(12) United States Patent
Tamaki et al.

(10) Patent No.: US 7,597,823 B2
(45) Date of Patent: Oct. 6, 2009

(54) NITRIDE PHOSPHOR AND PRODUCTION PROCESS THEREOF, AND LIGHT EMITTING DEVICE

(75) Inventors: Hiroto Tamaki, Tokushima (JP);
Masatoshi Kameshima, Tokushima (JP); Suguru Takashima, Tokushima (JP); Motokazu Yamada, Anan (JP); Takahiro Naitou, Anan (JP); Kazuhiko Sakai, Anan (JP); Yoshinori Murazaki, Anan (JP)

(73) Assignee: Nichia Corporation, Anan-shi (JP)

( * ) Notice: Subject to any disclaimer, the term of this patent is extended or adjusted under 35 U.S.C. 154(b) by 175 days.

(21) Appl. No.: 11/905,720

(22) Filed: Oct. 3, 2007

(65) Prior Publication Data

US 2009/0072708 A1 Mar. 19, 2009

Related U.S. Application Data

(62) Division of application No. 11/252,111, filed on Oct. 18, 2005, now Pat. No. 7,297,293, which is a division of application No. 10/478,598, filed as application No. PCT/JP03/03418 on Mar. 20, 2003, now Pat. No. 7,258,816.

(30) Foreign Application Priority Data

| Mar. 22, 2002 | (JP) | 2002-080879 |
| Apr. 26, 2002 | (JP) | 2002-126566 |
| May 23, 2002 | (JP) | 2002-148555 |
| Jun. 7, 2002 | (JP) | 2002-167166 |
| Jun. 27, 2002 | (JP) | 2002-187647 |
| Aug. 5, 2002 | (JP) | 2002-226855 |
| Nov. 29, 2002 | (JP) | 2002-348386 |
| Nov. 29, 2002 | (JP) | 2002-348387 |
| Dec. 3, 2002 | (JP) | 2002-351634 |

(51) Int. Cl.
*C09K 11/59* (2006.01)

(52) U.S. Cl. ............... 252/301.4 F; 252/301.6 F; 313/503; 257/98

(58) Field of Classification Search ........... 252/301.4 F, 252/301.6 F; 313/503; 257/98
See application file for complete search history.

(56) References Cited

U.S. PATENT DOCUMENTS 6,284,156 B1 9/2001 Uehara et al.

(Continued)

FOREIGN PATENT DOCUMENTS

JP 7-133485 5/1995

(Continued)

OTHER PUBLICATIONS

Office Action dated Apr. 8, 2008 in Japanese Appln. No. 2002-148555 with English translation.

(Continued)

*Primary Examiner*—C. Melissa Koslow
(74) *Attorney, Agent, or Firm*—Nixon & Vanderhye PC

(57) ABSTRACT

To provide a phosphor containing a comparatively much red component and having high light emitting efficiency, high brightness and further high durability, the nitride phosphor is represented by the general formula $L_X M_Y N_{(2/3)X+(4/3)Y}$:R or $L_X M_Y O_Z N_{(2/3)X+(4/3)Y-(2/3)Z}$:R (wherein L is at least one or more selected from the Group II Elements consisting of Mg, Ca, Sr, Ba and Zn, M is at least one or more selected from the Group IV Elements in which Si is essential among C, Si and Ge, and R is at least one or more selected from the rare earth elements in which Eu is essential among Y, La, Ce, Pr, Nd, Sm, Eu, Gd, Tb, Dy, Ho, Er and Lu); contains the another elements.

25 Claims, 97 Drawing Sheets

U.S. PATENT DOCUMENTS

| | | | |
|---|---|---|---|
| 6,531,072 | B1 | 3/2003 | Suda et al. |
| 6,628,249 | B1 | 9/2003 | Kamikawa et al. |
| 6,657,379 | B2 | 12/2003 | Ellens et al. |
| 6,737,681 | B2 | 5/2004 | Koda |
| 6,744,071 | B2 * | 6/2004 | Sano et al. .................... 257/79 |
| 6,924,514 | B2 | 8/2005 | Suenaga |
| 7,297,293 | B2 * | 11/2007 | Tamaki et al. ......... 252/301.4 F |
| 7,476,338 | B2 * | 1/2009 | Sakane et al. ......... 252/301.4 F |
| 2002/0043926 | A1 | 4/2002 | Takahashi et al. |
| 2003/0038295 | A1 * | 2/2003 | Koda ........................... 257/98 |
| 2003/0094893 | A1 | 5/2003 | Ellens et al. |
| 2005/0230689 | A1 | 10/2005 | Setlur et al. |
| 2006/0017041 | A1 | 1/2006 | Tian et al. |

FOREIGN PATENT DOCUMENTS

| | | |
|---|---|---|
| JP | 10-112557 | 4/1998 |
| JP | 2000-204366 A | 7/2000 |
| JP | 2000-212556 | 8/2000 |
| JP | 2001-49250 | 2/2001 |
| JP | 2001-144332 A | 5/2001 |
| JP | 2001-172625 | 6/2001 |
| JP | 2001-214162 | 8/2001 |
| JP | 2002-042525 | 2/2002 |
| JP | 2002-076434 | 3/2002 |
| JP | 2002-80843 | 3/2002 |
| JP | 2002-105449 | 4/2002 |
| JP | 2002-118293 | 4/2002 |
| JP | 2002-363554 | 12/2002 |
| JP | 2003-124527 | 4/2003 |
| JP | 2003-206481 | 7/2003 |
| JP | 2003-321675 | 11/2003 |
| JP | 2003-336050 | 11/2003 |
| JP | 2005-042125 | 2/2005 |
| JP | 2005-060714 | 3/2005 |
| JP | 2005-272852 | 10/2005 |
| WO | 01/40403 A1 | 6/2001 |

OTHER PUBLICATIONS

Office Action dated Jul. 8, 2008 in Japanese Appln. No. 2002-148555 with English translation.

Office Action dated Apr. 22, 2008 in Japanese Appln. No. 2002-348386 with English translation.

Office Action dated Apr. 22, 2008 in Japanese Appln. No. 2005-338502 with English translation.

Office Action dated Mar. 25, 2008 in Japanese Appln. No. 2002-167166 with English translation.

Office Action dated Mar. 25, 2008 in Japanese Appln. No. 2005-165944 with English translation.

Office Action dated Apr. 22, 2008 in Japanese Appln. No. 2002-348387 with English translation.

Office Action dated Apr. 22, 2008 in Japanese Appln. No. 2005-338506 with English translation.

Xie et al., "Preparation and Luminescence Spectra of Calcium- and Rare-Earth (R=Eu, Tb, and Pr)-Codoped $\alpha$-SiAlon Ceramics," J. Am. Ceram. Soc., vol. 85, No. 5, pp. 1229-1234 (May 2002).

Office Action of corresponding Japanese Patent Appln. No. 2002-080879, dated Oct. 31, 2006.

Office Action of corresponding Japanese Patent Appln. No. 2002-080879, dated Jan. 30, 2007.

Office Action of corresponding Japanese Patent Appln. No. 2002-126566, dated Jan. 30, 2007.

Office Action of corresponding Japanese Patent Appln. No. 2004-312020, dated Jan. 30, 2007.

* cited by examiner

Fig. 19A
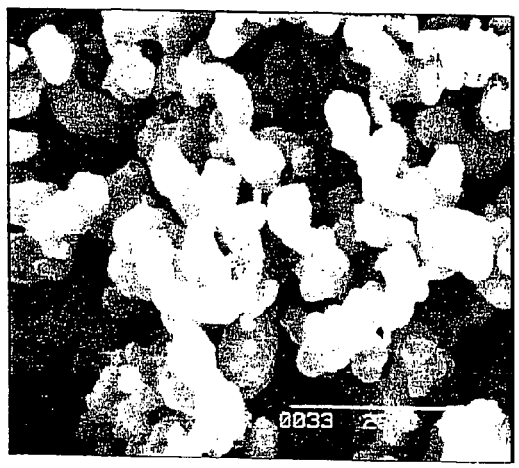 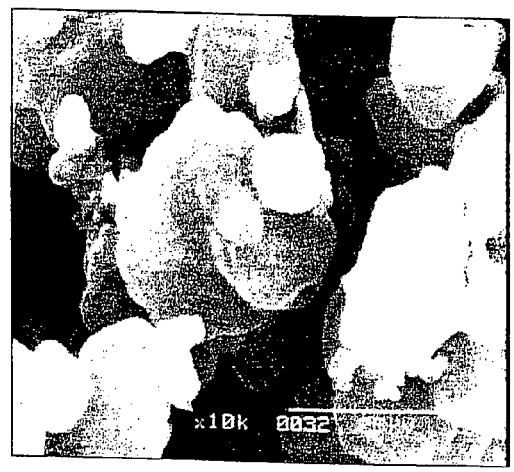
Fig. 19B
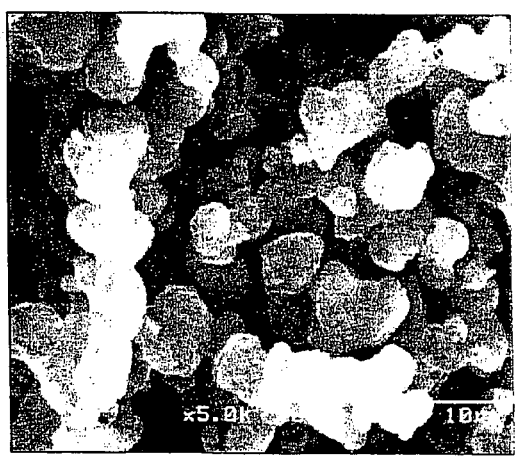 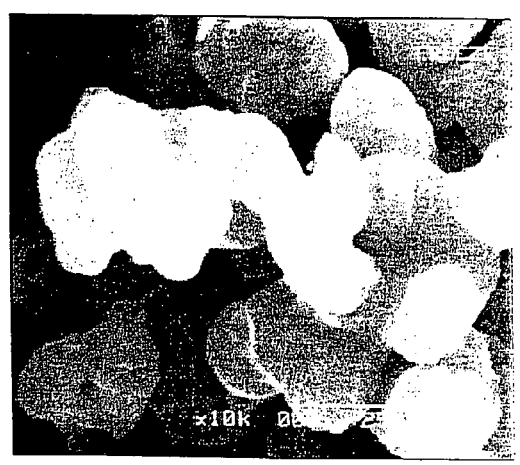

Fig. 20

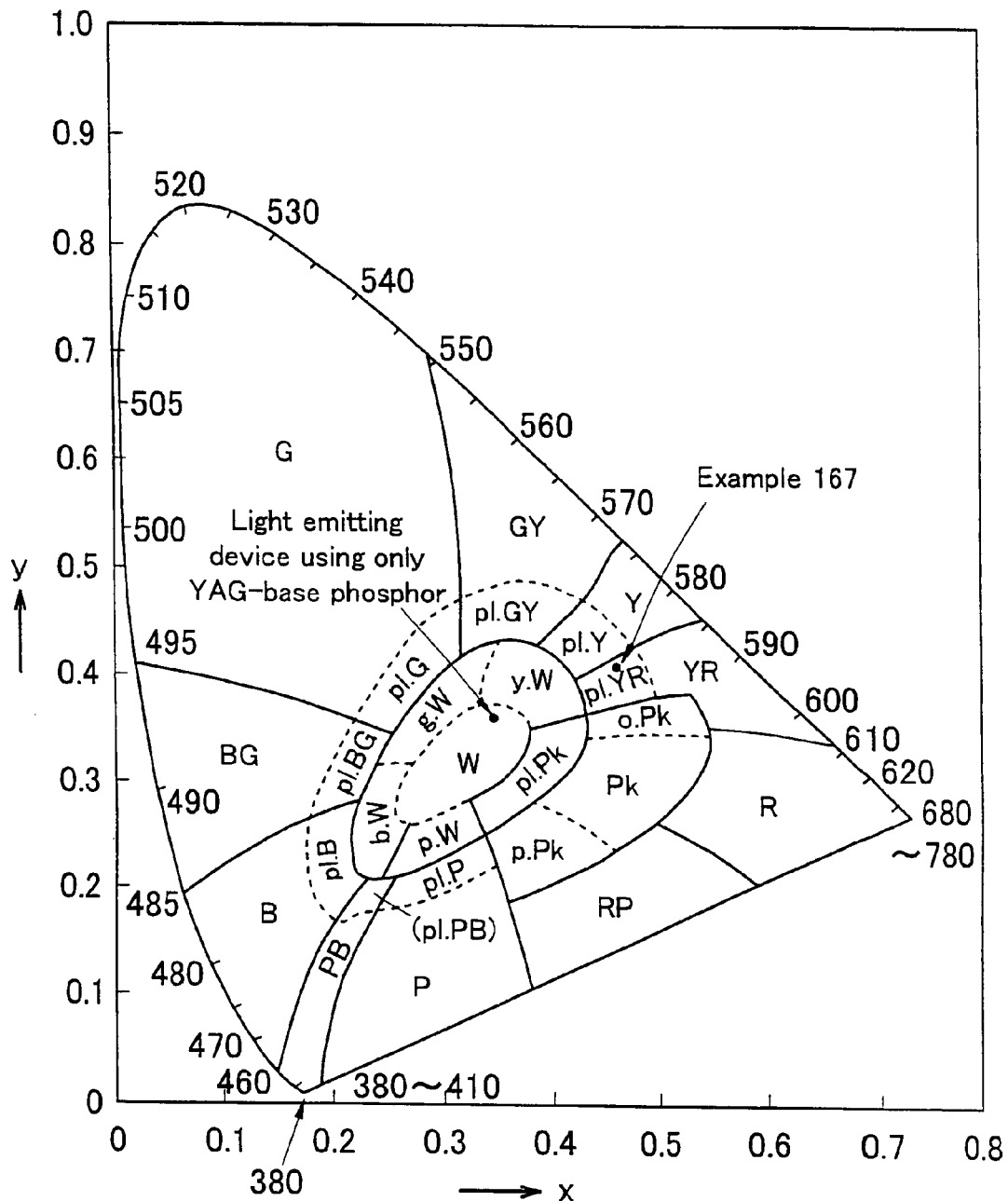

| G : Green | GY : Yellow green | pl.Y : pale yellow | b.W : Bluish white |
|---|---|---|---|
| Y : Yellow | YR : Yellow red | pl.G : pale green | g.W : Greenish white |
| R : Red | RP : Red purple | pl.B : pale blue | p.W : Purplish white |
| B : Blue | BG : Blue green | pl.P : pale purple | y.W : Yellowish white |
| W : White | PB : Blue purple | pl.Pk : pale pink | o.Pk : Orange pink |
| P : Purple | Pk : Pink | pl.PB : pale blue purple | p.Pk : Purplish pink |
| | | pl.GY : pale yellow green | |
| | | pl.BG : pale blue green | |
| | | pl.YR : pale yellow red | |

Fig. 32

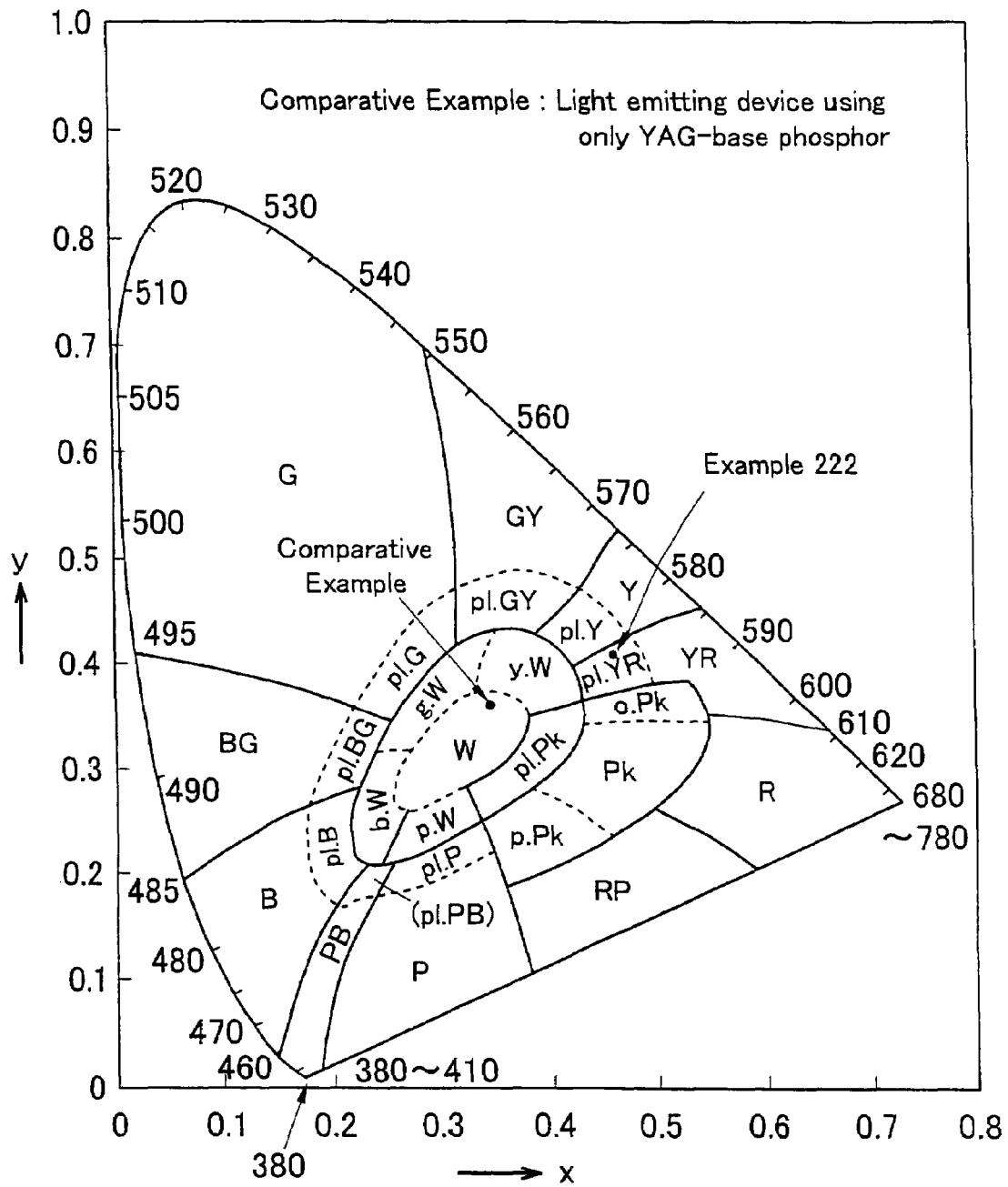

| | | | |
|---|---|---|---|
| G : Green | GY : Yellow green | pl.Y : pale yellow | b.W : Bluish white |
| Y : Yellow | YR : Yellow red | pl.G : pale green | g.W : Greenish white |
| R : Red | RP : Red purple | pl.B : pale blue | p.W : Purplish white |
| B : Blue | BG : Blue green | pl.P : pale purple | y.W : Yellowish white |
| W : White | PB : Blue purple | pl.Pk : pale pink | o.Pk : Orange pink |
| P : Purple | Pk : Pink | pl.PB : pale blue purple | p.Pk : Purplish pink |
| | | pl.GY : pale yellow green | |
| | | pl.BG : pale blue green | |
| | | pl.YR : pale yellow red | |

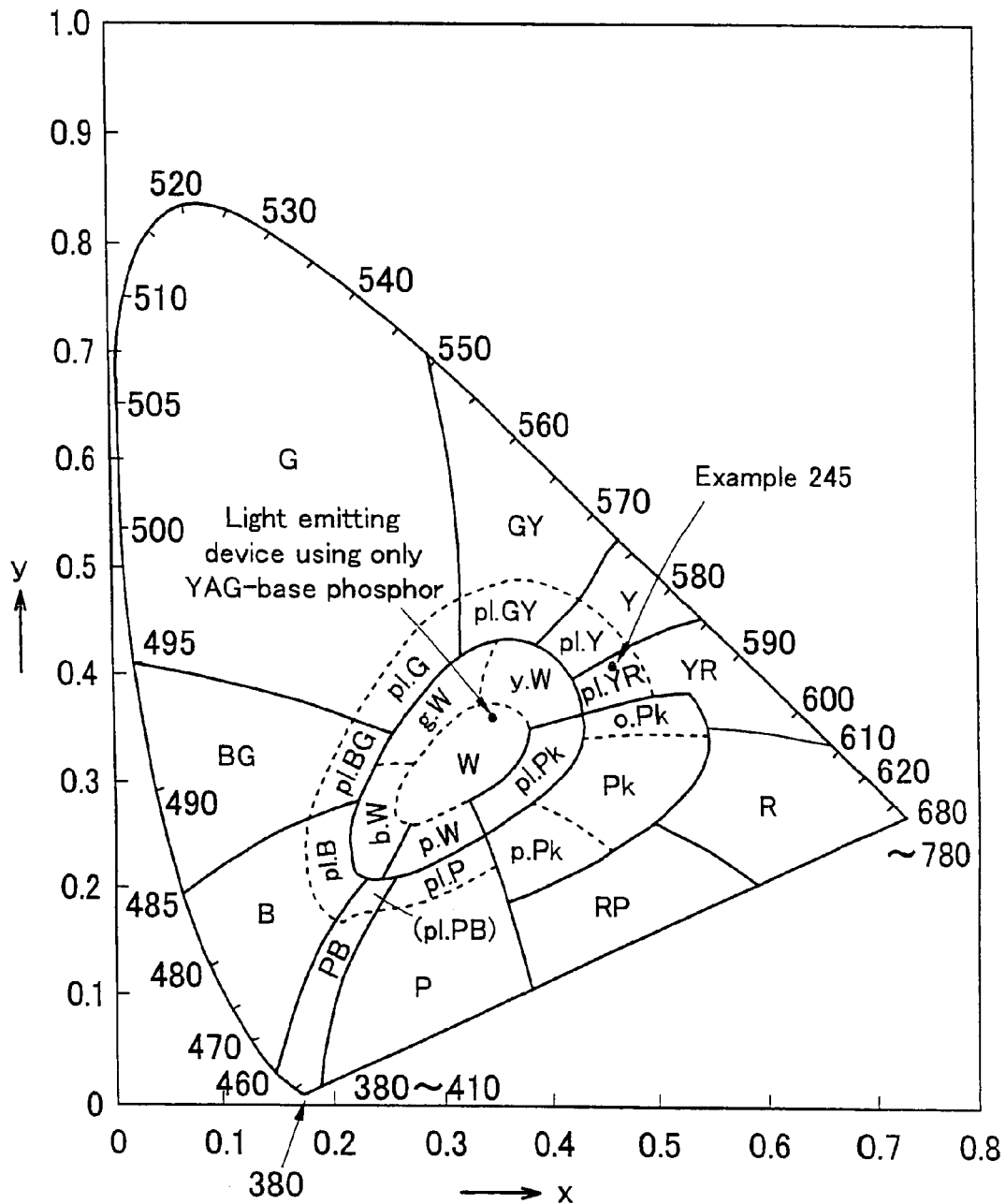

Fig. 42

G : Green       GY : Yellow green   pl.Y : pale yellow        b.W : Bluish white
Y : Yellow      YR : Yellow red     pl.G : pale green         g.W : Greenish white
R : Red         RP : Red purple     pl.B : pale blue          p.W : Purplish white
B : Blue        BG : Blue green     pl.P : pale purple        y.W : Yellowish white
W : White       PB : Blue purple    pl.Pk : pale pink         o.Pk : Orange pink
P : Purple      Pk : Pink           pl.PB : pale blue purple  p.Pk : Purplish pink
                                    pl.GY : pale yellow green
                                    pl.BG : pale blue green
                                    pl.YR : pale yellow red

Fig. 54

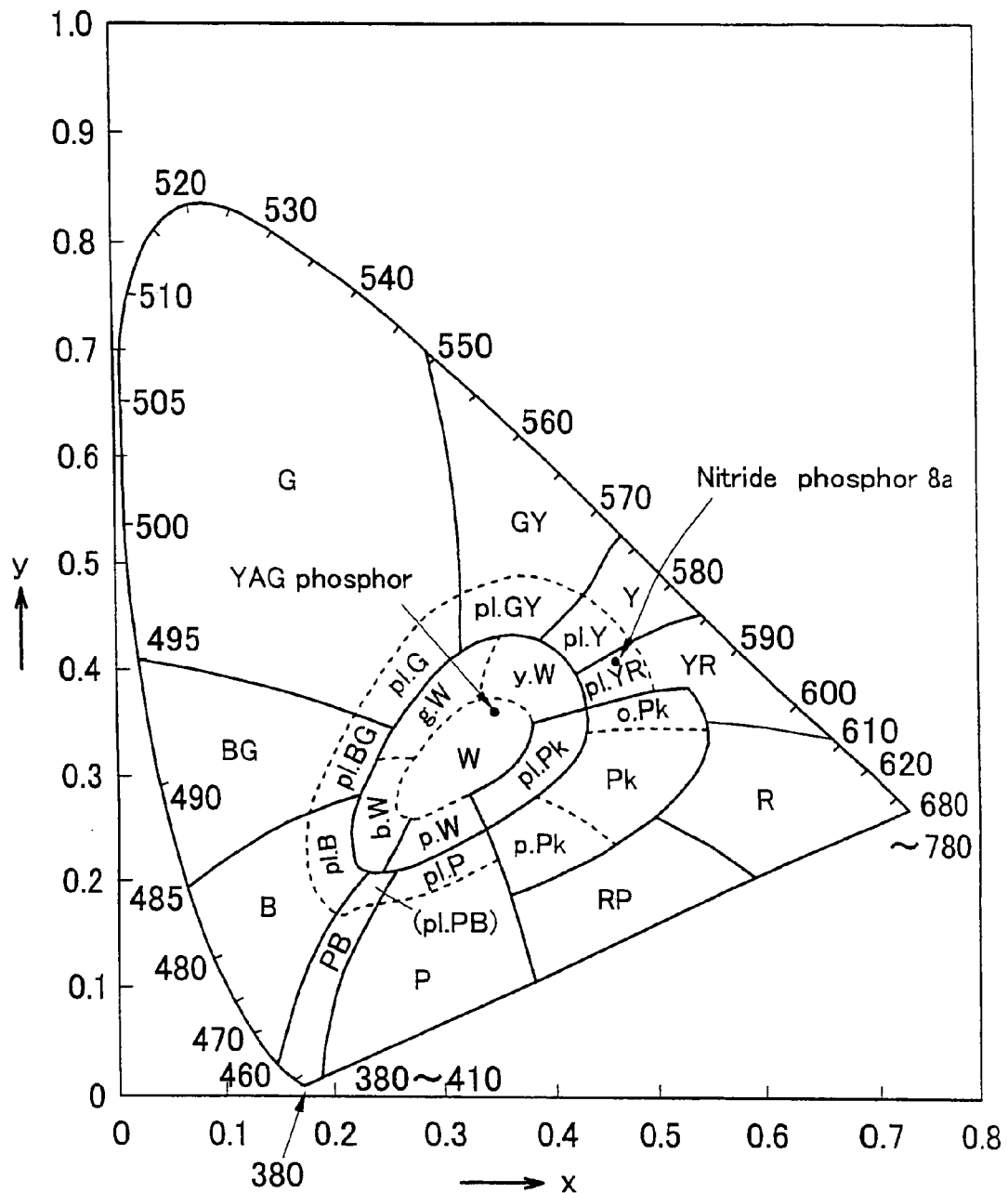

| | | | |
|---|---|---|---|
| G : Green | GY : Yellow green | pl.Y : pale yellow | b.W : Bluish white |
| Y : Yellow | YR : Yellow red | pl.G : pale green | g.W : Greenish white |
| R : Red | RP : Red purple | pl.B : pale blue | p.W : Purplish white |
| B : Blue | BG : Blue green | pl.P : pale purple | y.W : Yellowish white |
| W : White | PB : Blue purple | pl.Pk : pale pink | o.Pk : Orange pink |
| P : Purple | Pk : Pink | pl.PB : pale blue purple | p.Pk : Purplish pink |
| | | pl.GY : pale yellow green | |
| | | pl.BG : pale blue green | |
| | | pl.YR : pale yellow red | |

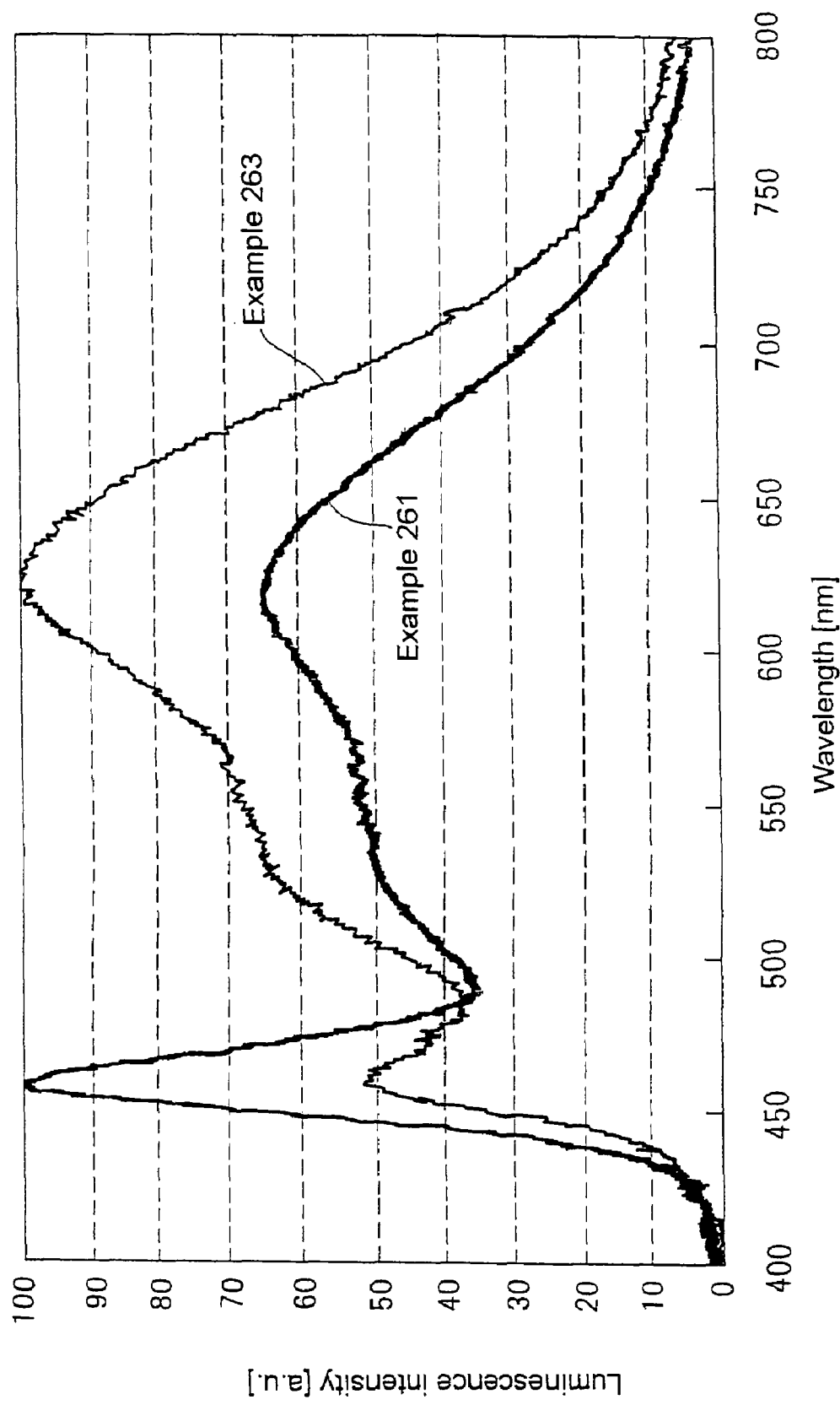

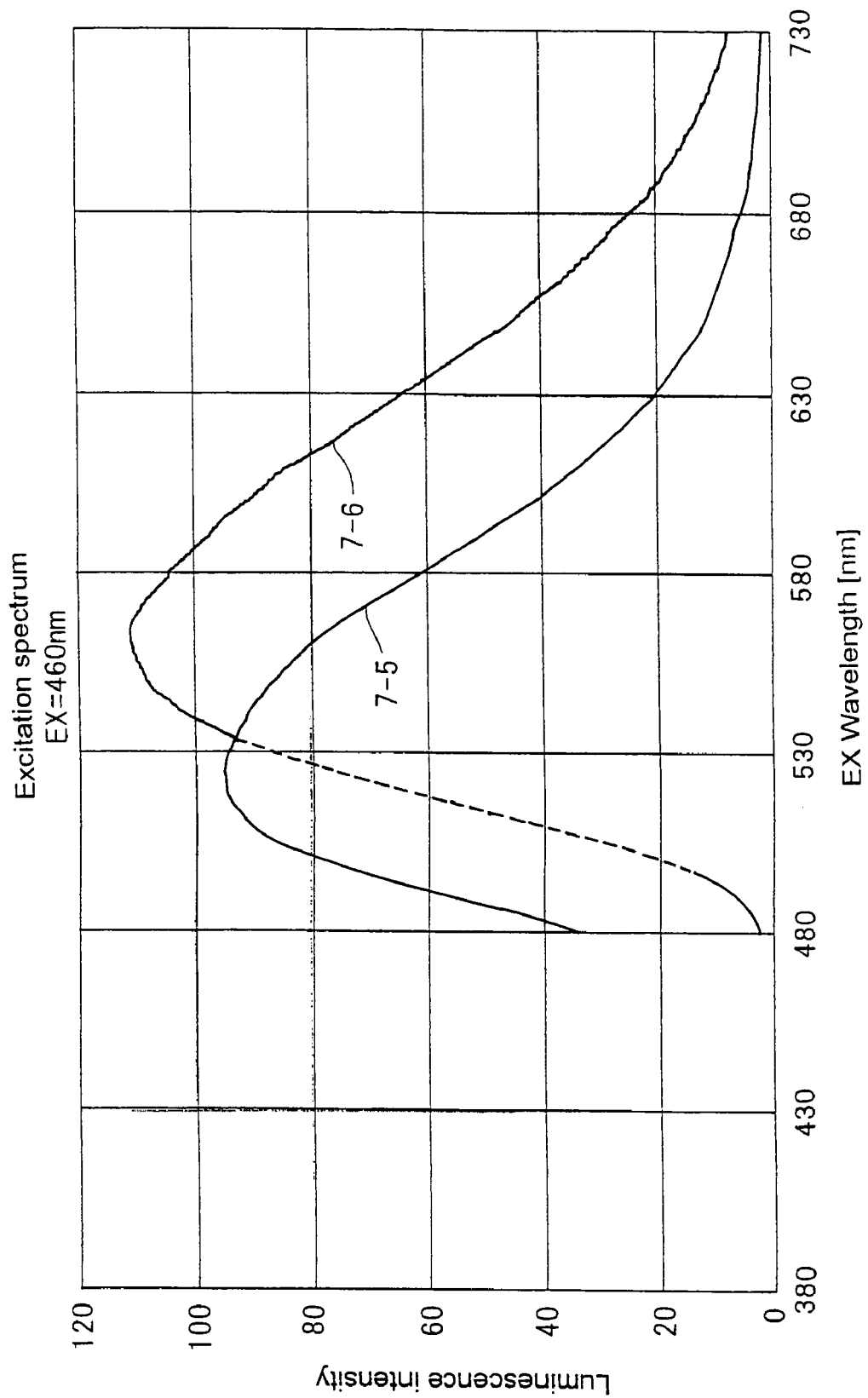

NITRIDE PHOSPHOR AND PRODUCTION PROCESS THEREOF, AND LIGHT EMITTING DEVICE

CROSS REFERENCE TO RELATED APPLICATIONS

This application is a divisional of U.S. application Ser. No. 11/252,111, filed Oct. 18, 2005, now U.S. Pat. No. 7,297,293, which is a divisional of U.S. application Ser. No. 10/478,598, filed Nov. 24, 2003, now U.S. Pat. No. 7,258,816, which is the US national phase of international application PCT/JP03/03418, filed in English on 20 Mar. 2003, which designated the US. PCT/JP03/03418 claims priority to JP application No. 2002-080879 filed 22 Mar. 2002, JP application No. 2002-126566 filed 26 Apr. 2002, JP application No. 2002-148555 filed 23 May 2002, JP application No. 2002-167166 filed 7 Jun. 2002, JP application No. 2002-187647 filed 27 Jun. 2002, JP application No. 2002-226855 filed 5 Aug. 2002, JP application No. 2002-348386 filed 29 Nov. 2002, JP application No. 2002-348387 filed 29 Nov. 2002 and JP application No. 2002-351634 filed 3 Dec. 2002. The entire contents of these applications are incorporated herein by reference.

TECHNICAL FIELD

The present invention relates to an illumination such as a light emitting device, a fluorescent lamp and the like, and relates to a display, a Back light for liquid crystal and the like which is used for a semiconductor light emitting element, and specifically relates to a nitride phosphor which is used for the light emitting device.

BACKGROUND OF THE INVENTION

A light emitting device using a semiconductor light emitting element has advantages that it is a small size, has good electrical efficiency and can emit a bright color, and there is no fear of burning out an electric bulb because the light source is a semiconductor element. Further, it has characteristics that it is excellent in initial driving property and tough in vibration and the repetition of on-off lighting.

Further, for the light emitting device using a semiconductor light emitting element, there is developed a light emitting device which has a light emitting color which is different from the light of the light emitting element by carrying out a wavelength conversion of the portion of the semiconductor light emitting element by a phosphor, and by mixing said wavelength-converted light and no wavelength-converted light to be emitted. Specifically, the light emitting device which emits light in a white color can be used in wide fields such as a general illumination, a display and a back light for liquid crystal, by the constitution.

In the white color light emitting device, a blue light emitting element using an InGaN-base material is used as a light emitting element, a YAG-base phosphor which is represented by the composition formula of $(Y,Gd)_3(Al, Ga)_5O_{12}$ is used as a phosphor, and a white light emitting color is obtained by the theory of color mixture of light. Namely, after blue light which was discharged from a light emitting element is emitted in the phosphor layer, it is discharged outside after repetition of absorption and scattering in the layer. On the other hand, the blue light absorbed in the phosphor works as an excitation source and emits yellow fluorescence. The yellow light and the blue light are mixed and the mixture is recognized as a white color by human eyes.

However, the above-mentioned white color light emitting device has defects that there is little red component in luminescence, color temperature is high, and only illumination light having low color rendering property which is deficient in red is obtained.

Namely, a conventional light emitting device which emits white light can hardly obtain a long wavelength side luminance at a visible light region, therefore it has been a light emitting device which exhibits a slightly bluish white color. On the contrary, there has been strongly required a light emitting device which exhibits a slightly reddish warm color-base white color, in the illumination for a window display, illumination for a medical spot and the like. Further, there has been strongly required a light emitting device which exhibits a white color which is soft for human eyes and near to an electric bulb color, also for general illumination.

However, since a conventional phosphor emitting reddish light has low efficiency caused by near ultra violet to blue light excitation and low chemical and thermal stabilities, durability is not adequate, therefore it is not practically used. Further, human eyes feel that the wave length region of a reddish component is dark. Accordingly, it is required that a red color region has higher brightness so that eyes feel the same level brightness as a green region and a blue region.

Under these circumstances, in the pamphlet of International Open Patent No. 01/40403, there is disclosed an $M_xSi_yN_z$:Eu nitride phosphor (wherein M is at least one of alkali earth metals at least selected from a group of Ca, Sr, Ba and Zn. $z=(2/3)x+(4/3)y$) which increased a red component in comparison with a conventional phosphor.

However, the nitride phosphor disclosed in the pamphlet of International Open Patent No. 01/40403 obtains a slightly reddish white color light, for example, by combination with a blue light emitting diode, but the improvement of brightness is further required.

Further, a conventional phosphor emitting red light has inadequate efficiency caused by near ultra violet to blue light excitation and inadequate durability, therefore it is not practically used.

Accordingly, it is the first purpose of the present invention to solve the above-mentioned problems and to provide a phosphor containing a comparatively much red component and having high light emitting efficiency, high brightness and further high durability; and a production process thereof.

Further, it is the second purpose of the present invention to provide a light emitting device which can emit reddish warm color-base white color light and can emit light having the color rendering property.

DISCLOSURE OF THE INVENTION

In order to solve the above-mentioned problems, the nitride phosphor related to the present invention is a nitride phosphor (base nitride phosphor) which is represented by the general formula $L_XM_YN_{((2/3)X+(4/3)Y)}$:R or $L_XM_YO_ZN_{((2/3)X+(4/3)Y-(2/3)Z)}$:R (wherein L is at least one or more selected from the Group II Elements consisting of Mg, Ca, Sr, Ba and Zn, M is at least one or more selected from the Group IV Elements in which Si is essential among C, Si and Ge, and R is at least one or more selected from the rare earth elements in which Eu is essential among Y, La, Ce, Pr, Nd, Sm, Eu, Gd, Tb, Dy, Ho, Er and Lu.), and absorbs at least the portion of light having the first luminescence spectrum in which a peak wave length is 500 nm or less and emits light having the second luminescence spectrum which has at least one or more of peaks at a range of 520 to 780 nm; and further contains the elements (hereinafter, referred to as different elements) below.

Namely, the first nitride phosphor related to the present invention is characterized in further containing at least one or more of different elements selected from the Group I Element consisting of Li, Na, K, Rb and Cs.

The first nitride phosphor containing the Group I Element consisting of Li, Na, K, Rb and Cs has a higher luminescence efficiency in comparison with a nitride phosphor not containing the Group I Element. This is considered because the above-mentioned Group I Element works as a flux during synthesis and then the Group I Element which worked as the flux exists between phosphor particles, or the luminescence itself of the phosphor is hardly inhibited because the Group I Element is scattered during its production steps. Further, the particle diameter of the nitride phosphor can be controlled by containing the Group I Element in the nitride phosphor.

Further, the second nitride phosphor related to the present invention is characterized in further containing at least one or more of elements selected from the Group V Element consisting of V, Nb and Ta, the Group VI Element consisting of Cr, Mo and W, the Group VII Element consisting of Re and the Group VIII Element consisting of Fe, Co, Ir, Ni, Pd, Pt and Ru, in the above-mentioned base nitride phosphor.

When the second nitride phosphor related to the present invention to which the Group V Element, the Group VI Element, the Group VII Element and the Group VIII Element were added is compared with a nitride phosphor to which those elements are not added, the second nitride phosphor has an effect capable of shortening afterglow. Further, these elements can adjust brightness. Hereat, it is preferable that the Group V Element, the Group VI Element, the Group VII Element and the Group VIII Element which are different from the elements contained in the above-mentioned nitride phosphor composition are 100 ppm or less based on the weight of the elements contained in the above-mentioned nitride phosphor composition. This is because the Group V Element, the Group VI Element, the Group VII Element and the Group VIII Element are killer elements inhibiting the luminescence of the present nitride phosphor therefore they are preferably removed to the outside of a system. To the contrary, since Cr, Ni and the like have an effect of shortening afterglow, about 0.1 ppm to several tens ppm may be contained.

Further, in the first nitride phosphor too, it is preferable that elements which are different from the elements contained in the above-mentioned base nitride phosphor are 1000 ppm or less based on the weight of the elements contained in the above-mentioned base nitride phosphor. When they are within this range, high brightness can be kept while adjusting luminescence properties. The luminescence properties in the specification are color tone, brightness, afterglow, light output property for excitation intensity, luminescence efficiency and the like.

Further, elements (the second different elements) which are different from the above-mentioned L, the above-mentioned M, the above-mentioned O, the above-mentioned N and the above-mentioned R may be contained in the above-mentioned base nitride phosphor, other than at least one or more of elements selected from the Group I Element consisting of Li, Na, K, Rb and Cs, the Group V Element consisting of V, Nb and Ta, the Group VI Element consisting of Cr, Mo and W, the Group VII Element consisting of Re and the Group VIII Element consisting of Fe, Co, Ir, Ni, Pd, Pt and Ru, or together with those elements.

The nitride phosphor which is represented by the general formula $L_XM_YN_{(2/3)X+(4/3)Y}$:R or $L_XM_YO_Z$ $N_{(2/3)X+(4/3)Y-(2/3)Z}$:R is a nitride phosphor which emits light having the second luminescence spectrum which has a peak wave length at a yellow to red region and the like when light having the first luminescence spectrum which has a peak wave length at an ultra violet to blue region is irradiated. The luminescence intensity can be changed by containing the second different element in said nitride phosphor, without changing the color tone. The nitride phosphor having desired brightness can be provided thereby. Further, the adjustment of the brightness can be easily carried out.

The above-mentioned different element and the second different element may be contained in raw materials when the above-mentioned base nitride phosphor is prepared. The nitride phosphor having desired brightness can be provided thereby, irrespective of whether those different elements and the second different element remain in the phosphor after preparation, or not. Further, the adjustment of the brightness can be easily carried out. Furthermore, the adjustment of the brightness can be carried out by controlling the kinds and contents of the above-mentioned different elements or the second different elements in the raw materials of the nitride phosphor of the present invention, for example, strontium nitride, calcium nitride, silicon nitride, europium oxide or europium nitride. Further, the purification step of the raw materials can be abbreviated when the contents of various elements which are contained in the raw materials are within the range capable of realizing the objective luminescence properties, and the simplification of the production step can be designed. Further, economic products can be supplied.

For example, as the second different element, there may be contained at least one or more of elements selected from the Group I Element consisting of Cu, Ag and Au, the Group III Element consisting of B, Al, Ga and In, the Group IV Element consisting of Ti, Zr, Hf, Sn and Pb, the Group V Element consisting of P, Sb and Bi, and the Group VI Element consisting of S. The adjustment of the brightness of the base nitride phosphor can be carried out by these elements. Further, Al, B, Ga, In and the like can keep high brightness while adjusting the brightness.

Further, the content of the above-mentioned second different element is preferably 1000 ppm or less. The adjustment of the luminescence properties can be easily carried out.

Further, when the above-mentioned different element or the second different element is contained in the raw materials when the above-mentioned base nitride phosphor is prepared, they are preferably contained in the raw materials at a range of 1000 ppm or less. When they are within the range, the nitride phosphor having desired brightness can be provided.

The firing step at preparing the above-mentioned base nitride phosphor is preferably carried out under reductive atmosphere. Because the scattering of unnecessary elements contained is accelerated by firing in reductive atmosphere and the improvement of luminescence brightness can be carried out.

The first production process of the nitride phosphor of the present invention is characterized in including the first step which mixes in a wet process the oxide of R (R has at least one or more selected from the rare earth element in which Eu is essential among Y, La, Ce, Pr, Nd, Sm, Eu, Gd, Tb, Dy, Ho, Er and Lu.) with a compound in which there are contained at least one or more of elements selected from the Group I Element consisting of Li, Na, K, Rb, Cs, Cu, Ag and Au, the Group III Element consisting of B, Al, Ga and In, the Group IV Element consisting of Ti, Zr, Hf, Sn and Pb, the Group V Element consisting of V, Nb, Ta, P, Sb and Bi, the Group VI Element consisting of Cr, Mo, W and S, the Group VII Element consisting of Re and the Group VIII Element consisting of Fe, Co, Ir, Ni, Pd, Pt and Ru; the second step of firing the mixture obtained by the first step; the third step in which the mixture obtained by the second step is mixed with at least any one of the nitride of L (L has at least one or more selected from the Group II Element consisting of Mg, Ca, Sr, Ba and Zn), the nitride of M and the oxide of M (M has at least one or more selected from the Group IV Element in which Si is essential among C, Si and Ge); and the fourth step of firing the mixture obtained from the third step in reductive atmosphere. The nitride phosphor having high brightness can be provided thereby. Further, the nitride phosphor having desired luminescence properties can be provided by the elements added.

It is preferable that at least either of the above-mentioned second step and the above-mentioned fourth step carries out firing using a crucible and/or a furnace material in which there are contained at least one or more of elements selected from the Group I Element consisting of Li, Na, K, Rb, Cs, Cu, Ag and Au, the Group III Element consisting of B, Al, Ga and In, the Group IV Element consisting of Ti, Zr, Hf, Sn and Pb, the Group V Element consisting of V, Nb, Ta, P, Sb and Bi, the Group VI Element consisting of Cr, Mo, W and S, the Group VII Element consisting of Re and the Group VIII Element consisting of Fe, Co, Ir, Ni, Pd, Pt and Ru. Because it is carried out so that the adjustment of the luminescence properties is further easily carried out by using a crucible and a furnace material which have elements capable of carrying out the luminescence properties. The Group I Element is used as a firing aid at production of the crucible and furnace material. Further, the Group I Element is an element which remains easily in a raw material. A crucible and a furnace material using the single body or the compound of these Group I Elements may be used, and firing treatment may be carried out by being mixed with a raw material of the base nitride phosphor. The adjustment of the luminescence properties can be carried out by using the crucible and the furnace material which contained the Group I Element. It is preferable to use the crucible and the furnace material which contains elements such as B, Au, Ga and In, in addition to the Group I Element. The brightness is improved by using those containing these.

For the nitride phosphor related to the present invention, the element different from the composition of the nitride phosphor, or a compound containing the different element is added in the production step. However, said different element is scattered at firing step, therefore there is also a case that only the element having smaller amount than the initial addition amount is contained in the composition of the nitride phosphor which is the final product. Accordingly, a smaller amount than the compounding amounts at the initial addition of said different element is only contained in the composition of the nitride phosphor which is the final product. Further, when the particle diameter of the nitride phosphor is desired to be controlled, it can be controlled by adding said different element.

The third nitride phosphor related to the present invention is a nitride phosphor which has at least R (R has at least one or more selected from the rare earth element in which Eu is essential among Y, La, Ce, Pr, Nd, Sm, Eu, Gd, Tb, Dy, Ho, Er and Lu.), L (L has at least one or more selected from the Group II Element consisting of Mg, Ca, Sr, Ba and Zn), M (M has at least one or more selected from the Group IV Element in which Si is essential among C, Si and Ge), and at least one or more of elements selected from the Group I Element consisting of Li, Na, K, Rb, Cs, Cu, Ag and Au, the Group III Element consisting of B, Al, Ga and In, the Group IV Element consisting of Ti, Zr, Hf, Sn and Pb, the Group V Element consisting of V, Nb, Ta, P, Sb and Bi, the Group VI Element consisting of Cr, Mo, W and S, the Group VII Element consisting of Re and the Group VIII Element consisting of Fe, Co, Ir, Ni, Pd, Pt and Ru; and said nitride phosphor is characterized in being produced by the above-mentioned first production process.

The first light emitting device related to the present invention is a light emitting device which has a light emitting element which emits light having the first luminescence spectrum which has a peak wave length of 500 nm or less and a phosphor which absorbs at least the portion of light having the above-mentioned first luminescence spectrum and emits light having the second luminescence spectrum which has at least one or more of peaks at a range of 520 to 780 nm, and the above-mentioned phosphor is characterized in being any one of the first nitride phosphor related to the present invention, the second nitride phosphor or the third nitride phosphor which was produced by the first production process related to the present invention.

In the first light emitting device, the above-mentioned nitride phosphor is excited by light which is emitted by a light emitting element having the first luminescence spectrum which has a peak wave length at a short wave length side region which is 500 nm or less from near ultra violet to visible light. The nitride phosphor excited emits light having the second luminescence spectrum which has a peak wave length at a yellow to red region of 520 nm to 780 nm. The light emitting device which can emit light of a bulb lamp color can be provided thereby. The electric bulb color is a range in which a point of 2700 to 2800K on the locus of black body radiation is made as a center in a white color according to the JIS Specification (JIS Z8110), and means a tinge having a tinge from yellow to red. Specifically, it means those having a luminescence color at the regions of (light) yellow red, (orange) pink, pink, (light) pink and (yellowish) white in the chromaticity coordinate of FIG. 8.

Further, according to the first production process related to the present invention, the phosphor whose particle diameter was controlled at a fixed range can be produced. Accordingly, the light emitting device having extremely little color unevenness can be realized by using the phosphor whose particle diameter was controlled at a fixed range in the above-mentioned first light emitting device. Further, the light emitting device having high brightness can be provided thereby. Furthermore, it has been conventionally difficult to change the luminescence properties without changing the color tone of a light emitting device, but the first light emitting device related to the present invention can change the luminescence properties without changing the color tone of the light emitting device because the nitride phosphor can be changed to desired luminescence properties by the effect of elements added.

It is preferable that the first light emitting device has further one or more of phosphors which absorb the light of the above-mentioned first luminescence spectrum and at least the portion of the light of the above-mentioned second luminescence spectrum and emits light having the third luminescence spectrum which has at least one or more of peak wave lengths from a blue region to a green region, a yellow region, and a red region. Thus, the light emitting device having desired luminescence color such as not only a white color but also a pastel color can be provided by using the phosphor which emits light with various tinges in combination with the nitride phosphor related to the present invention. Further, the white color can be also finely adjusted to (yellowish) white, (greenish) white, (bluish) white and the like.

The phosphor emitting the light of the above-mentioned third luminescence spectrum is preferably at least any one or more of a yttrium-aluminum oxide phosphor activated by at least cerium, a yttrium-gadolinium-aluminum oxide phosphor activated by at least cerium, and a yttrium-gallium-aluminum oxide phosphor activated by at least cerium. The light emitting device having desired luminescence color can be provided thereby. For example, when the nitride phosphor related to the present invention, a yttrium-aluminum oxide phosphor activated by cerium and the like are used, a white color having various tinges in excitation by visible light can be created by the combination of these phosphors.

The above-mentioned first light emitting device can emit light with various white colors (bluish white, reddish white and the like) by mixing 2 or more of the portion of light from the above-mentioned light emitting element, the portion of light from the phosphor having the above-mentioned second luminescence spectrum, and the portion of light from the phosphor having the above-mentioned third luminescence spectrum. Said light emitting device can provide a desired white color light emitting device by adjusting the compounding amounts of various phosphors. For example, the nitride phosphor is excited by the light emitting element having blue light to emit yellow red light, and the phosphor emitting light of the above-mentioned third luminescence spectrum is excited to emit yellow light, therefore the blue light passed between the nitride phosphor and the phosphor, and the yellow red light of the nitride phosphor and the yellow light of the phosphor are recognized as a white color for human eyes, by the principle with respect to the color mixture of light.

In the present invention, the element different from the above-mentioned L, M, N, O and R, or the second different element is usually added by oxides or hydrides, but the present invention is not limited to this, and metals, nitrides, imides, amides or other inorganic salts may be well. Further, a condition in which they are previously contained in other raw materials may be well. Oxygen is occasionally contained in the composition of the above-mentioned nitride phosphor. It is considered that oxygen is introduced from various oxides being raw materials or oxygen is mixed during firing. The oxygen accelerates the effects of Eu diffusion, particle growth and the improvement of crystallinity. Namely, the similar effect can be obtained by replacing one compound which is used for raw materials, to metals, nitrides and oxides, but there is also a case that the effect of using oxides is rather big. The nitride phosphor has crystal configurations such as monoclinic and orthorhombic.

Further, the first and the second nitride phosphors related to the present invention can arbitrarily adjust the afterglow property. The afterglow property is important in a display device such as displays such as PDP, CRT and LCD on which displays are continuously and repeatedly carried out. The white light emitting device using a semiconductor light emitting element and a phosphor in combination is used as an outdoor display and an LCD back light. Short afterglow is required for the use. Accordingly, the afterglow can be suppressed by containing B, Mg, Cr, Ni, Al and the like in the base nitride phosphor of the phosphor.

The above-mentioned nitride phosphor has preferably a mean particle diameter of 2.5 to 15 μm. In particular, 3 to 8 μm is preferable. When the particle diameter is large, there are advantages that the luminescence brightness is improved and light take-out efficiency is improved, etc.

As described above, the first and the second nitride phosphors related to the present invention can easily adjust the luminescence properties such as color tone, brightness and afterglow. Further, the nitride phosphor can be provided by economic and simple production steps while controlling the luminescence properties. The first light emitting device related to the present invention can provide a light emitting device which has good luminescence efficiency and emits slightly reddish warm color white light. Furthermore, it can provide the nitride phosphor having a luminescence spectrum from yellow to red regions which is used in combination with a blue light emitting element and the like. Accordingly, the present invention has a technical meaning that the nitride phosphor, the production process of the nitride phosphor, and the light emitting device using thereof are provided.

As described above, according to the present invention, the nitride phosphor having a luminescence spectrum from yellow to red regions which can be used in combination with a blue light emitting element and the like can be provided. The light emitting device which has good luminescence efficiency and emits slightly reddish warm color-base white light can be provided using the nitride phosphor.

Further, the present invention could specify elements which lower the brightness of the phosphor and elements which improve the brightness of the phosphor. It can optimize the crucible and the material of the firing furnace thereby and can provide the phosphor having high brightness.

Further, the nitride phosphor whose particle diameter was controlled at a fixed range can be provided. Furthermore, the present invention has an extremely important meaning that it can provide the nitride phosphor by which the improvement of the luminescence properties and durability was designed.

In order to solve the above-mentioned problems, the fourth nitride phosphor related to the present invention is a nitride phosphor containing at least one or more of the Group II Element selected from a group consisting of Be, Mg, Ca, Sr, Ba and Zn, at least one or more of the Group IV Elements selected from a group consisting of C, Si, Ge, Sn, Ti, Zr and Hf, and N which is activated by at least one or more of the rare earth elements selected from a group consisting of Y, La, Ce, Pr, Nd, Sm, Eu, Gd, Tb, Dy, Ho, Er and Lu; and said nitride phosphor is characterized in containing 1 ppm or more and 10000 ppm or less of B. The improvement of the luminescence properties such as luminescence brightness, quantum efficiency and the like can be designed thereby. The reason why the effect is obtained is that it is considered that the diffusion of an activator occurs by addition of a boron element and the growth of a particle is accelerated. Further, it is considered that the boron element invades in the crystal lattices of the nitride phosphor, corrects the distortion of said crystal lattices and directly participates in the luminescence mechanism, therefore the improvement of the luminescence properties such as luminescence brightness, quantum efficiency and the like is designed.

The typical one of the above-mentioned fourth nitride phosphor is a nitride phosphor consisting of Si, N and at least any one of elements of Cs and Sr which is activated by Eu. In the typical example of the nitride phosphor, the portion of Eu can be substituted with at least one or more of the rare earth elements selected from a group consisting of Y, La, Ce, Pr, Nd, Sm, Eu, Gd, Th, Dy, Ho, Er and Lu. The portion of at least any one of elements of Ca and Sr can be substituted with at least one or more of the Group II Elements selected from a group consisting of Be, Mg, Ba and Zn. The portion of Si can be substituted with at least one or more of the Group IV Elements selected from a group consisting of C, Ge, Sn, Ti, Zr and Hf.

O may be contained in the composition of the fourth nitride phosphor related to the present invention. It can be easily produced because a raw material containing oxygen can be used thereby.

The fifth nitride phosphor related to the present invention is a nitride phosphor which is represented by the general formula $L_X M_Y N_{((2/3)X+(4/3)Y)}$:R or $L_X M_Y O_Z N_{((2/3)X+(4/3)Y-(2/3)Z)}$:R (wherein L is at least one or more of the Group II Elements selected from a group consisting of Be, Mg, Ca, Sr, Ba and Zn. R is at least one or more of the rare earth elements selected from a group consisting of Y, La, Ce, Pr, Nd, Sm, Eu, Gd, Th, Dy, Ho, Er and Lu. X, Y and Z are $0.5 \leq X \leq 3$, $1.5 \leq Y \leq 8$, and $0 < Z \leq 3$); and said nitride phosphor is characterized in containing 1 ppm or more and 10000 ppm or less of B. The improvement of the luminescence properties such as luminescence brightness, quantum efficiency and the like can be designed thereby.

The sixth nitride phosphor related to the present invention is a nitride phosphor which absorbs the portion of light having the first luminescence spectrum and emits light having the second luminescence spectrum at a region different from the above-mentioned first luminescence spectrum, and characterized in that there is contained B which was added so that the addition amount can be freely controlled for the raw material of the above-mentioned nitride phosphor. The adjustment of the luminescence properties such as luminescence brightness, quantum efficiency, afterglow and the like can be carried out. When boron is not added, the luminescence properties such as luminescence brightness, quantum efficiency and the like are constant, but the luminescence brightness is designed to be improved and afterglow can be shortened, by adding boron. Since the luminescence properties differ in requested properties in accordance with uses such as illumination and display, it is required to change the luminescence properties at the same color tone.

Further, the first luminescence spectrum is obtained by excitation by an external device. It is preferable that the crystal configuration of the above-mentioned fifth and sixth nitride phosphors is a nitride phosphor being monoclinic or orthorhombic. The above-mentioned nitride phosphors can make the luminescence properties good by having a monoclinic or orthorhombic crystal configuration.

As the above-mentioned rare earth element, one or more of elements in which Eu is essential are preferable. The phosphor emitting orange to red light can be provided by using Eu as an activator. The nitride phosphor having different color tones and different afterglow properties can be provided by substituting the portion of Eu with other rare earth element.

It is preferable that the above-mentioned fifth and sixth nitride phosphors contain further 0.1 ppm or more and 500 ppm or less of one or more of the Group I Elements selected from a group consisting of Li, Na, K, Rb and Cs. The improvement of the luminescence properties such as luminescence brightness, quantum efficiency and the like can be carried out thereby. This is considered because the above-mentioned Group I Element works as a flux during synthesis and then the Group I Element which worked as the flux exists between phosphor particles, or the luminescence itself of the phosphor is hardly inhibited because the Group I Element is scattered during its production steps. Further, the particle diameter of the nitride phosphor can be controlled by containing the Group I Element in the nitride phosphor.

It is preferable that the above-mentioned fifth and sixth nitride phosphors contain further 0.1 ppm or more and 500 ppm or less of one or more of elements selected from the Group I Elements consisting of Cu, Ag and Au, the Group III Elements consisting of Al, Ga and In, the Group IV Elements consisting of Ti, Zr, Hf, Sn and Pb, the Group V Elements consisting of P, Sb and Bi, and the Group VI Element consisting of S. The adjustment of the luminescence brightness of the nitride phosphors can be carried out thereby.

It is preferable that the above-mentioned fifth and sixth nitride phosphors contain further 1 ppm or more and 500 ppm or less of either of elements of Ni and Cr. The afterglow of the nitride phosphors can be carried out thereby. Mg and Al have also a similar effect in addition to Ni and Cr. The afterglow can be controlled by controlling the amount of Mg, Al, Ni and Cr added.

It is preferable that the above-mentioned fifth and sixth nitride phosphors have a mean particle diameter of 2 μm or more and 15 μm or less. In particular, the mean particle diameter is preferably 3 μm or more and 12 μm or less. The mean particle diameter is further preferably 5 μm or more and 10 μm or less. The light emitting device having extremely little color unevenness can be provided by controlling the particle diameter within a fixed range. The light emitting device having high brightness can be provided thereby. The larger the mean particle diameter of the nitride phosphor is, the higher the luminescence brightness is, but when it is 15 μm or more, it is hardly coated and treated when it is used for a light emitting device. On the other hand, the smaller the mean particle diameter of the nitride phosphor is, the more homogeneously the phosphor emits light when it is coated on the fluorescent face of the light emitting device, but there are problems that the luminescence brightness is low and it is hardly treated during coating and production. Accordingly, the mean particle diameter having the above-mentioned range is preferable.

The second light emitting device related to the present invention is a light emitting device having an excitation light source which discharges light of a short wave length region from near ultra violet to visible light and a phosphor which absorbs at least the portion of light from said excitation light source and discharges light having a longer wave length region than light from the excitation light source; and the above-mentioned phosphor is characterized in having at least the sixth nitride phosphor related to the present invention. The light emitting device having good luminescence efficiencies such as luminescence brightness and quantum efficiency can be provided thereby. In the second light emitting device, the excitation light source discharges light of a short wave length region from near ultra violet to visible light. The portion of light discharged irradiates the phosphor. The phosphor absorbs the portion of light discharged and carries out the wavelength conversion. The light after the wavelength conversion is light having a longer wave length region than light from said excitation light source. The light emitting device which bestows a luminescence color having a tinge different from the luminescence color from the excitation light source can be provided. As a specific exemplification, said light is irradiated to the nitride phosphor related to the present invention using the excitation light source which emits blue light nearby 460 nm. Said nitride phosphor has a luminescence color from a yellow to red color nearby 580 nm to 650 nm. However, the light emitting device having a desired luminescence color can be provided by variously changing the nitride phosphor.

It is preferable that the above-mentioned phosphor has further at least one or more of any one of a phosphor emitting blue light, a phosphor emitting green light and a phosphor emitting yellow light. The light emitting device having desired luminescence color such as not only a white color but also a pastel color can be provided by using the phosphor which emits light with various tinges in combination with the nitride phosphor related to the present invention. Further, the white color can be also finely adjusted to (yellowish) white, (greenish) white, (bluish) white and the like. The light emitting device having desired luminescence color such as not only a white color but also a pastel color can be provided by using the excitation light source which emits blue light, the nitride phosphor, and at least one or more of phosphors among any one of a phosphor emitting blue light, a phosphor emitting green light and a phosphor emitting yellow light.

The above-mentioned excitation light source is preferably a semiconductor light emitting element. The light emitting device which makes the most of the characteristics of the semiconductor light emitting element can be provided by using the semiconductor light emitting element. The characteristics of the semiconductor light emitting element are that it is a small size, has good electric efficiency and emits brilliant color light; it is excellent in the initial driving property and tough in vibration and the repetition of ON-Off switching; and the semiconductor light emitting element used for a light emitting element lamp has no fear of a burnt-out light bulb because of a semiconductor element, etc.

The above-mentioned second light emitting device becomes a light emitting device which emits light as a white color, by mixing the portion of light from the above-mentioned excitation light source which transmits between the particles of above-mentioned phosphor with the portion of light discharged from the above-mentioned phosphor which is subject to wavelength conversion by the light from the above-mentioned excitation light source, to be discharged. A light emitting device having high luminescence efficiency which emits white color light can be provided by the second light emitting device. For example, the nitride phosphor is excited by the light emitting element having blue light to emit yellow red light, and the phosphor emits excited yellow light, therefore the blue light passed between the nitride phosphor and the phosphor, the yellow red light of the nitride phosphor and the yellow light of the phosphor are recognized as a white color for human eyes, by the principle concerning the color mixture of light. Wherein said light emitting device is a light emitting device excellent in the average color rendering index (Ra). Said average color rendering index (Ra) is 80 or more. In particular, it is a light emitting device excellent in the specific color rendering index (R9) which is an index indicating a red component. Said specific color rendering index (R9) is 70 or more.

The relation of color names and chromaticity coordinate in the specification is wholly based on the JIS specification (JIS Z8110).

As described above, the fifth and the sixth nitride phosphors related to the present invention are phosphors which are extremely excellent in the luminescence properties such as luminescence brightness, quantum efficiency and the like. The second light emitting device related to the present invention can provide a light emitting device which has good luminescence efficiency and emits slightly reddish warm color white light. Said light emitting device is a light emitting device excellent in the average color rendering index (Ra) and the specific color rendering index (R9). Further, the light emitting device which emits light of a white color or a pastel color or the like can be provided by providing a light emitting device which combines a semiconductor light emitting element which emits blue light with the nitride phosphor related to the present invention; and by providing a light emitting device which combines a semiconductor light emitting element which emits light at near ultra violet, the nitride phosphor related to the present invention, the phosphor which emits green light and the phosphor which emits yellow light. Accordingly, the present invention has a technical meaning of providing the nitride phosphor and the light emitting device using thereof.

From the description mentioned above, according to the fifth and sixth nitride phosphors related to the present invention, there can be provided the nitride phosphor in which when the semiconductor light emitting element emitting blue light is used as the excitation light source, the light which was emitted by said semiconductor light emitting element is irradiated, and light having a different wavelength (which has a luminescence spectrum at a yellow to red region) is generated (carry out the wavelength conversion) by absorbing the light.

Further, the second light emitting device related to the present invention is a light emitting device which emits light of a white color system, and said white color system is the average color rendering index Ra of 80 or more and the specific color rendering index R9 of 70 or more which indicates red in particular. The light emitting device emitting white light which is excellent in color rendering property can be provided thereby.

Further, the light emitting device which designed a multi-color such as a pastel color can be provided by mixing one or more of the fifth and sixth nitride phosphors related to the present invention, the phosphor which emits blue light, the phosphor which emits green light and the phosphor which emits yellow light.

Further, the nitride phosphor in which afterglow and particle diameter were controlled at a fixed range can be provided.

Furthermore, the present invention has an extremely important technical meaning that the nitride phosphor in which the luminescence properties and durability were improved can be provided.

In order to solve the above-mentioned problems, the seventh to tenth nitride phosphors related to the present invention are any one of nitride phosphors which absorb at least the portion of light having the first luminescence spectrum and emits light having the second luminescence spectrum which is different from the above-mentioned first luminescence spectrum. They are the phosphor comprising the system below.

The seventh nitride phosphor related to the present invention is characterized in being an L-M-N:Eu, WR-base phosphor (wherein L contains at least one or more selected from a group of II valency consisting of Be, Mg, Ca, Sr, Ba and Zn. M contains at least one or more selected from a group of IV valency consisting of C, Si, Ge, Sn, Ti, Zr and Hf. N is nitrogen. Eu is europium. WR is the rare earth element). According to the seventh nitride phosphor related to the present invention, the improvement of the luminescence efficiencies such as high brightness and high quantum efficiency can be carried out. Further, the phosphor having extremely good temperature characteristic can be provided. In the seventh phosphor, a co-activator plays a role as a melting agent by combination of Eu being an activator and the rare earth element being a co-activator, and exhibits a flux effect. It is considered that the improvement of the luminescence efficiencies is carried out by the flux effect in the seventh phosphor, and it is considered that since the co-activator plays a role as a melting agent, sensitization action is exhibited and the luminescence efficiencies are improved. The fluorescence sensitization means that a sensitizer being an energy donor is activated together for enhancing luminescence intensity, utilizing the transmission action of energy.

The seventh nitride phosphor related to the present invention converts the wave length of light of the first luminescence spectrum which is discharged from, for example, a light emitting element, a lamp and the like, and emits light having the second luminescence spectrum which is situated at a region different from the first luminescence spectrum.

Further, the eighth nitride phosphor related to the present invention is characterized in being an L-M-O—N:Eu, WR (wherein L contains at least one or more selected from a group of II valency consisting of Be, Mg, Ca, Sr, Ba and Zn. M contains at least one or more selected from a group of IV valency consisting of C, Si, Ge, Sn, Ti, Zr and Hf. O is oxygen. N is nitrogen. Eu is europium. WR is the rare earth element). In the eighth phosphor, an oxide can be used as a raw material. Further, when the phosphor is produced, it is considered that oxygen is contained in a composition, but in the eighth nitride phosphor related to the present invention, a phosphor having high luminescence efficiencies can be provided even when oxygen is contained in the composition during the firing step.

The ninth nitride phosphor related to the present invention is characterized in being a Ca—Si—N:Eu, WR-base, or Sr—Si—N:Eu, WR-base, or Sr—Ca—Si—N:Eu, WR-base silicon nitride (wherein WR is the rare earth element). The phosphor having the second luminescence spectrum at a long wave length region can be provided thereby. The principle is that when light having the first luminescence spectrum nearby 460 nm is irradiated to the phosphor, the wave length conversion of said first luminescence spectrum is carried out, and the phosphor comes to have the second luminescence spectrum at a long wave length side of 580 to 700 nm. Further, in like manner as the above-mentioned description, the phosphor having high luminescence efficiencies can be provided by the flux effect and the sensitization effect in accordance with the introduction of a co-activator. Further, the phosphor having different color tone can be provided by co-activation. The color tone is determined by the x value and y value in a chromaticity chart. For example, in Table 8, the phosphor co-activated is shifted to a red side in comparison with a phosphor which is not co-activated. When a red component is desired to be strengthened, the ninth phosphor related to the present invention is extremely effective. Further, short afterglow and long afterglow can be made by carrying out co-activation. For example, when the light emitting device using the phosphor is used for a display, the shorter the afterglow is, the better it is, therefore it can be used as the phosphor for short afterglow.

As the light having the first luminescence spectrum, there is light from a light emitting element, a light emitting element lamp and the like which has a luminescence spectrum at a short wave length side of 360 to 495 nm. In the present ninth phosphor, it is preferable that it is used in combination with a blue light emitting element mainly having a luminescence spectrum at a short wave length side of 440 to 480 nm.

On the other hand, the second luminescence spectrum is a spectrum of light which the excited phosphor in which the phosphor is excited by the portion of light having the first luminescence spectrum emits. It is situated at a region different from the first luminescence spectrum. It is preferable that the second luminescence spectrum has at least one peak wave length nearby 560 to 700 nm.

The phosphor related to the present invention has a peak wave length nearby 600 to 680 nm.

The tenth nitride phosphor related to the present invention is characterized in being a Ca—Si—O—N:Eu, WR-base, or Sr—Si—O—N:Eu, WR-base, or Sr—Ca—Si—O—N:Eu, WR-base silicon nitride (wherein WR is the rare earth element). The tenth phosphor can be prepared using an oxide raw material. Further, in like manner as the above-mentioned description, the phosphor having high luminescence efficiencies can be provided by the flux effect and the sensitization effect in accordance with the introduction of a co-activator.

In the seventh to tenth nitride phosphors related to the present invention, it is preferable that at least one or more among Y, La, Ce, Pr, Nd, Gd, Tb, Dy, Ho, Er and Lu are contained as the above-mentioned WR. The phosphor having high luminescence efficiencies can be provided by using Y, La, Ce, Pr, Nd, Gd, Tb, Dy, Ho, Er and Lu among the rare earth element being a co-activator. It is considered that Y, La, Gd, Lu and the like have no luminescence center, therefore this is caused by the flux effect. Further, Pr, Dy, Tb, Ho, Er and the like among the rare earth element have the luminescence center, and it is considered that this is caused by the sensitization effect and the sensitization effect.

In the seventh to tenth phosphors related to the present invention, the amount of the above-mentioned WR added is preferably 10.0% by weight or less. When the amount of Eu being a co-activator and the concentration of WR being a co-activator exceed a fixed amount, the concentration quenching occurs and the luminescence efficiency are lowered, therefore it is preferable to add the co-activator WR within the above-mentioned range.

In the eighth and tenth phosphors related to the present invention, the content of the above-mentioned O is preferably 3.0% by weight or less based on the total composition amount. Oxygen is contained in the composition of the fifth and seventh phosphors related to the present invention. This is contained when an oxide is mainly used as a raw material. It is considered that the oxide raw material works as a melting agent. When these oxide raw materials are used, they are generally cheap in comparison with a metal raw material, therefore the cost of a raw material can be reduced. However, oxygen in the composition of the phosphor related to the present invention lowers occasionally the luminescence efficiencies. Accordingly, it is preferable that oxygen is removed to the outside of a system as much as possible. Then, comparing and considering the above-mentioned merit and demerit, the oxygen concentration in the composition of the above-mentioned phosphors was determined within the above-mentioned range. However, even if it is out of the above-mentioned range, adequate luminescence efficiencies are exhibited, therefore it is not limited within the range.

Further, Mn is preferably added in the seventh to tenth phosphors related to the present invention. When the Sr—Ca—Si—N:Eu, WR-base phosphor in which Mn or a Mn compound was added at production process is used, the luminescence efficiencies such as luminescence brightness, quantum efficiency and energy efficiency was improved than the Sr—Ca—Si—N:Eu, WR-base phosphor in which Mn was not added. This is considered because the Mn or a Mn compound accelerates the diffusion of $Eu^{2+}$ being an activator and enlarges the particle diameter, and crystallinity was improved. Further, this is considered because Mn works as a sensitizer in the phosphor in which $Eu^{2+}$ is an activator and the increase of the luminescence intensity of the $Eu^{2+}$ activator was carried out.

When Mn or a Mn compound was added at the production steps of the above-mentioned seventh to tenth phosphors, Mn is scattered at the firing step, and there is also a case that the less amount of Mn than the initial compounding amount added is contained in the composition of the phosphor being the final product. Accordingly, only the less amount of Mn than the initial compounding amount added is contained in the composition of the phosphor being the final product.

Oxides or hydroxy oxide products such as $MnO_2$, $Mn_2O_3$, $Mn_3O_4$ and MnOOH as the Mn added in the above-mentioned seventh to tenth phosphors are usually added, but it is not limited to these, a Mn metal, a Mn nitride, an imide, an amide or other inorganic salts thereof. Further, a condition in which it is previously contained in other raw material may be well. Further, with respect to the above-mentioned seventh to tenth phosphors, O is contained in the composition. It is considered that O is introduced from various Mn compounds being a raw material, or accelerates the effects of Eu diffusion, particle growth and the improvement of crystallinity. Namely, with respect to the effect of the Mn addition, similar effect is obtained even if a Mn compound is changed to a metal, nitride and oxide, and the effect of a case of using an oxide is rather great. As a result, a phosphor in which a trace amount of O is contained in the composition of the phosphor is produced. Even if a compound not containing oxygen in the Mn compound is used, O is introduced by other raw material such as $Eu_2O_3$, atmosphere and the like, and the above mentioned problems are solved thereby even if a compound containing oxygen is not used.

The addition amount of Mn in the seventh to tenth phosphors is preferably 0.001 to 0.3 mol based on L (Sr—Ca, Sr, Ca and the like). In particular, the addition amount of Mn in the above-mentioned phosphor is preferably 0.0025 to 0.03 mol based on L (Sr—Ca, Sr, Ca and the like). The luminescence efficiencies such as luminescence brightness, quantum efficiency and energy efficiency can be improved by adding Mn in the phosphor during production step or in a raw material.

In the above-mentioned seventh to tenth phosphors, the residual amount of Mn is preferably 5000 ppm or less. The luminescence efficiencies can be improved by adding Mn in the above-mentioned phosphor. However, since Mn is scattered during firing and the like, the amount of Mn added in a raw material is different from the amount of Mn in the composition after production.

In the above-mentioned seventh to tenth phosphors, it is preferable that there are contained at least one or more selected from a group consisting of Mg, Sr, Ba, Zn, Ca, Ga, In, B, Al, Cu, Li, Na, K, Re, Ni, Cr, Mo, O and Fe. The luminescence efficiencies such as luminescence brightness and quantum efficiency can be improved by adding elements such as Mn and B in the above-mentioned phosphors. The reason is considered to be that the particle diameter of powder becomes homogeneous and big by containing the component constituting elements such as Mg and B in the base nitride phosphor such as Eu and WR, and crystallinity is remarkably improved. The wave length of the portion of light having the first luminescence spectrum can be converted at high efficiency by improving the crystallinity, and the phosphor having good luminescence efficiencies is obtained. Further, the afterglow property of the phosphor can arbitrarily be adjusted by adding the above-mentioned element. The afterglow property is important in a display device such as a display and PDP on which displays are continuously and repeatedly carried out. To the contrary, the afterglow can be suppressed by slightly containing B, Mg, Cr, Ni, Al and the like in the base nitride phosphor of the phosphor. The phosphor related to the present invention can be used for a display device such as a display. Further, even if an oxide such as $H_3BO_3$ is added for adding B and the like, the luminescence properties are not lowered, and it is considered that O plays also an important role in the diffusion process as described above. Thus, the particle diameter of the phosphor, crystallinity and energy transmission passage are changed by containing the component constituting elements such as Mg and B in the above-mentioned silicone nitride, absorption, reflection and scattering are changed, and the luminescence properties of a light emitting device such as luminescence and take-out of light, afterglow and the like are changed. In other word, the phosphor having the optimum luminescence properties at constituting a light emitting device can be produced by adjusting these.

Further, Sr, Ca, B and the like are mixed with the base nitride phosphor of L-M-N:Eu, WR to be a mix crystal. The peak wave length can be shifted to a short wave length side or a long wave length side by being the mix crystal.

The above-mentioned seventh to tenth phosphors are preferably a mean particle diameter of 3 μm or more. The phosphors of Sr—Ca—Si—N:Eu, WR-base, Sr—Si—N:Eu, WR-base, and Ca—Si—N:Eu, WR-base are a mean particle diameter of about 1 to 2 μm, but the above-mentioned silicon nitride to which Mn was added can be a mean particle diameter of 3 μm or more. According to the difference of the particle diameter, there are advantages that the larger the particle diameter is, the more the luminescence brightness of the phosphor is improved, and the light take-out efficiency in a light emitting device is raised, etc.

The third light emitting device related to the present invention is a light emitting device which has at least a light emitting element which emits light having the first luminescence spectrum and a phosphor which absorbs at least the portion of light of the above-mentioned first luminescence spectrum and emits light having the second luminescence spectrum which is different from the above-mentioned first luminescence spectrum; and the above-mentioned phosphor is characterized in using any one of the seventh to tenth phosphors related to the present invention. The light emitting device which emits light being a different color from the color which the light emitting device has can be provided thereby. For example, the light emitting device which emits light of a white color by combining blue and yellow, red and blue green, green and red purple and the like which are in the relation of a complementary color. However, it is not limited to the white color, but the light emitting device having a desired luminescence color can be provided. Specifically, there can be constituted the light emitting device which emits a warm color-base white color which is slightly reddish by mixing blue light which is emitted from a blue light emitting element and yellow red light which was emitted by the wave length conversion by the phosphor, by using the blue light emitting element which has the first luminescence spectrum nearby 440 to 480 nm and using the Sr—Ca—Si—N:Eu, WR-base phosphor which carries out the wave length conversion of the portion of light of said first luminescence spectrum and emits light of the second luminescence spectrum at 600 to 660 nm.

The phosphor used for the third light emitting device related to the present invention is not limited to one kind, and a combination of 2 or more of phosphors having different peak wave lengths can be used. For example, the Sr—Ca—Si—N:Eu, AR-base phosphor has a luminescence spectrum nearby 650 nm, and on the contrary, the Sr—Si—N:Eu, WR-base phosphor has a luminescence spectrum nearby 620 nm. The phosphor having peak wave length at a desired position within a wave length range of 620 to 650 nm can be produced. The light emitting device using the phosphor which combined 2 kind of phosphors can make a luminescence color different from a light emitting device using only one phosphor. The light emitting device having a desired luminescence color can be provided thereby.

The phosphor which is used in combination with the above-mentioned seventh to tenth phosphors is preferably one or 2 or more of any one of a yttrium-aluminum oxide phosphor activated by cerium, a yttrium-gadolinium-aluminum oxide phosphor activated by cerium, and a yttrium-gallium-aluminum oxide phosphor activated by cerium. As one example of the yttrium-aluminum oxide phosphor activated by cerium, there is $Y_3Al_5O_{12}$:Ce. As one example of the yttrium-gadolinium-aluminum oxide phosphor activated by cerium, there is $(Y_{0.8}Gd_{0.2})_3Al_5O_{12}$:Ce. As one example of the yttrium-gallium-aluminum oxide phosphor activated by cerium, there is $Y_3(Al_{0.8}Ga_{0.2})_5O_{12}$:Ce. The light emitting device which emits a desired white light can be provided by combining the seventh to tenth phosphors related to the present invention and the yttrium-aluminum oxide phosphor activated by cerium and the like with the above-mentioned blue light emitting element. The light emitting device which is constituted by the combination of the blue light emitting element and the yttrium-aluminum oxide phosphor activated by cerium exhibits a slightly pale white color, and since the warm color tinge was insufficient, the warm color tinge was compensated by containing the phosphor related to the present invention. Further, the light emitting device having a white color with various tinges can be provided by appropriately changing the compounding amount of the phosphors.

As described above, the third light emitting device related to the present invention has a technical meaning that the light emitting device having good luminescence efficiency which emits light of a warm color-base reddish white color can be provided. Further, it has a technical meaning that the phosphor having a luminescence spectrum at a yellow to red region which is used in combination with a blue light emitting element and the like can be provided.

As described above, according to the third light emitting device of the present invention, it has extremely important technical meanings that the light emitting device having good luminescence efficiency which emits light of a warm color-base reddish white color can be provided; further, the phosphor having a luminescence spectrum at yellow to red regions which is used in combination with a blue light emitting element and the like can be provided; and further, the phosphor in which the improvement of efficiency and durability was designed can be provided.

In order to solve the above-mentioned problems, the eleventh to thirteenth phosphors related to the present invention is a phosphor which absorbs at least the portion of light having the first luminescence spectrum and emits light having the second luminescence spectrum which is different from the above-mentioned first luminescence spectrum, and consists of silicon nitride below.

The eleventh phosphor related to the present invention is characterized in being a Sr—Ca—Si—N:R-base silicon nitride phosphor comprises Mn wherein R is one or more rare earth elements in which Eu is essential. The phosphor having the second luminescence spectrum at a long wave length side can be provided thereby. Namely, when light having the first luminescence spectrum nearby 460 nm is irradiated to the eleventh phosphor, the wave length conversion of said first luminescence spectrum is carried out, and light having the second luminescence spectrum at a long wave length side of 580 to 700 nm is emitted.

The Sr—Ca—Si—N:R-base silicon nitride phosphor in which Mn or a Mn compound was added at production process improves the luminescence efficiencies such as luminescence brightness, quantum efficiency and energy efficiency than the Sr—Ca—Si—N:R-base silicon nitride phosphor in which Mn was not added. This is considered because the Mn or a Mn compound accelerates the diffusion of $Eu^{2+}$ being an activator and enlarges the particle diameter, and crystallinity was improved. Further, this is considered because Mn works as a sensitizer in the phosphor in which $Eu^{2+}$ is an activator and the increase of the luminescence intensity of the $Eu^{2+}$ activator was carried out. The fluorescence sensitization means that a sensitizer which is an energy donor is activated together for enhancing luminescence intensity utilizing energy transmission action.

Hereat, the first luminescence spectrum is, for example, light from a light emitting element, a light emitting element lamp and the like which has a luminescence spectrum at a short wave length side of 360 to 495 nm. It is preferable that the light emitting element at this wave length is a blue light emitting element having a luminescence spectrum nearby 440 to 480 nm. On the other hand, the second luminescence spectrum is a luminescence spectrum at a wave length region different from the first luminescence spectrum, and a luminescence spectrum of light which the excited phosphor in which the phosphor is excited by at least the portion of light having the first luminescence spectrum emits (wavelength conversion). It is preferable that the second luminescence spectrum has one peak wave length nearby 560 to 700 nm, as at least one portion. The eleventh phosphor related to the present invention has a peak wave length nearby 600 to 680 nm.

Mn or a Mn compound is added at the production process of the above-mentioned and later-mentioned silicon nitride phosphors, Mn is scattered at the firing step, and there is also a case that the less trace amount of Mn than the initial compounding amount added is contained in the composition of the silicon nitride phosphor being the final product. Accordingly, there remains the less amount of Mn than the initial compounding amount added in the composition of the silicon nitride phosphor being the final product.

The twelfth phosphor related to the present invention is characterized in being a Sr—Si—N:R-base silicon nitride phosphor comprises Mn wherein R is one or more rare earth elements in which Eu is essential. In case of the silicon nitride of this system, luminescence efficiency is more improved by adding Mn at a production step than a case of not adding Mn. The effect which Mn exerts to the Sr—Si—N:Eu-base silicon nitride is similar as the above description, and this is considered because the Mn accelerates the diffusion of $Eu^{2+}$ being an activator and enlarges the particle diameter, and crystallinity was improved. Further, this is considered because Mn works as a sensitizer in the phosphor in which $Eu^{2+}$ is an activator and the increase of the luminescence intensity of the $Eu^{2+}$ activator was carried out. The Sr—Si—N:R-base silicon nitride phosphor related to the present invention has a composition and luminescence spectrum different from the above-mentioned Sr—Ca—Si—N:R-base silicon nitride phosphor, and has a peak wave length nearby 610 to 630 nm.

The thirteenth phosphor related to the present invention is characterized in being a Ca—Si—N:R-base silicon nitride phosphor comprises Mn wherein R is one or more rare earth elements in which Eu is essential. The effect of adding Mn is similar as the above description. However, the Ca—Si—N:R-base silicon nitride to which Mn was added has a peak wave length nearby 600 to 620 nm.

Mn which is added to the silicon nitride constituting the above-mentioned eleventh to thirteenth phosphors is usually added by oxides or hydroxy oxide products such as $MnO_2$, $Mn_2O_3$, $Mn_3O_4$ and MnOOH, but it is not limited to these, and may be a Mn metal, a Mn nitride, an imide, an amide or other inorganic salts thereof. Further, a condition in which it is previously contained in other raw material may be well. Further, O is contained in the composition of the above-mentioned silicon nitride. It is considered that O is introduced from various Mn compounds being a raw material, or accelerates the effects of Eu diffusion, particle growth and the improvement of crystallinity. Namely, with respect to the effect of the Mn addition, a similar effect is obtained even if a Mn compound is changed to a metal, nitride and oxide. The effect of a case of using an oxide is rather great. As a result, the phosphor in which a trace amount of O is contained in the composition of silicon nitride is produced. Accordingly, base nitride phosphor are Sr—Ca—Si—O—N:R, Sr—Si—O—N:R and Ca—Si—O—N:R. Thus, even if a compound not containing oxygen in the Mn compound is used, O is introduced by other raw material such as $Eu_2O_3$, atmosphere and the like, and Eu diffusion, particle growth and the improvement of crystallinity are accelerated by Mn even if a compound containing oxygen is not used.

The content of the above-mentioned O is preferably 3% by weight or less based on the amount of total composition. The luminescence efficiency can be improved thereby.

In the above-mentioned silicon nitride, it is preferable that there are contained at least one or more selected from a group consisting of Mg, Sr, Ca, Ba, Zn, B, Al, Cu, Mn, Cr and Ni. The luminescence efficiencies such as luminescence brightness and quantum efficiency can be improved by containing at least the component constituting elements such as Mn and B in the above-mentioned silicon nitride. The reason is considered to be that the particle diameter of powder becomes homogeneous and big by containing the component constituting elements such as Mg and B in the above-mentioned base nitride phosphor, and crystallinity is remarkably improved. The wave length of the first luminescence spectrum can be converted at high efficiency by improving the crystallinity, and the phosphor having good luminescence efficiencies which has the second luminescence spectrum is obtained. Further, the afterglow property of the phosphor can be arbitrarily adjusted. The afterglow property is important in a display device such as a display and PDP on which displays are continuously and repeatedly carried out. Accordingly, the afterglow can be suppressed by slightly containing B, Mg, Cr, Ni, Al and the like in the base nitride phosphor of the phosphor. Thus, the phosphor related to the present invention can be used for a display device such as a display. Further, even if oxides such as $MnO_2$, $Mn_2O_3$, $Mn_3O_4$ and $H_3BO_3$ are added for adding B and the like, the luminescence properties are not lowered, and it is considered that O plays also an important role in the diffusion process as described above. Thus, the particle diameter of the phosphor, crystallinity and energy transmission passage are changed by containing the component constituting elements such as Mg and B in the above-mentioned silicone nitride, absorption, reflection and scattering are changed, and the luminescence properties in a light emitting device such as luminescence and take-out of light, afterglow and the like are changed. In other word, the phosphor utilized for a light emitting device is optimized by utilizing this.

With respect to the Sr—Ca—Si—N:R-base silicon nitride, the molar ratio of Sr to Ca is preferably Sr:Ca=1 to 9:9 to 1. In particular, for the Sr—Ca—Si—N:Eu-base silicon nitride, the molar ratio of Sr to Ca is preferably Sr:Ca=1:1. The second luminescence spectrum can be shifted to a long wave length side by changing the molar ratio of Sr to Ca. In the later-mentioned Table 501, with respect to the phosphors having a composition of Sr:Ca=9:1 and Sr:Ca=1:9, the peak wave length is 624 nm and 609 nm, and to the contrary, when the molar ratio of Sr to Ca is gradually changed to Sr:Ca=7:3, Sr:Ca=6:4, and Sr:Ca=3:7, Sr:Ca=4:6, the peak wave length is 639 nm, 643 nm, and 636 nm, 642 nm and thus, the peak wave length can be shifted to a long wave length side. Thus, the phosphor having the peak wave length at a longer wave length side can be produced. Further, when the molar ratio of Sr to Ca is changed, there can be produced the phosphor having the peak wave length at the longest wave length side in which the peak wave length is 644 nm. The luminescence brightness can be improved by changing the molar ratio of Sr to Ca. In Table 1, the luminescence property at Sr:Ca=9:1 is referred to as 100%. When the molar amount of Ca is increased against Sr, the luminescence brightness is 170.3% at Sr:Ca=1:9 and the luminescence brightness is improved by 70.3%. Further, the quantum efficiency is improved by changing the molar ratio of Sr to Ca. In Table 501, the quantum efficiency was 100% at Sr:Ca=9:1, but the quantum efficiency is improved to be 167.7% at Sr:Ca=5:5. Thus, the luminescence efficiency can be improved by changing the molar ratio of Sr to Ca.

The compounding amount of R in the above-mentioned phosphor is preferably 0.003 to 0.5 mol based on Sr—Ca, Sr and Ca. In particular, the compounding amount of R in the above-mentioned phosphor is preferably 0.005 to 0.1 mol based on Sr—Ca, Sr and Ca. The peak wave length can be shifted to a long wave length side by changing the compounding amount of R. Further, the luminescence efficiencies such as luminescence brightness and quantum efficiency can be improved. In the later-mentioned Tables 16 to 18, there are shown test results in which the compounding amount of Eu in the Sr—Ca—Si—N:Eu-base silicon nitride was changed. For example, in Table 16, when Eu is 0.005 mol based on Sr—Ca at Sr:Ca=7:3, the peak wave length is 624 nm, the luminescence brightness is 100% and the quantum efficiency is 100%, but when Eu is 0.03 mol, the peak wave length is 637 nm, the luminescence brightness is 139.5% and the quantum efficiency is 199.2%, and the luminescence characteristics become extremely good.

The addition amount of Mn in the above-mentioned phosphor is preferably 0.001 to 0.3 mol based on Sr—Ca, Sr and Ca. In particular, the addition amount of Mn in the above-mentioned phosphor is preferably 0.0025 to 0.03 mol based on Sr—Ca, Sr and Ca. The luminescence efficiencies such as luminescence brightness, energy efficiency and quantum efficiency can be improved by adding Mn in the silicon nitride phosphor during production steps or in a raw material. In the Tables 405 to 409 mentioned later, there are shown the test results in which the addition amount of Mn in the Ca—Si—N:Eu-base silicon nitride was changed. For example, in Tables 19 to 23, when the luminescence brightness is 100% and the quantum efficiency is 100% based on the silicon nitride phosphor to which no Mn was added, the luminescence brightness is 115.3% and the quantum efficiency is 117.4% for the silicon nitride phosphor to which 0.015 mol of Mn based on Ca was added. Thus, the luminescence efficiencies such as luminescence brightness and quantum efficiency can be improved.

It is preferable that the above-mentioned phosphor consists of any one of combinations of the eleventh phosphor and the twelfth phosphor, the twelfth phosphor and the thirteenth phosphor, and the eleventh phosphor and the thirteenth phosphor. For example, the phosphor consisting of the combinations of the eleventh phosphor and the twelfth phosphor means the phosphor mixing the Sr—Ca—Si—N:Eu-base silicon nitride phosphor with the Sr—Si—N:Eu-base silicon nitride phosphor. For example, the Sr—Ca—Si—N:Eu-base silicon nitride phosphor has the luminescence spectrum nearby 650 nm, and on the contrary, the Sr—Si—N:Eu-base silicon nitride phosphor has the luminescence spectrum nearby 620 nm. The phosphor having the peak wave length at a desired position at a wave length range of 620 to 650 nm can be produced by mixing the desired amount of the mixed phosphor. In addition to the above-mentioned combinations, there can be also produced the phosphor mixing the Sr—Ca—Si—N:Eu-base silicon nitride phosphor with the Ca—Si—N:Eu-base silicon nitride phosphor, and the phosphor mixing the Sr—Ca—Si—N:Eu-base silicon nitride phosphor, the Sr—Si—N:Eu-base silicon nitride phosphor and the Ca—Si—N:Eu-base silicon nitride phosphor. The phosphor having the peak wave length at a desired position at a wave length range of 600 to 680 nm can be produced by these combinations.

The eleventh to thirteenth phosphors related to the present invention are preferably a phosphor characterized in having a particle diameter of 3 μm or more. The Sr—Ca—Si—N:Eu-base, Sr—Si—N:Eu-base and Ca—Si—N:Eu-base silicon nitride phosphors to which no Mn is added have a particle diameter of about 1 to 2 μm, but the above-mentioned silicon nitrides to which Mn is added have a particle diameter of 3 μm or more. There are advantages that when the particle diameter is large, the luminescence brightness is improved by the difference of the particle diameter, and the light take-out efficiency is improved, etc.

With respect to the eleventh to thirteenth phosphors related to the present invention, the residual amount of Mn is preferably 5000 ppm or less. Because the above-mentioned effects are obtained by adding Mn in the eleventh to thirteenth phosphors related to the present invention. However, since Mn is scattered at firing, the amount of Mn added in a raw material is different from the amount of Mn in the composition after production.

The fourth light emitting device related to the present invention is a light emitting device which has at least a light emitting element which emits light having the first luminescence spectrum and a phosphor which absorbs at least the portion of light of the above-mentioned first luminescence spectrum and emits light having the second luminescence spectrum which is different from the above-mentioned first luminescence spectrum (wavelength is converted); and the above-mentioned phosphor is characterized in using the eleventh to thirteenth phosphors related to the present invention. For example, there can be provided the light emitting device which emits light of a warm color-base white color which is slightly reddish by mixing blue light which is emitted from a blue light emitting element and yellow red light which was emitted by the wave length conversion by the phosphor, by using the blue light emitting element which has the first luminescence spectrum nearby 440 to 480 nm and using the phosphor related to the present invention which carries out the wave length conversion of said first luminescence spectrum and emits light of the second luminescence spectrum at 600 to 660 nm.

It is preferable that the above-mentioned phosphors contain the yttrium-aluminum oxide phosphor activated by cerium, the yttrium-gadolinium-aluminum oxide phosphor activated by cerium, and the yttrium-gallium-aluminum oxide phosphor activated by cerium. As one example of the yttrium-aluminum oxide phosphor activated by cerium, there is $Y_3Al_5O_{12}$:Ce. As one example of the yttrium-gadolinium-aluminum oxide phosphor activated by cerium, there is $(Y_{0.8}Gd_{0.2})_3Al_5O_{12}$:Ce. As one example of the yttrium-gallium-aluminum oxide phosphor activated by cerium, there is $Y_3(Al_{0.8}Ga_{0.2})_5O_{12}$:Ce. The light emitting device which emits a desired white light can be provided by combining the phosphors related to the present invention and the yttrium-aluminum oxide phosphor activated by cerium and the like with the above-mentioned blue light emitting element. The light emitting device which is constituted by the combination of the blue light emitting element and the yttrium-aluminum oxide phosphor activated by cerium exhibits a slightly pale white color, and since the warm color tinge was insufficient, the warm color tinge can be compensated by containing the phosphor related to the present invention. Further, the light emitting device having a white color with various tinges can be provided by appropriately changing the compounding amount of the phosphors.

As described above, the fourth light emitting device of the present invention has a technical meaning that the light emitting device having good luminescence efficiency which emits light of a warm color-base reddish white color can be provided. Further, it has a technical meaning that the phosphor having a luminescence spectrum at yellow to red regions which is used in combination with a blue light emitting element and the like can be provided.

In order to solve the above-mentioned problems, the fourteenth nitride phosphor related to the present invention is a nitride phosphor which contains at least nitrogen, and absorbs at least the portion of light having the first luminescence spectrum and emits light having the second luminescence spectrum which is different from the above-mentioned first luminescence spectrum; and characterized in that the above-mentioned nitride phosphor is represented by the general formula $L_XM_YN_{(2/3)X+(4/3)Y}$:R (wherein L is at least one or more selected from a group consisting of II valency of Be, Mg, Ca, Sr, Ba, Zn, Cd and Hg, M is at least one or more selected from a group consisting of IV valency of C, Si, Ge, Sn, Ti, Zr and Hf, and R is an activator), and contains at least one or more selected from a group consisting of Mg, Sr, Ba, Zn, Ca, Ga, In, B, Al, Cu, Mn, Li, Na, K, Re, Ni, Cr, Mo, O and Fe. The luminescence efficiencies such as luminescence brightness, energy efficiency and quantum efficiency can be improved by containing the component constituting elements such as Mn and B in the above-mentioned fourteenth nitride phosphor. The reason is considered to be that the particle diameter of powder becomes homogeneous and big by containing the component constituting elements such as Mg and B, and crystallinity is remarkably improved. The wave length of the first luminescence spectrum can be converted at high efficiency by improving the crystallinity, and the phosphor having good luminescence efficiencies can be obtained. Further, the afterglow property of the phosphor can be arbitrarily adjusted by the present fourteenth nitride phosphor. The afterglow property is important in a display device such as a display and PDP on which displays are continuously and repeatedly carried out. Accordingly, the afterglow can be suppressed by slightly containing B, Mg, Cr, Ni, Al and the like in the above-mentioned fourteenth nitride phosphor. Thus, the nitride phosphor related to the present invention can be used for a display device such as a display. Thus, the particle diameter of the phosphor, crystallinity and energy transmission passage are changed by adding a elements which are different from the element contained in the base nitride phosphor; absorption, reflection and scattering are changed; and the luminescence properties in a light emitting device such as luminescence and take-out of light, afterglow and the like are greatly influenced.

It is preferable that the above-mentioned fourteenth nitride phosphor is represented by the general formula $L_XM_YN_{(2/3)X+(4/3)Y}$:R (wherein L is at least one or more selected from a group consisting of II valency of Mg, Ca, Sr and Ba, M is Si, and R is an activator), and contains at least one or more selected from a group consisting of Mg, Sr, Ba, Zn, B, Al, Cu, Mn, Cr, O and Ni. Because the nitride phosphor hardly decomposed and having high reliability and good crystallinity can be provided by limiting L as Mg, Ca, Sr and Ba and limiting M as Si. In accordance with this, the light emitting device having good life property (long life) can be provided. When the light emitting device is constituted by utilizing the fourteenth nitride phosphor and a blue LED having a peak wave length nearby 400 to 460 nm as a light source which emits light of the first luminescence spectrum, the light emitting device having the peak wave length nearby 560 to 680 nm which emits white light can be produced.

The activator represented by the above-mentioned R is preferably Eu. Thus, there is prepared a phosphor which absorbs light having the first luminescence spectrum nearby 250 to 480 nm and has the second luminescence spectrum which is different from the first luminescence spectrum, in particular, has a peak at a yellow to red region, by said absorption.

Specifically, there can be provided a phosphor which shows the maximum wave length nearby 580 to 620 nm when light having the first luminescence spectrum which was excited at 460 nm is irradiated to the fourteenth nitride phosphor. Thus, the light emitting device emitting light of a white color can be provided by using a blue LED and the fourteenth nitride phosphor related to the present invention, in combination.

The activator represented by the above-mentioned R is preferably those containing at least one or more among Mn, B, Ce, Mg, Cu, Al and Eu. Thus, there can be provided the light emitting device having good luminescence properties which exhibits the maximum wave length at a region which is different from a case of using only Eu as an activator.

The above-mentioned X and Y are preferably X=2 and Y=5. Namely, the base nitride phosphor is preferably represented by $L_2M_5N_8$:R. The nitride phosphor having good crystallinity can be provided thereby. However, since the portion of L is substituted with Z, the total molar number of L and Z become X=2. Namely, in case of $Z_{0.03}$, the base nitride phosphor is preferably represented by $L_{1.97}Z_{0.03}M_5N_8$.

The above-mentioned X and Y are preferably X=1 and Y=7. Namely, the base nitride phosphor is preferably represented by $LM_7N_{10}$:R. The nitride phosphor having good crystallinity can be provided thereby.

The above-mentioned L and the above-mentioned R has preferably a molar ratio of L:R=1:0.001 to 1. The nitride phosphor having high luminescence brightness can be obtained by setting the compounding proportion of R in the base nitride phosphor represented by $L_XM_YN_{((2/3)X+(4/3)Y)}$:R within the above-mentioned range. Further, The nitride phosphor having good temperature characteristic can be provided. The relation of molar ratio is preferably L:R=1:0.003 to 0.05. When the molar ratio is within the range, the nitride phosphor having high luminescence brightness and good temperature characteristic can be provided. Further, since the Eu compound of a raw material is expensive, the more economic phosphor can be produced by reducing the compounding ratio of the Eu compound.

The size of the above-mentioned fourteenth nitride phosphor is preferably a mean particle diameter of 0.1 to 10 μm. In case of light emitting devices such as LED and an LED lamp, the optimum film thickness of the phosphor is proportional to about the mean particle diameter, and the smaller the particle diameter is, the less the coating amount is. On the other hand, the phosphor having a larger particle diameter has usually large luminescence efficiency. According to the present invention, there can be provided the nitride phosphor having high luminescence brightness, energy efficiency and quantum efficiency and good luminescence properties, and the nitride phosphor easily treated which can reduce the coating amount can be provided.

In the above-mentioned fourteenth nitride phosphor, the second luminescence spectrum has preferably at least one or more peaks at a yellow to red region. The light emitting device which emits light of a warm color-base white color can be provided by using a blue LED and the nitride phosphor having the second luminescence spectrum at a yellow to red region, in combination.

The above-mentioned second luminescence spectrum has preferably at least one or more peaks within a wave length range of 520 nm to 780 nm. The light emitting device which emits light of a warm color-base white color can be provided by using an ultraviolet or blue LED having a peak at 400 to 460 nm and the nitride phosphor having the second luminescence spectrum at a wave length range of 570 nm to 730 nm.

The second production process of the nitride phosphor related to the present invention is the production process of a nitride phosphor which is represented by the general formula $L_XM_YN_{((2/3)X+(4/3)Y)}$:R (wherein L is at least one or more selected from a group consisting of II valency of Be, Mg, Ca, Sr, Ba, Zn, Cd and Hg, M is at least one or more selected from a group consisting of IV valency of C, Si, Ge, Sn, Ti, Zr and Hf, and R is an activator), and contains at least one or more selected from a group consisting of Mg, Sr, Ba, Zn, Ca, Ga, In, B, Al, Cu, Mn, Li, Na, K, Re, Ni, Cr, Mo, O and Fe; and characterized in having a step of firing the raw material of the above-mentioned nitride phosphor in ammonia atmosphere. In the firing step, nitrogen containing several % of hydrogen is usually used as a reducing gas, but since hydrogen is eroded into a crucible and the like, the material of the crucible eroded comes to be contained in the composition of the phosphor. The material of the crucible contained in the composition of the phosphor becomes impurities and it causes the lowering of the luminescence efficiencies such as luminescence brightness, energy efficiency and quantum efficiency. Accordingly, since the firing is carried out in the ammonia atmosphere, the erosion of the crucible is prevented, and the phosphor having high luminescence efficiencies which does not contain the impurities can be produced. Further, since reactivity is improved in the ammonia atmosphere, the phosphor having extremely high yield can be produced.

The above-mentioned firing is preferably carried out using a crucible made of boron nitride. A molybdenum crucible has a fear of inhibiting luminescence and inhibiting the reaction system. On the other hand, when the crucible made of boron nitride is used, it does not inhibit the luminescence and inhibit the reaction system, therefore the phosphor having extremely high purity can be produced. Further, the crucible made of boron nitride is decomposed in hydrogen and nitrogen, it cannot be used in hydrogen and nitrogen atmosphere.

The fifth light emitting device related to the present invention is a light emitting device which has a semiconductor light emitting element emitting the first luminescence spectrum and a phosphor which absorbs at least the portion of light having the above-mentioned first luminescence spectrum and emits light having the second luminescence spectrum which is different from the above-mentioned first luminescence spectrum; and characterized in containing the fourteenth nitride phosphor related to the present invention in the above-mentioned phosphor. The light emitting device which emits light of a warm color-base white color can be constituted thereby.

It is preferable that the above-mentioned phosphor contains the yttrium-aluminum oxide phosphor substance activated by cerium. A desired luminescence color can be adjusted by containing the YAG fluorescent substance. In the light emitting device using a blue LED and the YAG phosphor, there are chromaticity coordinate x=0.348, y=0.367, and color temperature=4938K, and the luminescence of a pale white color is observed by visual observation. On the contrary, in the light emitting device using a blue LED and a mixture of the fourteenth nitride phosphor and the YAG phosphor, there are chromaticity coordinate x=0.454, y=0.416, and color temperature=2828K, and the luminescence of a warm color-base white color is observed by visual observation. The warm color-base white color light emitting device which is soft to eyes can be provided by the light emitting device using a blue LED and a mixture of the fourteenth nitride phosphor and the YAG phosphor. In particular, the electric bulb color light emitting device can be provided. Further, the light emitting device which can emit blue, green, red and other various colors can be provided by using a semiconductor light emitting element and the phosphor extremely excellent in luminescence property in combination, without limiting to the YAG phosphor.

The weight ratio of the above-mentioned yttrium-aluminum oxide phosphor substance activated by cerium and the above-mentioned nitride phosphor which are contained in the above-mentioned phosphor is preferably mixed at a ratio of 1 to 15:1. The fine adjustment of color temperature can be carried out by changing the compounding amount of the YAG phosphor and the above-mentioned nitride phosphor. In particular, the light emitting device which having good luminescence efficiencies which emits light of a warm color-base white color can be provided.

The above-mentioned first luminescence spectrum has a luminescence peak at 360 to 550 nm, and it is preferable that white color-base luminescence is carried out by mixing light which the phosphor which was excited by at least the portion light of the above-mentioned first luminescence spectrum emits, with the portion of light of the above-mentioned first luminescence spectrum, to be discharged. An ultraviolet LED having the luminescence wave length of an excitation wave length EX=400 nm can be used for the first luminescence spectrum in addition to be able to use a blue LED having the luminescence wave length of an excitation wave length EX=460 nm. Since the ultraviolet LED is not visible light, a person (eyes) cannot feel the fine change of luminescence in accordance with the current change, therefore there is no color change. Since the nitride phosphor related to the present invention absorbs light of luminescence wave length nearby 360 to 480 nm, an ultraviolet LED having EX=400 nm can be used. Accordingly, the light emitting device which emits light of a white color can be provided by combining it with the phosphor which emits light of the first luminescence spectrum which has a luminescence peak nearby 360 to 550 nm.

The above-mentioned phosphor is a powder or a granule, and preferably contained in a light transmitting material. The fine adjustment of the luminescence color can be easily carried out, and the luminescence efficiencies can be enhanced thereby.

The above-mentioned semiconductor light emitting element is preferably the III Group nitride-base compound semiconductor light emitting element. The luminescence brightness is enhanced thereby and the light emitting device having high reliability can be provided. When all or the portion of the semiconductor light emitting element is covered with the nitride phosphor related to the present invention, various problems such as deterioration, repulsion and pealing which are generated between the interface of the nitride phosphor and the semiconductor light emitting element can be suppressed by using the same material.

The above-mentioned light emitting device is preferably the average color rendering index Ra of 75 to 95 and a color temperature of 2000K to 8000K. The light emitting device which emits light of a warm color-base white color can be provided thereby. In particular, the color temperature is preferably 3000K to 5000K, and the light emitting device which emits light of an electric bulb color can be provided. Further, the light emitting device which emits light of a reddish white color can be provided by enhancing the specific color rendering index R9.

According to the above description, the present invention has technical meanings that the light emitting device which emits light of a reddish white color can be produced, and the nitride phosphor having a luminescence spectrum at a yellow to red region which is used in combination with a blue LED and the like can be produced.

Accordingly, the present invention can provide the phosphor having high luminescence brightness, and specifically, can provide the phosphor having excellent luminescence properties which emits light of a reddish warm color-base white color by using a semiconductor light emitting element which emits light of a luminescence spectrum at an ultraviolet to blue region and converting light from said semiconductor light emitting element by so-called color tone. Further, the phosphor having short afterglow can be provided. Furthermore, the light emitting device which emits light of a white color can be provided by combining the blue semiconductor light emitting element and the above-mentioned phosphor.

The fourteenth phosphor related to the present invention can be used for a fluorescent display tube, a display, a PDP, a CRT, an FL, an FED and a projecting tube, in particular, a light emitting device using a blue light emitting diode or an ultraviolet light emitting diode as a light source, a fluorescent lamp used for illumination for a display at a shop-window, illumination for medical spot and the like. Additionally, it can be applied to the back light of a cellular telephone, a light emitting diode (LED) and the like.

Thus, the present invention solves problems which have been not solved conventionally, and has an extremely superior technical meaning.

In order to solve the above-mentioned problems, the third production process of the nitride phosphor related to the present invention is the production process of a nitride phosphor which contains at least nitrogen, and absorbs at least the portion of light having the first luminescence spectrum and emits light having the second luminescence spectrum which is different from the above-mentioned first luminescence spectrum, and characterized in having a step of carrying out firing in ammonia atmosphere.

The production process of a conventional phosphor (for example, described in International Open Patent No. 01/40403) is that raw materials such as an adequately purified mother body and an activator were mixed, then, the mixture is charged in a molybdenum crucible and it is conducted through a step of being baked in a furnace.

In the method described in the International Open Patent No. 01/40403, the step of firing is carried out under a mix gas atmosphere of hydrogen (3.75%) and nitrogen (400 l/h). To the contrary, it is carried out in ammonia atmosphere, in the production process related to the present invention, and thus, a phosphor having an extremely high yield which shows luminescence property of high brightness can be produced.

The comparison result of Example which is related with the third production process related to the present invention, with Comparative Example (Comparative Example 10) is shown in Table 32 (which is specifically described in the Mode 2 of Operation of The Invention). In Table 32, Comparative Example 10 and Example which is related with the third production process related to the present invention are carried out under the same condition excluding the step of firing. Comparative Example 10 is baked in hydrogen and nitrogen atmosphere, and Example of the present invention is baked in ammonia atmosphere. As a result, the brightness of Example of the present invention is higher by 18% than that of Comparative Example 10. It shows an extremely superior result that there was the improvement of brightness by 18%, and it has a technical meaning. Further, energy efficiency is improved by 17.6%. Furthermore, quantum efficiency is improved by 20.7%. From this result, it is certified that the stable product of the phosphor having an extremely high yield which shows luminescence property of high brightness can be supplied by passing the production process related to the present invention, and the production process of the nitride phosphor having an extremely superior production efficiency can be provided. Further, according to the production process related to the present invention, the nitride phosphor having an extremely superior temperature characteristic can be produced.

In the step of firing related to the present invention, the firing is preferably carried out at a temperature condition of a range of 1200 to 1600° C. A range of 1200 to 1400° C. is more preferable. In the step of firing related to the present invention, the firing passes preferably one step firing that it is preferably carried out at a temperature condition of a range of 1200 to 1400° C. for several hours, but it can also pass two steps of firing that the first firing is carried out at a temperature of 700 to 1000° C. for several hours and further, the second firing is carried out at a temperature of 1200 to 1400° C. for several hours.

In the above-mentioned nitride phosphor, the second luminescence spectrum has preferably at least one or more peaks at a yellow to red region. When the phosphor has the luminescence spectrum, the light emitting device which emits light of a white color can be constituted by being used in combination with a blue light emitting diode. The second luminescence spectrum has more preferably one or more peaks at a yellow to red region of a wave length range of 580 to 630 nm.

The above-mentioned firing is preferably carried out using a crucible made of a boron nitride material. A molybdenum crucible is used in the cited literature. The molybdenum crucible has fears of inhibiting luminescence and inhibiting a reaction system. On the other hand, when the crucible made of a boron nitride material in the present invention is used, it does not inhibit luminescence and inhibit a reaction system, therefore the nitride phosphor having extremely high purity can be produced. Further, since the boron nitride crucible is decomposed in hydrogen and nitrogen, hydrogen and nitrogen atmosphere cannot be used by the synthesis method of the cited literature.

The above-mentioned nitride phosphor has preferably the basic constitution represented by $L_XM_YN_{(2/3)X+(4/3)Y}$:R (wherein L is at least one or more selected from a group consisting of II valency of Be, Mg, Ca, Sr, Ba, Zn, Cd and Hg, M is at least one or more selected from a group consisting of IV valency of C, Si, Ge, Sn, Ti, Zr and Hf, and R is an activator). The nitride phosphor having high luminescence brightness, high energy efficiency and high quantum efficiency can be provided. In the nitride phosphor, impurities contained in a raw material exist in addition to the base nitride phosphor represented by $L_XM_YN_{(2/3)X+(4/3)Y}$:R. For example, they are Co, Mo, Ni, Cu, Fe and the like. Since these impurities cause the lowering of luminescence brightness and the inhibition of the activity of an activator, it is preferable to remove them to out of the system as much as possible.

The above-mentioned nitride phosphor has preferably the basic constitution represented by $L_XM_YN_{(2/3)X+(4/3)Y}$:R (wherein L is at least one or more selected from a group consisting of II valency of Mg, Ca, Sr and Ba, M is Si, and R is an activator). The light emitting device can be produced by using the phosphor having a peak wave length nearby 560 to 680 nm which emits light of a white color, by using a blue light emitting diode having a peak at 400 to 460 nm which emits light of the first luminescence spectrum and irradiating the light on the nitride phosphor related to the present invention.

The present production process has preferably a step of mixing a nitride of L, a nitride of M and a compound of R. The nitride phosphor having an extremely little yield and an extremely superior production efficiency can be provided thereby. Said step of mixing is preferably carried out before firing, but mixing may be carried out during firing and after firing and the firing may be carried out again. The compounding proportion (mole ratio) of a nitride of L, a nitride of M and a compound of R which are raw materials and synthetic intermediates is preferably nitride of L:nitride of M:compound of R=1.80 to 2.20:4 to 6:0.01 to 0.10. The more homogeneous phosphor can be obtained thereby.

The activator represented by the above-mentioned R is preferably Eu. Because in the base constitution represented by $L_XM_YN_{(2/3)X+(4/3)Y}$:R, light nearby 250 to 480 nm (light of the first luminescence spectrum) is absorbed by using Eu as the activator. The phosphor can emit light of the second luminescence spectrum which is different from light of the first luminescence spectrum by the absorption. In particular, the light emitting device which emits light of a white color can be constituted by using the nitride phosphor of the present invention in combination with a blue light emitting diode.

The above-mentioned L and the above-mentioned R has preferably the relation of the molar ratio of L:R=1:0.001 to 1. The nitride phosphor having high luminescence brightness can be obtained by setting the compounding proportion of R in the base nitride phosphor represented by $L_XM_YN_{(2/3)X+(4/3)Y}$:R within the above-mentioned range. Further, the nitride phosphor having good temperature characteristic can be provided. The relation of the molar ratio is more preferably L:R=1:0.003 to 0.05. The nitride phosphor having high luminescence brightness and good temperature characteristic can be provided. Further, since the raw material of an Eu compound is expensive, the more economic phosphor can be produced by reducing the compounding proportion of the Eu compound.

According to the nitride phosphor prepared by the production process related to the present invention, the nitride phosphor exhibiting luminescence properties such as high luminescence brightness, high energy efficiency and high quantum efficiency can be provided. Further, the nitride phosphor having extremely good temperature characteristic can be provided.

The sixth light emitting device related to the present invention is a light emitting device which has at least a semiconductor light emitting element which emits light of the first luminescence spectrum, and a nitride phosphor which contains at least nitrogen, and absorbs at least the portion of light of the above-mentioned first luminescence spectrum and emits light of the second luminescence spectrum which is different from the above-mentioned first luminescence spectrum; and characterized in that the above-mentioned nitride phosphor is the nitride phosphor which was prepared by the third production process related to the present invention. Thus, the light emitting device which can emit blue, green, red and other various colors can be provided by using a semiconductor light emitting element and the phosphor extremely excellent in luminescence properties in combination. In particular, the light emitting device capable of emitting light of a slightly reddish white color which is greatly required in the market can be provided.

The alkali earth metal-base silicon nitride phosphor which is one example of the nitride phosphor of the present invention absorbs light of a short wave length of 250 to 450 nm at a visible light region and carries out reflection at a long wave length of 580 to 650 nm.

For example, the light emitting device emitting light of a slightly reddish white color can be produced by combining a blue light emitting diode and the alkali earth metal silicon nitride phosphor of the present invention and making a constitution in which the portion of light which the blue light emitting diode emits is irradiated to the alkali earth metal silicon nitride phosphor of the present invention. A mixture of the blue light emitting diode, a known $Y_3Al_5O_{12}$ phosphor and the alkali earth metal silicon nitride phosphor of the present invention can be used in combination, and the light emitting device emitting light of a white color can be also produced by the color mixture of visible light at a blue region and visible light at a yellow to orange region.

According to the above-mentioned description, the present invention has technical meanings that the nitride phosphor having excellent luminescence properties such as high luminescence brightness, high energy efficiency and high quantum efficiency and a production process thereof are provided; further, the stable light emitting device which emits light constantly is provided; and the production process of the nitride phosphor having good production efficiency can be provided.

According to the present invention, the nitride phosphor having high luminescence brightness can be provided, and specifically, there can be provided the light emitting device emitting light of a white color which uses a light emitting diode having a luminescence spectrum at an ultraviolet to blue region and converts light from said light emitting diode. Further, the product of the phosphor having high yield and exhibiting the luminescence property of high brightness is designed to be stably provided and the production process having good production efficiency can be provided. Further, the light emitting device emitting light of a white color can be provided by combining a blue light emitting diode and said phosphor. Thus, the present invention solves problems which have been not solved conventionally and has extremely superior technical meanings.

In order to solve the above-mentioned problems, the present invention relates to a light emitting device having a light emitting element, the first phosphor which absorbs at least the portion of light from the light emitting element and emits light having a different wave length, and the second phosphor which absorbs at least the portion of light from the light emitting element and emits light having a different wave length, wherein the peak wave length of luminescence spectrum which the light emitting element has is situated at a longer wave length side than the peak wave length of excitation spectrum which the first phosphor has and the peak wave length of excitation spectrum which the second phosphor has. The light emitting device suppressing the generation of chromaticity deviation can be provided thereby. In particular, since color deviation is generated along the locus of blackbody radiation in the present light emitting device, the color deviation is felt little in human vision in comparison with a case in which the color deviation is generated to a direction of perpendicular of locus of blackbody radiation. Further, the swing width of color tone deviation is extremely narrow by the interaction of the first phosphor and the second phosphor.

In accordance with the increase of electric current density, the peak wave length of luminescence spectrum which the light emitting element has is shifted toward shorter wavelength in the light emitting device. When the charged electric current of the light emitting element is increased, the increase of electric current density is generated, and the peak wave length of luminescence spectrum which the light emitting element has is shifted toward shorter wavelength. The present invention provides a light emitting device preventing the color deviation utilizing the action.

It is preferable that the first phosphor and the second phosphor have a nearly equal change of luminescence intensity in accordance with the change of ambient temperatures of the first phosphor and the second phosphor. The temperature characteristics of the first phosphor and the second phosphor in which the excitation efficiency fluctuates by the change of ambient temperatures in accordance with the increase of charged electric power of the phosphors become nearly equal by making such a constitution, therefore there can be provided a light emitting device capable of suppressing the color deviation even if the ambient temperatures are changed. In particular, there can be provided a light emitting device which suppressed the generation of the color deviation by the interaction between the color deviation in accordance with the increase of electric current density of the light emitting element and the color deviation in accordance with the change of ambient temperatures of the phosphors The change of ambient temperatures of the first phosphor and the second phosphor is mainly caused by the change of the electric current to the light emitting element. The temperature changes of the first phosphor and the second phosphor in which the excitation efficiency fluctuates by the influence of heat from the light emitting element become nearly equal by making such a constitution, therefore there can be formed a light emitting device capable of suppressing the color deviation even if the ambient temperatures of the phosphors are changed.

It is preferable that the peak wave length of luminescence spectrum is 350 nm to 530 nm in the light emitting element. In particular, 400 nm to 530 nm having a color tone of a light from the light emitting element is preferable. The color tone change of a semiconductor light emitting element and the color tone change of phosphors are controlled by making such a constitution, therefore it is possible to control the color deviation of the whole light emitting device.

The first phosphor has a higher excitation efficiency at the short wavelength side of the wave length change than the long wavelength side within a range of the wave length change of the light emitting element which is generated at changing the electric current density of the light emitting element. Alternatively, the present invention relates to the light emitting device in which the luminescence of the phosphor by the excitation light at the short wavelength side of the light emitting element has a higher luminescence intensity than the luminescence of the phosphor by the excitation light at the long wavelength side of the light emitting element. When the electric current density of the light emitting element is increased, the luminescence intensity of the first phosphor is increased thereby. Further, as described later, the luminescence intensity of the second phosphor is increased. Accordingly, a light emitting device in which the color deviation was extremely suppressed can be provided.

It is preferable that the first phosphor has the peak wave length of excitation spectrum which the first phosphor has at the short wavelength side of the wave length change within a range of the wave length change of the light emitting element which is generated at changing the electric current density of the light emitting element. Because the peak wave length of luminescence spectrum of the light emitting element is situated at the position of the peak wave length having the largest excitation absorption of the first phosphor, the first phosphor can be most efficiently emitted, the beam of the whole light emitting device can be controlled to be maximum.

The first phosphor contains preferably a yttrium-aluminum-garnet-base phosphor which contains Y and Al, and contains at least one of elements selected from Lu, Sc, La, Gd, Th, Eu and Sm and at least one of elements selected from Ga and In and is activated by at least one of elements selected from the rare earth elements. There can be made a light emitting device capable of suppressing the generation of the color deviation even if the ambient temperatures are changed, and suppressing the relative lowering of beam [lm] of the whole light emitting device accompanying the emission of heat, by making such a constitution. It is preferable that the peak wave length of excitation spectrum of the yttrium-aluminum-garnet-base phosphor is from 420 nm to 470 nm. There can be formed a light emitting device capable of reducing the color deviation by the charged electric current in comparison with a conventional technology and improving color rendering property, by making such a constitution.

It is preferable that the difference between the peak wave length of excitation spectrum which the first phosphor has and the peak wave length of excitation spectrum which the light emitting element has is 40 nm or less. There can be formed a light emitting device capable of reducing the color deviation by the charged electric current in comparison with a conventional technology and improving the color rendering property, by making such a constitution.

The second phosphor has a higher excitation efficiency at the short wavelength side of the wave length change than the long wavelength side within a range of the wave length change of the light emitting element which is generated at changing the electric current density of the light emitting element. Alternatively, the present invention relates to the light emitting device in which the luminescence of the phosphor by the excitation light at the short wavelength side of the light emitting element has a higher luminescence intensity than the luminescence of the phosphor by the excitation light at the long wavelength side of the light emitting element. When the electric current density of the light emitting element is increased, the luminescence intensity of the second phosphor is increased thereby. Further, as previously described, the luminescence intensity of the first phosphor is also increased. Accordingly, a light emitting device in which the color deviation was extremely suppressed can be provided.

The second phosphor contains preferably a nitride-base phosphor which contains N, and contains at least one of elements selected from Be, Mg, Ca, Sr, Ba and Zn and at least one elements selected from C, Si, Ge, Sn, Ti, Zr and Hf, and is activated by at least one of elements selected from the rare earth elements. There can be made a light emitting device capable of suppressing the generation of the color deviation even if the ambient temperatures are changed, and capable of suppressing the relative lowering of beam [lm] of the whole light emitting device accompanying the emission of heat, by making such a constitution. Further, it is preferable that the second phosphor is a phosphor which emits light by being excited by light having a wave length of 350 to 600 nm. There can be formed a light emitting device capable of reducing the color deviation by the charged electric current in comparison with a conventional technology and improving color rendering property, by making such a constitution.

It is preferable that the light emitting device is the light source of a back light for a liquid crystal display or a light source for illumination. There can be formed a liquid crystal display or a light source for illumination of hardly generating the color deviation even by the change of ambient temperatures in comparison with a conventional technology, by making such a constitution.

In order to achieve the above-mentioned third purpose, the light emitting device related to the present invention is a light emitting device equipped with light sources and a plural number of phosphors which absorb at least the portion of light from the light sources and emit light having a different wave length, wherein the phosphors contain the first phosphor on at least one of the light sources and at least one of the second phosphors in which at least a portion of light emitted is absorbed in the first phosphor, and the first phosphor is situated at the light source side than the second phosphors.

There can be made a light emitting device improving the color rendering property in comparison with a conventional technology, by making such a constitution.

A light emitting device capable of freely adjusting the color temperature of color mix light can be made by making such a constitution.

BRIEF DESCRIPTION OF THE DRAWING

FIG. 19A is a SEM (scanning electron microscope) photograph of the phosphor of Example 128 and FIG. 19B is that of Example 129.

FIG. 20 is a chart showing the chromaticity coordinate of the light emitting device of Example 167 related to the present invention.

FIG. 32 is a chart showing the chromaticity coordinate of the light emitting device of Example 222.

FIG. 42 is a chart showing the chromaticity coordinate of the light emitting device of Example 245.

FIG. 54 is a chart showing the chromaticity coordinate of the light emitting device of Example 256.

FIG. 79 is a chart showing the luminescence spectrum property of the light emitting device in the present invention.

FIG. 97 is a chart showing the luminescence spectra when the phosphors 7-5 and 7-6 were excited at EX=460 nm.

BEST MODE FOR CARRYING OUT THE INVENTION

Figure 1:
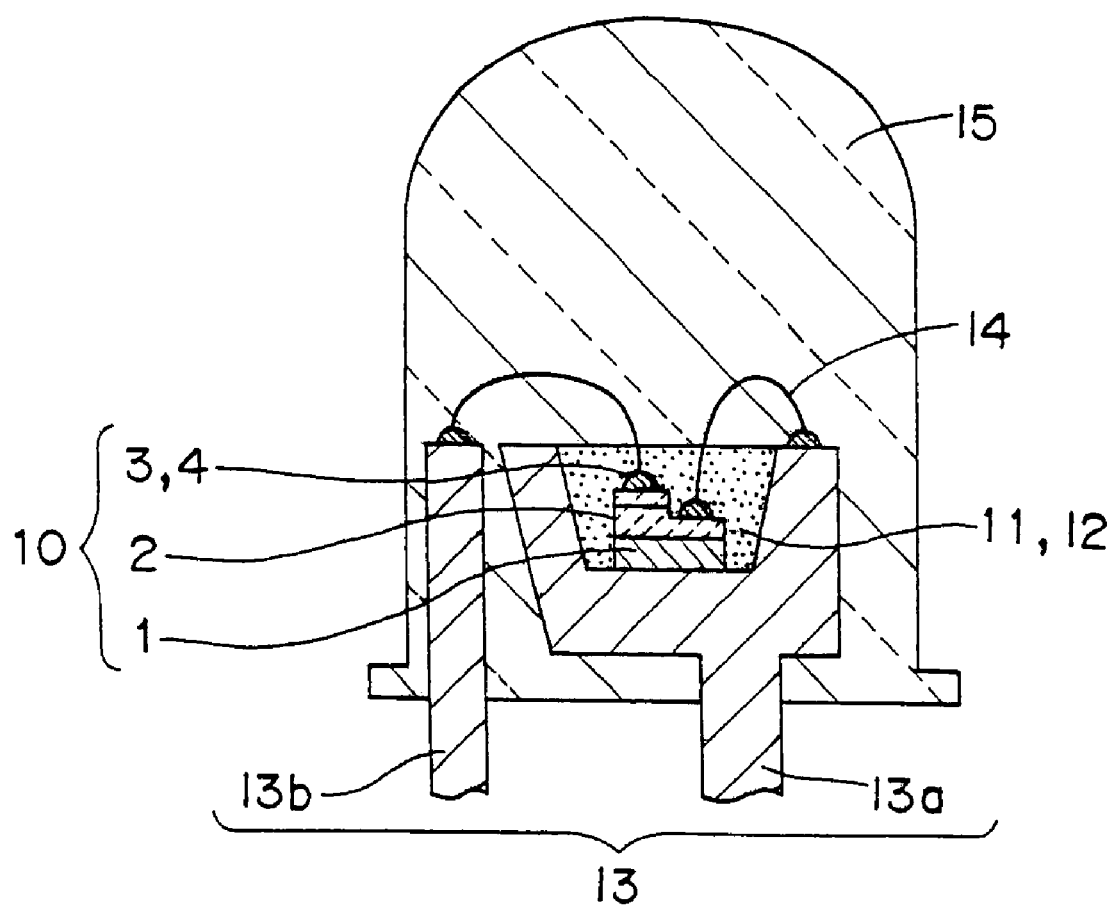
FIG. 1 is a section view showing the type I light emitting device related to the present invention.
Figure 2A:
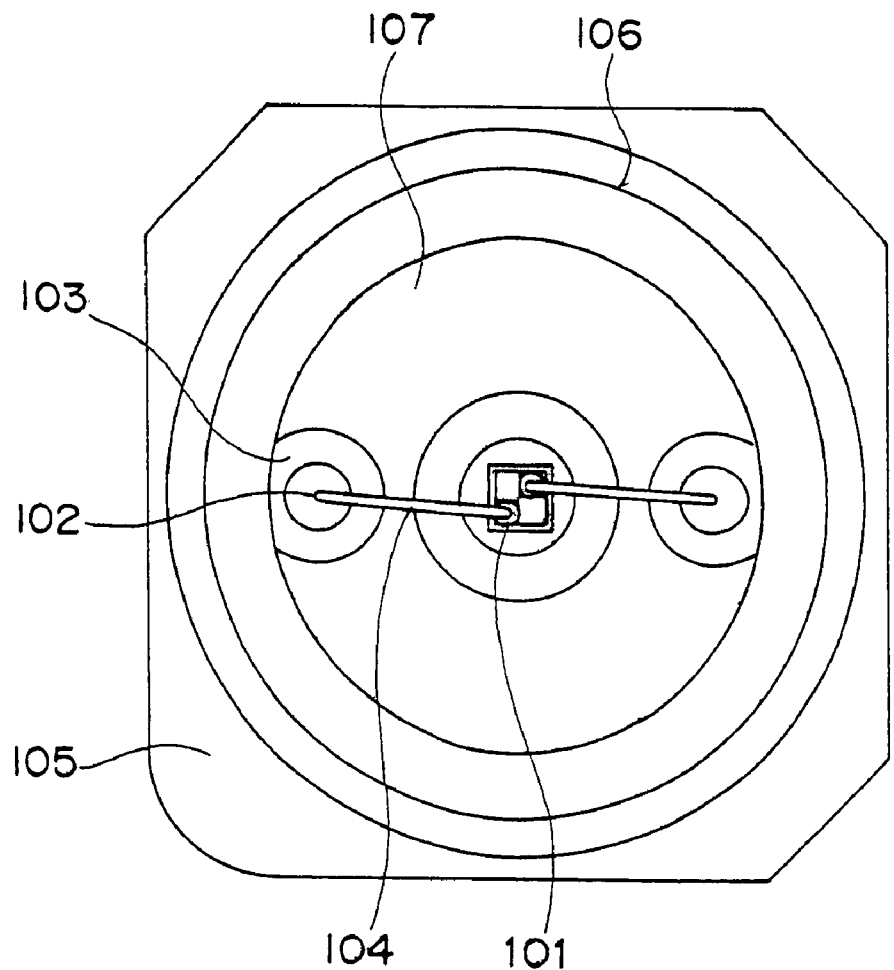
FIG. 2 is a plane view (a) and a section view (b) showing the type II light emitting device related to the present invention.
Figure 2B:
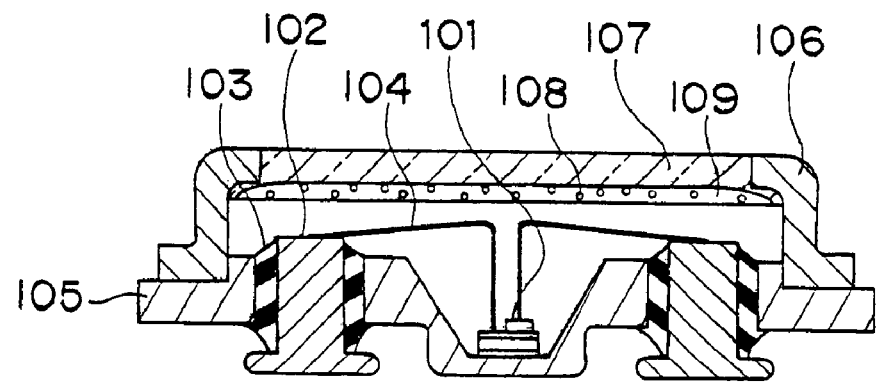

The phosphor and the production process thereof related to the present invention are illustrated below using the modes of operation and Examples. However, the present invention is not limited to the modes of operation and Examples.

The light emitting device related to the present invention is a light emitting device which has at least a light emitting element having the first luminescence spectrum and a phosphor which absorbs at least the portion of light of the above-mentioned first luminescence spectrum and emits light having the second luminescence spectrum; and the specific phosphor related to the present invention is used as its phosphor.

The specific examples (whole constitution) of the light emitting device are illustrated referring drawings.

(Type 1 Light Emitting Device I)

Type 1 light emitting device 1 is constituted by a light emitting element 10 containing a sapphire substrate 1, a semiconductor layer 2 which was laminated on its upper face, and positive and negative electrodes 3 (the positive and negative electrodes 3 are formed on the same face side of the semiconductor layer 2) which were formed on the semiconductor layer 2;

lead frames 13a and 13b which were electroconductively connected respectively with the positive and negative electrodes 3 of the light emitting element and electroconductive wires 14;

a coating member 12 containing phosphor 11 which were provided in a cup which was integrally formed in the lead frame 13a so as to cover the outer peripheral of the light emitting element 10; and a mold member 15 covering the whole.

Further, in the light emitting element 10, a light emitting layer (not illustrated) on the semiconductor layer 2 on sapphire substrate 1, and the luminescence spectrum of light output from the light emitting layer has a peak wave length at an ultraviolet to blue region (500 nm or less).

Type 1 light emitting device 1 is produced, for example, as described below.

Further, the light emitting element 10 is set on a die bonder and die-bonded (adhered) with the lead frame 13a where a cup was provided while turning the electrodes upward (face up). After the die bonding, the lead frame 13a with which the light emitting element was die-bonded is transferred to a wire bonder, the negative electrode 3 is wire-bonded by a gold wire with the lead frame 13a where a cup was provided, and the positive electrode 3 is wire-bonded with the another lead frame 13b.

Then, they are transferred to a mold device, and the phosphors 11 and the coating member 12 are charged in the cup of the lead frame 13 by a dispenser. The phosphors 11 and the coating member 12 are preliminarily mixed homogeneously at a desired proportion.

After charging the phosphors 11, the lead frame 13 was immersed in a mold frame in which the mold member 15 was preliminarily charged, then the mold frame is taken off to cure a resin and the bullet type light emitting device 1 as shown in FIG. 1 is prepared.

(Type 2 Light Emitting Device II)

Figure 7:
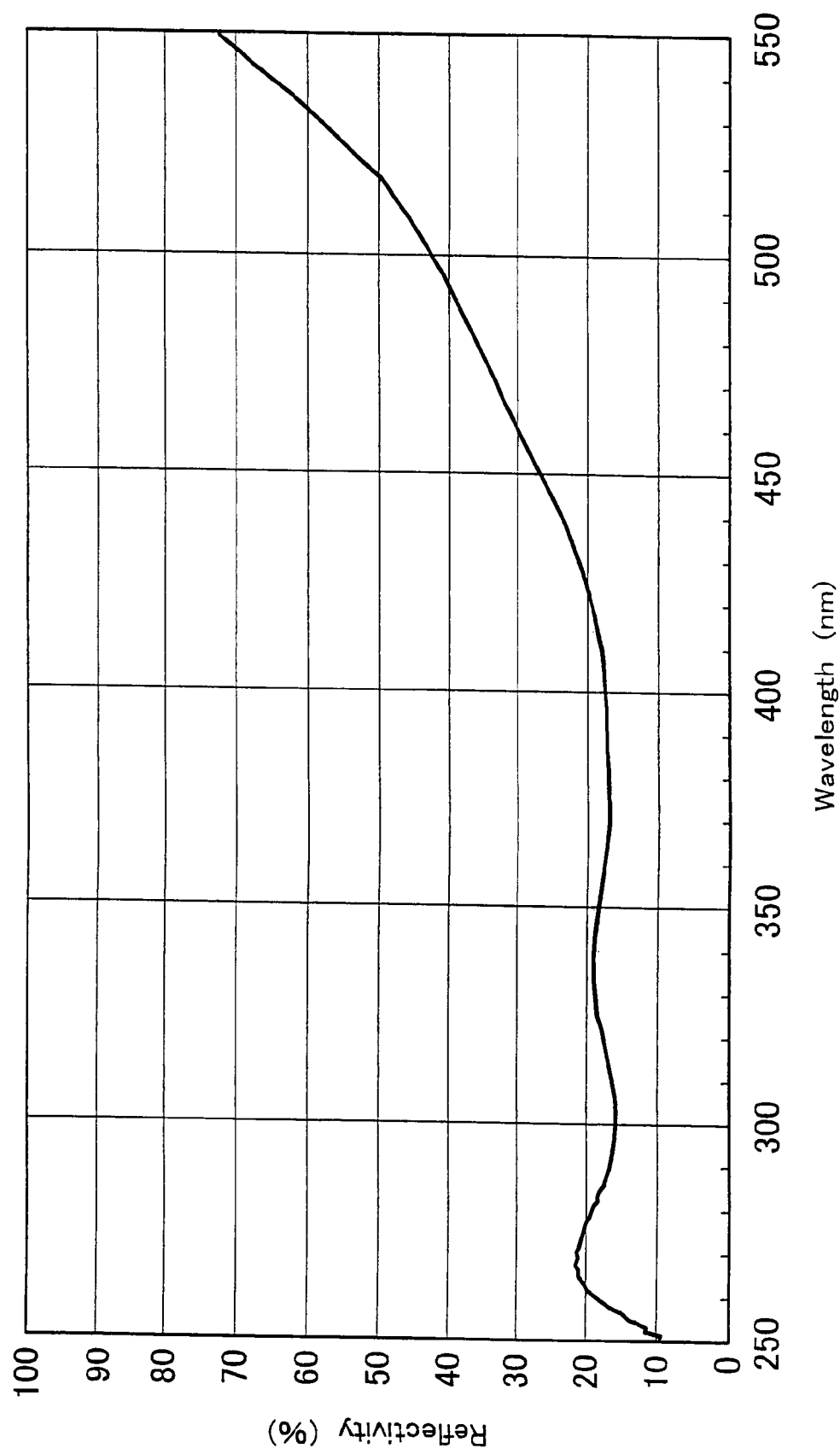
FIG. 7 is a chart showing the reflection spectrum of the phosphor of Example 60.

Type 2 light emitting device II which is different from Type 1 light emitting device 1 is illustrated referring FIG. 7.

The type 2 light emitting device II is a surface mounting type light emitting device. Hereat, various light emitting elements can be used as the light emitting element 101, and for example, an ultraviolet nitride semiconductor light emitting element and a blue nitride semiconductor light emitting element can be also used. Hereat, the ultraviolet light emitting element 101 is illustrated as an example.

The light emitting element 101 (LED chip 101) is a nitride semiconductor light emitting element which has an InGaN semiconductor having a peak wave length of about 370 nm as a light emitting layer. As the element structure of LED, there are laminated in order on a sapphire substrate, an n-type GaN layer being an undoped nitride semiconductor, a GaN layer in which n-type electrode of Si dope is formed and which becomes an n-type contact layer, an n-type GaN layer being an undoped nitride semiconductor, a GaN layer in which n-type electrode of Si dope is formed and which becomes an n-type contact layer, an n-type GaN layer being an undoped nitride semiconductor, an n-type AlGaN layer being a nitride semiconductor, a single quantum well structure light emitting layer having an InGaN layer, a Mg doped AlGaN layer as a p-type clad layer, and a Mg doped GaN layer being a p-type contact layer. Further, a GaN layer is formed on the sapphire substrate at a low temperature as a buffer layer. Further, the p-type semiconductor is annealed at 400° C. or more after film forming. Furthermore, the surfaces of respective p-n-contact layers were exposed by etching on the same face side of the nitride semiconductor on the sapphire substrate, an n-electrode is formed in a belt shape on the n-type contact layer exposed, and a transparent p-electrode comprising a metal thin film is formed on the whole faces of p-type contact layer. Further, a pedestal electrode is formed in parallel with the n-electrode on the transparent p-electrode using a spattering method.

In Type 2 light emitting device II, a package is constituted by a base 105 made of covar which has a concave at a central part for storing the light emitting element 101, and a lid 106 made of covar. The lead electrode 102 made of covar are respectively and hermetically inserted in the both sides of the concave of the base 105, and a glass window portion 107 is provided at the central part of the lid 106 made of covar. Further, a Ni/Ag layer is formed on the surfaces of the base 105 and the lead electrode 102.

Type 2 light emitting device II is produced using the package which is constituted as described above.

Firstly, the above-mentioned LED chip 101 is die-bonded by Ag—Sn alloy in the concave of the base 105 which was constituted as described above.

Then, the respective electric wires of the LED chip 101 which was die-bonded and the respective lead electrode 102 which were exposed on the bottom face of concave of the base 105 were respectively connected by an Ag wire 104 electrically.

Then, after moisture in the concave of the base 105 was adequately removed, it is covered with a lid 106 made of covar which has a glass window portion 107 at the central part, and sealed by carrying out seam welding. Hereat, a color conversion portion 109 (a coating portion containing the phosphor 108) is preliminarily provided at the back face of the glass window portion 107. The phosphors 108 such as $Ca_2Si_5N_8:Eu$, $(Y_{0.8}Gd_{0.2})_3Al_5O_{12}:Ce$ in which B was added, are preliminarily contained in a slurry consisting of 90% by weight of nitrocellulose and 10% by weight of γ-alumina, the slurry containing the phosphors is coated on the back face of the transparent window portion 107 of the lid 106, it is cured by heating at 220° C. for 30 minutes, and then, the color conversion portion 109 is formed. The light emitting device II which was constituted thus is a light emitting diode which can emit light of a white color having high luminescence brightness. Further, according to the type 2 light emitting device II, the light emitting device which can extremely and easily adjust chromaticity and is excellent in large scale productivity and reliability can be provided.

Further, the type 2 light emitting device II which was constituted as described above can make all of the constituting member by inorganic substances, and can constitute a light emitting device having remarkably high reliability, even if the luminescence emitted from the LED chip 101 is at an ultraviolet or visible short wave length region.

(Type 3 Light Emitting Device III)

Figure 3:
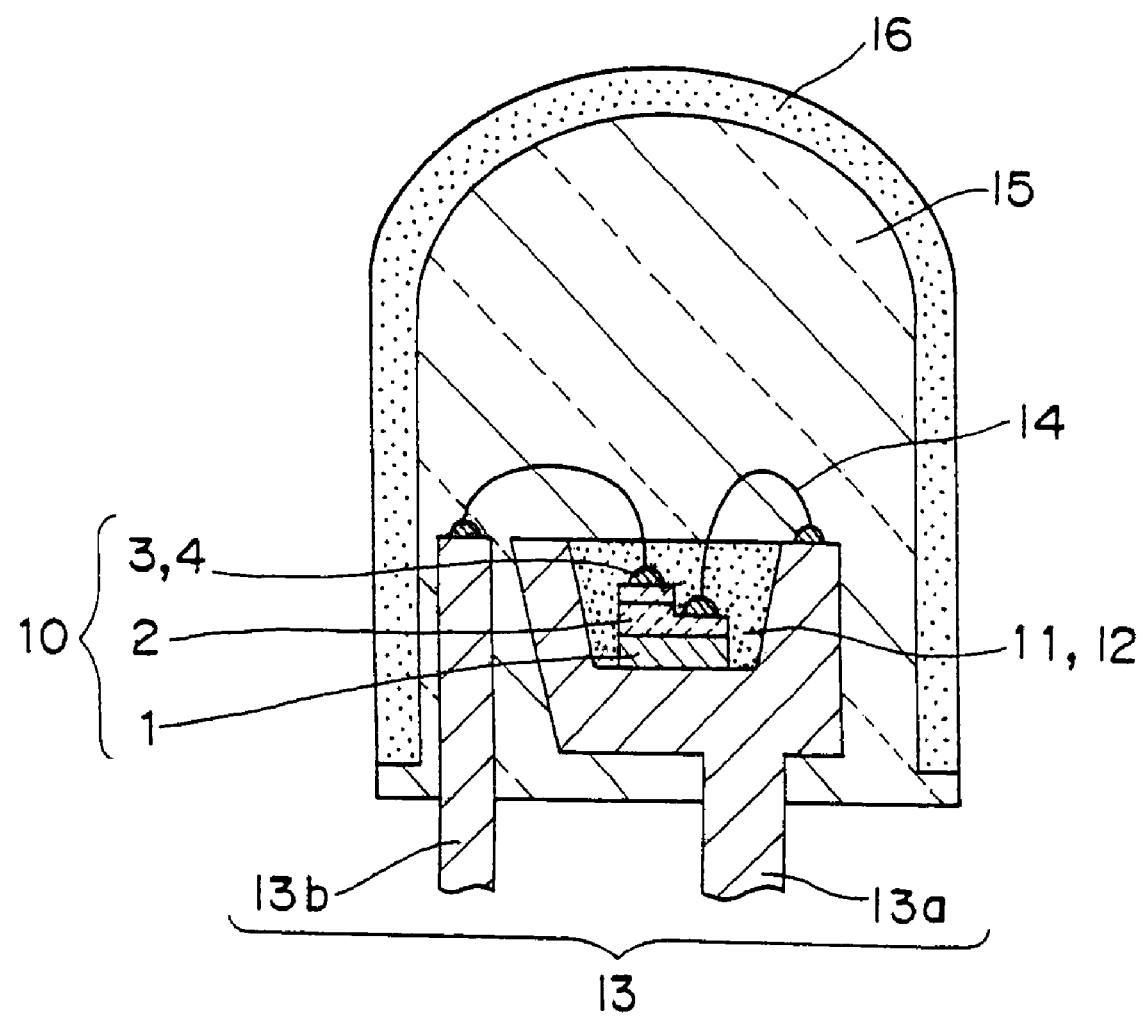
FIG. 3 is a section view showing the type III cap type light emitting device related to the present invention.

FIG. 3 is a section view showing the type 3 light emitting device III related to the present invention, and a cap type light emitting device.

In FIG. 3, the same codes are named for the same members as the members of the type 1 light emitting device 1, and illustration is abbreviated.

The light emitting device III is constituted by covering a cap 16 comprising a transparent resin in which the phosphors are dispersed (not illustrated), on the surface of the mold member 15 of the light emitting device 1. The phosphors are homogeneously dispersed in the transparent resin of the cap 16. The transparent resin containing the phosphors is molded in a form which is fit in the form of the mold member 15 of the light emitting device 1. Further, in place of the fitting, there may be also possible a production process that after the transparent resin containing the phosphors is charged in a fixed mold frame, the light emitting device 1 is pushed in said mold frame to be molded. As the specific material of the transparent resin of the cap 16, there are used transparent resins excellent in temperature characteristic and weather resistance such as an epoxy resin, a urea resin, a silicone resin, silica sol, glass, an inorganic binder and the like. In addition to the above-mentioned materials, thermosetting resins such as a melamine resin and a phenol resin can be used. Further, there can be used also thermoplastic resins such as a polyethylene, a polypropylene, a polyvinyl chloride and a polystyrene, thermoplastic rubbers such as a styrene-butadiene block copolymer and a segmented polyurethane. Further, a dispersant, barium titanate, titanium oxide, aluminum oxide and the like may be contained together with the phosphors. Further, a light stabilizer, a coloring agent may be contained. The specific phosphors related to the present invention described later are used for the phosphors used for the cap 16. The phosphors related to the present invention may be also used in the cup of the mount lead 13a. However, since the phosphors are used in the cap 16, only the coating member 12 may be adequate in the cup of the mount lead 13a.

Thus, in the light emitting device III which was constituted as described above, the wave length of the portion of light discharged from the light emitting element 10 is converted by the phosphors when it passes through the cap 16. The wave length converted light and the blue light whose wave length was not converted by the phosphor are mixed, and as a result, white color-base light is externally discharged from the surface of the cap 16.

The phosphor of the mode of operation related to the present invention is illustrated below.

Mode 1 of Operation

Phosphor of Mode of Operation of 11802003

The phosphor related to the present invention is a nitride phosphor which is represented by the general formula $L_XM_YN_{((2/3)X+(4/3)Y)}:R$ or $L_XM_YO_ZN_{((2/3)X+(4/3)Y-(2/3)Z)}:R$, and characterized in that an element (hereinafter, merely referred to as the "different element") which is different from the above-mentioned L, the above-mentioned M, the above-mentioned O, the above-mentioned N and the above-mentioned R are contained in the nitride phosphor.

Wherein L is at least one or more selected from the Group II Element consisting of Mg, Ca, Sr, Ba and Zn, M is at least one or more selected from the Group IV Element in which Si is essential among C, Si and Ge, and R is at least one or more selected from the rare earth element in which Eu is essential among Y, La, Ce, Pr, Nd, Sm, Eu, Gd, Tb, Dy, Ho, Er and Lu.

In the general formula, X, Y and Z is an arbitrary figure larger than 0. In particular, X and Y is preferably X=2 and Y=5 or X=1 and Y=7. Specifically, it is preferable that the nitride phosphors represented by $(Sr_TCa_{1-T})_2Si_5N_8:Eu$, $Sr_2Si_5N_8:Eu$, $Ca_2Si_5N_8:Eu$, $Sr_7Ca_{1-T}Si_7N_{10}:Eu$, $SrSi_7N_{10}:Eu$, $CaSrSi_7N_{10}:Eu$ and the like are used as the base nitride phosphor. Further, the different elements which are different from the above-mentioned L, the above-mentioned M, the above-mentioned O, the above-mentioned N and the above-mentioned R are contained in the base nitride phosphor. Said different elements are at least one or more of elements selected from the Group I Element consisting of Li, Na, K, Rb, Cs, Cu, Ag and Au, the Group III Element consisting of B, Al, Ga and In, the Group IV Element consisting of Ti, Zr, Hf, Sn and Pb, the Group V Element consisting of P, Sb and Bi, the Group VI Element consisting of S, the Group V Element consisting of V, Nb and Ta, the Group VI Element consisting of Cr, Mo and W, the Group VII Element consisting of Re and the Group VIII Element consisting of Fe, Co, Ir, Ni, Pd, Pt and Ru. One or 2 or more of these different elements are contained in the nitride phosphor. The content of these different elements in the nitride phosphor is not specifically limited, but is preferably 1000 ppm or less based on the phosphor which is represented by the general formula $L_XM_YN_{((2/3)X+(4/3)Y)}:R$ or $L_XM_YO_ZN_{((2/3)X+(4/3)Y-(2/3)Z)}:R$. Because good luminescence properties can be obtained by setting the content as 1000 ppm or less. The content of these different elements is more preferably set at a range of 0.1 to 500 ppm in order to obtain further good luminescence efficiency.

The addition amount of the different elements in the production process may be occasionally set at 500 ppm or more in order to set the addition amount of different elements at a range of 0.1 to 500 ppm in the phosphor after production, considering the scattered amount of the different elements in firing step. For example, there is a case that even if the amount of the different elements which are added in the raw material is set at 10000 ppm or more, the objective properties cannot be achieved because the different elements are scattered during the firing step in the production steps. However, even in such a case, it is preferable to adjust the amount so that the amount of the different elements become 1000 ppm or less in the final product, and the luminescence properties such as luminescence brightness can be adjusted thereby.

As described above, L consists of at least one or more among Mg, Ca, Sr, Ba and Zn. Namely, in the present invention, L may be one element and 2 or more elements may be contained as L.

For example, the mixture of Sr and Ca can change the compounding ratio according to requirement. In this case, the peak wave length of luminescence spectrum is shifted to a longer wave length side by mixing Sr and Ca, than by using Sr or Ca alone. When the molar ratio of Sr and Ca is about 5:5, the peak wave length is shifted to the longest wave length side, and when the molar ratio of Sr and Ca is 7:3 or 3:7, the peak wave length is respectively shifted to a longer wave length side than by using Sr or Ca alone.

M has at least one or more selected from the Group IV Element in which Si is essential among C, Si and Ge. Namely, in the present mode 1 of operation, only Si may be used as M, and either of a combination of C and Si, a combination of Ge and Si, a combination of C, Si and Ge may be used.

Thus, in the present mode 1 of operation, the nitride phosphor having good crystallinity is obtained by setting Si as essential in the composition of the nitride phosphor.

As a more specific example, for example, those using 95% by weight of Si and 5% by weight of Ge are mentioned.

R has at least one or more selected from the rare earth element in which Eu is essential among Y, La, Ce, Pr, Nd, Sm, Eu, Gd, Tb, Dy, Ho, Er and Lu. Namely, in the present mode 1 of operation, R may consisting of Eu alone, and contains Eu and may further contain one or 2 or more among the above-mentioned elements (the element other than Eu). Thus, in the mode 1 of operation, the nitride phosphor having good luminescence properties can be provided by specifying the element which is used as R.

In Examples related to the mode 1 of operation described later, europium being the rare earth element is used as a luminescent center. Europium has mainly 2-valent and 3-valent energy levels. In the phosphor of the present mode 1 of operation, $Eu^{3+}$ is used for the alkali earth metal silicon nitride phosphor of mother-body as the activator. For example, it is preferable to use europium alone or europium nitride. Further, in the present mode 1 of operation, the color tone can be changed and the adjustment of luminescence efficiency can be carried out by activating Eu together with other activator such as Ce and Nd.

In the present mode 1 of operation, the effect of adding the different elements which are different from the above-mentioned L, the above-mentioned M, the above-mentioned O, the above-mentioned N and the above-mentioned R exits in points that as described above, the diffusion of $Eu^{3+}$ is accelerated and luminescence properties such as color tone, luminescence brightness and afterglow can be improved. Further, since the particle diameter of phosphor particles can be enlarged, brightness can be improved. Further, Cr, Ni and the like have a function of shortening afterglow. The above-mentioned different element may be contained in raw materials which are used for producing the phosphor, and may be contained in a condition of a single body or a compound in the production steps and baked together with the raw materials. However, the above-mentioned different element is not occasionally contained in the nitride phosphor after firing. Even if it is contained, it may occasionally remain at a trace amount in comparison with the initially added amount (in raw materials or an amount added during the production steps). This is considered to be caused by the diffusion of the different element in the firing step.

The phosphor related to the present mode 1 of operation absorbs the portion of light at an ultraviolet to blue region which was emitted by the light emitting element 10, and emits light at a yellow to red region. When the phosphor related to the present mode 1 of operation is applied to, for example, the type 1 light emitting device 1, the light emitting device which emits light of a warm color-base white color can be constituted by the color mixing of blue light emitted from the light emitting element 10 (light in which the wave length is not converted by the phosphor) and the red color of the phosphor.

Further, in the light emitting device related to the present invention, in addition to the nitride phosphor related to the present mode 1 of operation, the light emitting device may have one or more of the phosphor which absorbs light of the first luminescence spectrum which was emitted by a light emitting element, and the portion of light having the second luminescence spectrum which is output from the nitride phosphor related to the present mode 1 of operation, and emits light different from the wave length of light absorbed, namely light having the third luminescence spectrum which has at least one or more peak wave lengths (from a blue region to a green region, a yellow region and a red region). Thus, the luminescence color can be made as a multi color. When such constitution is made, the phosphor having the third luminescence spectrum contains preferably at least one or more of the yttrium-aluminum oxide phosphor activated by at least cerium, the yttrium-gadolinium-aluminum oxide phosphor activated by at least cerium, and the yttrium-gallium-aluminum oxide phosphor activated by at least cerium. Because a desired chromaticity can be easily adjusted by containing the above-mentioned the yttrium-aluminum oxide phosphor. Specifically, there can be used $Ln_3M_5O_{12}$:R (Ln is at least one or more selected from Y, Gd and La. M contains at least either of Al and Ga. R is Lanthanide series), $(Y_{1-x}Gd_x)_3(Al_{1-y}Ga_y)O_{12}$:R (R is at least one or more selected from Ce, Tb, Pr, Sm, Eu, Dy and Ho. $0<R<0.5$). These phosphors are excited by light at a short wave length side of a near ultraviolet to visible light, 270 to 500 nm, and has a peak wave length of a luminescence spectrum at 500 to 600 nm. However, in the present invention, the phosphor having the third luminescence spectrum is not limited to the above-mentioned phosphors, and various phosphors can be used.

The yttrium-aluminum oxide phosphor activated by cerium and the like absorbs the portion of blue light which was emitted from the light emitting element 10, and emits light at a yellow region. Hereat, light becomes a pale white color by the color mixing of the blue light from the light emitting element 10 and the yellow light of the yttrium-aluminum oxide phosphor. Accordingly, the light emitting device which emits light of a warm color-base or electric bulb color-base white color can be constituted by using the yttrium-aluminum oxide phosphor and the above-mentioned nitride phosphor together with a coating member having transparency, and by the combination with the blue light from the light emitting element 10. Further, the light emitting device having various spectrum distributions can be provided by appropriately changing the combination of the phosphors and the contents of the respective phosphors. Further, the warm color-base white color and reddish white color light emitting device means that the average color rendering index Ra is 75 to 95 and the color temperature is 2000 to 8000K. In the present invention, it is possible to produce a warm color-base white color light emitting device, an electric bulb color-base white color light emitting device, a white color light emitting device, a neutral white color light emitting device, daylight color light emitting device according to the JISZ9112 Specification. In the light emitting device related to the present invention, the preferable device in particular is a light emitting device in which the average color rendering index Ra and color temperature are situated at the locus of black body radiation in a chromaticity chart. However, it is needless to say that the compounding amount of the yttrium-aluminum oxide phosphor and the above-mentioned nitride phosphor together is appropriately changed in order to provide a light emitting device having a desired color temperature and the average color rendering index. The warm color-base white color light emitting device can further improve the specific color rendering index R9. With respect to a white color light emitting device which is the combination of a conventional blue light emitting element and the yttrium-aluminum oxide phosphor activated by cerium, the specific color rendering index R9 is about near 0, and a red component was insufficient. Accordingly, it has been a solving problem to enhance the specific color rendering index R9, but the specific color rendering index R9 can be enhanced to 60 to 70 by containing the phosphor related to the present invention in the yttrium-aluminum oxide phosphor. Hereat, the specific color rendering index R9 is determined by using the respective color deviation of 7 color chips as a basis which is different from average rendering property, and not the average of 7 kinds. As 7 color chips, there are selected those which represent red having comparatively high chroma, yellow, green, blue, human skin (white people), the green of a leaf of a wood, human skin (Japanese). They are respectively called in order as R9, R10, R11, R12, R13, R14 and R15. Among these, R9 is a color chip which indicates red.

Further, the phosphor which is used in combination with the nitride phosphor of the present invention is not limited to the yttrium-aluminum oxide phosphor and the like. The phosphor having at least one or more of peak wave lengths from a blue region to a green region, a yellow region, and a red region which can attain the similar purpose as the yttrium-aluminum oxide phosphor and has the third luminescence spectrum can be also used in combination with the above-mentioned nitride phosphor. The white color light emitting device according to the principle of color mixing of light can be provided thereby. As specific phosphor used in combination with the nitride phosphor, there are phosphors emitting green-base light such as $SrAl_2O_4$:Eu, $Y_2SiO_5$:Ce,Tb, $MgAl_{11}O_{19}$:Ce,Tb, $Sr_7Al_{12}O_{25}$:Eu (at least one or more among Mg, Ca, Sr and Ba)$Ga_2S_4$:Eu; phosphors emitting blue-base light such as $Sr_5(PO_4)_3Cl$:Eu, $(BaCa)_5(PO_4)_3Cl$:Eu, $(SrCaBa)_5(PO_4)_3Cl$:Eu, (at least one or more among Mg, Ca, Sr and Ba)$_2B_5O_9Cl$:Eu,Mn, (at least one or more among Mg, Ca, Sr and Ba)$_5$(PO$_4$)$_6$Cl$_2$:Eu,Mn; phosphors emitting red-base light such as $Y_2O_2S$:Eu, $La_2O_2S$:Eu, $Y_2O_3$:Eu, $Ga_2O_2S$:Eu. Thus, a desired luminescence spectrum can obtained by changing the composition. However, luminescent phosphors such as green, blue, red and the like are not limited to the above-mentioned phosphors, and various phosphors can be used.

(Production Process of Phosphor of Mode 1 of Operation)

Figure 4:
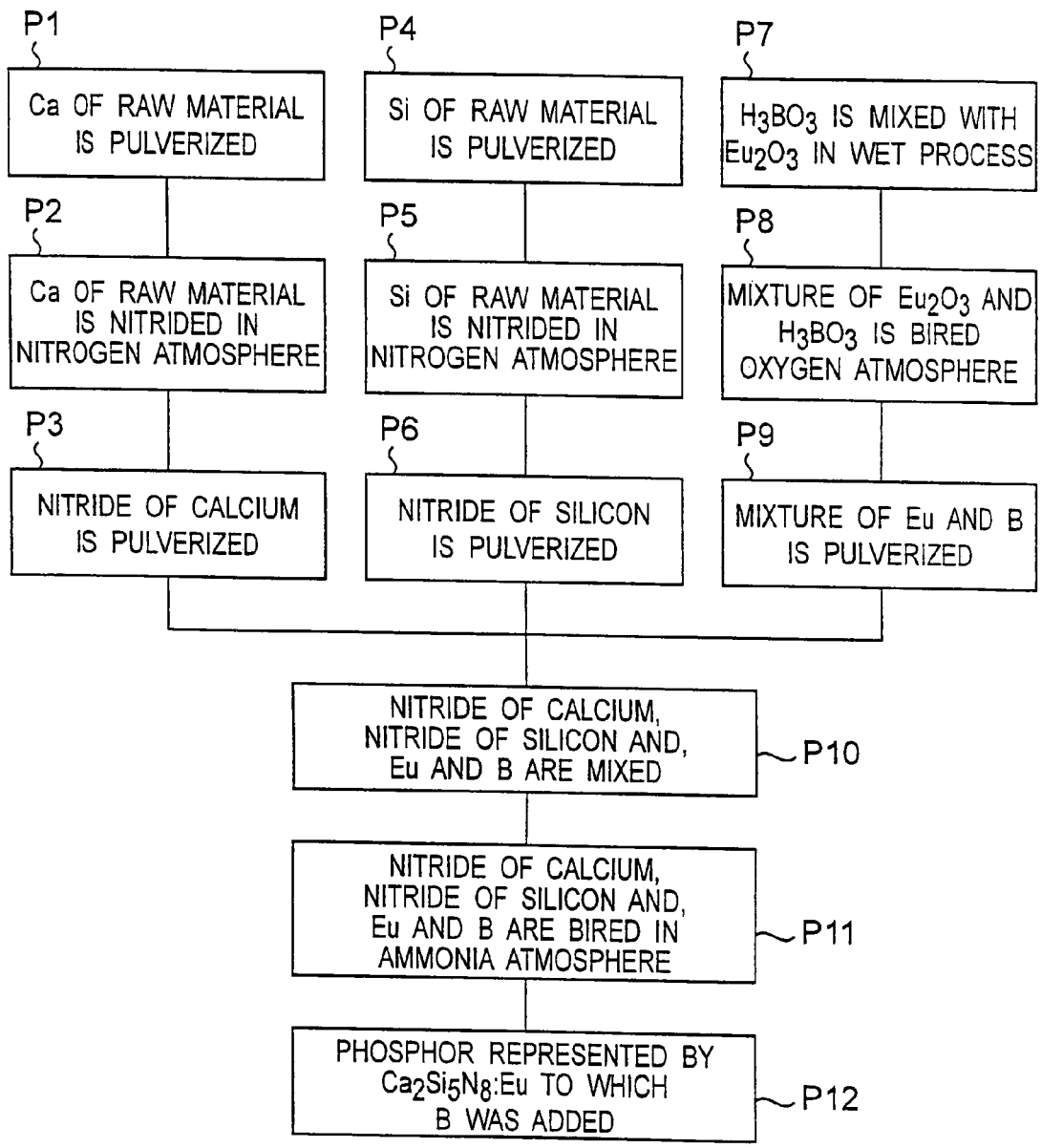
FIG. 4 is a chart showing the flow of the production steps of the nitride phosphor of the mode 1 of operation related to the present invention.

Then, the production process of the phosphor of mode 2 of operation related to the present invention is illustrated using FIG. 4, referring the case of producing $Ca_2Si_5N_8$:Eu which contains B, as an example.

Further, the present invention is not limited to the present production process. Furthermore, Li, Na, K, B and O are contained in the phosphor.

(1) Process P1

Firstly, Ca of a raw material is pulverized in the present production process (P1 of FIG. 4).

Ca itself is preferably used as the Ca of a raw material, but an imide compound, a amide compound and the like can be used. Further, the Ca of a raw material may contain Li, Na, K, B, Al and the like. The raw material is preferably those purified. Since a purification step is not required thereby, the production process of the phosphor can be simplified and an economic nitride phosphor can be provided. As the criterion of the pulverization of Ca, it is preferable that the mean particle diameter is about 0.1 µm or more and 15 µm or less from the viewpoint of the reactivity with other raw material, the control of the particle diameter at firing or after firing, but the present production is not limited to this range. The purity of Ca is preferably 2N or more, but is not limited to this range.

(2) Process P2

The pulverized Ca of a raw material is nitrided in nitrogen atmosphere (P2).

The reaction is shown in Formula 1.

$$3Ca + N_2 \rightarrow Ca_3N_2 \quad \text{[Formula 1]}$$

The Ca of a raw material is nitrided at a temperature of 600 to 900° C. for about 5 hours in nitrogen atmosphere to obtain the nitride of Ca, ($Ca_3N_2$). The nitride of Ca is preferably those having high purity.

(3) Process P3

The nitride of Ca, ($Ca_3N_2$) is pulverized.

(4) Process P4

The Si of a raw material is pulverized in the process P4.

Si itself is preferably used as the Si of a raw material, but an imide compound, a amide compound and the like can be used. For example, they are $Si_3N_4$, $Si(NH_2)_2$, $Mg_2Si$ and the like. The purity of the Si of a raw material preferably 3N or more, but the different elements such as Li, Na, K, B, Al and Cu may be contained. It is preferable that the mean particle diameter is about 0.1 µm or more and 15 µm or less from the viewpoints of the reactivity with other raw material, the control of the particle diameter at firing or after firing, (5) Process P5

The pulverized Si of a raw material is nitrided in nitrogen atmosphere.

The reaction is shown in Formula 2.

$$3Si + 2N_2 \rightarrow Si_3N_2 \quad \text{[Formula 2]}$$

The pulverized Si is also nitrided at a temperature of 800 to 1200° C. for about 5 hours in nitrogen atmosphere to obtain silicon nitride. The silicon nitride is preferably those having high purity.

(6) Process P6

Silicon nitride is pulverized in the process 6.

(7) Process P7

In the process P7, a Eu compound, $Eu_2O_3$ is mixed with a B compound, $H_3BO_3$ in wet condition (P7). Europium oxide is used as the Eu compound, but metal europium, europium nitride and the like can be also used. Additionally, an imide compound, an amide compound and the like can be used as the Eu compound Europium oxide is preferably those having high purity. Hereat, the different elements such as a B compound are mixed in a wet process but a dry mixing can be carried out.

Hereat, in order to evaluate the influence when specific elements are mixed in a crucible, elements constituting crucible material, or raw materials, the respective elements (the different elements) are added as a condition in which they are easily diffused in a nitride. Namely, it is deduced that the salts of the respective elements have a similar diffusion property or more as a crucible, a usual form crucible material, a metal itself or an oxide.

In the present production process, since an example in which B was added is illustrated, the B compound $H_3BO_3$ is used, but in the present invention, there are Li, K, Na and the like as the different elements other than B, and as these compounds, for example, there can be used $H_2MoO_4$, $LiOH \cdot H_2O$, $Na_2CO_3$, $K_2CO_3$, RbCl, CsCl, $Mg(NO_3)_2$, $CaCl_2 \cdot 6H_2O$, $SrCl_2 \cdot 6H_2O$, $BaCl_2 \cdot 2H_2O$, $TiOSO_4 \cdot H_2O$, $ZrO(NO_3)_2$, $HfCl_4$, $VCl_3$, $Nb_2O_5$, $TaCl_5$, $Cr(NO_3)_3 \cdot 9H_2O$, $H_2WO_4$, $ReCl_5$, $FeCl_3 \cdot 3H_2O$, $RuCl_3 \cdot 2H_2O$, $Co(NO_3)_3 \cdot 6H_2O$, $NiCl_2 \cdot H_2O$, $IrCl_3$, $PdCl_2$, $H_2PtCl_6 \cdot 6H_2O$, $Cu(CH_3COO)_2 \cdot H_2O$, $AgNO_3$, $HAuCl_4 \cdot 4H_2O$, $Zn(NO_3)_2 \cdot 6H_2O$, $H_3BO_3$, $Al(NO_3)_3 \cdot 9H_2O$, $GaCl_3$, $InCl_3$, $GeO_2$, $Sn(CH_3COO)$, $Pb(NO_3)_2$, $(NH_4)_2HPO_4$, $Sb_2O_3$, $Bi(NO_3)_3 \cdot 5H_2O$, $(NH_4)_2SO_4$ and the like. Further, these compounds are illustrated by examples in which they were added in separated form from the nitride of Ca, the nitride of Si, the Eu compound and the like, but the different element may be contained in the composition of raw materials such as the nitride of Ca, the nitride of Si, the Eu compound and the like.

(8) Process P8

A mixture of a Eu compound $Eu_2O_3$ and a B compound $H_3BO_3$ is baked in oxygen atmosphere in the process 8.

(9) Process P9

A mixture of Eu and B is pulverized in the process P9.

The mean particle diameter of the mixture of Eu and B after the pulverization is preferably about 0.1 µm to 15 µm.

(10) Process P10

A mixture of the nitride of Ca, the nitride of Si, Eu and B is mixed in the process P10.

(11) Process P11

A mixture of the nitride of Ca, the nitride of Si, Eu and B is baked in ammonia atmosphere in the process P11. The phosphor represented by $Ca_2Si_5N_8$:Eu to which B was added is obtained. The reaction formula of nitride phosphor by firing of the process P11 is shown in Formula 3.

$$(1.985/3)Ca_3N_2 + (5/3)Si_3N_4 + (0.015/2)Eu_2O \rightarrow Ca_{1.985}Eu_{0.015}Si_5N_{7.990}O_{0.0225} \quad \text{[Formula 3]}$$

The phosphor of the mode 1 of operation is produced as described above.

The firing can be carried out at a firing temperature of 1200 to 2000° C., but a firing temperature of 1400 to 1800° C. is preferable. It is preferable that a temperature is gradually raised in the firing, and one step firing by which the firing is carried out at 1200 to 1500° C. for several hours is used, but there can be also used two step firing (multi step) by which the firing at the first step is carried out at 800 to 1000° C. is carried out and the firing at the second step is carried out at 1200 to 1500° C. is carried out. It is preferable to carry out the firing of the raw material of the phosphor using a crucible made of boron nitride (BN) material and a boat. A crucible made of alumina ($Al_2O_3$) material can be also used in addition to the crucible made of boron nitride material. These B, Al and the like can improve the brightness, and the phosphor having high luminescence efficiency can be provided.

Further, reduction atmosphere is atmosphere containing at least one or more of nitrogen, hydrogen, argon, carbon dioxide, carbon monoxide and ammonia. However, the firing can be also carried out in reduction atmosphere other than the atmosphere.

The composition of the objective phosphor can be changed by changing the respective raw material and compounding proportion in the above-mentioned production process.

The objective phosphor can be obtained by using the above production process.

(Light Emitting Element)

In the present invention, the light emitting element is preferably a semiconductor light emitting element having a luminescence spectrum which can excite the phosphor efficiently (namely, a semiconductor light emitting element having a light emitting layer which emits the light of a luminescence spectrum which can excite the phosphor efficiently). As the material of semiconductor light emitting element, there can be mentioned various semiconductor such as BN, SiC, ZnSe and GaN, InGaN, InAlGaN, AlGaN, BAlGAN and BInAlGaN. Further, a luminescence center can be also made by containing Si, Zn and the like in these elements as impurity elements. As the material of the phosphor which can efficiently emit light at a short wave length region among an ultraviolet region to a visible light region which can efficiently excite the phosphor, nitride semiconductors (for example, a nitride semiconductor containing Al and Ga, $In_XAl_YGa_{1-X-Y}N$, $0<X<1$, $0<Y<1$, $X+Y\leq 1$ as a nitride semiconductor containing In and Ga) are preferably mentioned.

Further, as the structure of the semiconductor, there are preferably mentioned semiconductors of a homo structure, a hetero structure or a double hetero structure having a MIS junction, a PIN junction, a p-n junction and the like. A luminescence wave length can be variously selected by the material of semiconductor layers and mix crystal ratio. Further, output power can be also further improved by making a single quantum well structure and a multi quantum well structure in which a semiconductor activating layer was formed to be a thin film which generates quantum effect.

When the nitride semiconductor is used, materials such as sapphire, spinel, SiC, Si, ZnO, GaAs and GaN are preferably used for a substrate. The sapphire substrate is preferably used for forming the nitride semiconductor having good crystallinity by mass production. The nitride semiconductor can be formed on the sapphire substrate using an HVPE method, a MOCVD method and the like. In this case, an amorphous buffer layer in which is GaN, AlN, GaAlN and the like were grown at a low temperature is formed on the sapphire substrate, and the nitride semiconductor having a p-n junction is formed thereon.

The preparation example of the light emitting element capable of efficiently emitting light at an ultraviolet region which has a p-n junction using the nitride semiconductor is as below.

Firstly, $SiO_2$ is formed in a stripe form about perpendicular to an orifla face of a sapphire substrate on the buffer layer. The ELOG (Epitaxial Lateral Over Grows GaN) growth of GaN is carried out on it using an HVPE method. Successively, the first contact layer comprising n-GaN, the first clad layer comprising n-AlGaN, active layers having multi quantum well structure which laminated a plural number of layers of the well layers of InAlGaN and the barrier layers of AlGaN, the second clad layer comprising p-AlGaN, and the second contact layer comprising p-GaN are laminated in order by the MOCVD method.

Further, it may be carried out as below without using the ELOG growth.

For example, Si undoped n-GaN layer, n-contact layer comprising Si-doped n-GaN, undoped n-GaN layer, light emitting layer having multi quantum well structure (multi quantum well structure of GaN barrier layer/InGaN well layer), p-clad layer comprising Mg-doped p-GaN, and p-contact layer comprising Mg-doped p-GaN are laminated in order on a sapphire substrate through GaN buffer layer. Further, electrodes are formed as below.

P-Ohmic electrode is formed all over the surface on p-contact layer, and a p-pad electrode 3 is formed on the portion of p-ohmic electrode.

Further, the undoped GaN layer is removed from the p-contact layer by etching, the portion of n-contact layer is exposed, and an n-electrode is formed on the exposed portion.

Further, the light emitting layer having multi quantum well structure was used in the present mode of operation, but the present invention is not limited to this. For example, it may be single quantum well structure utilizing InGaN, and GaN to which n-impurities and p-impurities such as Si, Zn and the like were doped may be utilized.

Further, the light emitting layer of the light emitting element 10 can change a main luminescence peak at a range of 420 nm to 490 nm by changing the content of In. Further, the wave length is not limited to the above-mentioned range, those having luminescence wave length at 360 to 550 nm can be used.

Thus, a semiconductor light emitting element having double hetero structure is constituted on a substrate. In the present invention, there may be used a semiconductor laser element in which active layer is made as a ridge stripe shape and sandwiched by guide layer, and the edge surface of a resonator is provided.

A nitride semiconductor exhibits n-type electroconductivity in a condition in which it is not doped. However, it is preferable to set the carrier concentration of the respective layers within a fixed range for improving the luminescence efficiency. It is preferable to appropriately introduce Si, Ge, Se, Te, C and the like as n-type dopant for forming a desired n-type nitride semiconductor in which the carrier concentration is controlled. On the other hand, when p-type nitride semiconductor is formed, it is preferable to dope Zn, Mg, Be, Ca, Sr, Ba and the like. The nitride semiconductor is hardly made be p-type by only doping the p-type dopant, therefore it is preferable to make it be low resistance by carrying out heating by a furnace, a treatment by plasma irradiation and the like after introduction of the p-type dopant. When a structure in which a sapphire substrate is not removed is made, p- and n-contact layers are exposed at the same face side by partially etching from p-type side to the surface of the first contact layer, and the respective electrodes are formed on the respective contact layers. A light emitting element comprising the nitride semiconductor is prepared by cutting in a chip shape.

In the light emitting device, the light emitting element is selected in the relation of an excitation wave length with the luminescence wave length of a phosphor used, in order to realize a luminescence color required, but then, it is appropriately selected considering the deterioration of a transparent resin by light and the like. In the present invention, those having a luminescence spectrum at an ultraviolet region and its main luminescence wave length is 360 nm or more and 420 nm or less, and those having 450 nm or more and 470 nm or less can be also used.

Hereat, it is preferable to adjust the relation of the sheet resistance Rn of n-contact layer formed at an impurity concentration of $10^{17}$ to $10^{20}/cm^3$ with the sheet resistance Rp of transparent p-electrode, to be $Rp \geq Rn$ in the semiconductor light emitting element. Specifically, since the n-contact layer is formed to have, for example, a film thickness of 3 to 10 μm and more preferably 4 to 6 μm, the sheet resistance Rn is estimated to be 10 to 15Ω/□. Accordingly, hereat, the Rp is preferably formed in a thin film to have a resistance value of the above-mentioned sheet resistance (10 to 15Ω/□) or more. Further, the transparent p-electrode may be formed in a thin film having a film thickness of 150 μm or less. Further, ITO and ZnO other than a metal can be used for the p-electrode. Hereat, an n-electrode mode equipped with a plural number of openings for light take-out such as a mesh electrode may be made in place of the transparent p-electrode.

Further, when the transparent p-electrode is formed by one kind selected from a group of gold and platinum and a multilayered film or alloy comprising at least one kind of other elements, stability and reproducibility are improved by adjusting the sheet resistance of the transparent p-electrode by the content of gold or platinum element contained. Since gold or a metal element has a high absorption coefficient at the wave length of the semiconductor light emitting element used for the present invention, the lesser the amount of gold or platinum element contained in the transparent p-electrode is, the better the transparency is. A conventional semiconductor light emitting element had the relation of the sheet resistance of $Rp \leqq Rn$, but in the present invention, since it is $Rp \geqq Rn$, the transparent p-electrode is formed in a thinner film in comparison with a conventional one. The thin film forming can be easily attained by reducing the amount of gold or platinum element.

As described above, the semiconductor light emitting element used for the present invention has preferably the relation of $Rp \geqq Rn$ for the sheet resistance $Rn\Omega/\square$ of n-contact layer and the sheet resistance $Rn\Omega/\square$ of the transparent p-electrode. However, since it is difficult to measure Rn after preparing the semiconductor light emitting element, it is substantially impossible to know the relation of Rp and Rn, but it is possible to know what relation exists between Rp and Rn from the condition of light intensity distribution at light emission.

Further, when the transparent p-electrode and n-contact layer have the relation of $Rp \geqq Rn$, it is preferable to provide p-side pedestal electrode having an extended conduction portion in contact with the above-mentioned transparent p-electrode, therefore the external quantum efficiency can be further improved. The shape and direction of the extended conduction portion is not limited, and when the extended conduction portion is a linear shape, an area obstructing light is preferably reduced, but the shape may be a mesh shape. The shape may be a curve, a lattice, a branch and a hook other than linear shape. Hereat, since the shading effect is increased in proportion to the total area of the p-side pedestal electrode, it is preferable to design the line width and length of the extended conduction portion so that the shading effect does not exceeds the luminescence increasing effect.

(Coating Member)

The coating member 12 (transparent material) is provided in the cup of the lead frame 13, and used by being mixed with the phosphor 11 which converts the luminescence of the light emitting element 10. As the specific material of the coating member 12, there are used transparent resins excellent in temperature characteristic and weather resistance such as an epoxy resin, a urea resin, a silicone resin, silica sol, glass, an inorganic binder and the like. Further, a dispersant, barium titanate, titanium oxide, aluminum oxide and the like may be contained together with the phosphors. Further, a light stabilizer, a coloring agent may be contained.

(Lead Frame)

The lead frame 13 is constituted by the mount lead 13a and the inner lead 13b.

The mount lead 13a arranges the light emitting element 10. The upper part of the mount lead 13a is a cup shape, and the light emitting element 10 is die-bonded in the cup. Further, the external surface of the light emitting element 10 is covered in the cup with the coating member 12 containing the phosphor 11. A plural number of the light emitting elements 10 are arranged in the cup, and the mount lead 13a can be utilized as a common electrode of the plural number of the light emitting elements 10. In this case, an adequate electroconductivity and the connecting property of the electroconductive wire 14 are required. The die bonding (adhesion) of the light emitting element 10 with the cup of the mount lead 13a can be carried out by a thermoplastic resin and the like. As the thermoplastic resin, an epoxy resin, an acryl resin, an imide resin and the like are mentioned. An Ag paste with a carbon paste, a metal bump and the like can be used for die bonding the light emitting element with the mount lead 13a by a flip chip bonding and the like (face down structure) and carrying out electric connection. Further, an inorganic binder can be also used.

Further, the inner lead 13b is electrically connected by the electrode 3 of the light emitting elements 10 which was arranged on the mount lead 13a and the electroconductive wire 14. The inner lead 13b is arranged at a position which is separated from the mount lead 13a for preventing the electrical connection with the mount lead 13a. When a plural number of the light emitting elements 10 are arranged on the mount lead 13a, a constitution in which the respective wires are not mutually connected is required. The inner lead 13b uses preferably the similar material as that of the mount lead 13a, and iron, copper, copper with iron, gold, platinum, silver and the like can be used.

(Electroconductive Wire)

The electroconductive wire 14 electrically connects the electrode 3 of the light emitting elements 10 and the lead frame 13. The electroconductive wire 14 is preferably those having good ohmic property, mechanical connecting property and heat conductivity with the electrode 3. The specific material of the electroconductive wire 14 is preferably metals such as gold, copper, platinum, aluminum and the like, and alloys thereof, etc.

(Mold Member)

The mold member 15 is provided for protecting the light emitting elements 10, the phosphor 11, the coating member 12, the lead frame 13, the electroconductive wire 14 and the like from the external. The mold member 15 has purposes of expanding the angle of visibility, reducing the directionality of the light emitting elements 10, and focusing and scattering luminescence in addition to the purpose of protection from the external. In order to attain the purposes, the mold member 15 is formed in a desired shape. Namely, the mold member 15 may be a convex lens shape, a concave lens shape, additionally, a structure in which a plural number of layers were laminated. As the specific material of the mold member 15, materials excellent in transmission property, weather resistance and temperature characteristic such as an epoxy resin, a urea resin, a silicone resin, silica sol, glass, and the like can be used. A dispersant, a coloring agent, an ultraviolet absorbent and a phosphor be contained in the mold member 15. As the dispersant, barium titanate, titanium oxide, aluminum oxide and the like are preferable. The material is preferably used for reducing the repulsion of the mold member 15 with the material and for considering a refractive index.

Mode 2 of Operation

In similar manner as the mode 1 of operation, the light emitting device of the mode 2 of operation is the type I light emitting device which has at least a light emitting element which emits light of the first luminescence spectrum, and a nitride phosphor which converts the wave length of at least the portion of light of the above-mentioned first luminescence spectrum and has the second luminescence spectrum.

The light emitting device of the present mode 2 of operation uses, for example, only the nitride phosphor described later, as the phosphor 11. The phosphor 11 absorbs the portion of light at an ultraviolet to blue region which was emitted from the light emitting elements 10, and emits light at a yellow to red region. The light emitting device of the present mode 2 of operation emits light of a warm color-base white color and pastel colors such as pink by color mixing of the blue light emitted from the light emitting elements 10 with the red light of the phosphor, using the phosphor 11 for the type I light emitting device. The light emitting device of the mode 2 of operation is a light emitting device capable of emitting light of an electric bulb color by color mixing of the blue light emitted from the light emitting elements with the red light of the phosphor, and the yellow-green light of yttrium-aluminate garnet phosphor according to the JIS Specification.

Hereat, the electric bulb color is a range in which a point of 2500 to 3500K on the locus of black body radiation is made as a center in a white color according to the JIS Specification (JIS Z8110), and means a tinge having a tinge from yellow to red. Specifically, it means those having a luminescence color at the regions of (light) yellow red, (orange) pink, pink, (light) pink and (yellowish) white in the chromaticity coordinate of FIG. 8.

Further, the light emitting device of the mode 2 of operation is not limited to the type I, and for example, may be the type II.

The phosphor related to the present mode 2 of operation is illustrated below.

The phosphor of the present mode 2 of operation is a nitride phosphor containing at least one or more of the Group II Elements selected from a group consisting of Be, Mg, Ca, Sr, Ba and Zn, at least one or more of the Group IV Elements selected from a group consisting of C, Si, Ge, Sn, Ti, Zr and Hf, and N which is activated by at least one or more of the rare earth elements selected from a group consisting of Y, La, Ce, Pr, Nd, Sm, Eu, Gd, Tb, Dy, Ho, Er and Lu; and further, 1 ppm or more and 10000 ppm or less of B is contained. Further, O may be contained in the composition of said nitride phosphor. Among various nitride phosphors by the above-mentioned combinations, there is more preferable the nitride phosphor consisting of at least any one of one element of Ca and Sr, Si and N which is activated by Eu, and the nitride phosphor in which 1 ppm or more and 10000 ppm or less of B is contained. The portion of Eu can be substituted by at least one or more of the rare earth elements selected from a group consisting of Y, La, Ce, Pr, Nd, Sm, Eu, Gd, Tb, Dy, Ho, Er and Lu. The portion of at least any one of one element of Ca and Sr can be substituted by at least one or more of the Group II Elements selected from a group consisting of Be, Mg, Ba and Zn. The portion of Si can be substituted by at least one or more of the Group IV Elements selected from a group consisting of C, Ge, Sn, Ti, Zr and Hf.

Namely, the nitride phosphor related to the present mode 2 of operation is a nitride phosphor which is represented by the general formula $L_X M_Y N_{(2/3)X+(4/3)Y}$:R or $L_X M_Y O_Z N_{(2/3)X+(4/3)Y-(2/3)Z}$:R (wherein L is at least one or more of the Group II Elements selected from a group consisting of Be, Mg, Ca, Sr, Ba and Zn. M is at least one or more of the Group IV Elements selected from a group consisting of C, Si, Ge, Sn, Ti, Zr and Hf. R is at least one or more of the rare earth elements selected from a group consisting of Y, La, Ce, Pr, Nd, Sm, Eu, Gd, Tb, Dy, Ho, Er and Lu. X, Y and Z are $0.5 \leq X \leq 3$, $1.5 \leq Y \leq 8$, $0 \leq Z \leq 3$), and 1 ppm or more and 10000 ppm or less of B is contained. As the specific example contained in the general formula, there are mentioned $(Sr_T Ca_{1-T})_2 Si_5 N_8$:Eu, $Ca_2 Si_5 N_8$:Eu, $Sr_T Ca_{1-T} Si_7 N_{10}$:Eu, $SrSi_7 N_{10}$:Eu, $CaSi_7 N_{10}$:Eu, $Sr_2 Si_5 N_8$:Eu, $Ba_2 Si_5 N_8$:Eu, $Mg_2 Si_5 N_8$:Eu, $Zn_2 Si_5 N_8$:Eu, $SrSi_7 N_{10}$:Eu, $BaSi_7 N_{10}$:Eu, $MgSi_7 N_{10}$:Eu, $ZnSi_7 N_{10}$:Eu, $Sr_2 Ge_5 N_8$:Eu, $Ba_2 Ge_5 N_8$:Eu, $Mg_2 Ge_5 N_8$:Eu, $Zn_2 Ge_5 N_8$:Eu, $SrGe_7 N_{10}$:Eu, $BaGe_7 N_{10}$:Eu, $MgGe_7 N_{10}$:Eu, $ZnGe_7 N_{10}$:Eu, $Sr_{1.8} Ca_{0.2} Si_5 N_8$:Eu, $Ba_{1.8} Ca_{0.2} Si_5 N_8$:Eu, $Mg_{1.8} Ca_{0.2} Si_5 N_8$:Eu, $Zn_{1.8} Ca_{0.2} Si_5 N_8$:Eu, $Sr_{0.8} Ca_{0.2} Si_7 N_{10}$:Eu, $Ba_{0.8} Ca_{0.2} Si_7 N_{10}$:Eu, $Mg_{0.8} Ca_{0.2} Si_7 N_{10}$:Eu, $Zn_{0.8} Ca_{0.2} Si_7 N_{10}$:Eu, $Sr_{0.8} Ca_{0.2} Ge_7 N_{10}$:Eu, $Ba_{0.8} Ca_{0.2} Ge_7 N_{10}$:Eu, $Mg_{0.8} Ca_{0.2} Ge_7 N_{10}$:Eu, $Zn_{0.8} Ca_{0.2} Ge_7 N_{10}$:Eu, $Sr_{0.8} Ca_{0.2} Si_6 GeN_{10}$:Eu, $Ba_{0.8} Ca_{0.2} Si_6 GeN_{10}$:Eu, $Mg_{0.8} Ca_{0.2} Si_6 GeN_{10}$:Eu, $Zn_{0.8} Ca_{0.2} Si_6 GeN_{10}$:Eu, $Sr_2 Si_5 N_8$:Pr, $Ba_2 Si_5 N_8$:Pr and $Sr_2 Si_5 N_8$:Tb, $BaGe_7 N_{10}$:Ce (0<T<1).

B can be easily added by adding a boron compound to the respective raw materials and mixing them by a wet process or a dry process. Further, boron (B) can be preliminarily contained in raw materials such as $Ca_3 N_2$ and $Si_3 N_4$. For example, when a wet mixing is carried out and $H_3 BO_3$ is added, 1 ppm or more and 1000 ppm or less is preferable. In particular, 100 ppm or more and 1000 ppm or less is preferable. When a dry mixing is carried out and boron is added, 1 ppm or more and 10000 ppm or less is preferable. In particular, 100 ppm or more and 10000 ppm or less is preferable. Said boron works as flux. As boron added to raw materials, boron, a boride, boron nitride, boron oxide, a borate and the like can be used. Specifically, BN, $H_3 BO_3$, $B_2 O_6$, $B_2 O_3$, $BCl_3$, $SiB_6$, $CaB_6$ and the like are mentioned. These boron compounds are added to raw materials by weighing a fixed amount. The addition amount of boron to raw materials does not always coincide with the content of boron after firing. Since the portion of boron is scattered at the firing step in production steps, the content of boron after firing becomes less than the amount at adding to raw materials.

L is at least one or more of the Group II Elements selected from a group consisting of Be, Mg, Ca, Sr, Ba and Zn. Accordingly, Mg, Ca, Sr and the like can be used alone, but the combinations of Ca and Sr, Ca and Mg, Ca and Sr and the like are possible. In particular, the phosphor having good luminescence brightness, quantum efficiency and the like can be provided by using at least either of Ca and Sr in the composition of the nitride phosphor. The phosphor has at least one element of either of Ca and Sr, and the portion of Ca and Sr may be substituted with Be, Mg, Ba and Zn. When a mixture of 2 or more of elements is used, the compounding ratio can be changed according to requirement. Hereat, the peak wave length is shifted to a longer wave length side by mixing Sr and Ca, than by using Sr or Ca alone. When the molar ratio of Sr and Ca is 7:3 or 3:7, the peak wave length is respectively shifted to a longer wave length side than by using Sr or Ca alone. Further, when the molar ratio of Sr and Ca is about 5:5, the peak wave length is shifted to the longest wave length side.

M is at least one or more of the Group IV Elements selected from a group consisting of C, Si, Ge, Sn, Ti, Zr and Hf. Accordingly, C, Si, Ge and the like can be used alone, but the combinations of C and Si, Ge and Si, Ti and Si, Zr and Si, Ge, Ti and Si, and the like are possible. In particular, the economic nitride phosphor having good crystallinity can be provided. The portion of Si may be substituted with C, Ge, Sn, Ti, Zr and Hf. When a mixture in which Si is essential is used, the compounding ratio can be changed according to requirement. For example, Si is used by 95% by weight and Ge is used by 5% by weight.

R is at least one or more of the rare earth elements selected from a group consisting of Y, La, Ce, Pr, Nd, Sm, Eu, Gd, Tb, Dy, Ho, Er and Lu. Eu, Pr, Ce and the like can be used alone, but the combinations of Ce and Eu, Pr and Eu, La and Eu, and the like are possible. In particular, the nitride phosphor having good luminescence properties which has a peak wave length at a yellow to red region can be provided by using Eu as an activator. The portion of Eu may be substituted with Y, La, Ce, Pr, Nd, Sm, Gd, Tb, Dy, Ho, Er and Lu. Other element works as a co-activator by substituting the portion of Eu with other element. The color tone can be changed by making as the co-activator, and the adjustment of luminescence properties can be carried out. When a mixture in which Eu is essential is used, the compounding ratio can be changed according to requirement. Example related to the mode 2 of operation uses europium Eu being the rare earth element as a luminescent center. Europium has mainly 2-valent and 3-valent energy levels. The phosphor of the present invention uses $Eu^{3+}$ for the alkali earth metal silicon nitride phosphor of mother-body as the activator. For example, it is preferable to use europium alone or europium nitride.

The effect of adding boron accelerates the diffusion of $Eu^{3+}$ and can improve the luminescence properties such as luminescence brightness, energy efficiency and luminescence efficiency.

The above-mentioned nitride phosphor can further contain 1 ppm or more and 500 ppm or less of at least one or more of the Group I Elements selected from a group consisting of Li, Na, K, Rb and Cs. The Group I Elements are scattered during firing at the production steps, therefore the addition amount after firing is a less amount than the initial addition to raw materials. Accordingly, the amount added to raw materials is preferably adjusted at 1000 ppm or less. Because the luminescence efficiency such as luminescence brightness can be adjusted thereby. The luminescence brightness and luminescence efficiency can be improved by adding the Group I Elements, as described above.

The above-mentioned nitride phosphor can further contain 1 ppm or more and 500 ppm or less of at least one or more of elements selected from the Group I Element consisting of Cu, Ag and Au, the Group III Element consisting of Al, Ga and In, the Group IV Element consisting of Ti, Zr, Hf, Sn and Pb, the Group V Element consisting of P, Sb and Bi, the Group VI Element consisting of S. These elements are scattered during firing at the production steps in like manner as the Group I Elements, therefore the addition amount after firing is a less amount than the initial addition to raw materials. Accordingly, the amount added to raw materials is preferably adjusted to 1000 ppm or less. The luminescence efficiency can be adjusted by adding these elements.

The above-mentioned nitride phosphor can further contain 1 ppm or more and 500 ppm or less of either of Ni and Cr. Because it is carried out for adjusting afterglow. Accordingly, the amount added to raw materials is preferably adjusted to 1000 ppm or less.

The elements further added to the above-mentioned nitride phosphor are usually added by oxides, or hydroxy oxides, but are not limited to these. A metal, a nitride, an imide, an amide or other inorganic salts, and they may be used in a condition in which they are preliminarily contained in other raw materials.

Oxygen is occasionally contained in the composition of the above-mentioned nitride phosphor. It is considered that oxygen is introduced from various oxides being raw materials or oxygen is mixed during firing. The oxygen is considered to accelerate the effects of Eu diffusion, particle growth and the improvement of crystallinity. Namely, the similar effect can be obtained by replacing one compound which is used for raw materials, to metals, nitrides and oxides, but there is also a case that the effect of using oxides is rather big. The crystal configuration of the nitride phosphor is monoclinic or orthorhombic, but occasionally amorphous, hexagonal system and the like.

The above-mentioned phosphor of the mode 2 of operation can be prepared by the similar method as the mode 1 of operation.

Further, the steps of P7 to P9 are abbreviated, and the nitride of Ca, the nitride of Si, the Eu compound $Eu_2O_3$ and the B compound $H_{13}BO_3$ can be also mixed in a dry process.

Further, in the light emitting device of the mode 2 of operation, phosphors of at least one or more of a phosphor emitting blue light, a phosphor emitting green light and a phosphor emitting red light can be mixed to be used in addition to the nitride phosphor related to the above-mentioned mode 2 of operation.

There are various phosphors for a phosphor emitting blue light, a phosphor emitting green light and a phosphor emitting red light, but in particular, there are preferably used at least one or more of the yttrium-aluminum oxide phosphor activated by at least cerium, the yttrium-gadolinium-aluminum oxide phosphor activated by at least cerium, and the yttrium-gallium-aluminum oxide phosphor activated by at least cerium. The light emitting device having a desired luminescence color can be provided thereby. When the phosphor related to the present mode 2 of operation, the yttrium-aluminum oxide phosphor activated by cerium and the like, there is little self absorption in these phosphors, therefore luminescence can be efficiently taken out. Specifically, there can be used $Ln_3M_5O_{12}$:R (Ln is at least one or more selected from Y, Gd and La. M contains at least either of Al and Ca. R is Lanthanide series), $(Y_{1-x}Gd_x)_3(Al_{1-y}Ga_y)_5O_{12}$:R (R is at least one or more selected from Ce, Th, Pr, Sm, Eu, Dy and Ho. $0<R<0.5$). Said phosphors are excited by light at a short wave length side of a near ultraviolet to visible light, 270 to 500 nm, and has a peak wave length at 500 to 600 nm. However, the phosphor having the third luminescence spectrum such as a blue color is not limited to the above-mentioned phosphors, and various phosphors can be used.

As the excitation light source of the phosphor related to the present mode 2 of operation, there are a laser, a diode, ultraviolet radiation generated in the positive column of arc discharge, ultraviolet radiation generated in the positive column of glow discharge, and the like. However, as the excitation light source, it is preferable to use a semiconductor light emitting element and a laser diode discharging light at near ultraviolet region, a semiconductor light emitting element and a laser diode emitting blue light, and a semiconductor light emitting element and a laser diode emitting blue green light.

Further, light at a short wave length region of near ultraviolet to visible light means a wave length from about 270 nm to 500 nm.

Mode 3 of Operation

The light emitting device of the mode 3 of operation related to the present invention is the type I (bullet type) light emitting device, and is constituted in similar manner as the mode 1 of operation.

The phosphor of the light emitting device related to the present invention is specifically illustrated.

The phosphor related to the mode 3 of operation of the present invention is represented by L-M—N:Eu,WR or L-M-O—N:Eu,WR (wherein L is at least one or more selected from a group consisting of II valency of Be, Mg, Ca, Sr, Ba and Zn. M is at least one or more selected from a group consisting of IV valency of C, Si, Ge, Sn, Ti, Zr and Hf. N is nitrogen. Eu is europium. WR is the rare earth element).

In the illustration below, among the phosphor related to the mode 3 of operation of the present invention, there are mainly illustrated the Ca—Si—N:Eu, WR-base, or Sr—Si—N:Eu, WR-base, or Sr—Ca—Si—N:Eu, WR-base, or Ca—Si—O—N:Eu, WR-base, or Sr—Si—O—N:Eu, WR-base, or Sr—Ca—Si—O—N:Eu, WR-base silicon nitride, but it is not limited to this.

For example, as the modes, there are contained various combinations of the phosphors such as Ca—Ge—N:Eu,WR-base, Sr—Ge—N:Eu,WR-base, Sr—Ca—Ge—N:Eu,WR-base, Ca—Ge—O—N:Eu,WR-base, Sr—Ge—O—N:Eu, WR-base, Sr—Ca—Ge—O—N:Eu,WR-base, Ba—Si—N: Eu,WR-base, Sr—Ba—Si—N:Eu,WR-base, Ba—Si—O—N:Eu,WR-base, Sr—Ba—Si—O—N:Eu,WR-base, Ca—Si—C—N:Eu,WR-base, Sr—Si—C—N:Eu,WR-base, Sr—Ca—Si—C—N:Eu,WR-base, Ca—Si—C—O—N:Eu, WR-base, Sr—Si—C—O—N:Eu,WR-base, Sr—Ca—Si—C—O—N:Eu,WR-base, Mg—Si—N:Eu,WR-base, Mg—Ca—Sr—Si—N:Eu,WR-base, Sr—Mg—Si—N:Eu, WR-base, Mg—Si—O—N:Eu,WR-base, Mg—Ca—Sr—Si—O—N:Eu,WR-base, Sr—Mg—Si—O—N:Eu,WR-base, Ca—Zn—Si—C—N:Eu,WR-base, Sr—Zn—Si—C—N:Eu,WR-base, Sr—Ca—Zn—Si—C—N:Eu,WR-base, Ca—Zn—Si—C—O—N:Eu,WR-base, Sr—Zn—Si—C—O—N:Eu,WR-base, Sr—Ca—Zn—Si—C—O—N:Eu,WR-base, Mg—Zn—Si—N:Eu,WR-base, Mg—Ca—Zn—Sr—Si—N:Eu,WR-base, Sr—Zn—Mg—Si—N:Eu,WR-base, Mg—Zn—Si—O—N:Eu,WR-base, Mg—Ca—Zn—Sr—Si—O—N:Eu,WR-base, Sr—Mg—Zn—Si—O—N:Eu, WR-base, Ca—Zn—Si—Sn—C—N:Eu,WR-base, Sr—Zn—Si—Sn—C—N:Eu,WR-base, Sr—Ca—Zn—Si—Sn—C—N:Eu,WR-base, Ca—Zn—Si—Sn—C—O—N: Eu,WR-base, Sr—Zn—Si—Sn—C—O—N:Eu,WR-base, Sr—Ca—Zn—Si—Sn—C—O—N:Eu,WR-base, Mg—Zn—Si—Sn—N:Eu,WR-base, Mg—Ca—Zn—Sr—Si—Sn—N:Eu,WR-base, Sr—Zn—Mg—Si—Sn—N:Eu, WR-base, Mg—Zn—Si—Sn—O—N:Eu,WR-base, Mg—Ca—Zn—Sr—Si—Sn—O—N:Eu,WR-base, Sr—Mg—Zn—Sr—Si—Sn—O—N:Eu,WR-base, and the like.

As the WR being the rare earth element, it is preferable that at least one or more among Y, La, Ce, Pr, Nd, Gd, Tb, Dy, Ho, Er and Lu is contained, but Sc, Sm, Tm and Yb may be contained. These rare earth elements are mixed in raw materials in a condition of a single body, an oxide, an imide, an amide and the like. The rare earth element has mainly a stable electron disposition, but Yb, Sm and the like have a 2-valency electron disposition and Ce, Pr, Tb and the like have a 4-valency electron disposition. When the rare earth element of an oxide is used, the participation of oxygen influences the luminescence properties of the phosphor. Namely, there is a case of enhanced diffusion effect of the activator. There is a case of shortening afterglow and the like. However, when Mn is used, particle diameter is enlarged by the flux effect of Mn and O, and the luminescence brightness can be improved.

The example below is the Sr—Ca—Si—N:Eu, WR-base, Ca—Si—N:Eu, WR-base, Sr—Si—N:Eu, WR-base, Sr—Ca—Si—O—N:Eu WR-base, Ca—Si—O—N:Eu, WR-base, Sr—Si—O—N:Eu, WR-base silicon nitrides to which Mn was added. The base nitride phosphor of the phosphor are represented by the general formula $L_XSi_YN_{(2/3)X+(4/3)Y}$:Eu, WR or $L_XSi_YO_ZN_{(2/3)X+(4/3)Y-(2/3)Z}$:Eu, WR (L is either of Sr, Ca, Sr and Ca). It is preferable that X and Y is X=2 and Y=5, or X=1 and Y=7 in the general formula, but an arbitrary one can be also used. Specifically, it is preferable to use the phosphor in which the base nitride phosphor are represented by $(Sr_XCa_{1-x})_2Si_5N_8$:Eu,WR, $Sr_2Si_5N_8$:Eu,WR, $Ca_2Si_5N_8$:Eu,WR, $Sr_XCa_{1-X}si_7N_{10}$:Eu,WR, $SrSi_7N_{10}$:Eu,WR and $CaSi_7N_{10}$:Eu,WR to which Mn was added, but at least one or more selected from a group consisting of Mg, Sr, Ca, Ba, Zn, B, Al, Cu, Cr and Ni may be contained in the composition of the phosphor. However, the present invention is not limited to the mode of operation and Examples.

L is either of Sr, Ca, Sr and Ca. The compounding ratio of Sr and Ca can be changed according to requirement.

An economic phosphor having good crystallinity can be provided by using Si in the composition of the phosphor.

Europium being the rare earth element is used as a luminescent center. Europium has mainly 2-valent and 3-valent energy levels. In the phosphor of the present invention, $Eu^{3+}$ is used for the alkali earth metal silicon nitride phosphor of mother-body as the activator. $Eu^{3+}$ is easily oxidized and it is commercially available in the composition of 3-valent $Eu_2O_3$. However, since O participates greatly in case of the commercially available $Eu_2O_3$, a good phosphor is hardly obtained. Accordingly, it is preferable to use those in which O is eliminated from $Eu_2O_3$ to the out of system. For example, it is preferable to use europium alone or europium nitride. However, when Mn is added, then it is not limited to this.

$Sr_2Si_5N_8$:Eu,Pr, $Ba_2Si_5N_8$:Eu,Pr, $Mg_2Si_5N_8$:Eu,Pr, $Zn_2Si_5N_8$:Eu,Pr, $SrSi_7N_{10}$:Eu,Pr, $BaSi_7N_{10}$:Eu,Ce, $MgSi_7N_{10}$:Eu,Ce, $ZnSi_7N_{10}$:Eu,Ce, $Sr_2Ge_5N_8$:Eu,Ce, $Ba_2Ge_5N_8$:Eu,Pr, $Mg_2Ge_5N_8$:Eu,Pr, $Zn_2Ge_5N_8$:Eu,Pr, $SrGe_7N_{10}$:Eu,Ce, $BaGe_7N_{10}$:Eu,Pr, $MgGe_7N_{10}$:Eu,Pr, $ZnGe_7N_{10}$:Eu,Ce, $Sr_{1.8}Ca_{0.2}Si_5N_8$:Eu,Pr, $Ba_{1.8}Ca_{0.2}Si_5N_8$:Eu,Ce, $Mg_{1.8}Ca_{0.2}Si_5N_8$:Eu,Pr, $Zn_{1.8}Ca_{0.2}Si_5N_8$:Eu,Ce, $Sr_{0.8}Ca_{0.2}Si_7N_{10}$:Eu,La, $Ba_{0.8}Ca_{0.2}Si_7N_{10}$:Eu,La, $Mg_{0.8}Ca_{0.2}Si_7N_{10}$:Eu,Nd, $Zn_{0.8}Ca_{0.2}Si_7N_{10}$:Eu,Nd, $Sr_{0.8}Ca_{0.2}Ge_7N_{10}$:Eu,Tb, $Ba_{0.8}Ca_{0.2}Ge_7N_{10}$:Eu,Th, $Mg_{0.8}Ca_{0.2}Ge_7N_{10}$:Eu,Pr, $Zn_{0.8}Ca_{0.2}Ge_7N_{10}$:Eu,Pr, $Sr_{0.8}Ca_{0.2}Si_6GeN_{10}$:Eu,Pr, $Ba_{0.8}Ca_{0.2}Si_6GeN_{10}$:Eu,Pr, $Mg_{0.8}Ca_{0.2}Si_5GeN_{10}$:Eu,Y, $Zn_{0.8}Ca_{0.2}Si_6GeN_{10}$:Eu,Y, $Sr_2Si_5N_8$:Pr, $Ba_2Si_5N_8$:Pr, $Sr_2Si_5N_8$:Tb, $BaGe_7N_{10}$:Ce and the like are produced, but the phosphor is not limited to this.

Mn being an additive accelerates the diffusion of $Eu^{3+}$ and improves the luminescence properties such as luminescence brightness, energy efficiency and quantum efficiency. Mn is baked together with raw materials during the production step by being contained in the raw materials or by containing Mn alone or a Mn compound. However, Mn is not contained in the base nitride phosphor after firing, and only a small amount of Mn remains in comparison with the initial content even if Mn is contained. This considered to be because Mn was scattered in the firing step.

The phosphor contains at least one or more selected from a group consisting of Mg, Sr, Ca, Ba, Zn, Ca, Ga, In, B, Al, Cu, Li, Na, K, Re, Ni, Cr, Mo, O and Fe in the base nitride phosphor or together with the base nitride phosphor. These elements have actions of enlarging the particle diameter and enhancing the luminescence brightness, etc. Further, B, Al, Mg, Cr and Ni have an action capable of suppressing afterglow. The phosphor to which additives such as B, Mg and Cr are not added can usually shorten the time required for reducing afterglow to ⅒, to from about ½ to about ¼ than a phosphor to which the additive is added.

The phosphor 11 related to the present mode 3 of operation absorbs the portion of blue light which was emitted from the light emitting element 10 and emits light at a yellow to red region. The phosphor 11 is used to the light emitting device having the above-mentioned constitution, and there is provided the light emitting device which emits light of a warm color-base white color by color mixing of blue light which was emitted from the light emitting element 10, with the red light of the phosphor.

In particular, it is preferable to contain the yttrium-aluminum oxide phosphor activated by cerium, in the phosphor 11 in addition to the phosphor related to the present invention. Because the phosphor can be adjusted to a desired chromaticity by containing the above-mentioned yttrium-aluminum oxide phosphor activated by cerium. The yttrium-aluminum oxide phosphor activated by cerium absorbs the portion of blue light which was emitted from the light emitting element 10 and emits light at a yellow region. Light of a pale white color is emitted by color mixing of blue light which was emitted from the light emitting element 10, with the yellow light of the yttrium-aluminum oxide phosphor. Accordingly, there can be provided the light emitting device which emits light of a warm color-base white color by combining the yttrium-aluminum oxide phosphor and the above-mentioned phosphor, with the phosphor 11 which was mixed with a coating member having transparency and blue light which is emitted from a blue light emitting element 10. The light emitting device which emits light of a warm color-base white color is the average color rendering index Ra of 75 to 95 and a color temperature of 2000K to 8000K. The preferable device in particular is a light emitting device in which the average color rendering index Ra and color temperature are situated at the locus of black body radiation in a chromaticity chart. However, the compounding amount of the yttrium-aluminum oxide phosphor and the phosphor is appropriately changed in order to provide a light emitting device having a desired color temperature and the average color rendering index. The warm color-base white color light emitting device improves further the specific color rendering index R9. With respect to a white color light emitting device which is the combination of a conventional blue light emitting element and the yttrium-aluminum oxide phosphor activated by cerium, the specific color rendering index R9 is about near 0, and a red component was insufficient. Accordingly, it has been a solving problem to enhance the specific color rendering index R9, but the specific color rendering index R9 can be enhanced to 60 to 70 by containing the phosphor related to the present invention in the yttrium-aluminum oxide luminescent substance.

(Production Process of Phosphor)

Figure 13:
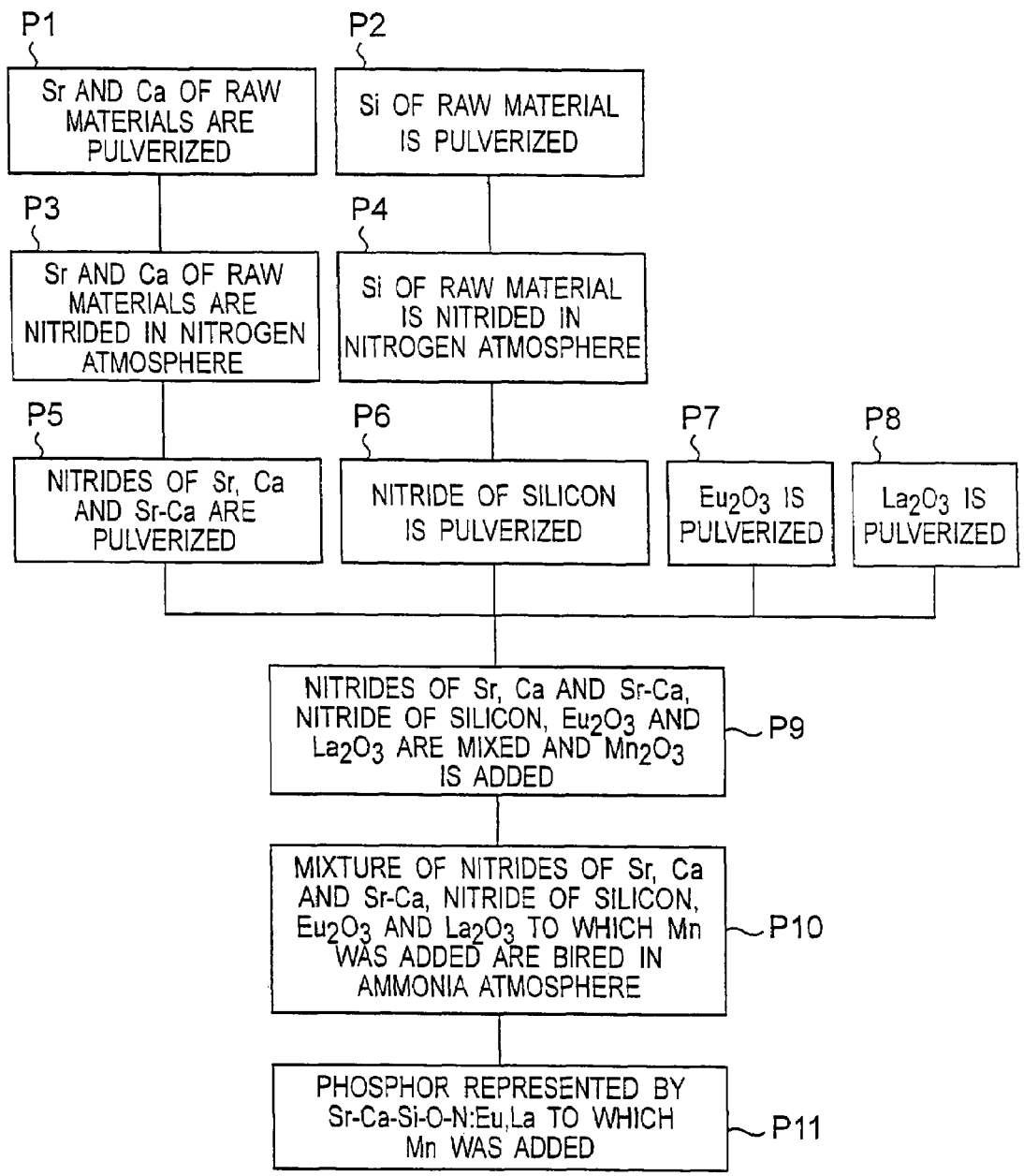
FIG. 13 is a chart showing the flow of the production steps of the nitride phosphor of the mode 3 of operation related to the present invention.

Then, the production process of the phosphor, Sr—Ca—Si—O—N:Eu,La of the mode 3 of operation related to the present invention is illustrated using FIG. 13, but is not limited to the present production process. Mn is contained in the above-mentioned phosphor.

Sr and Ca of a raw material are pulverized (P1). Sr and Ca of a raw material are preferably used as a single body, but compounds such as an imide compound, an amide compound and the like can be used. Further, the Sr and Ca of a raw material may be those containing B, Al, Cu, Mg, MnO, $Mn_2O_3$, $Al_2O_3$ and the like. It is preferable that the mean particle diameter of Sr and Ca obtained by pulverization is about 0.1 μm to 15 μm, but is not limited to this range. The purity of Sr and Ca is preferably 2N or more, but is not limited to this range. After at least 2 or more among a metal Ca, a metal Sr and a metal Eu are made as an alloy condition, it is nitrided and pulverized, and then can be used as a raw material.

The Si of a raw material is pulverized (P2). Si of a raw material is preferably used as a single body, but a nitride compound, an imide compound, an amide compound and the like can be used. For example, they are $Si_3N_4$, $Si(NH_2)_2$, $Mg_2Si$ and the like. The purity of the Si of a raw material is preferably 3N or more, but compounds such as $Al_2O_3$, Mg, a metal boride ($Co_3B$, $Ni_3B$, CrB), manganese oxide, $H_3BO_3$, $B_2O_3$, $Cu_2O$ and CuO may be contained. It is preferable that the mean particle diameter of the Si compound is about 0.1 μm to 15 μm.

Then, the Sr and Ca of a raw material is nitrided in nitrogen atmosphere (P3).

The reaction is shown in Formula 4.

$3Sr+N_2 \rightarrow Sr_3N_2$ 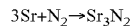

$3Ca+N_2 \rightarrow Ca_3N_2$ [Formula 4]

Sr and Ca are nitrided at a temperature of 600 to 900° C. for about 5 hours in nitrogen atmosphere. Sr and Ca may be nitrided by mixing, and the respective one may be separately nitrided. The nitrides of Sr and Ca can be obtained thereby. The nitrides of Sr and Ca are preferably those having high purity, but those which are commercially available can be used.

The Si of a raw material is nitrided in nitrogen atmosphere (P4). The reaction formula is shown in Formula 5.

$3Si+2N_2 \rightarrow Si_3N_4$ [Formula 5]

Silicone Si is also nitrided at a temperature of 800 to 1200° C. for about 5 hours in nitrogen atmosphere to obtain silicon nitride. The silicon nitride is preferably those having high purity, but those which are commercially available can be also used.

The nitrides of Sr, Ca, or Sr—Ca are pulverized (P5).

Similarly, the nitride of Si is pulverized (P6).

Further, a Eu compound $Eu_2O_3$ is pulverized (P7). Europium oxide is used as the Eu compound, but metal europium, europium nitride and the like can be also used. Europium oxide is preferably those having high purity, but those commercially available can be also used.

At least one or more selected from a group consisting of Mg, Sr, Ca, Ba, Zn, B, Al, Cu, Mn, Cr, O and Ni may be contained in the above-mentioned raw materials. Further, the compounding amount of the above-mentioned elements can be adjusted and mixed in the mixing process (P8) below. These compounds can be added alone in raw materials, but added in the form of compounds. The compounds are $H_3BO_3$, $Cu_2O_3$, $MgCl_2$, MgO.CaO, $Al_2O_3$, a metal boride (CrB, $Mg_3B_2$, $AlB_2$, MnB), $B_2O_3$, $Cu_2O$, CuO and the like.

A lanthanum compound $La_2O_3$ is pulverized (P8).

Since the lanthanum oxide is immediately converted to a carbonate when it is left alone in air, the pulverization is carried out in nitrogen atmosphere. The lanthanum oxide is preferably those having high purity, but those commercially available can be also used. It is preferable that the mean particle diameter of the nitride of alkali earth metals, silicon nitride, europium oxide and lanthanum oxide after the pulverization is preferably about 0.1 μm to 15 μm.

After the above-mentioned pulverization, the nitrides of Sr, Ca, or Sr—Ca, silicone nitride, a Eu compound $Eu_2O_3$ and a lanthanum compound $La_2O_3$ are mixed and $Mn_2O_3$ is added thereto (P9).

Finally, the mixture of the nitrides of Sr, Ca, or Sr—Ca, silicone nitride and a Eu compound $Eu_2O_3$, and a lanthanum compound $La_2O_3$ are baked in ammonia atmosphere (P10). The phosphor represented by the Sr—Ca—Si—O—N:Eu,La to which Mn was added can be obtained by firing (P11).

The reaction formula of the base nitride phosphor by the firing is shown in Formula 6.

$(0.9775/3)Sr_3N_2+(0.9775/3)Ca_3N_2+(5/3)Si_3N_4+$
$(0.015/2)Eu_2O+(0.03/2)La_2O_3 \rightarrow$
$Sr_{0.9775}Ca_{0.9775}Eu_{0.015}La_{0.030}Si_5N_{7.970}O_{0.0675}$ [Formula 6]

However, the composition of the objective phosphors can be changed by changing the compounding ratio of the respective raw materials.

The firing can be carried out at a firing temperature of 1200 to 1700° C., but a firing temperature of 1400 to 1700° C. is preferable. It is preferable that a temperature is gradually raised in the firing, and one step firing by which the firing is carried out at 1200 to 1500° C. for several hours is used, but there can be also used two step firing (multi step) by which the firing at the first step is carried out at 800 to 1000° C. is carried out and the firing at the second step is carried out at 1200 to 1500° C. is carried out. It is preferable to carry out the firing of the raw material of the phosphor 11 using a crucible made of boron nitride (BN) material and a boat. A crucible made of alumina ($Al_2O_3$) material can be also used in addition to the crucible made of boron nitride material. The objective phosphor can be obtained by using the above-mentioned production process.

Mode 4 of Operation

The light emitting device of the mode 4 of operation related to the present invention is the type I light emitting device, and contains the phosphor described later.

The constitution member of the light emitting device related to the present invention is specifically illustrated.

(Phosphor of Mode 4 of Operation)

The phosphor related to the mode 4 of the present invention is the Sr—Ca—Si—N:R, Ca—Si—N:R, Sr—Si—N:R, Sr—Ca—Si—O—N:R, Ca—Si—O—N:R, Sr—Si—O—N: R-base silicon nitrides. The base nitride phosphor of the phosphor is represented by the general formula $L_X Si_Y N_{(2/3)X+(4/3)Y}$:R or $L_X Si_Y O_Z N_{(2/3)X+(4/3)Y-(2/3)Z}$:R (L is either of Sr, Ca, Sr and Ca. $0.5 \leq X \leq 3$, $1.5 \leq Y \leq 8$). It is preferable that X and Y is X=2, Y=5 or X=1, Y=7 in the general formula, but arbitrary one can be also used. Specifically, it is preferable to use the phosphor in which the base nitride phosphor are represented by $(Sr_X Ca_{1-X})_2 Si_5 N_8$:R, $Sr_2 Si_5 N_8$:R, $Ca_2 Si_5 N_8$:R, $Sr_X Ca_{1-X} Si_7 N_{10}$:R, $SrSi_7 N_{10}$:R, and $CaSi_7 N_{10}$:R, to which Mn was added, but at least one or more selected from a group consisting of Mg, Sr, Ca, Ba, Zn, B, Al, Cu, Mn, Cr and Ni may be contained in the composition of the phosphor. However, the present invention is not limited to the mode of operation and Examples.

L is either of Sr, Ca, Sr and Ca. The compounding ratio of Sr and Ca can be changed according to requirement.

An economic phosphor having good crystallinity can be provided by using Si in the composition of the phosphor.

Europium being the rare earth element is used as a luminescent center. Europium has mainly 2 valent and 3 valent energy levels. The phosphor of the present invention uses $Eu^{3+}$ for the alkali earth metal silicon nitride phosphor of mother-body as the activator. In the phosphor of the present invention, R is used for the alkali earth metal silicon nitride phosphor of mother-body as the activator. For example, it is preferable to use europium alone or europium nitride. However, when Mn is added, then it is not limited to this.

Mn being an additive accelerates the diffusion of $Eu^{3+}$ and improves the luminescence properties such as luminescence brightness, energy efficiency and quantum efficiency. Mn is baked together with raw materials during the production step by being contained in the raw materials or by containing Mn alone or a Mn compound. However, Mn is not contained in the base nitride phosphor after firing, and only a small amount of Mn remains in comparison with the initial content even if Mn is contained. This considered to be because Mn was scattered in the firing step.

The phosphor contains at least one or more selected from a group consisting of Mg, Sr, Ca, Ba, Zn, Ca, Ga, In, B, Al, Cu, Li, Na, K, Re, Ni, Cr, Mo, O and Fe in the base nitride phosphor or together with the base nitride phosphor. These elements have actions of enlarging the particle diameter and enhancing the luminescence brightness, etc. Further, B, Al, Mg, Cr and Ni have an action capable of suppressing afterglow. The phosphor to which additives such as B, Mg and Cr are not added can usually shorten the time required for reducing afterglow to $\frac{1}{10}$, to from about $\frac{1}{2}$ to about $\frac{1}{4}$ than a phosphor to which an additive is not added.

The phosphor 11 related to the present invention absorbs the portion of blue light which was emitted from the light emitting element 10 and emits light at a yellow to red region. The phosphor 11 is used to the light emitting device having the above-mentioned constitution, and there is provided the light emitting device which emits light of a warm color-base white color by color mixing of blue light which was emitted from the light emitting element 10, with the red light of the phosphor.

In particular, it is preferable to contain the yttrium-aluminum oxide phosphor activated by cerium, in the phosphor 11 in addition to the phosphor related to the present invention. Because the phosphor can be adjusted to a desired chromaticity by containing the above-mentioned yttrium-aluminum oxide luminescent substance activated by cerium. The yttrium-aluminum oxide fluorescent substance activated by cerium absorbs the portion of blue light which was emitted from the light emitting element 10 and emits light at a yellow region. Light of a pale white color is emitted by color mixing of blue light which was emitted from the light emitting element 10, with the yellow light of the yttrium-aluminum oxide luminescent substance. Accordingly, there can be provided the light emitting device which emits light of a warm color-base white color by combining the yttrium-aluminum oxide fluorescent substance and the above-mentioned phosphor, with the phosphor 11 which was mixed with a coating member having transparency and blue light which is emitted from a blue light emitting element 10. The light emitting device which emits light of a warm color-base white color is the average color rendering index Ra of 75 to 95 and a color temperature of 2000K to 8000K. The preferable device in particular is a light emitting device in which the average color rendering index Ra and color temperature are situated at the locus of black body radiation in a chromaticity chart. However, the compounding amount of the yttrium-aluminum oxide fluorescent substance and the phosphor is appropriately changed in order to provide a light emitting device having a desired color temperature and the average color rendering index. The warm color-base white color light emitting device improves further the specific color rendering index R9. With respect to a white color light emitting device which is the combination of a conventional blue light emitting element and the yttrium-aluminum oxide fluorescent substance activated by cerium, the specific color rendering index R9 is about near 0, and a red component was insufficient. Accordingly, it has been a solving problem to enhance the specific color rendering index R9, but the specific color rendering index R9 can be enhanced to 60 to 70 by containing the phosphor related to the present invention in the yttrium-aluminum oxide fluorescent substance.

(Production Process of Phosphor)

Figure 21:
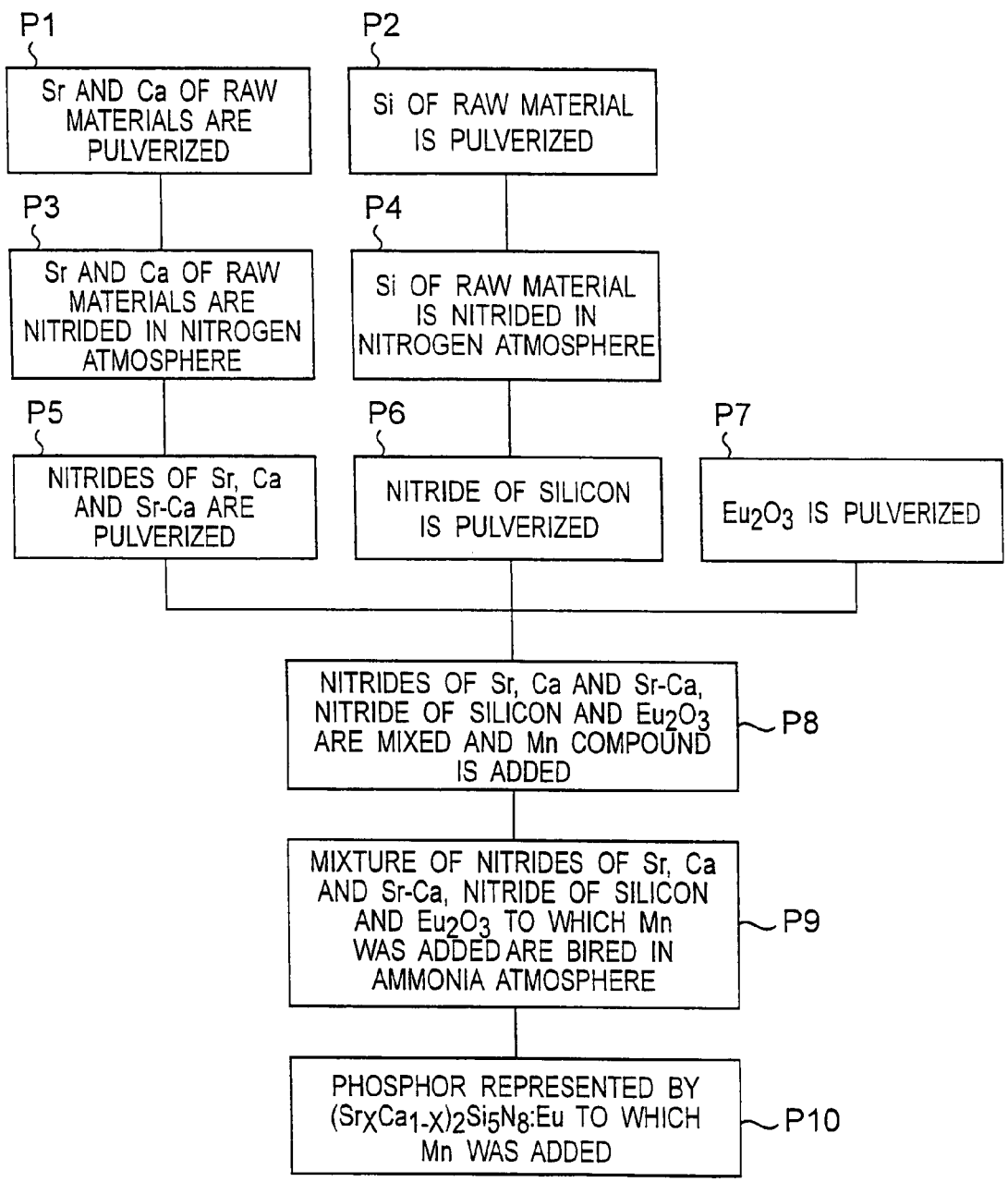
FIG. 21 is a chart showing the production process of the phosphor of the mode 4 of operation related to the present invention.

Then, the production process of the phosphor (($Sr_X Ca_{1-X})_2 Si_5 N_8$:R) related to the present invention is illustrated using FIG. 21, but is not limited to the present production process. Mn and O are contained in the above-mentioned phosphor.

Sr and Ca of a raw material are pulverized (P1). Sr and Ca of a raw material are preferably used as a single body, but compounds such as an imide compound, an amide compound and the like can be used. Further, the Sr and Ca of a raw material may be those containing B, Al, Cu, Mg, $Al_2O_3$ and the like. It is preferable that the mean particle diameter of Sr and Ca obtained by the pulverization is about 0.1 μm to 15 μm, but is not limited to this range. The purity of Sr and Ca is preferably 2N or more, but is not limited to this range. After at least one or more among a metal Ca, a metal Sr and a metal Eu are made as an alloy condition, it is nitrided and pulverized, and then can be used as a raw material.

The Si of a raw material is pulverized (P2). Si of a raw material is preferably used as a single body, but a nitride compound, an imide compound, an amide compound and the like can be used. For example, they are $Si_3N_4$, $Si(NH_2)_2$, $Mg_2Si$ and the like. The purity of the Si of a raw material is preferably 3N or more, but compounds such as $Al_2O_3$, Mg, a metal boride ($Co_3B$, $Ni_3B$, CrB), manganese oxide, $H_3BO_3$, $B_2O_3$, $Cu_2O$ and CuO may be contained. It is preferable that the mean particle diameter of the Si compound is about 0.1 μm to 15 μm.

Then, the Sr and Ca of a raw material is nitrided in nitrogen atmosphere (P3).

The reaction is shown in Formula 7.

$$3Sr+N_2 \rightarrow Sr_3N_2$$

$$3Ca+N_2 \rightarrow Ca_3N_2 \quad \text{[Formula 7]}$$

Sr and Ca are nitrided at a temperature of 600 to 900° C. for about 5 hours in nitrogen atmosphere. Sr and Ca may be nitrided by mixing, and the respective one may be separately nitrided. The nitrides of Sr and Ca can be obtained thereby. The nitrides of Sr and Ca are preferably those having high purity, but those which are commercially available can be also used.

The Si of a raw material is nitrided in nitrogen atmosphere (P4). The reaction formula is shown in Formula 8.

$$3Si+N_2 \rightarrow Si_3N_2 \quad \text{[Formula 8]}$$

Silicone Si is also nitrided at a temperature of 800 to 1200° C. for about 5 hours in nitrogen atmosphere to obtain silicon nitride. The silicon nitride used in the present invention is preferably those having high purity, but those which are commercially available can be also used.

The nitrides of Sr, Ca, or Sr—Ca are pulverized (P5).

Similarly, the nitride of Si is pulverized (P6).

Further, a Eu compound $Eu_2O_3$ is pulverized (P7). Europium oxide is used as the Eu compound, but metal europium, europium nitride and the like can be also used. Additionally, an imide compound and an amide compound can be used as the Z of a raw material. Europium oxide is preferably those having high purity, but those commercially available can be also used. The mean particle diameter of the nitride of an alkali earth metal, silicone nitride and europium oxide after pulverization is about 0.1 μm to 15 μm.

At least one or more selected from a group consisting of Mg, Sr, Ca, Ba, Zn, B, Al, Cu, Mn, Cr, O and Ni may be contained in the above-mentioned raw materials. Further, the compounding amount of the above-mentioned elements such as Mg, Zn and B can be adjusted and mixed in the mixing process (P8) below. These compounds can be added alone in raw materials, but usually added in the form of compounds. The compounds are $H_3BO_3$, $Cu_2O_3$, $MgCl_2$, MgO.CaO, $Al_2O_3$, a metal boride (CrB, $Mg_3B_2$, $AlB_2$, MnB), $B_2O_3$, $Cu_2O$, CuO and the like.

After the above-mentioned pulverization, the nitrides of Sr, Ca, or Sr—Ca, silicone nitride and a Eu compound $Eu_2O_3$ are mixed and Mn is added thereto (P8).

Finally, the mixture of the nitrides of Sr, Ca, or Sr—Ca, silicone nitride and a Eu compound $Eu_2O_3$ are baked in ammonia atmosphere (P9). The phosphor represented by the $(Sr_XCa_{1-X})_2Si_5N_8$:Eu to which Mn was added can be obtained by firing (P10). The reaction formula of the base nitride phosphor by the firing is shown in Formula 9.

$$(X/3)Sr_3N_2+((1.97-X)/3)Ca_3N_2+(5/3)Si_3N_4+$$
$$(0.03/2)Eu_2O_3 \rightarrow Sr_XCa_{1.97-X}Eu_{0.03}Si_5N_{7.98}O_{0.045} \quad \text{[Formula 9]}$$

However, the composition of the objective phosphors can be changed by changing the compounding ratio of the respective raw materials.

The firing can be carried out at a firing temperature of 1200 to 1700° C., but a firing temperature of 1400 to 1700° C. is preferable. It is preferable that a temperature is gradually raised in the firing, and one step firing by which the firing is carried out at 1200 to 1500° C. for several hours is used, but there can be also used two step firing (multi step firing) by which the firing at the first step is carried out at 800 to 1000° C. is carried out and the firing at the second step is carried out at 1200 to 1500° C. is carried out. It is preferable to carry out the firing of the raw material of the phosphor 11 using a crucible made of boron nitride (BN) material and a boat. A crucible made of alumina ($Al_2O_3$) material can be also used in addition to the crucible made of boron nitride material.

The objective phosphor can be obtained by using the above-mentioned production process.

Mode 5 of Operation

The light emitting device of the mode 5 of operation is the type I light emitting device, and contains the phosphor described later.

(Phosphor of Mode 5 of Operation)

The nitride phosphor related to the present mode 5 of operation is a nitride phosphor which contains the base nitride phosphor represented by $L_XM_YN_{((2/3)X+(4/3)Y)}$:R and contains at least one or more selected from a group consisting of Mg, Sr, Ba, Zn, B, Al, Cu, Mn, Cr, O and Fe and the like.

L includes at least one or more selected from a group consisting of II valency of Be, Mg, Ca, Sr, Ba, Zn, Cd and Hg. In particular, since a nitride phosphor which is hardly decomposed and has high reliability can be provided, Mg, Ca, Sr and Ba are preferably used. Those in which only one of these base nitride phosphor was used can be also used, and those in which the portion of said one kind was substituted with other base nitride phosphor may be used.

M includes at least one or more selected from a group consisting of IV valency of C, Si, Ge, Sn, Ti, Zr and Hf. In particular, an economic phosphor having good crystallinity can be provided by setting Si as M.

R is an activator, and includes at least one or more selected from a group consisting of Eu, Cr, Mn, Pb, Ce, Tb, Pr, Sm, Tm, Ho, Er, Yb and Nd. The present invention is illustrated using Eu, Mn Ce and the like among these which carries out emission of light at a yellow to red region, but is not limited to this. R is used for Eu, and europium Eu is made as a luminescence center. Europium has mainly 2-valent and 3-valent energy levels. In the nitride phosphor of the present invention, $Eu^{3+}$ is used for the alkali earth metal silicon nitride phosphor of mother-body as the activator. $Eu^{3+}$ is easily oxidized and it is commercially available in the composition of 3-valent $Eu_2O_3$. However, since O participates greatly in case of the commercially available $Eu_2O_3$, a good phosphor is hardly obtained. Accordingly, it is preferable to use those in which O is eliminated from $Eu_2O_3$ to the out of system. For example, it is preferable to use europium alone or europium nitride.

The nitride phosphor contains at least one or more selected from a group consisting of Mg, Sr, Ba, Zn, Ca, Ga, In, B, Al, Cu, Mn, Li, Na, K, Re, Ni, Cr, Mo, O and Fe in addition to the base nitride phosphor. These elements have actions of enlarging the particle diameter and enhancing the luminescence brightness, etc. Further, B, Al, Mg, Cr and Ni have an action capable of suppressing afterglow. The phosphor to which additives such as B, Mg and Cr are not added can usually shorten the time required for reducing afterglow to $1/10$, to from about $1/2$ to about $1/4$ than a phosphor to which the additives are added. On the other hand, since Fe and Mo have a fear of lowering luminescence efficiency, it is preferable to remove them out of the system.

The nitride phosphor 11 absorbs the portion of blue light which was emitted from the light emitting element 10 and emits light at a yellow to red region. The nitride phosphor 11 is used to the light emitting device having the above-mentioned constitution, and there is provided the light emitting device which emits light of a warm color-base white color by color mixing of blue light which was emitted from the light emitting element 10, with the red light of the nitride phosphor.

In particular, it is preferable to contain the yttrium-aluminum oxide phosphor activated by cerium, in the phosphor 11 in addition to the nitride phosphor related to the present invention. Because the phosphor can be adjusted to a desired chromaticity by containing the above-mentioned yttrium-aluminum oxide luminescent substance activated by cerium. The yttrium-aluminum oxide fluorescent substance activated by cerium absorbs the portion of blue light which was emitted from the light emitting element 10 and emits light at a yellow region. Hereat, light of a pale white color is emitted by color mixing of blue light which was emitted from the light emitting element 10, with the yellow light of the yttrium-aluminum oxide fluorescent substance. Accordingly, there can be provided the light emitting device which emits light of a warm color-base white color by combining the yttrium-aluminum oxide fluorescent substance and the above-mentioned nitride phosphor, with the phosphor 11 which was mixed with a coating member having transmittance and blue light which is emitted from a blue light emitting element 10. The light emitting device which emits light of a warm color-base white color is the average color rendering index Ra of 75 to 95 and a color temperature of 2000K to 8000K. The preferable device in particular is a white light emitting device in which the average color rendering index Ra and color temperature are situated at the locus of black body radiation in a chromaticity chart. However, the compounding amount of the yttrium-aluminum oxide fluorescent substance and the nitride phosphor is appropriately changed in order to provide a light emitting device having a desired color temperature and the average color rendering index.

(Production Process of Nitride Phosphor)

Figure 33:
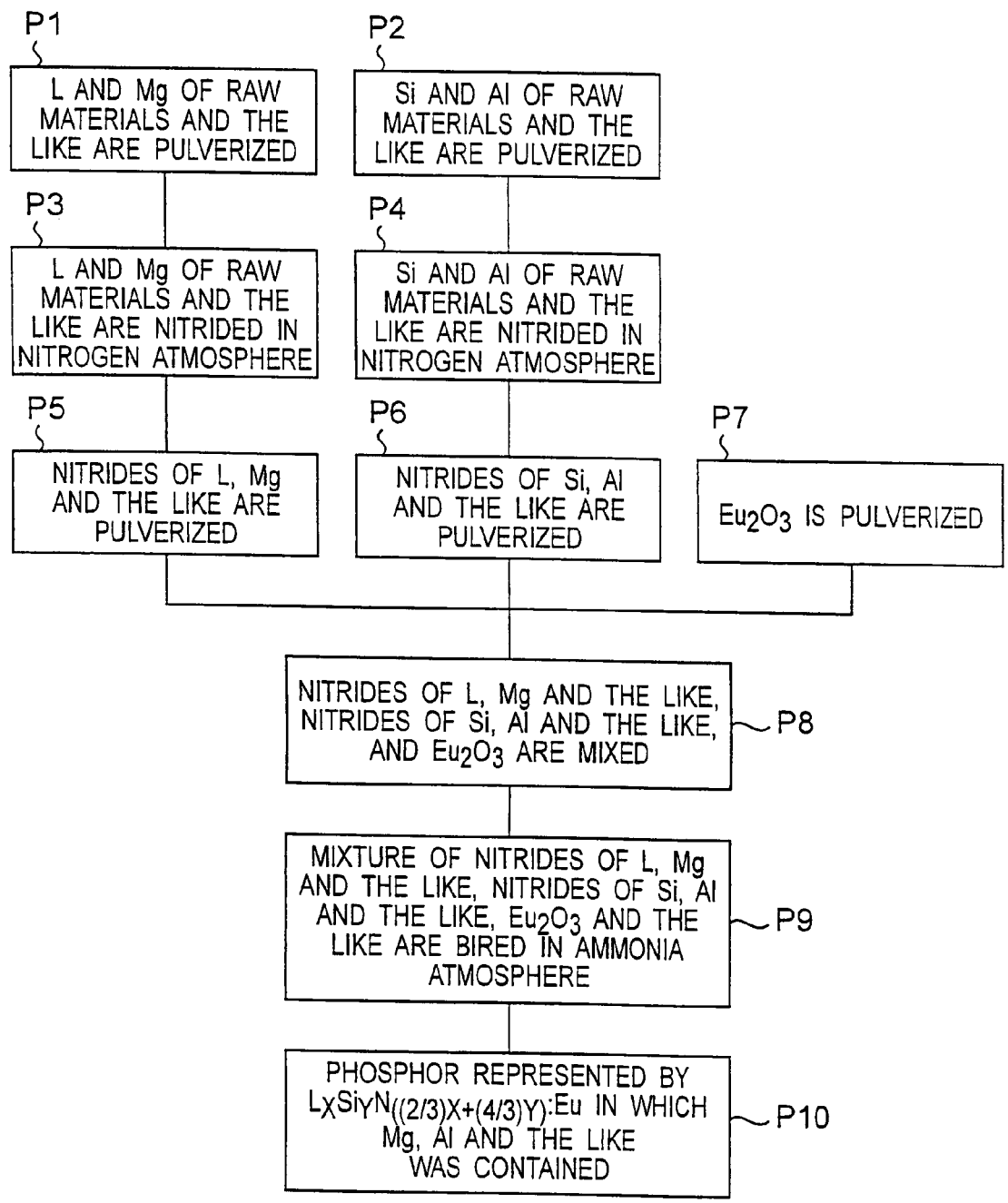
FIG. 33 is a chart showing the flow of the production steps of the nitride phosphor of the mode 5 of operation related to the present invention.

Then, the production process of the nitride phosphor related to the present invention is illustrated using FIG. 33.

L and Mg of a raw material are pulverized (P1). L includes at least one or more selected from a group consisting of II valency of Be, Mg, Ca, Sr, Ba, Zn, Cd and Hg. In particular, the L of a raw material is preferably an alkali earth metal consisting of II valency of Be, Mg, Ca, Sr and Ba, and the single body of an alkali earth metal is preferable. Those containing 2 or more may be used. An imide compound, an amide compound and the like can be used as the L of a raw material. Further, the L of a raw material may be those containing B, Al, Cu, Mg, Mn, $Al_2O_3$ and the like. It is preferable that the mean particle diameter of the alkali earth metal obtained by the pulverization is about 0.1 μm to 15 μm, but is not limited to this range. The purity of L is preferably 2N or more, but is not limited to this range. After at least one or more among a metal L, a metal M and a metal activator are made as an alloy condition, it is nitrided and pulverized, and then can be used as a raw material.

The Si, Al and the like of a raw material are pulverized (P2). M of the base nitride phosphor, $L_XM_YN_{((2/3)X+(4/3)Y)}$:R includes at least one or more selected from a group consisting of IV valency of C, Si, Ge and Sn. As M of a raw material, an amide compound, an imide compound and the like can be used. Since Si is cheap and easily treated among M, the production process is illustrated using Si, but not limited to this. Si, $Si_3N_4$, $Si(NH_2)_2$, $Mg_2Si$ and the like can be used. In addition to $Al_2O_3$, Mg, a metal boride ($Co_3B$, $Ni_3B$, $Mo_2B$), manganese oxide, $H_3BO_3$, $B_2O_3$, $Cu_2O$ and CuO may be contained. It is preferable that the mean particle diameter of the Si compound is about 0.1 μm to 15 μm. The purity of Si is preferably 3N or more.

Then, the L and Mg of a raw material are nitrided in nitrogen atmosphere (P3). The reaction is shown in Formula 10. Because Mg is an order from several 10 ppm to 1000 ppm, it doesn't include in reaction formula.

$$3L+N_2 \rightarrow L_3N_2 \qquad \text{[Formula 10]}$$

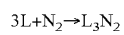

The L of II valency is nitrided at a temperature of 600 to 900° C. for about 5 hours in nitrogen atmosphere. The nitride of L can be obtained thereby. The nitride of L is preferably those having high purity, but those which are commercially available can be also used.

The Si, Al and the like of a raw material are nitrided in nitrogen atmosphere (P4). The reaction formula is shown in Formula 11. Additionally, because Al is also an order from several 10 ppm to 1000 ppm, it doesn't include in reaction formula.

$$3Si+2N_2 \rightarrow Si_3N_4 \qquad \text{[Formula 11]}$$

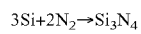

Silicone Si is also nitrided at a temperature of 800 to 1200° C. for about 5 hours in nitrogen atmosphere to obtain a silicon nitride. The silicon nitride used in the present invention is preferably those having high purity, but those which are commercially available can be also used.

The nitrides of L, Mg and the like are pulverized (P5).

Similarly, the nitride of Si, Al and the like is pulverized (P6). Further, a Eu compound $Eu_2O_3$ is pulverized (P7). The R of the base nitride phosphor, $L_XM_YN_{((2/3)X+(4/3)Y)}$:R is an activator, and includes at least one or more selected from a group consisting of Eu, Cr, Mn, Pb, Sb, Ce, Th, Pr, Sm, Tm, Ho and Er. The production method related to the present invention is illustrated using Eu among R which exhibits a luminescence wave length at a red region. Europium oxide is used as the Eu compound, but metal europium, europium nitride and the like can be also used. Additionally, an imide compound and an amide compound can be used as the R of a raw material. Europium oxide is preferably those having high purity, but those commercially available can be also used. The mean particle diameter of the nitride of an alkali earth metal, silicone nitride and europium oxide after pulverization is about 0.1 μm to 15 μm.

At least one or more selected from a group consisting of Mg, Sr, Ba, Zn, Ca, Ga, In, B, Al, Cu, Mn, Li, Na, K, Re, Ni, Cr, Mo, O and Fe may be contained in the above-mentioned raw materials. Further, the compounding amount of the above-mentioned compounds such as B, Al and Mn can be adjusted and mixed in the mixing process (P8) below. These compounds can be added alone in raw materials, but usually added in the form of compounds. The compounds are $H_3BO_3$, $Cu_2O_3$, $MgCl_2$, $MgO.CaO$, $Al_2O_3$, a metal boride (CrB, $Mg_3B_2$, $AlB_2$, MnB), $B_2O_3$, $Cu_2O$, CuO and the like. Further, Mn, Al and the like are contained in raw materials before firing, and there are also compounds in which the portion of the raw material was substituted.

After the above-mentioned pulverization, the nitrides of Si, Al and the like, a Eu compound $Eu_2O_3$ and the like are mixed (P8).

Finally, the mixture of the nitrides of L, Mg and the like, the nitrides of Si, Al and the like, and a Eu compound $Eu_2O_3$ and the like is baked in ammonia atmosphere (P9). The phosphor represented by $L_XSi_YN_{((2/3)X+(4/3)Y)}$:Eu which contains Mg, Al and the like can be obtained by firing (P10). The reaction formula of the base nitride phosphor by the firing is shown in Formula 12. As well as the above-mentioned, because the additives such as Mg, Al, $H_3BO_3$ and the like are an order from several 10 ppm to 1000 ppm, it doesn't include in reaction formula.

   [Formula 12]

However, the compounding ratio of the respective mixtures can be appropriately changed by changing the composition of the objective phosphor. The base nitride phosphor, $L_XSi_Y N_{((2/3)X+(4/3)Y)}$:R are preferably $L_2Si_5N_8$:Eu and $Lsi_7N_{10}$:Eu, but are not limited to the compounding amount.

The firing can be carried out at a firing temperature of 1200 to 1700° C., but a firing temperature of 1200 to 1400° C. is preferable. It is preferable that a temperature is gradually raised in the firing, and one step firing by which the firing is carried out at 1200 to 1500° C. for several hours is used, but there can be also used two step firing (multi step firing) by which the firing at the first step is carried out at 800 to 1000° C. is carried out and the firing at the second step is carried out at 1200 to 1500° C. is carried out. It is preferable to carry out the firing of the raw material of the phosphor 11 using a crucible made of boron nitride (BN) material and a boat. A crucible made of alumina ($Al_2O_3$) material can be also used in addition to the crucible made of boron nitride material.

The objective phosphor can be obtained by using the above-mentioned production process.

Mode 6 of Operation

The phosphor of the mode 6 of operation is the nitride phosphor for a light emitting device, and is constituted as below.

Figure 43:
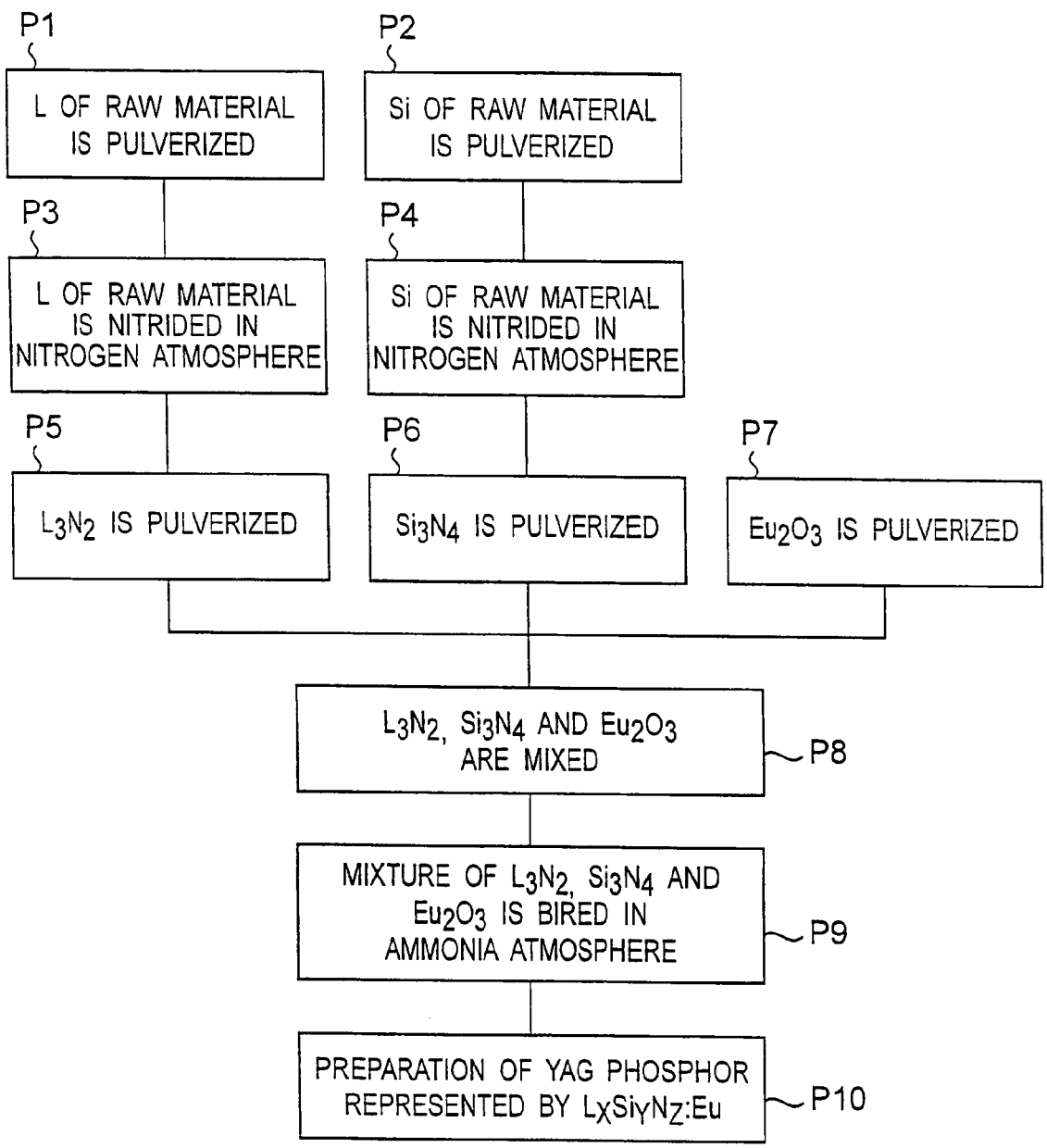
FIG. 43 is a chart showing the flow of the production steps of the nitride phosphor of the mode 6 of operation related to the present invention.

Firstly, the production process of the nitride phosphor of the present mode 6 of operation is illustrated using FIG. 43.

The L of a raw material is pulverized in the process P1.

The L of a raw material includes at least one or more selected from a group consisting of II valency of Be, Mg, Ca, Sr, Ba, Zn, Cd and Hg. In particular, the L of a raw material is preferably an alkali earth metal consisting of II valency of Be, Mg, Ca, Sr and Ba, and the single body of an alkali earth metal is further preferable. Those containing 2 or more may be used. An imide compound, an amide compound and the like can be used as the L of a raw material. It is preferable that the mean particle diameter of the alkali earth metal obtained by the pulverization is about 0.1 μm to 15 μm, but is not limited to this range. The purity of L is preferably 2N or more, but is not limited to this range. After at least one or more among a metal L, a metal M and a metal activator are made as an alloy condition in order to make a better mixing condition, it is nitrided and pulverized, and then can be used as a raw material.

The Si of a raw material is pulverized in the process P2. M in the base nitride phosphor, $L_XM_YN_{((2/3)X+(4/3)Y)}$:R includes at least one or more selected from a group consisting of IV valency of C, Si, Ge and Sn. As the M of a raw material, an imide compound, an amide compound and the like can be used. Since Si is cheap and easily treated among M, the production process is illustrated using Si, but not limited to this. Si, $Si_3N_4$, $Si(NH_2)_2$, and the like can be used. It is preferable that the mean particle diameter of the Si compound is about 0.1 μm to 15 μm. The purity of Si is preferably 3N or more.

Then, the L of a raw material is nitrided in nitrogen atmosphere in the process of P3.

The reaction formula is shown in Formula 13.

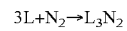   [Formula 13]

The L of II valency is nitrided at a temperature of 600 to 900° C. for about 5 hours in nitrogen atmosphere. The nitride of L can be obtained thereby. The nitride of L is preferably those having high purity, but those (manufactured by High Purity Chemical Co.) which are commercially available can be also used.

In the process P4, the Si of a raw material is nitrided in nitrogen atmosphere. The reaction formula is shown in Formula 14.

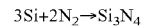   [Formula 14]

Silicone, Si is also nitrided at a temperature of 800 to 1200° C. for about 5 hours in nitrogen atmosphere to obtain a silicon nitride. The silicon nitride used in the present invention is preferably those having high purity, but those (manufactured by Ube Chemical Co.) which are commercially available can be also used.

In the process P5, the nitride of L, $L_3N_2$ is pulverized.

In the process P6, the silicone nitride, $Si_3N_2$ is also pulverized.

In the process P7, a Eu compound, $Eu_2O_3$ is also pulverized.

R of the base nitride phosphor, $L_XM_YN_{((2/3)X+(4/3)Y)}$:R is an activator, and includes at least one or more selected from a group consisting of Eu, Cr, Mn, Pb, Sb, Ce, Tb, Pr, Sm, Tm, Ho and Er. The production method related to the present invention is illustrated using Eu among R which exhibits a luminescence wave length at a red region, but is not limited to this. Europium oxide is used as the Eu compound, but europium nitride and the like can be also used. Additionally, an imide compound and an amide compound can be used as the R of a raw material. Europium oxide is preferably those having high purity, but those (manufactured by Shin-etsu Chemical Co., Ltd.) commercially available can be also used. The mean particle diameter of the nitride of an alkali earth metal, silicone nitride and europium oxide after pulverization is preferably about 0.1 μm to 15 μm.

In the process P8, $L_3N_2$, $Si_3N_4$ and $Eu_2O_3$ are mixed.

Since these mixtures are easily oxidized, mixing is carried out in a glove box in argon atmosphere or nitrogen atmosphere.

Finally, the mixture of $L_3N_2$, $Si_3N_2$ and $Eu_2O_3$ is baked in ammonia atmosphere in the process P9.

The objective phosphor represented by $L_XSi_YN_Z$:Eu can be obtained by firing (P10). The reaction formula by the firing is shown in Formula 15.

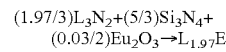   [Equation 15]

However, the compounding ratio of the respective mixtures can be appropriately changed by changing the composition of the objective phosphor. In the [Formula 15], oxygen is contained in the nitride phosphor related to the present invention, but it is adequate that the base nitride phosphor, $L_XM_YN_{(2/3)X+(4/3)Y}$:R are contained in the nitride phosphor because the purposes of the present invention can be attained.

The firing can use a tube furnace, a furnace, a high frequency furnace and a metal furnace and the like. The firing can be carried out at a firing temperature of 1200 to 1600° C., but a firing temperature of 1200 to 1400° C. is preferable. It is preferable to use a crucible made of boron nitride (BN) material and a boat. A crucible made of alumina ($Al_2O_3$) material can be also used in addition to the crucible made of boron nitride material. Luminescence is not obstructed in ammonia atmosphere even if the crucible made of alumina material was used.

The phosphor of the mode 6 of operation can be produced by the above-mentioned production process, and the objective phosphor can be obtained.

The nitride of L, the nitride of M and the compound of R which are the intermediates in the production process of the nitride phosphor of the present mode 6 of operation, $L_XSi_YN_Z$: Eu are illustrated below. The nitride of an alkali earth metal as the nitride of L, silicon nitride as the nitride of M and europium oxide as the nitride of R are illustrated as an example, but they are not limited to this.

The R of the nitride phosphor of the present mode 6 of operation uses europium Eu as a luminescence center. Europium has mainly 2-valent and 3-valent energy levels. In the nitride phosphor of the present invention, $Eu^{3+}$ is used for the alkali earth metal silicon nitride phosphor of mother-body as the activator. $Eu^{3+}$ is easily oxidized and it is commercially available in the composition of 3-valent $Eu_2O_3$. However, since O participates greatly in case of the commercially available $Eu_2O_3$, a good phosphor is hardly obtained. Accordingly, it is preferable to use those in which O is eliminated from $Eu_2O_3$ to the out of system. For example, it is preferable to use europium alone or europium nitride.

The II valency L of a raw material is also easily oxidized. For example, 0.66% of O and 0.01% of N are contained. A commercially available Ca Metal, $Ca_3N_2$ (manufactured by High Purity Chemical Co.) was purchased in order to nitrogenation in the production process of the Ca metal, and when O and N were measured, it was 1.46% of O and 16.98% of N, but when it was hermetically sealed again after opening the seal, it was changed to 6.80% of O and 13.20% of N. Further, in case of another commercially available Ca Metal, $Ca_3N_2$, it was 26.25% of O and 6.54% of N. Since the O becomes an impurity and provokes luminescence deterioration, it is preferable to remove O to the external of a system as much as possible. Accordingly, the Ca was nitrided at a temperature of 800° C. for 8 hours in nitrogen atmosphere. As a result, calcium nitride in which O was reduced to 0.67% was obtained. N in the calcium nitride was 15.92 at this time.

COMPARATIVE EXAMPLE

In order to make the characteristic of the present mode 6 of operation clear, known alkali earth metal-base silicone nitride, $Ca_2Si_5N_8$:Eu was produced and measured. The test result is shown in Table 31.

TABLE 31

| | | Raw material | | | | Result | | |
|---|---|---|---|---|---|---|---|---|
| | Basic constituting elements | Mixing ratio of raw material (Ca/Si/Eu) | Baking pattern | Atmosphere | Form | Body color | Visual emission (365 nm) | Remarks |
| Comparative Example 5 | $Ca_2Si_5N_8$:Eu | 2/5/0.2 | One step 1400° C. × 5 h | $H_2/N_2$ | Crucible | Orange (partially) | Orange (partially) | |
| Comparative Example 6 | $Ca_2Si_5N_8$:Eu | 1.8/5/0.2 | One step 1400° C. × 5 h | $H_2/N_2$ | Boat | White | No light emission | Increased amount, Oxidized |
| Comparative Example 7 | $Ca_2Si_5N_8$:Eu | 1.8/5/0.2 | One step 1400° C. × 5 h | $H_2/N_2$ | Crucible | Yellow (partially) | Yellow (partially) | Only surface emits light |
| Comparative Example 8 | $Ca_2Si_5N_8$:Eu | 4/5/0.2 | One step 1400° C. × 5 h | $H_2/N_2$ | Crucible | Orange (partially) | Orange (partially) | Increased amount, Oxidized |
| Comparative Example 9 | $Ca_2Si_5N_8$:Eu | 1.8/5/0.2 | One step 1400° C. × 5 h | $H_2$ | Crucible | White | No light emission | |

Comparative Example 5 is a known phosphor, $Ca_2Si_5N_8$:Eu.

The compounding ratio (molar ratio) of calcium nitride, $Ca_3N_2$, silicone nitride, $Si_3N_2$, and europium oxide, $Eu_2O_3$, is adjusted to be Ca:Si:Eu=2:5:0.2. The three compounds as raw materials were charged in a crucible, and firing was carried out in a small size furnace at 1400° C. for 5 hours under hydrogen/nitrogen atmosphere. The temperature was gradually raised by heating from room temperature to 1400° C., and after carrying out firing for 5 hours, cooling was further gradually carried out until room temperature for 5 hours. As a result, a phosphor powder having a orange body color and orange luminescence was obtained, and when visual observation was carried out, luminescence brightness was extremely low.

With respect to Comparative Examples 6 to 9, firing was carried out changing the firing conditions of a furnace, firing temperature, atmosphere and form. The firing is carried out under hydrogen/nitrogen atmosphere. The nitride phosphors which were obtained in the conditions of Comparative Examples 6 to 8 had extremely low luminescence brightness by visual observation. In case of Comparative Example 9, firing was carried out in hydrogen atmosphere but luminescence was not carried out by visual observation. Even though these tests were repeatedly carried out, similar test results were obtained.

The phosphor represented by $M_XSi_YN_Z$:Eu (M contains at least one or more of alkali earth metals consisting of a group of Ca, Sr, Ba and Zn, and Z is Z=2/3X+4/3Y) absorbs a short wave length of 250 nm to 450 nm at a visible light region and intensely reflect light at a wave length of 450 nm to 500 nm. Accordingly, since the phosphor absorbs a short wave length of from indigo, blue color to blue green color of visible light, it strongly reflects at wave length sides such as a green color, a yellow color, a red color and the like. For example, it has property of obtaining a slightly reddish white color by combination with a blue light emitting diode, utilizing the characteristic.

However, although the above-mentioned phosphor has a useful luminescence property, it can be grasped that the luminescence brightness is low depending on the production condition or composition.

Mode 7 of Operation

The mode 7 of operation of the present invention is illustrated as follows referring to drawings. However, the mode 7 of operation shown below exemplifies the light emitting device for embodying the technical philosophy of the present invention, and the present invention does not limit the light emitting device to below. Further, the sizes and positional relation of members shown the respective drawings are occasionally exaggerated for clarifying the illustration.

The phosphors used in the present invention are phosphors containing the first phosphor and the second phosphor. The change of luminescence intensity of the second phosphor in accordance with the change of ambient temperature is nearly equal to that of the first phosphor. Further, the phosphors are phosphors containing the second phosphor which has a nearly equal change of luminescence intensity as the first phosphor under a condition in which the ambient temperatures of the phosphors are changed in accordance with the change of the charged electric current to the light emitting element. In particular, the phosphors used in the present mode 7 of operation are the first phosphor which emits light having the peak wave length of luminescence spectrum in a range of a yellow to green region and the second phosphor which emits light having the peak wave length of luminescence spectrum in a red region. The first phosphor is a YAG-base phosphor which contains Y and Al, and contains at least one of elements selected from Lu, Sc, La, Gd, Tb, Eu and Sm and at least one of elements selected from Ga and In and is activated by cerium. The second phosphor is a nitride-base phosphor which contains N, and contains at least one of elements selected from Be, Mg, Ca, Sr, Ba and Zn and at least one elements selected from C, Si, Ge, Sn, Ti, Zr and Hf, and is activated by Eu and/or the rare earth element.

Figure 55:
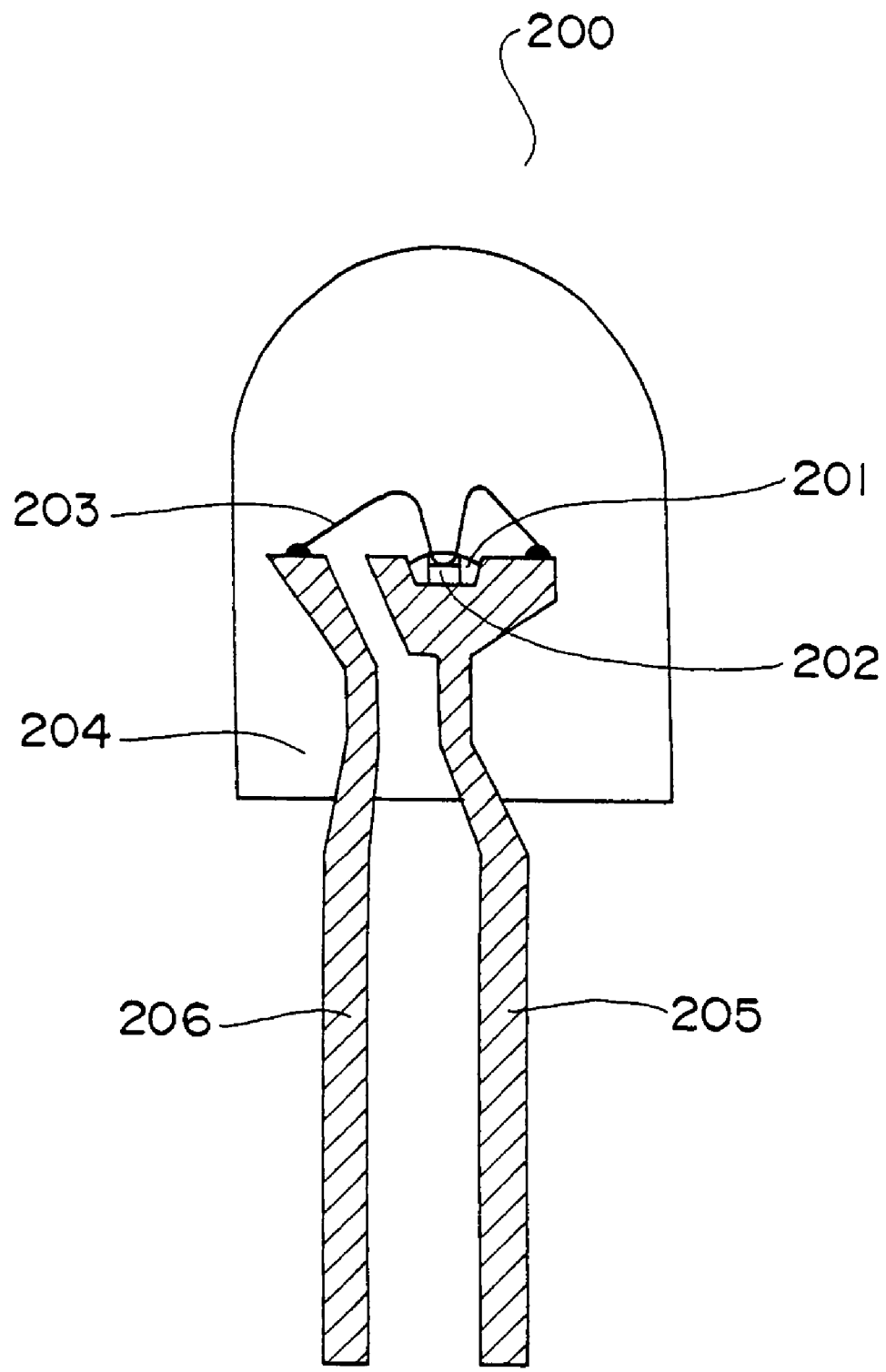
FIG. 55 is a typical section view of the light emitting diode related to one Example of the present invention.

The light emitting diode 200 of FIG. 55 is a lead type light emitting diode equipped with the mount lead 205 and the inner lead 206. The LED chip 202 is provided on the cup portion of the mount lead 205, the coating portion 201 containing the above-mentioned phosphors was filled up in the cup portion so as to cover the LED chip 202, and then it is resin-molded by the molding member 204 to be constituted. Hereat, the n-side electrode and p-side electrode of the LED chip 202 are respectively connected with the mount lead 205 and the inner lead 206 using the wire 203.

In the light emitting diode which was constituted as above, the portion of light (hereinafter, called as the "LED light") which was emitted by the light emitting element (LED chip) 202 excites the phosphor contained in the coating portion 201 to generate fluorescence having a different wave length from the LED light, and the fluorescence which the phosphor generates and the LED light which does not contribute the excitation of the phosphor are color-mixed and are output.

In general, since the excitation efficiency of the phosphor is lowered in accordance with the raise of the ambient temperature, the output of light emitted from the phosphor is also lowered. In the present mode 7 of operation, the lowering proportion of the relative luminescence output when the ambient temperature was changed by 1° C. is defined as the decreasing rate of the luminescence output. The decreasing rates of the luminescence output of the first phosphor and the second phosphor are $4.0 \times 10^{-3}$ [a.u./° C.] or less together, preferably $3.0 \times 10^{-3}$ [a.u./° C.] or less, and more preferably $2.0 \times 10^{-3}$ [a.u./° C.] or less, and it is constituted that the lowering of beam [lm] of the whole light emitting device accompanying heat emission can be further suppressed. Further, it is constituted that the decreasing rates of the luminescence output of the first phosphor and the second phosphor against the raise of temperature are nearly equal. Namely, the difference of the decreasing rates of the luminescence output of the first phosphor and the second phosphor is set at $2.0 \times 10^{-3}$ [a.u./° C.] or less and more preferably $2.0 \times 10^{-4}$ [a.u./° C.] or less, therefore the decreasing rates of the luminescence output are nearly equal. The temperature characteristics of the phosphors in which the excitation efficiency is lowered by heat emission become nearly equal, therefore a light emitting device which can suppress the color deviation even if the ambient temperature is changed can be formed.

The respective constitutions of the mode 7 of operation of the present invention are specifically described below.

[Phosphor]

As the phosphor used in the present mode 7 of operation, there can be used a phosphor combining a yttrium-aluminum-garnet-base phosphor with a phosphor capable of emitting red light, in particular a nitride-base phosphor. These YAG-base phosphor and nitride-base phosphor may be mixed to be contained in the coating portion 201, or separately contained in the coating portion 201 which is constituted by a plural number of layers. The respective phosphors are specifically illustrated below.

(Yttrium-Aluminum-Garnet-Base Phosphor)

The yttrium-aluminum-garnet-base phosphor (YAG-base phosphor) used in the present mode 7 of operation is a phosphor which contains Y and Al, and contains at least one of elements selected from Lu, Sc, La, Gd, Tb, Eu and Sm and at least one of elements selected from Ga and In and is activated by at least one of elements selected from the rare earth elements, and a phosphor which emits light by being excited by visible light or ultraviolet rays which were emitted from the LED chip 202. In particular, in the present mode 7 of operation, two or more of yttrium-aluminum oxide-base phosphors which are activated by Ce or Pr and have different compositions can be also applied. For example, there are mentioned $YAlO_3$:Ce, $Y_3Al_5O_{12}$ Y:Ce (YAG:Ce), $Y_4Al_2O_9$:Ce, further a mixture thereof and the like. Further, at least one selected from Ba, Sr, Mg, Ca and Zn may be contained, and further, when Si is contained, the reaction of crystal growth can be also suppressed and the particles of the phosphor can be also uniformed. Hereat, the YAG-base phosphor activated by Ce shall be widely considered, and it is used for a wide meaning including a phosphor having fluorescence action in which a portion or all of yttrium is substituted with at least one of elements selected from a group consisting of Lu, Se, La, Gd and Sm, or a portion or all of aluminum is substituted with any or both of Ba, Tl, Ga and In. More specifically, it is a photoluminescence phosphor indicated by the general formula $(Y_zGd_{1-z})_3Al_5O_{12}$:Ce (provided that $0<Z\leq1$), and a photoluminescence phosphor indicated by the general formula $(Re_{1-a}Sm_a)_3Re'_5O_{12}$:Ce (provided that $0\leq a<1$, $0\leq b\leq1$, Re is at least one selected from Y, Gd, La and Sc, and Re' is at least one selected from Al, Ga and In).

A desired white luminescence color display can be carried out by color mixing blue light which was emitted from a light emitting element using a nitride-base phosphor-base semiconductor, with green or red light which is emitted from a phosphor whose body color is yellow for absorbing blue light, or yellow light being more greenish light and more reddish light. It is preferable that the light emitting device contains the powder and bulk of the phosphor in various resins such as an epoxy resin, an acrylic resin or a silicone resin, and inorganic substances such as silicon oxide and aluminum oxide in order to provoke the color mixing. The product containing the phosphor can be variously used for a dot shape product and a laminar shape product which were thinly formed so that light from the LED chip passes through the product, and the like in accordance with uses. Arbitrary color tones such as a light bulb color including a white color can be provided by variously adjusting the ratio of the phosphor and resins, coating and the filling amount, and selecting the luminescence wave length of a light emitting element.

Further, a light emitting device capable of efficiently emitting light can be made by respectively arranging 2 or more of phosphors against the incident light from the light emitting element in order. Namely, the reflection light can be effectively utilized by laminating a color converting member in which the phosphor having an absorbing wave length at a long wavelength side and capable of emitting light at a long wavelength side was contained, and a color converting member which has an absorbing wave length at a long wavelength side and can emit light at a longer wave length side, on the light emitting element having a reflection member.

When the YAG-base phosphor is used, a light emitting device having an adequate light resistance in high efficiency can be made even though it is arranged contacting with the LED chip having (Ee)=0.1 W·cm$^{-2}$ or more and 1000 W·cm$^{-2}$ or less as emission brightness, or adjacently.

Since the YAG-base phosphor capable of emitting blue light which is the yttrium-aluminum oxide-base phosphor used for the present mode 7 of operation which was activated by Ce is a garnet configuration, it is strong for heat, light and moisture, and the peak wave length of the excitation absorption spectrum can be set from 420 nm to 470 nm. Further, the luminescence peak wave length $\lambda p$ is around 510 nm and has a broad luminescence spectrum which is spread around 700 nm. On the other hand, since the YAG-base phosphor capable of emitting red light which is the yttrium-aluminum oxide-base phosphor which was activated by Ce is also the garnet configuration, it is strong for heat, light and moisture, and the peak wave length of the excitation absorption spectrum can be set from 420 nm to 470 nm. Further, the luminescence peak wave length $\lambda p$ is around 600 nm and has a broad luminescence spectrum which is spread around 750 nm.

Among the compositions of the YAG-base phosphors having the garnet configuration, the luminescence spectrum shifts toward shorter wavelength by substituting the portion of Al with Ga, and the luminescence spectrum shifts toward longer wavelength by substituting the portion of Y of the composition with Gd and/or La. The YAG-base phosphor can be also obtained by, for example, baking a raw material in which a more excessive amount of substituting element than a stoichiometric ratio was adjusted to be added When the substitution of Y is less than 20%, a green component is large and a red component is little. Further, when it is more than 80%, the red component is increased but the brightness is rigorously lowered. Further, with respect to the excitation absorption spectrum similarly, among the composition of the YAG-base phosphor having the garnet configuration, the excitation absorption spectrum shifts toward shorter wavelength by substituting the portion of Al with Ga, and the excitation absorption spectrum shifts toward longer wavelength by substituting the portion of Y with Gd and/or La. It is preferable that the peak wave length of the excitation absorption spectrum of the YAG-base phosphor is situated at a shorter wave length side than the peak wave length of the luminescence spectrum of the light emitting element. When such a constitution is made, the peak wave length of the excitation absorption spectrum coincides nearly with the peak wave length of the luminescence spectrum of the light emitting element, therefore a light emitting device suppressing the generation of the color deviation can be formed without lowering the excitation efficiency of the phosphor.

With respect to the phosphor, oxides or compounds which are easily converted to be oxides at a high temperature are used as raw materials of Y, Gd, Ce, La, Al, Sm and Ga, and they are adequately mixed at a stoichiometric ratio to obtain a raw material. Alternatively, a solubilized solution which was obtained by dissolving the rare earth elements of Y, Gd, Ce, La and Sm in an acid at a stoichiometric ratio was co-precipitated with oxalic acid and then the co-precipitated product was baked to obtain a co-precipitated oxide. Then, the co-precipitated oxide, aluminum oxide and gallium oxide are mixed to obtain a mix raw material. An appropriate amount of a fluoride such as ammonium fluoride, or $NH_4Cl$ as a flux is mixed with this, and the mixture is packed in a crucible and baked at a temperature range of 1350 to 1450° C. in air for 2 to 5 hours to obtain a baked product. The baked product is pulverized in water by a ball mill, washed, separated, dried and finally sieved to obtain the phosphor. Further, in the production method of the phosphor of the alternative mode 7 of operation, it is preferable that a mixture comprising a flux and a mix raw material which mixed the raw materials of the phosphor is baked by 2 steps which consist of the first baking step of carrying out in air or weak reduced atmosphere and the second baling step of carrying out in reduced atmosphere. Wherein the weak reduced atmosphere means weak reduced atmosphere which was set to contain at least an oxygen amount necessary for the reaction process of forming a desired phosphor from the mix raw material. The black conversion of the phosphor can be prevented and the lowering of the absorption efficiency of light can be prevented by carrying out the first baking step until the configuration formation of the desired phosphor is completed in the weak reduced atmosphere. Further, the reduced atmosphere in the second baking step means stronger reduced atmosphere than the weak reduced atmosphere. Thus, when the phosphor is baked at 2 steps, the phosphor having the high absorption efficiency of excitation wave length is obtained. Accordingly, when the light emitting device is formed by the phosphor which was formed thus, the amount of the phosphor necessary for obtaining a desired color tone can be reduced, a light emitting device having a high light-take out efficiency can be formed.

The yttrium-aluminum oxide-base phosphors which were activated by 2 or more cerium having different compositions may be used in mixture, or may be respectively arranged independently. When the phosphors are respectively arranged independently, it is preferable to arrange a phosphor easily absorbing and emitting light from the light emitting element at a shorter wave length side and a phosphor easily absorbing and emitting light at a longer wave length side than the former, in order. The absorption and emission of light can be carried out in high efficiency thereby.

In the present mode 7 of operation, when the YAG-base phosphor is used as the first phosphor, for example, the phosphor having the compositions below can be used.

Figure 92:
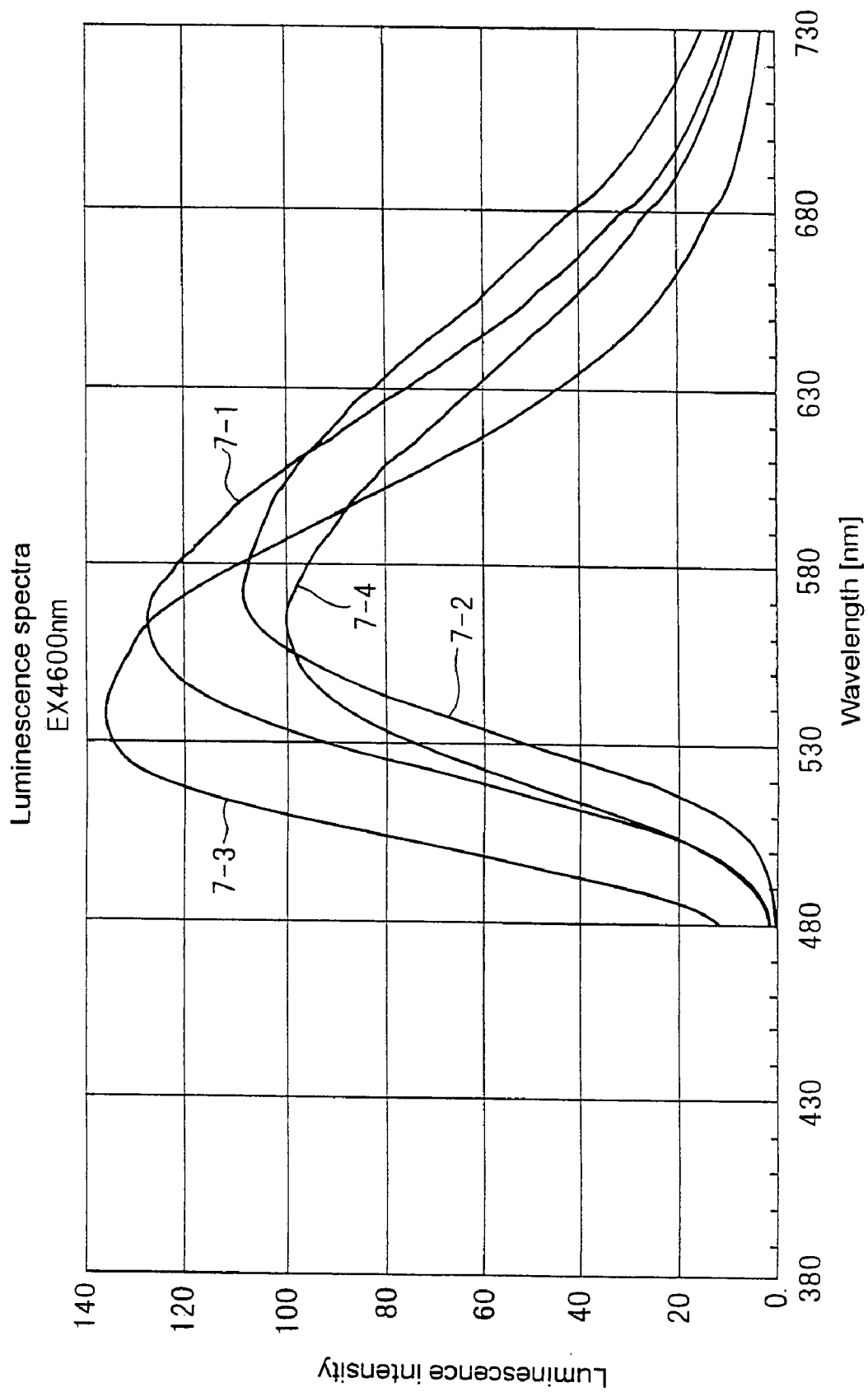
FIG. 92 is a chart showing the luminescence spectra when the YAG-base phosphors (the phosphors 7-1 to 7-4) in the mode 7 of operation were excited at EX=460 nm.
Figure 93:
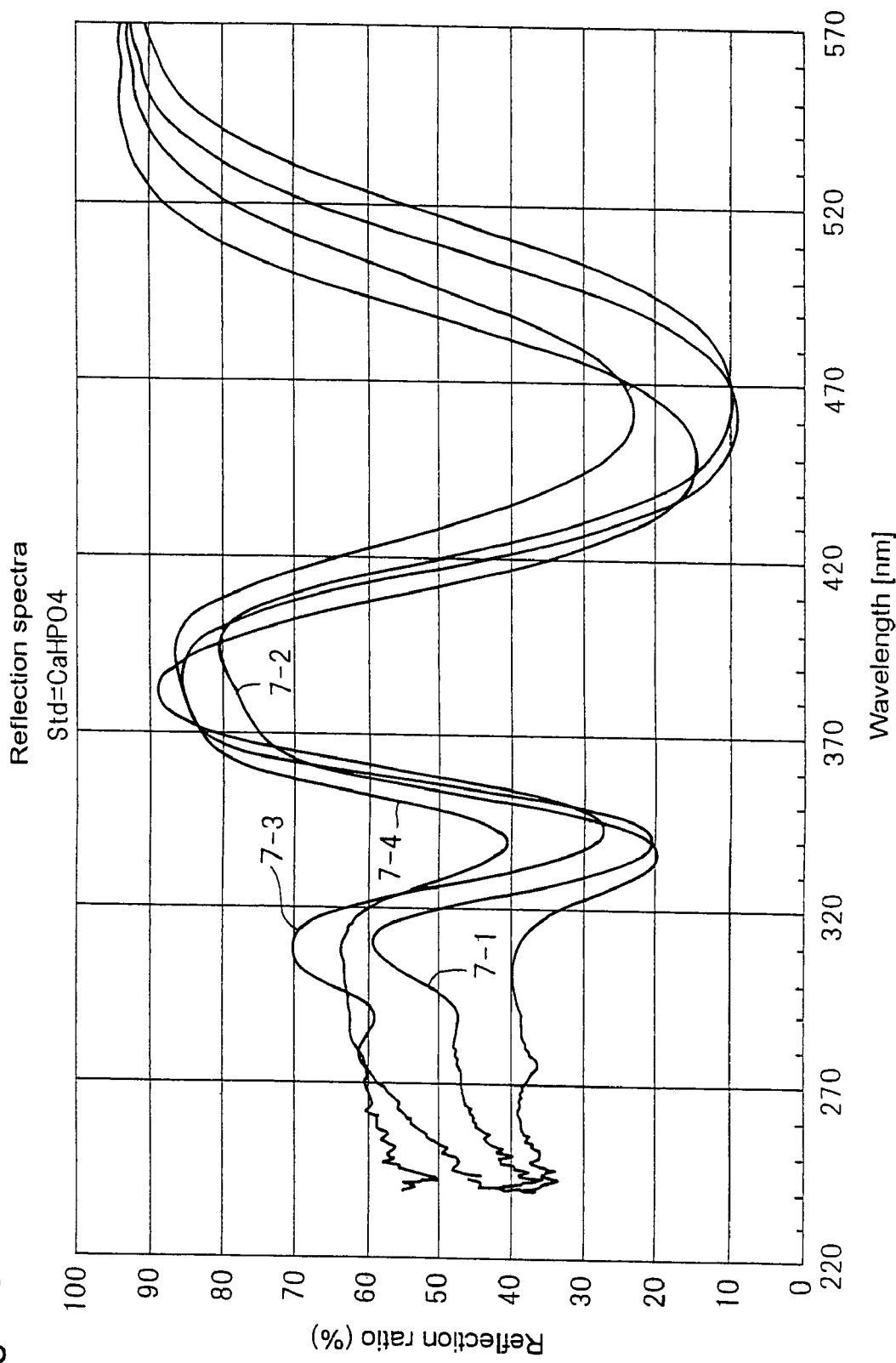
FIG. 93 is a chart showing the reflection spectra of the phosphors 7-1 to 7-4.
Figure 94:
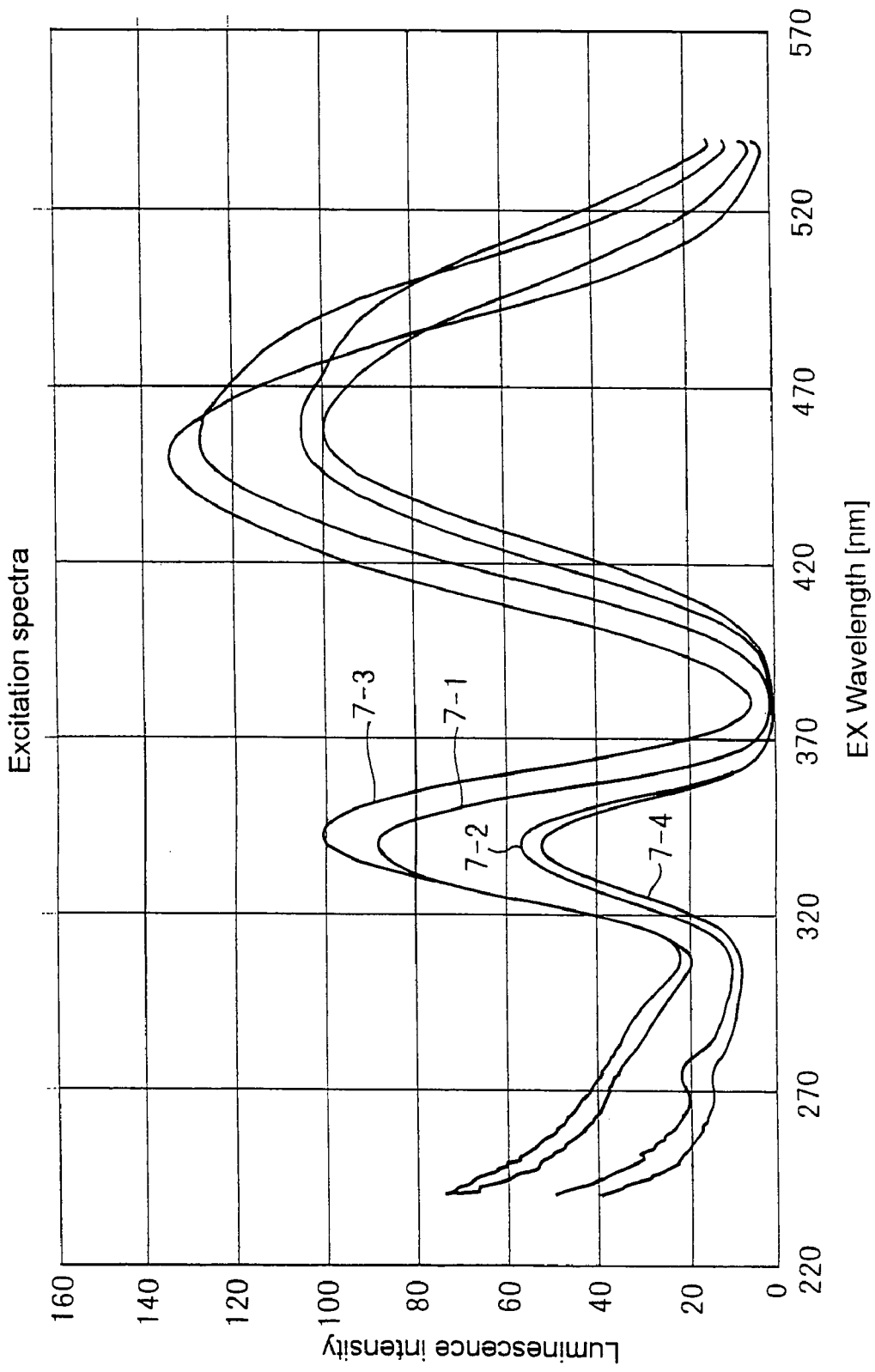
FIG. 94 is a chart showing the excitation spectra of the phosphors 7-1 to 7-4.
Figure 95:
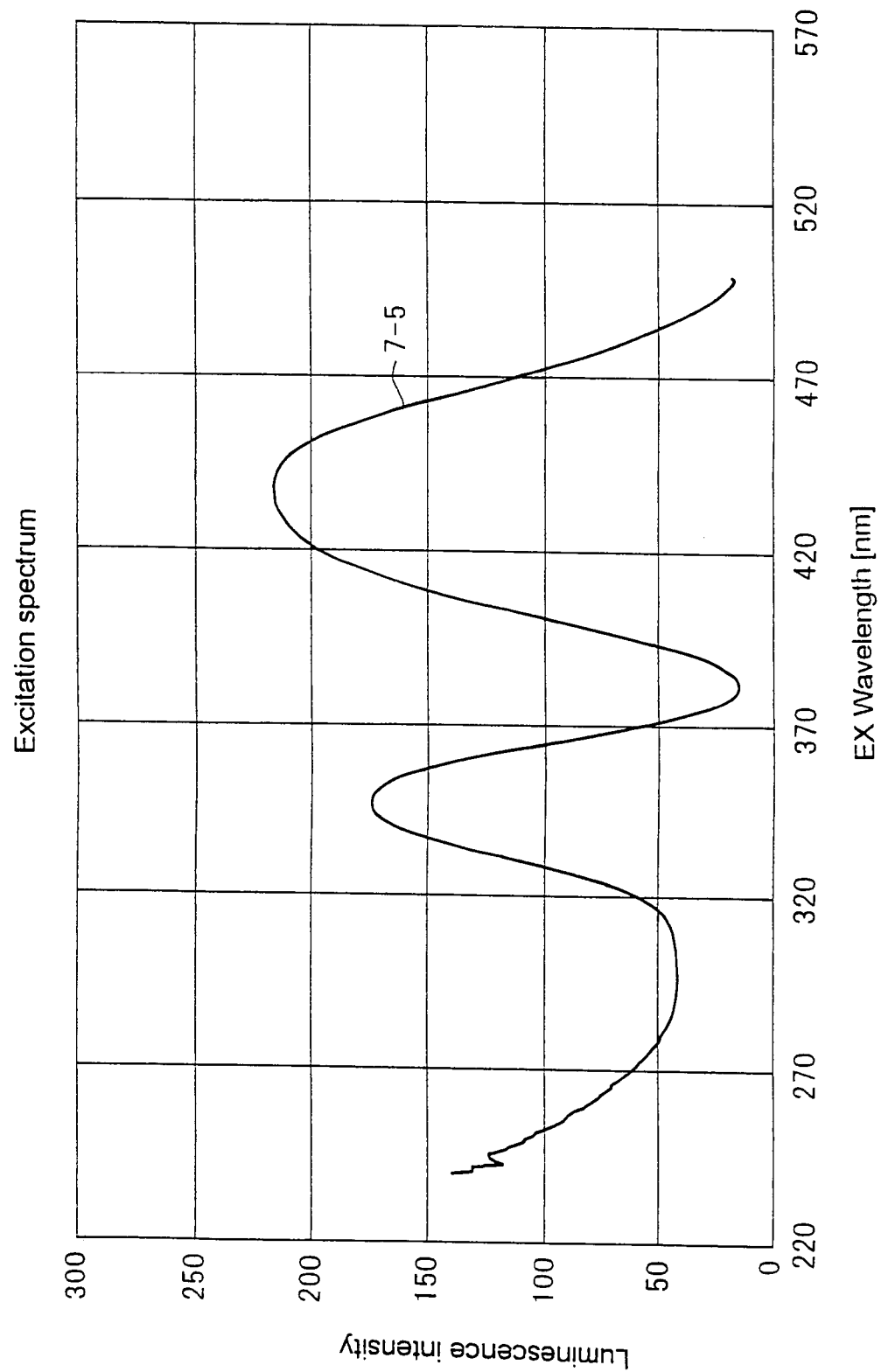
FIG. 95 is a chart showing the excitation spectrum of the phosphor 7-5.
Figure 96:
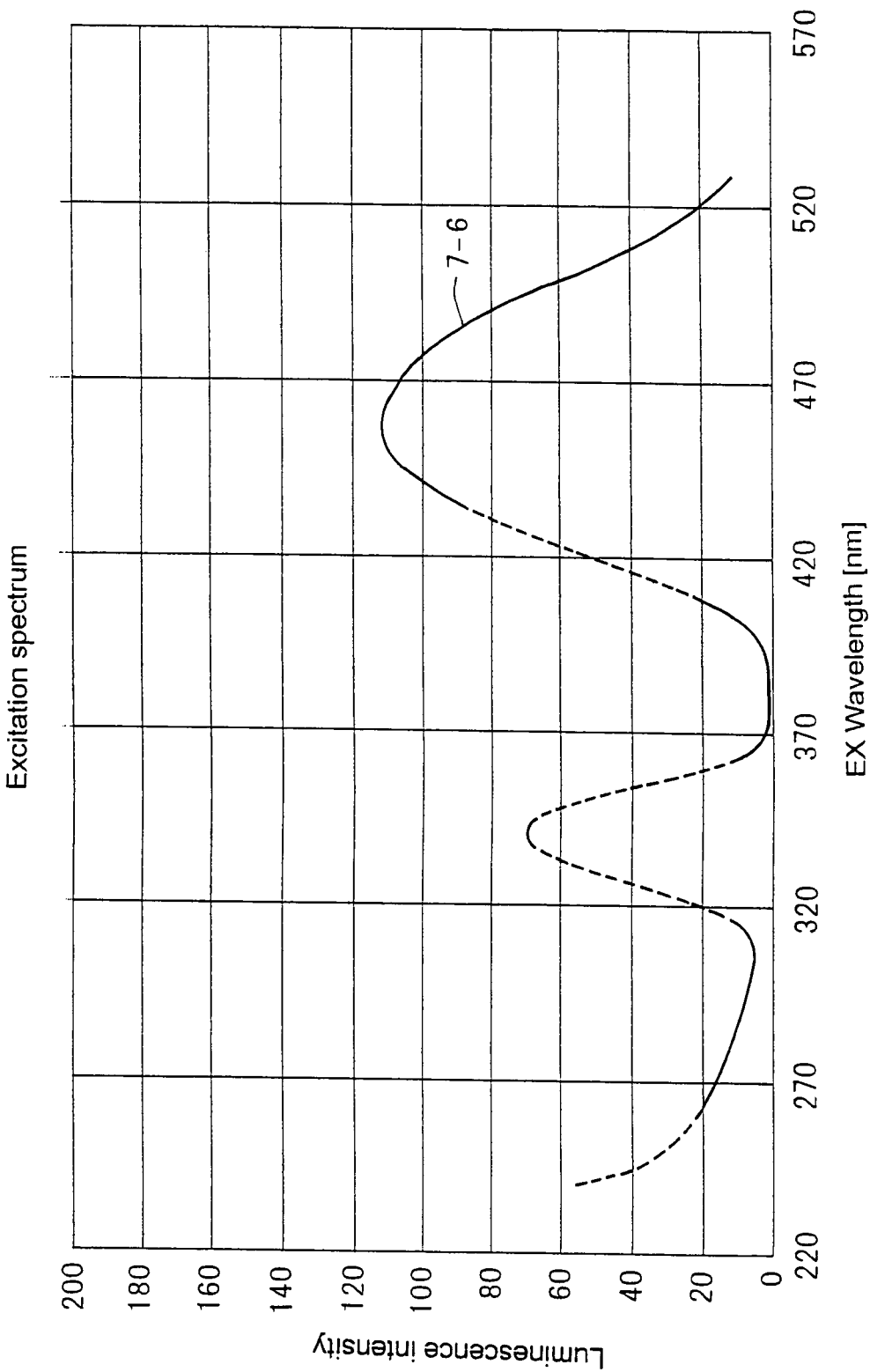
FIG. 96 is a chart showing the excitation spectrum of the phosphor 7-6.

The phosphor 7-1: $(Y_{0.90}Gd_{0.10})_{2.85}Ce_{0.15}Al_5O_{12}$
The phosphor 7-2: $(Y_{0.395}Gd_{0.605})_{2.85}Ce_{0.15}Al_5O_{12}$
The phosphor 7-3: $Y_{2.965}Ce_{0.035}(Al_{0.8}Ga_{0.2})_5O_{12}$
The phosphor 7-4: $(Y_{0.80}Gd_{0.20})_{2.965}Ce_{0.035}Al_5O_{12}$
The phosphor 7-5: $Y_{2.965}Ce_{0.035}(Al_{0.5}Ga_{0.5})_5O_{12}$
The phosphor 7-6: $Y_{2.85}Ce_{0.15}Al_5O_{12}$ Further, the YAG-base phosphor in the present invention is not limited to these. The phosphors 7-1 to 7-6 are more specifically illustrated referring to FIG. 92 to FIG. 97. FIG. 92 is a chart showing the luminescence spectra when the YAG-base phosphors of the phosphors 7-1 and 7-4 were excited at EX=460 nm. FIG. 93 is a chart showing the reflection spectra of the YAG-base phosphors of the phosphors 7-1 to 7-4. FIG. 94 is a chart showing the excitation spectra of the YAG-base phosphors of the phosphors 7-1 to 7-4. FIG. 97 is a chart showing the luminescence spectra when the YAG-base phosphors of the phosphors 7-5 and 7-6 were excited at EX=460 nm. FIG. 95 is a chart showing the excitation spectrum of the YAG-base phosphor of the phosphor 7-5. FIG. 96 is a chart showing the excitation spectrum of the YAG-base phosphor of the phosphor 7-6.

Since the YAG-base phosphors of the phosphors 7-1 to 7-6 have different peak wave lengths, the YAG-base phosphor having a desired color tone is selected. Then, the light emitting element is selected from the excitation spectrum and reflection spectrum. For example, the peak wave length at the long wavelength side of the excitation spectrum is about 456 nm for the YAG-base phosphor of 1. Considering a case that the light emitting element is shifted toward shorter wavelength in accordance with the increase of charged electric current, the light emitting element having a luminescence peak wave length at a longer wave length side by about 5 to 10 nm than the 456 nm is selected. Further, the light emitting element is selected considering the excitation spectrum of the second phosphor.

On the other hand, when the YAG-base phosphor is selected as the second phosphor after selecting a phosphor which emits light at a certain wave length, the points below must be considered. For example, when the charged electric current is low from the relation of the second phosphor with the light emitting element, the light emitting element having a luminescence peak wave length of 457 nm is used at a rating drive of 20 mA. When the YAG-base phosphor of the phosphor 7-6 is selected, the peak wave length of the excitation spectrum of the YAG-base phosphor of the phosphor 7-6 is 457 nm. Accordingly, when the charged electric current is comparatively low to the light emitting element, the YAG-base phosphor of the phosphor 7-6 emits light most efficiently. However, the peak wave length of the excitation spectrum of the light emitting element is shifted toward shorter wavelength by about 10 nm in accordance with the increase of the charged electric current to the light emitting element. When the luminescence peak wave length is shifted toward shorter wavelength by about 10 nm, the excitation efficiency of the YAG-base phosphor of the phosphor 7-6 is lowered, therefore the relative luminescence intensity of the YAG-base phosphor is lowered. Namely, the proportion of the luminescence intensity of emission after conversion to the excitation light is relatively lowered. Accordingly, the light emitting device using the YAG-base phosphor of the phosphor 7-6 generates the color tone deviation in accordance with the increase of the charged electric current to the light emitting element. On the contrary, when the YAG-base phosphor of the phosphor 7-5 is selected, the peak wave length of the excitation spectrum is 440 nm. The luminescence intensity of the YAG-base phosphor of the phosphor 7-5 is improved in accordance with the increase of the charged electric current to the light emitting element. On the other hand, the luminescence output of the YAG-base phosphor is lowered in accordance with the emission of heat. Accordingly, the light emitting device using the YAG-base phosphor of the phosphor 7-5 can provide a light emitting device having the little color tone deviation and stable luminescence because the color tone deviation caused by heat is compensated with the color tone deviation caused by spectrum shift in accordance with the increase of the charged electric current to the light emitting element, even if the charged electric current to the light emitting element is increased. Accordingly, when the YAG-base phosphor having the same peak wave length at increasing the charged electric current of the light emitting element or the peak wave length of the excitation spectrum at a short wavelength side is used for the first phosphor, the change of the color tone and luminescence intensity is extremely little. In addition to the above-mentioned phosphors, various YAG-base phosphors can be used.

(Nitride-Base Phosphor)

In the present mode 7 of operation, the nitride-base phosphor absorbs the portion of blue light which was emitted from the LED chip 202 and emits light at a yellow to red region. The nitride-base phosphor is used together with the YAG-base phosphor to the light emitting device having the above-mentioned constitution, and there is provided the light emitting device which emits light of a warm color-base white color by color mixing of blue light which was emitted from the LED chip 202, with the yellow to red light by the nitride-base phosphor. It is preferable to contain the yttrium-aluminum oxide fluorescence substance activated by cerium, in the phosphor which is added in addition to the nitride-base phosphor. Because the phosphor can be adjusted to a desired chromaticity by containing the yttrium-aluminum oxide luminescent substance. The yttrium-aluminum oxide fluorescent substance activated by cerium absorbs the portion of blue light which was emitted from the LED chip 202 and emits light at a yellow region. Hereat, light of a pale white color is emitted by color mixing of blue light which was emitted from the LED chip 202, with the yellow light of the yttrium-aluminum oxide fluorescent substance. Accordingly, there can be provided the light emitting device which emits light of a white color mix light by mixing the yttrium-aluminum oxide fluorescent substance with the phosphor which emits red light in the coating member 201 having transmittance and combining the mixture with blue light which was emitted from the LED chip 202. In particular, the light emitting device emitting white light which is situated on the locus of black body radiation in a chromaticity chart. However, in order to provide a light emitting device having a desired color temperature, the phosphor amount of the yttrium-aluminum oxide fluorescent substance and the amount of the phosphor which emits red light can be also suitably changed. The light emitting device emitting white color mix light is designed to improve the specific rendering index R9.

Conventionally, a light emitting device emitting white light which used a semiconductor element adjusts the balance of blue light from a light emitting element and green to red light from a phosphor matching with the visual sensitivity of human, and obtains the balance from the color mixing of light. The color tone of a light emitting device emitting white light which used a semiconductor light emitting element is usually obtained by adjusting the balance of luminescence at the rating drive region in which the output property of the light emitting device is stable. However, in case of a liquid crystal back light and a light-adjustable illumination light source, these light emitting devices are used by changing the applied electric power and electric current density. When the electric current density is changed for adjusting the power of the light emitting device in a conventional technology, the balance of luminescence has been broken and the color tone deviation has been generated to lower the quality of the light source. The mode of operation of the present invention is specifically illustrated below.

Firstly, FIG. 55 is referred.

The peak wave length of the luminescence spectrum which the light emitting element has is shifted toward shorter wavelength by increasing the applied electric current to the light emitting element. When the applied electric current is increased, the electric current density is enlarged and energy level is raised. There are factors such as a band gap is enlarged thereby, and the like. The fluctuation width between the peak wave length of the luminescence spectrum when the electric current density to the light emitting element is small and the peak wave length of the luminescence spectrum when the applied electric current is increased is about 10 nm when the applied electric current is increased by 20 mA to 100 mA in the present mode of operation.

Figure 56:
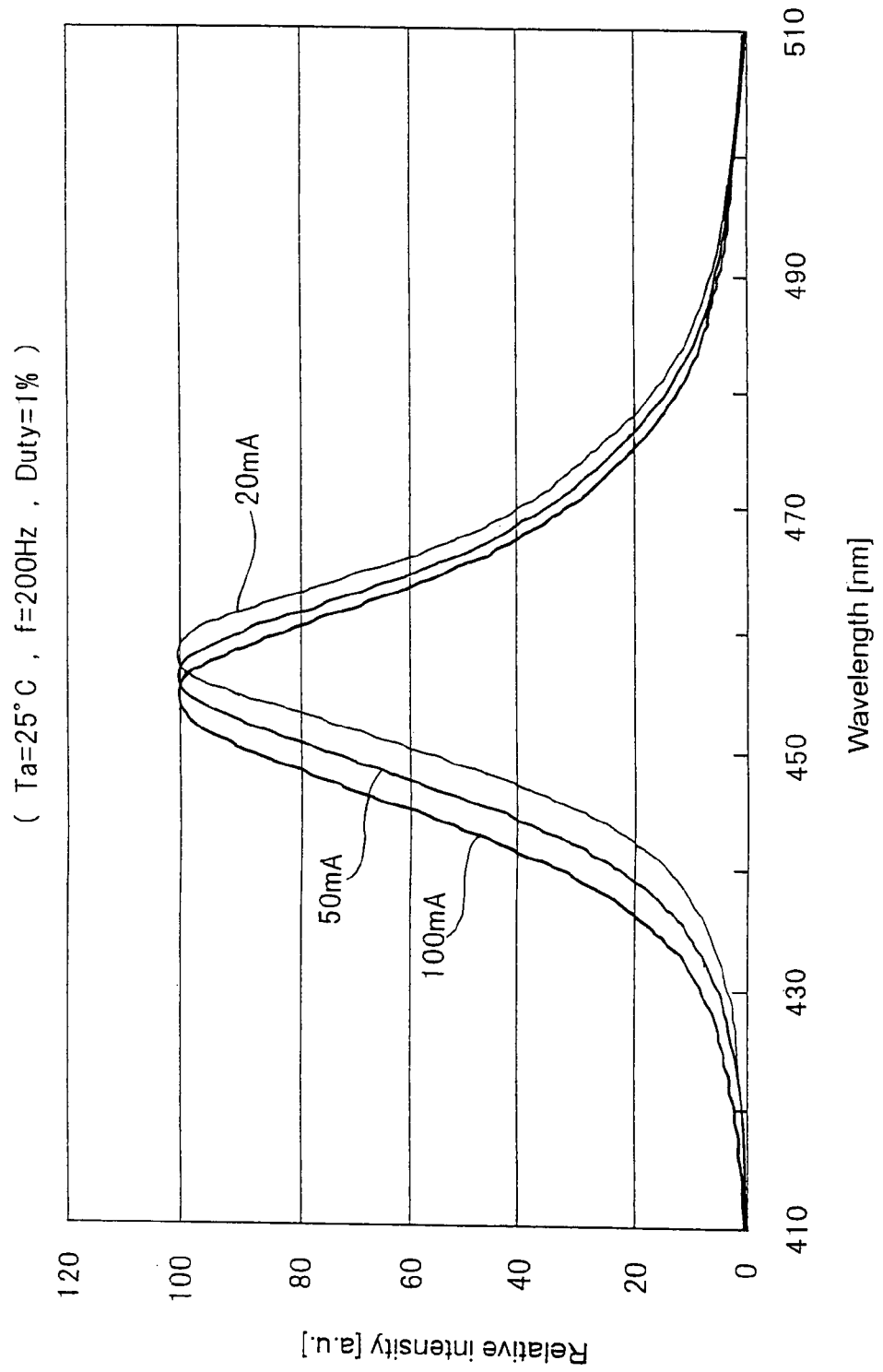
FIG. 56 is a chart showing the relation between the electric current and the relative luminescence spectrum property of an LED chip in one Example of the present invention.
Figure 57:
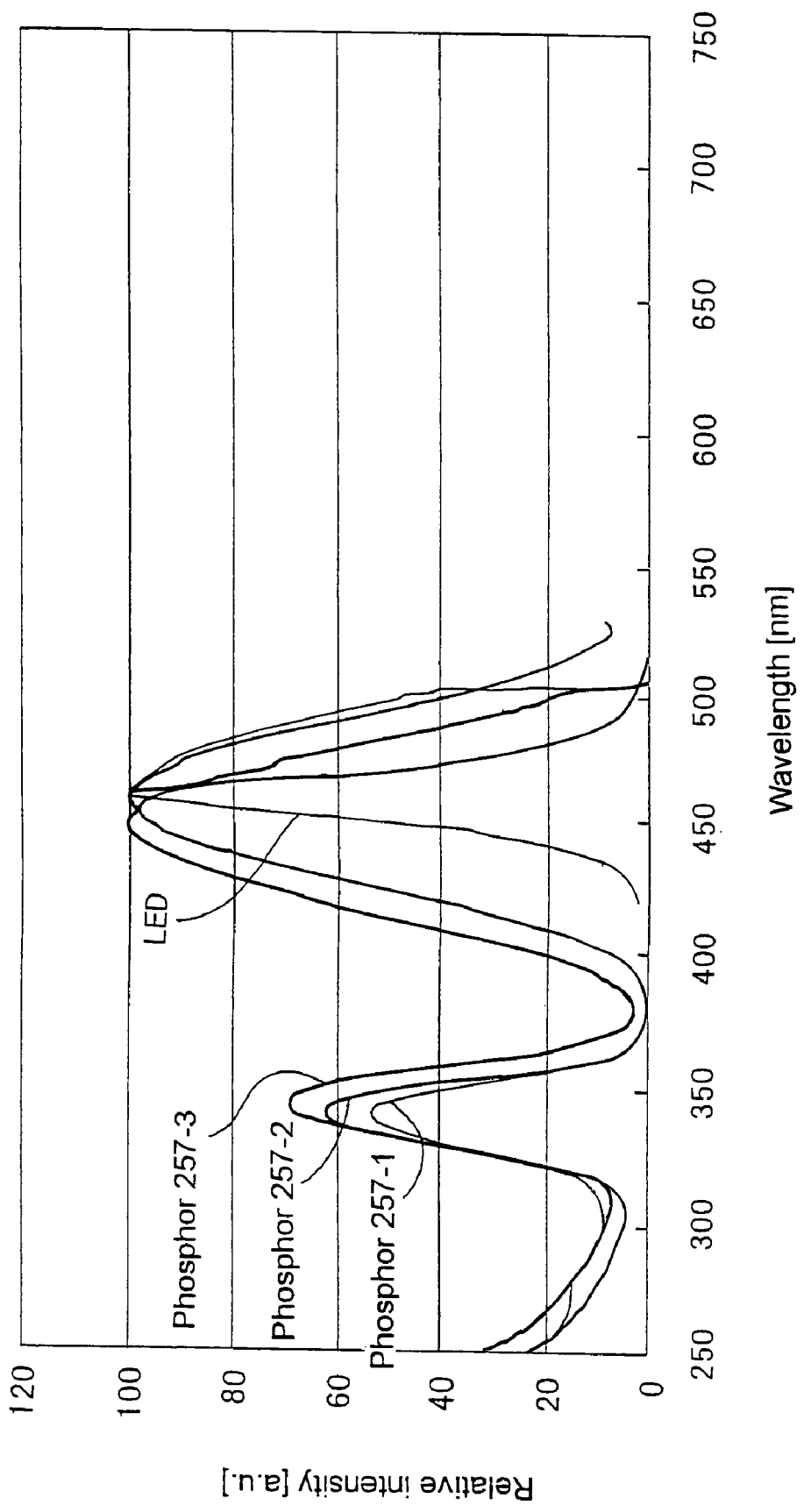
FIG. 57 is a chart showing the excitation absorption spectrum of the YAG-base phosphor in one Example of the present invention.

Illustration is carried out using FIG. 56 and FIG. 57.

For example, the YAG-base phosphor is used as the first phosphor. The peak wave length of the excitation spectrum for the YAG-base phosphor of the phosphor 3 is about 448 nm. When the luminescence intensity of the peak wave length of 448 nm of the excitation spectrum is set as 100, the luminescence intensity at 460 nm is 95. Accordingly, the excitation of the YAG-base phosphor at 448 nm has higher luminescence intensity than the excitation of the YAG-base phosphor at 460 nm. The relation of the light emitting element with the first phosphor is outlined because of this reason. Just after electric current is applied to the light emitting element, a light emitting element in which the luminescence peak wave length of the light emitting element is 460 nm is selected. The light emitting element emits blue light. The YAG-base phosphor which was excited by the blue light of the light emitting element emits green light of about 530 nm. Then, the applied electric current of the light emitting element is increased and the electric current of 100 mA is charged. The luminescence output of the semiconductor element is increased thereby, and the temperature of the light emitting element and the periphery is increased in accordance with this. Further, the luminescence peak wave length of the light emitting element is shifted from 460 nm to a short wave length of 450 nm. At this time, the YAG-base phosphor has the higher luminescence intensity at 450 nm than 460 nm of the peak wave length of the excitation spectrum. Accordingly, the excitation of the YAG-base phosphor exhibits relatively the higher luminescence intensity at 450 nm of the excitation light than at 460 nm. Further, blue light has a lower visual feeling efficiency at 450 nm than at 460 nm. Accordingly, since the brightness of the blue light of the light emitting element and the green light of the YAG-base phosphor becomes higher, the relative intensity of the green light to the blue light is strengthened. Accordingly, the color tone of the light emitting device is slightly shifted toward the green light side on a straight line linking the blue light with the green light. On the other hand, since the brightness of the phosphor is lowered by the increase of the ambient temperature, the relative intensity of the green light to the blue light is weakened. Accordingly, the color tone of the light emitting device is slightly shifted toward the blue light side on a straight line linking the blue light with the green light. The color tone deviation is suppressed by these balances.

Figure 58:
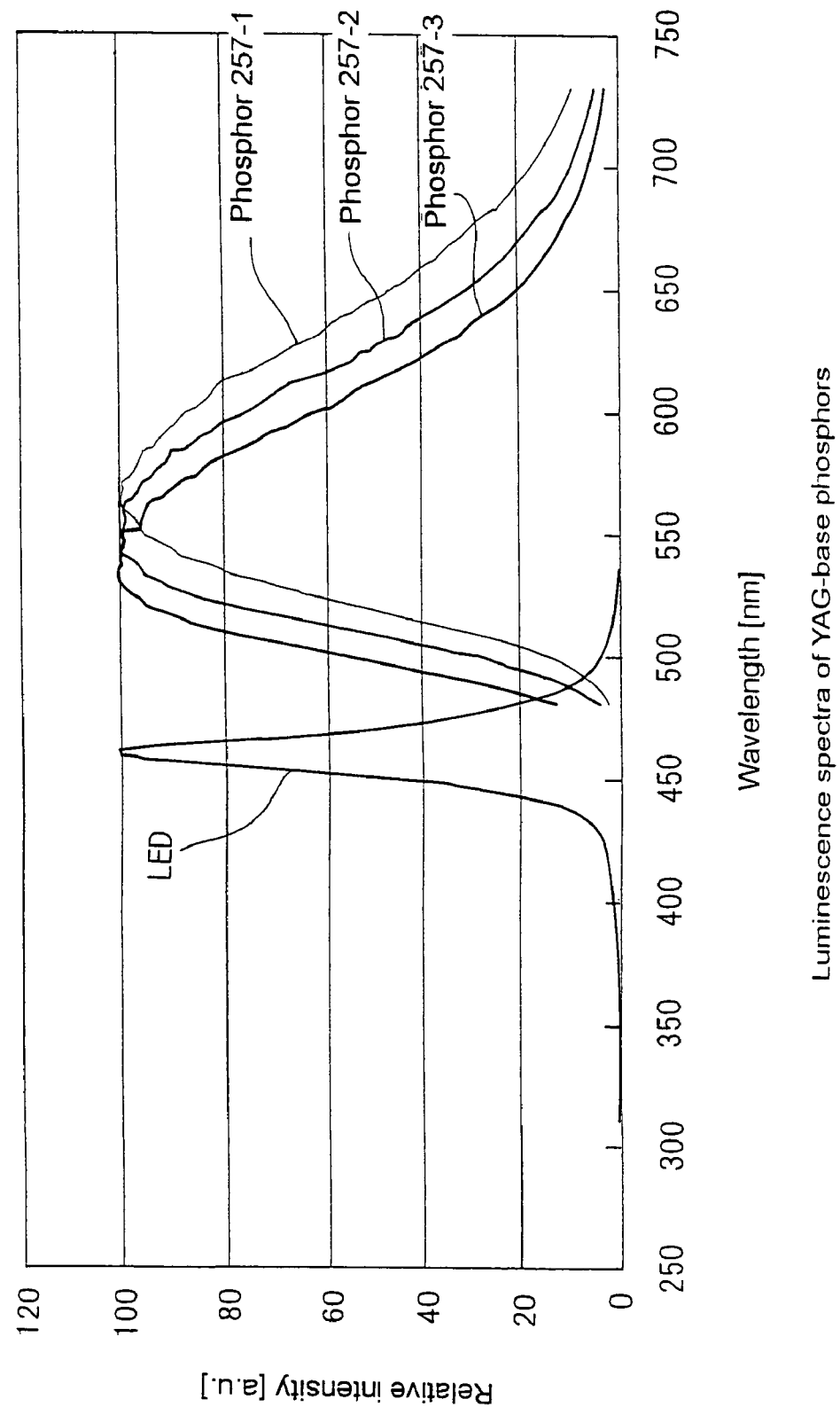
FIG. 58 is a chart showing the luminescence spectrum of the YAG-base phosphor in one Example of the present invention.
Figure 59:
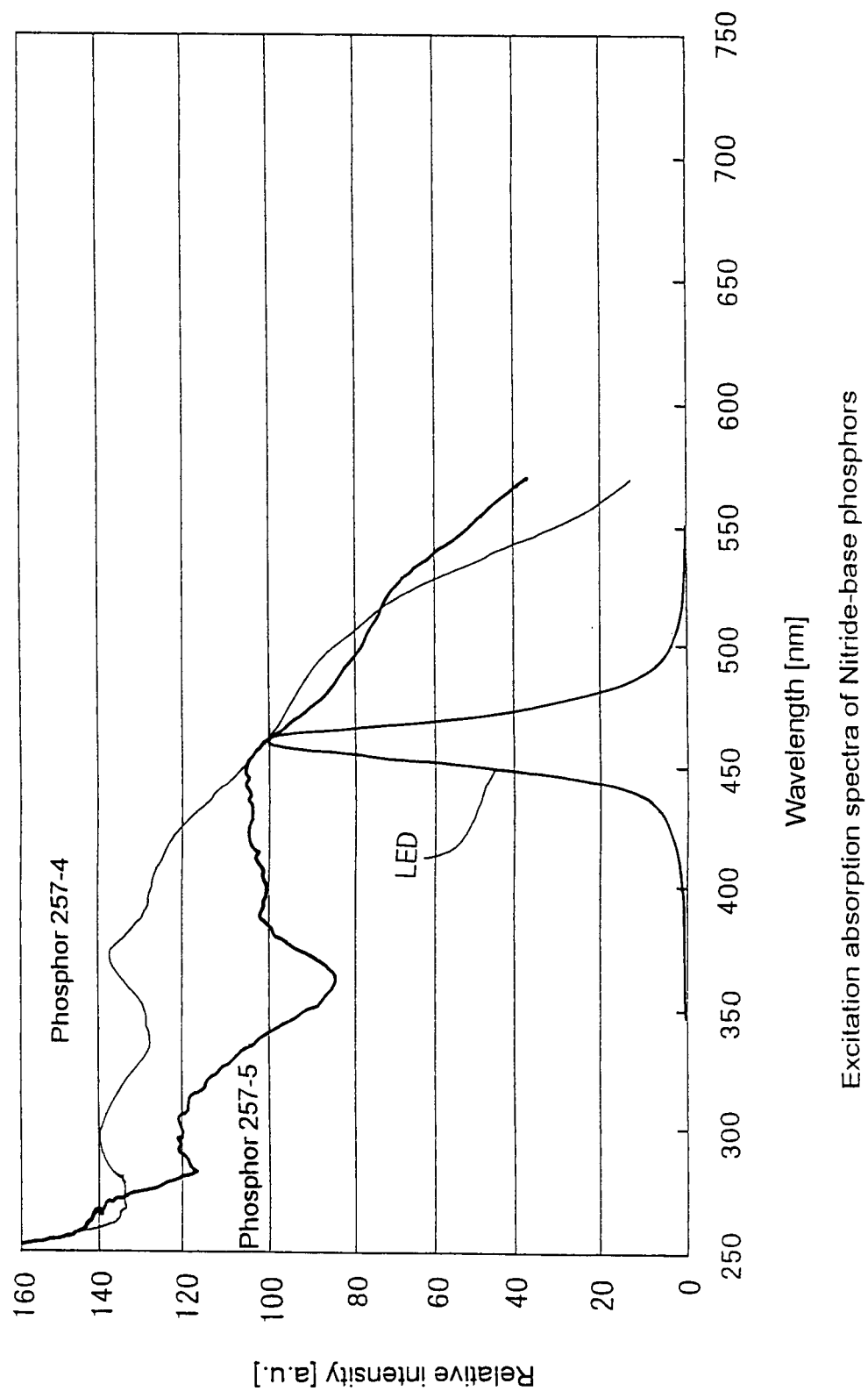
FIG. 59 is a chart showing the excitation absorption spectrum of the nitride-base phosphor in one Example of the present invention.

Illustration is carried out using FIG. 58 and FIG. 59.

For example, the nitride-base phosphor is used as the second phosphor. The peak wave length of the excitation spectrum with respect to the nitride-base phosphor of the phosphor 5 is about 450 nm between 350 nm and 500 nm. When the luminescence intensity of the peak wave length of 450 nm of the excitation spectrum is set as 100, the luminescence intensity at 460 nm is 95. Accordingly, the excitation of the YAG-base phosphor at 450 nm has higher luminescence intensity than the excitation of the nitride-base phosphor at 460 nm. The relation of the light emitting element with the second phosphor is outlined because of this reason. When the applied electric current density to the light emitting element is low, a light emitting element in which the luminescence peak wave length of the light emitting element is 460 nm is selected. The same light emitting element as the one which was used for exciting the first phosphor is used. The light emitting element emits blue light. The nitride-base phosphor which was excited by the blue light of the light emitting element emits red light of about 637 nm. Then, the applied electric current of the light emitting element is increased and the electric current of 100 mA is charged. The luminescence output of the semiconductor element is increased thereby, and the temperature of the light emitting element and the periphery is increased in accordance with this. Further, the luminescence peak wave length of the light emitting element is shifted from 460 nm to a short wave length of 450 nm. At this time, the nitride-base phosphor has the higher luminescence intensity at 450 nm than 460 nm of the peak wave length of the excitation spectrum. Accordingly, the excitation of the nitride-base phosphor exhibits relatively the higher luminescence intensity at 450 nm of the excitation light than at 460 nm. Further, blue light has a lower visual feeling efficiency at 450 nm than at 460 nm. Accordingly, since the brightness of the blue light of the light emitting element and the red light of the nitride-base phosphor becomes higher, the relative intensity of the red light to the blue light is strengthened. Accordingly, the color tone of the light emitting device is slightly shifted toward the red light side on a straight line linking the blue light with the red light. On the other hand, since the brightness of the phosphor is lowered by the increase of the ambient temperature, the relative intensity of the green light to the blue light is weakened. Accordingly, the color tone of the light emitting device is slightly shifted toward the blue light side on a straight line linking the blue light with the red light. The color tone deviation is suppressed by these balances.

The relation between the first phosphor with the second phosphor is outlined. The nitride-base phosphor absorbs not only the light from the light emitting element but also the light around the peak wave length (about 530 nm) of the luminescence spectrum of the YAG-base phosphor, and is excited.

Further, the mutual relation of the light emitting element with the first phosphor and the second phosphor is specifically illustrated. Heat emission is generated by charging electric current to the light emitting element. The quantity of heat emission is also increased by increasing the applied electric current to the light emitting element. The greater part of the heat which was generated at the light emitting element is accumulated in the coating member or the phosphor. Thus, the ambient temperature is raised and the lowering of the luminescence output of the phosphor itself is generated. On the contrary, the peak wave length of the luminescence spectrum of the light emitting element is shifted toward shorter wavelength side by increasing the applied electric current to the light emitting element as the description, and the luminescence intensity of the first phosphor is increased. The first phosphor can keep the color tone and luminescence output by these interactions without most changing. Further, the second phosphor can also keep the color tone and luminescence output by these interactions without most changing.

The color tone of the light emitting device is determined by the respective interactions of the light emitting element with the first phosphor and the second phosphor. Namely, the peak wave length of the luminescence spectrum of the light emitting element is shifted toward shorter wavelength in accordance with the increase of the applied electric current. The luminescence intensities of the first phosphor and the second phosphor which are excited by the light emitting element is increased in accordance with this. On the other hand, the light emitting element is heated in accordance with the increase of the applied electric current to the light emitting element. The heat is accumulated in the first phosphor and the second phosphor, the coating member and the like by the heat emission. The luminescence output of these phosphors is lowered by the accumulation of heat. Accordingly, the color tone deviation of the light emitting device can be suppressed even if the applied electric current to the light emitting element is increased. The color tone deviation can be hardly felt visually by selection of the first phosphor and the second phosphor even if the color tone deviation is generated in the light emitting device. Considering the interactions of the light emitting element with the first phosphor and the second phosphor, the color tone of the light emitting device transfers to a direction in which the color tone x is increased and a direction in which the color tone y is also increased. The direction to which the color tone is deviated is fluctuated along the locus of black radiation. The color deviation along the locus of black radiation is low sensitivity for human vision in comparison with the color deviation to a direction perpendicular to the locus of black radiation. Further, the swing width of the color deviation is narrow by the interaction (self absorption and the like) of the first phosphor and the second phosphor. Accordingly, the present invention can provide a light emitting device preventing the color tone deviation. The present invention has a great effect in particular for a light emitting device being easily subject to the influence of heat, for example, a semiconductor light emitting device which is DC drive and a power system which requires a large applied power, a light emitting device in which heat discharge is difficult and heat is easily accumulated, and under drive environment.

Further, a phosphor in which the excitation spectrum is hardly changed can be used within a range in which the light emitting element transfers to a short wavelength side in accordance with the increase of the applied electric power. For example, when the nitride-base phosphor of the phosphor 5 of Example is used, the excitation spectrum is hardly changed between 420 nm to 450 nm, but the effect is exhibited by using YAG having the characteristic of the present invention in combination. Further, the light emitting device of the present invention can be provided even if a phosphor having a characteristic of temperature characteristics of the above-mentioned phosphor and a characteristic of the excitation spectrum and the light emitting element is used other than the above-mentioned phosphor.

Further, the positions of the excitation spectrum and the peak wave length of the light emitting element can be adjusted considering the thermal resistance and discharge property of heat of the light emitting device, the junction temperature of the light emitting element and the like.

Mode 8 of operation

The mode 8 of operation of the present invention is illustrated referring to the drawing below. However, the mode 8 of operation shown below exemplifies a light emitting device light emitting device for embodying the technical philosophy of the present invention, and the present invention does not limit the light emitting device to below. Further, the size of the members and the positional relation shown in the respective drawings are occasionally exaggerated.

The phosphor used in the present invention contains the first phosphor situated on at least one light emitting elements and at least one of more of the second phosphors in which the portion of light emitted is absorbed in the first phosphor, and is characterized in that the first phosphor is situated at least one light emitting elements side than the second phosphors. In particular, the phosphor layers used in the present mode 8 of operation are the first phosphor layer 303 which emits light having the peak wave length of luminescence spectrum at a red region and the second phosphor layer 306 which emits light having the peak wave length of luminescence spectrum at a yellow to green region. The first phosphor layer 303 can contain a nitride-base phosphor which contains N, and contains at least one of elements selected from Be, Mg, Ca, Sr, Ba and Zn and at least one elements selected from C, Si, Ge, Sn, Ti, Zr and Hf, and is activated by at least one element selected from the rare earth elements. Further, the second phosphor layer 306 can contain a YAG-base phosphor which contains Y and Al, and contains at least one of elements selected from Lu, Sc, La, Gd, Tb, Eu and Sm and at least one of elements selected from Ga and In and is activated by at least one element selected from the rare earth elements.

Figure 74:
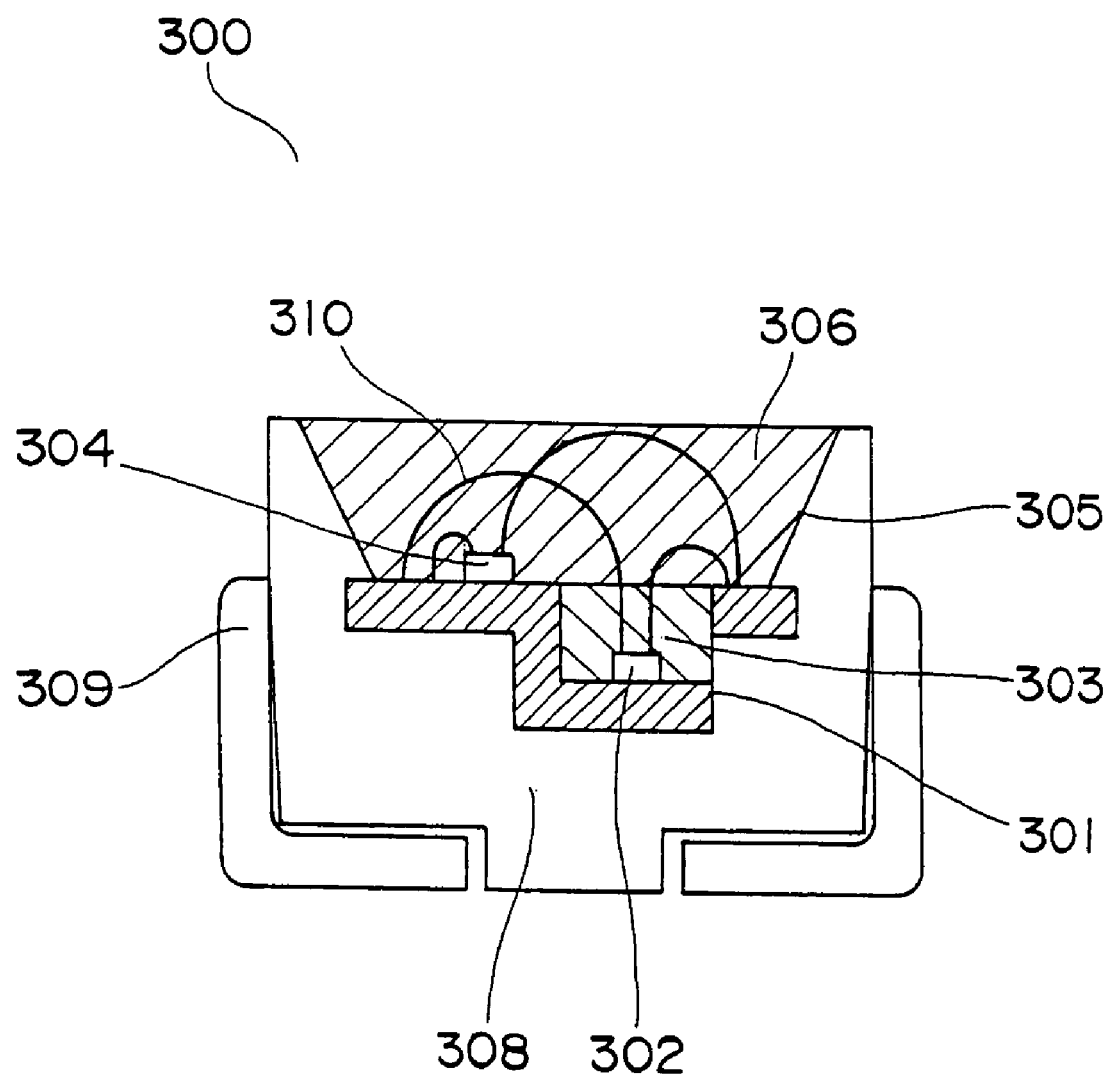
FIG. 74 is a typical section view of the light emitting diode related to the present invention.

The light emitting device related to the present invention has the first concave portion mounting the first phosphor and at least one of light emitting elements and the second concave portion mounting the second phosphor and at least one of light emitting elements. FIG. 74 is a typical section view of the surface mounting type light emitting diode in the present mode 8 of operation. The first concave portion 301 and the second concave portion are provided at a face side of observing luminescence in the package 308. Hereat, the first concave portion 301 is provided in the second concave portion 305.

The second phosphor is situated on at least one of light emitting elements, and/or on at least one of light emitting elements which are different from the at least one of light emitting elements. Namely, as shown in FIG. 74, the LED chip 302 capable of emitting light at a blue region is mounted in the first concave portion 301, and the first phosphor layer 303 is formed so as to cover the LED chip 302. Further, similarly, the LED chip 304 capable of emitting light at a blue region is mounted in the second concave portion 305, and the second phosphor layer 306 is formed so as to cover the LED chip 304 and the first phosphor layer 303. When the molding member having a diffusing agent is used, the first phosphor layer 303 and the second phosphor layer 306 are covered, the electroconductive wire 310, LED chip and phosphor layers are protected, and light which is emitted from the phosphor layers can be also diffused and color-mixed to a direction of the face of observing luminescence. Hereat, the n-side electrode and p-side electrode of the LED chip 302 and the LED chip 304 are respectively connected with the n-side electrode and p-side electrode of the lead electrode 309 which was integrally molded in the package 308, using the electroconductive wire 310.

In the light emitting diodes which were constituted as above, the portion of LED light excites the phosphor contained in the first phosphor layer 303, and generates light at a red region having a wave length which is different from the LED light. Further, the portions of LED light by the LED chip 304 and the LED chip 302 excites the phosphor contained in the second phosphor layer 306, and generates light at a yellow to green region having a wave length which is different from the LED light. The fluorescences which are generated from the first phosphor layer 303 and the second phosphor layer 306 and LED light which is output without contributing the excitation of the phosphors are color-mixed to be output from the direction of the face of observing luminescence of the light emitting device. Thus, a plural number of LRD chips are used and a plural number of phosphors are directly excited respectively, therefore the present invention can make the light emitting device capable of highly brilliantly emitting the light of luminescence spectrum which the respectively phosphors have naturally, in comparison with a conventional light emitting device which excites several kinds of phosphors by one LED chip at once.

When the first phosphor layer and the second phosphor layer, or the third phosphor layer are separately laminated in order, the phosphors emitting light having different wave lengths are respectively contained in the respective phosphor layers, therefore the light emitting device which improved the color rendering property can be made. Namely, since the peak wave length of the luminescence spectrum at a red region which is emitted from the red color-base phosphor contained in the first phosphor layer exists at a range of 600 nm to 700 nm and the peak wave length of the excitation absorption spectrum of the YAG-base phosphor contained in the second phosphor layer exists at a range of 420 nm to 470 nm, the light emitted from the red color-base phosphor is hardly absorbed in the YAG-base phosphor and efficiently color-mixed with light having other wave length.

Further, the first concave portion 301 is formed in the inner portion from the second concave portion 305. Since the light having a wave length of 500 nm to 700 nm which was emitted from the second phosphor layer 306 and is oriented to the direction of the face of observing luminescence is not absorbed by the red color-base phosphor having the excitation absorption spectrum at a wave length range of 350 nm to 600 nm, the light emitting device which improved the color rendering property can be made.

Further, since the phosphor layers are formed so as to be divided into 2 layers, the light emitted from the first phosphor layer 303 and the LED light are not absorbed and diffused by the phosphor particles during passing the second phosphor layer 306, therefore the light at a blue region, the light at a yellow to green region and the light at a red region are efficiently color-mixed. Accordingly, the color rendering property of the light emitted from the light emitting device can be improved. Further, a diffusing agent or a filler may be preferably contained in the second phosphor layer 306, or the molding member which contained a diffusing agent or a filler may be formed on the second phosphor layer 306. The color mixing can be more efficiently carried out by making such a constitution.

Since the excitation efficiency of phosphors is usually lowered in accordance with the raise of ambient temperature, the output of the light emitted from the phosphors is also lowered. In the present mode 8 of operation, the lowering proportion of the relative luminescence output when the ambient temperature was changed by 1° C. in a condition in which the phosphor is coated on the light emitting element emitting light at a blue region in which the peak wave length λp is about 460 nm is defined as the decreasing rate of the luminescence output. The decreasing rates of the luminescence output of the red color-base phosphor and the YAG-base phosphor against the raise of temperature are $4.0 \times 10^{-3}$ [a.u./° C.] or less and more preferably $2.0 \times 10^{-3}$ [a.u./° C.] or less, and it can be constituted that the lowering of beam [lm] of the whole light emitting device accompanying heat emission can be further suppressed. Further, it can be constituted that the decreasing rates of the luminescence output of the red color-base phosphor and the YAG-base phosphor against the raise of temperature are nearly equal. Namely, the difference of the decreasing rates of the luminescence output of the red color-base phosphor and the YAG-base phosphor is set as $2.0 \times 10^{-3}$ [a.u./° C.] or less and more preferably $2.0 \times 10^{-4}$ [a.u./° C.] or less, therefore the decreasing rates of the luminescence output can be nearly the same. The temperature characteristics of the phosphors in which the excitation efficiency is lowered by heat emission become nearly equal, therefore a light emitting device which can suppress the color deviation even if the ambient temperature is changed can be formed.

The respective constitutions of the mode 8 of operation of the present invention are specifically described below.

[Phosphor]

As the phosphor used in the present invention, it is possible to use various phosphors which respectively emit lights having different wave length regions which are excited by light at an ultraviolet to visible light region, in combination. At that time, the phosphors in which the portion of the light emitted from the first phosphor is not absorbed in the second phosphor are respectively selected. In the present mode 8 of operation, the phosphor which generates light of a fixed color by excitation by ultraviolet rays can be also used as a phosphor, and as the specific example, for example, there are mentioned (1) $Ca_{10}(PO_4)_6FCl:Sb,Mn$,
(2) $M_5(PO_4)_3Cl:Eu$ (provided that M is one selected from Sr, Ca, Ba and Mg),
(3) $BaMg_2Al_{16}O_{27}:Eu$,
(4) $BaMg_2Al_{16}O_{27}:Eu,Mn$,
(5) $3.5MgO.0.5MgF_2.GeO_2:Mn$,
(6) $Y_2O_2S:Eu$,
(7) $Mg_6As_2O_{11}:Mn$,
(8) $Sr_4Al_{14}O_{25}:Eu$,
(9) $(Zn,Cd)S:Cu$,
(10) $SrAl_2O_4:Eu$,
(11) $Ca_{10}(PO_4)_6ClBr:Mn,Eu$,
(12) $Zn_2GeO_4:Mn$,
(13) $Gd_2O_2S:Eu$, and
(14) $La_2O_2S:Eu$.

In particular, as the phosphor used in the present mode 8 of operation, a phosphor using the yttrium-aluminum-garnet (pomegranate stone type)-base phosphor and the red color-base phosphor capable of emitting red light, in particular, the nitride-base phosphor in combination can be used. These YAG-base phosphor and nitride-base phosphor are respectively contained in the phosphor layers which are constituted by a plural number of layers. The respective phosphors are specifically illustrated below. In the present invention, the particle diameter of the phosphor is a value obtained by a volume based particle size distribution curve, and the volume based particle size distribution curve is obtained by measuring the particle size distribution of a phosphor by a laser diffraction-scattering method. Specifically, the phosphor is diffused in a sodium hexametaphosphate aqueous solution having a concentration of 0.05% under environments of a temperature of 25° C. and a humidity of 70%, and the value is obtained by measuring the particles at a particle diameter range of 0.03 μm to 700 μm by a laser diffraction type particle size distribution measurement apparatus (SALD-2000A).

(Yttrium-Aluminum-Garnet-Base Phosphor)

The yttrium-aluminum-garnet-base phosphor (YAG-base phosphor) used in the present mode 8 of operation is a phosphor which contains Y and Al, and contains at least one of elements selected from Lu, Sc, La, Gd, Tb, Eu and Sm and at least one of elements selected from Ga and In and is activated by at least one elements selected from the rare earth elements, and a phosphor which emits light excited by visible light and ultraviolet rays which were emitted from the LED chip 304. In particular, the present mode 8 of operation, 2 or more of the yttrium-aluminum oxide-base phosphors having different compositions which were activated by Ce or Pr are utilized. A desired white luminescence color display can be carried out by color mixing the blue light which was emitted from a light emitting element using a nitride-base phosphor-base semiconductor, with the green or red light which is emitted from a phosphor whose body color is yellow for absorbing the blue light, or the yellow light being more greenish light and more reddish light. It is preferable that the light emitting device contains the powder and bulk of the phosphor in various resins such as an epoxy resin, an acrylic resin or a silicone resin, and inorganic transparent substances such as silicon oxide, aluminum oxide and silica sol in order to provoke the color mixing. The product containing the phosphor can be variously used for a dot shape product and a laminar shape product which were thinly formed so that the light from the LED chip passes through the product, and the like in accordance with uses. Arbitrary color tones such as a light bulb color including a white color can be provided by variously adjusting the ratio of the phosphor and resins, coating and the filling amount, and selecting the luminescence wave length of a light emitting element.

Further, a light emitting device capable of efficiently emitting light can be made by respectively arranging 2 or more of phosphors against the incident light from the light emitting element in order. Namely, the reflection light can be effectively utilized by laminating a color converting member in which the phosphor having an absorbing wave length at a long wavelength side and capable of emitting light at a long wavelength side was contained, and a color converting member which has an absorbing wave length at a long wavelength side and can emit light at a longer wave length side, on the light emitting element having a reflection member.

When the YAG-base phosphor is used, a light emitting device having an adequate light resistance in high efficiency can be made even though it is arranged contacting with the LED chip having (Ee)=0.1 W·cm$^{-2}$ or more and 1000 W·cm$^{-2}$ or less as emission brightness, or adjacently.

Since the YAG-base phosphor capable of emitting blue light which is the yttrium-aluminum oxide-base phosphor used for the present mode 8 of operation which was activated by Ce is a garnet configuration, it is strong for heat, light and moisture, and can make the peak wave length of the excitation absorption spectrum be 420 nm to 470 nm. Further, the luminescence peak wave length $\lambda p$ is around 510 nm and has a broad luminescence spectrum which is spread around 700 nm. On the other hand, since the YAG-base phosphor capable of emitting red light which is the yttrium-aluminum oxide-base phosphor which was activated by Ce is also the garnet configuration, it is strong for heat, light and moisture, and can make the peak wave length of the excitation absorption spectrum be 420 nm to 470 nm. Further, the luminescence peak wave length $\lambda p$ is around 600 nm and has a broad luminescence spectrum which is spread around 750 nm.

Among the composition of the YAG-base phosphor having the garnet configuration, the luminescence spectrum is shifted toward a shorter wavelength by substituting the portion of Al with Ga, and the luminescence spectrum is shifted toward a longer wavelength by substituting the portion of Y of the composition with Gd and/or La. When the substitution of Y is less than 20%, a green component is large and a red component is little. Further, when it is more than 80%, the red component is increased but the brightness is rigorously lowered. Further, with respect to the excitation absorption spectrum similarly, among the composition of the YAG-base phosphor having the garnet configuration, the excitation absorption spectrum is shifted toward shorter wavelength by substituting the portion of Al with Ga, and the excitation absorption spectrum is shifted toward longer wavelength side by substituting the portion of Y with Gd and/or La. It is preferable that the peak wave length of the excitation absorption spectrum of the YAG-base phosphor is situated at a shorter wave length side than the peak wave length of the luminescence spectrum of the light emitting element. When the constitution is made thus, the peak wave length of the excitation absorption spectrum coincides nearly with the peak wave length of the luminescence spectrum of the light emitting element, therefore a light emitting device suppressing the generation of the color deviation can be formed without lowering the excitation efficiency of the phosphor.

With respect to the phosphor, oxides or compounds which are easily converted to be oxides at a high temperature are used as raw materials of Y, Gd, Ce, La, Al, Sm and Ga, and they are adequately mixed at a stoichiometric ratio to obtain a raw material. Alternatively, a solubilized solution which was obtained by dissolving the rare earth elements of Y, Gd, Ce, La and Sm in an acid at a stoichiometric ratio was co-precipitated with oxalic acid and then the co-precipitated product was baked to obtain a co-precipitated oxide. Then, the co-precipitated oxide, aluminum oxide and gallium oxide are mixed to obtain a mix raw material. An appropriate amount of a fluoride such as ammonium fluoride as a flux is mixed with this, and the mixture is packed in a crucible and baked at a temperature range of 1350 to 1450° C. in air for 2 to 5 hours to obtain a baked product. The baked product is pulverized in water by a ball mill, washed, separated, dried and finally sieved to obtain the phosphor. Further, in the production method of the phosphor of the alternative mode of operation, it is preferable that a mixture comprising a flux and a mix raw material which mixed the raw materials of the phosphor is baked by 2 steps which consist of the first baking step of carrying out in air or weak reduced atmosphere and the second baking step of carrying out in reduced atmosphere. Wherein the weak reduced atmosphere means weak reduced atmosphere which was set to contain at least an oxygen amount necessary for the reaction process of forming a desired phosphor from the mix raw material. The black conversion of the phosphor can be prevented and the lowering of the absorption efficiency of light can be prevented by carrying out the first baking step until the configuration formation of the desired phosphor is completed in the weak reduced atmosphere. Further, the reduced atmosphere in the second baking step means stronger reduced atmosphere than the weak reduced atmosphere. Thus, when the phosphor is baked at 2 steps, the phosphor having the high absorption efficiency of excitation wave length is obtained. Accordingly, when the light emitting device is formed by the phosphor which was formed thus, the amount of the phosphor necessary for obtaining a desired color tone can be reduced, a light emitting device having a high light-take out efficiency can be formed.

The yttrium-aluminum oxide-base phosphors which were activated by 2 or more cerium having different compositions may be used in mixture, or may be respectively arranged independently. When the phosphors are respectively arranged independently, it is preferable to arrange a phosphor easily absorbing and emitting light from the light emitting element at a shorter wave length side and a phosphor easily absorbing and emitting light at a longer wave length side than the former, in order. The absorption and emission of light can be carried out in high efficiency thereby.

(Nitride-Base Phosphor)

The first phosphor used in the present invention is a nitride-base phosphor which contains N, and contains at least one of elements selected from Be, Mg, Ca, Sr, Ba and Zn and at least one elements selected from C, Si, Ge, Sn, Ti, Zr and Hf, and is activated by at least one of elements selected from the rare earth elements. Further, the nitride-base phosphor used in the present mode 8 of operation means a phosphor which is excited by absorbing the visible light and ultraviolet rays from an LED chip and emits light.

In particular, the phosphor related to the present invention is the Sr—Ca—Si—N Eu-base, Ca—Si—N:Eu-base, Sr—Si—N:Eu-base, Sr—Ca—Si—O—N Eu-base, Ca—Si—O—N:Eu-base, Sr—Si—O—N:Eu-base silicon nitrides to which Mn was added. The basic constituting elements of the phosphor are represented by the general formula $L_X Si_Y N_{(2/3)X+(4/3)Y}$:Eu or $L_X Si_Y O_Z N_{(2/3)X+(4/3)Y-(2/3)Z}$:Eu (L is either of Sr, Ca, Sr and Ca). It is preferable that X and Y are X=2 and Y=5, or X=1 and Y=7 in the general formula, but an arbitrary one can be also used. Specifically, it is preferable to use the phosphor in which the basic constituting elements are represented by $(Sr_X Ca_{1-X})_2 Si_5 N_8$:Eu, $Sr_2 Si_5 N_8$:Eu, $Ca_2 Si_5 N_8$:Eu, $Sr_X Ca_{1-X} Si_7 N_{10}$:Eu, $SrSi_7 N_{10}$:Eu and $CaSi_7 N_{10}$:Eu to which Mn was added, but at least one or more selected from a group consisting of Mg, Sr, Ca, Ba, Zn, B, Al, Cu, Cr and Ni may be contained in the composition of the phosphor. However, the present invention is not limited to the mode 8 of operation and Examples. L is either of Sr, Ca, Sr and Ca. The compounding ratio of Sr and Ca can be changed according to requirement.

An economic phosphor having good crystallinity can be provided by using Si in the composition of the phosphor.

Europium being the rare earth element is used as a luminescent center. Europium has mainly bivalent and tervalent energy levels. In the phosphor of the present invention, $Eu^{3+}$ is used for the alkali earth metal silicon nitride-base phosphor of mother-body as the augmenting agent. $Eu^{3+}$ is easily oxidized and it is commercially available in the composition of tervalent $Eu_2O_3$. However, since O participates greatly in case of the commercially available $Eu_2O_3$, a good phosphor is hardly obtained. Accordingly, it is preferable to use those in which O is eliminated from $Eu_2O_3$ to the out of system. For example, it is preferable to use europium alone or europium nitride. However, when Mn is added, then it is not limited to this.

Mn being an additive accelerates the diffusion of $Eu^{3+}$ and improves the luminescence efficiency such as luminescence brightness, energy efficiency and quantum efficiency. Mn is baked together with raw materials during the production step by being contained in the raw materials or by containing Mn alone or a Mn compound. However, Mn is not contained in the basic constituting elements after baking, and only a small amount of Mn remains in comparison with the initial content even if Mn is contained. This is considered to be because Mn was scattered in the baking step.

The phosphor contains at least one or more selected from a group consisting of Mg, Sr, Ca, Ba, B, Al, Cu, Mn, Cr, O and Ni, in the basic constituting elements or together with the basic constituting elements. These elements have actions of enlarging the particle diameter and enhancing the luminescence brightness, etc. Further, B, Al, Mg, Cr and Ni have an action capable of suppressing afterglow.

The nitride-base phosphor absorbs the portion of the light emitted by the LED chip 302 and emits light at a yellow to red region. The light emitting device emitting warm color-base color mix light can be made by color-mixing the blue light emitted from the LED chips 302 and 304, the light by the YAG-base phosphor and the yellow to red light from the nitride-base phosphor, using the nitride-base phosphor together with the YAG-base phosphor for the light emitting device having the above-mentioned constitution. The yttrium-aluminum oxide-base fluorescent substance activated by cerium absorbs the portion of the blue light emitted from the LED chip 304 and emits light at a yellow region. Hereat, the blue light emitted from the LED chip 304 and the yellow light of the yttrium-aluminum oxide-base fluorescent substance emit blue white light by color mixing. Accordingly, the light emitting device emitting white-base color mix light can be made by respectively containing the phosphor emitting red light and the yttrium-aluminum oxide fluorescent substance in the first phosphor layer and the second phosphor layer and combining the blue lights emitted from the LED chip 302 or the LED chip 304. The preferable light emitting device in particular is a light emitting device in which chromaticity is situated at the locus of black body radiation in a chromaticity chart. However, the compounding amount of the yttrium-aluminum oxide fluorescent substance and the compounding amount of the phosphor emitting red light can be appropriately changed in order to provide a light emitting device having a desired color temperature. The light emitting device which emits white color-base color mix light designs to improve the specific average rendering index R9. With respect to a white color light emitting device which is the combination of a conventional blue light emitting element and the yttrium-aluminum oxide phosphor activated by cerium, the specific average rendering index R9 is about near O around a color temperature Tcp=4600K, and a red component was insufficient. Accordingly, it has been a solving problem to enhance the specific color rendering index R9, but the present invention, the specific color rendering index R9 can be enhanced by using the phosphor emitting red light and the yttrium-aluminum oxide fluorescent substance in combination.

Then, the production process of the phosphor $((Sr_X Ca_{1-X})_2 Si_5 N_8$:Eu) related to the present invention is illustrated, but is not limited to the present production process. Mn and O are contained in the above-mentioned phosphor.

Sr and Ca of a raw material are pulverized. Sr and Ca of a raw material are preferably used as a single body, but compounds such as an imide compound, an amide compound and the like can be used. Further, the Sr and Ca of a raw material may be those containing B, Al, Cu, Mg, $Al_2O_3$ and the like. The pulverization of the Sr and Ca of a raw material is carried out. It is preferable that the mean particle diameter of Sr and Ca obtained by the pulverization is about 0.1 μm to 15 μm, but is not limited to this range. The purity of Sr and Ca is preferably 2N or more, but is not limited to this range. After at least one or more among a metal Ca, a metal Sr and a metal Eu are made as an alloy condition, it is nitrided and pulverized, and then can be used as a raw material.

The Si of a raw material is pulverized. The Si of a raw material is preferably used as a single body, but a nitride compound, an imide compound, an amide compound and the like can be also used. For example, they are $Si_3N_4$, $Si(NH_2)_2$, $Mg_2Si$ and the like. The purity of the Si of a raw material is preferably 3N or more, but compounds such as $Al_2O_3$, Mg, a metal boride ($Co_3B$, $Ni_3B$, CrB), manganese oxide, $H_3BO_3$, $B_2O_3$, $Cu_2O$ and CuO may be contained. The pulverization of Si is carried out in like manner as the Sr and Ca of a raw material. It is preferable that the mean particle diameter of the Si compound is about 0.1 μm to 15 μm.

Then, the Sr and Ca of a raw material is nitrided in nitrogen atmosphere. The reaction formula is shown in Formulae 16 and 17.

$$3Sr+N_2 \rightarrow Sr_3N_2 \quad \text{(Formula 16)}$$

$$3Ca+N_2 \rightarrow Ca_3N_2 \quad \text{(Formula 17)}$$

Sr and Ca are nitrided at a temperature of 600 to 900° C. for about 5 hours in nitrogen atmosphere. Sr and Ca may be nitrided by mixing, and the respective one may be separately nitrided. The nitrides of Sr and Ca can be obtained thereby. The nitrides of Sr and Ca are preferably those having high purity, but those which are commercially available can be also used.

The Si of a raw material is nitrided in nitrogen atmosphere. The reaction formula is shown in Formula 18.

$$3Si+2N_2 \rightarrow Si_3N_4 \quad \text{[Formula 18]}$$

Silicone Si is also nitrided at a temperature of 800 to 1200° C. for about 5 hours in nitrogen atmosphere. The silicon nitride is obtained thereby. The silicon nitride used in the present invention is preferably those having high purity, but those which are commercially available can be also used.

The nitrides of Sr, Ca, or Sr—Ca are pulverized. The pulverization of the nitrides of Sr, Ca, or Sr—Ca is carried out.

Similarly, the nitride of Si is pulverized. Further, similarly, a Eu compound $Eu_2O_3$ is pulverized. Europium oxide is used as the Eu compound, but a metal europium, europium nitride and the like can be also used. Additionally, an imide compound and an amide compound can be used as the Z of a raw material. Europium oxide is preferably those having high purity, but those commercially available can be also used. The mean particle diameters of the nitrides of an alkali earth metal, silicone nitride and europium oxide after pulverization are about 0.1 μm to 15 μm.

At least one or more selected from a group consisting of Mg, Sr, Ca, Ba, Zn, B, Al, Cu, Mn, Cr, O and Ni may be contained in the above-mentioned raw materials. Further, the compounding amount of the above-mentioned elements such as Mg, Zn and B can be adjusted and mixed in the mixing process below. These compounds can be added alone in raw materials, but usually added in the form of compounds. This kind of compounds are $H_3BO_3$, $Cu_2O_3$, $MgCl_2$, $MgO.CaO$, $Al_2O_3$, a metal boride ($CrB$, $Mg_3B_2$, $AlB_2$, $MnB$), $B_2O_3$, $Cu_2O$, $CuO$ and the like.

After the above-mentioned pulverization, the nitrides of Sr, Ca, or Sr—Ca, silicone nitride and a Eu compound $Eu_2O_3$ are mixed and Mn is added thereto.

Finally, the mixture of the nitrides of Sr, Ca, or Sr—Ca, silicone nitride and a Eu compound $Eu_2O_3$ are baked in ammonia atmosphere. The phosphor represented by the $(Sr_XCa_{1-X})_2Si_5N_8$:Eu to which Mn was added can be obtained by baking. The reaction formula of the basic constituting elements by the baking is shown below.

$$(X/3)Sr_3N_2+((1.97-X)/3)Ca_3N_2+(5/3)Si_3N_4+\\(0.03/2)Eu_2O_3 \rightarrow Sr_XCa_{1.97-X}Eu_{0.03}Si_5N_{7.98}O_{0.045} \quad \text{[Formula 9]}$$

Provided that the composition of the objective phosphors can be changed by changing the compounding ratio of the respective raw materials.

The baking can be carried out at a baking temperature of 1200 to 1700° C., but a baking temperature of 1400 to 1700° C. is preferable. It is preferable that a temperature is gradually raised in the baking, and one step baking by which the baking is carried out at 1200 to 1500° C. for several hours is used, but there can be also used two step baking (multistage baking) by which the baking at the first step is carried out at 800 to 1000° C. is carried out and the baking at the second step is carried out at 1200 to 1500° C. is carried out. It is preferable to carry out the baking of the raw material of the phosphor using a crucible made of boron nitride (BN) material and a boat. A crucible made of alumina ($Al_2O_3$) material can be also used in addition to the crucible made of boron nitride material.

The objective phosphor can be obtained by using the above-mentioned production process.

In Example of the present invention, the nitride-base phosphor is used as the phosphor emitting reddish light, in particular, but in the present invention, the phosphor layer 303 containing the phosphor emitting reddish light other than the nitride-base phosphor can be also used. The phosphor emitting reddish light is a phosphor emitting light by being excited by light having a wave length of 400 to 600 nm, and for example, there are mentioned $Y_2O_2S$:Eu, $La_2O_2S$:Eu, CaS:Eu, SrS:Eu, ZnS:Mn, ZnCdS:Ag,Al, ZnCdS:Cu,Al and the like. The color rendering property of a light emitting device can be improved by combining the phosphor layer containing the YAG-base the phosphor and the phosphor layer containing emitting red light.

[LED Chips 302 and 304]

As the excitation light source of the phosphor in the present invention, various light sources which can excite the first phosphor and the second phosphor can be utilized. For example, there are mentioned a semiconductor light emitting element, a semiconductor laser element and the like which are typically represented by LED chips. In particular, in the present mode 8 of operation, the light emitting element being the light source which excites the first phosphor and the second phosphor is the LED chips 302 and 304. Alternatively, as the another mode of operation of the present invention, a light source formed by combining the light emitting element which can emit ultraviolet light with the phosphor which absorbs the ultraviolet light and emits light having a different wave length may be used as the light source which excites the first phosphor and the second phosphor. For example, the LED chip emitting ultraviolet light and the phosphor which absorbs the ultraviolet light and emits light at a blue region are combined to make the excitation light source, and there may be formed the light emitting device in which the first phosphor in which the excitation light source excites and emits light at a red region and the second phosphor in which the excitation light source excites and emits light at a green to yellow region are arranged in order from the excitation light source side. By being constituted thus, there can be formed the light emitting device which improved the color rendering property utilizing the LED chip emitting ultraviolet light because the light emitted from the second phosphor is not absorbed by the first phosphor.

As the present mode 8 of operation, when the first phosphor, the second phosphor and the light emitting element are combined and the light emitting device which color-mixes the wave length-converted light by exciting those phosphors to emit is made, the LED chips which emit light having a wave length which can excite the phosphors are used. The LED chips are prepared by forming GaAs InP, GaAlAs, InGaAlP, InP, AlN, GaN, InGaN, AlGaN, InGaAlN and the like on a substrate, as the luminescence layer by an MOCVD method and the like. As the structure of the semiconductor, there are mentioned homo structures having an MIS junction, a PIN junction, a PN junction and the like; a hetero structure, a double hetero structure and the like. The luminescence wave length can be variously selected depending on the material of the semiconductor and the degree of mix crystal thereof. Further, the semiconductor active layer can be made as a mono quantum well structure and a multi quantum well structure by which the layer was formed so that a quantum effect is generated. The semiconductor is preferably a nitride-base phosphor semiconductor which can efficiently excite a semiconductor and can efficiently emit light having a comparatively short wave length (the general formula: $In_iGa_jAl_kN$, provided that $0 \leq i$, $0 \leq j$, $0 \leq k$, $i+j+k=1$).

When the gallium nitride compound semiconductor is used, materials such as sapphire, spinel, SiC, Si, ZnO and GaN are preferably used for a semiconductor substrate. It is more preferably to use a sapphire substrate in order to form the GaN having good crystallinity. When a semiconductor film is formed on the sapphire substrate, it is preferable that buffer layers such as GaN and AlN are formed and the gallium nitride semiconductor having a PN junction is formed on the buffer layer. Further, as the substrate, there can be also utilized a GaN single crystal itself which was selectively grown on the sapphire substrate using $SiO_2$ as a mask. In this case, the light emitting element and the sapphire substrate can be also separated by removing $SiO_2$ by etching after formation of the respective semiconductor layers. The gallium nitride compound semiconductor exhibits an n-type electric conductibility in a condition in which an impurity is not doped. When a desired n-type gallium nitride semiconductor which improves luminescence efficiency and the like is formed, it is preferable to suitably introduce Si, Ge, Se, Te, C and the like as an n-type dopant. On the other hand, when a P-type gallium nitride semiconductor is formed, Zn, Mg, Be, Ca, Sr, Ba and the like which are a P-type dopant are doped.

Since the gallium nitride compound semiconductor is hardly converted to a P-type by only doping a P-type dopant, it is preferable that the semiconductor is converted to a P-type by annealing by heating by a furnace, low speed electron beam radiation, plasma radiation and the like after introduction of the P-type dopant. As the specific layer constitution of the light emitting element, there are preferably mentioned those in which an n-type contact layer being the gallium nitride semiconductor, an n-type dad layer being the aluminum-gallium nitride semiconductor, an active layer being indium-gallium nitride semiconductor in which Zn and Si were doped, a P-type clad layer being the aluminum-gallium nitride semiconductor, and a P-type contact layer being the gallium nitride semiconductor were laminated on the sapphire substrate and a silicon carbide having a buffer layer which formed the gallium nitride, aluminum nitride and the like at low temperature. In order to form the LED chip 302, the respective electrodes having desired forms are formed after forming the exposed face of the P-type semiconductor and the n-type semiconductor by etching and the like on a semiconductor substrate, using a spattering method, a vacuum evaporation method and the like, in case of the LED chip 302 having the sapphire substrate. In case of the SiC substrate, a pair of electrodes can be also formed utilizing the electric conductibility of the substrate.

Then, the semiconductor wafer and the like which were formed are directly and fully cut by a dicing saw in which a blade having an edge made of diamond is rotated, or the semiconductor wafer is broken by an external force after cutting (half cut) a groove having a broader width than the edge width. Alternatively, after very fine scribe lines (meridian), for example, are drawn in a cross-cut shape on the semiconductor wafer by a scriber in which a diamond needle at the edge goes back and force linearly, the semiconductor wafer is broken by an external force, and it is cut into a chop shape from the semiconductor wafer. The LED chip 302 being the nitride compound semiconductor can be formed thus.

In the light emitting device of the present invention which excites the phosphor to emit light, the luminescence peak wave length of the LED chip can be made as 350 nm or more and 530 nm or less considering the excitation absorption wave length of the phosphor.

Further, the light emitting device capable of freely adjusting the color temperature of the color mix light can be made by individually making the respective luminescence outputs of the LED chip 302 and the LED chip 304 controllable and by controlling the degree of color mixing of the lights which were emitted by the wave length conversion by the first phosphor and the second phosphor.

[Electroconductive Wire 310]

As the electroconductive wire 310, there are required those having good ohmic property with the electrodes of the LED chip, mechanical connecting property, electric conductibility and thermal conductivity. As the thermal conductivity, 0.01 cal/(s)(cm$^2$)($^\circ$ C./cm) or more is preferable and 0.5 cal/(s) (cm$^2$)($^\circ$ C./cm) or more is more preferable. Further, considering the workability and the like, the diameter of the electroconductive wire is preferably Φ10 μm or more and Φ45 μm or less. In particular, the electroconductive wire tends to be broken down at the interface between the coating member containing the phosphor and the molding member not containing the phosphor. It is considered that the wire tends to be broken down because the substantial quantity of thermal expansion is different because of the mixing of the phosphors even if the same material is respectively used. Accordingly, the diameter of the electroconductive wire is more preferably 25 μm or more and 35 μm or less is more preferable from the viewpoint of a luminescence area and an easy handling.

As the electroconductive wire, there are specifically mentioned electroconductive wires using metals such as gold, copper, platinum and aluminum, and an alloy thereof. The electroconductive wire can easily connect the electrodes of the respective LED chips with the inner lead and the mount lead by a wire bonding equipment.

[Package 308]

The package 308 in the present mode 8 of operation has the first concave portion 301 mounting the LED chip 302 and the first phosphor layer 303 and the second concave portion mounting the LED chip 304 and the second phosphor layer 306. Further, the one pair of positive and negative lead electrodes 309 which supply electric power to the LED chip are integrally molded in the portion of the package. As shown in FIG. 74, it is preferable that the first concave portion 301 is formed at the more inner part which is the reverse direction against the face of observing luminescence than the bottom face of the second concave portion 305 to which the LED chip 304 is mounted. Alternatively, the first concave portion 301 having a cup shape may be provided in the second concave portion 305 and on the same bottom face to which the LED chip 304 is mounted. In the another mode of operation, the LED chip 304 is mounted through a spacer on the same face to which the LED chip 302 is mounted, and the LED chip 302 may be mounted at a position nearer to the bottom face of the concave portion by the thickness of the spacer than the LED chip 304. Further, in the alternative mode of operation, after the first phosphor layer 303 is formed against the surface of the face side of observing luminescence of the LED chip 302 by a screen printing or a coating method using a spray, it may be mounted on the bottom face of the concave portion. It is possible to surely cover only the desired LED chip 302 with the forming material of the phosphor layer containing the red color-base phosphor by setting as mentioned above. Further, since the light which was emitted from the phosphor contained in the second phosphor layer 306 and is oriented to the direction of the face of observing luminescence is not absorbed by the red color-base phosphor, the light emitting device which improved the color rendering property can be made.

The package 308 can be comparatively and simply formed by a transfer molding, an insert molding and the like. As the thermoplastic material of the package, there can be used thermoplastic resins such as an aromatic nylon-base resin, a poly(phthalamide) resin (PPA), a sulfone-base resin, a poly (amide-imide) resin (PAI), a polyketone resin (PK), a polycarbonate resin, a poly(phenylene sulfide) (PPS), a liquid crystal polymer (LCP), an ABS resin, a resin and a PBT resin, etc. Further, those obtained by containing a glass fiber in these thermoplastic resins may be used as the thermoplastic material. It is possible to form a package having high rigidity and high strength by containing a glass fiber. Hereat, the first concave portion and the second concave portion can be formed by an integral molding at molding the package using a molding mold.

Further, the package can be formed using a metal material. In this case, the concave portions can be easily formed by carrying out a pressuring processing, and the lead electrodes are formed at the portion of the package through an insulating member. The light emitting device which improved the heat discharging property can be made by using the metal material as the package material.

The adhesion of the LED chips in the concave portions of the package can be carried out by an insulating adhesive such as a thermosetting resin. Specifically, an epoxy resin, an acrylic resin and the like are mentioned. Further, an Ag paste, a carbon paste, a metal bump, a eutectic solder and the like can be used in order to design electrical conduction with the lead electrodes from the face down bonding which is a mounting method of connecting the electrode faces of the LED chips against the lead electrodes. Further, in order to improve the light utilization efficiency of the light emitting diodes, the surface of the mount lead to which the LED chips are arranged is made as a mirror shape, and reflection function may be bestowed to the surface. The surface roughness is preferably 0.1 S or more and 0.8 S or less.

[Lead Electrode 309]

The one pair of positive and negative lead electrodes used in the present mode 8 of operation supply electric power to the LED chips and are formed in the portion of the package 308 through the insulating member in accordance with requirement. As the alternative mode of operation, the first concave portion and the second concave portion are directly provided against either of the one pair of positive and negative lead electrodes, and the LED chip may be mounted through an insulating adhesive. The specific electric resistance of the lead electrode is preferably 300 $\mu\Omega$-cm or less and more preferably 3 $\mu\Omega$-cm or less. Further, when a plural number of LED chips are mounted on the lead electrodes, it is required that the thermal conductivity is good because the quantity of heat emission from the LED chips is increased. Specifically, 0.01 cal/(s)(cm$^2$)($°$ C./cm) or more is preferable and 0.5 cal/(s)(cm$^2$)($°$ C./cm) or more is more preferable. As the material satisfying the condition, there are mentioned iron, copper, iron in copper, tin in copper, ceramics with metallized patterns and the like.

[Mount Lead 402]

Figure 76:
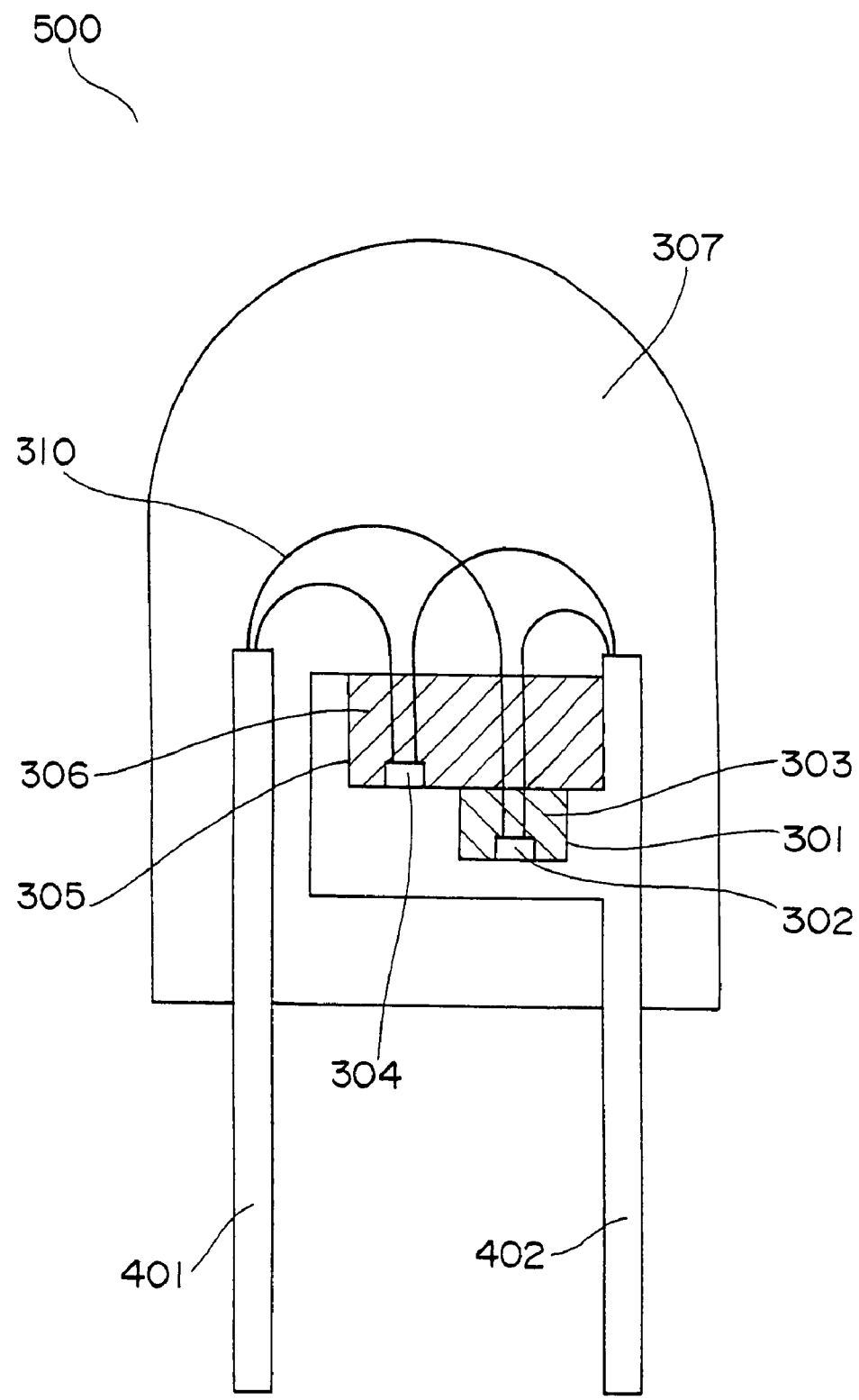
FIG. 76 is a typical section view of the light emitting diode related to the present invention.

The mount lead 402 in the present mode 8 of operation has the first concave portion 301 and the second concave portion 305 which arrange the LED chip 302 and the LED chips 304 as shown in FIG. 76, and it is enough to have a size for mounting the die-bonding equipment and the like. As shown in FIG. 76, it is preferable that the first concave portion 301 is formed at the more inner part which is the reverse direction against the face of observing luminescence than the bottom face of the second concave portion 305 to which the LED chip 304 is mounted. Alternatively, the first concave portion having a cup shape may be provided in the second concave portion 305 and on the same bottom face to which the LED chip 304 is mounted. In the another mode of operation, the LED chip 304 is mounted through a spacer on the same face to which the LED chip 302 is mounted, and the LED chip 302 may be mounted at a position nearer to the bottom face of the concave portion by the thickness of the spacer than the LED chip 304. Further, in the alternative mode of operation, after the first phosphor layer 303 is formed against the surface of the face side of observing luminescence of the LED chip 302 by a screen printing or a coating method using a spray, it may be mounted on the bottom face of the concave portion. It is possible to surely cover only the desired LED chip 302 with the forming material of the phosphor layer containing the red color-base phosphor by setting as mentioned above. Further, when a plural number of the LED chips are mounted and the mount lead is utilized as the common electrode of the LED chip, an adequate electric conductibility and the connecting property with bonding wires and the like are required.

The adhesion of the LED chips 302 and 304 with the cup of the mount lead 402 can be carried out by a thermosetting resin and the like. Specifically, an epoxy resin, an acrylic resin and the like are mentioned. Further, they are adhered with the mount lead by a face down LED chip and the like, and an Ag paste, a carbon paste, a metal bump and the like can be used in order to electrical connection. Further, in order to improve the light utilization efficiency of the light emitting diodes, the surface of the mount lead to which the LED chips are arranged is made as a mirror shape, and reflection function may be bestowed to the surface. The surface roughness is preferably 0.1 S or more and 0.8 S or less. Further, the specific electric resistance of the mount lead is preferably 300 $\mu\Omega$-cm or less and more preferably 3 $\mu\Omega$-cm or less. Further, when a plural number of LED chips are mounted on the mount lead, it is required that the thermal conductivity is good because the quantity of heat emission from the LED chips is increased. Specifically, 0.01 cal/(s)(cm$^2$)($°$ C./cm) or more is preferable and 0.5 cal/(s)(cm$^2$)($°$ C./cm) or more is more preferable. As the material satisfying these conditions, there are mentioned iron, copper, iron in copper, tin in copper, ceramics with metallized patterns and the like. When these metals are used, the first concave portion and the second concave portion can be formed by processing by a mold for molding, a extrusion pressuring processing and the like.

[Inner Lead 401]

The inner lead 401 is designed to connect the LED chip 302 which was arranged on the mount lead 402 with the electro-conductive wire 310. When a plural number of LED chips are provided on the mount lead, it is required that a constitution in which the respective electroconductive wires can be arranged so as to not being mutually contacted is made. Specifically, the contact of the electroconductive wire which is connected with the inner lead which is further separated from the mount lead can be prevented by enlarging the area of the edge face to which the inner lead is wire-bonded, in accordance with leaving from the mount lead. The roughness of the connection edge face with the electroconductive wire is preferably 1.6 S or more and 10 S or less considering adhesion. In order to form the edge portion of the inner lead in various shapes, it may be formed by previously determining the shape of the lead frame by a frame to punch out, or may be formed by shaving the portion of the upper part of the inner leads after all of the inner leads are formed. Further, after the inner lead was formed by punching, the desired area of edge face and the height of edge face can be simultaneously formed by pressuring from the direction of the edge face.

It is required that the inner lead has good connecting property and electric conductibility with the bonding wire and the like which are an electroconductive wire. The specific electric resistance is preferably 300 μΩ-cm or less and more preferably 3 μΩ-cm or less. As the material satisfying the condition, there are mentioned iron, copper, iron in copper, tin in copper; aluminum, iron and copper which are plated with copper, gold and silver and the like.

[Phosphor Layer 303, 306]

The first phosphor layer 303 and the second phosphor layer 306 in the present mode 8 of operation cover the LED chips in the concave portions provided in the package, and the red color-base phosphor which converts the luminescence of the LED chips, and the YAG-base phosphor are respectively contained in them. As the specific material of the phosphor layers, there are preferably used transparent resins excellent in weather resistance such as an epoxy resin, a urea resin and a silicone resin; transparent inorganic materials excellent in light resistance such as silica sol and glass. Further, a diffusing agent may be contained together with the phosphor. As the specific diffusing agent, there are preferably used barium titanate, titanium oxide, aluminum oxide, silicon oxide, calcium carbonate, silicon dioxide, and the like.

[Molding Member 307]

The molding member 307 can be provided for protecting the LED chips 302 and 304, the electroconductive wire 110 and the phosphor layer in which the phosphor was contained, from the external environment. The molding member 307 can be formed generally using a resin. Further, a visual angle can be increased by containing the phosphor, but the directionality from the LED chips is reduced by containing a diffusing agent in the resin mold, and the visual angle can be further increased. Further, a lens effect for focusing and diffusing luminescence from the LED chips can be bestowed by making the molding member 307 be a desired shape. Accordingly, the molding member 307 may be a structure in which a plural number of layers were laminated. Specifically, it is a convex lens shape, a concave lens shape, further an elliptical shape viewed from the face of observing luminescence, and a shape which combined a plural number of the shapes. As the specific material of the molding member 307, there are preferably used transparent resins excellent in weather resistance such as an epoxy resin, a urea resin and a silicone resin; transparent inorganic materials excellent in light resistance such as silica sol and glass. Further, a diffusing agent may be contained together with the phosphor. As the specific diffusing agent, there are preferably used barium titanate, titanium oxide, aluminum oxide, silicon oxide, calcium carbonate, silicon dioxide, and the like. Further, the molding member and the phosphor layer may be formed by the same member considering a refractive index, and for example, may be formed using a silicone resin. In the invention of the present application, it can cover the coloration of the phosphor viewed from the face of observing luminescence that the molding member contains a diffusing agent and a coloring agent. Further, the coloration of the phosphor is that the phosphor of the invention of the present application absorbs a blue component among lights from strong external light and emits light. Accordingly, it is observed to be colored yellow. In particular, the colored portion is occasionally magnified depending on the shape of the molding member such as a convex shape. The coloration is occasionally not preferable on designing. The diffusing agent contained in the molding member colors the molding member in a milky white color, and the colorant colors in a desired color, therefore the coloring can be invisible. Accordingly, the color of the phosphor is not observed from the face side of observing luminescence.

Further, when the main luminescence wave length of light emitted from the LED chip is 430 nm or more, it is preferable from the viewpoint of weather resistance that an ultraviolet absorbing agent being a light stabilizer is contained in the molding member.

EXAMPLES

The phosphor and light emitting device related to the present invention are illustrated below according to Examples, but not limited to these Examples.

Further, temperature characteristic is shown by a relative brightness in which the luminescence brightness at 25° C. is 100%, in Examples below.

Further, the particle diameter is a value obtained by an air transmission method called as F.S.S.S.No. (Fisher Sub Sieve Sizer's No.).

Further, afterglow is measured by switching off the lamp of an excitation light source after irradiating light of 253.7 nm at room temperature (20° C.) for a fixed time. The basis of time is that the time of the instance of switching off the lamp of the excitation light source is defined as zero. When the brightness during irradiation of the excitation light source is set as the brightness basis of 100%, a time required for the brightness being quenched to 1/10 is measured. The afterglow property is determined by making the measurement result as a basis.

Examples 1 to 80

The phosphors of Examples 1 to 80 are the phosphor related to the mode 1 of operation.

Table 1 shows the properties of the nitride phosphor of Examples 1 to 80 related to the present invention.

Figure 5:
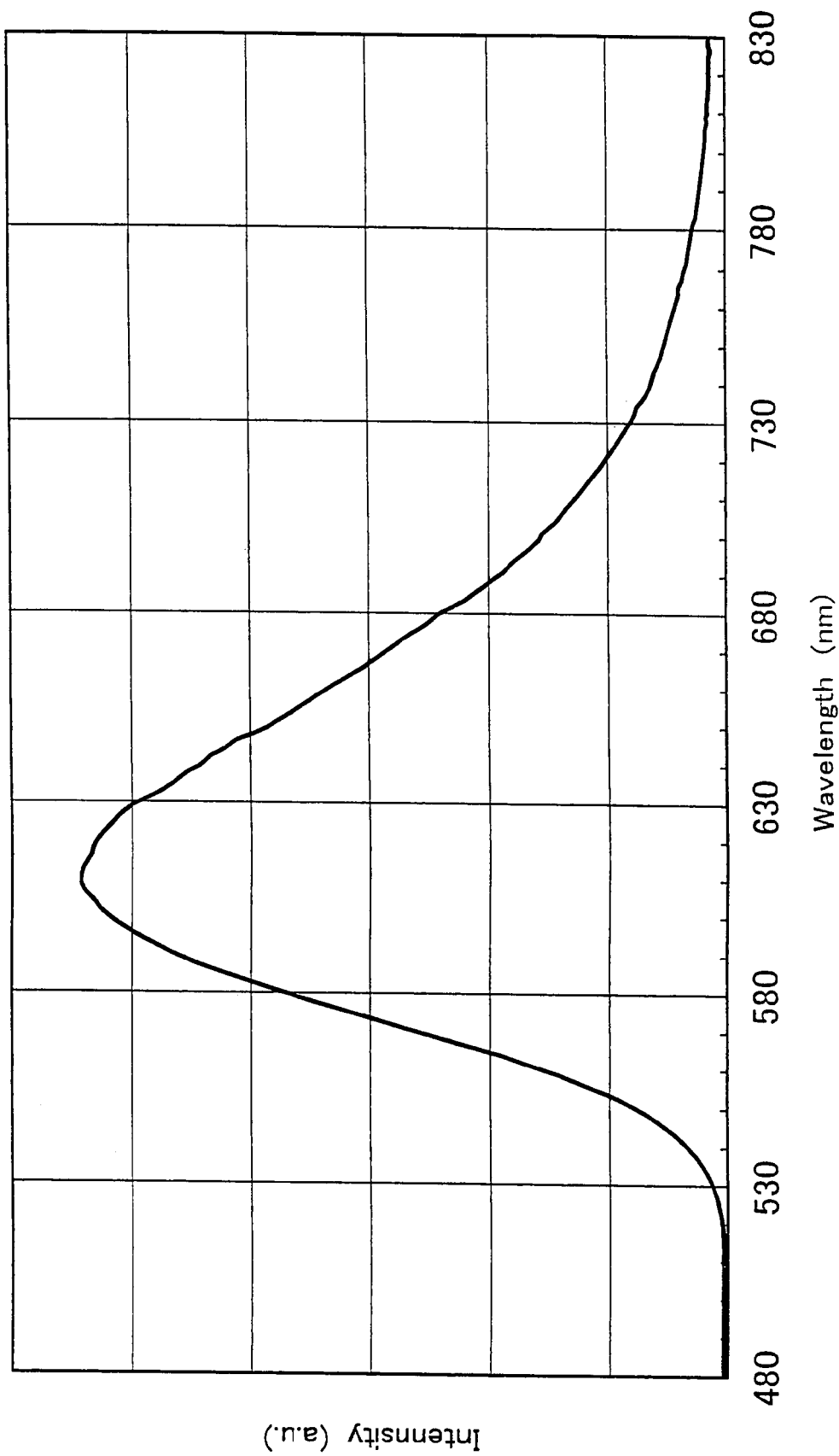
FIG. 5 is a chart showing the luminescence spectrum when the nitride phosphor of Example 60 related to the present invention was excited at Ex=460 nm.
Figure 6:
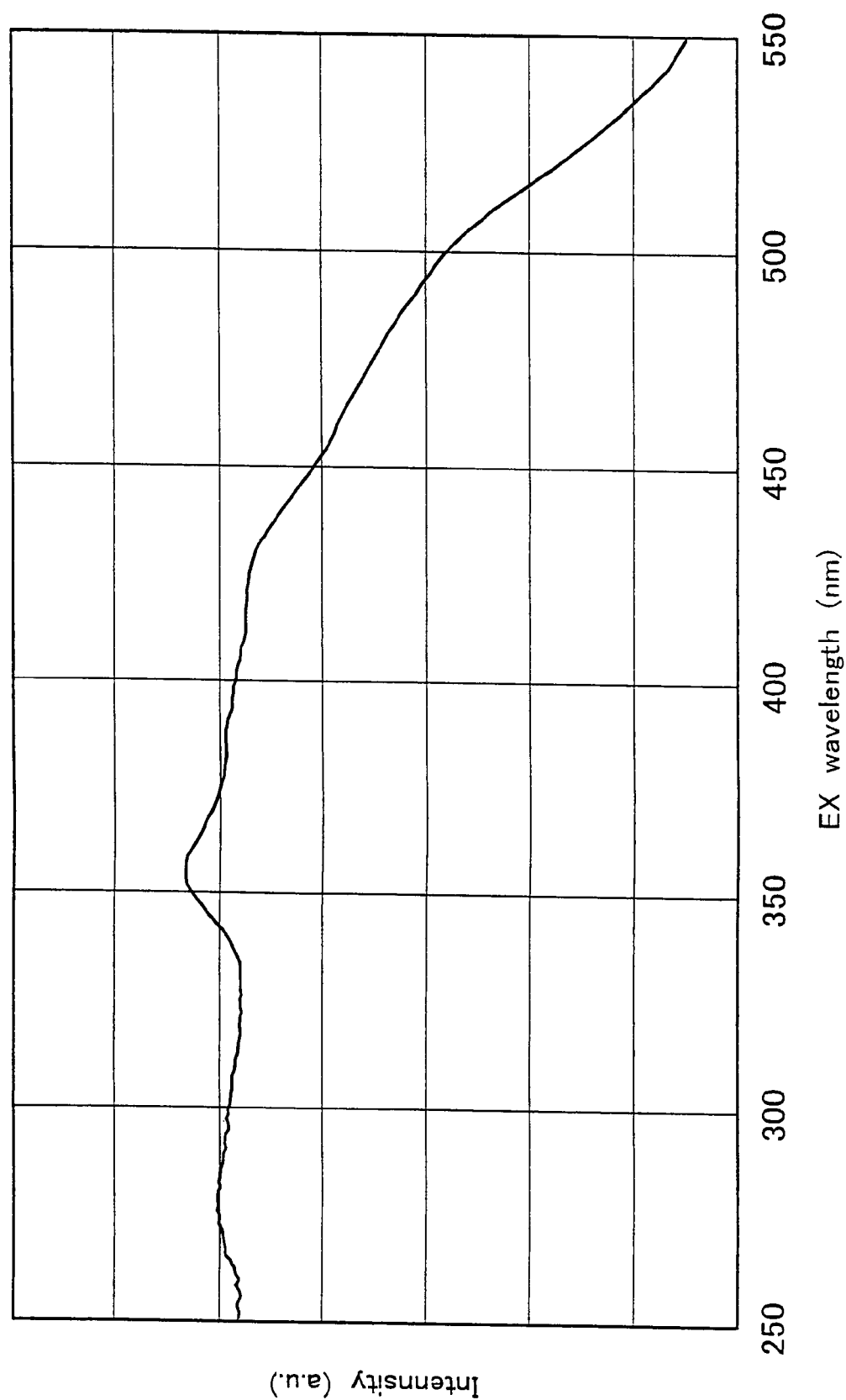
FIG. 6 is a chart showing the excitation spectrum of the phosphor of Example 60.

Further, FIG. 5 is a drawing showing a luminescence spectrum when the nitride phosphor of Example 60 was excited at Ex=460 nm. FIG. 6 is a drawing showing the excitation spectrum of the nitride phosphor of Example 60. FIG. 7 is a drawing showing the reflection spectrum of the nitride phosphor of Example 60.

TABLE 1

| | Element | Addition amount (ppm) | Molecular weight of addition source | Reagent maker | | Molecular weight of element | Color tone x | Color tone y | Brightness Y(%) | Quantum efficiency Q(%) | Particle diameter (μm) | After-glow (msec) | Temperature Characteristics 100° C. | Temperature Characteristics 200° C. |
|---|---|---|---|---|---|---|---|---|---|---|---|---|---|---|
| 1 | Li | 100 | LiOH•H₂O 41.96 | Wako Reagent super-high grade | 124-01212 | 6.94 | 0.585 | 0.407 | 205.5 | 211.8 | 2.5 | 28 | 95.4 | 65.5 |
| 2 | Li | 500 | LiOH•H₂O 41.96 | Wako Reagent super-high grade | 124-01212 | 6.94 | 0.585 | 0.407 | 196.2 | 201.8 | 2.3 | 30 | | |
| 3 | Na | 100 | Na₂CO₃ 105.99 | Wako Reagent super-high grade | 197-01585 | 22.99 | 0.584 | 0.406 | 210.9 | 215.9 | 2.6 | 14 | 97.1 | 70.3 |
| 4 | Na | 500 | Na₂CO₃ 105.99 | Wako Reagent super-high grade | 197-01585 | 22.99 | 0.585 | 0.406 | 215.5 | 221.4 | 2.7 | 22 | | |
| 5 | K | 100 | K₂CO₃ 138.21 | Wako Reagent super-high grade | 162-03495 | 39.1 | 0.585 | 0.406 | 209.8 | 216.4 | 2.5 | 24 | 96.1 | 66.1 |
| 6 | K | 500 | K₂CO₃ 138.21 | Wako Reagent super-high grade | 162-03495 | 39.1 | 0.585 | 0.407 | 210.2 | 216.4 | 2.6 | 26 | | |
| 7 | Rb | 100 | RbCl 120.92 | Wako Reagent super-high grade | 187-00321 | 8542 | 0.585 | 0.407 | 217.1 | 221.6 | 2.4 | 22 | 96.6 | 69.5 |
| 8 | Rb | 500 | RbCl 120.92 | Wako Reagent super-high grade | 187-00321 | 8542 | 0.584 | 0.407 | 205.1 | 209.8 | 2.5 | 30 | | |
| 9 | Cs | 100 | CsCl 168.36 | Wako Reagent super-high grade | 035-01952 | 132.91 | 0.585 | 0.407 | 192.6 | 183.1 | 2.2 | 18 | 94.3 | 66.4 |
| 10 | Cs | 500 | CsCl 168.36 | Wako Reagent super-high grade | 035-01952 | 132.91 | 0.585 | 0.407 | 202.0 | 192.0 | 2.5 | 18 | | |
| 11 | Mg | 100 | MgNO₃)₂ 5.5% | Wako Reagent super-high grade | 134-00255 | 24.31 | 0.586 | 0.407 | 215.5 | 220.5 | 2.7 | 22 | 85.5 | 66.5 |
| 12 | Mg | 500 | MgNO₃)₂ 5.5% | Wako Reagent super-high grade | 134-00255 | 24.31 | 0.586 | 0.406 | 216.0 | 221.6 | 2.8 | 32 | | |
| 13 | Sr | 100 | SrCl₂•6H₂O 266.64 | Wako Reagent super-high grade | 197-04185 | 87.62 | 0.586 | 0.406 | 212.4 | 202.3 | 2.5 | 22 | 97.3 | 70.8 |
| 14 | Sr | 500 | SrCl₂•6H₂O 266.64 | Wako Reagent super-high grade | 197-04185 | 87.62 | 0.584 | 0.407 | 206.7 | 195.9 | 2.5 | 26 | | |
| 15 | Ba | 100 | BaCl₂•2H₂O 244.26 | Wako Reagent super-high grade | 029-00175 | 137.33 | 0.587 | 0.405 | 224.8 | 231.9 | 2.7 | 18 | 97.5 | 72.1 |
| 16 | Ba | 500 | BaCl₂•2H₂O 244.26 | Wako Reagent super-high grade | 029-00175 | 137.33 | 0.586 | 0.407 | 215.5 | 220.0 | 2.6 | 20 | | |
| 17 | Ti | 100 | TiOSO₄•H₂O 177.98 | Kishida Chemical Co., Ltd | 020-78905 | 47.9 | 0.585 | 0.409 | 218.2 | 222.1 | 2.8 | 14 | 98.1 | 65.7 |
| 18 | Ti | 500 | TiOSO₄•H₂O 177.98 | Kishida Chemical Co., Ltd | 020-78905 | 47.9 | 0.584 | 0.409 | 208.4 | 212.3 | 3.2 | 14 | | |
| 19 | Zr | 100 | ZrO(NO₃)₂ 267.3 | Mitsuwa Chemical Co., Ltd. | | 91.22 | 0.586 | 0.407 | 214.9 | 221.0 | 2.6 | 20 | 98.4 | 74.4 |
| 20 | Zr | 500 | ZrO(NO₃)₂ 267.3 | Mitsuwa Chemical Co., Ltd. | | 91.22 | 0.586 | 0.408 | 206.7 | 221.8 | 2.7 | 34 | | |
| 21 | Hf | 100 | HfCl₄ 320.3 | Mitsuba Kagaku | NO 51872 | 178.49 | 0.584 | 0.407 | 193.6 | 198.2 | 2.5 | 30 | 93.4 | 61.2 |
| 22 | Hf | 500 | HfCl₄ 320.3 | Mitsuba Kagaku | NO 51872 | 178.49 | 0.583 | 0.408 | 192.0 | 194.5 | 2.5 | 30 | | |
| 23 | V | 100 | VCl₃ 157.30 | Wako Reagent super-high grade | 221-00452 | 50.94 | 0.585 | 0.407 | 214.9 | 220.5 | 3.1 | 26 | 97.9 | 69.9 |
| 24 | V | 500 | VCl₃ 157.30 | Wako Reagent super-high grade | 221-00452 | 50.94 | 0.582 | 0.411 | 164.7 | 166.5 | 3.1 | 26 | | |
| 25 | Nb | 100 | Nb₂O₅ 265.8 | Wako Reagent super-high grade | 144-05332 | 92.91 | 0.584 | 0.408 | 190.7 | 193.8 | 2.5 | 26 | 98.2 | 71.2 |
| 26 | Nb | 500 | Nb₂O₅ 265.8 | Wako Reagent super-high grade | 144-05332 | 92.91 | 0.583 | 0.409 | 191.1 | 192.7 | 2.3 | 26 | | |
| 27 | Ta | 100 | TaCl₅ 358.21 | Kishida Chemical Co., Ltd | 020-76055 | 180.95 | 0.585 | 0.408 | 218.2 | 222.8 | 2.5 | 26 | 99.1 | 74.8 |
| 28 | Ta | 500 | TaCl₅ 358.21 | Kishida Chemical Co., Ltd | 020-76055 | 180.95 | 0.583 | 0.411 | 190.9 | 192.0 | 2.6 | 18 | | |
| 29 | Cr | 100 | Cr(NO₃)₃•9H₂O 400.14 | Wako Reagent super-high grade | 033-03175 | 52 | 0.582 | 0.411 | 167.6 | 169.7 | 2.7 | 18 | 96.5 | 64.6 |
| 30 | Cr | 500 | Cr(NO₃)₃•9H₂O 400.14 | Wako Reagent super-high grade | 033-03175 | 52 | 0.579 | 0.412 | 100.0 | 100.0 | 2.6 | 10 | | |
| 31 | Mo | 100 | H₂MoO₄ 179.98 | NAKARAI Chemical | | 95.94 | 0.583 | 0.402 | 197.3 | 200.2 | 2.6 | 12 | 93.6 | 58.6 |
| 32 | Mo | 500 | H₂MoO₄ 179.98 | NAKARAI Chemical | | 95.94 | 0.581 | 0.410 | 174.3 | 175.4 | 2.5 | 20 | | |
| 33 | W | 100 | H₂WO₄ 249.88 | Wako Reagent super-high grade | 209-03452 | 183.85 | 0.584 | 0.409 | 208.6 | 213.4 | 2.6 | 32 | 97.9 | 72.7 |
| 34 | W | 500 | H₂WO₄ 249.88 | Wako Reagent super-high grade | 209-03452 | 183.85 | 0.584 | 0.409 | 187.8 | 190.4 | 2.9 | 22 | | |
| 35 | Re | 100 | ReCl₅ 363.47 | Mitsuba Kagaku | NO 58374 | 186.2 | 0.584 | 0.407 | 207.8 | 211.8 | 2.9 | 22 | 98.2 | 71.2 |
| 36 | Re | 500 | ReCl₅ 363.47 | Mitsuba Kagaku | NO 58374 | 186.2 | 0.583 | 0.409 | 193.6 | 196.1 | 2.4 | 22 | | |
| 37 | Fe | 100 | FeCl₃•3H₂O 270.3 | Wako Reagent super-high grade | 9-87 | 55.85 | 0.581 | 0.410 | 149.9 | 152.2 | 2.5 | 22 | 93.7 | 65.6 |
| 38 | Fe | 500 | FeCl₃•3H₂O 270.3 | Wako Reagent super-high grade | 9-87 | 55.85 | 0.580 | 0.411 | 113.5 | 114.8 | 2.4 | 32 | | |
| 39 | Co | 100 | Co(NO₃)₃•6H₂O 291.03 | Wako Reagent super-high grade | 035-03755 | 58.93 | 0.585 | 0.409 | 177.4 | 180.9 | 2.4 | 42 | 99.6 | 79.6 |
| 40 | Co | 500 | Co(NO₃)₃•6H₂O 291.03 | Wako Reagent super-high grade | 035-03755 | 58.93 | 0.581 | 0.411 | 151.0 | 152.2 | 2.6 | 16 | | |
| 41 | Ir | 100 | IrCl₃ 298.57 | Wako Reagent super-high grade | 096-01601 | 192.22 | 0.583 | 0.410 | 195.7 | 200.3 | 2.7 | 18 | 96.5 | 67.7 |
| 42 | Ir | 500 | IrCl₃ 298.57 | Wako Reagent super-high grade | 096-01601 | 192.22 | 0.581 | 0.410 | 183.7 | 186.5 | 2.6 | 22 | | |
| 43 | Ni | 100 | NiCl₂•6H₂O 237.72 | Wako Reagent super-high grade | 141-01062 | 58.71 | 0.582 | 0.410 | 163.0 | 165.6 | 2.4 | 22 | 97.5 | 70.1 |
| 44 | Ni | 500 | NiCl₂•6H₂O 237.72 | Wako Reagent super-high grade | 141-01062 | 58.71 | 0.580 | 0.411 | 112.0 | 113.4 | 2.7 | 12 | | |
| 45 | Pd | 100 | PdCl₂ 177.31 | Wako Reagent super-high grade | 162-00053 | 106.42 | 0.583 | 0.409 | 191.0 | 193.6 | 2.8 | 20 | 98.3 | 72.5 |
| 46 | Pd | 500 | PdCl₂ 177.31 | Wako Reagent super-high grade | 162-00053 | 106.42 | 0.582 | 0.410 | 166.5 | 168.4 | 2.5 | 22 | 98.6 | 73.0 |

TABLE 1-continued

| | Element | Addition amount (ppm) | addition source | Molecular weight of addition source | Reagent maker | Molecular weight of element | Color tone x | Color tone y | Brightness Y(%) | Quantum efficiency Q(%) | Particle diameter (μm) | After-glow (msec) | Temperature Characteristics 100° C. | 200° C. |
|---|---|---|---|---|---|---|---|---|---|---|---|---|---|---|
| 47 | Pt | 100 | H$_2$PtCl$_6$•6H$_2$O | 517.90 | Wako Reagent super-high grade 169-02861 | 195.08 | 0.582 | 0.411 | 194.7 | 197.7 | 2.5 | 24 | 98.1 | 72.0 |
| 48 | Pt | 500 | | | | | 0.581 | 0.410 | 181.6 | 183.8 | 2.4 | 24 | | |
| 49 | Ru | 100 | RuCl$_3$•2H$_2$O | 244.2 | Kishida Chemical Co., Ltd 020-68601 | 101.07 | 0.584 | 0.407 | 205.5 | 209.8 | 2.5 | 20 | 97.9 | 69.8 |
| 50 | Ru | 500 | | | | | 0.582 | 0.409 | 173.8 | 175.4 | 2.5 | 28 | | |
| 51 | Cu | 100 | Cu(CH$_3$COO)$_2$•H$_2$O | 199.65 | Wako Reagent super-high grade 3-402 | 63.54 | 0.586 | 0.406 | 214.9 | 193.6 | 2.6 | 24 | 97.8 | 70.6 |
| 52 | Cu | 500 | | | | | 0.586 | 0.406 | 208.2 | 168.3 | 2.2 | 32 | | |
| 53 | Ag | 100 | Ag(NO$_3$) | 169.8 | Wako Reagent super-high grade 198-00835 | 107.8 | 0.585 | 0.406 | 205.1 | 220.7 | 2.3 | 24 | 96.7 | 68.1 |
| 54 | Ag | 500 | | | | | 0.585 | 0.407 | 204.7 | 214.1 | 2.2 | 26 | | |
| 55 | Au | 100 | HAuCl$_4$•4H$_2$O | 411.9 | Wako Reagent super-high grade 077-00931 | 196.97 | 0.584 | 0.407 | 205.1 | 210.9 | 2.2 | 22 | 98.2 | 71.2 |
| 56 | Au | 500 | | | | | 0.583 | 0.409 | 204.7 | 209.8 | 2.4 | 24 | | |
| 57 | Zn | 100 | Zn(NO$_3$)$_2$•6H$_2$O | 297.49 | Wako Reagent super-high grade 265-01032 | 65.37 | 0.585 | 0.407 | 208.6 | 213.7 | 2.6 | 20 | 93.2 | 63.0 |
| 58 | Zn | 500 | | | | | 0.584 | 0.408 | 195.8 | 200.0 | 2.3 | 22 | | |
| 59 | B | 100 | H$_3$BO$_3$ | 61.84 | Wako Reagent super-high grade 021-02195 | 10.81 | 0.588 | 0.405 | 234.6 | 244.6 | 3.1 | 20 | 96.9 | 69.9 |
| 60 | B | 500 | | | | | 0.588 | 0.405 | 237.9 | 248.1 | 3.3 | 22 | | |
| 61 | Al | 100 | Al(NO$_3$)$_3$•9H$_2$O | 375.14 | Wako Reagent super-high grade 018-01945 | 26.98 | 0.585 | 0.407 | 181.2 | 186.3 | 2.5 | 22 | 95.7 | 68.1 |
| 62 | Al | 500 | | | | | 0.586 | 0.407 | 191.1 | 196.1 | 2.7 | 26 | | |
| 63 | Ga | 100 | GaCl$_3$ | 176.09 | Nichia Corporation | 69.72 | 0.585 | 0.407 | 213.3 | 218.5 | 2.5 | 24 | 97.1 | 68.2 |
| 64 | Ga | 500 | | | | | 0.585 | 0.407 | 213.3 | 218.0 | 2.7 | 38 | | |
| 65 | In | 100 | InCl$_3$ | 221.2 | Nichia Corporation | 114.82 | 0.585 | 0.407 | 210.2 | 215.3 | 2.5 | 26 | 96.9 | 64.6 |
| 66 | In | 500 | | | | | 0.585 | 0.407 | 204.7 | 208.9 | 2.4 | 22 | | |
| 67 | Ge | 100 | GeO$_2$ | 104.6 | Wako Reagent super-high grade 071-04552 | 72.59 | 0.584 | 0.408 | 199.8 | 204.6 | 2.5 | 24 | 96.1 | 63.8 |
| 68 | Ge | 500 | | | | | 0.585 | 0.407 | 186.9 | 190.7 | 2.2 | 24 | | |
| 69 | Sn | 100 | Sn(CH$_3$COO)$_2$ | 236.78(90%) | Kishida Chemical Co., Ltd lot F07563D + E8 | 118.69 | 0.584 | 0.408 | 201.3 | 205.7 | 2.2 | 22 | 97.8 | 66.1 |
| 70 | Sn | 500 | | | | | 0.584 | 0.407 | 185.4 | 188.4 | 2.2 | 24 | | |
| 71 | Pb | 100 | Pb(NO$_3$)$_2$ | 331.21 | Wako Reagent super-high grade 124-00612 | 207.20 | 0.585 | 0.407 | 203.1 | 192.9 | 2.5 | 20 | 97.0 | 70.4 |
| 72 | Pb | 500 | | | | | 0.585 | 0.407 | 208.2 | 198.2 | 2.4 | 26 | | |
| 73 | P | 100 | (NH$_4$)$_2$HPO$_4$ | 132.08 | Wako Reagent super-high grade 016-03325 | 30.97 | 0.584 | 0.408 | 204.7 | 209.3 | 2.2 | 28 | 95.4 | 60.8 |
| 74 | P | 500 | | | | | 0.584 | 0.408 | 202.4 | 205.7 | 2.3 | 22 | | |
| 75 | Sb | 100 | Sb$_2$O$_3$ | 291.5 | Wako Reagent super-high grade 016-11652 | 121.75 | 0.585 | 0.407 | 207.1 | 211.4 | 2.5 | 24 | 96.7 | 61.0 |
| 76 | Sb | 500 | | | | | 0.584 | 0.408 | 186.3 | 189.5 | 2.1 | 24 | | |
| 77 | Bi | 100 | Bi(NO$_3$)$_3$•5H$_2$O | 485.07 | Wako Reagent super-high grade 024-09042 | 208.98 | 0.584 | 0.407 | 205.5 | 210.3 | 2.2 | 24 | 96.7 | 65.1 |
| 78 | Bi | 500 | | | | | 0.583 | 0.408 | 173.4 | 176.8 | 2.1 | 26 | | |
| 79 | S | 100 | (NH$_4$)$_2$SO$_4$ | 132 | Wako Reagent super-high grade 019-03435 | 32.06 | 0.585 | 0.407 | 197.8 | 203.4 | 2.5 | 26 | 97.3 | 69.8 |
| 80 | S | 500 | | | | | 0.586 | 0.407 | 200.4 | 209.3 | 2.5 | 34 | | |

The nitride phosphor related to the present invention is a nitride phosphor which is represented by the general formula $L_XM_YN_{((2/3)X+(4/3)Y)}$:R or $L_XM_YO_ZN_{((2/3)X+(4/3)Y-(2/3)Z)}$:R and the above-mentioned nitride phosphor contains elements (hereinafter, merely referred to as the "different elements") which are different from the above-mentioned L, the above-mentioned M, the above-mentioned O, the above-mentioned N and the above-mentioned R. Among said general formula, Examples 1 to 80 are a nitride phosphor which is represented by $Ca_{1.985}Eu_{0.015}Si_5N_{7.99}O_{0.00225}$ and contain elements different from the above-mentioned L, the above-mentioned M, the above-mentioned O, the above-mentioned N and the above-mentioned R. Table 1 is the result of testing the properties of the nitride phosphor of Example 1 to 80. The mixing ratio of raw materials in Table 1 represents the raw materials by molar ratio. In Examples 1 to 80, the concentration of Eu is 0.015. The concentration of Eu is a molar ratio against the molar concentration of Ca. Further, the addition amount of the different elements against the phosphor after synthesis is the concentration of 100 ppm or 500 ppm. The adjustment of brightness and the adjustment of quantum efficiency can be carried out by adding said different elements. Further, when elements are diffused from a crucible and a furnace material, and in order to confirm the effect by elements contained in raw materials, the effect by said different elements was confirmed by adding the different elements to raw materials. Accordingly, when elements are diffused from a crucible and a furnace material in a practical use, it is considered to be a further mild condition (they become less than a case of consciously adding the different elements to raw materials).

In the present Example, the Ca of a raw material was firstly pulverized to 1 to 15 μm, and nitrided in nitrogen atmosphere. Then, the nitride of Ca was pulverized to 0.1 to 10 μm. 20 g of the Ca of a raw material was weighed and nitrided.

Similarly, the Si of a raw material was pulverized to 1 to 15 μm, and nitrided in nitrogen atmosphere. Then, the nitride of Si was pulverized to 0.1 to 10 μm. 20 g of the Si of a raw material was weighed and nitrided.

Then, a compound containing the different elements was mixed with a Eu compound, $Eu_2O_3$ in a wet process. An example is illustrated by selecting $H_3BO_3$ as a compound containing the different elements. Firstly, 20 g of the Eu compound, $Eu_2O_3$ and 3.65 g of $H_3BO_3$ were weighed. When $H_3BO_3$ is made as a solution, $Eu_2O_3$ is mixed with the $H_3BO_3$ solution, and the mixture is dried. After drying, firing was carried out at 700° C. to 800° C. for about 5 hours in oxygen atmosphere. Europium oxide to which B was added was produced thereby. After the firing, a mixture of Eu and B was pulverized to 0.1 to 10 μm.

The mixture of nitride of Ca, the nitride of Si and the mixture of Eu and B was mixed in nitrogen atmosphere. In Examples 1 to 80, the mixing ratio (molar ratio) contained in raw materials is Ca:Si:Eu=1.985:5:0.015. 5.73 g of $Ca_3N_2$ (molecular weight=148.26), 13.9 g of $Si_3N_4$ (molecular weight=140.31), and 0.37 g of the mixture of Eu and B (Eu is 0.31 among them) were weighed and mixed. The amount of B added is 500 ppm.

In case of Examples 1 to 80, the mixing, firing, pulverization, and weighing of Eu with the different elements were carried out so that the different elements shown in Table 1 are 100 ppm and 500 ppm in place of the above-mentioned boron (B). The different elements which are added to the nitride phosphors of Examples 1 to 80 are $LiOH.H_2O$ (Wako Reagent, special grade: 124-01212), $Na_2CO_3$ (Wako Reagent, special grade: 197-01585), $K_2CO_3$ (Wako Reagent, special grade: 162-03495), RbCl (Wako Reagent, special grade: 187-00321), CsCl (Wako Reagent, special grade: 035-01952), $Mg(NO_3)_2$ (Wako Reagent, special grade: 134-00255), $CaCl_2.6H_2O$ (Wako Reagent, special grade), $SrCl_2.6H_2O$ (Wako Reagent, special grade: 197-04185), $BaCl_2.2H_2O$ (Wako Reagent, special grade: 029-00175), $TiOSO_4.H_2O$ (Kishida Chemical: 020-78905), $ZrO(NO_3)_2$ (Mitsuwa Chemical), $HfCl_4$ (Mitsuba Chemical: No. 51872), $VCl_3$ (Wako Reagent, special grade: 221-00452), $Nb_2O_5$ (Wako Reagent, special grade: 144-05332), $TaCl_5$ (Kishida Chemical: 020-76055), $Cr(NO_3)_3.9H_2O$ (Wako Reagent, special grade: 033-03175), $H_2WO_4$ (Wako Reagent, special grade: 209-03452), $ReCl_5$ (Mitsuba Chemical: No. 58374), $FeCl_3.3H_2O$ (Wako Reagent, special grade: 9-87), $RuCl_3.2H_2O$ (Kishida Chemical: 020-68601), $Co(NO_3)_3.6H_2O$ (Wako Reagent, special grade: 035-03755), $NiCl_2.H_2O$ (Wako Reagent, special grade: 141-01062), $IrCl_3$ (Wako Reagent, special grade: 096-01601), $PdCl_2$ (Wako Reagent, special grade: 162-00053), $H_2PtCl_6.6H_2O$ (Wako Reagent, special grade: 169-02861), $Cu(CH_3COO)_2.H_2O$ (Wako Reagent, special grade: 3-402), $AgNO_3$ (Wako Reagent, special grade: 198-00835), $HAuCl_4.4H_2O$ (Wako Reagent, special grade: 077-00931), $Zn(NO_3)_2.6H_2O$ (Wako Reagent, special grade: 265-01032), $H_3BO_3$ (Wako Reagent, special grade: 021-02195), $Al(NO_3)_3.9H_2O$ (Wako Reagent, special grade: 018-01945), $GaCl_3$ (manufactured by NICHIA CORPORATION), $InCl_3$ (manufactured by NICHIA CORPORATION), $GeO_2$ (Wako Reagent, special grade: 071-04552), $Sn(CH_3COO)_2$ (Kishida Chemical: lotF07563D), $Pb(NO_3)_2$ (Wako Reagent, special grade: 124-00612), $(NH_4)_2HPO_4$ (Wako Reagent, special grade: 016-03325), $Sb_2O_3$ (Wako Reagent, special grade: 016-11652), $Bi(NO_3)_3.5H_2O$ (Wako Reagent, special grade: 024-09042), $(NH_4)_2SO_4$ (Wako Reagent, special grade: 019-03435). These compounds were weighed and added so that the concentrations of the different elements in these compounds are 100 ppm or 500 ppm against $Ca_2Si_5N_8$:Eu.

The above-mentioned compounds having the different elements were mixed and baked. As the firing conditions, these compounds were charged in a crucible made of boron nitride in ammonia atmosphere, the temperature was gradually raised from room temperature over about 5 hours, firing was carried out at about 1350° C. for 5 hours, and they were gradually cooled to room temperature over about 5 hours. The different element was scattered by the firing, therefore the different element is also not occasionally contained in the final product. Even though the different element is contained, the less amount thereof than the initial addition amount remain by 0.1 ppm to about several hundreds ppm.

The luminescence brightness and quantum efficiency of the nitride phosphor of Examples 1 to 80 is represented by the relative value on the basis that it is 100% when 500 ppm of Cr was added (the quantum efficiency of Example 30).

It is the purpose of the firing not only to react in solid state but also to obtain particles having the desired particle sizes and good crystallinity. Flux is a material added to accelerate the growth of crystal. Flux can accelerate not only to grow the crystal but also to introduce a co-activator into the lattice of the base material. For example, since the Group I Elements have a relatively low melting point and can be introduced grain boundary during the firing, the crystal growth is accelerated by melting the element of the phosphor. The phosphor of which particle size is grown to absorb the exciting energy easily can be obtained.

The nitride phosphors in Examples 1 to 10 containing the Group I Element consisting of Li, Na, K and Cs have high brightness and high quantum efficiency. It is considered that this is caused by the flux effect. In Examples 1 to 10, the brightness can be adjusted by adjusting the addition amount of the Group I Element.

Examples 11 to 16, 57 and 58 are the Group II Element corresponding to the above-mentioned L and contain 100 ppm or 500 ppm of Mg, Sr, Ba and Zn. The brightness can be adjusted by adjusting the amount of L in the nitride phosphors.

The nitride phosphors containing the Group IV Element consisting of Ti, Zr and Hf of Examples 17 to 22, the Group I Element consisting of Ag and Au of Examples 51 to 56, the Group III Element consisting of B, Al, Ga and In of Examples 59 to 66, the Group IV Element consisting of Sn and Pb of Examples 69 to 72, the Group V Element consisting of P, Sb and Bi of Examples 73 to 78, and the Group VI Element consisting of S of Examples 79 and 80 can be brightness.

The brightness can be adjusted by adjusting the amount of the nitride phosphors containing the Group V Element consisting of V, Nb and Ta of Examples 23 to 28, the Group VI Element consisting of Cr, Mo and W of Examples 29 to 34, the Group VII Element consisting of Re of Examples 35 and 36, and the Group VIII Element consisting of Fe, Co, Ir, Ni, Pd, Pt and Ru of Examples 37 to 50.

In the present Examples, it is considered that a crucible is eroded at firing step, and elements constituting the crucible from the crucible contaminate in the nitride phosphor. Hereat, since the nitride phosphors related to Examples use the crucible of a boron nitride material and firing is carried out in ammonia atmosphere, it is considered that a crucible is eroded and B contaminates in the nitride phosphor. In this case, the nitride phosphor can improve the luminescence brightness and quantum efficiency by containing B as shown in Examples 59 and 60.

Accordingly, the crucible of a boron nitride material can be positively used for aiming the effect of improving the luminescence brightness and quantum efficiency.

On the other hand, when the crucible of a molybdenum nitride material is used, it is considered that molybdenum contaminates in the nitride phosphor, but in this case, molybdenum lowers the brightness and quantum efficiency as shown in Example 32. Accordingly, it is preferable that the boron nitride crucible is used than the molybdenum crucible. Thus, the influence of the element contained in a crucible, a furnace material and the like to the nitride phosphor can be estimated to a certain degree from Examples 1 to 80.

Even if the different element is contained by the concentration of several hundreds ppm, a light emitting device which emits light of a brilliant orange to red color by the excitation light source of 450 nm to 470 can be provided without generating the sharp lowering of luminescence brightness and luminescence efficiency, from Examples 1 to 80.

Further, in Table 1, the temperature characteristic shows the quality of luminescence of the nitride phosphor at a high temperature and it shows that the nitride phosphor having little attenuation at a high temperature can emits stable luminescence even if the nitride phosphor was provided near at the surface of a light emitting device. Examples 1 to 80 is 97 to 100% at 35° C., 95 to 100% at 100° C., and 58 to 80% at 200° C. Accordingly, it can be grasped that the temperature characteristic of the nitride phosphors of Examples 1 to 80 is extremely good.

According to the above-mentioned Examples 1 to 80, in particular, when several tens to several hundreds ppm of B was added, the brightness is 234.6% and the luminescence efficiency is 244.6% (when 100 ppm of B is added), and the brightness is 237.9% and the luminescence efficiency is 248.1% (when 500 ppm of B is added), as the basis when 500 ppm of Cr was added. This shows that the improvement of the luminescence efficiency is remarkable. Further, the similar effect can be obtained at using Ba, Sr, Ca—Sr and the like in place of Ca, although it is not described in Examples.

The nitride phosphors of Examples 1 to 80 have a peak wave length near at 609 nm when they are excited by an excitation light source of 460 nm.

The afterglow of Example 3 was 14 msec, the afterglow of Example 9 was 18 msec, the afterglow of Example 11 was 22 msec, the afterglow of Example 15 was 18 msec, the afterglow of Example 17 was 14 msec, the afterglow of Example 27 was 18 msec, the afterglow of Example 29 was 10 msec, the afterglow of Example 39 was 16 msec, the afterglow of Example 43 was 12 msec, the afterglow of Example 59 was 20 msec, the afterglow of Example 61 was 22 msec, and the like. Thus, Na, Ti, Mg, Al, B, Cr, Ni and the like have the effect of shortening the afterglow.

When the component composition of the nitride phosphors of Examples 1 to 80 was analyzed, Li, Na, K, Rb, Cs, Mg, W, Cu, Ag, Au, Zn, Ga, In, Ge, Sn, Pb, P, Sb, Bi and the like in which the addition amount were 500 ppm remained by only the amount of 100 ppm or less. Only the less amount of the other different elements than the initial addition amount remained. For example, B which was added by 500 ppm remained by only 400 ppm. This is considered to be that the different elements were scattered.

Example 81

Figure 8:
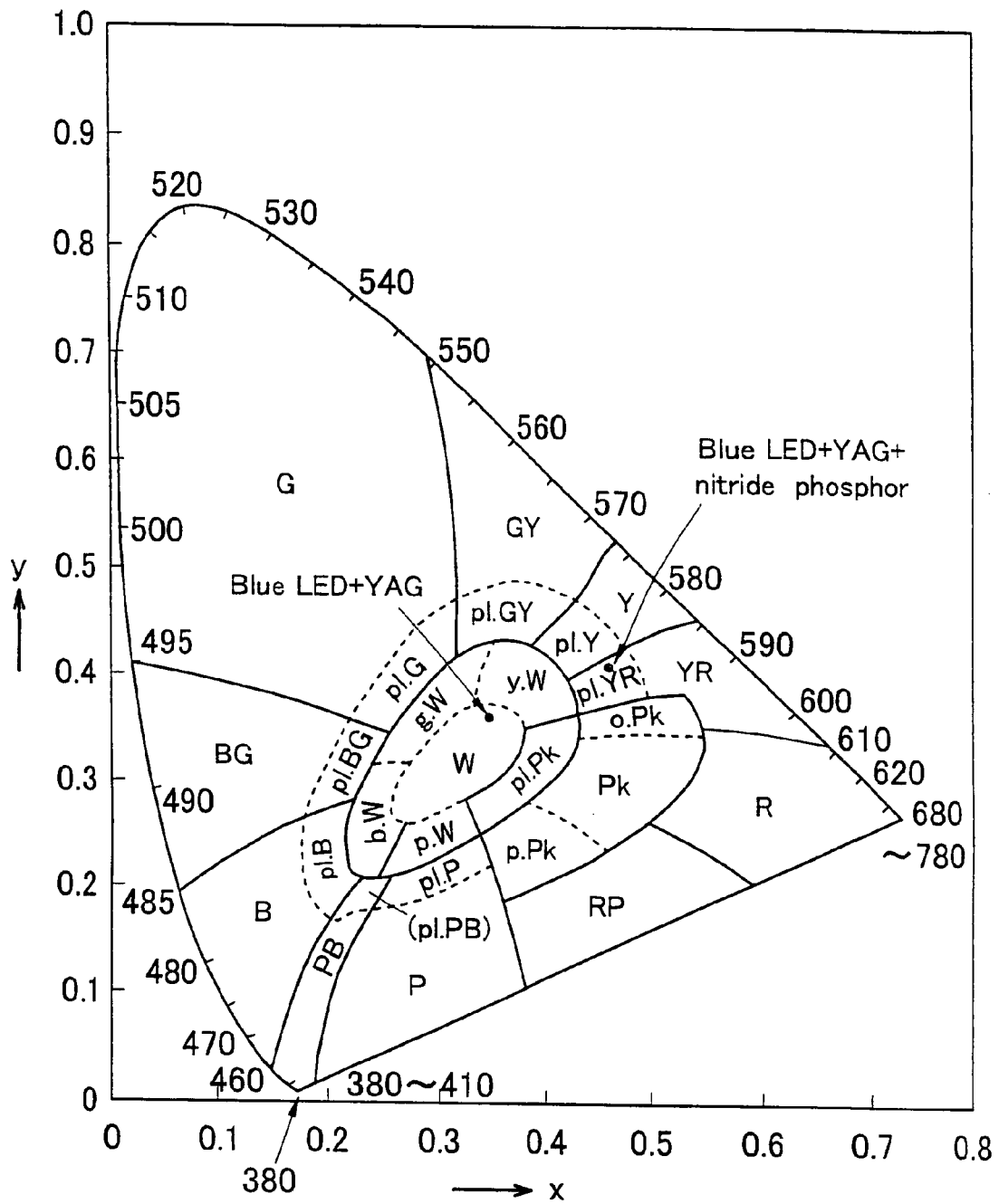
FIG. 8 is a chart showing the chromaticity coordinate of Example 81 related to the present invention.

The light emitting device of Example 81 is a white light emitting device which was constituted using the phosphor of Example 15 and to which a reddish component was added. Further, the light emitting device of Example 81 is the type 1 light emitting device shown in FIG. 1. Further, FIG. 8 is a drawing showing the chromaticity coordinate of the light emitting device of Example 81.

In the light emitting element 10 of Example 81, $n^+$GaN:Si, n-AlGaN:Si, n-GaN, GaInN QWs, p-GaN:Mg, p-AlGaN: Mg, and p-GaN:Mg are laminated in order on the sapphire substrate 1 as the semiconductor layer 2. Further, the portion of $n^+$GaN:Si is etched and exposed to form an n-type electrode. Copper with Fe is used for the lead frame 13. The light emitting element 10 is die-bonded at about the central part of the cup bottom of the mount lead 13a. Gold is used for the electroconductive wire 14, and Ni plating is carried out on the bump 4 for electrically connecting the electrode 3 with the electroconductive wire 14. In the phosphor 11 the phosphor of Example 15 and the YAG-base phosphor are used by mixture. As the coating member 12, a mixture which mixed an epoxy resin and a dispersant, barium titanate, titanium oxide and the above-mentioned phosphor 11 at a fixed proportion is used. The epoxy resin is used as the mold member 15. The bullet type light emitting device of Example 81 is a column in which the mold member 15 is a radius of 2 to 4 mm, height is about 7 to 10 mm, and the upper portion is hemispherical.

When current is run in the light emitting device 1 of Example 81, the blue light emitting element 10 having the first luminescence spectrum with a peak wave length of about 460 nm which can excite the phosphor 11 emits light, and the phosphor 11 which covers the semiconductor layer 2 carries out the wave conversion of the portion of light having the first luminescence spectrum. Specifically, the phosphor of Example 15 emits light having the second luminescence spectrum which is different from light having the first luminescence spectrum. Further, the YAG-base phosphor contained in the phosphor 11 is excited by light having the first luminescence spectrum and emits light having the third luminescence spectrum. The white light emitting device of Example 81 emits reddish light which was obtained by color mixing of mutually mixing the first, second and third luminescence spectra.

As the phosphor 11 of the light emitting device of Example 81, there is used a phosphor which mixed the phosphor of Example 15 and the yttrium-gadolinium-aluminum oxide phosphor (Y—Ga—Al—O:Ce) activated by cerium. Example 15 is the nitride phosphor of $Ca_2Si_5N_8$:Eu in which Ba was added. On the other hand, as a comparison, there was prepared the type 1 light emitting device which did not contain the phosphor of Example 15 and used only the yttrium-gadolinium-aluminum oxide phosphor activated by cerium as the phosphor 11. The white light emitting device of Example 81 and the comparative white light emitting device use the phosphor of $(Y_{0.8}Gd_{0.2})_3Al_5O_{12}$:Ce as the yttrium-gadolinium-aluminum oxide phosphor. The comparative white light emitting device emits light by combination of a blue light emitting element and the phosphor of Y—Ga—Al—O:Ce. It is preferable to use the yttrium-gallium-aluminum oxide phosphor activated by cerium, $Y_3(Al_{0.8}Ga_{0.2})_5O_{12}$:Ce, in place of the yttrium-gadolinium-aluminum oxide phosphor activated by cerium.

In the light emitting device of Example 81, the weight ratio of the phosphor 11 was the coating member:the phosphor of Y—Gd—Al—O:Ce:the phosphor of Example 15=10:3.8:0.6. On the other hand, the comparative phosphor is mixed at the weight ratio of the coating member the phosphor of Y—Gd—Al—O:Ce=10:3.6.

The light emitting device of Example 81 is compared with the light emitting device of Comparative Example using a blue light emitting element and the phosphor of Y—Gd—Al—O:Ce. Table 2 shows the measurement result of the light emitting device of Example 81 and the light emitting device of Comparative Example. In the Table 2, the phosphor of Y—Gd—Al—O:Ce is described in abbreviation as YAG.

The color rendering property of the light emitting device of Example 81 is improved in comparison with the light emitting device of Comparative Example. The light emitting device of Comparative Example was insufficient in the specific color rendering index R9, but R9 is improved in the light emitting device 1 of Example 81. The specific color rendering index R9 is a value measuring deviation from a red standard color having comparatively high chroma. Further, it is improved to a value nearer to about 100% than other specific color rendering indexes R8, R10 and the like. Lamp efficiency shows a high value.

The phosphor 11 mixed with the coating member 12 is used by mixing the phosphor of Y—Gd—Al—O:Ce with the nitride phosphor, but since the two phosphors have different density, those having high density and smaller particle diameter are generally precipitated fast. Accordingly, the phosphor of Y—Gd—Al—O:Ce is precipitated in advance, and the nitride phosphor is precipitated next. Accordingly, even if the same coating member 12 and the phosphor 11 are used, color unevenness in the color tone of the light emitting device is generated. Therefore, it is preferable that the particle diameter of the nitride phosphor is controlled at a fixed size and the phosphor of Y—Gd—Al—O:Ce and the nitride phosphor are precipitated about at the same time. It can be improved not to generate the color unevenness.

Example 82

The light emitting device of Example 82 related to the present invention is the type 2 (surface mounting type) light emitting device shown in FIG. 7. The light emitting device of Example 82 uses a light emitting element capable of emitting blue light (a light emitting element having InGaN semiconductor layer which has a peak wave length of 460 nm at a blue region as a luminescence layer) as the light emitting element 101. However, the present invention is not limited to the light emitting element capable of emitting blue light, and for

TABLE 2

| | Electric current IF (mA) | Voltage VF (V) | Radiation analysis Radiometric (mW) | Brightness measurement Photometric (lm) | Peak wave length Peak (nm) | Half-value width FWHM (nm) | Visual wave length Dominant (nm) |
|---|---|---|---|---|---|---|---|
| Blue LED | 20 | 4.05 | 14.78 | 0.955 | 464.02 | 19.35 | 468.05 |
| Comparative Example Blue LED + YAG | 20 | 3.75 | 9.59 | 3.042 | 463.47 | 150.73 | 568.85 |
| Example81 Blue LED + YAG + nitride phosphor | 20 | 3.80 | 5.84 | 1.890 | 596.00 | 196.36 | 582.75 |

| | Color tone x | Color tone y | Color temperature Tcp (K) | Average color rendering property Ra | Emission efficiency (lm/W) |
|---|---|---|---|---|---|
| Blue LED | 0.134 | 0.057 | — | — | 11.8 |
| Comparative Example Blue LED + YAG | 0.348 | 0.367 | 4939 | 78 | 40.6 |
| Example81 Blue LED + YAG + nitride phosphor | 0.454 | 0.416 | 2828 | 76 | 24.9 | example, a light emitting element capable of emitting ultraviolet light at 380 to 400 nm can be also used.

More specifically, a p-type semiconductor layer and an n-type semiconductor layer are formed in the light emitting element 101 (not illustrated), and the electroconductive wires 104 which are respectively linked with the lead electrode 102 through ohmic electrodes are connected with said p type semiconductor layer and the n-type semiconductor layer. Further, the insulating sealing material 103 is formed so as to cover the outer peripheral of the lead electrode and prevents short circuit. At the upper part of the light emitting element 101, the transparent window portion 107 which is extended from the lid 106 situated at the upper part of the package 105 is provided. At the inner face of said transparent window portion 107, a mixture of the phosphor 108 related to the present invention and the coating member 109 is coated on about all over the surface. Hereat, the phosphor of Example 60, the phosphor of $(Ca_{0.93}, Eu_{0.05}, Mn_{0.02})_{10}(PO_4)_6Br_2$ and the phosphor of $Y_3(Al_{0.8},Ga_{0.2})_5O_{12}$:Ce are used in the light emitting device of Example 82. The package 105 is a square having a side of 8 mm to 12 mm whose corner portion was removed.

Among the blue light emitted from the light emitting element 101, indirect light reflected by a reflecting plate and light directly discharged from the light emitting element 101 are irradiated on the phosphor 108, and white light emission becomes possible.

When a white LED lamp is prepared using the light emitting device which was formed as described above, the yield can be 99%. Thus, according to the light emitting diode of the present Example 81, there can be provided a light emitting device which has good mass production and high reliability and further little color tone unevenness.

Example 83

The light emitting device of Example 83 is the type 3 (cap type) light emitting device shown in FIG. 8.

In the light emitting device of Example 83, the phosphor used for the cap 16 uses the phosphor of Example 15. The phosphor of Example 15 is also used in the cup of the mount lead 13a. However, since the phosphor used for the cap 16, the inside of the cup of the mount lead 13a may be only the coating member 12.

In the light emitting device thus constituted, the wave length conversion of the portion of light emitted from the light emitting element 10 is carried out by the phosphor of Example 15 when the light passes through the cap 16. The wave length-converted light and blue light which was not wave length-converted by the phosphor are mixed, and as a result, white light is discharged from the surface of the cap 16.

Examples 84 to 109 related to the mode 2 of operation related to the present invention is illustrated below.

Examples 84 to 87

Table 3 shows the properties of the nitride phosphors of Examples 84 to 87

Figure 9:
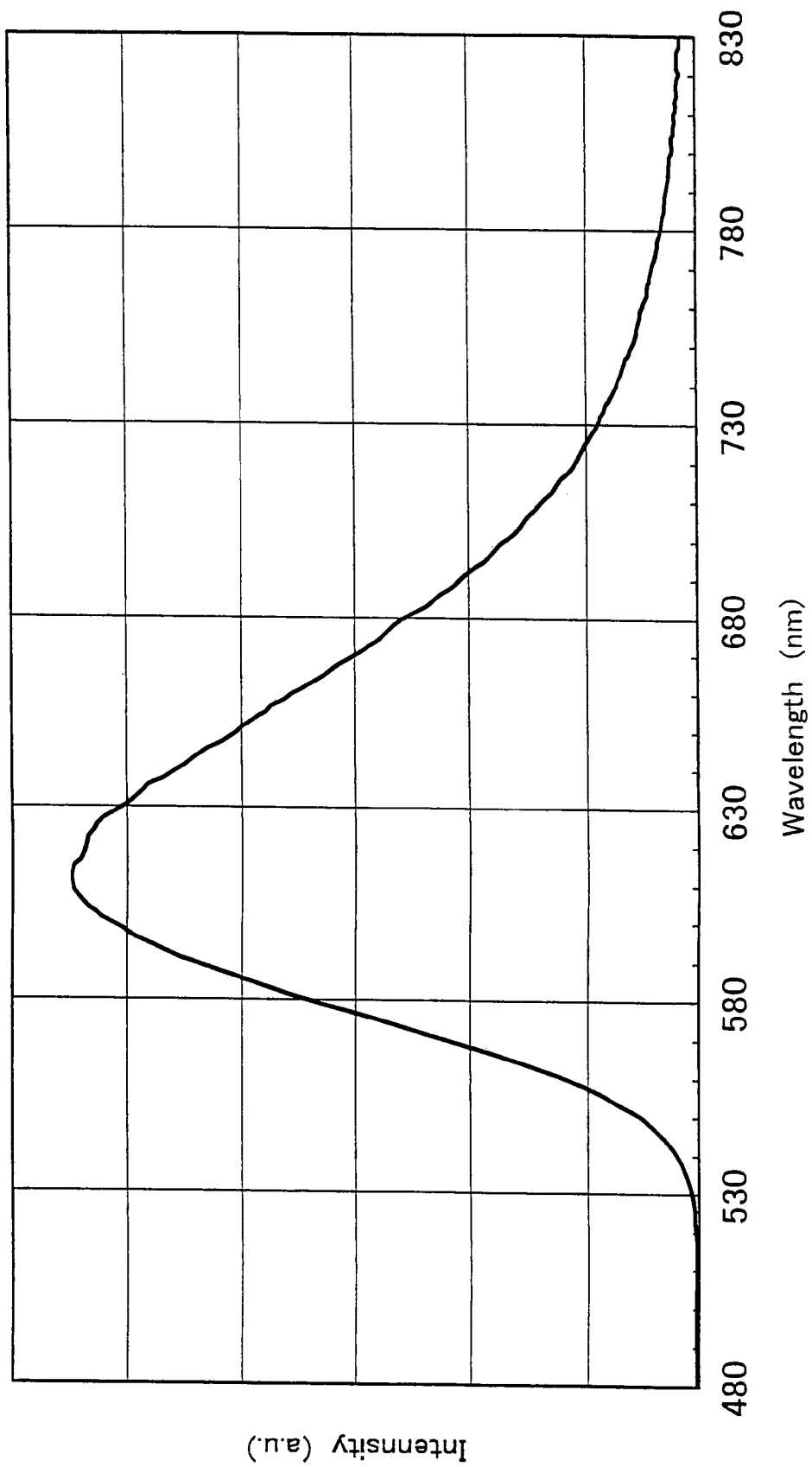
FIG. 9 is a chart showing the luminescence spectrum when the nitride phosphor of Example 86 related to the present invention was excited by light of a wave length at Ex=460 nm.
Figure 10:
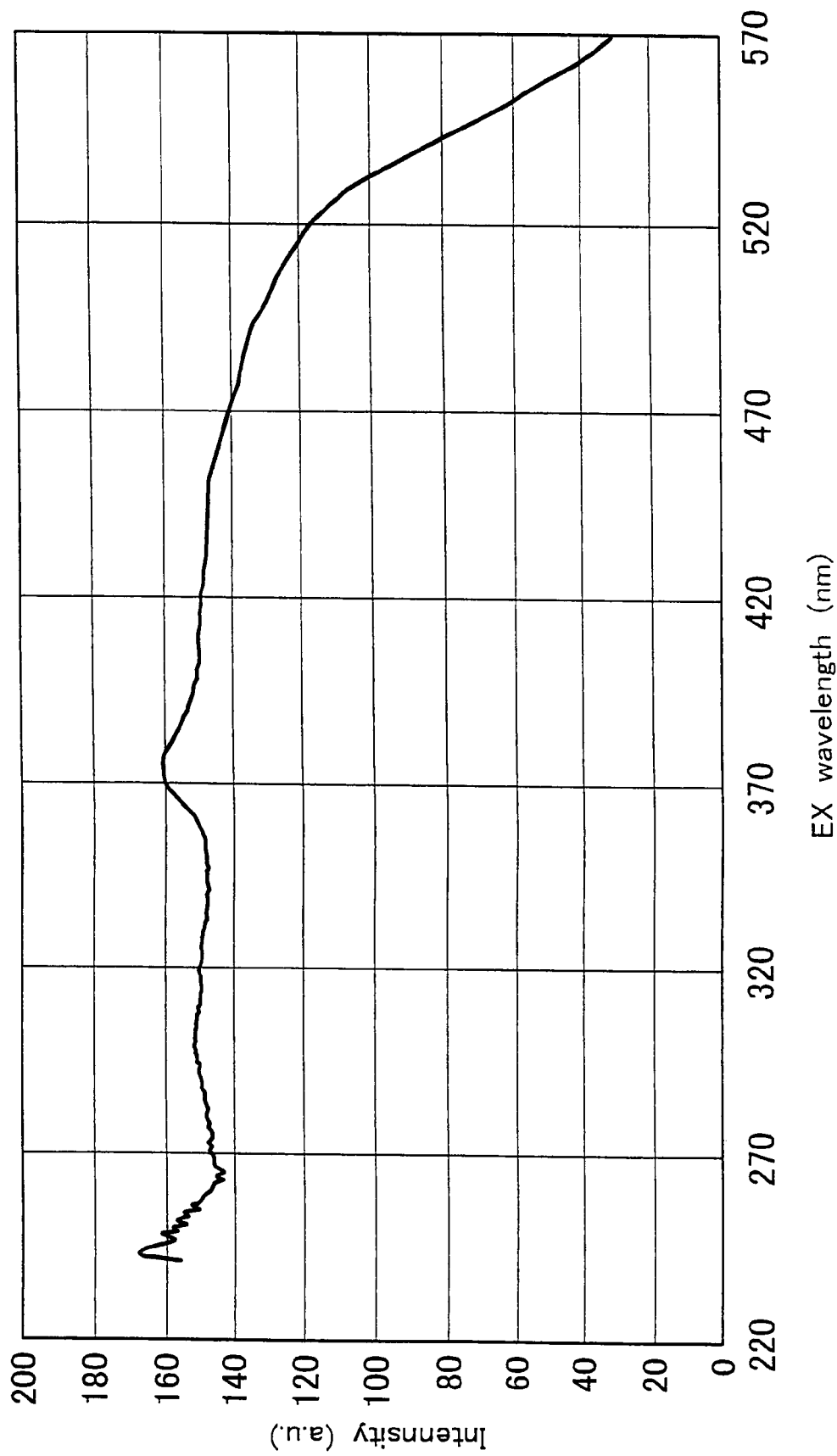
FIG. 10 is a chart showing the excitation spectrum of the nitride phosphor of Example 86.
Figure 11:
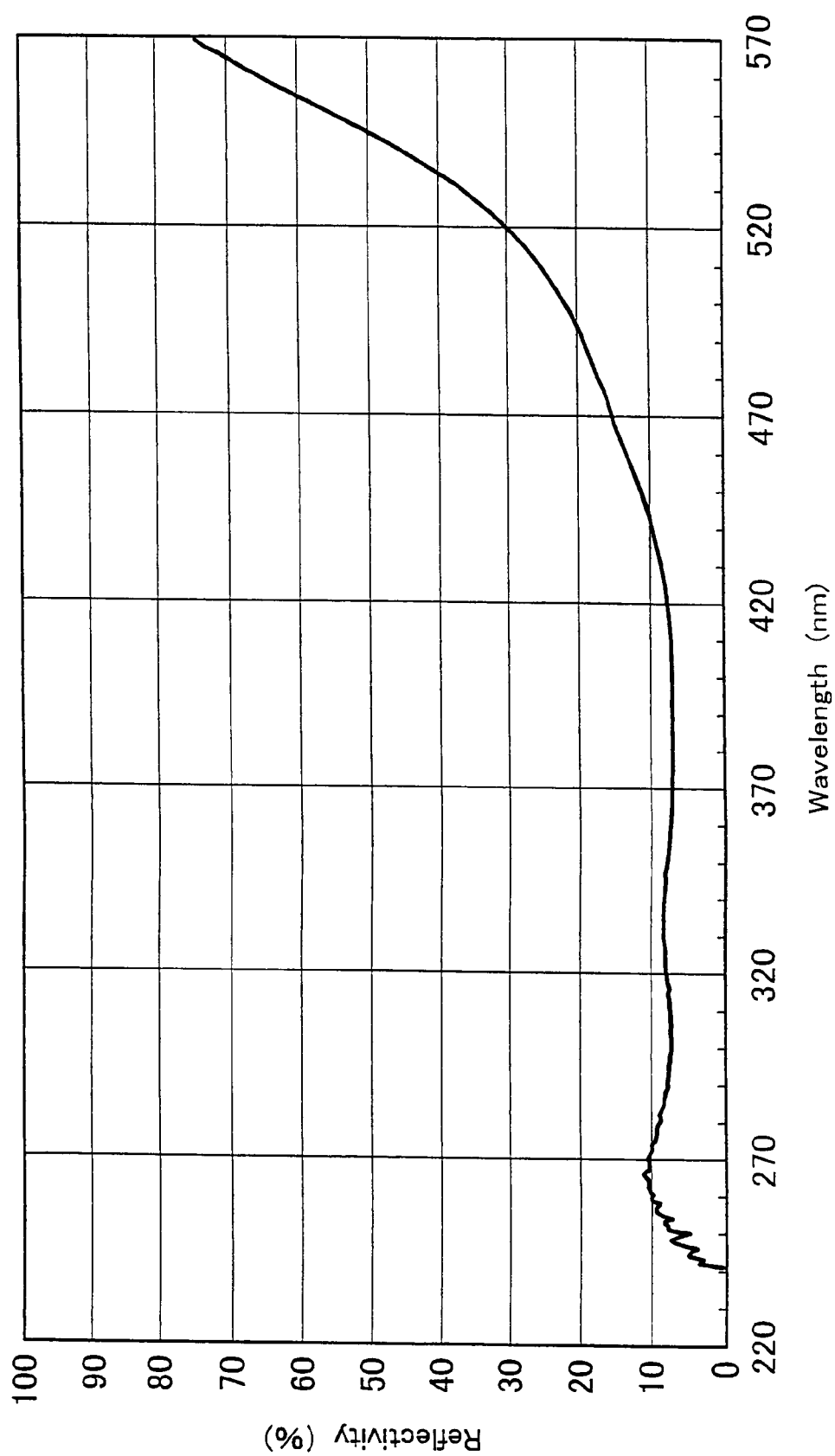
FIG. 11 is a chart showing the reflection spectrum of the nitride phosphor of Example 86.
Figure 12A:
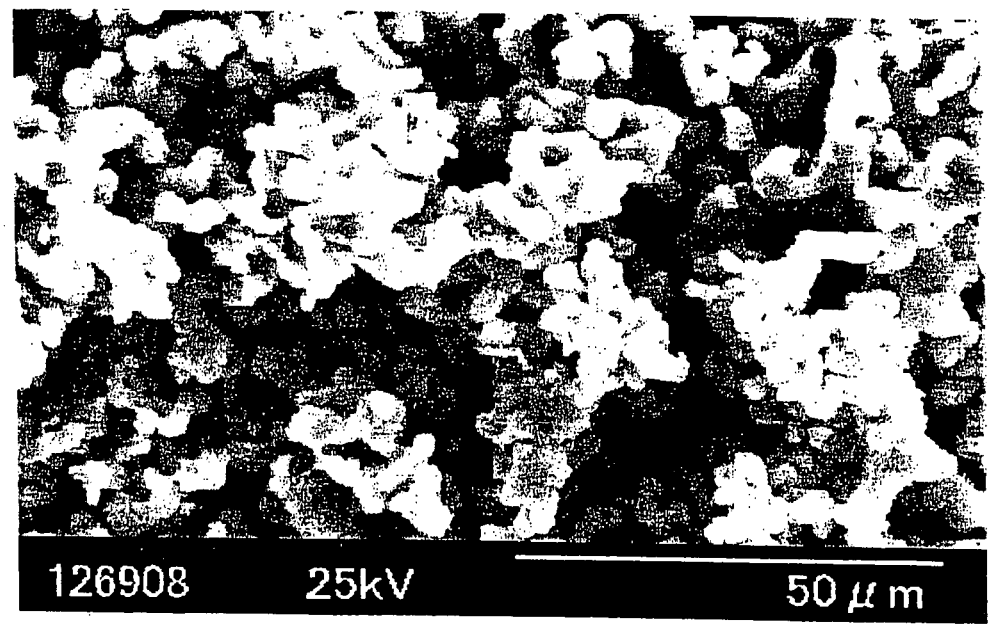
FIGS. 12(A) and (B) are SEM photographs of the nitride phosphor of Example 86.
Figure 12B:
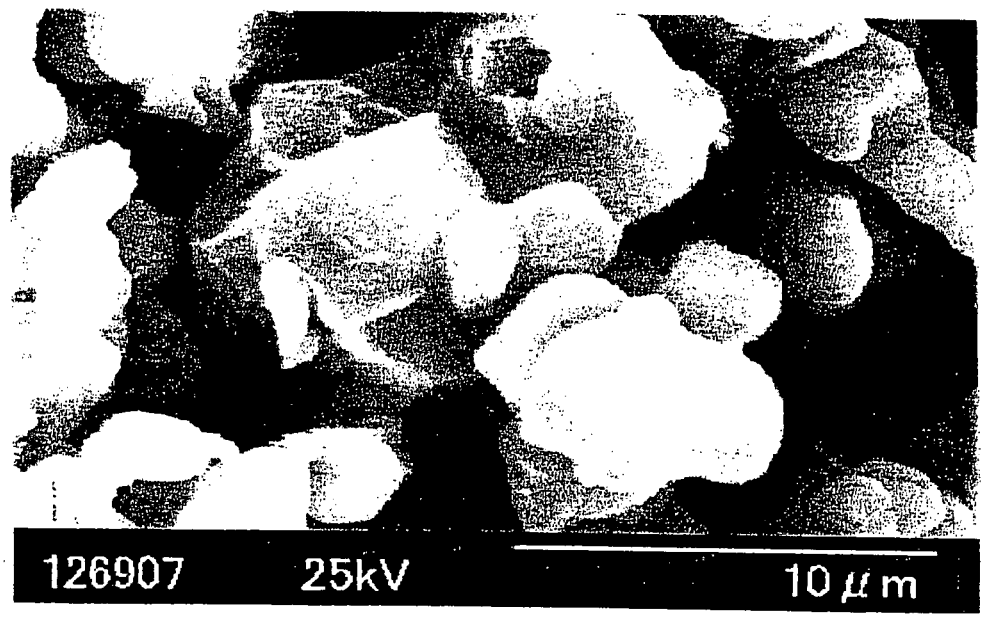

Further, FIG. 9 is a drawing showing a luminescence spectrum when the nitride phosphor of Example 86 was excited at Ex=460 nm. FIG. 10 is a drawing showing the excitation spectrum of the nitride phosphor of Example 86. FIG. 11 is a drawing showing the reflection spectrum of the nitride phosphor of Example 86. FIG. 12 is a SEM photo photographed the nitride phosphor of Example 86. FIG. 12A is a photo photographed at a magnification of 1000. FIG. 12A is a photo photographed at a magnification of 5000.

TABLE 3

| Example | Addition amount of B (ppm) | Color tone x | Color tone y | Emission brightness (%) | Quantum efficiency (%) |
|---|---|---|---|---|---|
| 84 | 10 | 0.596 | 0.398 | 100 | 100 |
| 85 | 200 | 0.598 | 0.397 | 107 | 108 |
| 86 | 500 | 0.598 | 0.396 | 112 | 113 |
| 87 | 1000 | 0.598 | 0.396 | 110 | 112 |

Examples 84 to 87 are nitride phosphors which are represented by $(Ca_{0.97}Eu_{0.03})_2Si_5N_8$ and contain a fixed amount of B. The luminescence brightness and quantum efficiency are shown by a relative value based on the basis of the nitride phosphor Example 84.

In Examples 84 to 87, the concentration of Eu is 0.03. The concentration of Eu is a molar ratio against the molar concentration of Ca.

The Ca of a raw material was firstly pulverized to 1 to 15 μm, and nitrided in nitrogen atmosphere. Then, the nitride of Ca was pulverized to 0.1 to 10 μm. 20 g of the Ca of a raw material was weighed and nitrided.

Similarly, the Si of a raw material was pulverized to 1 to 15 μm, and nitrided in nitrogen atmosphere. Then, the nitride of Si was pulverized to 0.1 to 10 μm. 20 g of the Si of a raw material was weighed and nitrided.

Then, a Eu compound, $H_3BO_3$ was mixed with a Eu compound, $Eu_2O_3$ in a wet process. 20 g of the Eu compound, $Eu_2O_3$ and a fixed amount of $H_3BO_3$ were weighed. After $H_3BO_3$ was made as a solution, $Eu_2O_3$ was mixed with the solution, and the mixture is dried. After drying, firing was carried out at 700° C. to 800° C. for about 5 hours in oxygen atmosphere. Europium oxide to which B was added was produced thereby. After the firing, a mixture of Eu and B was pulverized to 0.1 to 10 μm.

The mixture of nitride of Ca, the nitride of Si and the mixture of Eu and B was mixed in nitrogen atmosphere. In Examples 84 to 87, the mixing ratio (molar ratio) contained in raw materials of calcium nitride, $Ca_3N_2$, silicone nitride, $Si_3N_2$, europium oxide, $Eu_2O_3$ is Ca:Si:Eu=1.94:5:0.06. $Ca_3N_2$ (molecular weight=148.26), $Si_3N_4$ (molecular weight=140.31), and the mixture of Eu and B were weighed so as to be the mixing ratio, and mixed. The amount of B added is 10 ppm, 200 ppm, 500 ppm and 1000 ppm against the molecular weight of the final composition.

The above-mentioned compounds were mixed and baked. As the firing conditions, the above-mentioned compounds were charged in a crucible in ammonia atmosphere, the temperature was gradually raised from room temperature, firing was carried out at about 1600° C. for about 5 hours, and they were gradually cooled to room temperature. In general, B added remains in the composition even if firing is carried out, but the portion of B is scattered by the firing, therefore the less amount remains occasionally in the final product.

The luminescence brightness and quantum efficiency of the nitride phosphors of Examples 84 to 87 are represented by the relative value based on the basis that Example 84 is 100%.

From Table 3, when 10000 ppm or less of B was added, and in particular, 1 ppm or more and 1000 ppm or less of B was added, the luminescence brightness and quantum efficiency exhibited high values.

The mean particle diameter of the nitride phosphors of Examples 84 to 87 was 6.3 to 7.8 μm. Further, oxygen was contained by 0.5 to 1.2% by weight in the phosphors of Examples 84 to 87.

The nitride phosphors related to Examples 84 to 87 are baked in ammonia atmosphere using the crucible of a boron nitride material.

The temperature characteristic of the nitride phosphors of Examples 84 to 87 is extremely good. The temperature characteristic of the nitride phosphors of Example 86 was 97% at 100° C., and 70% at 200° C.

The nitride phosphor related to Examples 84 to 87 have a peak wave length near at 609 nm when excitation was carried out by the excitation light source of 460 nm.

Examples 88 to 92

Table 4 shows the properties of the nitride phosphors of Examples 88 to 92.

TABLE 4

| Example | Addition amount of B (ppm) | Color tone x | Color tone y | Emission brightness (%) | Quantum efficiency (%) |
|---|---|---|---|---|---|
| 88 | 10 | 0.596 | 0.396 | 100 | 100 |
| 89 | 200 | 0.598 | 0.396 | 100 | 100 |
| 90 | 500 | 0.598 | 0.396 | 100 | 100 |
| 91 | 1000 | 0.598 | 0.396 | 105 | 104 |
| 92 | 10000 | 0.598 | 0.396 | 102 | 101 |

Examples 88 to 92 are nitride phosphors which are represented by $(Ca_{0.97}Eu_{0.03})_2Si_5N_8$ and contain a fixed amount of B. The luminescence brightness and quantum efficiency are shown by a relative value based on the basis of the nitride phosphor Example 88.

In Examples 88 to 92, the concentration of Eu is 0.03. The concentration of Eu is a molar ratio against the molar concentration of Ca.

The production process of Examples 88 to 92 is different from that of Examples 84 to 87.

Firstly, the Ca of a raw material was pulverized to 1 to 15 μm, and nitrided in nitrogen atmosphere. Then, the nitride of Ca was pulverized to 0.1 to 10 μm. 20 g of the Ca of a raw material was weighed and nitrided.

Similarly, the Si of a raw material was pulverized to 1 to 15 μm, and nitrided in nitrogen atmosphere. Then, the nitride of Si was pulverized to 0.1 to 10 μm. 20 g of the Si of a raw material was weighed and nitrided.

The nitride of Ca, the nitride of Si, a Eu compound, $Eu_2O_3$ and B compound, $H_3BO_3$ were mixed in a dry process. 20 g of the Eu compound, $Eu_2O_3$ and a fixed amount of $H_3BO_3$ were weighed to be used. In Examples 88 to 92, they are adjusted so that the mixing ratio (molar ratio) of the raw materials of nitride of Ca, $Ca_3N_2$, the nitride of Si, $Si_3N_4$, and europium oxide, $Eu_2O_3$ is Ca:Si:Eu=1.94:5:0.06. The amount of B added is 10 ppm, 200 ppm, 500 ppm, 1000 ppm and 10000 ppm against the molecular weight of the final composition.

The above-mentioned compounds were mixed and baked. As the firing conditions, the above-mentioned compounds were charged in a crucible in ammonia atmosphere, the temperature was gradually raised from room temperature, firing was carried out at about 1600° C. for about 5 hours, and they were gradually cooled to room temperature.

The luminescence brightness and quantum efficiency of the nitride phosphor of Examples 88 to 92 are represented by the relative value based on the basis that Example 88 is 100%.

From Table 4, when 10000 ppm or less of B was added, the luminescence brightness and quantum efficiency exhibited high values.

The mean particle diameter of the nitride phosphors of Examples 88 to 92 was 6.0 to 7.2 μm. Further, the concentration of oxygen was 0.7 to 1.0% by weight.

Examples 93 to 98

Table 5 shows the properties of the nitride phosphors of Examples 93 to 98.

TABLE 5

| Example | Addition amount of B (ppm) | Color tone x | Color tone y | Emission brightness (%) | Quantum efficiency (%) |
|---|---|---|---|---|---|
| 93 | 10 | 0.618 | 0.375 | 100 | 100 |
| 94 | 100 | 0.619 | 0.374 | 104 | 107 |
| 95 | 200 | 0.620 | 0.373 | 105 | 109 |
| 96 | 500 | 0.618 | 0.376 | 106 | 105 |
| 97 | 1000 | 0.620 | 0.373 | 97 | 102 |
| 98 | 5000 | 0.625 | 0.368 | 95 | 110 |

Examples 93 to 98 are nitride phosphors which are represented by $(Sr_{0.97}Eu_{0.03})_2Si_5N_8$ and contain a fixed amount of B. The luminescence brightness and quantum efficiency are shown by a relative value based on the basis of the nitride phosphor Example 93.

In Examples 93 to 98, the concentration of Eu is 0.03. The concentration of Eu is a molar ratio against the molar concentration of Sr.

Examples 93 to 98 was produced by about the same production process as that of Examples 84 to 87. Examples 93 to 98 used Sr in place of Ca used in Examples 84 to 87. Baking was carried out at about 1600° C. in Examples 84 to 87, but firing was carried out at about 1350° C. in Examples 93 to 98.

From Table 5, when 10000 ppm or less of B was added, and in particular, 10 ppm or more and 5000 ppm or less of B was added, the luminescence brightness and quantum efficiency exhibited high values.

The mean particle diameter of the nitride phosphors of Examples 93 to 98 was 2.1 to 4.7 μm. Further, the concentration of oxygen was 0.3 to 1.1% by weight.

Examples 99 to 103

Table 6 shows the properties of the nitride phosphors of Examples 99 to 103.

TABLE 6

| Example | Addition amount of B (ppm) | Color tone x | Color tone y | Emission brightness (%) | Quantum efficiency (%) |
|---|---|---|---|---|---|
| 99 | 10 | 0.629 | 0.364 | 100 | 100 |
| 100 | 100 | 0.628 | 0.365 | 101 | 101 |
| 101 | 500 | 0.629 | 0.364 | 102 | 103 |
| 102 | 1000 | 0.628 | 0.365 | 98 | 98 |
| 103 | 5000 | 0.629 | 0.364 | 92 | 97 |

Examples 99 to 103 are nitride phosphors which are represented by $(Sr_{0.97}Eu_{0.03})_2Si_5N_8$ and contain a fixed amount of B. The luminescence brightness and quantum efficiency are shown by a relative value based on the basis of the nitride phosphor Example 99.

In Examples 99 to 103, the concentration of Eu is 0.03. The concentration of Eu is a molar ratio against the molar concentration of Sr.

Examples 99 to 103 was produced by about the same production process as that of Examples 84 to 87. Examples 99 to 103 used Sr in place of Ca used in Examples 84 to 87.

From Table 6, when 1000 ppm or less of B was added, and in particular, 10 ppm or more and 500 ppm or less of B was added, the luminescence brightness and quantum efficiency exhibited high values.

The mean particle diameter of the nitride phosphors of Examples 99 to 103 was 3.2 to 3.9 μm.

Examples 104 to 109

Table 7 shows the properties of the nitride phosphors of Examples 104 to 109.

TABLE 7

| Example | Addition amount of B (ppm) | Color tone x | Color tone y | Emission brightness (%) | Quantum efficiency (%) |
|---|---|---|---|---|---|
| 104 | 10 | 0.636 | 0.357 | 100 | 100 |
| 105 | 100 | 0.635 | 0.357 | 100 | 100 |
| 106 | 200 | 0.636 | 0.356 | 102 | 103 |

TABLE 7-continued

| Example | Addition amount of B (ppm) | Color tone x | Color tone y | Emission brightness (%) | Quantum efficiency (%) |
|---|---|---|---|---|---|
| 107 | 500 | 0.636 | 0.356 | 101 | 102 |
| 108 | 1000 | 0.636 | 0.356 | 98 | 99 |
| 109 | 5000 | 0.636 | 0.356 | 88 | 105 |

Examples 104 to 109 are nitride phosphors which are represented by $(Ca_{0.285}Sr_{0.685}Eu_{0.03})_2Si_5N_8$ and contain a fixed amount of B. The luminescence brightness and quantum efficiency are shown by a relative value based on the basis of the nitride phosphor Example 104.

In Examples 104 to 109, the concentration of Eu is 0.03. The concentration of Eu is a molar ratio against the molar concentration of a mixture of Ca and Sr.

Examples 104 to 109 was produced by about the same production process as that of Examples 84 to 87. Examples 104 to 109 used a mixture of Ca and Sr in place of Ca used in Examples 84 to 87, and the molar ratio of Ca:Sr is 3:7.

From Table 7, when 5000 ppm or less of B was added, and in particular, 10 ppm or more and 1000 ppm or less of B was added, the luminescence brightness and quantum efficiency exhibited high values.

The mean particle diameter of the nitride phosphors of Examples 104 to 109 was 1.6 to 2.0 μm.

Examples 110 to 169 Related to Mode 3 of Operation

Examples 110 to 124

Figure 14:
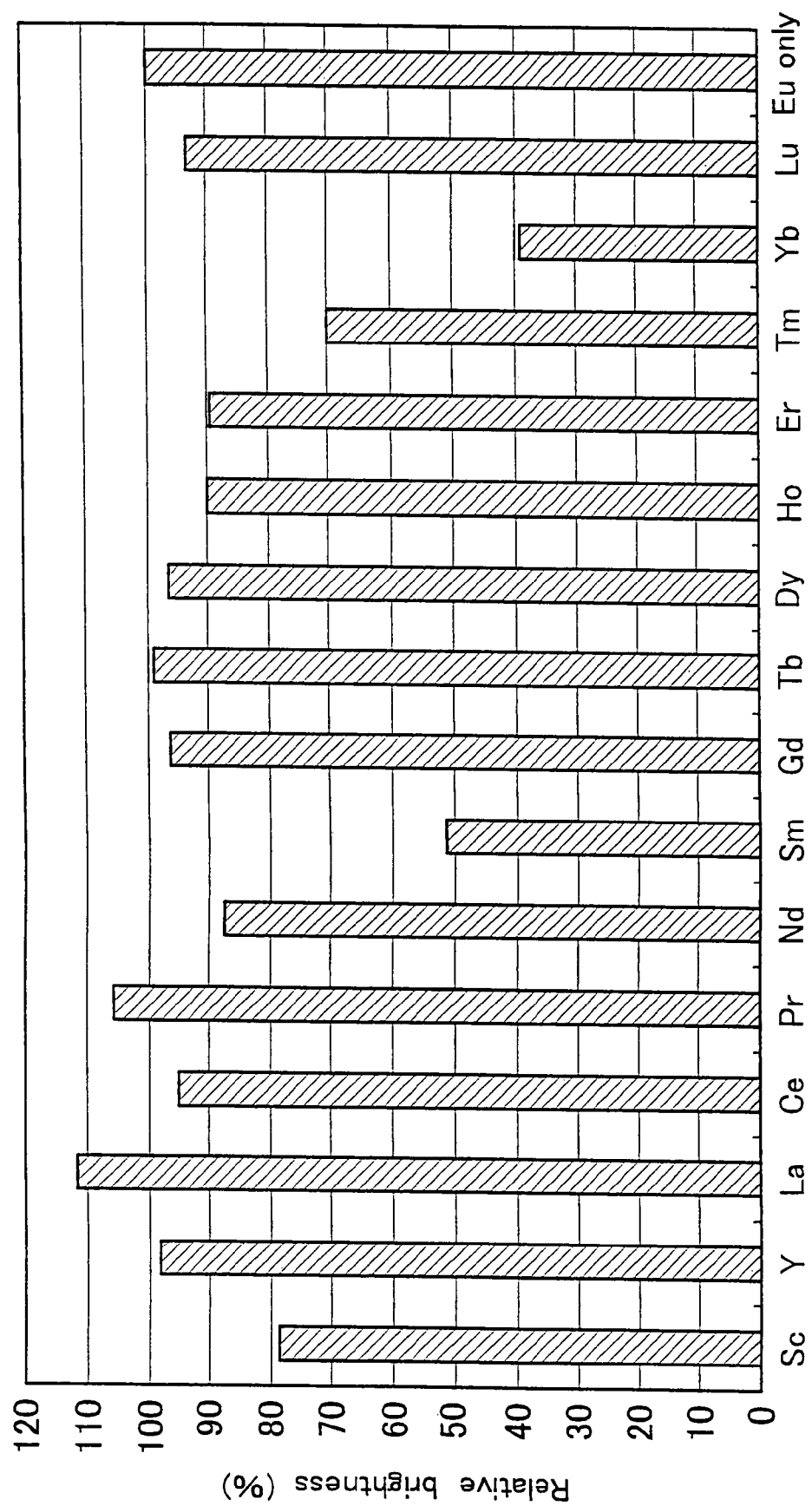
FIG. 14 is a graph comparing the luminescence brightness of the phosphors of Examples 110 to 124 which variously changed the co-activator WR in the base nitride phosphor Ca—Si—N:Eu, WR.

Examples 110 to 124 produced phosphors which variously changed the co-activator WR in the base nitride phosphor, Ca—Si—N:Eu,WR. Table 8 shows the chemical properties and physical properties of the phosphors of Examples 110 to 124 which variously changed the co-activator WR in the base nitride phosphor, Ca—Si—N:Eu,WR. FIG. 14 shows the luminescence brightness of the phosphors of Examples 110 to 124 which variously changed the co-activator WR in the base nitride phosphor, Ca—Si—N:Eu,WR.

TABLE 8

| | Concentration of Eu | Rare earth metal | Addition concentration | Ion radius (Å) | Color tone x | Color tone y | Emission brightness (%) | Quantum efficiency (%) | Peak wave length (nm) | Afterglow 1/10 (ms) | Content O (%) | Content N (%) |
|---|---|---|---|---|---|---|---|---|---|---|---|---|
| Comparative Example 1 | 0.0075 | — | — | 1.13 | 0.581 | 0.410 | 100 | 100 | 609 | 18.5 | 1.3 | 30.0 |
| Example 110 | 0.0075 | Sc | 0.015 | 0.83 | 0.579 | 0.412 | 78.4 | 77.6 | 609 | 11.0 | 1.4 | 27.9 |
| Example 111 | 0.0075 | Y | 0.015 | 1.06 | 0.582 | 0.409 | 98.2 | 99.1 | 609 | 6.5 | 1.2 | 30.8 |
| Example 112 | 0.0075 | La | 0.015 | 1.22 | 0.583 | 0.409 | 111.4 | 111.9 | 609 | 12.5 | 1.1 | 33.5 |
| Example 113 | 0.0075 | Ce | 0.015 | 1.18 | 0.582 | 0.409 | 92.8 | 94.7 | 609 | 20.5 | 1.3 | 31.1 |
| Example 114 | 0.0075 | Pr | 0.015 | 1.16 | 0.586 | 0.408 | 105.4 | 106.8 | 609 | 23.5 | 1.4 | 30.4 |
| Example 115 | 0.0075 | Nd | 0.015 | 1.15 | 0.582 | 0.409 | 87.4 | 91.2 | 621 | 74.5 | 1.3 | 31.8 |
| Example 116 | 0.0075 | Sm | 0.015 | 1.13 | 0.582 | 0.410 | 51.1 | 50.8 | 608 | 2.5 | 1.3 | 31.5 |
| Example 117 | 0.0075 | Gd | 0.015 | 1.11 | 0.582 | 0.409 | 96.4 | 97.2 | 609 | 44.5 | 1.4 | 30.2 |
| Example 118 | 0.0075 | Tb | 0.015 | 1.09 | 0.582 | 0.409 | 99.1 | 100.4 | 610 | 26.0 | 1.3 | 30.7 |
| Example 119 | 0.0075 | Dy | 0.015 | 1.07 | 0.585 | 0.409 | 96.4 | 96.7 | 609 | 41.5 | 1.5 | 30.3 |
| Example 120 | 0.0075 | Ho | 0.015 | 1.05 | 0.584 | 0.410 | 89.7 | 89.5 | 609 | 11.0 | 1.4 | 30.0 |
| Example 121 | 0.0075 | Er | 0.015 | 1.04 | 0.583 | 0.410 | 89.4 | 89.1 | 609 | 8.5 | 1.3 | 29.9 |
| Example 122 | 0.0075 | Tm | 0.015 | 1.04 | 0.579 | 0.411 | 70.0 | 70.1 | 609 | 199.0 | 1.5 | 26.0 |
| Example 123 | 0.0075 | Yb | 0.015 | 1 | 0.579 | 0.410 | 39.0 | 39.4 | 610 | 2.0 | 1.3 | 29.8 |
| Example 124 | 0.0075 | Lu | 0.015 | 0.99 | 0.581 | 0.410 | 93.1 | 94.1 | 611 | 25.5 | 1.3 | 30.8 |

The phosphors of Examples 110 to 124 are represented by the general formula, $(Ca_{0.9775}, Eu_{0.0075}, Z_{0.015})_2Si_5N_8$. In the phosphors of Examples 110 to 124, oxygen is contained by 1.0 to 1.6%. In Examples 110 to 124, the concentration of Eu is 0.0075. The concentration of Eu is a molar ratio against the molar concentration of Ca. Further, the rare earth elements of Sc, Y, La, Ce, Pr, Nd, Sm, Gd, Tb, Dy, Ho, Er, Tm, Yb and Lu were used for the co-activator WR. The concentration of the co-activator WR added is 0.015. The concentration of WR added is a molar ratio for the molar concentration of Ca. Comparative Example 1 is a phosphor in which no co-activator WR is added and only Eu was added, and is shown as comparison.

Further, Table 8 and FIG. 14 are not the data which compared the optimum value of the phosphors of Examples 110 to 124 in which WR was co-activated, and is one example. For example, as shown in Table 9 and FIG. 15 to FIG. 19, when the compounding amounts of the co-activator La and the activator Eu, and the like were changed, the phosphor of Example which is different from the compounding amount of the co-activator La of Table 8 showed the highest value of the luminescence brightness. The phosphor having higher luminescence brightness than that of the phosphors of Examples 110 to 124 can be produced by changing the compounding amount of the rare earth element, firing condition and the like.

Firstly, calcium nitride, silicone nitride, europium oxide and the oxide of the rare earth element are mixed. The oxides of the rare earth element are represented by $Z_2O_3$ in general, but cerium, praseodymium, and terbium are exceptional, and they are respectively cerium oxide, $CeO_2$, praseodymium oxide, $Pr_6O_{11}$, and terbium, $Tb_4O_7$. In Examples 110 to 124, the compounding ratio (molar ratio) of calcium nitride, $Ca_3N_2$, silicone nitride, $Si_3N_2$, europium oxide, $Eu_2O_3$, and the oxides of the rare earth element which are raw materials is adjusted to be Ca:Si:Eu:rare earth element=1.955:5:0.015: 0.030. At least one or more of Mn, Mg, Sr, Ca, Ba, Zn, B, Al, Cu, Cr, Ni and the like may be contained by several ppm to several hundreds ppm in said raw materials.

The above-mentioned compounds are mixed, and firing is carried out. As firing conditions, they are charged in a boron nitride crucible in ammonia atmosphere, the temperature was gradually raised from room temperature over about 5 hours, and firing is carried out for 5 hours at about 1350° C., cooling was further gradually carried out until room temperature over 5 hours. The base nitride phosphor after the firing is $(Ca_{0.9775}, Eu_{0.0075}, WR_{0.015})_2Si_5N_8$.

Example 111 uses Y as the co-activator WR. It becomes low afterglow in comparison with Comparative Example 1 which does not contain the co-activator WR. It can be applied to products such as a display in which short afterglow is required, by making the phosphor be short afterglow.

Example 112 uses La as the co-activator WR. The luminescence brightness of Example 112 increases by 11.4% in comparison with Comparative Example 1. A more clear phosphor can be provided by the increase of luminescence brightness in comparison with Comparative Example 1. Further, Example 112 becomes short afterglow in comparison with Comparative Example 1.

Example 113 uses Ce as the co-activator WR. Example 113 can improve the luminescence brightness in like manner as Example 112.

Example 114 uses Pr as the co-activator WR. The luminescence brightness of Example 114 increases by 5.4% in comparison with Comparative Example 1. A more clear phosphor can be provided by the increase of luminescence brightness in comparison with Comparative Example 1. Further, the Y value of color tone is not changed in comparison with Comparative Example 1 and the x value of color tone is changed. A red component is increased in comparison with Comparative Example 1 by the change of the Y value of color tone, and a more reddish phosphor can be provided. Further, the quantum efficiency is good.

Example 115 uses Nd as the co-activator WR. The luminescence peak wave length of Example 115 is shifted to 621 nm, and it can increase reddish. Example 115 becomes long afterglow in comparison with Comparative Example 1.

Example 117 uses Gd as the co-activator WR. Example 117 can improve the luminescence brightness in like manner as Example 112.

Example 118 uses Tb as the co-activator WR. Example 118 can improve the luminescence brightness in like manner as Example 112. The quantum efficiency of Example 118 is good.

Example 119 uses Dy as the co-activator WR. Example 119 can improve the luminescence brightness in like manner as Example 112.

Example 120 uses Ho as the co-activator WR. Example 120 can improve the luminescence brightness in like manner as Example 112. Example 120 becomes short afterglow in comparison with Comparative Example 1.

Example 121 uses Er as the co-activator WR. Example 121 can improve the luminescence brightness in like manner as Example 112. Example 121 becomes short afterglow in comparison with Comparative Example 1.

Example 124 uses Lu as the co-activator WR. Example 124 can improve the luminescence brightness in like manner as Example 112. Example 124 becomes short afterglow in comparison with Comparative Example 1.

Any of the temperature characteristics of the phosphors of Examples 110 to 124 is extremely good. With respect to the temperature characteristics, when said phosphors were provided on the surface of light emitting elements, the composition of the phosphors is not changed, and the high luminescence properties are exhibited, therefore it is shown that the higher the temperature is, the more stable the phosphor is.

The phosphor related to Example uses the crucible of a boron nitride material, and firing is carried out in ammonia atmosphere. Since a furnace and a crucible are not eroded under the firing condition, impurities are not contaminated in a baked product. The crucible of a boron nitride material can be used, but it is not preferable that the crucible of a molybdenum nitride material is used. When the crucible of a molybdenum nitride material is used, it is considered that the crucible is eroded, molybdenum contaminates in the nitride phosphor, and molybdenum provokes the lowering of the luminescence properties.

Thus, the improvement of the luminescence properties can provide a luminescence material which emits light of a more brilliant white color. Further, since the improvement of the luminescence properties enhances the luminescence efficiency, the reduction of electric power can be attained.

Examples 125 to 133

Figure 15:
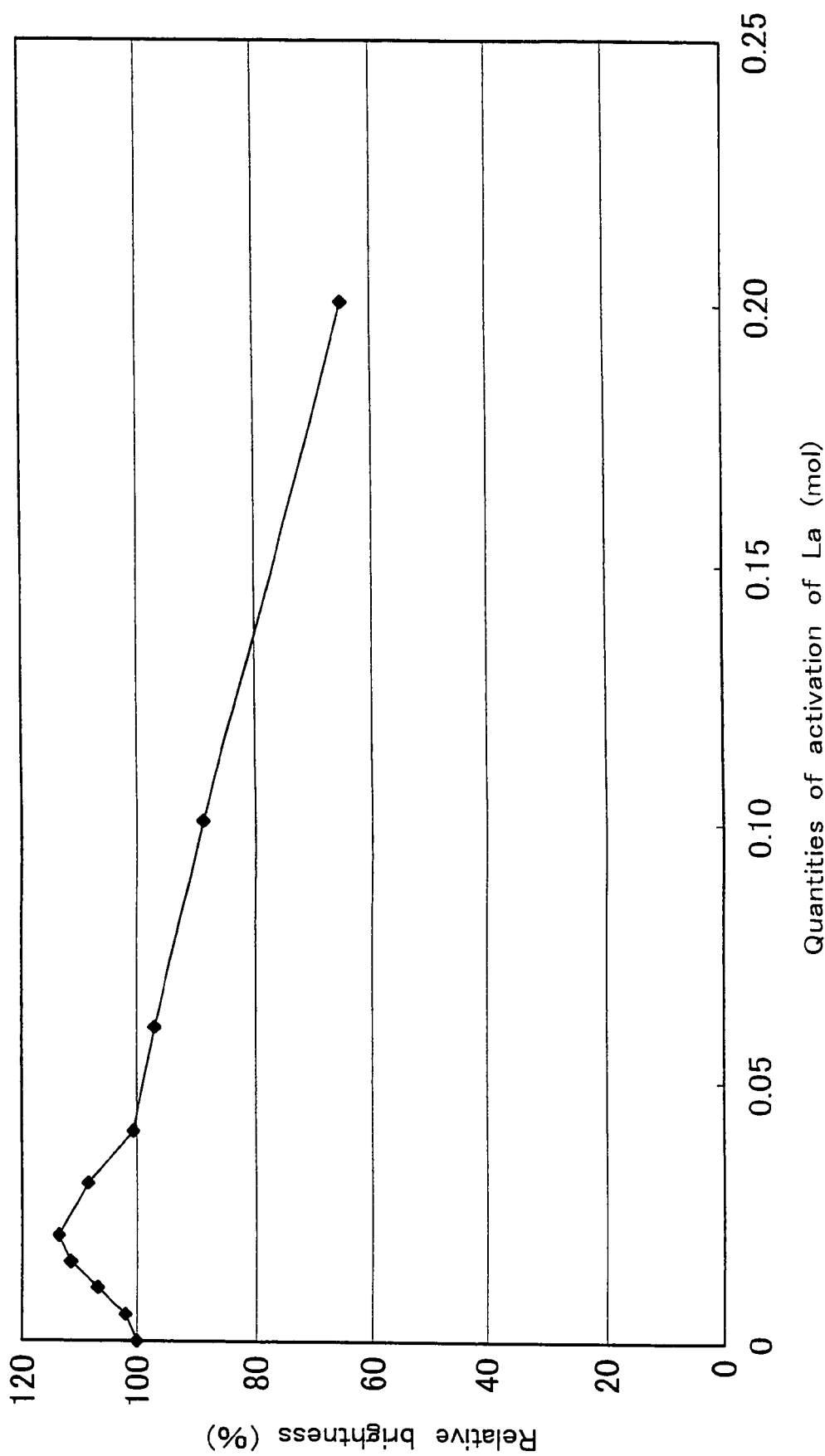
FIG. 15 is a chart showing the measurement result which measured the luminescence brightness of the phosphors of Examples 125 to 133 which variously changed the addition concentration of the co-activator La in the base nitride phosphor Ca—Si—N:Eu, La.
Figure 16:
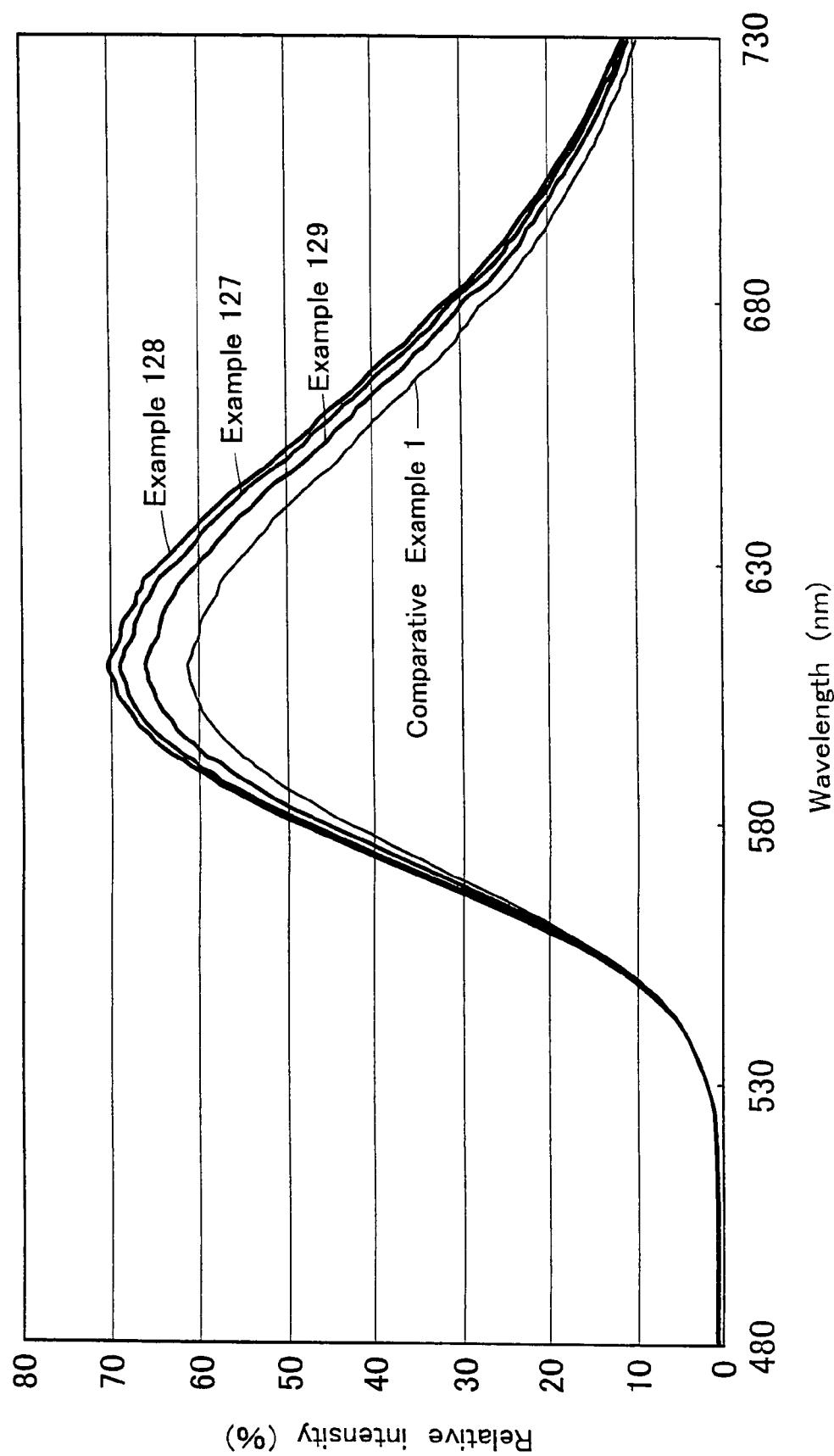
FIG. 16 is a chart showing the luminescence spectra of the phosphors of Examples 127 to 129 which variously changed the addition concentration of the co-activator La in the base nitride phosphor Ca—Si—N:Eu, La.
Figure 17:
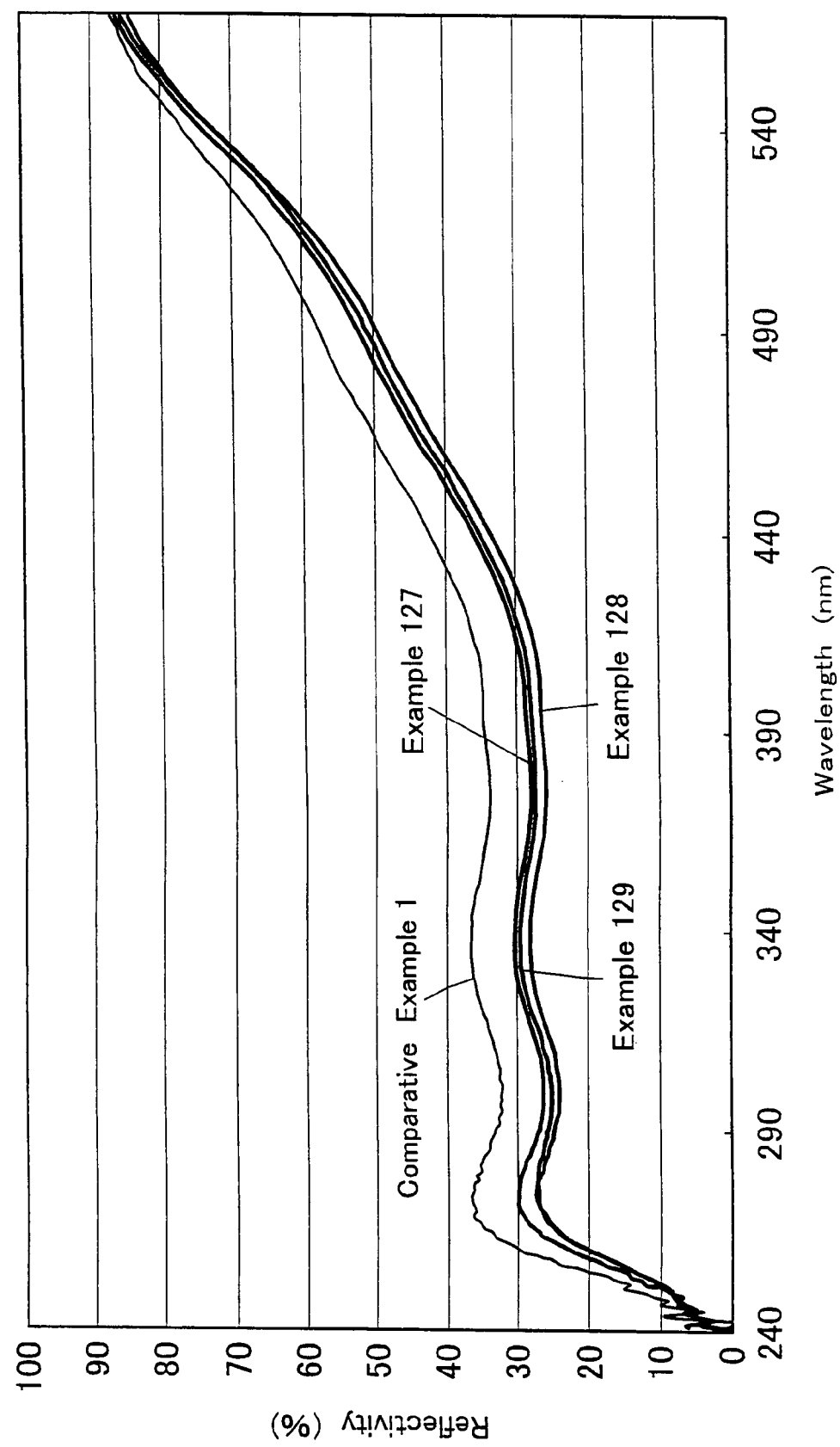
FIG. 17 is a chart showing the reflection spectra of the phosphors of Examples 127 to 129 which variously changed the addition concentration of the co-activator La in the base nitride phosphor Ca—Si—N:Eu, La.
Figure 18:
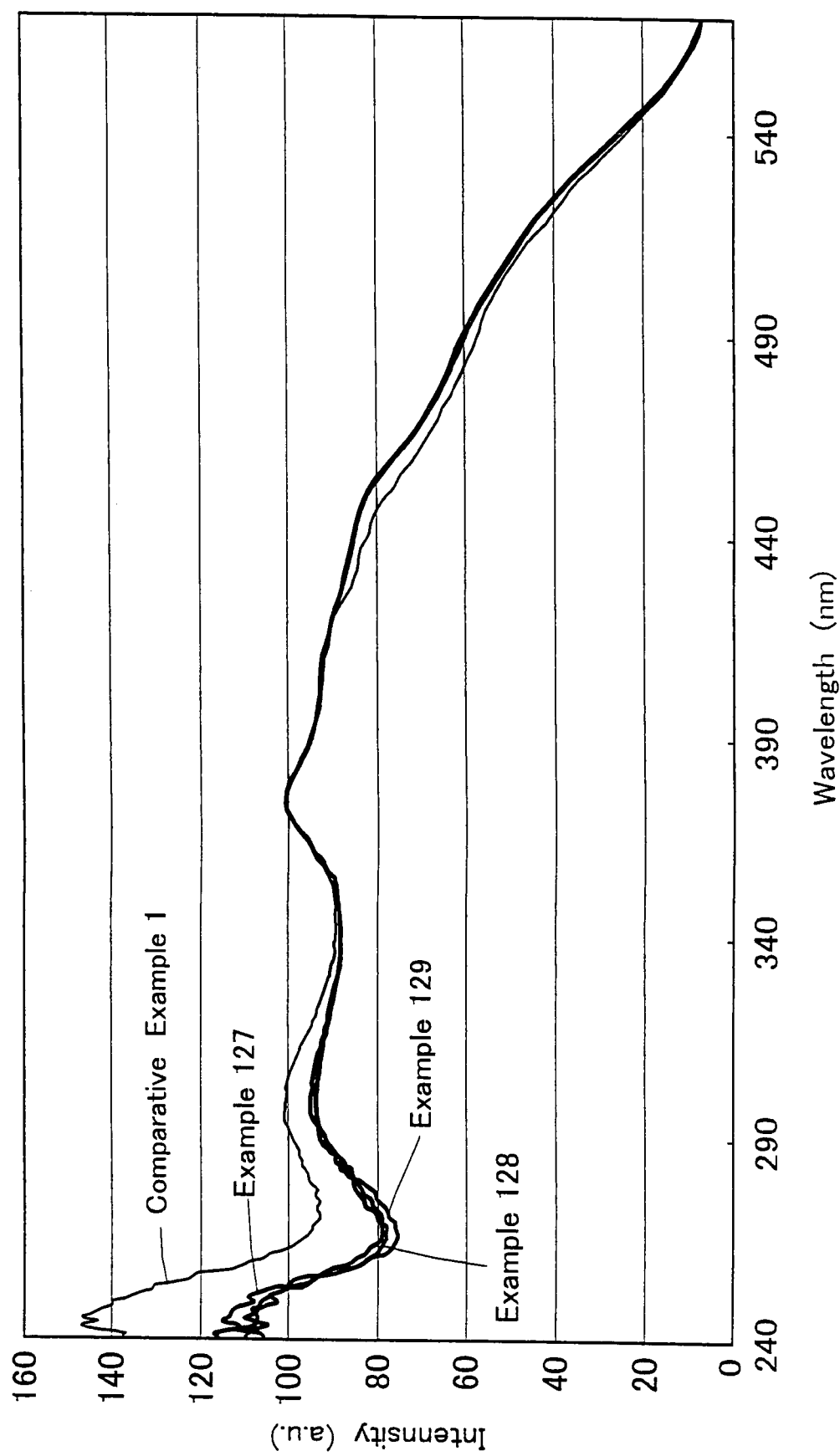
FIG. 18 is a chart showing the excitation spectrum of the phosphors of Examples 127 to 129 which variously changed the addition concentration of the co-activator La in the base nitride phosphor Ca—Si—N:Eu, La.

Examples 125 to 133 produced phosphors which variously changed the addition concentration of the co-activator La in the base nitride phosphor, Ca—Si—N:Eu,La. Table 9 shows the chemical properties and physical properties of the phosphors of Examples 125 to 133 which variously changed the addition concentration of the co-activator La in the base nitride phosphor, Ca—Si—N:Eu,La. FIG. 15 is a drawing which shows the measurement result which was obtained by measuring the luminescence brightness of the phosphors of Examples 125 to 133 which variously changed the addition concentration of the co-activator La in the base nitride phosphor, Ca—Si—N:Eu,La. FIG. 16 is a drawing which shows the luminescence spectra of the phosphors of Examples 125 to 133 which variously changed the addition concentration of the co-activator La in the base nitride phosphor, Ca—Si—N: Eu,La. FIG. 17 shows the reflection spectra of the phosphors of Examples 125 to 133 which variously changed the addition concentration of the co-activator La in the base nitride phosphor, Ca—Si—N:Eu,La. FIG. 18 shows the excitation spectra of the phosphors of Examples 125 to 133 which variously changed the addition concentration of the co-activator La in the base nitride phosphor, Ca—Si—N:Eu,La. FIG. 19A is a photo photographed the particle diameter of the phosphor of Example 128, and FIG. 19B is a photo photographed that of Example 129.

TABLE 9

| | Concentration of Eu | Addition concentration of La | Color tone x | Color tone y | Emission brightness (%) | Quantum efficiency (%) | Peak wave length (nm) | Mean particle diameter (μm) | Temperature characteristics 100° C. | 200° C. | 35° C. | Content O (%) | N (%) |
|---|---|---|---|---|---|---|---|---|---|---|---|---|---|
| Comparative Example 1 | 0.0075 | 0 | 0.581 | 0.410 | 100 | 100 | 609 | 2.8 | 99.5 | 75.4 | 99.1 | 1.3 | 31.6 |
| Example 125 | 0.0075 | 0.005 | 0.581 | 0.410 | 101.8 | 101.7 | 609 | 3.0 | 98.5 | 74.3 | 98.7 | 1.2 | 31.6 |
| Example 126 | 0.0075 | 0.01 | 0.582 | 0.409 | 106.6 | 107.0 | 609 | 3.3 | 98.2 | 74.0 | 98.7 | 1.2 | 31.9 |
| Example 127 | 0.0075 | 0.015 | 0.583 | 0.409 | 111.4 | 111.9 | 609 | 3.6 | 98.8 | 75.3 | 99.8 | 1.3 | 31.2 |
| Example 128 | 0.0075 | 0.02 | 0.583 | 0.409 | 113.5 | 114.3 | 609 | 3.7 | 98.6 | 74.9 | 99.4 | 1.4 | 31.3 |
| Example 129 | 0.0075 | 0.03 | 0.582 | 0.410 | 108.4 | 105.9 | 608 | 3.6 | 99.0 | 77.4 | 98.7 | 1.4 | 30.9 |
| Example 130 | 0.0075 | 0.04 | 0.582 | 0.409 | 100.6 | 101.5 | 609 | 3.5 | 99.2 | 74.4 | 97.9 | 1.7 | 30.1 |
| Example 131 | 0.0075 | 0.06 | 0.582 | 0.410 | 96.7 | 98.0 | 609 | 3.6 | 98.0 | 70.6 | 98.6 | 1.9 | 29.6 |
| Example 132 | 0.0075 | 0.1 | 0.582 | 0.409 | 88.3 | 89.9 | 609 | 3.7 | 98.2 | 70.8 | 95.9 | 2.4 | 28.4 |
| Example 133 | 0.0075 | 0.2 | 0.582 | 0.409 | 64.6 | 66.6 | 610 | 3.9 | 98.1 | 69.9 | 98.1 | 3.6 | 26.5 |

The phosphor is represented by the general formula, $(Ca_{(1-0.0075-x)}Eu_{0.0075}La_x)_2Si_5N_8$ in which Mn was added. In the phosphors of Examples 125 to 133, oxygen is contained by 1.0 to 1.6%. In Examples 125 to 133, the concentration of Eu is 0.0075. In Examples 125 to 133, there were prepared the phosphors in which the concentration of La was changed to 0.005, 0.01, 0.015, 0.02, 0.03, 0.04, 0.06, 0.1 and 0.2. Examples 125 to 133 use $La_2O_3$ as a raw material. Comparative Example 1 is a phosphor in which no co-activator La is added and only Eu was added, and is shown as comparison.

Since Examples 125 to 133 carry out the similar production steps as Examples 110 to 124, the steps which pass the similar constitution are abbreviated. In said raw materials, at least one or more of Mg, Sr, Ca, Ba, Zn, B, Al, Cu, Mn, Cr and Ni may be contained by several ppm to several hundreds ppm.

In Examples 125 to 133, the x value of color tone and the y value of color tone are nearly the same. On the contrary, the luminescence brightness is improved in accordance with the gradual increase of the addition concentration of La. This is considered to be caused by the flux effect. Although the luminescence brightness was peak when the addition concentration of La is 0.02, it is lowered afterward. This is considered to be caused by concentration quenching.

Further, the afterglows of Examples 125 to 133 become short in comparison with Comparative Example 1.

Further, any of the temperature characteristics of Examples 125 to 133 is extremely good.

The mean particle diameter of Example 128 is 3.7 μm, and the mean particle diameter of Example 20 is 3.6 μm. To the contrary, the mean particle diameter of Comparative Example 1 is 2.8 μm. The luminescence brightness could be improved when the mean particle diameter is 3.0 μm or more, from this fact.

Examples 134 to 144

Examples 134 to 144 produced phosphors which variously changed the addition concentration of the co-activator Pr in the base nitride phosphor, Ca—Si—N:Eu,Pr. Table 10 shows the chemical properties and physical properties of the phosphors of Examples 134 to 144 which variously changed the addition concentration of the co-activator Pr in the base nitride phosphor, Ca—Si—N:Eu,Pr.

TABLE 10

| | Concentration of Eu | Addition concentration of Pr | Color tone x | Color tone y | Emission brightness (%) | Quantum efficiency (%) | Peak wave length (nm) | Mean particle diameter (μm) |
|---|---|---|---|---|---|---|---|---|
| Comparative Example 1 | 0.0075 | 0 | 0.581 | 0.410 | 100.0 | 100 | 609 | 2.8 |
| Example 134 | 0.0075 | 0.0025 | 0.582 | 0.410 | 103.3 | 102.8 | 609 | 2.7 |
| Example 135 | 0.0075 | 0.005 | 0.582 | 0.410 | 105.7 | 105.7 | 610 | 2.9 |
| Example 136 | 0.0075 | 0.0075 | 0.582 | 0.409 | 101.8 | 102.2 | 610 | 3.4 |
| Example 137 | 0.0075 | 0.01 | 0.582 | 0.409 | 98.8 | 99.3 | 610 | 3.3 |
| Example 138 | 0.0075 | 0.0125 | 0.582 | 0.409 | 96.7 | 97.2 | 610 | 3.4 |
| Example 139 | 0.0075 | 0.015 | 0.582 | 0.409 | 96.5 | 97.2 | 610 | 3.1 |
| Example 140 | 0.0075 | 0.0175 | 0.582 | 0.410 | 96.1 | 97.2 | 610 | 3.3 |
| Example 141 | 0.0075 | 0.02 | 0.582 | 0.409 | 93.4 | 94.3 | 610 | 3.1 |
| Example 142 | 0.0075 | 0.03 | 0.581 | 0.410 | 94.6 | 95.4 | 610 | 3.6 |
| Example 143 | 0.0075 | 0.06 | 0.581 | 0.410 | 84.4 | 86.1 | 610 | 3.5 |
| Example 144 | 0.0075 | 0.1 | 0.581 | 0.411 | 70.3 | 71.9 | 613 | 3.3 |

The phosphor is represented by the general formula, $(Ca_{(1-0.0075-X)}Eu_{0.0075}Pr_X)_2Si_5N_8$ in which Mn was added. In the phosphors of Examples 134 to 144, oxygen is contained by 1.0 to 1.6%. In Examples 134 to 144, the concentration of Eu is 0.0075. In Examples 134 to 144, there were prepared the phosphors in which the concentration of Pr was changed to 0.0025, 0.005, 0.0075, 0.01, 0.0125, 0.015, 0.0175, 0.02, 0.03, 0.06 and 0.1. Examples 134 to 144 use $Pr_6O_{11}$ as a raw material. Comparative Example 1 is a phosphor in which no co-activator Pr is added and only Eu was added, and is shown as comparison.

Since Examples 134 to 144 carry out the similar production steps as Examples 110 to 124, the steps which pass the similar constitution are abbreviated. In said raw materials, at least one or more of Mg, Sr, Ca, Ba, Zn, B, Al, Cu, Mn, Cr and Ni may be contained by several ppm to several hundreds ppm.

In Examples 134 to 144, the x value of color tone and the y value of color tone are nearly the same. The peak wave lengths are also about the same. To the contrary, the luminescence brightness is improved in accordance with the gradual increase of the addition concentration of Pr. This is considered to be caused by the sensitization effect. Although the luminescence brightness was peak when the addition concentration of Pr is 0.005, it is lowered afterward. This is considered to be caused by concentration quenching. The luminescence brightness of Example 139 was improved.

Any of the temperature characteristics of Examples 134 to 144 is extremely good. For example, the temperature characteristic of Example 135 is 99.2% at 10° C., and 68.1% at 200° C. The temperature characteristic of Example 139 is 98.6% at 100° C., and 74.8% at 200° C.

In Examples 136 to 144, the phosphors having a mean particle diameter of 3.0 μm or more are prepared, and showed high luminescence brightness.

Examples 145 to 148

Examples 145 to 148 produced phosphors which variously changed the addition concentration of the co-activator Eu in the base nitride phosphor, Ca—Si—N:Eu,Pr. Table 11 shows the chemical properties and physical properties of the phosphors of Examples 145 to 148 which variously changed the Eu concentration in the base nitride phosphor, Ca—Si—N:Eu,Pr.

The phosphor is represented by the general formula, $(Ca_{(1-Y-0.005)}Eu_YPr_{0.005})_2Si_5N_8$ in which Mn was added. In the phosphors of Examples 145 to 148, oxygen is contained by 1.0 to 1.6%. In Examples 145 to 148, the concentration of Pr is 0.005. In Examples 145 to 148, there were prepared the phosphors in which the concentration of Eu was changed to 0.0075, 0.0015, 0.03 and 0.06. Examples 145 to 148 use $Pr_6O_{11}$ as a raw material.

Since Examples 145 to 148 carry out the similar production steps as Examples 1 to 15, the steps which pass the similar constitution are abbreviated. In said raw materials, at least one or more of Mg, Sr, Ca, Ba, Zn, B, Al, Cu, Mn, Cr and Ni may be contained by several ppm to several hundreds ppm.

In Examples 145 to 148, the x value of color tone and the y value of color tone differ depending on the concentration of Eu. In accordance with the increase of concentration of Eu, red element is increasing, then the phosphor that has a more reddish color can be provided. Additionally, in accordance with the increase of concentration of Eu, the luminescence brightness is improved. In particular, the luminescence brightness is extremely high for any of Examples 146 and 147. Any of the temperature characteristics of Examples 145 to 148 is extremely good.

Examples 149 to 155

Examples 149 to 155 produced phosphors which variously changed the mixing ratio of Sr and Ca in the base nitride phosphor, Ca—Si—N:Eu,La. Table 12 shows the chemical properties and physical properties of the phosphors of Examples 149 to 155 which variously changed the addition concentration of the co-activator in the base nitride phosphor, Ca—Si—N:Eu,la.

TABLE 11

|  | Concentration of Eu | Addition concentration of Pr | Color tone x | Color tone y | Emission brightness (%) | Quantum efficiency (%) | Peak wave length (nm) |
| --- | --- | --- | --- | --- | --- | --- | --- |
| Comparative Example 1 | 0.0075 | 0 | 0.581 | 0.410 | 100.0 | 100 | 609 |
| Example 145 | 0.0075 | 0.005 | 0.582 | 0.410 | 105.7 | 105.7 | 610 |
| Example 146 | 0.015 | 0.005 | 0.584 | 0.407 | 112.3 | 113.9 | 609 |
| Example 147 | 0.03 | 0.005 | 0.588 | 0.403 | 117.3 | 123.9 | 610 |
| Example 148 | 0.06 | 0.005 | 0.590 | 0.401 | 109.2 | 119.6 | 612 |

TABLE 12

| | Sr/Ca | Concentration of Eu | Addition concentration of La | Color tone x | Color tone y | Emission brightness (%) | Quantum efficiency (%) | Peak wave length (nm) |
|---|---|---|---|---|---|---|---|---|
| Comparative Example 1 | 0/10 | 0.0075 | 0 | 0.581 | 0.410 | 100.0 | 100 | 609 |
| Example 149 | 0/10 | 0.0075 | 0.02 | 0.583 | 0.409 | 113.5 | 114.3 | 609 |
| Example 150 | 3/7 | 0.0075 | 0.02 | 0.595 | 0.395 | 63.7 | 76.3 | 624 |
| Example 151 | 4/6 | 0.0075 | 0.02 | 0.608 | 0.382 | 64.0 | 85.9 | 627 |
| Example 152 | 5/5 | 0.0075 | 0.02 | 0.618 | 0.372 | 67.0 | 100.2 | 634 |
| Example 153 | 6/4 | 0.0075 | 0.02 | 0.615 | 0.374 | 66.1 | 94.7 | 633 |
| Example 154 | 7/3 | 0.0075 | 0.02 | 0.612 | 0.378 | 70.9 | 93.4 | 626 |
| Example 155 | 10/0 | 0.0075 | 0.02 | 0.604 | 0.387 | 89.2 | 95.4 | 618 |

The phosphor is represented by the general formula, $(Sr_TCa_{(1-T-0.0075-0.005)}Eu_{0.0075}La_{0.005})_2Si_5N_8$. In the phosphors of Examples 149 to 155, oxygen is contained by 1.0 to 2.0%. In Examples 149 to 155, the concentration of Eu is 0.0075 and the addition concentration of La is 0.02. Examples 149 to 155 use $La_6O_{11}$ as a raw material. Comparative Example 1 is a phosphor in which ratio is Sr:Ca=0:10, no co-activator La is added and only Eu was added, and is shown as comparison.

Since Examples 149 to 155 carry out the similar production steps as Examples 110 to 124, the steps which pass the similar constitution are abbreviated. In said raw materials, at least one or more of Mg, Sr, Ca, Ba, Zn, B, Al, Cu, Mn, Cr and Ni may be contained by several ppm to several hundreds ppm.

Since the phosphors of Examples 149 to 155 are the phosphor of mix crystal type of Sr and Ca, the phosphor of mix crystal type of Sr and Ca changes the color tone and peak wave length. The peak wave length shifts to a long wave length side in accordance with the increase of Sr. The peak wave length shifts to the longest wave length side at Sr:Ca=5:5. A reddish warm color-base phosphor having a peak wave length at a longer wave length side than Ca—Si—N:Eu,WR can be produced thereby. In Examples 149 to 155, the x value of color tone and the y value of color tone are changed by the mixing ratio of Sr and Ca. The phosphor having a desired color tone can be produced thereby. For example, the light emitting device mixing the phosphor of Ca—Si—N:Eu,La and the phosphor of Sr—Ca—Si—O—N:Eu,La can provide a light emitting device having a desired peak wave length at a range of 609 nm to 634 nm. Any of the temperature characteristics of Examples 149 to 155 is extremely good.

Examples 156 to 160

Examples 156 to 160 produced phosphors which variously changed the addition concentration of the co-activator Tb in the base nitride phosphor, Ca—Si—N:Eu,Tb. Table 13 shows the chemical properties and physical properties of the phosphors of Examples 156 to 160 which variously changed the addition concentration of the co-activator Tb in the base nitride phosphor, Ca—Si—N:Eu,Tb.

TABLE 13

| | Concentration of Eu | Addition concentration of Tb | Color tone x | Color tone y | Emission brightness (%) | Quantum efficiency (%) | Peak wave length (nm) |
|---|---|---|---|---|---|---|---|
| Comparative Example 1 | 0.0075 | 0 | 0.581 | 0.410 | 100.0 | 100.0 | 609 |
| Example 156 | 0.0075 | 0.015 | 0.582 | 0.409 | 99.1 | 100.4 | 610 |
| Example 157 | 0.0075 | 0.03 | 0.579 | 0.412 | 82.0 | 81.7 | 609 |
| Example 158 | 0.0075 | 0.06 | 0.579 | 0.412 | 77.8 | 78.0 | 610 |
| Example 159 | 0.0075 | 0.1 | 0.578 | 0.412 | 66.1 | 66.4 | 609 |
| Example 160 | 0.0075 | 0.2 | 0.576 | 0.414 | 43.2 | 43.7 | 609 |

The phosphor is represented by the general formula, $(Ca_{(1-0.0075-x)}Eu_{0.0075}Tb_x)_2Si_5N_8$ to which Mn was added. In the phosphors of Examples 156 to 160, oxygen is contained by 1.0 to 2.0%. In Examples 156 to 160, the concentration of Eu is 0.0075. In Examples 156 to 160, there were prepared the phosphors in which the concentration of Tb was changed to 0.015, 0.03, 0.06, 0.1 and 0.2. Examples 156 to 160 use $Tb_4O_7$ as a raw material. Comparative Example 1 is a phosphor in which no co-activator Tb is added and only Eu was added, and is shown as comparison.

Since Examples 156 to 160 carry out the similar production steps as Examples 110 to 124, the steps which pass the similar constitution are abbreviated. In said raw materials, at least one or more of Mg, Sr, Ca, Ba, Zn, B, Al, Cu, Mn, Cr and Ni may be contained by several ppm to several hundreds ppm. Any of the temperature characteristics of Examples 156 to 160 is good. For example, the temperature characteristic of Examples 156 is 98.9% at 100° C. and 77.0% at 200° C. The temperature characteristic of Examples 159 is 97.2% at 100° C. and 69.4% at 200° C., and it is extremely good.

Examples 161 to 165

Examples 161 to 165 produced phosphors which variously changed the addition concentration of the co-activator Nd in the base nitride phosphor, Ca—Si—N:Eu,Nd. Table 14 shows the chemical properties and physical properties of the phosphors of Examples 161 to 165 which variously changed the addition concentration of the co-activator Nd in the base nitride phosphor, Ca—Si—N:Eu,Nd.

one or more of Mg, Sr, Ca, Ba, Zn, B, Al, Cu, Mn, Cr and Ni may be contained by several ppm to several hundreds ppm.

In Examples 161 to 165, the x value of color tone and the y value of color tone are varied in accordance with the increase of the addition concentration of Nd. The x value of color tone is lowered and the y value of color tone is raised in accordance with the increase of the addition concentration of Nd. The color becomes slightly yellow red in comparison with Example 163 thereby. On the other hand, the peak wave length is shifted to a long wave length side in accordance with the increase of the addition concentration of Nd. Afterglow becomes short by the addition of Nd. Any of the temperature characteristics of Examples 161 to 165 is extremely good. For example, the temperature characteristic of Examples 161 is 99.7% at 100° C. and 77.6% at 200° C. The temperature characteristic of Examples 164 is 99.6% at 100° C. and 76.7% at 200° C., and it is extremely good.

Example 166

The light emitting device of Example 166 related to the present invention is the type 1 light emitting device which was constituted using the phosphor of Example 135 related to the present invention, and a white light emitting device which can emit light of a reddish white color.

As the phosphor 11 of the light emitting device used for Example 166, there is used a phosphor which mixed the phosphor of Example 135 and the yttrium-gadolinium-aluminum oxide fluorescent substance (Y—Gd—Al—O:Ce) activated by cerium. Example 135 is the phosphor of

TABLE 14

| | Concentration of Eu | Addition concentration of Nd | Color tone x | Color tone y | Emission brightness (%) | Quantum efficiency (%) | Peak wave length (nm) |
|---|---|---|---|---|---|---|---|
| Comparative Example 1 | 0.0075 | 0 | 0.581 | 0.410 | 100.0 | 100 | 609 |
| Example 161 | 0.0075 | 0.015 | 0.582 | 0.406 | 87.4 | 91.2 | 621 |
| Example 162 | 0.0075 | 0.03 | 0.580 | 0.412 | 68.8 | 71.7 | 621 |
| Example 163 | 0.0075 | 0.06 | 0.579 | 0.412 | 59.5 | 63.1 | 622 |
| Example 164 | 0.0075 | 0.1 | 0.578 | 0.413 | 48.9 | 53.4 | 623 |
| Example 165 | 0.0075 | 0.2 | 0.572 | 0.416 | 26.7 | 30.1 | 624 |

The phosphor is represented by the general formula, $Ca_{(1-0.0075-x)}Eu_{0.0075}Nd_x)_2Si_5N_8$ to which Mn was added. In the phosphors of Examples 161 to 165, oxygen is contained by 1.0 to 2.1%. In Examples 161 to 165, the concentration of Eu is 0.0075. In Examples 161 to 165, there were prepared the phosphors in which the concentration of Nd was changed to 0.015, 0.03, 0.06, 0.1 and 0.2. Examples 161 to 165 use $Nd_2O_3$ as a raw material. Comparative Example 1 is a phosphor in which no co-activator Nd is added and only Eu was added, and is shown as comparison.

Since Examples 161 to 165 carry out the similar production steps as Examples 1 to 15, the steps which pass the similar constitution are abbreviated. In said raw materials, at least Ca—Si—O—N:Eu,Pr. A light emitting device which is prepared as a comparison does not contain the phosphor of Example 26 and contains only the yttrium-gadolinium-aluminum oxide fluorescent substance activated by cerium as the phosphor. The light emitting device of Example 166 and the light emitting device of Comparative Example use the phosphor of $(Y_{0.8}Gd_{0.2})_3Al_5O_{12}$:Ce. Namely, the light emitting device of Comparative Example emits light by combination of a blue light emitting element and the phosphor of (Y—Gd—Al—O:Ce).

The weight ratio of the phosphor 11 in the light emitting device of Example 166 is the coating member:the phosphor (of Y—Gd—Al—O:Ce):the phosphor of Example 26=10:

3.8:0.6. On the other hand, the weight ratio of the phosphor of the light emitting device of Comparative Example is mixed at the coating member:the phosphor of (Y—Gd—Al—O:Ce)=10:3.6.

The light emitting device 1 of the present Example 166 is compared with the light emitting device 2 of Comparative Example using only a blue light emitting element and the phosphor of Y—Gd—Al—O:Ce. The color tone of the light emitting device of the present Example 166 is hardly changed in comparison with the light emitting device 2 of Comparative Example, but the color rendering property is improved. The light emitting device 2 of Comparative Example was deficient in the specific color rendering index R9, but R9 is improved in the light emitting device 1 of the present Example 166. The specific color rendering index R9 is a value obtained by measuring the color deviation of a red color having comparatively high chroma. Further, it is improved to a value of nearly 100% than other specific color rendering indexes R8, R10 and the like. The lamp efficiency indicates a high value.

Example 167

The light emitting device of Example 167 related to the present invention is an electric bulb color light emitting device which was constituted using the phosphor of Example 154. The light emitting device of Example 167 is the type 1 light emitting device, and has the constitution of FIG. 1. FIG. 20 is a drawing showing the chromaticity coordinate of the light emitting device 3 of Example 167.

In the light emitting device of Example 167, the phosphor 11 uses a phosphor which mixed the phosphor of Example 154 and the yttrium-gallium-aluminum oxide fluorescent substance (Y—Ga—Al—O:Ce) activated by cerium. More specifically, in the light emitting device of Example 167, the phosphor of the composition of $Y_3(Al_{0.8}Ga_{0.2})_5O_{12}$:Ce is used as the yttrium-gallium-aluminum oxide fluorescent substance activated by cerium.

When the phosphor of the composition of $Y_3(Al_{0.8}Ga_{0.2})_5O_{12}$:Ce is excited by a light of wave length Ex=460 nm, the peak wave length of the luminescence spectrum is 530 to 540 nm. Similarly, the peak wave length of the phosphor of Example 158 is 625 nm.

The weight ratio of the phosphor 11 is mixed by the weight ratio of the coating member:the phosphor of (Y—Ga-M-O:Ce):the phosphor of Example 158=10:4.0:1.08.

The light emitting device of Example 167 using the phosphor which was thus mixed emits light of an electric bulb color. According to FIG. 20 showing the chromaticity coordinate of the light emitting device 3 of Example 167, the x value of color tone and the y value of color tone are situated at a warm color-base white luminescence region. The specific color rendering index R9 of the light emitting device 3 of Example 167 is also 60%, and the color rendering property is improved. The peak wave length is also situated nearby 620 nm at a red color region, and an electric bulb color light emitting device can be obtained. The color temperature and color rendering property Ra are also good and it has the luminescence property nearby an electric bulb color. Further, the light emitting device 3 of Example 167 has the high luminescence property of 19 to 22 lm/W.

Example 168

The light emitting device of Example 168 is the type 2 light emitting device 101 which has an InGaN layer having a luminescence peak of 460 nm at a blue region as a light emitting layer, and uses the phosphor of Example 1.

In the light emitting device of Example 168, the phosphor is a phosphor in which an indirect luminescence spectrum which was reflected from a reflection plate and a luminescence spectrum which was directly emitted from the light emitting element 101 are irradiated on the phosphor 108, and light having a blue luminescence spectrum which was emitted from the light emitting element 101 emits light of a white color. A desired luminescence spectrum can be obtained by doping phosphors emitting green light such as $SrAl_2O_4$:Eu, $Y_2SiO_5$:Ce,Tb, $MgAl_{11}O_{19}$:Ce,Tb, $Sr_7Al_{12}O_{25}$:Eu (at least one or more among Mg, Ca, Sr and Ba)$Ga_2S_4$:Eu; phosphors emitting blue light such as $Sr_5(PO_4)_3Cl$:Eu, $(SrCaBa)_5(PO_4)_3Cl$:Eu, $(BaCa)_5(PO_4)_3Cl$:Eu, (at least one or more among Mg, Ca, Sr and Ba)$_2B_5O_9Cl$:Eu,Mn, (at least one or more among Mg, Ca, Sr and Ba)$(PO_4)_6Cl_2$:Eu,Mn; phosphors emitting red light such as $Y_2O_2S$:Eu, $La_2O_2S$:Eu, $Y_2O_3$:Eu, $Ga_2O_2S$:Eu, and the like, in the phosphor 108 of the present invention.

When a white LED lamp is produced using the light emitting device which was constituted as above, the yield of 99% is obtained. Thus, the light emitting device of Example 168 can be produced in good mass productivity, and reliability is high and the unevenness of color tone can be lowered.

Example 169

The light emitting device of Example 169 related to the present invention is the cap type 3 light emitting device, and constituted using the phosphor of Example 152.

In the light emitting device of Example 169 thus constituted, the wave length of the portion of light which was emitted from the light emitting element 10 is converted by the phosphor of Example 152 when it passes the cap 16. The light in which the wave length was thus converted is mixed with blue light which was not subjected to the wave length conversion by the phosphor, and as a result, white light is externally emitted from the surface of the cap 16.

Examples 170 to 223 related to Mode 4 of Operation

Examples 170 to 176

Table 15 shows the chemical properties and physical properties of the phosphors of Examples 170 to 176 related to the present invention.

Figure 22:
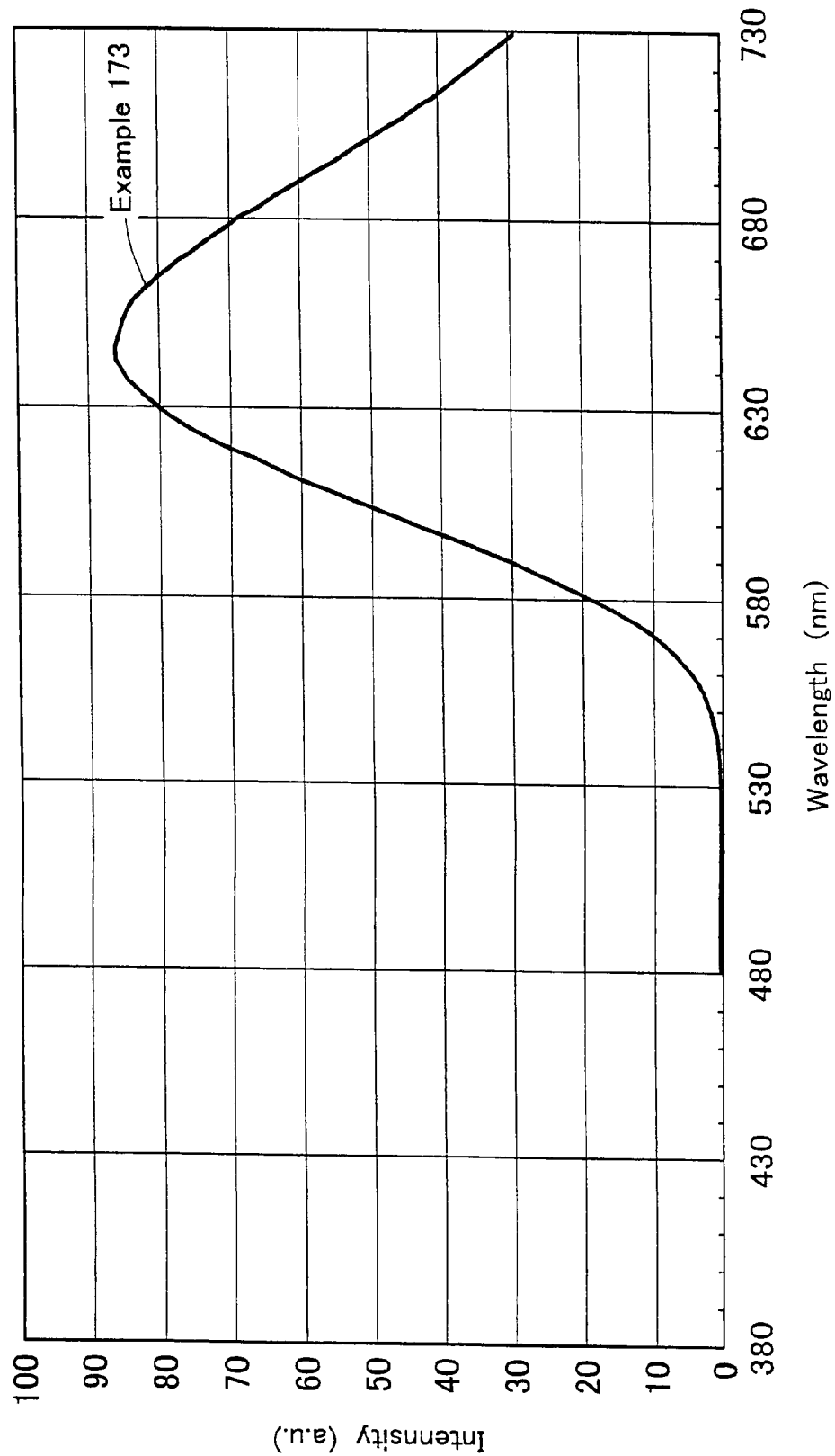
FIG. 22 is a chart showing the luminescence spectrum when the phosphor of Example 173 related to the present invention was excited at Ex=460 nm.
Figure 23:
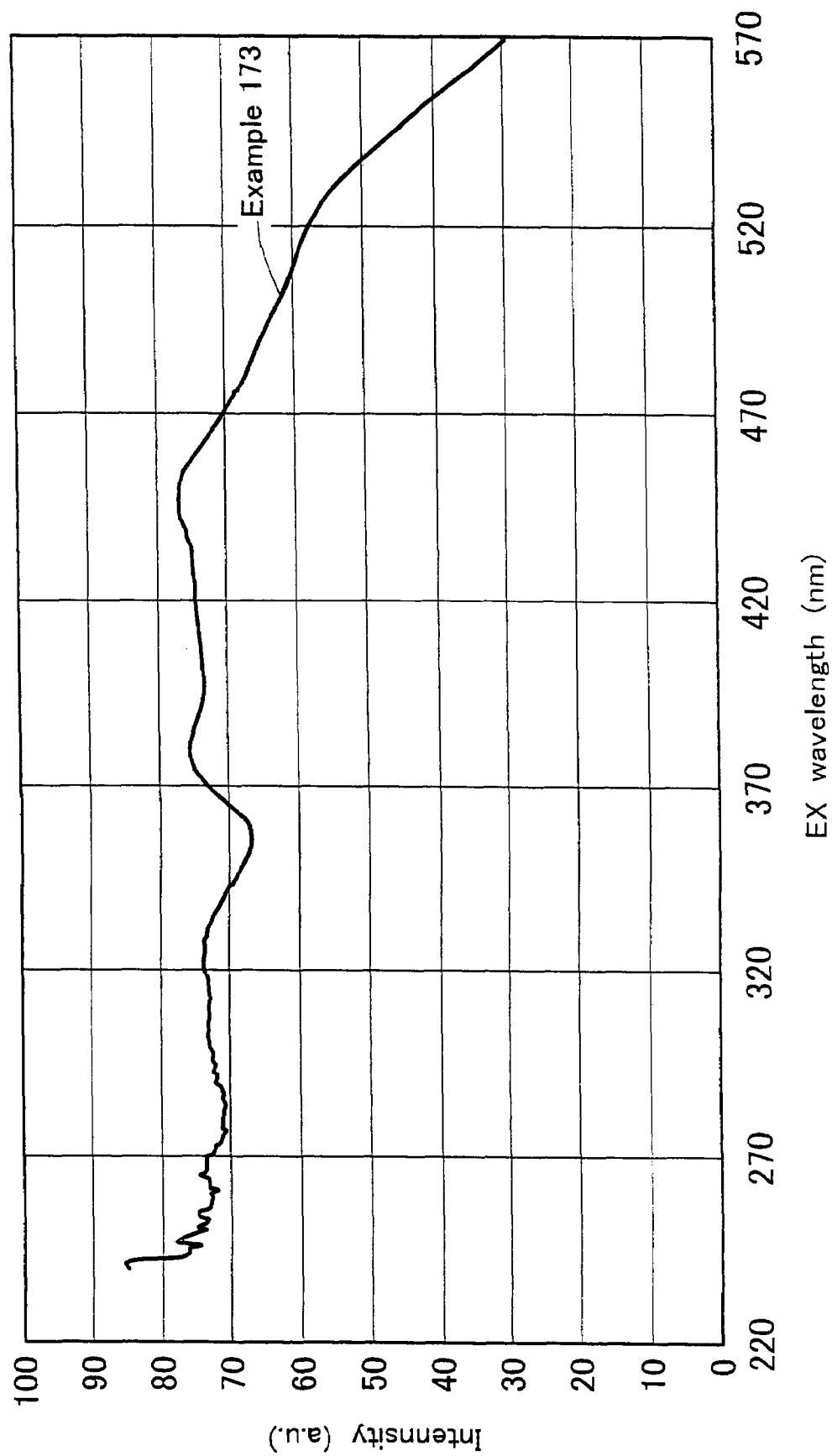
FIG. 23 is a chart showing the excitation spectrum of the phosphor of Example 173.
Figure 24:
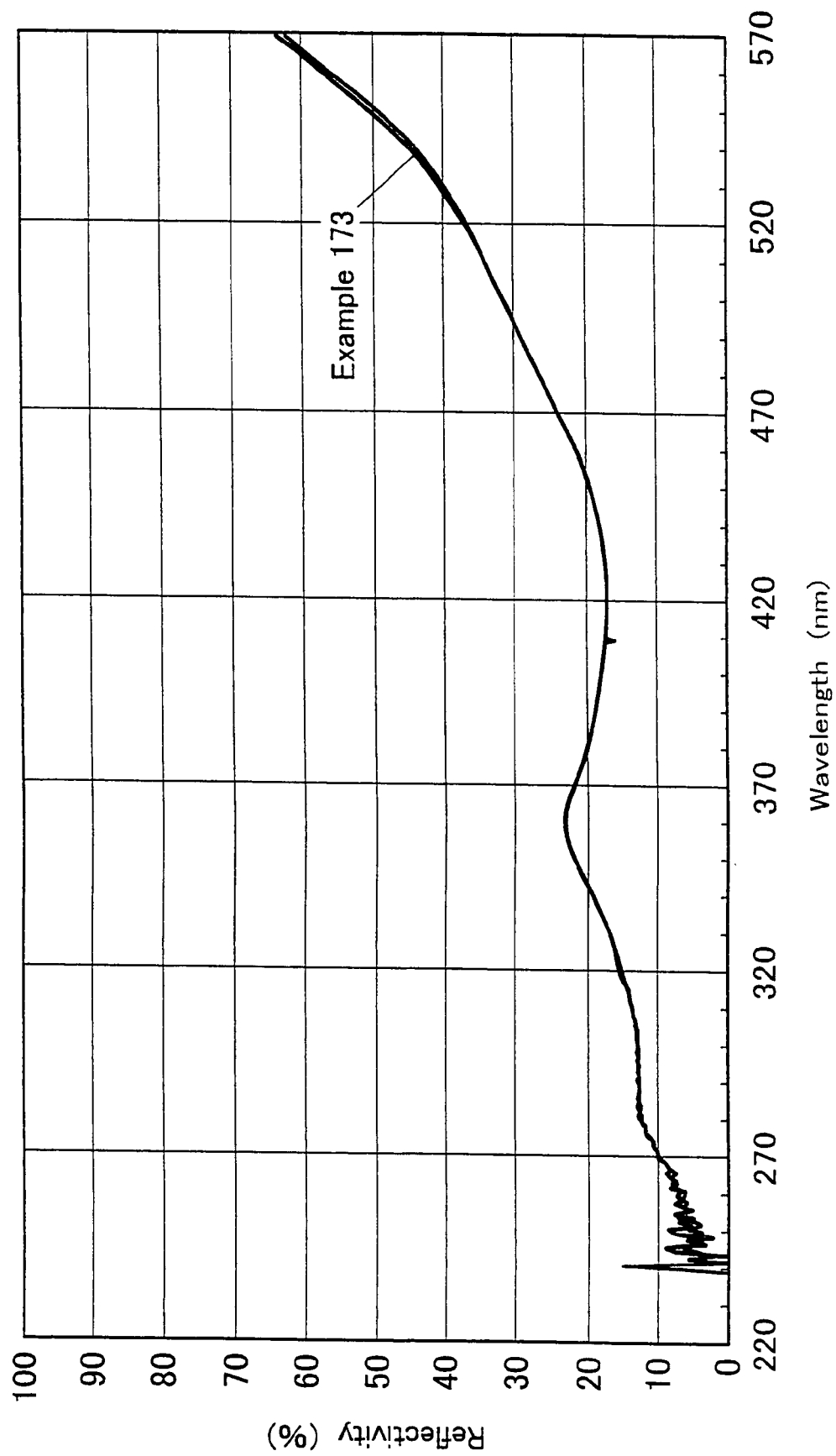
FIG. 24 is a chart showing the reflection spectrum of the phosphor of Example 173.
Figure 25:
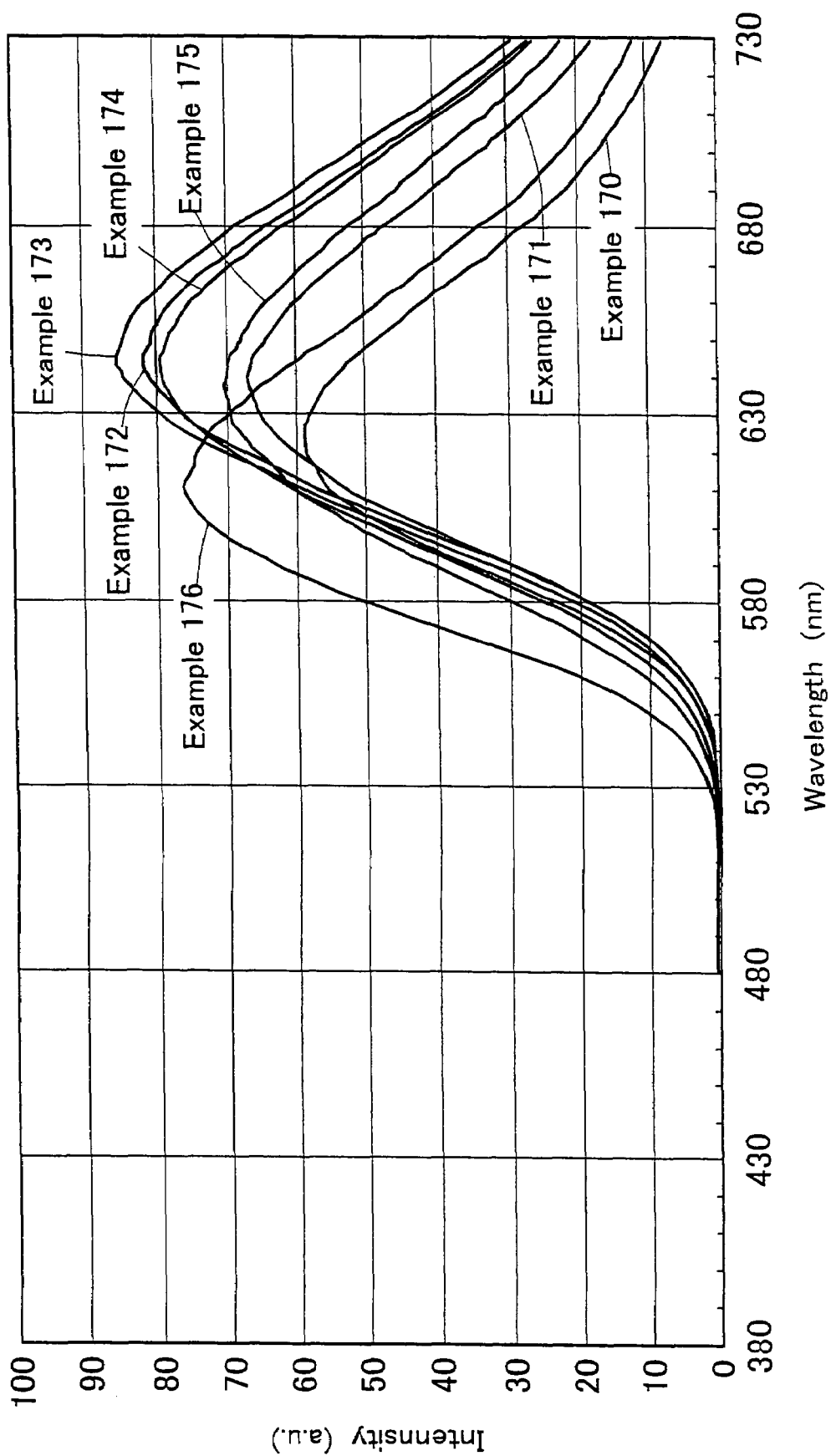
FIG. 25 is a chart showing the luminescence spectra when the phosphors of Examples 170 to 176 were excited at Ex=460 nm.

Further, FIG. 22 and FIG. 24 showed the luminescence properties of the phosphor of Example 173. FIG. 22 is a drawing showing a luminescence spectrum when the phosphor of Example 173 was excited by Ex=460 nm. FIG. 23 is a drawing showing an excitation spectrum of the phosphor of Example 173. FIG. 24 is a drawing showing a reflection spectrum of the phosphor of Example 173. FIG. 25 is a drawing showing the luminescence spectra when the phosphors of Examples 170 to 176 were excited by Ex=460 nm.

TABLE 15

| | | Raw material | Mn mol, against (alkali earth mol + Eu mol = 1 mol) | Eu mol, against (1 mol − alkali earth mol) | Emission characteristics | | | | | Temperature characteristics | |
|---|---|---|---|---|---|---|---|---|---|---|---|
| | Ratio of Sr/Ca | Mixing ratio of raw material (Sr/Ca/Si/Eu) | | | Color tone x | Color tone y | Brightness (%) | Quantum efficiency (%) | Peak wave length (nm) | | 100° C. | 200° C. |
| 170 | 9/1 | 1.746/0.194/5/0.06 | 0.015 | 0.03 | 0.616 | 0.375 | 100.0 | 100.0 | 624 | 99.4 | 92.7 |
| 171 | 7/3 | 1.358/0.582/5/0.06 | 0.015 | 0.03 | 0.629 | 0.362 | 95.3 | 126.9 | 639 | 104.5 | 100.1 |
| 172 | 6/4 | 1.164/0.776/5/0.06 | 0.015 | 0.03 | 0.635 | 0.356 | 103.4 | 157.9 | 643 | 106.0 | 99.6 |
| 173 | 5/5 | 0.97/0.97/5/0.06 | 0.015 | 0.03 | 0.631 | 0.359 | 111.2 | 167.7 | 644 | 105.9 | 97.9 |
| 174 | 4/6 | 0.776/1.164/5/0.06 | 0.015 | 0.03 | 0.622 | 0.369 | 118.1 | 160.2 | 642 | 101.0 | 93.1 |
| 175 | 3/7 | 0.582/1.358/5/0.06 | 0.015 | 0.03 | 0.610 | 0.381 | 123.7 | 146.5 | 636 | 100.1 | 93.8 |
| 176 | 1/9 | 0.194/1.746/5/0.06 | 0.015 | 0.03 | 0.587 | 0.405 | 170.3 | 138.5 | 609 | 90.7 | 51.2 |

Examples 170 to 176 are results of testing the chemical properties and physical properties of the phosphors related to the present invention which are represented by Sr—Ca—Si—N:Eu to which Mn was added. The mixing ratio of raw materials in Table 15 is those in which the raw materials are represented by molar ratio. The phosphors are represented by the general formula $Sr_xCa_{(1.94-x)}Eu_{0.06}Si_5N_8$ ($0 \leq X \leq 1.94$) to which Mn was added, or those containing the fine amount of oxygen are used. In Examples 170 to 176, the concentration of Eu is 0.03. The concentration of Eu is a molar ratio against the molar concentration of Sr—Ca. Further, Si is 5, while the addition amount of Mn is 0.015. Examples 170 to 176 are results obtained by properly changing the concentration of Sr and the concentration of Ca.

Firstly, strontium nitride, calcium nitride, silicone nitride and europium oxide are mixed. In Example 170, the compounding ratio (molar ratio) of strontium nitride, $Sr_3N_2$, calcium nitride, $Ca_3N_2$, silicone nitride, $Si_3N_2$, and europium oxide, $Eu_2O_3$ which are raw materials is adjusted to be Sr:Ca:Si:Eu=X:1.94–X:5:0.06. Mn was added at a molar ratio of 0.015. At least one or more of Mg, Sr, Ca, Ba, Zn, B, Al, Cu, Mn, Cr and Ni may be contained by several ppm to several hundreds ppm in said raw materials.

The above-mentioned compounds are mixed, and firing is carried out. As firing conditions, they are charged in a boron nitride crucible in ammonia atmosphere, the temperature was gradually raised from room temperature over about 5 hours, firing is carried out for 5 hours at about 1350° C., and cooling was further gradually carried out until room temperature over 5 hours. Mn remains by several ppm to several tens ppm in $Sr_xCa_{(1.94-x)}Eu_{0.06}Si_5N_8$ ($0 \leq X \leq 1.94$) after the firing.

In Example 170, the molar ratio of Sr:Ca is 9:1. The luminescence brightness of the silicon nitride phosphor of Example 170 is referred to as 100%, the luminescence efficiency is referred to as 100%, and the luminescence efficiencies of Examples 171 to 176 are prescribed based on the basis of the compounding proportion at this time. When the compounding proportion of Ca against Sr is increased, the luminescence efficiencies of the silicon nitride phosphor 126.9% at the molar ratio of Sr Ca=7:3, and the peak wave length is 639 nm. The luminescence efficiency is improved from this, and the peak wave length is shifted to a long wave length side. Further, when the compounding proportion of Ca against Sr is increased and the molar ratio of Sr:Ca is 5:5, namely, 1:1, the luminescence brightness of the silicon nitride phosphor is 111.2%, the luminescence efficiency is 167.7%, and the peak wave length is 644 nm. From this result, the luminescence efficiencies such as the luminescence brightness and quantum efficiency are more improved than the case of Sr Ca=9:1. In particular, since the peak wave length is shifted to a longer wave length side, the reddish phosphor can be produced. Further, the temperature characteristic is also extremely good. When the compounding proportion of Ca against Sr is further increased, the peak wave length is shifted to a short wave length side. Even such case, the luminescence brightness and quantum efficiency are not lowered, and the good luminescence properties can be obtained. In particular, since Sr is expensive in comparison with Ca, production cost can be reduced by increasing the compounding proportion of Ca.

The phosphor having a desired peak wave length can be produced by appropriately combining the phosphors of Examples 170 to 176 with Sr—Si—N:Eu to which Mn was added, Ca—Si—N:Eu to which Mn was added, Sr—Ca—Si—O—N:Eu to which Mn was added, Sr—Si—O—N:Eu to which Mn was added, and Ca—Si—O—N:Eu to which Mn was added. Since these have about the same composition, the phosphor has good luminescence properties.

The phosphor related to Example uses the crucible of a boron nitride material, and firing is carried out in ammonia atmosphere. Since a furnace and a crucible are not eroded under the firing condition, impurities are not contaminated in a baked product. The crucible of a boron nitride material can be used, but it is not preferable that the crucible of a molybdenum nitride material is used. When the crucible of a molybdenum nitride material is used, it is considered that the crucible is eroded, molybdenum contaminates in the nitride phosphor, and molybdenum provokes the lowering of the luminescence properties.

Thus, the improvement of the luminescence properties can provide luminescence materials which emit light of more brilliant white. Further, since the improvement of the luminescence properties enhance the energy efficiency, electric power can be also reduced.

When said phosphor was provided on the surface of a light emitting device, it is represented that the high luminescence properties are exhibited and the higher the temperature characteristics are, the more stable they are.

Examples 177 to 180

Figure 26:
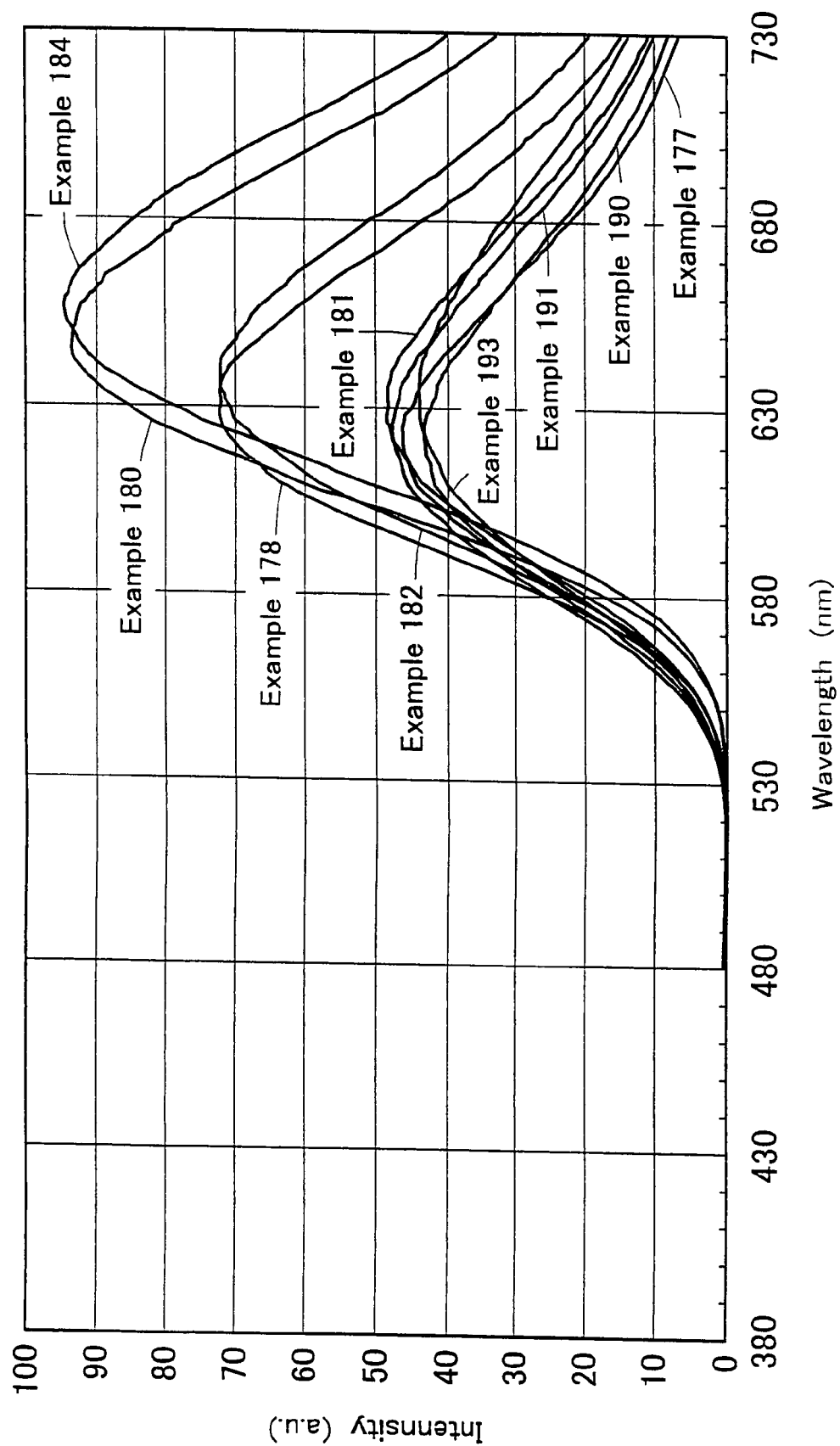
FIG. 26 is a chart showing the luminescence spectra when the phosphors of Examples 177, 178, 180, 181, 182, 184, 190, 191 and 193 were excited at Ex=460 nm.

Table 16 shows the chemical properties and physical properties of the phosphors of Examples 177 to 180 related to the present invention. FIG. 26 is a drawing showing luminescence spectra when the phosphors of Examples 177, 178, 180, 181, 182, 184, 190, 191 and 193 were excited by Ex=460 nm.

TABLE 16

| | Ratio of Sr/Ca | Mixing ratio of raw material (Sr/Ca/Si/Eu) | Raw material Mn mol, against (alkali earth mol + Eu) mol = 1 mol) | Eu mol, against (1 mol − alkali earth) mol) | Emission characteristics Color tone x | Color tone y | Brightness (%) | Quantum efficiency (%) | Peak wave length (nm) | Temperature characteristics 100° C. | 200° C. |
|---|---|---|---|---|---|---|---|---|---|---|---|
| 177 | 7/3 | 1.393/0.597/5/0.01 | 0.015 | 0.005 | 0.605 | 0.384 | 100.0 | 100.0 | 624 | 105.1 | 103.4 |
| 178 | 7/3 | 1.379/0.591/5/0.03 | 0.015 | 0.015 | 0.619 | 0.370 | 135.0 | 162.0 | 631 | 104.1 | 104 |
| 179 | 7/3 | 1.358/0.582/5/0.06 | 0.015 | 0.03 | 0.631 | 0.360 | 139.5 | 199.2 | 637 | 106 | 103.7 |
| 180 | 7/3 | 1.316/0.564/5/0.12 | 0.015 | 0.06 | 0.640 | 0.349 | 124.5 | 219.1 | 646 | 108.5 | 103.1 |

Examples 177 to 180 are results of testing the chemical properties and physical properties when the concentration of Eu of the phosphors related to the present invention which are represented by Sr—Ca—Si—N:Eu to which Mn was added were changed. The phosphor is represented by the general formula $Sr_XCa_{(2-T-X)}Eu_TSi_5N_8(0 \leqq X<2)$ to which Mn was added or those containing the fine amount of oxygen are used. The compounding proportion of Sr and Ca of raw materials is Sr:Ca=X:2−T−X=7:3. As the compounding proportion of Eu, those which are T=0.01, 0.03, 0.06 and 0.12 are used. The concentration of Eu at this case is 0.005, 0.015, 0.03 and 0.06. The concentration of Eu is a molar ratio against the molar concentration of Sr—Ca. Further, Si is 5, while the addition amount of Mn is 0.015.

Since Examples 177 to 180 carries out the similar production steps as Examples 170 to 176, the step which passes the similar constitution is abbreviated. At least one or more of Mg, Sr, Ca, Ba, Zn, B, Al, Cu, Mn, Cr and Ni may be contained by several ppm to several hundreds ppm in said raw materials.

The luminescence efficiency is shown based on the basis of the phosphor of Example 177. The most improvement of the luminescence brightness was observed at Example 177 in which the concentration of Eu is 0.03. When the concentration of Eu is little, the luminescence is not adequately carried out, and when the concentration of Eu is too much, the concentration quenching occurs, or it is reacted with $Sr_3N_2$ or $Ca_3N_2$, and creates the composition different from the objective base nitride phosphor, therefore the lowering of the luminescence efficiency occurs. The luminescence efficiency is best for Example 180. On the other hand, the peak wave length is shifted to a long wave length side in accordance with the increase of the concentration of Eu. The reason why this phenomenon occurs is not clear, but it is considered that the mix crystal of Sr and Ca is further accelerated by accelerating the diffusion of Mn with $Sr_3N_2$ and $Ca_3N_2$, therefore the peak wave length is shifted to a long wave length side. Any of the temperature characteristics of Examples 177 to 180 is extremely good.

Examples 181 to 189

Table 17 shows the chemical properties and physical properties of the phosphors of Examples 181 to 189 related to the present invention.

TABLE 17

| | Ratio of Sr/Ca | Mixing ratio of raw material (Sr/Ca/Si/Eu) | Raw material Mn mol, against (alkali earth mol + Eu) mol = 1 mol) | Eu mol, against (1 mol − alkali earth) mol) | Emission characteristics Color tone x | Color tone y | Brightness (%) | Quantum efficiency (%) | Peak wave length (nm) | Temperature characteristics 100° C. | 200° C. |
|---|---|---|---|---|---|---|---|---|---|---|---|
| 181 | 5/5 | 0.99/0.99/5/0.01 | 0.015 | 0.005 | 0.611 | 0.378 | 100.0 | 100.0 | 628 | 104.2 | 98.6 |
| 182 | 5/5 | 0.985/0.985/5/0.03 | 0.015 | 0.015 | 0.623 | 0.367 | 127.7 | 148.5 | 637 | 105.1 | 99.6 |
| 183 | 5/5 | 0.97/0.97/5/0.06 | 0.015 | 0.03 | 0.631 | 0.359 | 132.3 | 178.1 | 644 | 105.9 | 97.9 |
| 184 | 5/5 | 0.94/0.94/5/0.12 | 0.015 | 0.06 | 0.644 | 0.345 | 111.8 | 195.8 | 656 | 99 | 81 |
| 185 | 5/5 | 0.94/0.94/5/0.12 | 0.015 | 0.06 | 0.636 | 0.353 | 30.3 | 47.1 | 658 | 100.1 | 92.3 |
| 186 | 5/5 | 0.9/0.9/5/0.2 | 0.015 | 0.1 | 0.648 | 0.342 | 80.5 | 156.2 | 663 | 108.3 | 83.9 |
| 187 | 5/5 | 0.85/0.85/5/0.3 | 0.015 | 0.15 | 0.653 | 0.337 | 83.6 | 185.4 | 667 | 111.8 | 78.2 |
| 188 | 5/5 | 0.8/0.8/5/0.4 | 0.015 | 0.2 | 0.655 | 0.335 | 74.4 | 179.2 | 668 | 112 | 70.3 |
| 189 | 5/5 | 0.7/0.7/5/0.6 | 0.015 | 0.3 | 0.657 | 0.333 | 58.5 | 152.2 | 670 | 111.3 | 56.7 |

Examples 181 to 189 are results of testing the chemical properties and physical properties when the concentration of Eu of the phosphors related to the present invention which are represented by Sr—Ca—Si—N:Eu to which Mn was added were changed. The phosphor is represented by the general formula $Sr_XCa_{(2-T-X)}Eu_TSi_5N_8(0\leq X<2)$ to which Mn was added or those containing the fine amount of oxygen are used. The compounding proportion of Sr and Ca of raw materials is

Examples 190 to 193

Table 18 shows the chemical properties and physical properties of the phosphors of Examples 190 to 193 related to the present invention.

TABLE 18

| | | Raw material | | | Emission characteristics | | | | | | |
|---|---|---|---|---|---|---|---|---|---|---|---|
| | Ratio of | Mixing ratio of raw material | Mn mol, against (alkali earth mol + Eu) | Eu mol, against (1 mol − alkali earth) | Color | Color | Brightness | Quantum efficiency | Peak wave length | Temperature characteristics | |
| | Sr/Ca | (Sr/Ca/Si/Eu) | mol = 1 mol | mol | tone x | tone y | (%) | (%) | (nm) | 100° C. | 200° C. |
| 190 | 3/7 | 0.597/1.393/5/0.01 | 0.015 | 0.005 | 0.597 | 0.392 | 100.0 | 100.0 | 621 | 101.5 | 89.6 |
| 191 | 3/7 | 0.591/1.379/5/0.03 | 0.015 | 0.015 | 0.598 | 0.392 | 110.3 | 113.5 | 626 | 98.2 | 77.5 |
| 192 | 3/7 | 0.582/1.358/5/0.06 | 0.015 | 0.03 | 0.610 | 0.381 | 141.4 | 175.8 | 636 | 100.1 | 93.8 |
| 193 | 3/7 | 0.564/1.368/5/0.12 | 0.015 | 0.06 | 0.604 | 0.387 | 95.6 | 113.0 | 635 | 91.6 | 55.2 |

Sr:Ca=X:2−T−X=5:5. As the compounding proportions of Eu in Examples 181 to 184, those which are T=0.01, 0.03, 0.06 and 0.12 are used. The concentrations of Eu at this case is 0.005, 0.015, 0.03 and 0.06. The concentration of Eu is a molar ratio against the molar concentration of Sr—Ca. Examples 185 to 189 used commercially available raw materials which are different from Examples 181 to 184. As the compounding proportions of Eu in Examples 185 to 189, those which are T=0.12, 0.2, 0.3, 0.4 and 0.6 are used. The concentrations of Eu at this case is 0.06, 0.1, 0.15, 0.2 and 0.3. With respect to the addition amount of Mn in Examples 181 to 189, Si is 5, while the addition amount of Mn is 0.015.

Since Examples 181 to 189 carry out the similar production steps as Examples 170 to 176, the step which passes the similar constitution is abbreviated. At least one or more of Mg, Sr, Ca, Ba, Zn, B, Al, Cu, Mn, Cr and Ni may be contained by several ppm to several hundreds ppm in said raw materials.

The luminescence efficiency is shown based on the basis of the phosphor of Example 181. The most improvement of the luminescence brightness was observed at Example 183 in which the concentration of Eu is 0.03. When the concentration of Eu is little, the luminescence is not adequately carried out, and when the concentration of Eu is too much, the concentration quenching occurs, or it is reacted with $Sr_3N_2$ or $Ca_3N_2$, and creates the composition different from the objective base nitride phosphor, therefore the lowering of the luminescence efficiency occurs. The luminescence efficiency is best for Example 184. Examples 185 to 189 generate the lowering of the luminescence brightness, but it is considered that since commercially available raw materials are used, impurities are contained in said raw materials therefore the lowering of the luminescence efficiency occurs. In Examples 181 to 185 and in Examples 185 to 189, the peak wave length is shifted to a long wave length side in accordance with the increase of the concentration of Eu. The principle is not clear, but it is considered that the mix crystal of Sr and Ca is further accelerated by accelerating the diffusion of Mn with $Sr_3N_2$ and $Ca_3N_2$, therefore the peak wave length is shifted to a long wave length side. Any of the temperature characteristics of Examples 181 to 189 is extremely good.

Examples 190 to 193 are results of testing the chemical properties and physical properties when the concentration of Eu of the phosphors related to the present invention which are represented by Sr—Ca—Si—N:Eu to which Mn was added were changed. The phosphor is represented by the general formula $Sr_XCa_{(2-T-X)}Eu_TSi_5N_8(0\leq X<2)$ to which Mn was added or those containing the fine amount of oxygen are used. The compounding proportion of Sr and Ca of raw materials is Sr:Ca=X:2−T−X=3:7. The compounding proportions of Eu in Examples 190 to 193 use those which are T=0.01, 0.03, 0.06 and 0.12. The concentrations of Eu at this case is 0.005, 0.015, 0.03 and 0.06. The concentration of Eu is a molar ratio against the molar concentration of Sr—Ca. With respect to the addition amount of Mn in Examples 190 to 193, Si is 5, while the addition amount of Mn is 0.015.

Since Examples 190 to 193 carry out the similar production steps as Examples 170 to 176, the step which passes the similar constitution is abbreviated. At least one or more of Mg, Sr, Ca, Ba, Zn, B, Al, Cu, Mn, Cr and Ni may be contained by several ppm to several hundreds ppm in said raw materials.

The luminescence efficiency is shown based on the basis of the phosphor of Example 190. The most improvement of the luminescence brightness was observed at Example 192 in Examples 190 to 193 when the concentration of Eu is 0.03, in like manner as Examples in Tables 15 to 17. From the viewpoint of the luminescence brightness, the optimum phosphor is thought to be able to be produced when the concentration of Eu is 0.03. Further, in case of Example 192, the luminescence efficiency together with the luminescence brightness is the best. In Examples 190 to 193, the peak wave length is shifted to a long wave length side in accordance with the increase of the concentration of Eu. Any of the temperature characteristics of Examples 190 to 193 is extremely good.

Examples 194 to 201

Table 19 shows the chemical properties and physical properties of the phosphors of Examples 194 to 201 related to the present invention.

TABLE 19

| | Ratio of Sr/Ca | Mixing ratio of raw material (Sr/Ca/Si/Eu) | Raw material Mn mol, against (alkali earth mol + Eu mol = 1 mol) | Eu mol, against (1 mol − alkali earth) mol) | Color tone x | Color tone y | Brightness (%) | Quantum efficiency (%) | Peak wave length (nm) | Temperature characteristics 100° C. | 200° C. |
|---|---|---|---|---|---|---|---|---|---|---|---|
| 194 | 0/10 | 1.985/5/0.015 | — | 0.0075 | 0.581 | 0.411 | 100.0 | 100.0 | 609 | 99.5 | 78.9 |
| 195 | 0/10 | 1.985/5/0.015 | 0.0025 | 0.0075 | 0.582 | 0.410 | 102.4 | 103.1 | 609 | 96.3 | 80.3 |
| 196 | 0/10 | 1.985/5/0.015 | 0.005 | 0.0075 | 0.581 | 0.410 | 101.5 | 102.0 | 609 | 99 | 76.9 |
| 197 | 0/10 | 1.985/5/0.015 | 0.0075 | 0.0075 | 0.581 | 0.410 | 113.6 | 108.3 | 609 | 100.1 | 76.9 |
| 198 | 0/10 | 1.985/5/0.015 | 0.015 | 0.0075 | 0.583 | 0.409 | 115.3 | 117.4 | 609 | 100.1 | 76.9 |
| 199 | 0/10 | 1.985/5/0.015 | 0.03 | 0.0075 | 0.581 | 0.411 | 93.2 | 93.8 | 609 | 98.5 | 73.6 |
| 200 | 0/10 | 1.985/5/0.015 | 0.05 | 0.0075 | 0.578 | 0.413 | 68.7 | 68.8 | 609 | 89.5 | 55.8 |
| 201 | 0/10 | 1.985/5/0.015 | 0.1 | 0.0075 | 0.572 | 0.418 | 32.2 | 31.9 | 609 | 71.9 | 30.8 |

Examples 194 to 201 are results of testing the chemical properties and physical properties when the addition amount Mn of the phosphors related to the present invention which are represented by Ca—Si—N:Eu was changed. The mixing ratio of raw materials in Table 19 was a value in which the raw materials are represented by molar ratio. The phosphor which was thus produced is represented by the general formula $Ca_{(2-T)}Eu_TSi_5N_8$ to which Mn was added or a form containing the fine amount of oxygen. A phosphor in which Mn was not added is shown in Example 194. The phosphors of Examples 194 to 201 use those in which the addition amounts of Mn are 0.005, 0.01, 0.015, 0.03, 0.06, 0.1 and 0.2. The concentrations of Mn in this case are 0.0025, 0.005, 0.0075, 0.015, 0.03, 0.05 and 0.1, and the concentration of Mn is a molar ratio against the molar concentration of Ca. The concentration of Eu is constant at 0.075.

Since Examples 194 to 201 carry out the similar production steps as Examples 170 to 176, the step which passes the similar constitution is abbreviated. At least one or more of Mg, Sr, Ca, Ba, Zn, B, Al, Cu, Mn, Cr and Ni may be contained by several ppm to several hundreds ppm in said raw materials.

The luminescence efficiency is shown based on the basis of the phosphor of Example 194 to which Mn was not added. The most improvement of the luminescence brightness was observed in Example 197 in which the concentration of Mn is 0.0075 and Example 198 in which the concentration of Mn is 0.015. This is considered to be caused by that when the concentration of Mn is little, the diffusion of raw materials is not adequately carried out and the growth of particles is not adequately carried out. On the other hand, when the concentration of Mn is too much, it is considered to be caused by that Mn prevents the composition formation of Ca—Si—N:Eu and crystal growth. The quantum efficiency is extremely good in Examples 195 to 198. Even if the addition amount of Mn is changed, the temperature characteristics in Examples 194 to 200 are extremely good. The peak wave length is constant even if the addition amount of Mn is changed.

Examples 202 to 204

Table 20 shows the chemical properties and physical properties of the phosphors of Examples 202 to 204 related to the present invention.

TABLE 20

| | Ratio of Sr/Ca | Mixing ratio of raw material (Sr/Ca/Si/Eu) | Raw material Mn mol, against (alkali earth mol + Eu mol = 1 mol) | Eu mol, against (1 mol − alkali earth mol) | Color tone x | Color tone y | Brightness (%) | Quantum efficiency (%) | Peak wave length (nm) | Temperature characteristics 100° C. | 200° C. |
|---|---|---|---|---|---|---|---|---|---|---|---|
| 202 | 0/10 | 1.97/5/0.03 | — | 0.015 | 0.586 | 0.406 | 100.0 | 100.0 | 609 | 93.8 | 66 |
| 203 | 0/10 | 1.97/5/0.03 | 100 ppm | 0.015 | 0.585 | 0.406 | 100.5 | 100.3 | 610 | 97 | 69.7 |
| 204 | 0/10 | 1.97/5/0.03 | 500 ppm | 0.015 | 0.588 | 0.403 | 103.5 | 103.1 | 610 | 96.5 | 66.2 |

Examples 202 to 204 are results of testing the chemical properties and physical properties when the addition amount of Mn of the phosphors related to the present invention which are represented by Ca—Si—N Eu was changed. The mixing ratio of raw materials in Table 20 is a value in which the raw materials are represented by molar ratio. The concentration of Eu is constant at 0.015. The phosphor which was thus produced is represented by the general formula $Ca_{(2-T)}Eu_TSi_5N_8$ to which Mn was added or a form containing the fine amount of oxygen. A phosphor in which Mn was not added is shown in Example 2O$_2$. Those in which the addition amounts of Mn in Examples 202 to 204 are 100 ppm and 500 ppm against the total amount of raw materials are used.

Since Examples 202 to 204 carry out the similar production steps as Examples 170 to 176, the step which passes the similar constitution is abbreviated. Firstly, calcium nitride, silicon nitride and europium oxide were mixed. At least one or more of Mg, Sr, Ca, Ba, Zn, B, Al, Cu, Mn, Cr and Ni may be contained by several ppm to several hundreds ppm in said raw materials.

The luminescence efficiency is shown based on the basis of the phosphor of Example 202 to which Mn was not added. Both of the phosphor in which the addition amount of Mn is 100 ppm and the phosphor in which the addition amount of Mn is 500 ppm improved the luminescence brightness and the luminescence efficiency. Further, the improvement of the temperature characteristic is designed. Even if the addition amount of Mn is little, the luminescence properties such as the luminescence brightness, luminescence efficiency and temperature characteristic can be improved.

Examples 205 to 206

Figure 27A:
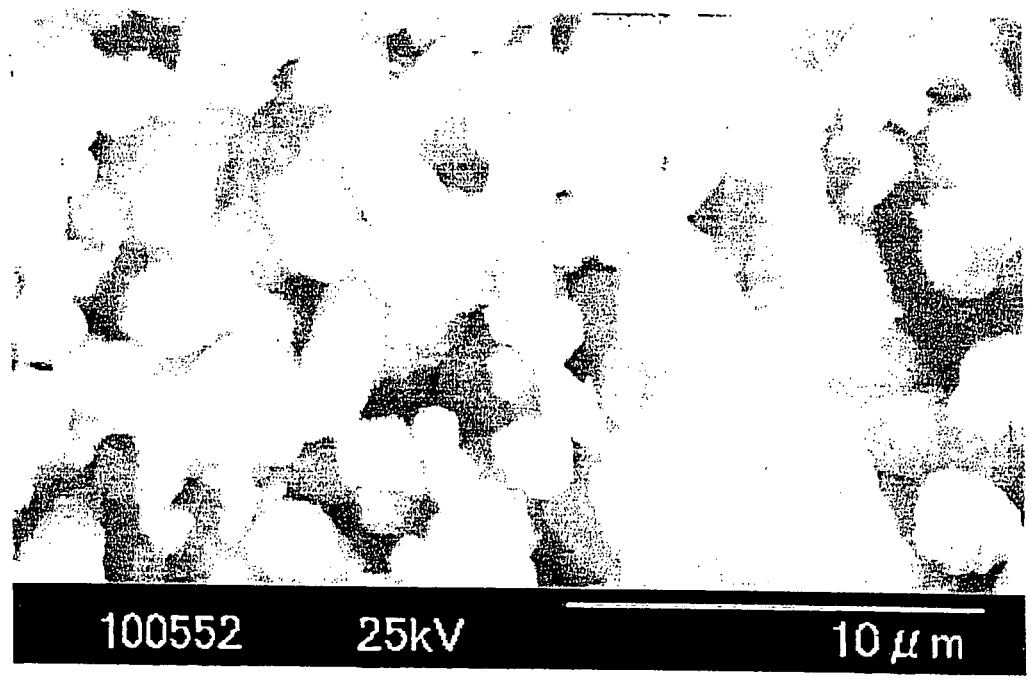
FIG. 27A is a SEM (scanning electron microscope) photograph of the phosphor of Example 205 and FIG. 27B is that of Example 206.
Figure 27B:
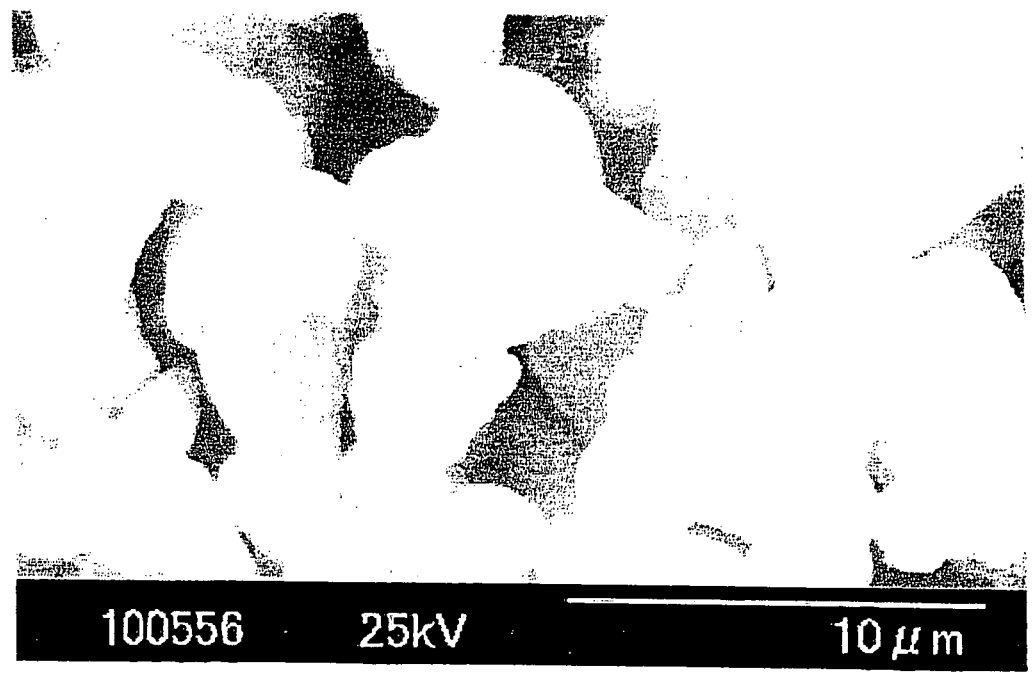

Table 21 shows the chemical properties and physical properties of the phosphors of Examples 205 to 206 related to the present invention. FIG. 27A is a photo photographing the particle diameter of the phosphors of Example 205, and FIG. 27B is that of Example 206.

concentration of Mn is a molar ratio against the molar concentration of Ca. The concentration of Eu is constant at 0.02.

Since Examples 205 to 206 carry out the similar production steps as Examples 170 to 176, the step which passes the similar constitution is abbreviated. At least one or more of Mg, Sr, Ca, Ba, Zn, B, Al, Cu, Mn, Cr and Ni may be contained by several ppm to several hundreds ppm in said raw materials.

The luminescence efficiency is shown based on the basis of the phosphor of Example 205 to which Mn was not added. Example 206 in which the addition amount of Mn is 0.02 improved the luminescence brightness and the luminescence efficiency. The reason is considered to be the same as mentioned above.

When the mean particle diameters of Examples 205 and 206 were measured, the mean particle diameter of Example 205 is 2.9 μm and the mean particle diameter of Example 206 is 6.4 μm. The difference of the luminescence brightness is generated by the difference of the mean particle diameter.

In FIG. 27, there are shown photos which photographed the particle diameters of the phosphor to which Mn was not added and the phosphor to which Mn was added. The mean particle diameter of the phosphor of Example 205 to which Mn was not added is 2.8 μm and the mean particle diameter of the

TABLE 21

| | Ratio of Sr/Ca | Mixing ratio of raw material (Sr/Ca/Si/Eu) | Raw material Mn mol, against (alkali earth mol + Eu mol = 1 mol) | Eu mol, against (1 mol − alkali earth mol) | Emission characteristics | | | | | | |
|---|---|---|---|---|---|---|---|---|---|---|---|
| | | | | | Color tone x | Color tone y | Brightness (%) | Quantum efficiency (%) | Peak wave length (nm) | Temperature characteristics | |
| | | | | | | | | | | 100° C. | 200° C. |
| 205 | 0/10 | 1.96/5/0.04 | — | 0.02 | 0.589 | 0.403 | 100.0 | 100.0 | 609 | 95.9 | 65.5 |
| 206 | 0/10 | 0.96/5/0.04 | 0.02 | 0.02 | 0.592 | 0.401 | 109.5 | 111.8 | 609 | 92.3 | 56.1 |

Examples 205 to 206 are results of testing the chemical properties and physical properties when the addition amount of Mn of the phosphors related to the present invention which are represented by Ca—Si—N:Eu was changed. The mixing ratio of raw materials in Table 21 is a value in which the raw materials are represented by a molar ratio. The phosphor which was thus produced is represented by the general formula $Ca_{(2-T)}Eu_TSi_5N_8$ to which Mn was added or a form containing the fine amount of oxygen. A phosphor in which Mn was not added is shown in Example 205. The phosphor of Example 206 uses one in which the addition amount of Mn is 0.04 mol. The concentration of Mn in this case is 0.02, and the phosphor of Example 206 to which Mn was added is 6.4 μm. The mean particle diameter of the phosphor to which Mn was added is comparatively big in comparison with the phosphor to which Mn was not added. It is considered that the difference of the mean particle diameter enhances the luminescence brightness.

Examples 207 to 211

Table 22 shows the chemical properties and physical properties of the phosphors of Examples 207 to 211 related to the present invention.

TABLE 22

| | Ratio of Sr/Ca | Mixing ratio of raw material (Sr/Ca/Si/Eu) | Raw material Mn mol, against (alkali earth mol + Eu mol = 1 mol) | Eu mol, against (1 mol − alkali earth mol) | Emission characteristics | | | | | | |
|---|---|---|---|---|---|---|---|---|---|---|---|
| | | | | | Color tone x | Color tone y | Brightness (%) | Quantum efficiency (%) | Peak wave length (nm) | Temperature characteristics | |
| | | | | | | | | | | 100° C. | 200° C. |
| 207 | 10/0 | 1.94/5/0.06 | — | 0.03 | 0.614 | 0.377 | 100.0 | 100.0 | 620 | 101.7 | 90.6 |
| 208 | 10/0 | 1.94/5/0.06 | 0.005 | 0.03 | 0.616 | 0.375 | 102.6 | 106.0 | 621 | 101.5 | 83.8 |
| 209 | 10/0 | 1.94/5/0.06 | 0.015 | 0.03 | 0.616 | 0.375 | 111.8 | 116.4 | 621 | 102 | 85.4 |

TABLE 22-continued

| | | Raw material | | | Emission characteristics | | | | | | |
|---|---|---|---|---|---|---|---|---|---|---|---|
| | | | Mn mol, against (alkali earth mol + Eu | Eu mol, against (1 mol − alkali | | | | Quantum | Peak wave | Temperature characteristics | |
| | Ratio of | Mixing ratio of raw material | | | Color | Color | Brightness | efficiency | length | | |
| | Sr/Ca | (Sr/Ca/Si/Eu) | mol = 1 mol) | earth mol) | tone x | tone y | (%) | (%) | (nm) | 100° C. | 200° C. |
| 210 | 10/0 | 1.94/5/0.06 | 0.05 | 0.03 | 0.618 | 0.373 | 105.6 | 114.9 | 626 | 102.7 | 86.8 |
| 211 | 10/0 | 1.94/5/0.06 | 0.1 | 0.03 | 0.618 | 0.373 | 86.2 | 99.8 | 627 | 90.9 | 75.1 |

Examples 207 to 211 are results of testing the chemical properties and physical properties when the addition amount of Mn of the phosphors related to the present invention which are represented by Sr—Si—N:Eu was changed. The mixing ratio of raw materials in Table 22 is a value in which the raw materials are represented by a molar ratio. The phosphor which was thus produced is represented by the general formula $Sr_{(2-T)}Eu_TSi_5N_8$ to which Mn was added or a form containing the fine amount of oxygen. A phosphor in which Mn was not added is shown in Example 207. The phosphors of Examples 208 to 211 use those in which the addition amounts of Mn are 0.01, 0.03, 0.1 and 0.2. The concentrations of Mn in this case are 0.005, 0.015, 0.05 and 0.1, and the concentration of Mn is a molar ratio against the molar concentration of Sr. The concentration of Eu is constant at 0.03.

Since Examples 207 to 211 carry out the similar production steps as Examples 170 to 176, the step which passes the similar constitution is abbreviated. At least one or more of Mg, Sr, Ca, Ba, Zn, B, Al, Cu, Mn, Cr and Ni may be contained by several ppm to several hundreds ppm in said raw materials.

The luminescence efficiency is shown based on the basis of the phosphor of Example 207 to which Mn was not added. Examples 208 to 210 improved the luminescence brightness, and in particular, Example 209 in which the concentration of Mn is 0.015 improved the luminescence brightness to the utmost. Further, with respect to Examples 208 to 210, the quantum efficiency is extremely good. Further, the temperature characteristics in Examples 208 to 211 are extremely good, even if the addition amount of Mn is changed. The peak wave length is shifted to a long wave length side in accordance with the increase of the addition amount of Mn. The reason is not clear, but it is considered that Mn accelerates the diffusion of raw materials, in particular, Eu.

Examples 212 to 220

Table 23 shows the chemical properties and physical properties of the phosphors of Examples 212 to 220 related to the present invention.

TABLE 23

| | | Raw material | | | Emission characteristics | | | | | | |
|---|---|---|---|---|---|---|---|---|---|---|---|
| | | | Mn mol, against (alkali earth mol + Eu | Eu mol, against (1 mol − alkali earth | | | | Quantum | Peak wave | Temperature characteristics | |
| | Ratio of | Mixing ratio of raw material | | | Color | Color | Brightness | efficiency | length | | |
| | Sr/Ca | (Sr/Ca/Si/Eu) | mol = 1 mol) | mol) | tone x | tone y | (%) | (%) | (nm) | 100° C. | 200° C. |
| 212 | 5/5 | 0.98/0.98/5/0.04 | — | 0.02 | 0.624 | 0.366 | 100.0 | 100.0 | 638 | 101.7 | 92.5 |
| 213 | 5/5 | 0.98/0.98/5/0.04 | 0.005 | 0.02 | 0.628 | 0.362 | 132.9 | 141.4 | 641 | 105.5 | 97.3 |
| 214 | 5/5 | 0.98/0.98/5/0.04 | 0.015 | 0.02 | 0.628 | 0.362 | 144.5 | 151.5 | 641 | 101.8 | 85.4 |
| 215 | 5/5 | 0.98/0.98/5/0.04 | 0.05 | 0.02 | 0.627 | 0.363 | 149.7 | 155.5 | 642 | 104.8 | 95.3 |
| 216 | 5/5 | 0.98/0.98/5/0.04 | 0.1 | 0.02 | 0.623 | 0.367 | 128.9 | 129.6 | 641 | 105 | 95.3 |
| 217 | 5/5 | 0.98/0.98/5/0.04 | — | 0.02 | 0.637 | 0.353 | 100.0 | 100.0 | 644 | 102.8 | 88.1 |
| 218 | 5/5 | 0.98/0.98/5/0.04 | 0.02 | 0.02 | 0.638 | 0.353 | 105.1 | 105.7 | 644 | 101.1 | 86.5 |
| 219 | 7/3 | 1.386/0.594/5/0.02 | — | 0.01 | 0.620 | 0.371 | 100.0 | 100.0 | 627 | 102.1 | 93.4 |
| 220 | 7/3 | 1.386/0.594/5/0.02 | 0.01 | 0.01 | 0.622 | 0.370 | 105.8 | 105.1 | 628 | 102 | 94.2 |

Examples 212 to 220 are results of testing the chemical properties and physical properties when the addition amount of Mn of the phosphors related to the present invention which are represented by Sr—Ca—Si—N:Eu was changed. The mixing ratio of raw materials in Table 23 is a value in which the raw materials are represented by a molar ratio. The phosphors of Examples 212 to 220 which were thus produced are represented by the general formula $Sr_XCa_{(2-X-T)}Eu_TSi_5N_8$ or a form containing the fine amount of oxygen.

Since Examples 212 to 220 carry out the similar production steps as Examples 170 to 176, the step which passes the similar constitution is abbreviated. At least one or more of Mg, Sr, Ca, Ba, Zn, B, Al, Cu, Mn, Cr and Ni may be contained by several ppm to several hundreds ppm in said raw materials.

The molar ratios of Sr and Ca in Examples 212 to 220 are Sr:Ca=5:5. A phosphor in which Mn was not added is shown in Example 212. The phosphors of Examples 213 to 216 use those in which the addition amounts of Mn are 0.01, 0.03, 0.1 and 0.2. The concentrations of Mn in this case are 0.005, 0.015, 0.05 and 0.1, and the concentration of Mn is a molar ratio against the molar concentration of Sr—Ca. The concentration of Eu is constant at 0.02.

The luminescence efficiency is shown based on the basis of the phosphor of Example 212 to which Mn was not added.

Examples 217 to 218

Table 24 shows the results of carrying out the composition analysis of the phosphors represented by Sr—Ca—Si—N:Eu of Examples 217 and 218 related to the present invention.

The presence or absence of Mn in the above-mentioned phosphors can be made clear from the above-mentioned analysis results. Further, O is contained by 1 to 2% in the above-mentioned composition.

TABLE 24

| | Conjectured composition | Sr (%) | Ca (%) | Ba (%) | Si (%) | Eu (%) | Mn (ppm) | O (%) | N (%) | |
|---|---|---|---|---|---|---|---|---|---|---|
| 217 | $Sr_{0.991}Ca_{0.983}Ba_{0.001}Eu_{0.039}Si_{5.000}O_{0.309}N_{7.485}$ | 22.7 | 10.3 | 0.05 | 36.7 | 1.56 | 0 | 1.29 | | Residual amount against 100% of total amount |
| 218 | $Sr_{0.991}Ca_{0.983}Ba_{0.001}Eu_{0.039}Si_{5.000}O_{0.356}N_{7.457}$ | 22.7 | 10.3 | 0.05 | 36.6 | 1.54 | 8 | 1.49 | | Residual amount against 100% of total amount |

Any of Examples 213 to 216 improved the luminescence brightness. Further, the luminescence efficiencies are also improved. Furthermore, the temperature characteristics are also extremely good. Thus, the luminescence properties are improved by adding Mn to the phosphor represented by Sr—Ca—Si—N:Eu.

Examples 217 and 218 carried out the production of the phosphor related to the present invention using commercially available raw materials. The molar ratio of Sr and Ca in Examples 217 and 218 is Sr:Ca=5:5. The phosphor to which Mn was not added is shown in Example 217. The phosphor of Example 218 uses a phosphor in which the addition amount of Mn is 0.04. The concentration of Mn is 0.02, and the concentration of Mn is a molar ratio against the molar concentration of Sr—Ca. The concentration of Eu is 0.02.

The luminescence efficiency is shown based on the basis of the phosphor of Example 217 to which Mn is not added. The luminescence properties can be improved by addition of Mn even if commercially available raw materials are used.

The production of the phosphor related to the present invention was carried out using the commercially available raw materials in Examples 219 and 220. The molar ratio of Sr and Ca in Examples 219 and 220 is Sr:Ca=7:3. The phosphor to which Mn is not added is shown in Example 50. The phosphor of Example 220 uses a phosphor in which the addition amount of Mn is 0.02. The concentration of Mn in this case is 0.01. The concentration of Mn is a molar ratio against the molar concentration of Sr—Ca. The concentration of Eu is 0.01.

The luminescence efficiency is shown based on the basis of the phosphor of Example 219 to which Mn was not added. Example 220 in which the addition amount of Mn is 0.01 can improve the luminescence properties.

Example 221

Figure 28:
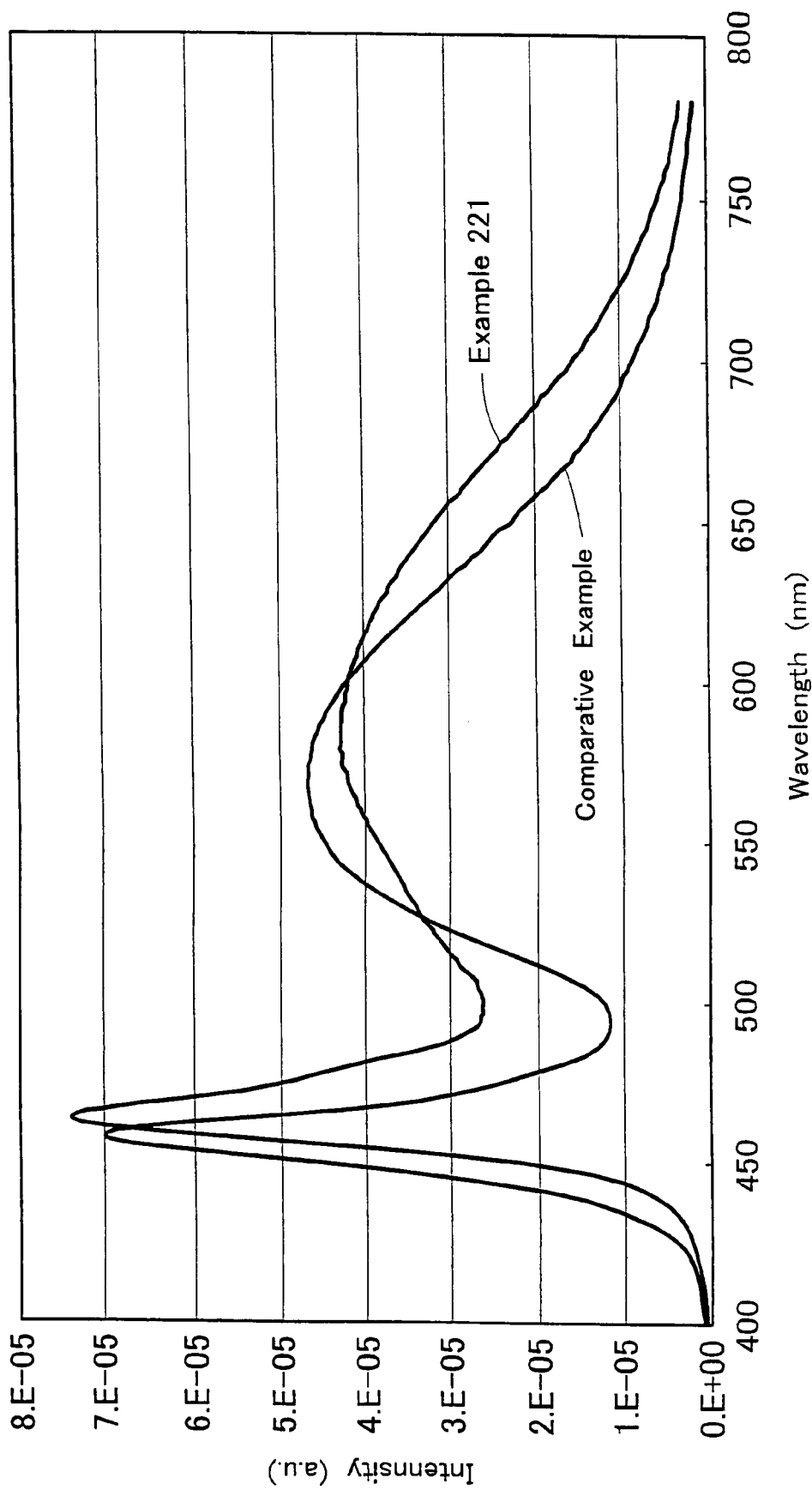
FIG. 28 is a chart showing the luminescence spectrum of the light emitting device of Example 221 related to the present invention.
Figure 29:
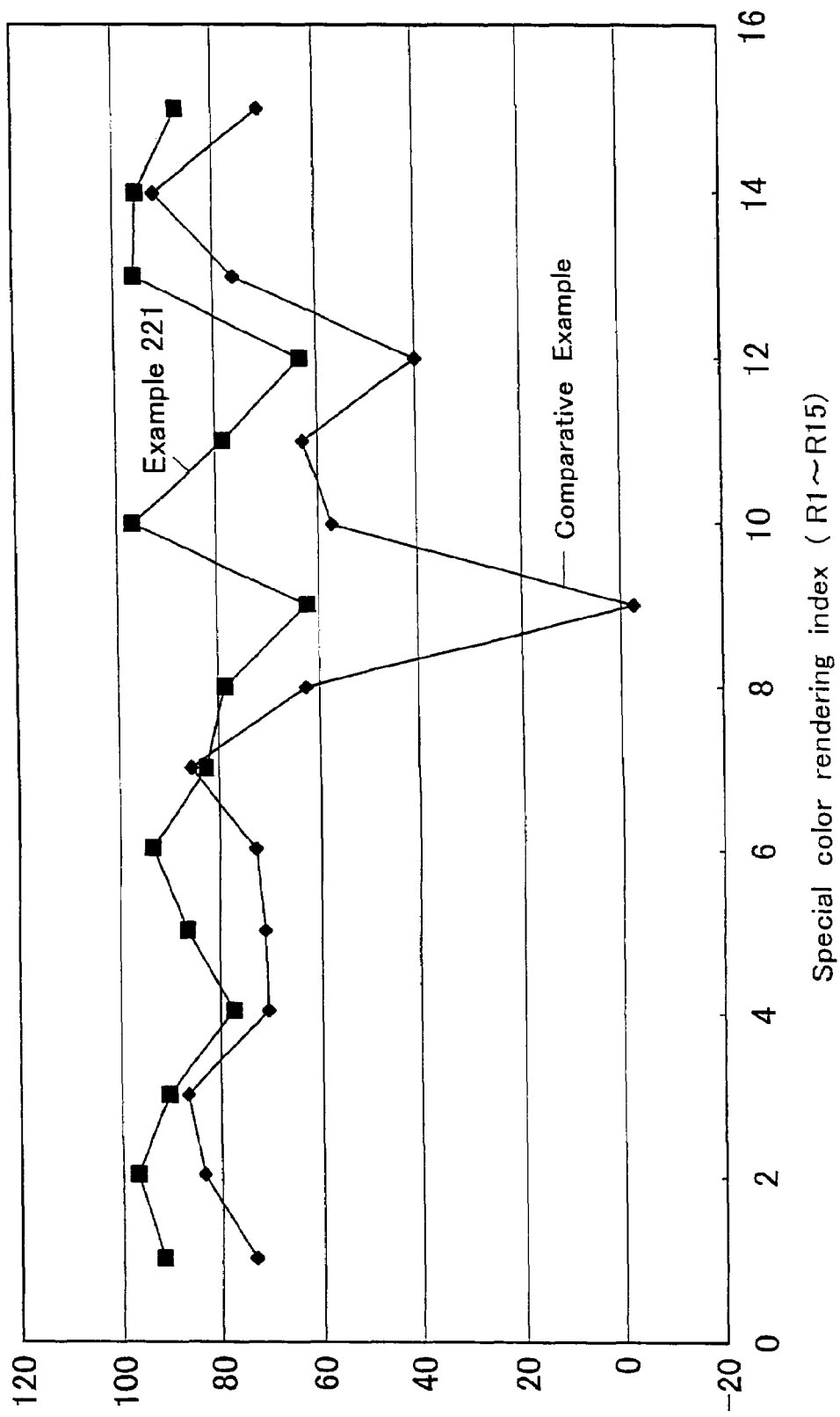
FIG. 29 is a chart showing the color rendering evaluation of the light emitting device of Example 221.

The light emitting device of Example 221 is the type 1 white light emitting device to which a reddish component was added, FIG. 28 is a drawing showing the luminescence spectrum of the light emitting device of Example 221, and FIG. 29 is a drawing showing the color rendering property.

In the light emitting device of Example 221, the phosphor of Example 218 and the YAG-base phosphor are used in mixture as the phosphor 11. As the coating member 12, a mixture which mixed an epoxy resin and a dispersant, barium titanate, titanium oxide and the phosphor 11 at a fixed proportion is used. The epoxy resin is used as the mold member 15. The bullet type light emitting device 1 is a column in which the mold member 15 is a radius of 2 to 4 mm, height is about 7 to 10 mm, and the upper portion is hemispherical.

When current is run in the light emitting device of Example 221, the blue light emitting element 10 emits light having the first luminescence spectrum with a peak wave length of 460 nm, the phosphor 11 contained in the coating member 12 which covers the semiconductor layer 2 carries out the wave conversion of the light, and emits light having the second luminescence spectrum which is different from light having the first luminescence spectrum. Further, the YAG-base phosphor contained in the phosphor 11 emits light having the third luminescence spectrum by light having the first luminescence spectrum. Reddish white light is emitted by color mixing of mutually mixing the first, second and third luminescence spectra.

Table 25 shows the luminescence properties of the light emitting device of Example 221 and the luminescence properties of the light emitting device which was prepared for comparison. In FIG. 28, FIG. 29 and Table 25, the measurement results of the luminescence properties of the light emitting device of Example 221 and the light emitting device of Comparative Example are shown together.

TABLE 25

| | | | 1. Phosphor | | |
|---|---|---|---|---|---|
| | | | $\lambda p$ [nm] | x | y |
| Y—Gd—Al—O:Ce | | | 562 | 0.457 | 0.527 |
| Sr—Ca—Si—N:Eu | | | 650 | 0.639 | 0.351 |

| | 2. Preparation ratio | | |
|---|---|---|---|
| Preparation ratio | Coating member | Y—Gd—Al—O:Ce | Sr—Ca—Si—N:Eu |
| Light emitting device 2 | 10 | 3.6 | — |
| Light emitting device 1 | 10 | 3.8 | 0.6 |

| | 3. Measurement result | | | | | | | | | |
|---|---|---|---|---|---|---|---|---|---|---|
| | If [mA] | Vf [V] | Po [mW] | Y [lm] | $\lambda p$ [nm] | $\Delta\lambda$ [nm] | $\lambda d$ [nm] | x | y | Tcp [K] | Ra | Lamp efficiency [lm/W] |
| Blue-LED | 20 | 3.7 | 14.1 | 0.66 | 456.9 | 19.5 | 461.2 | 0.145 | 0.037 | — | — | 8.8 |
| Light emitting device | 20 | 3.7 | 8.58 | 2.76 | 456.5 | 173.8 | 576.2 | 0.357 | 0.361 | 4599 | 76.2 | 37.0 |
| Light emitting device | 20 | 3.7 | 6.56 | 1.84 | 462.4 | 176.7 | 575.4 | 0.355 | 0.361 | 4671 | 87.7 | 24.9 |

As described above, the phosphor 11 of the light emitting device related to the present Example 221 uses the phosphor of Example 218 and the yttrium-gadolinium-aluminum oxide fluorescent substance (Y—Ga—Al—O:Ce) activated by cerium. More specifically, the phosphor of $(Y_{0.8}Gd_{0.2})_3Al_5O_{12}$:Ce as the yttrium-gadolinium-aluminum oxide fluorescent substance (Y—Ga—Al—O:Ce).

When $(Y_{0.8}Gd_{0.2})_3Al_5O_{12}$:Ce is excited by light of Ex=460 nm, light having a peak wave length of 562 nm is emitted. Similarly, the peak wave length of the phosphor of Example 218 is 650 nm.

In the light emitting device of Example 221, the weight ratio of the phosphor 11 and the coating member is the coating member:the phosphor of (Y—Ga—Al—O:Ce):the phosphor of Example 218=10:3.8:0.6. On the other hand, the phosphor of Comparative Example in the light emitting device using the combination of a blue light emitting element and the phosphor of Y—Ga—Al—O:Ce is mixed at the weight ratio of the coating member:the phosphor of (Y—Ga—Al—O:Ce)=10: 3.6.

The light emitting device of Example 221 is compared with the light emitting device of Comparative Example. The color tone of the light emitting device of Example 221 is hardly changed in comparison with the light emitting device of Comparative Example, but the color rendering property is improved. As cleared from FIG. 29, the light emitting device of Comparative Example was insufficient in the specific color rendering index R9, but R9 is improved in the light emitting device of Example 221. Further, other specific color rendering indexes R8, R10 and the like are also improved to a value nearer to 100%. Lamp efficiency shows a high value of 24.9 lm/W.

Example 222

Figure 30:
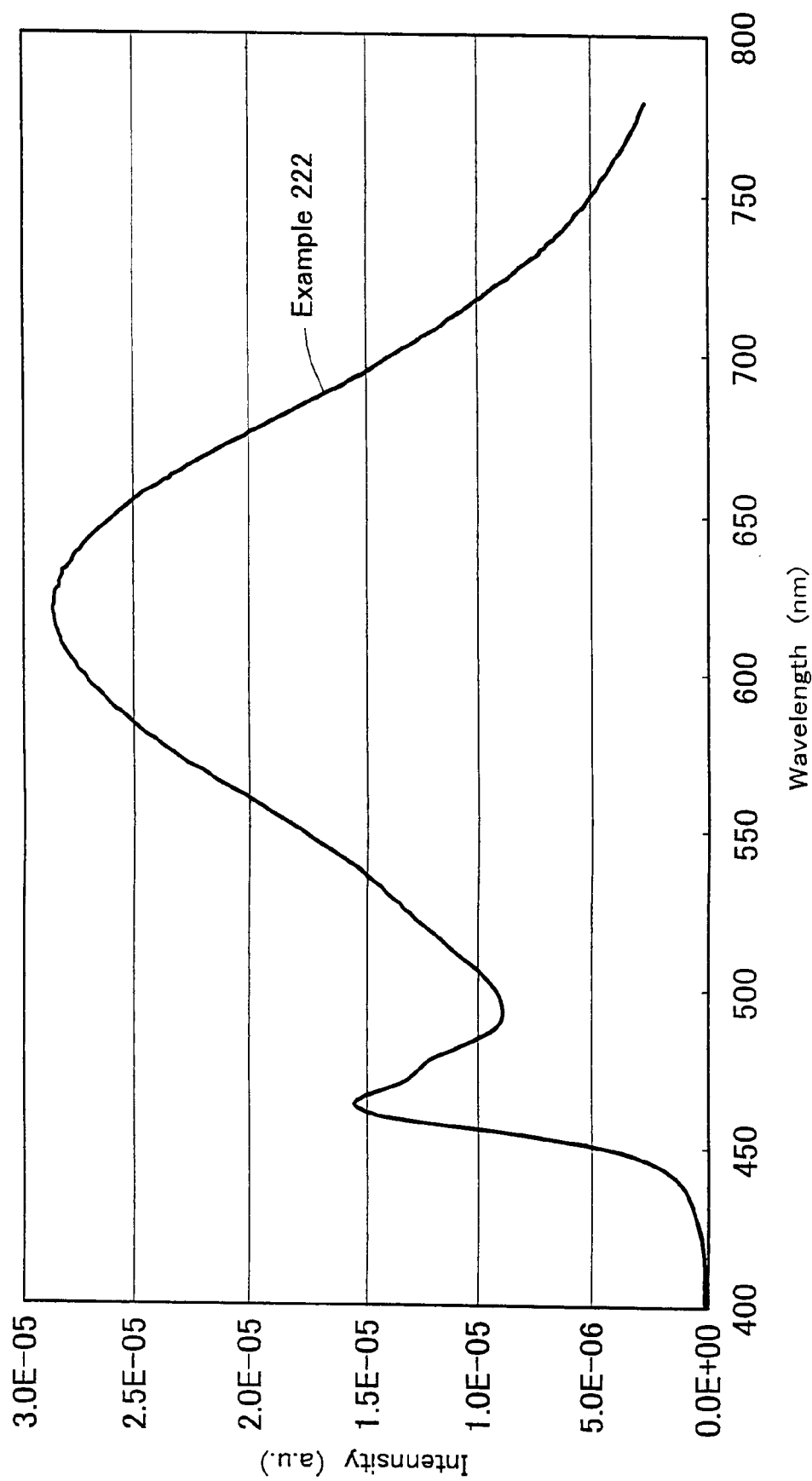
FIG. 30 is a chart showing the luminescence spectrum of the light emitting device of Example 222 related to the present invention.
Figure 31:
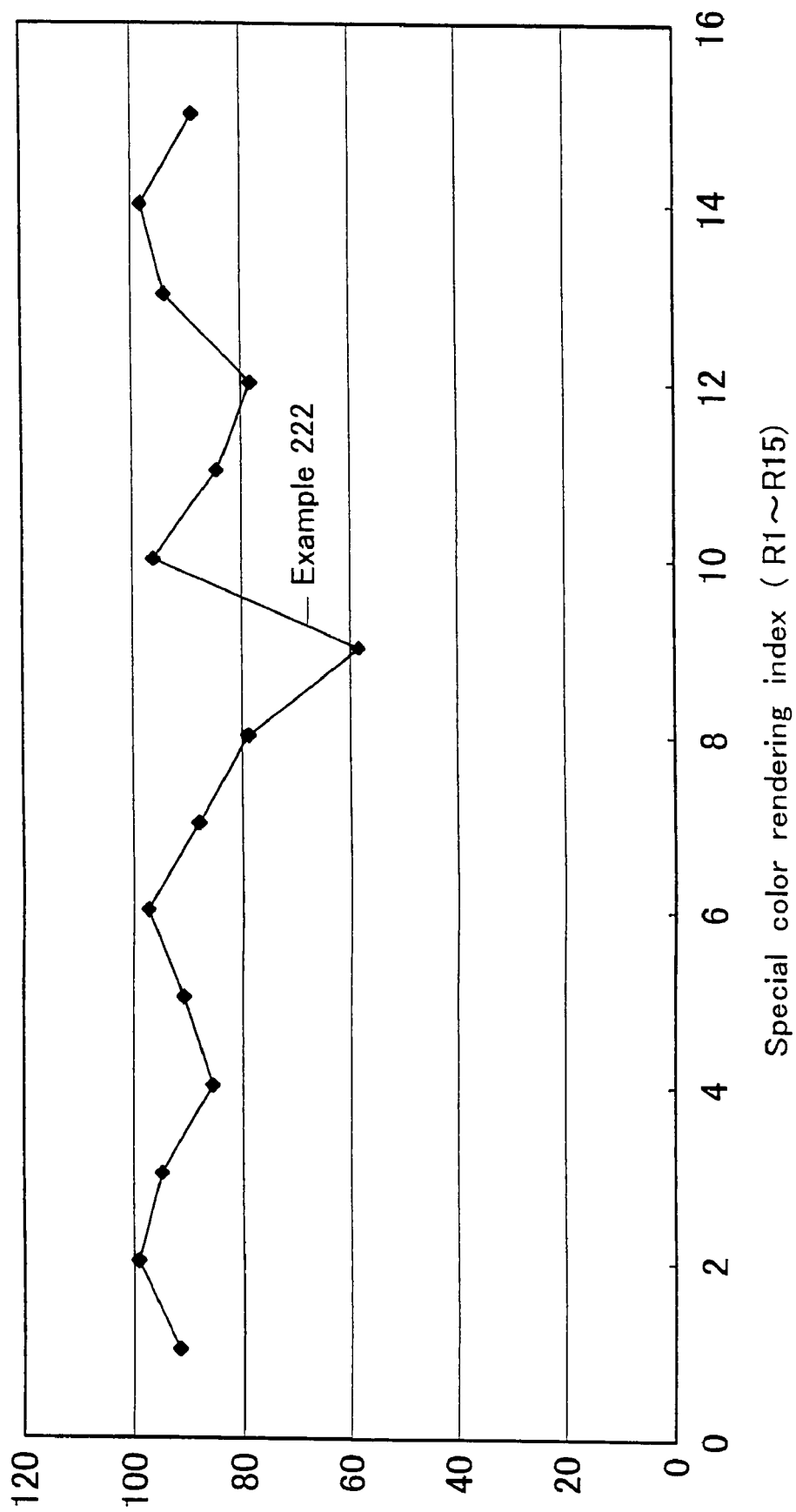
FIG. 31 is a chart showing the color rendering evaluation of the light emitting device of Example 222.

The light emitting device of Example 222 is similarly the type 1 light emitting device, and an electric bulb color light emitting device. FIG. 30 is a drawing showing the luminescence spectrum of the light emitting device of Example 222. FIG. 31 is a drawing showing the color rendering property of the light emitting device of Example 222. FIG. 32 is a drawing showing the chromaticity coordinate of the light emitting device of Example 222. Table 26 shows the luminescence properties of the light emitting device of Example 222.

TABLE 26

| | 1. Phosphor | | |
|---|---|---|---|
| | $\lambda p$ [nm] | x | y |
| Y—Ga—Al—O:Ce | 533 | 0.383 | 0.575 |
| Sr—Ca—Si—N:Eu | 650 | 0.639 | 0.351 |

| | 2. Preparation ratio | | |
|---|---|---|---|
| Preparation ratio | Coating member | Y—Ga—Al—O:Ce | Sr—Ca—Si—N:Eu |
| Exampl222 | 10 | 4.0 | 1.08 |

TABLE 26-continued

|  | 3. Measurement result | | | | | | | | | | |
|---|---|---|---|---|---|---|---|---|---|---|---|
|  | If [mA] | Vf [V] | Po [mW] | Y [lm] | λp [nm] | Δλ [nm] | λd [nm] | x | y | Tcp [K] | Ra | Light emitting device [lm/W] |
| Blue-LED | 20 | 3.7 | 14.1 | 0.66 | 456.9 | 19.5 | 461.2 | 0.145 | 0.037 | — | — | 8.8 |
| Light emitting device 3 | 20 | 3.7 | 5.3 | 1.42 | 620.7 | 238.1 | 583.6 | 0.449 | 0.407 | 2832 | 90.4 | 19.2 |

In the light emitting device 3 of Example 222, the phosphor 11 uses a mixture of the phosphor of Example 218 and the yttrium-gadolinium-aluminum oxide fluorescent substance (Y—Ga—Al—O:Ce) activated by cerium. Further, in the light emitting device 3 of Example 222, the phosphor having the composition of $Y_3(Al_{0.8}Ga_{0.2})_5O_{12}:Ce$ is used as the yttrium-gadolinium-aluminum oxide fluorescent substance.

When the present phosphor is excited by light of Ex=460 nm, light having a peak wave length of 533 nm is emitted. Similarly, the peak wave length of the phosphor of Example 218 is 650 nm.

The phosphor 11 and the coating member are mixed at the weight ratio of the coating member:the phosphor of (Y—Ga—Al—O:Ce):the phosphor of Example 218=10:4.0: 1.08.

The light emitting device of Example 22 using the phosphor which was thus mixed emits light of an electric bulb color. According to FIG. 32 showing the chromaticity coordinate of the light emitting device of Example 222, the color tone x and the color tone y are situated at a warm color-base white color luminescence region. The specific color rendering index R9 of the light emitting device of Example 222 is also 60%, and the color rendering property is improved. In the light emitting device of Example 222, the peak wave length is situated at a red region of 620.7 nm, therefore the electric bulb color white light emitting device is obtained. In the light emitting device of Example 222, the color temperature is 2832K, the color rendering property Ra is 90.4, therefore it has the luminescence property nearby an electric bulb color. Further, the light emitting device of Example 222 has the high luminescence property of 19.2 lm/W.

Example 223

The light emitting device of Example 223 is the type 3 light emitting device.

The light emitting device of Example 223 uses the light emitting element 101 which has an InGaN semiconductor layer having a luminescence peak of 460 nm at a blue region as a light emitting layer.

Further, the phosphor of Example 220 and the phosphor of $Y_3(Al_{0.8}Ga_{0.2})_5O_{12}:Ce$ are used as the phosphor.

In the light emitting device of Example 223 which was constituted as above, the phosphor is a phosphor in which an indirect luminescence spectrum which was reflected from a reflection plate and a luminescence spectrum which was directly emitted from the light emitting element 101 are irradiated on the phosphor 108, and light having a blue luminescence spectrum which was emitted from the light emitting element 101 emits light of a white color.

Further, a desired luminescence spectrum can be obtained by doping phosphors emitting green light such as $SrAl_2O_4$:Eu, $Y_2SiO_5$:Ce,Tb, $MgAl_{11}O_{19}$:Ce,Tb, $Sr_7Al_{12}O_{25}$:Eu (at least one or more among Mg, Ca, Sr and Ba)$Ga_2S_4$:Eu; phosphors emitting blue light such as $Sr_5(PO_4)_3Cl$:Eu, (SrCa Ba)$_5(PO_4)_3Cl$:Eu, $(BaCa)_5(PO_4)_3Cl$:Eu, (at least one or more among Mg, Ca, Sr and Ba)$_2B_5O_9Cl$:Eu,Mn, (at least one or more among Mg, Ca, Sr and Ba)$(PO_4)_6Cl_2$:Eu,Mn; phosphors emitting red light such as $Y_2O_2S$:Eu, $La_2O_2S$:Eu, $Y_2O_3$:Eu, $Ga_2O_2S$:Eu and the like, in the phosphor 108 of the present invention.

When a white LED lamp is produced using the light emitting device which was constituted as above, the yield of 99% is obtained. Thus, according to the present Example 222, the light emitting device having good mass productivity, high reliability and further the little unevenness of color tone can be produced.

Examples 224 to 245 related to Mode 5 of Operation

Examples 224 to 229

Figure 34:
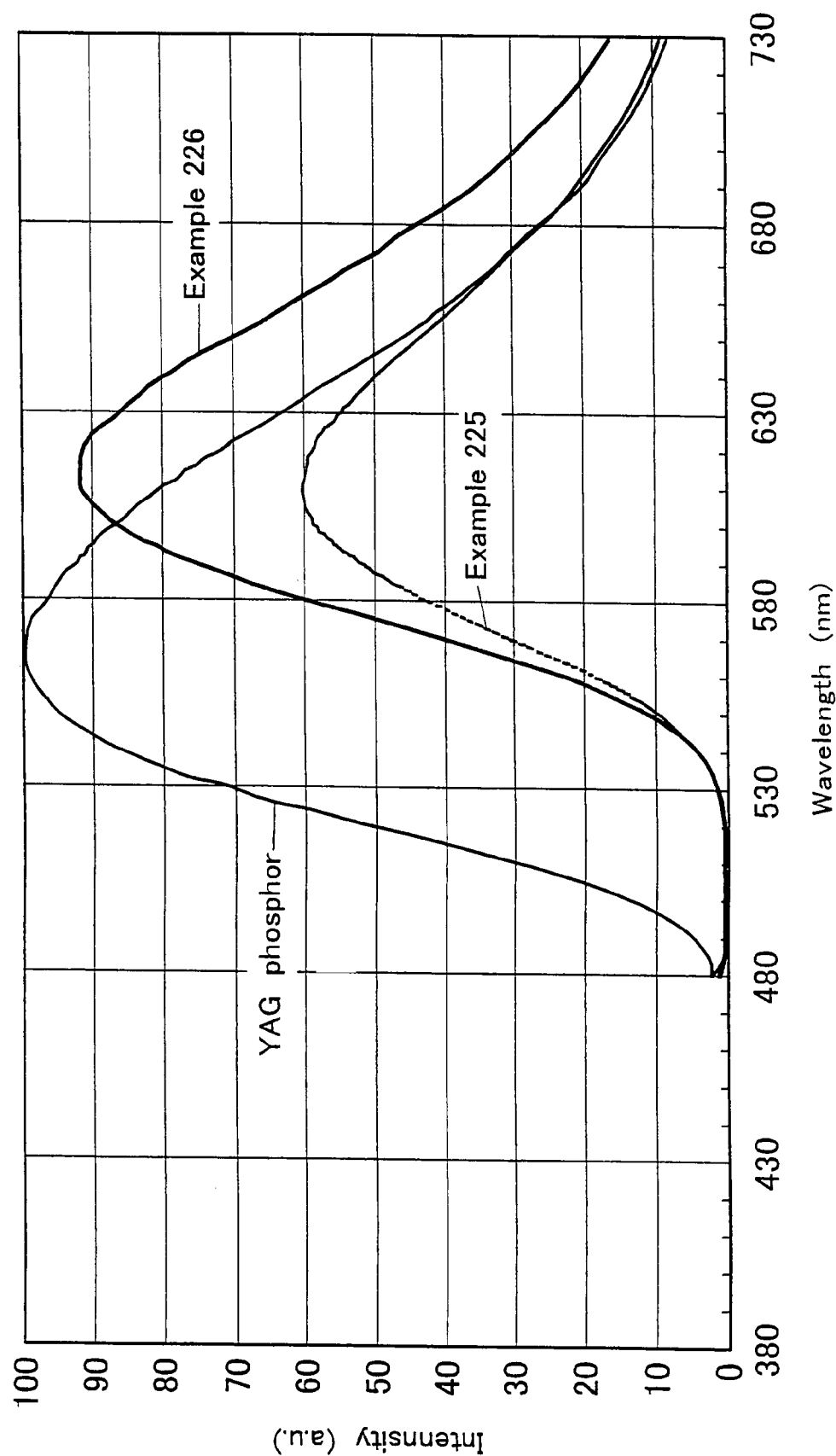
FIG. 34 is a chart showing the luminescence spectra when the nitride phosphors of Examples 225 and 226 were excited at Ex=460 nm.
Figure 35:
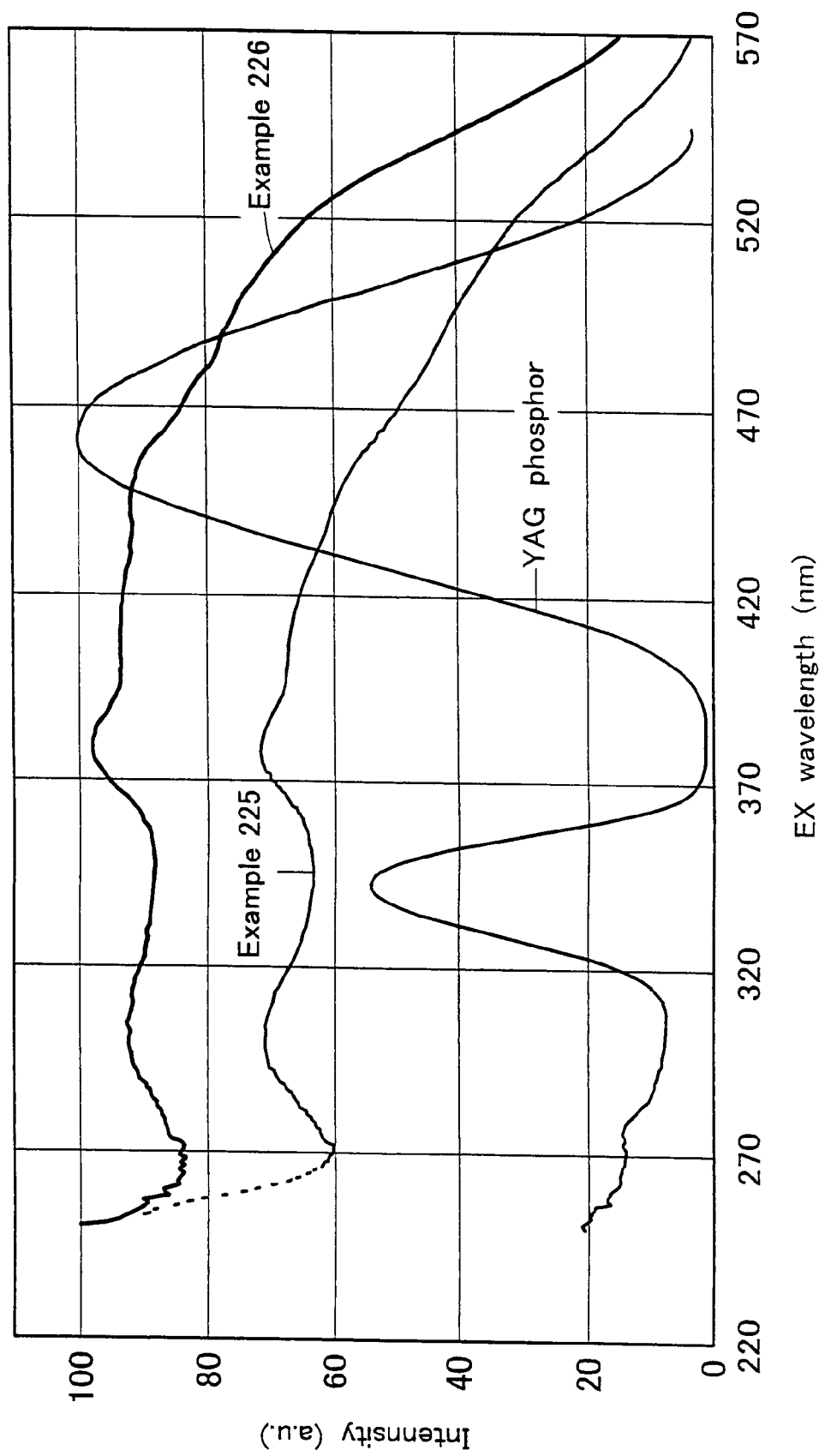
FIG. 35 is a chart showing the excitation spectra of the nitride phosphors of Examples 225 and 226.
Figure 36:
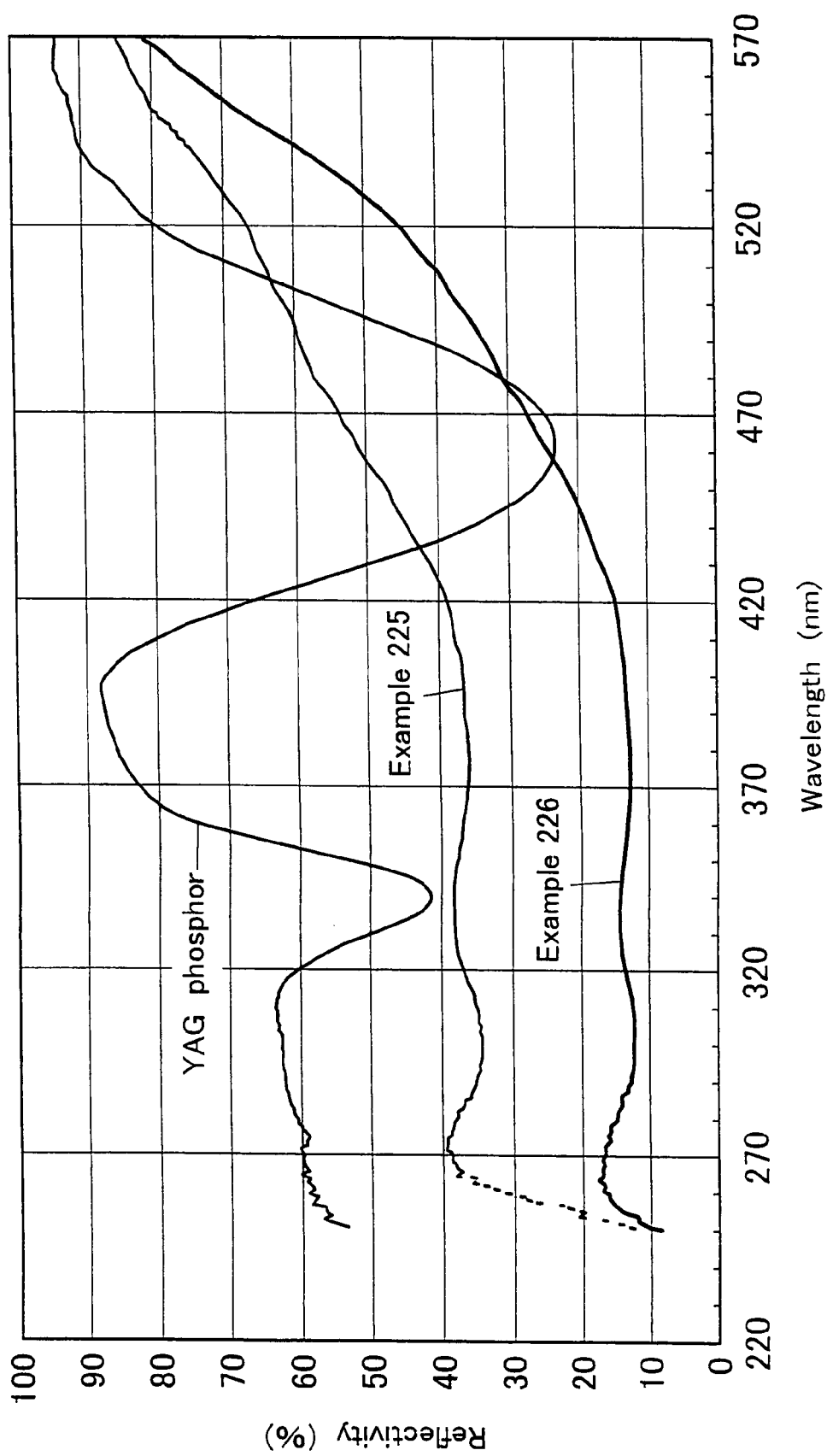
FIG. 36 is a chart showing the reflection spectra of the nitride phosphors of Examples 225 and 226.
Figure 37:
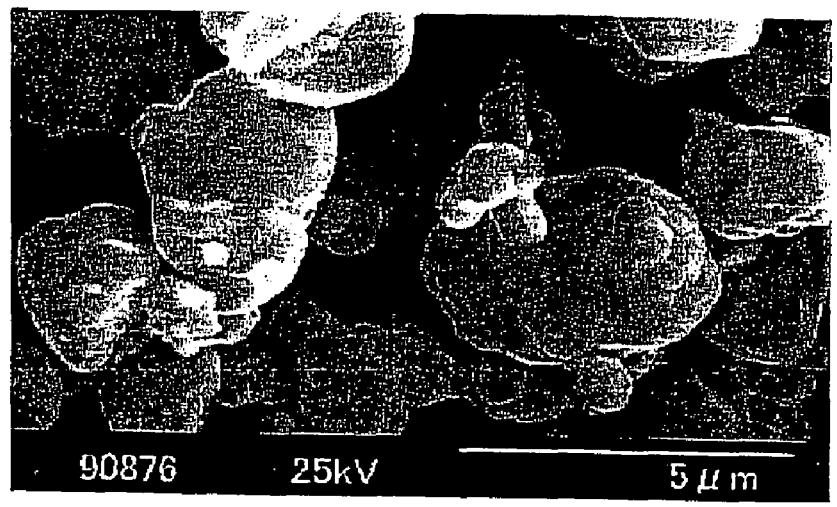
FIG. 37 is a SEM (scanning electron microscope) photograph of the nitride phosphor of Example 226.

Table 27 shows Examples 224 to 229 and Comparative Examples 2 and 3 of the nitride phosphors related to the present invention. Further, FIG. 34 to FIG. 36 show the luminescence properties of the nitride phosphors of Examples 225 and 226. FIG. 34 is a drawing showing luminescence spectra when the nitride phosphors of Examples 225 and 226 were excited at Ex=460 nm. FIG. 35 is a drawing showing the excitation spectrum of the nitride phosphors of Examples 225 and 226. FIG. 36 is a drawing showing the reflection spectrum of the nitride phosphor of the nitride phosphors of Examples 225 and 226. FIG. 37 is a photo photographed the particle diameter of the nitride phosphor of Example 226.

TABLE 27

|  |  | Raw material | | | | | Result | |
|---|---|---|---|---|---|---|---|---|
|  | Basic constituting elements | Mixing ratio of raw material (Ca/Si/Eu) | Other element | Baking pattern | Crucible material | Atmosphere | Central particle diameter (Dm/σlog) | Central particle diameter (US exists) (Dm/σlog) |
| Example 224 | $Ca_{1.97}Si_5N_8:Eu_{0.03}$ | 1.97/5/0.03 | — | One step 1350° C. × 5 h | BN | $NH_3$ | 5.33/0.410 | 4.69/0.378 |
| Example 225 | $Ca_{1.99}Si_5N_8:Eu_{0.01}$ | 1.99/5/0.01 | — | One step 1350° C. × 5 h | BN | $NH_3$ | 5.61/0.412 | 4.31/0.415 |

TABLE 27-continued

| | | | | | | | | |
|---|---|---|---|---|---|---|---|---|
| Example 226 | $Ca_{1.94}Si_5N_8:Eu_{0.06}$ | 1.94/5/0.06 | — | One step 1350° C. × 5 h | BN | $NH_3$ | 5.13/0.366 | 4.67/0.419 |
| Example 227 | $Ca_{1.97}Si_5N_8:Eu_{0.03}$ | 1.97/5/0.03 | — | Two steps 800° C. × 3 h, 1350° C. × 5 h | BN | $NH_3$ | — | — |
| Example 228 | $Ca_{1.97}Si_5N_8:Eu_{0.03}$ | 1.97/5/0.03 | B | One step 1350° C. × 5 h | BN | $NH_3$ | — | — |
| Example 229 | $Ca_{1.97}Si_5N_8:Eu_{0.03}$ | 1.97/5/0.03 | Al | One step 1350° C. × 5 h | $Al_2O_3$ | $NH_3$ | — | — |
| Comparative Example 2 | $Ca_{1.97}Si_5N_8:Eu_{0.03}$ | 1.97/5/0.03 | — | One step 1350° C. × 5 h | Mo | $NH_3$ | — | — |
| Comparative Example 3 | $Ca_{1.97}Si_5N_8:Eu_{0.03}$ | 1.97/5/0.03 | Fe | One step 1350° C. × 5 h | BN | $NH_3$ | — | — |

| | Emission properties (460 nm) | | | | | Temperature characteristics (%) | | |
|---|---|---|---|---|---|---|---|---|
| | Color tone x | Color tone y | Brightness (%) | Quantum efficiency (%) | Peak wave length (nm) | 100° C. | 200° C. | 300° C. |
| Example 224 | 0.583 | 0.406 | 135.5 | 139.0 | 612 | 93.7 | 67.1 | 23.5 |
| Example 225 | 0.583 | 0.410 | 97.6 | 96.5 | 610 | 99.8 | 81.1 | 37.1 |
| Example 226 | 0.590 | 0.401 | 139.4 | 148.0 | 614 | 92.9 | 56.1 | 12.5 |
| Example 227 | 0.584 | 0.400 | 128.7 | 136.8 | 612 | 97.7 | 70.6 | 22.6 |
| Example 228 | 0.587 | 0.405 | 137.6 | 141.1 | 612 | 95.8 | 65.8 | 21.6 |
| Example 229 | 0.586 | 0.406 | 116.1 | 119.1 | 611 | 95.7 | 68.1 | 22.6 |
| Comparative Example 2 | 0.581 | 0.410 | 100.0 | 100.0 | 610 | 97.9 | 72.7 | 25.7 |
| Comparative Example 3 | 0.58 | 0.411 | 65.1 | 65.4 | 611 | 99.6 | 79.6 | 29.6 |

| | Chemical analysis | | | | | | | | | | | | | |
|---|---|---|---|---|---|---|---|---|---|---|---|---|---|---|
| | Ca (%) | Eu (%) | N (%) | O (%) | Fe (ppm) | Mg (ppm) | Sr (ppm) | Ba (ppm) | Zn (ppm) | B (ppm) | Al (ppm) | Mo (ppm) | Mn (ppm) | Cu (ppm) | Si |
| Example 224 | 23.1 | 1.22 | 29.4 | 0.87 | 7 | 7 | 180 | 1 | 9 | <1 | 110 | <1 | <1 | <1 | Residual amount against 100% of total amount |
| Example 225 | 23.7 | 0.46 | 31.3 | 1.35 | 6 | 13 | 70 | 6 | 360 | <1 | 30 | <1 | 1 | <1 | Residual amount against 100% of total amount |
| Example 226 | 22.4 | 2.40 | 31.5 | 0.97 | 8 | 15 | 50 | 6 | 5 | <1 | 30 | <1 | 1 | 1 | Residual amount against 100% of total amount |
| Example 227 | 23.2 | 1.20 | 29.3 | 0.80 | 7 | 8 | 150 | 5 | 5 | <1 | 90 | <1 | 1 | <1 | Residual amount against 100% of total amount |
| Example 228 | 23.1 | 1.21 | 29.3 | 0.90 | 9 | 7 | 110 | 6 | 7 | 510 | 100 | <1 | <1 | <1 | Residual amount against 100% of total amount |
| Example 229 | 23.0 | 1.21 | 29.3 | 0.95 | 9 | 10 | 120 | 6 | 4 | <1 | 90 | <1 | 1 | <1 | Residual amount against 100% of total amount |
| Comparative Example 2 | 23.1 | 1.22 | 29.4 | 0.85 | 9 | 8 | 120 | 5 | 4 | <1 | 30 | 490 | 1 | 1 | Residual amount against 100% of total amount |

TABLE 27-continued

| Comparative Example 3 | 23.1 | 1.22 | 29.3 | 0.98 | 480 | 8 | 140 | 6 | 5 | <1 | 90 | <1 | 1 | 1 | Residual amount against 100% of total amount |

Examples 224 to 229 are results of testing the chemical properties and physical properties of the nitride phosphors related to the present invention which contains at least one or more selected from a group consisting of B, Al, Cu, Mn, Co, Ni, Mo, O and Fe in $L_XM_YN_{((2/3)X+(4/3)Y)}$:Z. The nitride phosphors are represented by $Ca_{2-t}Eu_tSi_5N_8$ using Ca for L, Si for M and Eu for Z of the base nitride phosphor of $L_XM_Y N_{((2/3)X+(4/3)Y)}$:Z. The portion of Ca used in the nitride phosphors of Examples 224 to 229 is substituted with Eu, and the compounding proportion of Eu is represented by t and the compounding proportion of Ca is represented by 2–t. There are contained the compounding proportions of Eu which are represented by 0.03 for Example 224, 0.01 for Example 225 and 0.06 for Example 226, against 5 of Si.

Calcium nitride, silicon nitride and europium oxide which contain several ppm to several hundreds ppm of at least one or more selected from a group consisting of Mg, Sr, Ba, Zn, B, Al, Cu, Mn and Fe are mixed. In Example 224, the compounding proportion (molar ratio) of calcium nitride, $Ca_3N_2$, silicon nitride, $Si_3N_4$, and europium oxide, $Eu_2O_3$ which are raw materials is set so as to be Ca:Si:Eu=1.97:5:0.03.

| | |
|---|---|
| Calcium nitride, $Ca_3N_2$ | 14.47 g |
| Silicon nitride, $Si_3N_4$ | 34.75 g |
| Europium oxide, $Eu_2O_3$ | 0.79 g |

The above-mentioned compounds are mixed and firing is carried out. As firing conditions, they are charged in a boron nitride crucible in ammonia atmosphere, the temperature was gradually raised from room temperature over about 5 hours, firing is carried out for 5 hours at about 1350° C., and cooling was further gradually carried out until room temperature over 5 hours.

According to Table 27, O is contained by 0.87% by weight, and Mg, Sr, Ba, Zn, B, Al, Cu, Mn and Fe are contained by several ppm in the nitride phosphor of Example 224 in addition to the base nitride phosphor. Si of % by weight obtained by extracting the above-mentioned base nitride phosphor from 100% is contained. The nitride phosphor has high luminescence brightness by the firing conditions and Mg, Sr, Ba, Zn, B, Al, Cu and Mn. Since a semiconductor light emitting element generally used is raised to a temperature of 100 to 150° C., it is preferable that it is stable at said temperature when the nitride phosphor are formed on the surface of a light emitting element. The temperature characteristics of the nitride phosphors of the present Examples 224 to 229 are extremely good. From this viewpoint, Example 225 has extremely good temperature characteristic therefore has a superior technical meaning.

Example 226 has the high luminescence brightness in comparison with Example 225, and has the high quantum efficiency. Accordingly, Example 226 exhibits the extremely good temperature characteristic.

The particle diameter of Example 224 is 1 to 3 μm, the particle diameter is big, and the luminescence brightness is high. It has a good dispersion and easiness to handle.

Example 227 carried out the firing of raw materials changing firing conditions. Even if the firing is a two step firing, Example 227 exhibits the high brightness, high quantum efficiency and good temperature characteristic in like manner as Examples 224 and 226.

The phosphors related to Examples use the crucible of boron nitride material, and firing is carried out in ammonia atmosphere. Since a furnace and a crucible are not eroded, impurities are not contaminated in a baked product. Example 228 shows the luminescence efficiency when B is contained in raw materials. From the result of Example 228, the luminescence efficiency is kept in a high condition even if much B is contained.

This is caused by an assumption that a furnace and a BN crucible are eroded and BN is contained in the phosphor, but since the luminescence efficiency is not lowered, firing can be carried out without considering the erosion of the furnace and crucible. Namely, even if the boron nitride eroded is contained in the phosphor as a result of carrying out the firing under the condition, the luminescence efficiency is not lowered, therefore it is extremely useful.

Example 229 shows the luminescence properties of the phosphor containing much aluminum. This considered the erosion from an alumina crucible when the alumina crucible is used. From the result of Example 229, the phosphor in which aluminum is contained exhibits also the high luminescence properties. Accordingly, even if the alumina crucible is used, firing can be carried out without considering the contamination of the alumina crucible.

On the contrary, Comparative Example 2 uses a molybdenum crucible. When the molybdenum crucible is used, the crucible is eroded to be contained in the phosphor. The phosphor of Comparative Example 2 containing molybdenum generates the lowering of the luminescence properties. Accordingly, it is not preferable to use the molybdenum crucible. Since molybdenum lowers the luminescence properties, it is preferably removed to the outside of a system.

Comparative Example 2 used those which contained Fe in the phosphor. Since Fe is occasionally contained in the phosphor by the contamination from the molybdenum crucible and a furnace, an effect of containing Fe in the phosphor was tested. As a result, since Fe lowers also the luminescence properties, it is preferably removed to the outside of a system.

Comparative Test

Figure 38:
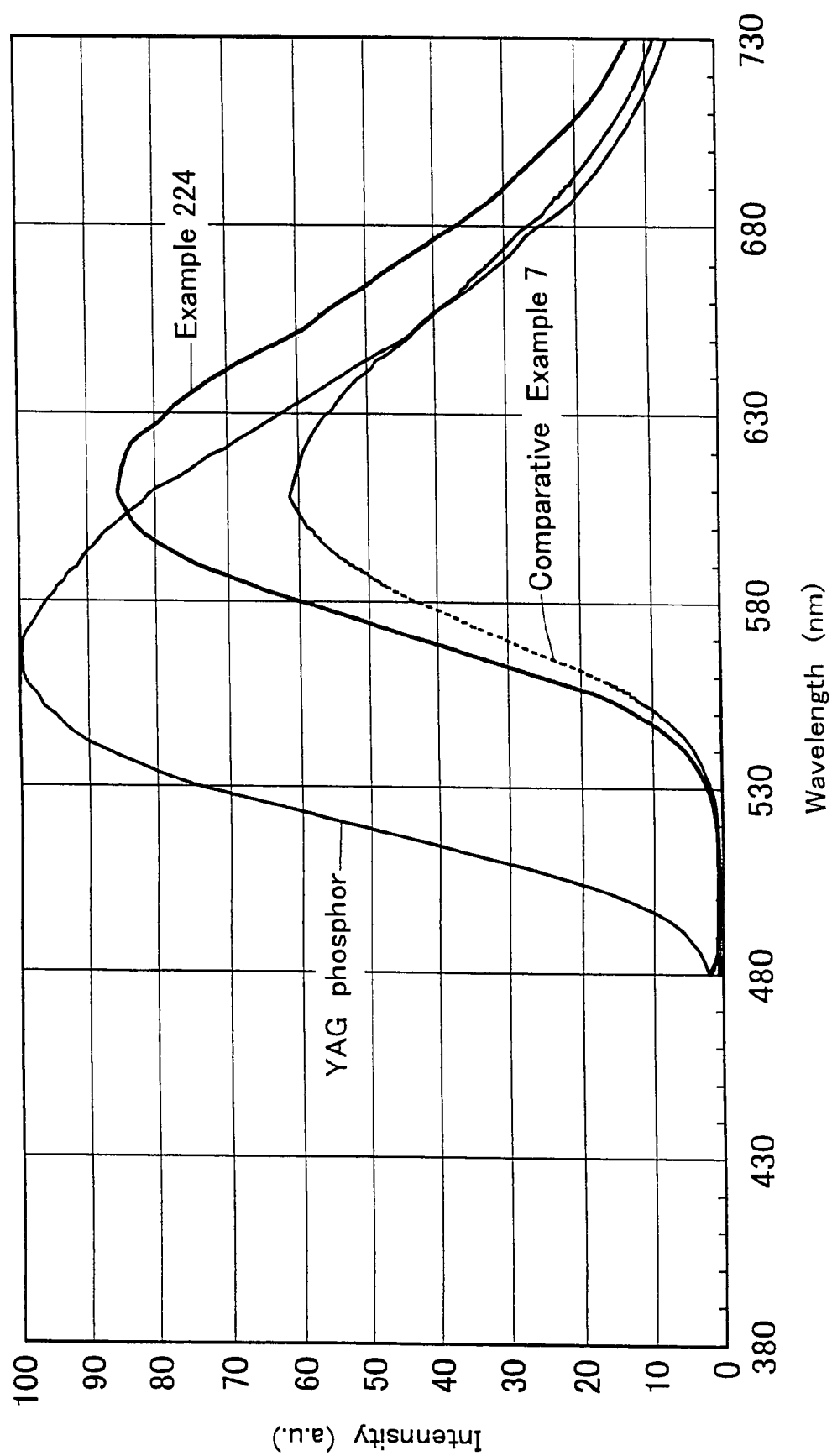
FIG. 38 is a chart showing the luminescence spectra when the nitride phosphors of Example 224 and Comparative Example 7 were excited at Ex=460 nm.

In order to clear the action effect of the present invention, a comparative test was further carried out. Comparative Example 4 is a nitride phosphor containing the base nitride phosphor, and on the other hand, Examples 224 and 227 are the nitride phosphors containing the base nitride phosphor and the component constituting elements. The result is shown in Table 28. FIG. 38 is a drawing showing luminescence spectra when the nitride phosphors of Example 224 and Comparative Example 4 were excited at Ex=460 nm.

TABLE 28

| | Basic constituting elements | Raw material | | | | | | | |
|---|---|---|---|---|---|---|---|---|---|
| | | Mixing ratio of raw material (Ca/Si/Eu) | $Ca_3N_2$ | $Si_3N_4$ | $Eu_2O_3$ | Baking pattern | Crucible material | Atmosphere | Gas mass flow |
| Comparative Example 4 | $Ca_{1.97}Si_5N_8{:}Eu_{0.03}$ | 1.97/5/0.03 | 2.89 | 6.95 | 0.16 | Two steps 800° C. × 3 h, 1350° C. × 5 h | BN | $H_2/N_2$ | 0.1/3 |
| Example 227 | $Ca_{1.97}Si_5N_8{:}Eu_{0.03}$ | 1.97/5/0.03 | 14.47 | 34.75 | 0.79 | Two steps 800° C. × 3 h, 1350° C. × 5 h | BN | $NH_3$ | 1 |
| Example 224 | $Ca_{1.97}Si_5N_8{:}Eu_{0.03}$ | 1.97/5/0.03 | 14.47 | 34.75 | 0.79 | One step 1350° C. × 5 h | BN | $NH_3$ | 1 |

| | Emission characteristics (460 nm) | | | | | Temperature characteristics (%) | | |
|---|---|---|---|---|---|---|---|---|
| | Color tone x | Color tone y | Brightness (%) | Quantum efficiency (%) | Energy efficiency (%) | 100° C. | 200° C. | 300° C. |
| Comparative Example 4 | 0.585 | 0.407 | 99.1 | 100.5 | 99.1 | 93.3 | 62.8 | 18.2 |
| Example 227 | 0.584 | 0.406 | 128.7 | 136.8 | 131.1 | 97.7 | 70.6 | 22.6 |
| Example 224 | 0.585 | 0.406 | 134.3 | 139.3 | 136.8 | 93.7 | 67.1 | 23.5 |

The compounding proportion of calcium nitride, $Ca_3N_2$, silicon nitride, $Si_3N_4$, and europium oxide, $Eu_2O_3$ which are the raw materials of Comparative Example 4 is set so as to be Ca:Si:Eu=1.97:5:0.03, and those which were adequately purified as the raw materials were used. On the other hand, the compounding proportion of the raw materials of Example 227 uses the same condition as Comparative Example 4, and the concentration of several ppm of Mg, Sr, Ba, Zn, B, Al, Cu, Mn and Fe which is the same concentration as that of Example 224 is contained in the raw materials. Example 227 charges the three compounds of the raw materials in a BN crucible, the temperature was gradually raised from room temperature, firing is carried out for 3 hours at about 800° C., and further the temperature was gradually raised, firing is carried out for 5 hours at about 1350° C., and cooling was further gradually carried out until room temperature over 5 hours. Comparative Example 4 charged the three compounds of the raw materials which do not contain Mn and the like in a molybdenum crucible, and firing was carried out in hydrogen/nitrogen atmosphere. When the ammonia flow rate of Example 227 is referred to as 1, the flow rate of hydrogen/nitrogen of Comparative Example 4 is hydrogen:nitrogen=0.1:3. On the other hand, Example 224 carried out the raise of temperature gradually, firing was carried out for 5 hours at about 1350° C., and cooling was further gradually carried out until room temperature over 5 hours.

As cleared from Table 28 and FIG. 38, the luminescence brightness of Comparative Example 4 is 99.1% and on the other hand, the luminescence brightness of Example 227 was 128.7%, therefore the luminescence brightness was improved by 29.6%. The difference of the luminescence brightness has an important technical meaning from the viewpoint of the luminescence efficiency. The energy efficiency of Comparative Example 4 was 99.1%, and on the contrary, the energy efficiency of Example 227 was 131.1%. It was improved by 32%. Further, the quantum efficiency of Comparative Example 4 was 100.5%, and on the contrary, the quantum efficiency of Example 227 was 136.8%. It was improved by 36.3%. Thus, the extremely remarkable luminescence properties can be obtained by changing atmosphere and the material of a crucible. Further, the extremely remarkable luminescence properties can be obtained by containing Mg, Mn and the like. The improvement of the luminescence properties can provide a light emitting material which emits light of a more brilliant white color. Further, the improvement of the luminescence property can improve also the reduction of electric power because it enhances energy efficiency.

Further, Example 224 carried out firing under the same condition except the difference of a firing pattern in comparison with Example 227. The firing pattern of Example 224 carried out the raise of temperature gradually from room temperature, firing was carried out for 5 hours at about 1350° C., and cooling was further gradually carried out until room temperature over 5 hours. At this time, the luminescence brightness was 134.3%, and it was improved by 34.3% in comparison with Comparative Example 4. Further, the energy efficiency was 136.8%, and it was improved by 36.8% in comparison with Comparative Example 4. Further, the quantum efficiency was 139.3%, and it was improved by 39.3% in comparison with Comparative Example 4. Further, when the temperature characteristic is observed by the relative brightness fluctuation of a measured lot by setting room temperature as 100, Comparative Example 4 is 62.8% at a temperature of 200° C., and on the contrary, Example 224 is 67.1% at the same temperature, which showed a high value. Further, Comparative Example 4 is 18.2% at a temperature of 300° C., and on the contrary, Example 224 was 23.5% at the same temperature, which showed a high value. When said nitride phosphor was provided on surface of a light emitting element, the composition of the nitride phosphor is not changed, it represents that the temperature characteristic shows the high luminescence property, and it shows that the higher the temperature characteristic is, the more stable it is. From the result of Table 28, it is clear that the nitride phosphor related to the present invention has the better temperature characteristic than Comparative Example 4, and reliability is high. Examples 224 and 227 showed the extremely remarkable luminescence property in comparison with Comparative Example 4. The improvement of the luminescence property which has been not solved can be extremely easily carried out thereby.

Examples 230 to 232

The base nitride phosphor of the phosphor of Example 230 is $Sr_{1.97}Eu_{0.03}Si_5N_8$. The compounding proportion of raw materials is strontium nitride, $Sr_3N_2$:silicon nitride, $Si_3N_4$: europium oxide, $Eu_2O_3$=1.97:5:0.03. The concentration of 250 to 400 ppm of Mg, Sr, Ba, Zn, B, Al, Cu, Mn, Co and Fe are contained in the raw materials. The three compounds of the raw materials were charged in a BN crucible, firing was carried out for 3 hours at 800 to 1000° C. in a tubular furnace, then firing was carried out at 1250 to 1350° C. for 5 hours, and cooling was further gradually carried out until room temperature over 5 hours. Ammonia gas was continuously flown at a flow rate of 1 liter/min. As a result, the temperature characteristic at 200° C. of the nitride phosphor of Example 230 is 87.7%, which shows the extremely high temperature characteristic. Table 29 shows Examples 230 to 232 of the nitride phosphors related to the present invention.

length becomes 637 nm by changing the concentration of Eu. The temperature characteristic is 97.9% at 200° C., which shows a high value, therefore high stability is shown Examples 233 to 243

Figure 40:
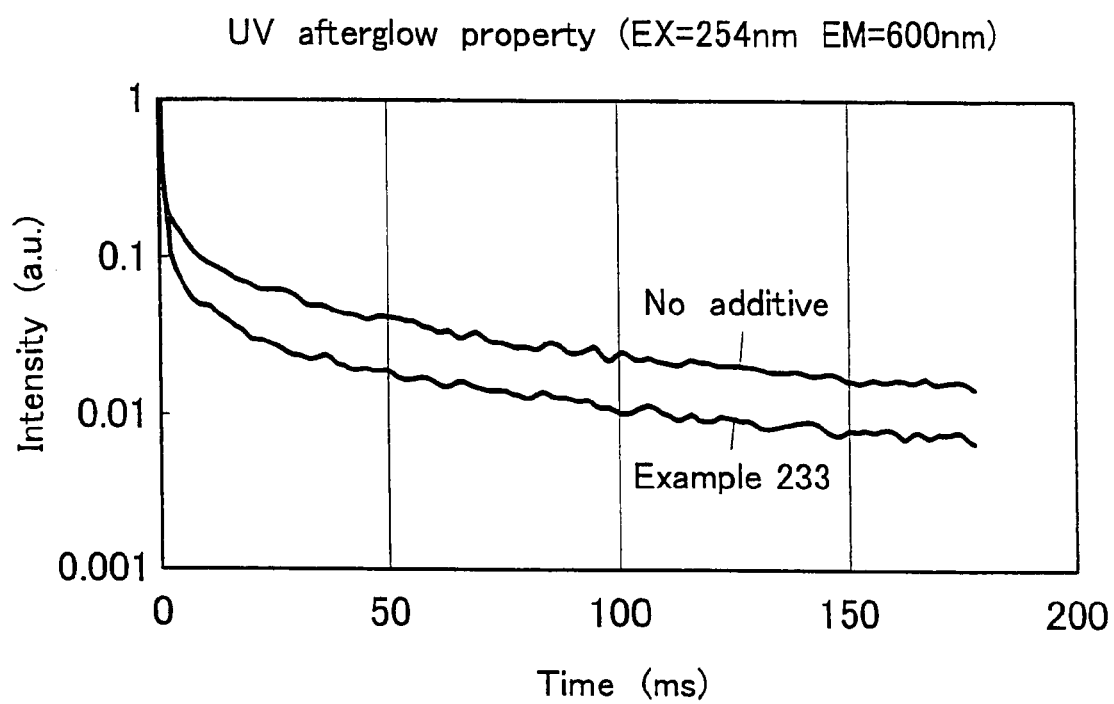
FIG. 40 is a chart showing the measurement result which measured the afterglow property of Example 233.

Examples 233 to 243 carried out the measurement of afterglow property. Table 30 shows the result of measuring the afterglow properties of Examples 233 to 243. FIG. 40 shows the result of measuring the afterglow property of Example 233.

TABLE 30

| Basic constituting elements | | Compound | Addition amount (wt %) | 1/10 Afterglow (msec) |
|---|---|---|---|---|
| No additive | $Ca_{1.94}Si_5N_8:Eu_{0.06}$ | — | — | 20.5 |
| Example 233 | $Ca_{1.94}Si_5N_8:Eu_{0.06}$ | BN | 0.25 | 6.5 |
| Example 234 | $Ca_{1.94}Si_5N_8:Eu_{0.06}$ | BN | 0.75 | 14.5 |
| Example 235 | $Ca_{1.94}Si_5N_8:Eu_{0.06}$ | BN | 1.50 | 16.5 |
| Example 236 | $Ca_{1.94}Si_5N_8:Eu_{0.06}$ | BN | 3.00 | 18.0 |

TABLE 29

| | | Raw material | | | | |
|---|---|---|---|---|---|---|
| | Basic constituting elements | Mixing ratio of raw material | Baking pattern | Atmosphere | Crucible material | Raw material (g) |
| Example 230 | $Sr_{1.97}Si_5N_8:Eu_{0.03}$ | Sr/Si/Eu = 1.97/5/0.03 | Two steps 800-1000° C. × 3 h, 1250-1350° C. × 5 h | $NH_3$ | BN | 4.47 |
| Example 231 | $Sr_{1.4}Ca_{0.6}Si_5N_8:Eu$ | Sr/Ca/Si/Eu = 1.26/0.54/5/0.2 | Two steps 800-1000° C. × 3 h, 1250-1350° C. × 5 h | $NH_3$ | BN | 8.8 |
| Example 232 | $Sr_{1.4}Ca_{0.6}Si_5N_8:Eu$ | Sr/Ca/Si/Eu = 1.379/0.591/5/0.03 | Two steps 800-1000° C. × 3 h, 1250-1350° C. × 5 h | $NH_3$ | BN | 8.8 |

| | Emission characteristics (460 nm) | | | | Temperature characteristics (%) |
|---|---|---|---|---|---|
| | Color tone x | Color tone y | Brightness (%) | Quantum efficiency (%) | Peak wave length (%) | 200° C. |
| Example 230 | 0.612 | 0.379 | 96.5 | 110.2 | 621 | 87.7 |
| Example 231 | 0.649 | 0.341 | 58.8 | 151.9 | 657 | 92.3 |
| Example 232 | 0.655 | 0.366 | 89.9 | 119.5 | 637 | 97.9 |

Figure 39:
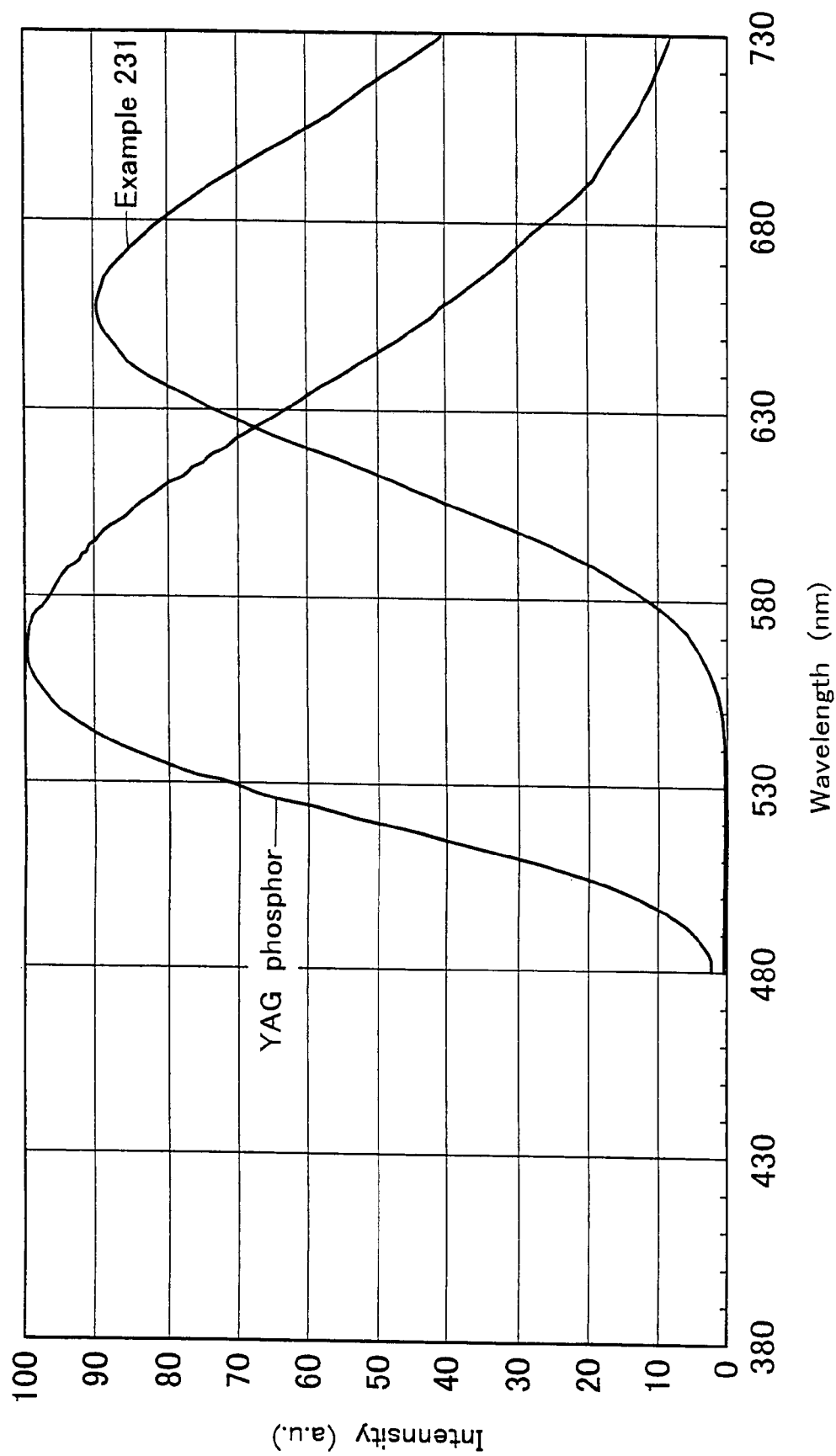
FIG. 39 is a chart showing the luminescence spectrum when the nitride phosphor of Example 231 was excited at Ex=460 nm.

The base nitride phosphor of the phosphor of Example 231 is $Sr_{1.4}Ca_{0.6}Si_5N_8$:Eu. The concentration of about 250 to 350 ppm of Mg, Sr, Ba, Zn, B, Al, Cu, Mn, Co and Fe are contained in strontium nitride, calcium nitride, silicon nitride and europium oxide which are the raw materials of the phosphor. Example 231 carried out firing under the similar condition as Example 230. FIG. 39 is a drawing showing a luminescence spectrum when Example 231 was excited at Ex=460 nm. As cleared from FIG. 39, when light of a luminescence spectrum of Ex=460 nm was irradiated, the combination of Sr and Ca shifted it to a longer wave length side than a case of using Sr of II valency alone. The peak of the luminescence spectrum is 657 nm. Thus, the phosphor emitting light of a reddish white color can be obtained by the combination of a blue light emitting element and the phosphor of Example 231. Further, the quantum efficiency of the phosphor, $Sr_{1.4}Ca_{0.6}Si_5N_8$:Eu of Example 231 is 151.9%, which is extremely good.

Example 232 changed the compounding proportion of Eu. Example 232 shows the good luminescence property in like manner as other Examples. Further, the luminescence wave TABLE 30-continued

| Basic constituting elements | | Compound | Addition amount (wt %) | 1/10 Afterglow (msec) |
|---|---|---|---|---|
| Example 237 | $Ca_{1.94}Si_5N_8:Eu_{0.06}$ | $H_3BO_3$ | 0.25 | 10.5 |
| Example 238 | $Ca_{1.94}Si_5N_8:Eu_{0.06}$ | $H_3BO_3$ | 0.75 | 9.5 |
| Example 239 | $Ca_{1.94}Si_5N_8:Eu_{0.06}$ | $H_3BO_3$ | 1.50 | 13.0 |
| Example 240 | $Ca_{1.94}Si_5N_8:Eu_{0.06}$ | $H_3BO_3$ | 3.00 | 16.5 |
| Example 241 | $Ca_{1.94}Si_5N_8:Eu_{0.06}$ | $Mg_3N_2$ | 0.05 | 7.0 |
| Example 242 | $Ca_{1.94}Si_5N_8:Eu_{0.06}$ | $Mg_3N_2$ | 0.10 | 11.0 |
| Example 243 | $Ca_{1.94}Si_5N_8:Eu_{0.06}$ | $Mg_3N_2$ | 0.20 | 14.5 |

The measurement of Examples 233 to 243 irradiates ultraviolet of 254 nm, and the luminescence intensity just after termination of irradiation is referred to as 1. The time from just after termination of irradiation until the luminescence intensity becomes 1/10 is measured. Table 30 is the time required for until the luminescence intensity becomes 1/10. Examples 233 to 243 are the same composition except the phosphor of Example 224 and additives. Namely, the base nitride phosphor of the phosphor is $Ca_{1.97}Eu_{0.03}Si_5N_8$, the component constituting elements are Mg, Sr, Ba, Zn, B, Al, Cu, Mn, Co and Fe, and the component constituting elements are contained by the concentration of 250 to 400 ppm. BN, $H_3BO_3$ and $Mg_3N_2$ are contained by the concentration of several % by weight in the raw material of Example 224. The raw material containing B and Mg was charged in BN and firing was carried out. Fixed compounding amounts of BN are used for Examples 233 to 236, those of $H_3BO_3$ are used for Examples 237 to 240 and those of $Mg_3N_2$ are used for Examples 241 to 243. A phosphor which does not contain additives was used for a standard value as a comparison object. As a result, the afterglow of Example 233 was shortest among Examples 233 to 236. The afterglow of Example 237 was shortest among Examples 237 to 240. The afterglow of Example 241 was shortest among Examples 241 to 243. Thus, the afterglow property can be suppressed by adding fixed amounts of B, Mg and the like.

Other Examples

Examples of various nitride phosphors are shown. The nitride phosphor related to the present invention is the nitride phosphor which contains at least one or more selected from a group consisting of Mg, Sr, Ba, Zn, B, Al, Cu, Mn, Co, Ni, Mo, O and Fe in the base nitride phosphor of $L_XM_Y N_{(2/3)X+(4/3)Y}$:Z. L being the base nitride phosphor of said nitride phosphor contains at least one or more selected from a group consisting of II valency of Be, Mg, Ca, Sr, Ba, Zn, Cd and Hg; M contains at least one or more selected from a group consisting of IV valency of C, Si, Ge and Sn; and Z is an activator. The activator is preferably Eu, but Cr, Mn, Pb, Sb, Ce, Tb, Sm, Pr, Tm, Ho, Er and the like can be also used.

The base nitride phosphor of the nitride phosphor can produce, $Sr_2Si_5N_8$:Eu,Pr, $Ba_2Si_5N_8$:Eu,Pr, $Mg_2Si_5N_8$:Eu,Pr, $Zn_2Si_5N_8$:Eu,Pr, $SrSi_7N_{10}$:Eu,Pr, $BaSi_7N_{10}$:Eu,Ce, $MgSi_7N_{10}$:Eu,Ce, $ZnSi_7N_{10}$:Eu,Ce, $Sr_2Ge_5N_8$:Eu,Ce, $Ba_2Ge_5N_8$:Eu,Pr, $Mg_2Ge_5N_8$:Eu,Pr, $Zn_2Ge_5N_8$:Eu,Pr, $SrGe_7N_{10}$:Eu,Ce, $BaGe_7N_{10}$:Eu,Pr, $MgGe_7N_{10}$:Eu,Pr, $ZnGe_7N_{10}$:Eu,Ce, $Sr_{1.8}Ca_{0.2}Si_5N_8$:Eu,Pr, $Ba_{1.8}Ca_{0.2}Si_5N_8$:Eu,Ce, $Mg_{1.8}Ca_{0.2}Si_5N_8$:Eu,Pr, $Zn_{1.8}Ca_{0.2}Si_5N_8$:Eu,Ce, $Sr_{0.8}Ca_{0.2}Si_7N_{10}$:Eu,La, $Ba_{0.8}Ca_{0.2}Si_7N_{10}$:Eu,La, $Mg_{0.8}Ca_{0.2}Si_7N_{10}$:Eu,Nd, $Zn_{0.8}Ca_{0.2}Si_7N_{10}$:Eu,Nd, $Sr_{0.8}Ca_{0.2}Ge_7N_{10}$:Eu,Tb, $Ba_{0.8}Ca_{0.2}Ge_7N_{10}$:Eu,Tb, $Mg_{0.8}Ca_{0.2}Ge_7N_{10}$:Eu,Pr, $Zn_{0.8}Ca_{0.2}Ge_7N_{10}$:Eu,Pr, $Sr_{0.8}Ca_{0.2}Si_6GeN_{10}$:Eu,Pr, $Ba_{0.8}Ca_{0.2}Si_6GeN_{10}$:Eu,Pr, $Mg_{0.8}Ca_{0.2}Si_6GeN_{10}$:Eu,Y, $Zn_{0.8}Ca_{0.2}Si_6GeN_{10}$:Eu,Y, $Sr_2Si_5N_8$:Pr, $Ba_2Si_5N_8$:Pr, $Sr_2Si_5N_8$:Tb, $BaGe_7N_{10}$:Ce and the like. However, the present invention is not limited to the nitride phosphors.

Example 244

The light emitting device of Example 244 is the type 2 light emitting device.

As a light emitting layer, the semiconductor light emitting element 101 which has an InGaN semiconductor layer of 460 nm having a luminescent peak at a blue region is used. A p-type semiconductor layer and an n-type semiconductor layer are formed in said semiconductor light emitting element 101 (not illustrated). The electroconductive wire 104 which is linked the lead electrode 102 is formed at said p-type semiconductor layer and an n-type semiconductor layer. The insulating sealing material 103 is formed so as to cover the outer peripheral of the lead electrode 102, and short-circuit is prevented. The transparent window part 107 which is extended from the lid 106 on the upper part of the package 105 is provided on the upper part of the semiconductor light emitting element 101. The homogeneous mixture of the nitride phosphor 108 and the coating member 109 related to the present invention is coated all over the inner surface of said transparent window part 107. The light emitting device 1 uses the nitride phosphor of Example 223. The package 105 is a square having a side of 8 mm to 12 mm whose corner portions are removed.

An indirect luminescence spectrum which was reflected from a reflection plate and a luminescence spectrum which was directly emitted from the semiconductor light emitting element 101 are irradiated on the nitride phosphor 108 of the present invention, and light having a blue luminescence spectrum which was emitted from the light emitting element 101 emits light of a white color. A desired luminescence spectrum can be obtained by doping phosphors emitting green light such as $SrAl_2O_4$:Eu, $Y_2SiO_5$:Ce,Th, $MgAl_{11}O_{19}$:Ce,Tb, $Sr_7Al_{12}O_{25}$:Eu (at least one or more among Mg, Ca, Sr and Ba)$Ga_2S_4$:Eu; phosphors emitting blue light such as $Sr_5(PO_4)_3Cl$:Eu, $(SrCaBa)_5(PO_4)_3Cl$:Eu, $(BaCa)_5(PO_4)_3Cl$:Eu, (at least one or more among Mg, Ca, Sr and Ba)$_2B_5O_9Cl$:Eu, Mn, (at least one or more among Mg, Ca, Sr and Ba)$(PO_4)_6Cl_2$:Eu,Mn; phosphors emitting red light such as $Y_2O_2S$:Eu, $La_2O_2S$:Eu, $Y_2O_3$:Eu, $Ga_2O_2S$:Eu, in the nitride phosphor 108 of the present invention.

When a white LED lamp is produced using the light emitting device which was constituted as above, the yield of 99% is obtained. Thus, the light emitting device can be produced in good mass productivity by using the light emitting diode being the present invention, and the light emitting device having high reliability and the little unevenness of color tone can be provided.

Example 245

Figure 41:
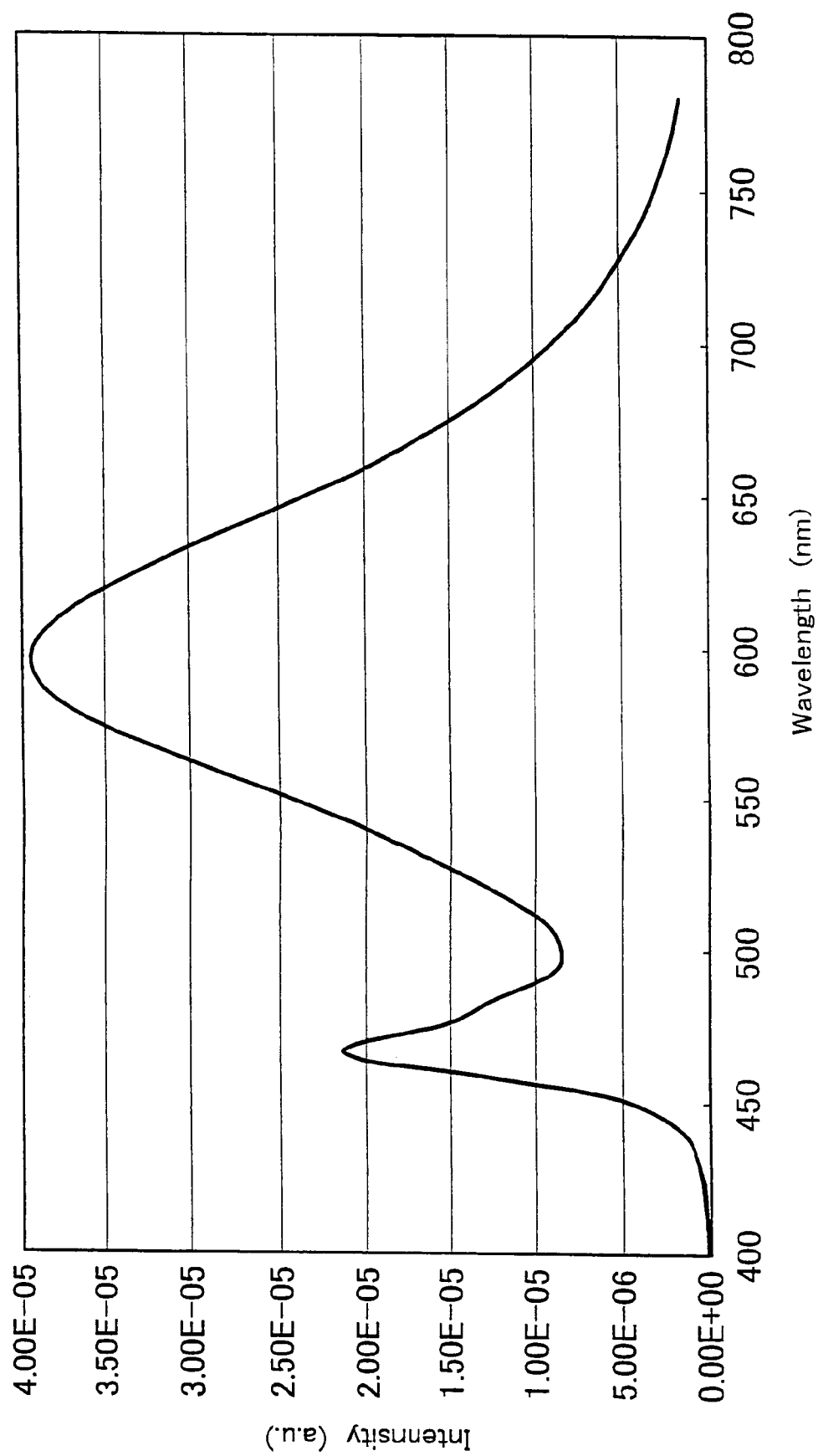
FIG. 41 is a chart showing the luminescence spectrum of the light emitting device of Example 245 related to the present invention.

The light emitting device of Example 245 is the type 1 light emitting device. FIG. 41 is a drawing showing the luminescence spectrum of the light emitting device of the present Example 245. FIG. 42 is a drawing showing the chromaticity coordinate of the light emitting device of the present Example 245.

In the light emitting device, the semiconductor layer 2 of n- and p-GaN layers is formed on the sapphire substrate 1, the electrodes 3 are provided at said semiconductor layer 2 of the n- and p-GaN layers, and said electrodes 3 are electroconductively connected with the lead frame 13 by the electroconductive wires 14. The upper part of the semiconductor light emitting element 10 is covered with the phosphors 11 and the coating member 12, and the outer peripheral of the lead frames 13, the phosphors 11 and the coating member 12 are covered with the mold member 15. In the semiconductor layer 2, there are laminated in order on a sapphire substrate 1, n$^+$GaN:Si, n-AlGaN:Si, n-GaN, GaInN, QWs, p-GaN:Mg, p-AlGaN:Mg and p-GaN:Mg. The portion of said n$^+$GaN:Si is etched to form n-type electrode. On said p-GaN:Mg, p-type electrode is formed. The lead frames 13 uses copper with iron. On the upper part of the mount lead 13a, a cup for mounting the semiconductor light emitting element 10 is provided, and said semiconductor light emitting element 10 is die-bonded on the bottom face of the central part of said cup. Gold is used for the electroconductive wires 14, and Ni is plated on the bump 4 which electroconductively connects the electrodes 3 with the electroconductive wires 14. The nitride phosphor of Example 224 and YAG phosphor are mixed for the phosphor 11. A mixture obtained by mixing an epoxy resin and a dispersant, barium titanate, titanium oxide and the above-mentioned phosphor 11 at a fixed proportion is used. The mold member 15 uses the epoxy resin. The light emitting device 2 is a bullet type in which the radius of the mold member 15 is 2 to 4 mm, height is about 7 to 10 mm, and the upper part is hemispherical.

When electric current is run in the light emitting device 2, the blue light emitting element 10 emits light having the first luminescence spectrum with a peak wave length of about 460 nm, the phosphor 11 which covers the semiconductor layer 2 carries out the wave conversion of the first luminescence spectrum, and emits light having the second luminescence spectrum which is different from light having the first luminescence spectrum. Further, the YAG-base phosphor contained in the phosphor 11 emits light having the third luminescence spectrum by light having the first luminescence spectrum. There can be provided the light emitting device which emits light of a reddish white color by mixing color mixing of the first, second and third luminescence spectra.

In FIG. 42, the measurement result of the light emitting device using the YAG-base phosphor is shown together, as the comparative object of the light emitting device 2 of the present Example 245.

The nitride phosphor of the light emitting device of the present Example 245 uses the phosphor 11 mixing the nitride phosphor of Example 224, the coating member 12 and the YAG (yttrium-aluminum-garnet) fluorescent substance activated by cerium. The weight ratio of the phosphor 11 and the like is the coating member:YAG:the nitride phosphor of Example 224=25:6:3. On the other hand, the phosphor of the light emitting device using the combination of a blue light emitting element and the phosphor of YAG is mixed at the weight ratio of the coating member the phosphor of YAG=25: 6.

The light emitting device of the present Example 245 is compared with the light emitting device using the blue light emitting element and the phosphor of YAG. The peak wave length of the phosphor of YAG is 463.47 nm, and on the contrary, the peak wave length of the nitride phosphor has the luminescence spectrum at a position different from 596.00 nm. In the chromaticity coordinate, too, the light emitting device using only the phosphor of YAG is a white color which is represented by the color tone x=0.348 and the color tone y=0.367 and emits pale light. On the other hand, the light emitting device 2 using the nitride phosphor and the phosphor of YAG is a reddish white color which is represented by the color tone x=0.454 and the color tone y=0.416. The color temperature is 2827.96K, the color rendering property Ra is 76, and it has the luminescence properties which is near to an electric bulb color. The light emitting device 2 related to the present invention has the high luminescence efficiency of 24.87 lm/W.

From this, it has an extremely important technical meaning that a near electric bulb color light emitting device can be produced.

Examples 246 to 256 related to Mode 6 of Operation

Examples 246 to 254

Comparative Test

Figure 44:
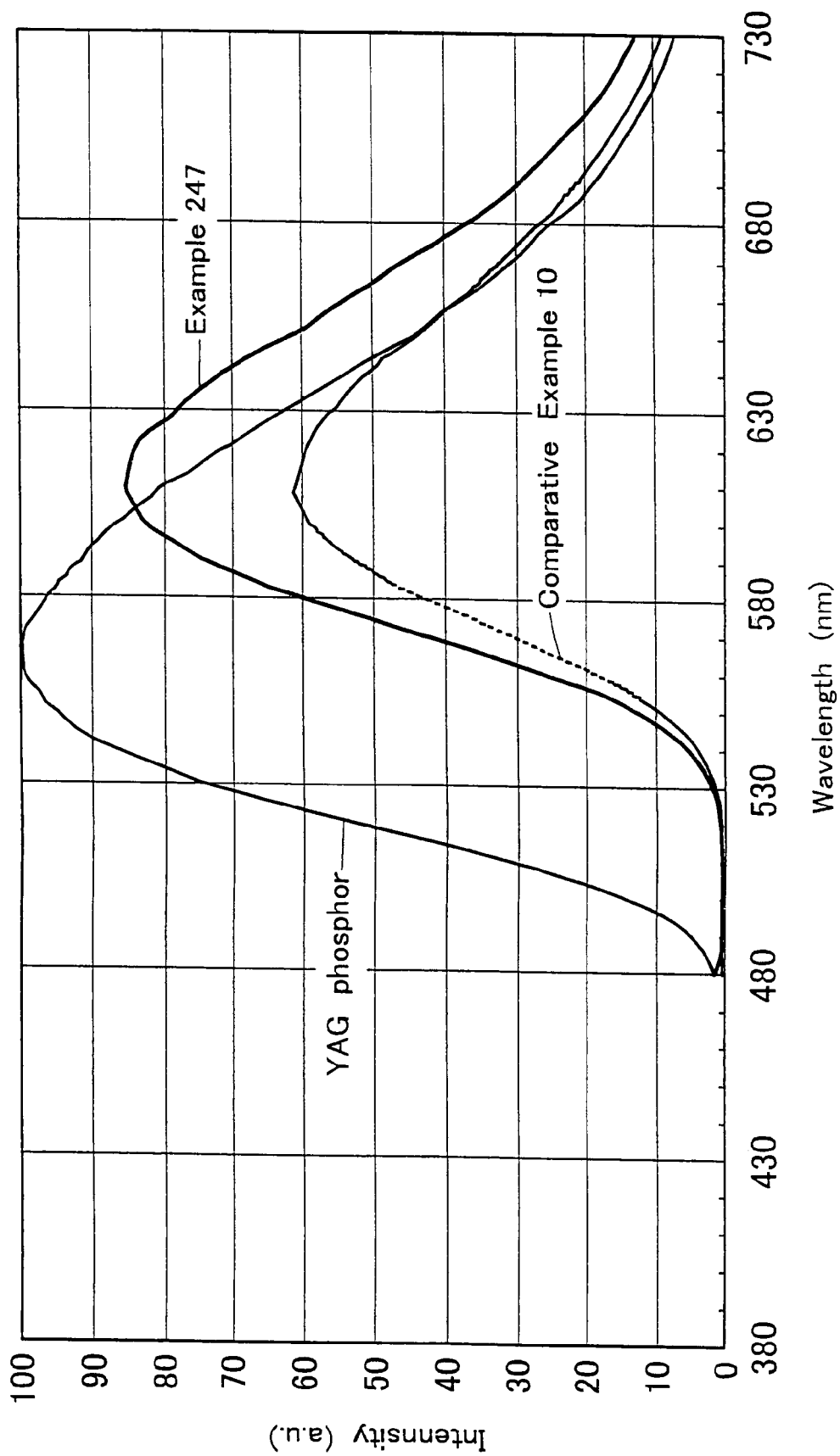
FIG. 44 is a chart showing the luminescence spectra when Example 247 and Comparative Example 10 were excited at Ex=460 nm.

In order to clear the action effect of the present invention, firing was carried out under the same condition except the difference of atmosphere. The result is shown in Table 32. FIG. 44 is a drawing showing the luminescence spectra when Example 227 and Comparative Example 10 were excited at Ex=460 nm.

TABLE 32

| | | Raw material | | | | | | | | | Result | |
|---|---|---|---|---|---|---|---|---|---|---|---|---|
| | | Mixing ratio | | | | | | | | | | |
| | Basic constituting elements | of raw material (Ca/Si/Eu) | $Ca_3N_2$ | $Si_3N_4$ | $Eu_2O_3$ | Baking pattern | Atmosphere | Gas mass flow | Charge amount | Yield | Body color | Visual emission (365 nm) |
| Comparative Example 10 | $Ca_2Si_5N_8$:Eu | 1.97/5/0.03 | 2.89 | 6.95 | 0.16 | Two steps 800° C. × 3 h, 1350° C. × 5 h | $H_2/N_2$ | 0.1/3 | 10.00 | 9.05 | Orange | Orange |
| Example 246 | $Ca_2Si_5N_8$:Eu | 1.97/5/0.03 | 14.47 | 34.75 | 0.79 | Two steps 800° C. × 3 h, 1350° C. × 5 h | $NH_3$ | 1 | 50.01 | 49.10 | Orange | Orange |
| Example 246 | $Ca_2Si_5N_8$:Eu | 1.97/5/0.03 | 14.47 | 34.75 | 0.79 | One step 1350° C. × 5 h | $NH_3$ | 1 | 50.01 | 49.10 | Orange | Orange |

| | Emission characteristics (460 nm) | | | | | Temperature characteristics | | |
|---|---|---|---|---|---|---|---|---|
| | Color tone x | Color tone y | Brightness (%) | Energy efficiency (%) | Quantum efficiency (%) | 100° C. | 200° C. | 300° C. |
| Comparative Example 10 | 0.598 | 0.401 | 59.9 | 57.1 | 57.3 | 93.3 | 62.8 | 18.2 |
| Example 246 | 0.597 | 0.400 | 77.9 | 74.7 | 78.0 | 97.7 | 70.6 | 22.6 |
| Example 247 | 0.598 | 0.400 | 82.0 | 78.8 | 79.1 | 93.7 | 67.1 | 23.5 |

Example 246 and Comparative Example 10 are adjusted so that the compounding proportion of calcium nitride, $Ca_3N_2$, silicon nitride, $Si_3N_4$, and europium oxide, $Eu_2O_3$ which are the raw materials is Ca:Si:Eu 1.97:5:0.03. The three compounds of the raw materials are charged in a BN crucible, the temperature was gradually raised from room temperature, firing was carried out for 3 hours at about 800° C., the temperature was gradually further raised, firing was carried out for 5 hours at about 1350° C., and cooling was further gradually carried out until room temperature over 5 hours. With respect to Comparative Example 10, firing was carried out in hydrogen/nitrogen atmosphere. When the ammonia flow rate of Example 246 is referred to as 1, the flow rate of hydrogen/nitrogen of Comparative Example 10 is hydrogen:nitrogen=0.1:3. On the other hand, Example 246 carried out firing in ammonia atmosphere.

As cleared from Table 32 and FIG. 44, the luminescence brightness of Comparative Example 10 is 100% and on the other hand, the luminescence brightness of Example 246 was 130.0%, therefore the luminescence brightness was improved by 30%. The difference of the luminescence brightness has an extremely important meaning from the viewpoint of the luminescence efficiency. The energy efficiency of Comparative Example 10 was 100%, and on the contrary, the energy efficiency of Example 246 was 130.8%. It was improved by 30.8%. Further, the quantum efficiency of Comparative Example 10 was 100%, and on the contrary, the quantum efficiency of Example 246 was 136.1%. It was improved by 36.1%. Thus, the extremely remarkable luminescence properties can be obtained by changing atmosphere. The improvement of the luminescence properties can provide a light emitting material which emits light of a more brilliant white color. Further, the improvement of the luminescence property can improve also the reduction of electric power because it enhances energy efficiency.

Further, Example 247 carried out firing under the same condition except the difference of a firing pattern in comparison with Example 246. The firing pattern of Example 247 carried out the raise of temperature gradually from room temperature, firing was carried out for 5 hours at about 1350° C., and cooling was further gradually carried out until room temperature over 5 hours. At this time, the luminescence brightness was 136.9%, and it was improved by 36.9% in comparison with Comparative Example 10. Further, the energy efficiency was 138%, and it was improved by 38% in comparison with Comparative Example 10. Further, the quantum efficiency was 138%, and it was improved by 38% in comparison with Comparative Example 10. Further, when the temperature characteristic is observed by the relative brightness fluctuation of a measured lot by setting room temperature as 100, Comparative Example 10 is 62.8 at a temperature of 200° C., and on the contrary, Example 247 is 67.1 at the same temperature, which showed a high value. Further, Comparative Example 10 is 18.2 at a temperature of 300° C., and on the contrary, Example 247 was 23.5 at the same temperature, which showed a high value. The temperature characteristic represents that when said nitride phosphor was provided on surface of a light emitting element, it shows the high luminescence property without changing the composition of the nitride phosphor, and it shows that the higher the temperature characteristic is, the more stable it is. From the result of FIG. 32, it is clear that the nitride phosphor related to the present invention has the better temperature characteristic than Comparative Example 10, and it is clear that reliability is high. Examples 246 and 247 showed the extremely remarkable luminescence property in comparison with Comparative Example 10. The improvement of the luminescence property which has been not solved can be extremely easily carried out thereby.

Examples 247 to 249

Figure 45:
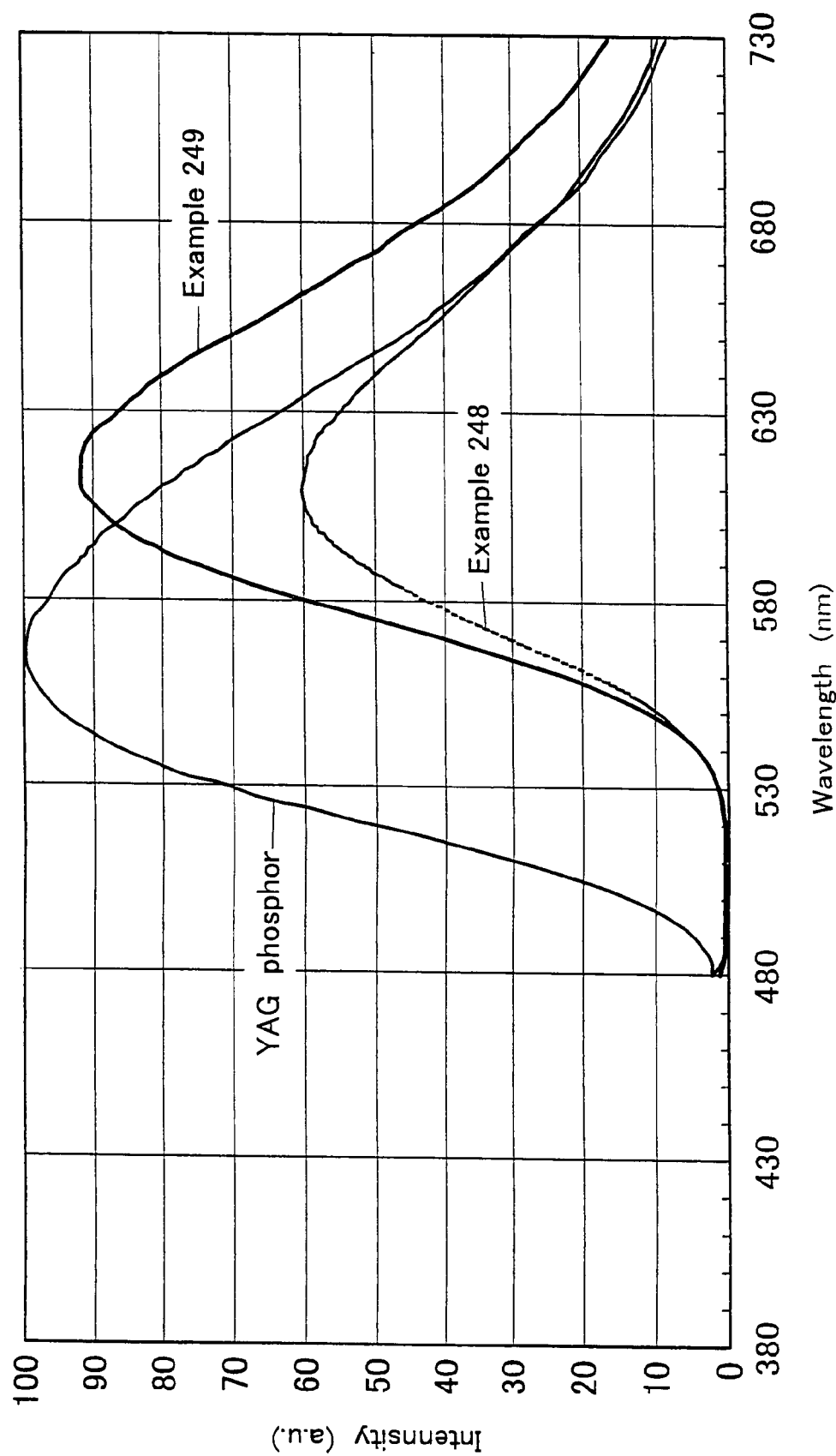
FIG. 45 is a chart showing the luminescence spectra when Examples 248, 249 were excited at Ex=460 nm.
Figure 46:
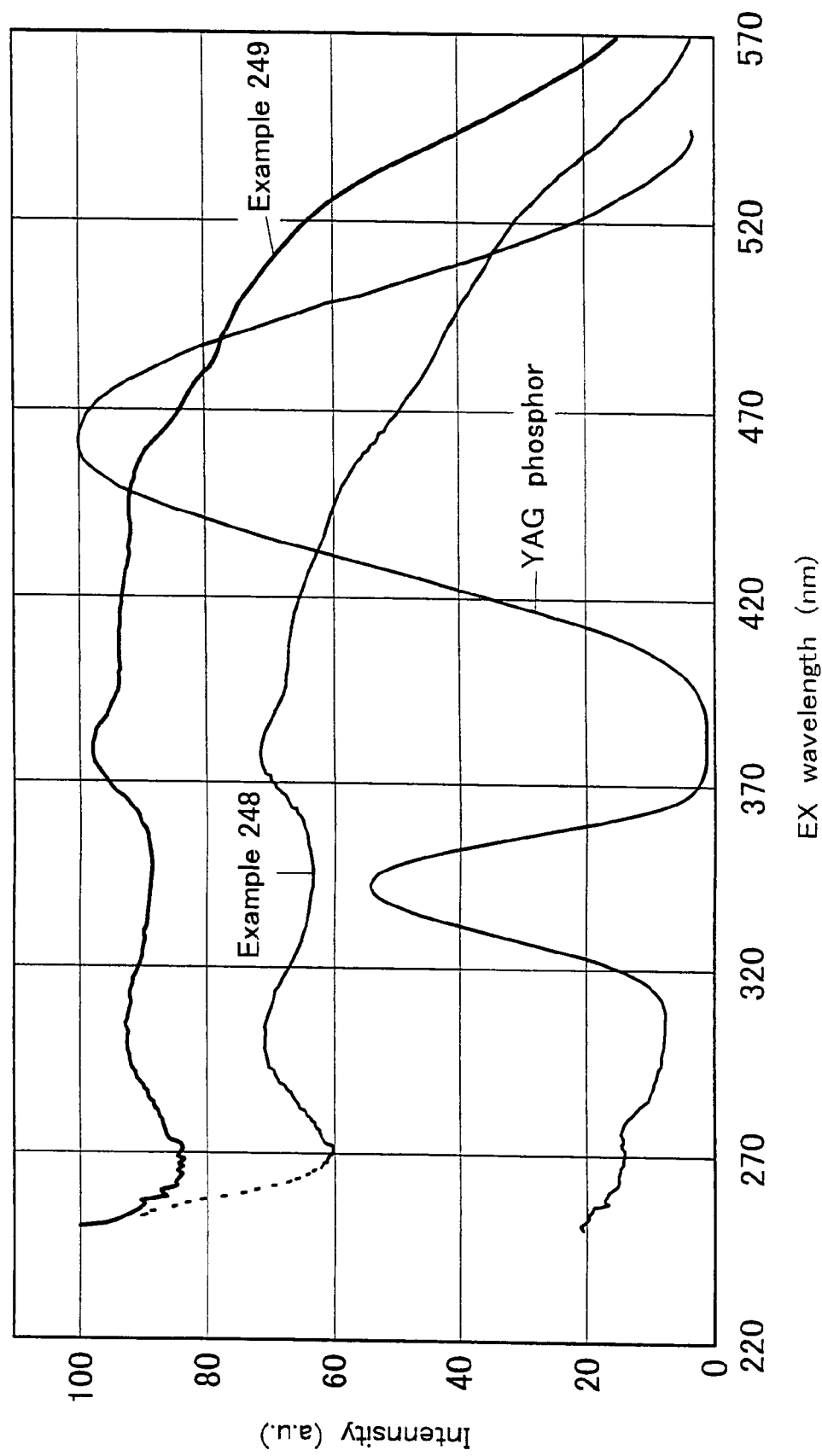
FIG. 46 is a chart showing the excitation spectra of Examples 248, 249.
Figure 47:
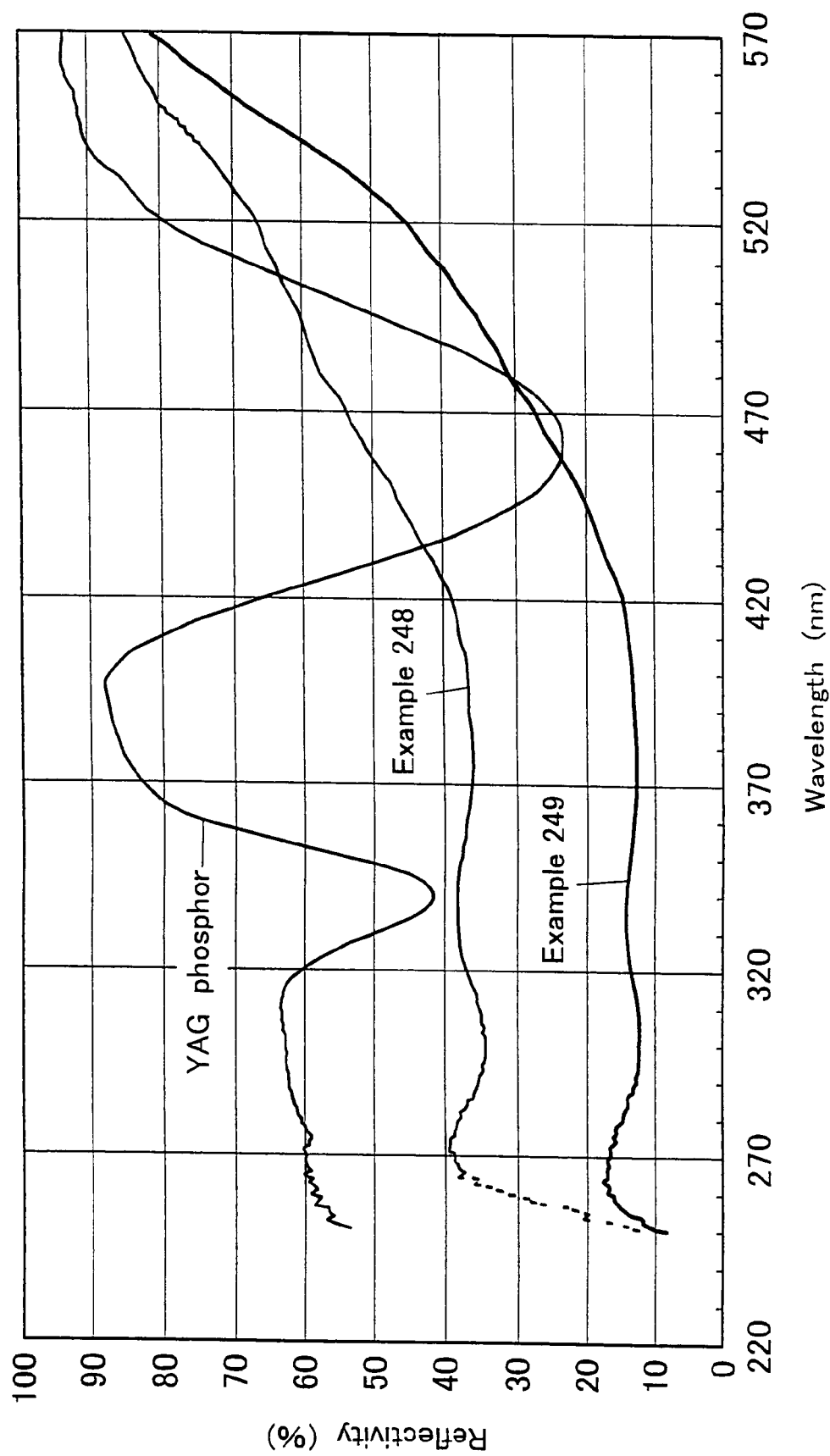
FIG. 47 is a chart showing the reflection spectra of Examples 248, 249.

Table 33 shows Examples 247 to 249 of the nitride phosphors related to the present invention. Further, FIG. 45 to FIG. 47 show the luminescence properties of Examples 247 to 249. FIG. 45 is a drawing showing the luminescence spectra when Examples 247 to 249 were excited at Ex=460 nm. FIG. 46 is a drawing showing the excitation spectra of Examples 247 to 249. FIG. 47 is a drawing showing the reflection spectra of Examples 247 to 249.

TABLE 33

| | Basic constituting elements | Mixing ratio of raw material (Ca/Si/Eu) | Baking pattern | Atmosphere | Central particle diameter (Dm/σlog) | particle diameter (US exists) (Dm/σlog) |
|---|---|---|---|---|---|---|
| Example 247 | $Ca_{1.97}Si_5N_8:Eu_{0.03}$ | 1.97/5/0.03 | One step 1350° C. × 5 h | $NH_3$ | 5.33/0.410 | 4.69/0.378 |
| Example 248 | $Ca_{1.99}Si_5N_8:Eu_{0.01}$ | 1.99/5/0.01 | One step 1350° C. × 5 h | $NH_3$ | 5.61/0.412 | 4.31/0.415 |
| Example 249 | $Ca_{1.94}Si_5N_8:Eu_{0.06}$ | 1.94/5/0.06 | One step 1350° C. × 5 h | $NH_3$ | 5.13/0.366 | 4.67/0.419 |

| | Emission characteristics (460 nm) | | | | | Temperature characteristics | | |
|---|---|---|---|---|---|---|---|---|
| | Color tone x | Color tone y | Brightness (%) | Quantum efficiency (%) | Peak wave length (nm) | 100° C. | 200° C. | 300° C. |
| Example 247 | 0.598 | 0.400 | 82.0 | 79.1 | 612 | 93.7 | 67.1 | 23.5 |
| Example 248 | 0.593 | 0.404 | 59.0 | 55.1 | 610 | 99.8 | 81.1 | 37.1 |
| Example 249 | 0.603 | 0.395 | 84.4 | 84.6 | 614 | 92.9 | 56.1 | 12.5 |

Examples 247 to 249 are results of testing the chemical properties and physical properties of the nitride phosphors related to the present invention of $L_xM_yN_{((2/3)X+(4/3)Y)}$:Z. The nitride phosphor is $(Ca_{1-t}Eu_t)_2Si_5N_8$. Examples 247 to 249 use Eu as the activator Z and change the compounding proportion t of said Eu. Example 247 contains 0.015 of Eu, Example 248 contains 0.005 of Eu, and Example 249 contains 0.03 of Eu. The firing condition is similar as Example 247, the temperature was gradually raised from room temperature, firing was carried out for 5 hours at about 1350° C., and cooling was further gradually carried out until room temperature over 5 hours.

It is clear that Example 247 has the higher temperature characteristic in comparison with Example 248. Since the temperature of a light emitting element generally used is raised to a temperature of 100 to 150° C., it is preferable that it is stable at said temperature range when the nitride phosphor is formed on the surface of the light emitting element. From the viewpoint, since Example 248 has the extremely good temperature characteristic, it has superior technical meaning.

Example 249 has the high luminescence brightness and high quantum efficiency in comparison with Example 247. Accordingly, Example 249 has the extremely good luminescence property.

Examples 250 to 252

Table 34 shows Examples 250 to 252 of the nitride phosphors related to the present invention.

production efficiency, the provision of a stable nitride phosphor and the reduction of production cost can be carried out.

Example 251 is the phosphor of $Ca_{1.96}Eu_{0.04}Si_5N_8$. The compounding proportion (mol ratio) of calcium nitride, $Ca_3N_2$, silicon nitride, $Si_3N_4$, and europium oxide, $Eu_2O_3$ which are raw materials is adjusted so as to be Ca:Si:Eu=1.96:5:0.04.

| | |
|---|---|
| $Ca_3N_2$ (manufactured by High Purity Chemical Co.) | 2.867 g |
| $Si_3N_4$ (manufactured by Ube Chemical Co.) | 6.923 g |
| $Eu_2O_3$ (manufactured by Shin-etsu Chemical Co.) | 0.208 g |

The firing of the three compounds of the raw materials was carried out by a similar test method as Example 250. As a result, the nitride phosphor powder in which a body color is orange and a luminescence color is also orange was obtained in like manner as Example 250.

Example 252 is the phosphor of $Ca_{1.985}Eu_{0.015}Si_5N_8$. The compounding proportion (mol ratio) of calcium nitride, $Ca_3N_2$, silicon nitride, $Si_3N_4$, and europium oxide, $Eu_2O_3$ which are raw materials is adjusted so as to be Ca:Si:Eu=1.98:5:0.02.

| | |
|---|---|
| $Ca_3N_2$ (manufactured by High Purity Chemical Co.) | 2.916 g |
| $Si_3N_4$ (manufactured by Ube Chemical Co.) | 6.969 g |
| $Eu_2O_3$ (manufactured by Shin-etsu Chemical Co.) | 0.105 g |

TABLE 34

| | Basic constituting elements | Mixing ratio of raw material (Ca/Si/Eu) | Baking pattern | Atmosphere | Form | Body color | Visual emission (365 nm) |
|---|---|---|---|---|---|---|---|
| Example 250 | $Ca_{1.8}Si_5N_8:Eu_{0.2}$ | 1.8/5/0.2 | One step 1350° C. × 5 h | $NH_3$ | BN boat | Orange | Orange |
| Example 251 | $Ca_{1.96}Si_5N_8:Eu_{0.04}$ | 1.96/5/0.04 | One step 1350° C. × 5 h | $NH_3$ | BN boat | Orange | Orange |
| Example 252 | $Ca_{1.98}Si_5N_8:Eu_{0.02}$ | 1.98/5/0.02 | One step 1350° C. × 5 h | $NH_3$ | BN boat | Orange | Orange |

Example 250 in Table 34 is $Ca_{1.8}Si_5N_8:Eu_{0.2}$. The compounding proportion (mol ratio) of calcium nitride, $Ca_3N_2$, silicon nitride, $Si_3N_4$, and europium oxide, $Eu_2O_3$ which are raw materials is adjusted so as to be Ca:Si:Eu=1.8:5:0.2.

| | |
|---|---|
| $Ca_3N_2$ (manufactured by High Purity Chemical Co.) | 1.243 g |
| $Si_3N_4$ (manufactured by Ube Chemical Co.) | 3.266 g |
| $Eu_2O_3$ (manufactured by Shin-etsu Chemical Co.) | 0.492 g |

The three compounds of the raw materials were charged in a BN crucible, and firing was carried out for 5 hours at 1200 to 1350° C. in a tubular furnace under ammonia atmosphere. Temperature was raised by heating from room temperature to 1350° C. over 5 hours, firing was carried out for 5 hours, and cooling was further gradually carried out until room temperature over 5 hours. Ammonia gas was continuously flown at a flow rate of 2 liter/min. As a result, the nitride phosphor powder in which a body color is orange and a luminescence color is also orange was obtained. With respect to the phosphor powder, the whole phosphor powder emits light of an orange color in visual observation. Thus, since the whole phosphor powder emits light uniformly, the improvement of The firing of the three compounds of the raw materials was carried out by a similar test method as Example 250. As a result, the nitride phosphor powder in which a body color is orange and a luminescence color is also orange was obtained in like manner as Example 250. Further, the luminescence brightness of the nitride phosphor obtained by the present Example 252 was improved than Comparative Example in visual observation. Further, the phosphor obtained by Example 252 showed the luminescence brightness which is similar as Example 251. (Measurement result of phosphor obtained from Examples 251 and 252)

Figure 48:
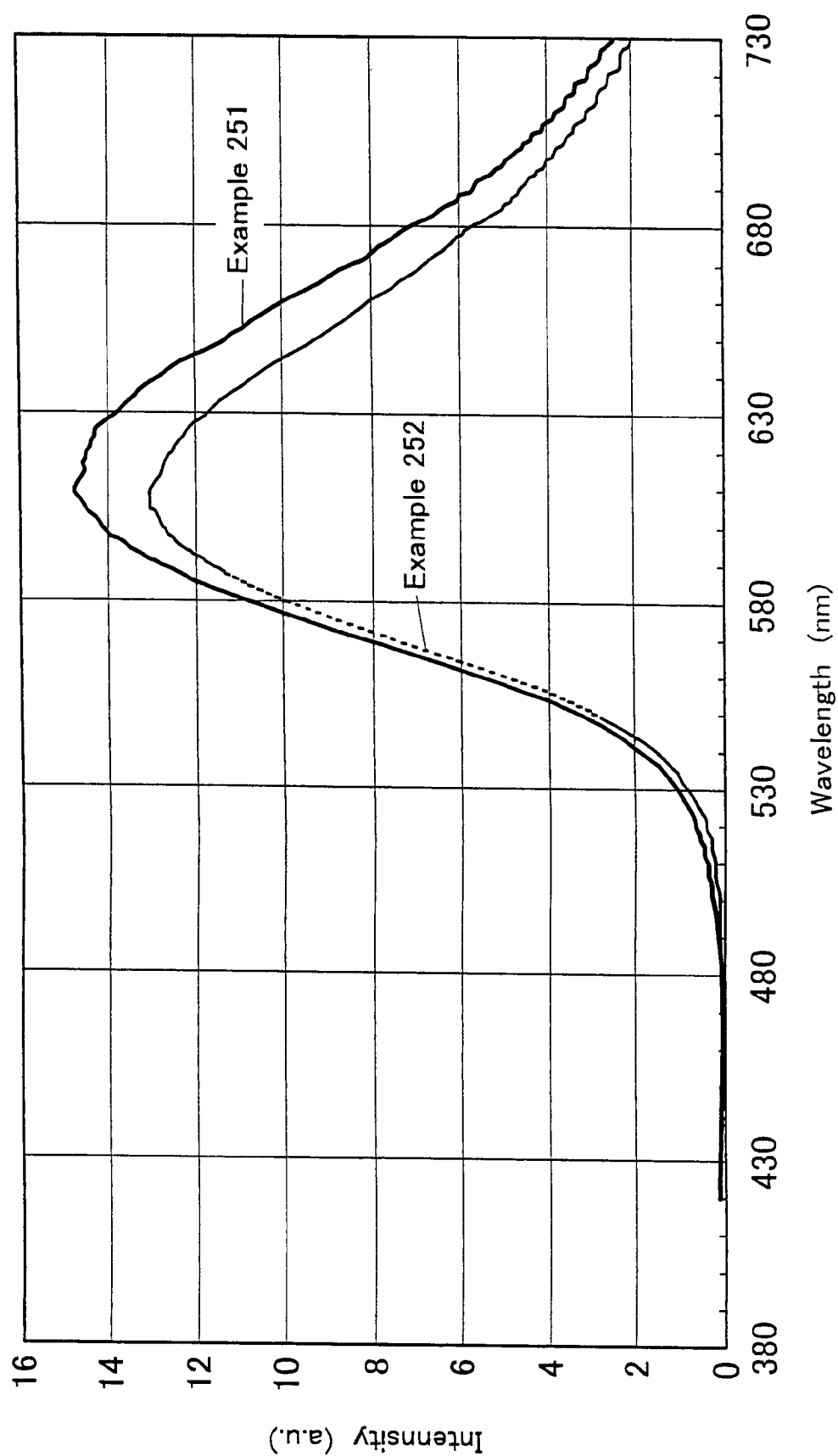
FIG. 48 is a chart showing the luminescence spectra when Examples 251 and 252 were excited at Ex=400 nm.
Figure 50:
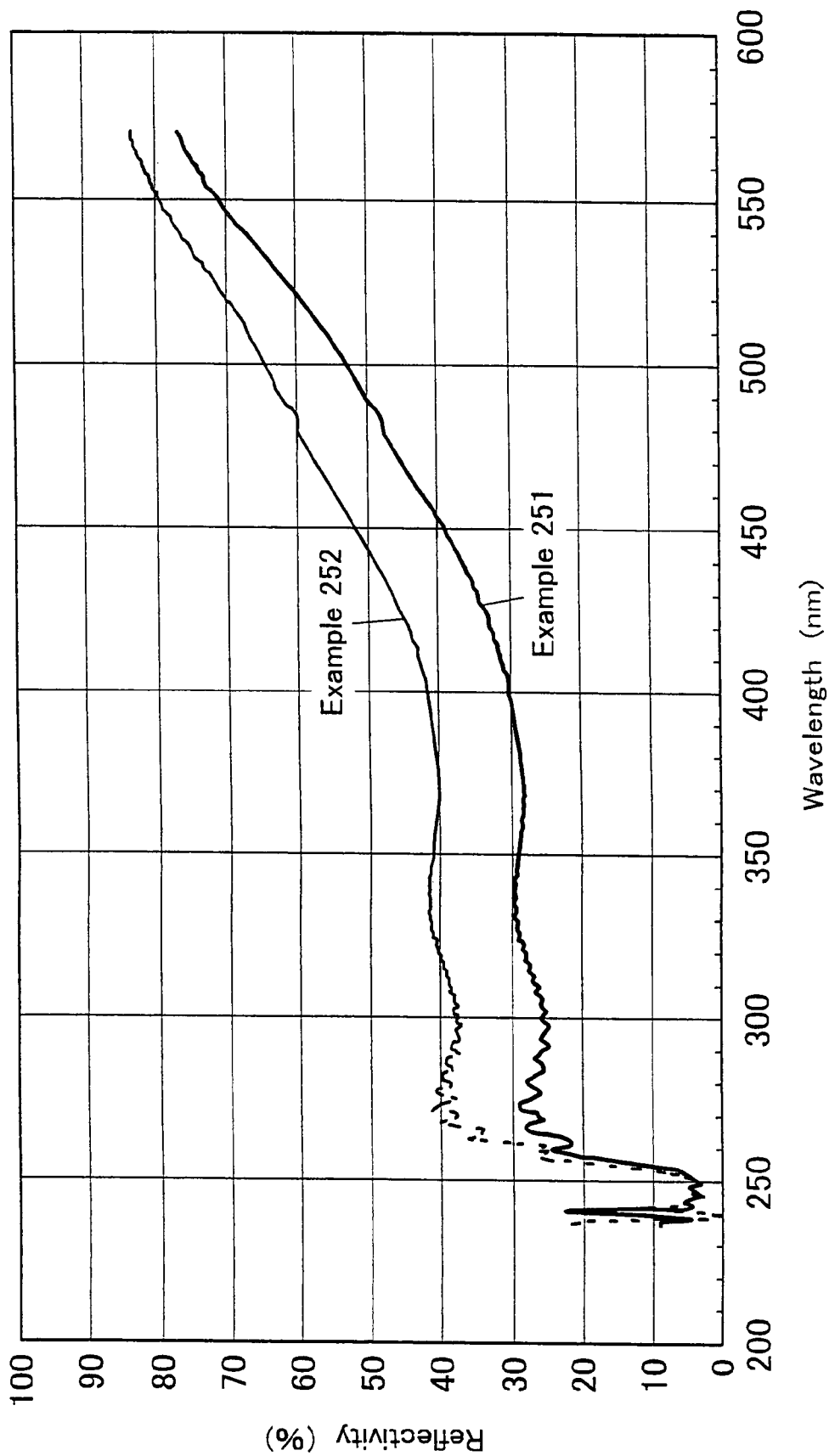
FIG. 50 is a chart showing the reflection coefficients of Examples 251 and 252.
Figure 51:
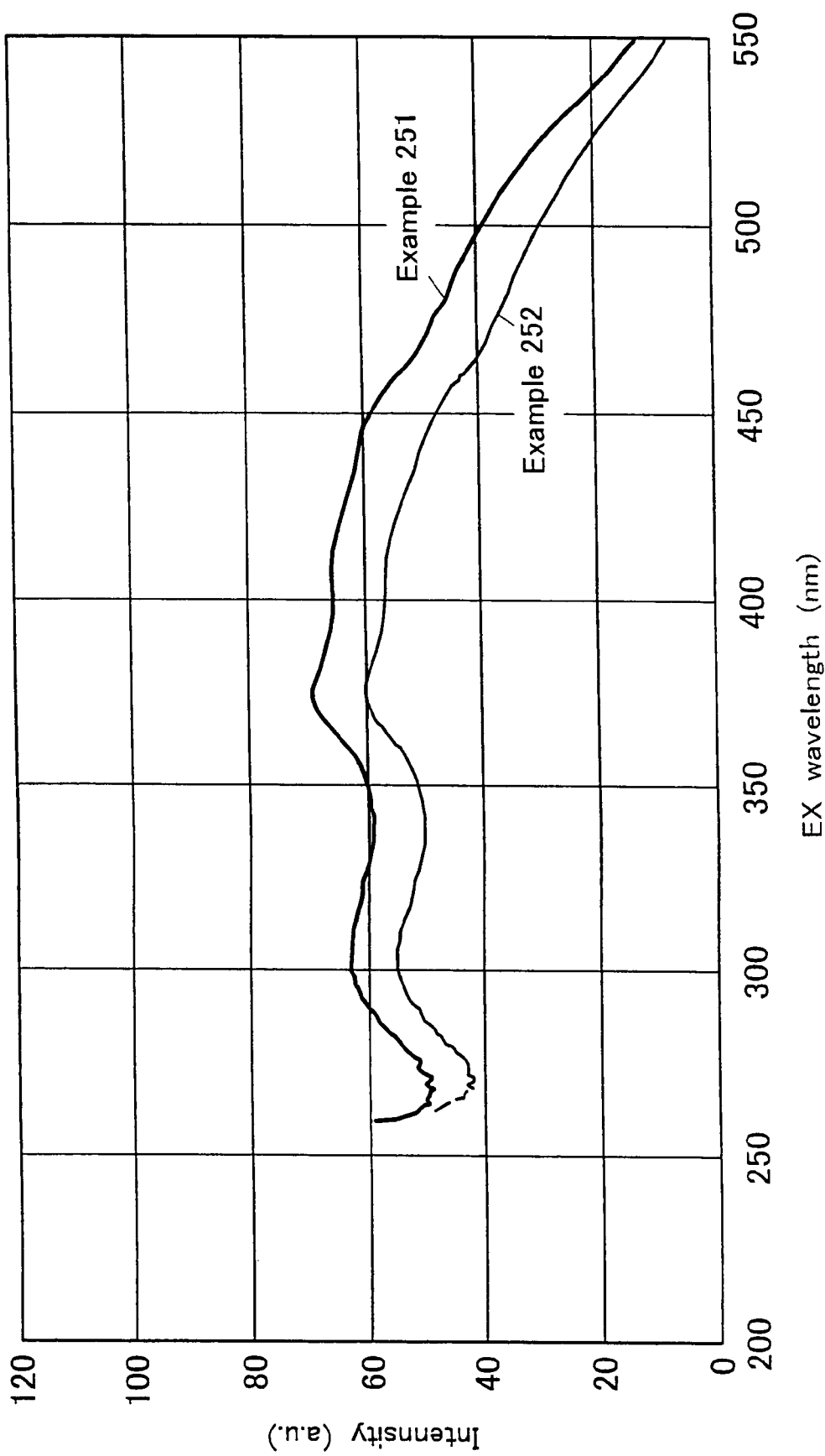
FIG. 51 is a chart showing the excitation spectra of Examples 251 and 252.

As a typical example, the measurement of the nitride phosphors of Examples 251 and 252 was carried out. The test result is shown in FIG. 48 and FIG. 51. FIG. 48 is a drawing showing the luminescence spectra when Examples 251 and 252 were excited at Ex=460 nm. FIG. 50 is a drawing showing the reflection ratio of Examples 251 and 252. FIG. 51 is a drawing showing the excitation spectra of Examples 251 and 252.

Light having a wave length of 400 nm at a visual light region was irradiated on Examples 251 and 252. In FIG. 48, the nitride phosphors of Examples 251 and 252 emit light at 610 nm to the utmost.

Figure 49:
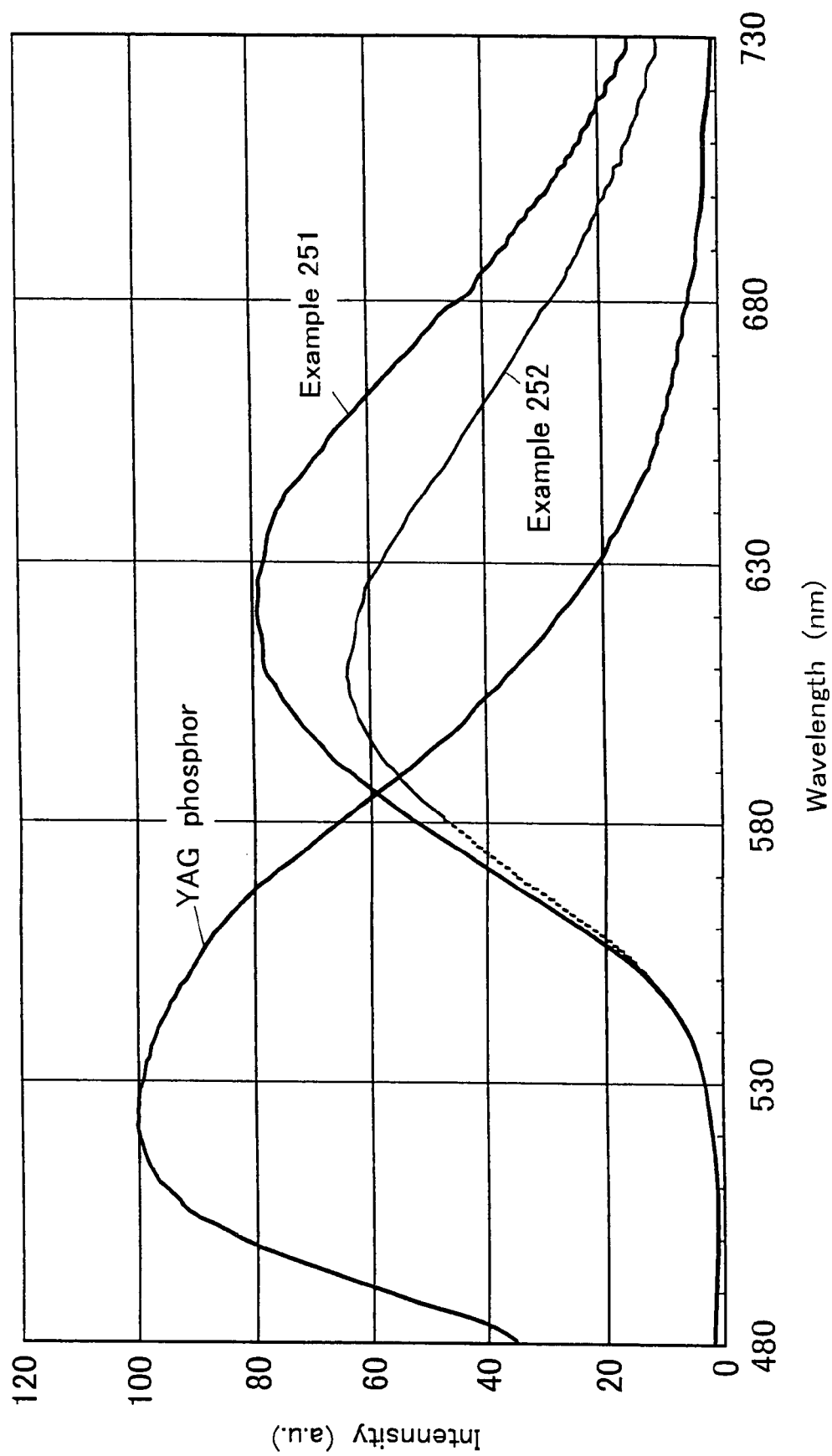
FIG. 49 is a chart showing the luminescence spectra when Examples 251 and 252 were excited at Ex=460 nm.

Light having a wave length of 460 nm at a visible light region was irradiated on Examples 251 and 252. In FIG. 49, Example 251 emits light at 620 nm to the utmost, and Example 252 emits light at 610 nm to the utmost. Thus, since Example 251 is shifted to a longer wave length than Example 252, it emits redder light. Since 460 nm is a wave length having the highest luminescence brightness among known blue light emitting diode, the reddish white nitride phosphor can be produced by combination of the blue and yellow-red luminescence spectra. With respect to the reflection coefficient, the nitride phosphor of Example 252 exhibits higher reflection property than the nitride phosphor of Example 250. Both of the nitride phosphors of Examples 251 and 252 absorb light of a short wave length side at visible light region. With respect to the excitation spectrum, the nitride phosphor of Example 251 exhibits a higher excitation spectrum than the nitride phosphor of Example 252.

Light emission at a yellow-red visible light region was confirmed from FIG. 48 to FIG. 51.

Examples 253 and 254

Example 253 is the phosphor of $Sr_{1.97}Eu_{0.03}Si_5N_8$. The compounding proportion is calcium nitride, $Ca_3N_2$: silicon nitride, $Si_3N_4$: europium oxide, $Eu_2O_3$=1.97:5:0.03. The three compounds of the raw materials were charged in a BN crucible, firing was carried out for 3 hours at 800 to 1000° C. in a tubular furnace, and cooling was further gradually carried out until room temperature over 5 hours. Ammonia gas was continuously flown at a flow rate of 1 liter/min. As a result, the nitride phosphor in which a body color is pink and emits visually pink light at irradiation of light at 365 nm was obtained. The temperature characteristic at 200° C. of the nitride phosphor of Example 253 is 87.7%, which exhibits the extremely high temperature characteristic. Table 35 shows Examples 253 and 254 of the nitride phosphors related to the present invention.

the quantum efficiency of the phosphor of $Sr_{1.4}Ca_{0.6}Si_5N_8$:Eu of Example 254 showed 151.3%, and it is excellent.

Example 255

The light emitting device of Example 255 is the type 2 light emitting device using a semiconductor light emitting element which has the InGaN semiconductor layer having a luminescent peak of 460 nm and the nitride phosphor 8 described later.

In the light emitting device of Example 255 constituted as described above, an indirect luminescence spectrum which was reflected from a reflection plate and a luminescence spectrum which was directly emitted from the semiconductor light emitting element 1 are irradiated on the nitride phosphor 8, and light having a blue luminescence spectrum which was emitted from the semiconductor light emitting element emits light of a white color. Further, a desired luminescence spectrum can be obtained by doping phosphors emitting green light such as $SrAl_2O_4$:Eu, $Y_2SiO_5$:Ce,Tb, $MgAl_{11}O_{19}$:Ce,Tb, $Sr_7Al_{12}O_{25}$:Eu (at least one or more among Mg, Ca, Sr and Ba)$Ga_2S_4$:Eu; phosphors emitting blue light such as $Sr_5(PO_4)_3$ Cl:Eu, $(SrCaBa)_5(PO_4)_3$Cl:Eu, $(BaCa)_5(PO_4)_3$Cl:Eu, (at least one or more among Mg, Ca, Sr and Ba)$_2B_5O_9$Cl:Eu,Mn, (at least one or more among Mg, Ca, Sr and Ba)(PO$_4$)$_6$Cl$_2$:Eu,Mn; phosphors emitting red light such as $Y_2O_2S$:Eu, $La_2O_2S$:Eu, $Y_2O_3$:Eu, $Ga_2O_2S$:Eu, in the nitride phosphor 8.

The light emitting device which was constituted as above can be produced at an yield of 99%. Thus, the light emitting device of the present Example can produce a light emitting

TABLE 35

| | | Raw material | | | | | Result | |
| --- | --- | --- | --- | --- | --- | --- | --- | --- |
| | Basic constituting elements | Mixing ratio of raw material | Baking pattern | Atmosphere | Form | Raw material (g) | Body color | Visual emission (365 nm) |
| Example 253 | $Sr_{1.97}Si_5N_8$:$Eu_{0.03}$ | Sr/Si/Eu = 1.97/5/0.03 | Two steps 800-1000° C. × 3 h, 1250-1350° C. × 5 h | NH$_3$ | BN crucible | 4.47 | Pink | Pink |
| Example 254 | $Sr_{1.4}Ca_{0.6}Si_5N_8$:Eu | Sr/Ca/Si/Eu = 1.26/0.54/5/0.2 | Two steps 800-1000° C. × 3 h, 1250-1350° C. × 5 h | NH$_3$ | BN crucible | 8.8 | Thick orange | Red orange |

| | Emission characteristics (460 nm) | | | | Temperature |
| --- | --- | --- | --- | --- | --- |
| | Color tone x | Color tone y | Brightness (%) | Energy efficiency (%) | Quantum efficiency (%) | characteristics 200° C. |
| Example 253 | 0.625 | 0.373 | 58.4 | 62.4 | 62.9 | 87.7 |
| Example 254 | 0.663 | 0.336 | 35.5 | 81.3 | 86.7 | 92.3 |

Figure 52:
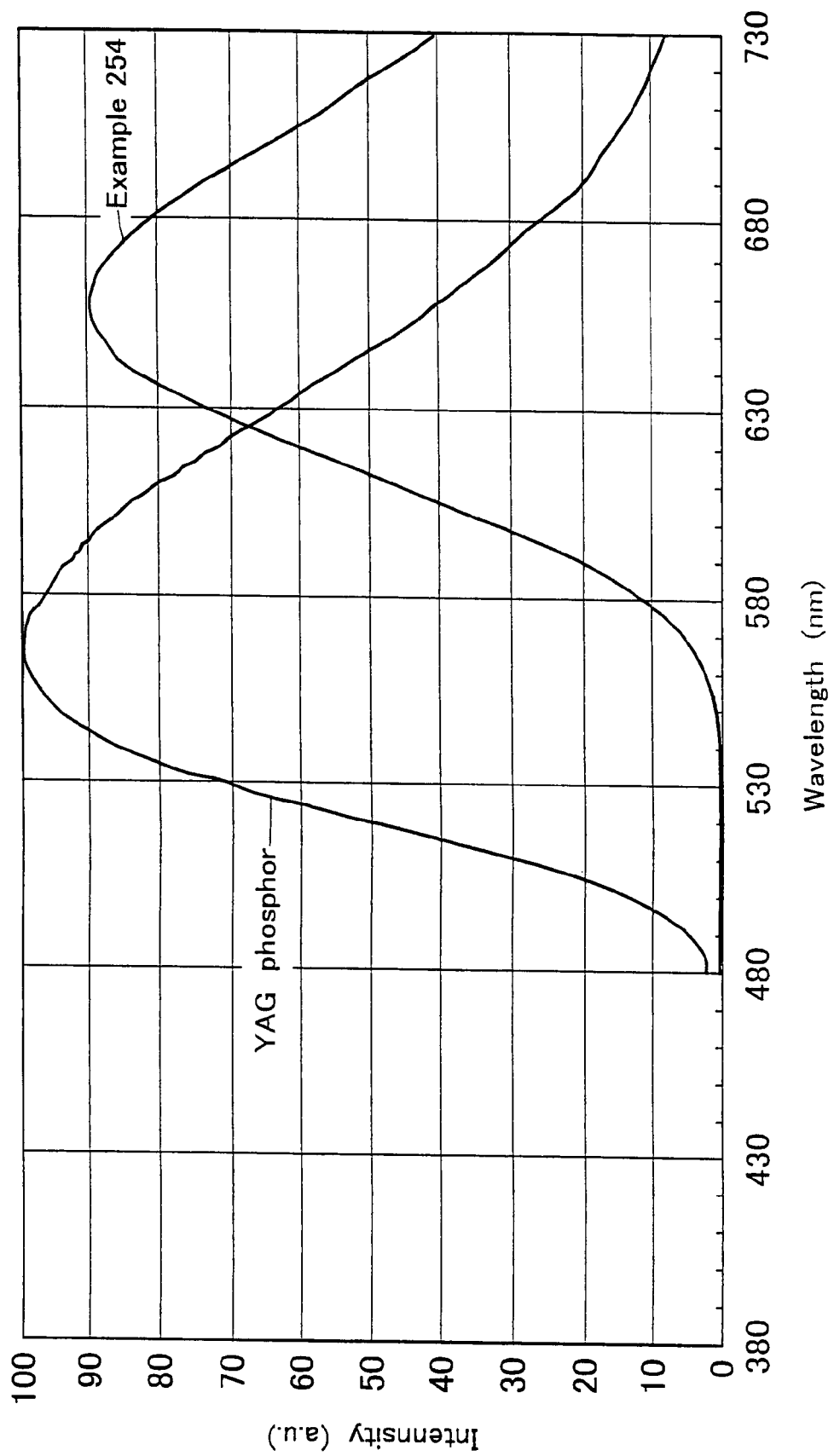
FIG. 52 is a chart showing the luminescence spectrum when Example 254 was excited at Ex=460 nm.

Example 254 is the phosphor of $Sr_{1.4}Ca_{0.6}Si_5N_8$:Eu. The firing of Example 254 was carried out in a similar condition as Example 253. FIG. 52 is a drawing showing the luminescence spectrum when Example 254 were excited at Ex=460 nm. As cleared from FIG. 52, when light of a luminescence spectrum at Ex=460 nm was irradiated, the combination Sr with Ca is shifted to a longer wave length side than a case of using Sr of II-valency alone. The peak of the luminescence spectrum is 655 nm. Thus, the phosphor emitting light of a reddish white color can be obtained by the combination of a blue light emitting element and the phosphor of Example 254. Further, device in good mass productivity, and can provide the light emitting device having high reliability and the little unevenness of color tone.

Example 256

Figure 53:
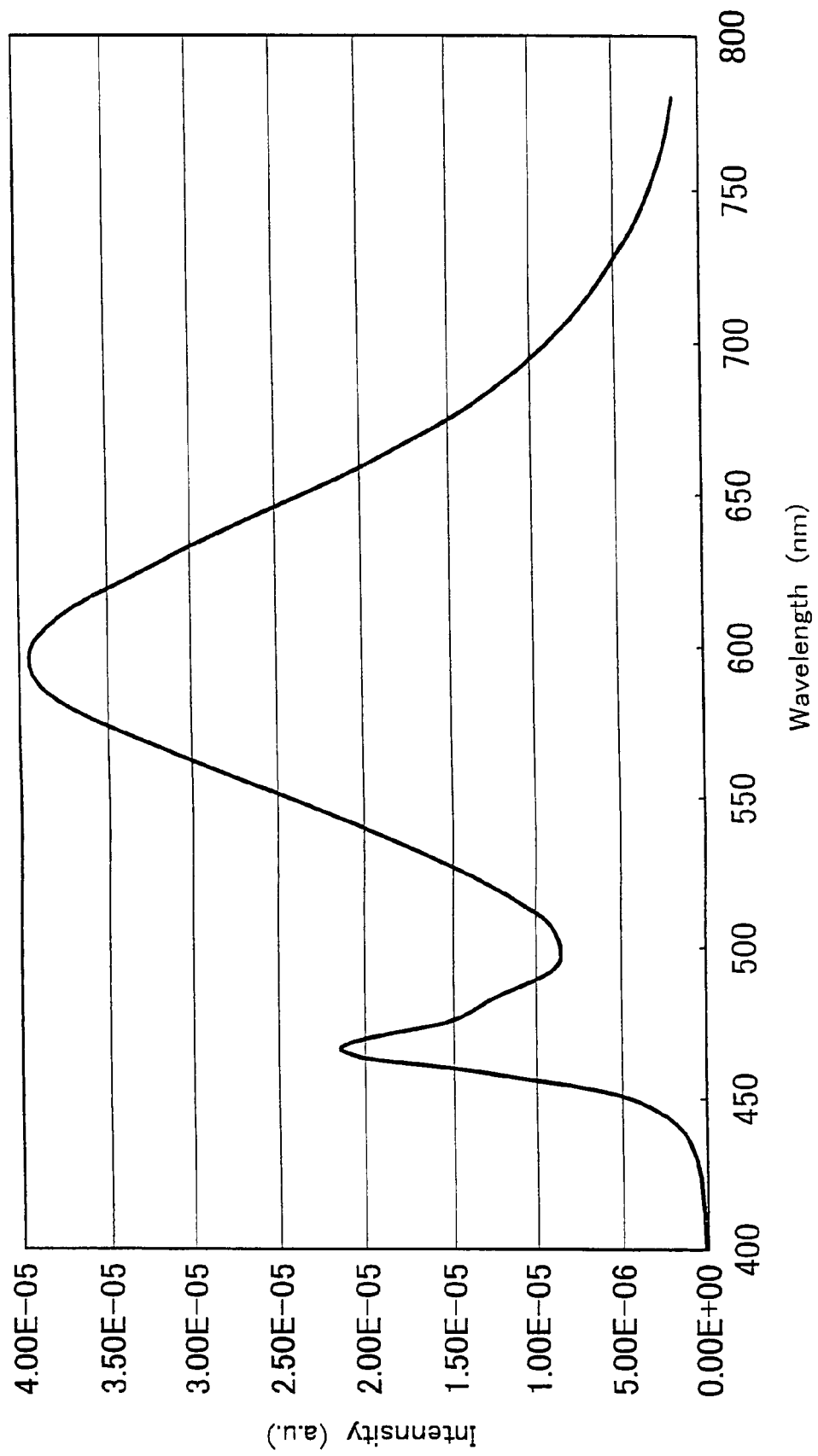
FIG. 53 is a chart showing the luminescence spectrum of the light emitting device of Example 256 related to the present invention.

The light emitting device of Example 256 is the type 1 light emitting device 2. FIG. 53 is a drawing showing the luminescence spectrum of the light emitting device of the present Example 256. FIG. 54 is a drawing showing the chromaticity coordinate of the light emitting device of the present Example 256.

The light emitting device of Example 256 uses a semiconductor light emitting element whose luminescent peak has a luminescent spectrum of 460 nm and the nitride phosphor 8a of Example 247.

In the light emitting device, when electric current is run in the light emitting device, the light emitting element (blue LED) emits light having a luminescence spectrum with a peak wave length of about 460 nm, the nitride phosphor 8a carries out the wave conversion of the light, and generates light having a luminescence spectrum which is different from the light absorbed. As the whole of the light emitting device, it emits light of a reddish white color.

In FIG. 54, the measurement result of the light emitting device using the YAG-base phosphor is shown together, as the comparative object of the light emitting device of the present Example 256.

The nitride phosphor 8a of the light emitting device of the present Example 256 uses a mixture which mixes the nitride phosphor of Example 247, a resin and the yttrium-aluminum-garnet fluorescent substance (hereinafter, referred to as YAG) activated by cerium. The weight ratio of these is the resin: YAG: the nitride phosphor of Example 247=25:6:3. On the other hand, the phosphor of the light emitting device using the combination of a blue light emitting element and the phosphor of YAG is mixed at the weight ratio of the resin: YAG=25:6. The light emitting device of the present Example 256 uses the semiconductor light emitting element 1 (hereinafter, referred to as blue LED) which has an InGaN semiconductor layer having a luminescent peak of 460 nm. The nitride phosphor 8a carries out the wave length conversion of the emitted light of the blue LED, and the light emitting device 2 which emits light of a slightly reddish white color can be obtained.

The light emitting device of the present Example 256 is compared with the light emitting device using the blue LED and the phosphor of YAG. The peak wave length of the phosphor of YAG is 463.47, and on the contrary, the peak wave length of the nitride phosphor 8a has the luminescence spectrum at a position different from 596.00 nm. In the chromaticity coordinate, too, the light emitting device of Comparative Example using only the phosphor of YAG is a white color which is represented by the color tone x=0.348 and y=0.367 and emits pale light. On the other hand, the light emitting device 2 of Example 256 using the nitride phosphor 8a is a reddish white color which is represented by the color tone x=0.454 and the color tone y=0.416. The color temperature of the light emitting device of Example 256 is 2827.96K, and it has the luminescence property which is near to an electric bulb color. Further, in the color rendering property, too, the light emitting device 2 using the nitride phosphor 8a exhibits the similar color rendering property as the light emitting device using the phosphor of YAG. Further, the light emitting device 2 related to the present invention has the high luminescence efficiency of 24.87 lm/W.

Example 255

The light emitting device of Example 255 is the type 2 light emitting device using a semiconductor light emitting element which has the InGaN semiconductor layer having a luminescent peak of 460 nm and the nitride-base phosphor 8 described later.

In the light emitting device of Example 255 constituted as described above, an indirect luminescence spectrum which was reflected from a reflection plate and a luminescence spectrum which was directly emitted from the semiconductor light emitting element 1 are irradiated on the nitride-base phosphor 8, and light having a blue luminescence spectrum which was emitted from the semiconductor light emitting element emits light of a white color. Further, a desired luminescence spectrum can be obtained by doping phosphors emitting green light such as $SrAl_2O_4$:Eu, $Y_2SiO_5$:Ce,Tb, $MgAl_{11}O_{19}$:Ce,Tb, $Sr_7Al_{12}O_{25}$:Eu (at least one or more among Mg, Ca, Sr and Ba) $Ga_2S_4$:Eu; phosphors emitting blue light such as $Sr_5(PO_4)_3Cl$:Eu, $(SrCaBa)_5(PO_4)_3Cl$:Eu, $(BaCa)_5(PO_4)_3Cl$:Eu, (at least one or more among Mg, Ca, Sr and Ba)$_2B_5O_9Cl$:Eu,Mn, (at least one or more among Mg, Ca, Sr and Ba) $(PO_4)_6Cl_2$:Eu,Mn, phosphors emitting red light such as $Y_2O_2S$:Eu, $La_2O_2S$:Eu, $Y_2O_3$:Eu, $Ga_2O_2S$:Eu, in the nitride-base phosphor 8.

The light emitting device which was constituted as above can be produced at a yield of 99%. Thus, the light emitting device of the present Example can produce a light emitting device in good mass productivity, and can provide the light emitting device having high reliability and the little unevenness of color tone.

Example 256

The light emitting device of Example 256 is a light emitting device 2 of a type 1, and FIG. 53 is a chart showing a luminescence spectrum of the light emitting device of Example 256. FIG. 54 is a chart showing chromaticity coordinate of the light emitting device of Example 256. The light emitting device of Example 256 uses a semiconductor light emitting element whose luminescent peak has a luminescent spectrum of 460 nm and the nitride-base phosphor 8a of Example 247.

In the light emitting device, when electric current is run in the light emitting device, the light emitting element (blue LED) emits light having a luminescence spectrum with a peak wave length of about 460 nm, the nitride-base phosphor 8a carries out the wave conversion of the light, and generates light having a luminescence spectrum which is different from the light absorbed. As the whole of the light emitting device, it emits light of a reddish white color.

In FIG. 54, the measurement result of the light emitting device using the YAG-base phosphor is shown together, as the comparative object of the light emitting device of the present Example 256.

The nitride-base phosphor 8a of the light emitting device of the present Example 256 uses a mixture which mixes the nitride-base phosphor of Example 247, a resin and the yttrium-aluminum-garnet fluorescent substance (hereinafter, referred to as YAG) activated by cerium. The weight ratio of these is the resin:YAG:the nitride-base phosphor of Example 247=25:6:3. On the other hand, the phosphor of the light emitting device using the combination of a blue light emitting element and the phosphor of YAG is mixed at the weight ratio of the resin:YAG=25:6. The light emitting device of the present Example 256 uses the semiconductor light emitting element 1 (hereinafter, referred to as blue LED) which has an InGaN semiconductor layer having a luminescent peak of 460 nm. The nitride-base phosphor 8a carries out the wave length conversion of the emitted light of the blue LED, and the light emitting device 2 which emits light of a slightly reddish white color can be obtained.

The light emitting device of the present Example 256 is compared with the light emitting device using the blue LED and the phosphor of YAG. The peak wave length of the phosphor of YAG is 463.47, and on the contrary, the peak wave length of the nitride-base phosphor 8a has the luminescence spectrum at 596.00 nm which is a different position. In the chromaticity coordinate, too, the light emitting device of Comparative Example using only the phosphor of YAG is a white color which is represented by the color tone x=0.348 and y=0.367 and emits pale light. On the other hand, the light emitting device 2 of Example 256 using the nitride-base phosphor 8a is a reddish white color which is represented by the color tone x=0.454 and the color tone y=0.416. The color temperature of the light emitting device of Example 256 is 2827.96K, and it has the luminescence property which is near to an electric bulb color. Further, in the color rendering property, too, the light emitting device 2 using the nitride-base phosphor 8a exhibits the similar color rendering property as the light emitting device using the phosphor of YAG. Further, the light emitting device 2 related to the present invention has the high luminescence efficiency of 24.871 m/W.

Examples which are related with the mode 7 of operation related to the present invention are specifically illustrated below, while mentioning Comparative Examples.

Example 257

As shown in FIG. 55, the light emitting diode 200 which was formed in the present Comparative Examples 11 to 13 is a lead type light emitting diode equipped with the mount lead 205 and the inner lead 206, the LED chip 202 is mounted on the cup portion of the mount lead 205, and the coating portion 201 containing phosphors which were combined as the under-mentioned Table 37 was filled so as to cover the LED chip 202 and then resin-molded by the molding member 204 to be constituted. Hereat, the n-side electrode and p-side electrode of the LED chip 202 are connected with the mount lead 205 and the inner lead 206 using the wire 203.

FIG. 57 shows the excitation absorption spectrum of the YAG-base phosphor used in the present Example. Further, FIG. 58 shows the luminescence spectrum of the YAG-base phosphor used in the present Example. In the present Example, as the YAG-base phosphors respectively having different compositions, $(Y_{0.8}Gd_{0.2})_3Al_5O_{12}$:Ce (hereinafter, called as the "phosphor 257-1"), $Y_3Al_5O_{12}$:Ce (hereinafter, called as the "phosphor 257-2"), and $Y_3(Al_{0.8}Ga_{0.2})_5O_{12}$:Ce (hereinafter, called as the "phosphor 257-3") were used. These phosphors are phosphors which absorb blue light from the LED chip to be excited and emit yellow to green light.

Figure 60:
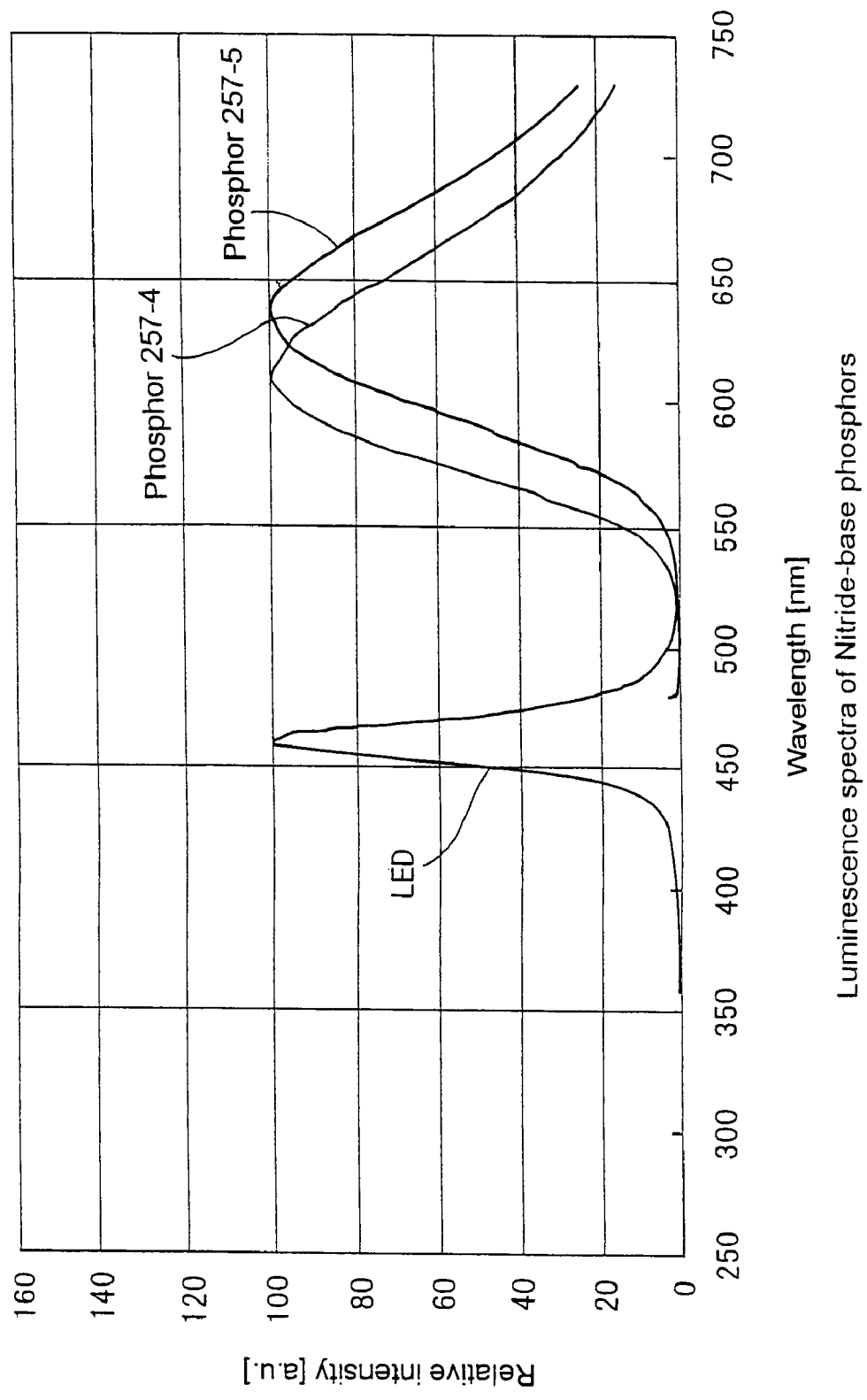
FIG. 60 is a chart showing the luminescence spectrum of the nitride-base phosphor in one Example of the present invention.

FIG. 59 shows the excitation absorption spectrum of the nitride-base phosphor used in the present Example. Further, FIG. 60 shows the luminescence spectrum of the nitride-base phosphor used in the present Example. In the present Example, as the nitride-base phosphors respectively having different compositions, $(Ca_{0.985}Eu_{0.015})_2Si_5N_8$ (hereinafter, called as the "phosphor 257-4"), and $(Sr_{0.679}Ca_{0.291}Eu_{0.03})_2Si_5N_8$ (hereinafter, called as the "phosphor 257-5") were used. These phosphors are phosphors which absorb blue light from the LED chip to be excited and emit red light. The composition and the peak wave lengths of the luminescence spectrum of the above-mentioned phosphors are shown below.

TABLE 36

|  | Composition | Luminescence peak wave length (nm) | Color tone x | Color tone y |
|---|---|---|---|---|
| Phosphor 257-1 | $(Y_{0.8}Gd_{0.2})_3Al_5O_{12}$:Ce | 562 | 0.457 | 0.527 |
| Phosphor 257-2 | $Y_3Al_5O_{12}$:Ce | 550 | 0.422 | 0.554 |
| Phosphor 257-3 | $Y_3(Al_{0.8}Ga_{0.2})_5O_{12}$:Ce | 533 | 0.383 | 0.575 |

TABLE 36-continued

|  | Composition | Luminescence peak wave length (nm) | Color tone x | Color tone y |
|---|---|---|---|---|
| Phosphor 257-4 | $(Ca_{0.985}Eu_{0.015})_2Si_5N_8$ | 610 | 0.597 | 0.401 |
| Phosphor 257-5 | $(Sr_{0.679}Ca_{0.291}Eu_{0.03})_2Si_5N_8$ | 637 | 0.638 | 0.36 |

Firstly, after the light emitting diodes were formed using the phosphors 257-1 to 257-5 one by one, the ambient temperature was raised by applying a pulse current of 20 mA under a condition in which the heat emission of the LED chips themselves is negligible, and the luminescence outputs of the light emitting diodes for the ambient temperature were measured. Then, the relative outputs of the LED luminescence based on 25° C. were determined with respect to the respective phosphors 257-1 to 257-5, and shown as the ambient temperature-relative light output property in FIG. 64 to FIG. 68. Further, the decreasing rates of the relative LED luminescence outputs when the ambient temperature was changed by 1° C. are determined for the respective phosphors, and shown in Table 37 below as the decreasing rates of the luminescence outputs for the temperature rises of the first phosphor and the second phosphor.

TABLE 37

|  | Composition | Decreasing rate of the luminescence output [a.u./° C.] |
|---|---|---|
| Phosphor 257-1 | $(Y_{0.8}Gd_{0.2})_3Al_5O_{12}$:Ce | $2.2 \times 10^{-3}$ |
| Phosphor 257-2 | $Y_3Al_5O_{12}$:Ce | $1.5 \times 10^{-3}$ |
| Phosphor 257-3 | $Y_3(Al_{0.8}Ga_{0.2})_5O_{12}$:Ce | $1.8 \times 10^{-3}$ |
| Phosphor 257-4 | $(Ca_{0.985}Eu_{0.015})_2Si_5N_8$ | $3.4 \times 10^{-3}$ |
| Phosphor 257-5 | $(Sr_{0.679}Ca_{0.291}Eu_{0.03})_2Si_5N_8$ | $1.9 \times 10^{-3}$ |

The LED chip 202 used for exciting the phosphors in the present Example is the light emitting element in which the InGaAlN compound semiconductor was formed as a luminescence layer, and the peak wave length of the luminescence spectrum is 460 nm. Further, the chromaticity coordinate is shifted toward lower color temperature along the black body radiation locus by heightening the electric current density between 3 to 300 A/cm². FIG. 56 is a chart showing the electric current property of luminescence spectrum when electric current run in the LED chip 202 is changed. As shown in FIG. 56, with respect to the electric current property of luminescence spectrum, the peak wave length is shifted toward shorter wavelength side in accordance with the increase of applied electric current.

Then, as shown in FIG. 57, the positions of the peak wave length of the excitation absorption spectrum of the above-mentioned three phosphors 257-1 to 257-3 are nearly coincided with the positions to which the peak wave length of luminescence spectrum of the LED chip is shifted in accordance with the increase of electric current which is applied to the LED chip. Hereat, it is preferable that the difference between the peak wave length of the excitation absorption spectrum of the phosphors 257-1 to 257-3 and the peak wave length of the luminescence spectrum of the LED chip is 40 nm or less. Since the excitation efficiency of the phosphors is improved by using the phosphors and the quantity of light emitted from the LED is decreased without wave length conversion, the chromaticity deviation of a light emitting device can be prevented.

Hereat, when the phosphor 257-3 is used, the luminescence spectrum of the phosphor 257-3 is shifted toward shorter wave length than the luminescence spectrum of the phosphor 257-1 as shown in FIG. 58. Accordingly, although the chromaticity deviation of the light emitting device can be prevented by shifting the peak wave lengths of the excitation absorption spectrum of the YAG-base phosphors, the emission of the light emitting device is deviated from the black body radiation locus, therefore a red component is added to the color mix light by adding the phosphor 257-4 or the phosphor 257-5, and the chromaticity coordinate is adjusted near at the black body radiation locus.

The compounding ratio of the nitride-base phosphor to the YAG-base phosphor is shown in Table 38 below.

TABLE 38

| Example No. | Phosphor | Resin | YAG-base phosphor | Nitride phosphor |
|---|---|---|---|---|
| Example 257-1 | Phosphor 3 + Phosphor 5 | 10 | 2.6 | 0.4 |
| Comparative Example 11 | Phosphor 1 | 10 | 3 | 0 |
| Comparative Example 12 | Phosphor 2 + Phosphor 4 | 10 | 2.2 | 0.4 |
| Comparative Example 13 | Phosphor 2 + Phosphor 5 | 10 | 2.2 | 0.4 |

The measurement result of the optical properties when the light emitting diodes were formed in Example 257 and Comparative Examples 11 to 13 is shown in Table 39 below.

arrow direction in accordance with the increase of the applied electric current. On the other hand, in case of Example 257, it can be grasped that the chromaticity is migrated to a low chromaticity side to an arrow direction as if it migrates nearly along the black body radiation locus.

Figure 61:
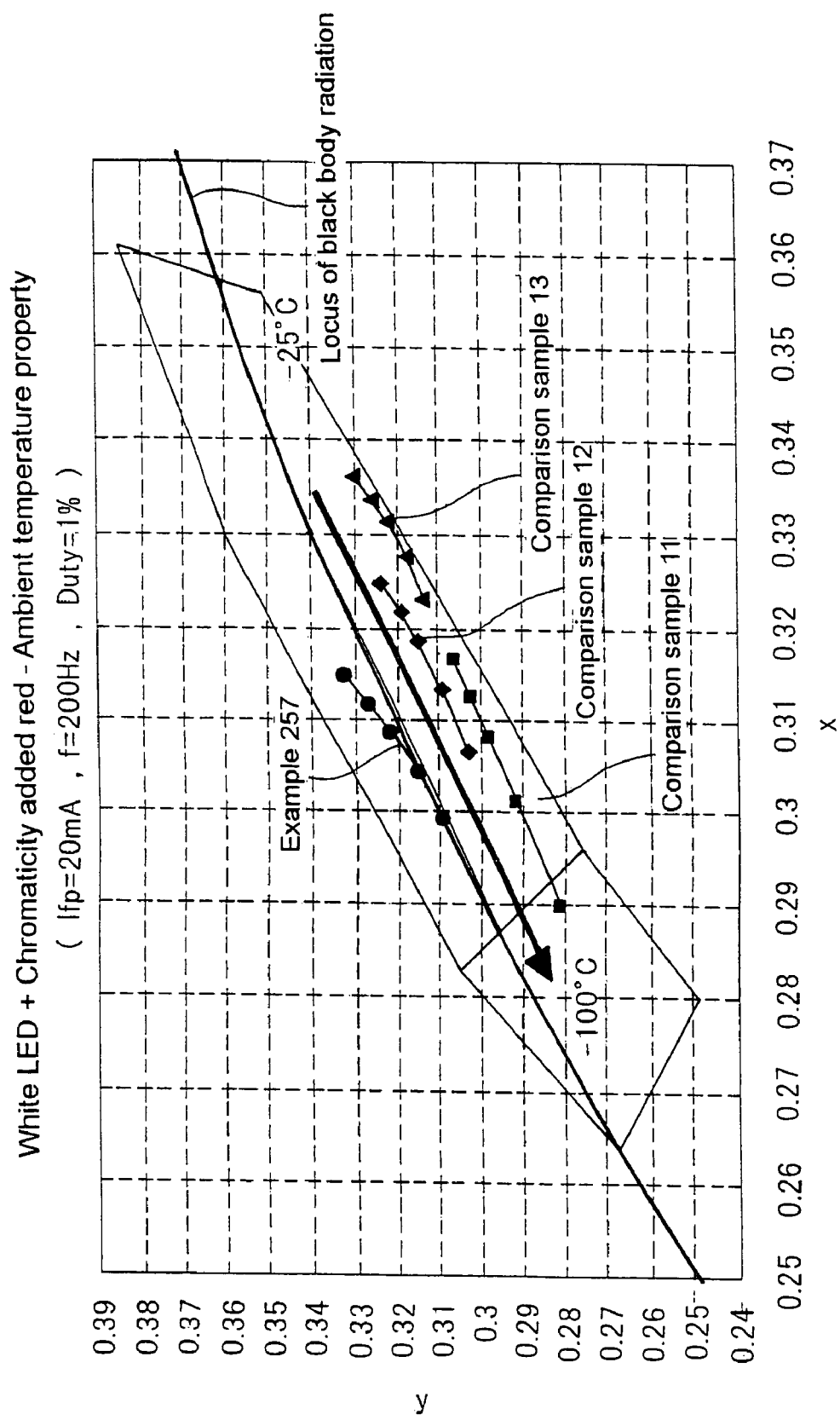
FIG. 61 is a chart showing the relation between the ambient temperature and the chromaticity property (measurement by a pulse drive) in one Example of the present invention.
Figure 62:
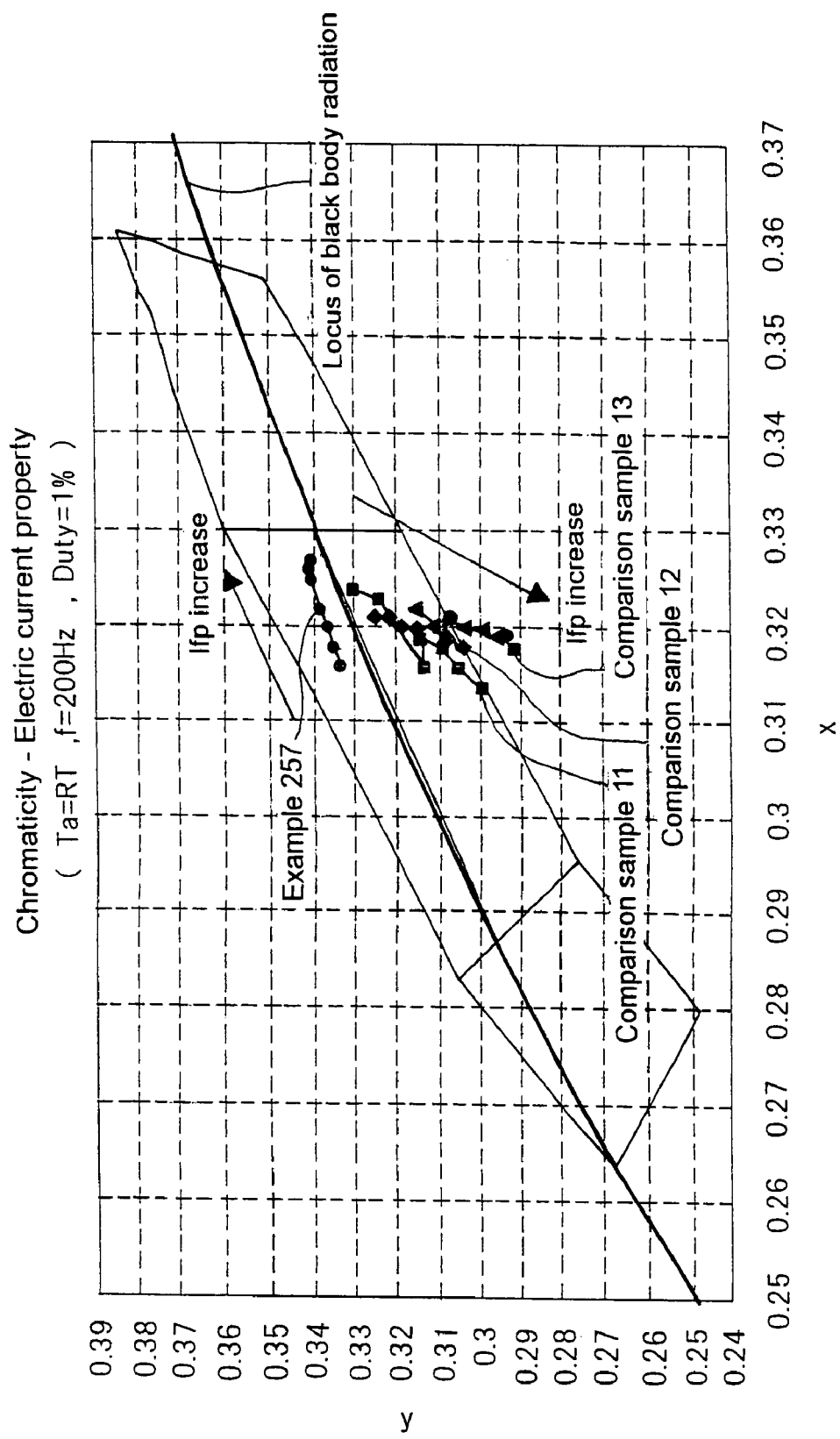
FIG. 62 is a chart showing the relation between the electric current and the chromaticity property (measurement by a pulse drive) in one Example of the present invention.
Figure 63:
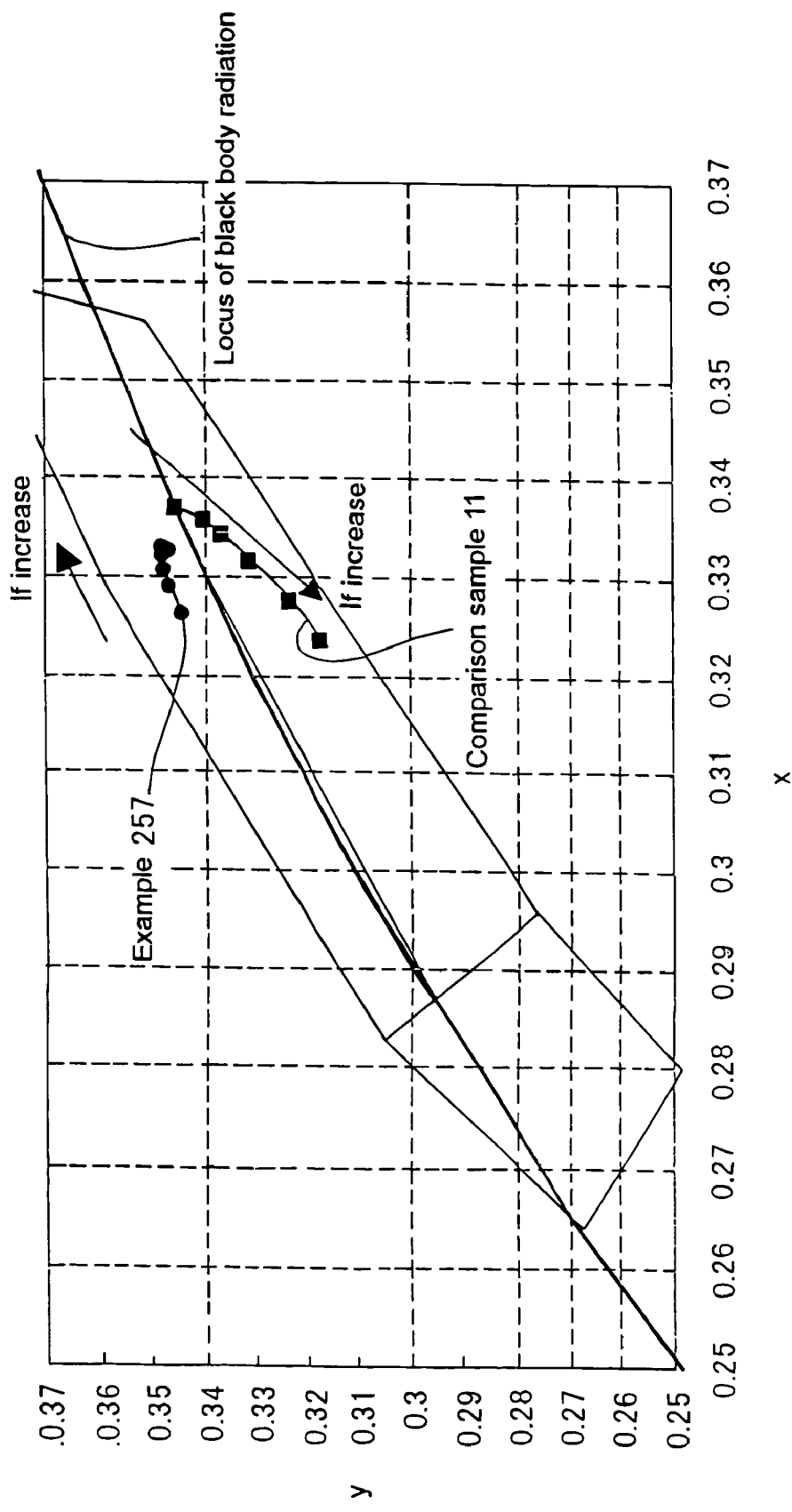
FIG. 63 is a chart showing the relation between the electric current and the chromaticity property (measurement by a DC drive) in one Example of the present invention.
Figure 64:
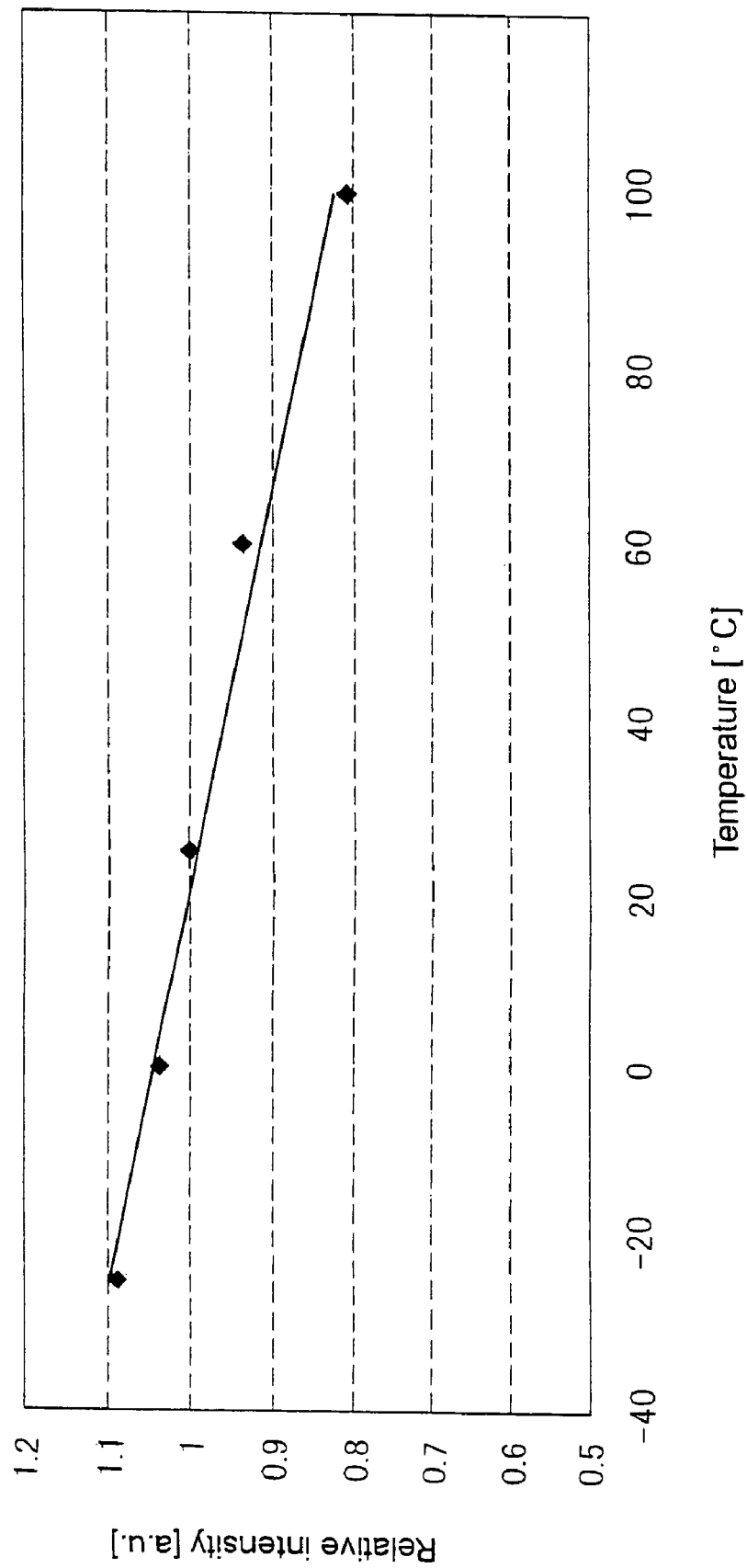
FIG. 64 is a chart showing the relation between the ambient temperature and the relative light output property of the phosphor 1 in one Example of the present invention.
Figure 65:
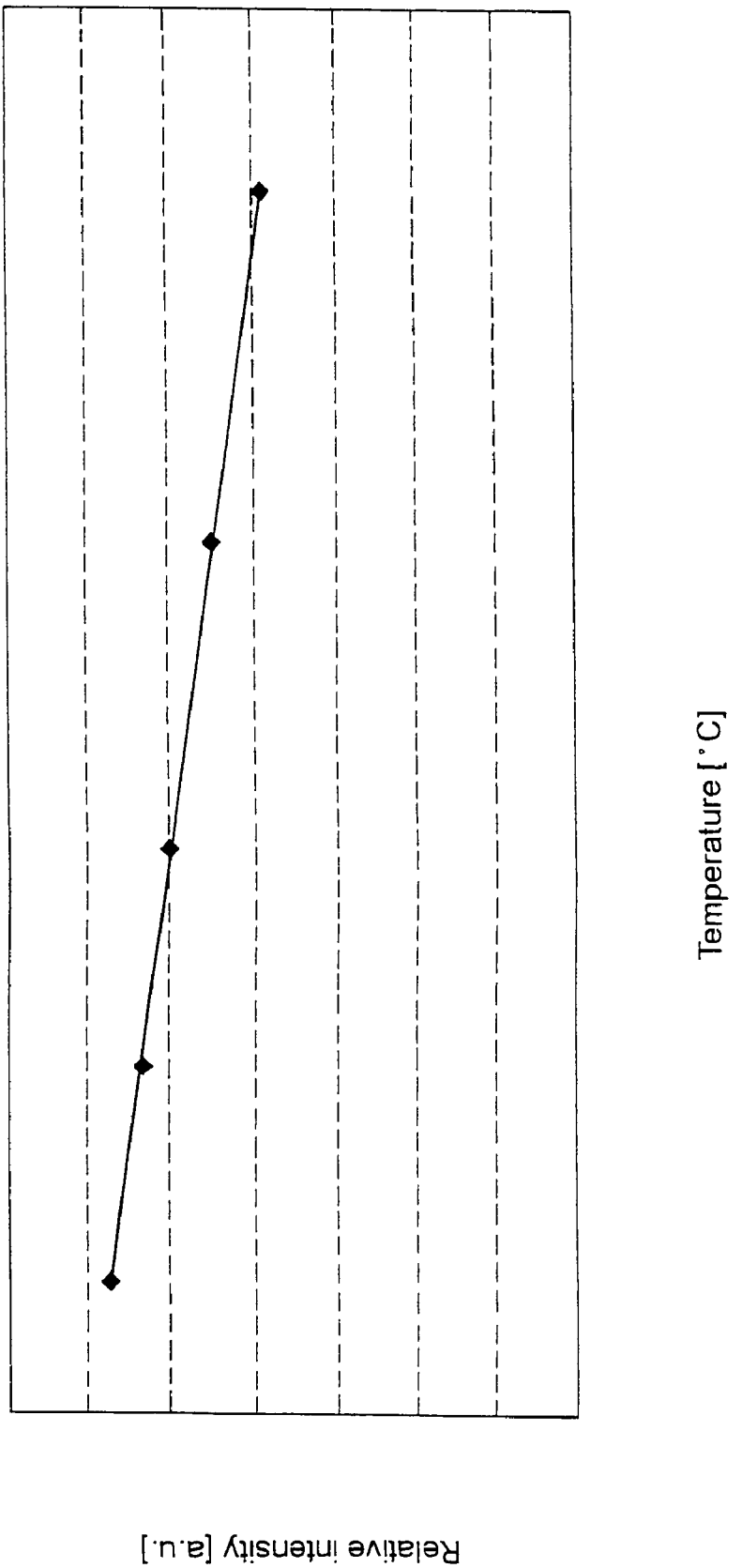
FIG. 65 is a chart showing the relation between the ambient temperature and the relative light output property of the phosphor 2 in one Example of the present invention.
Figure 66:
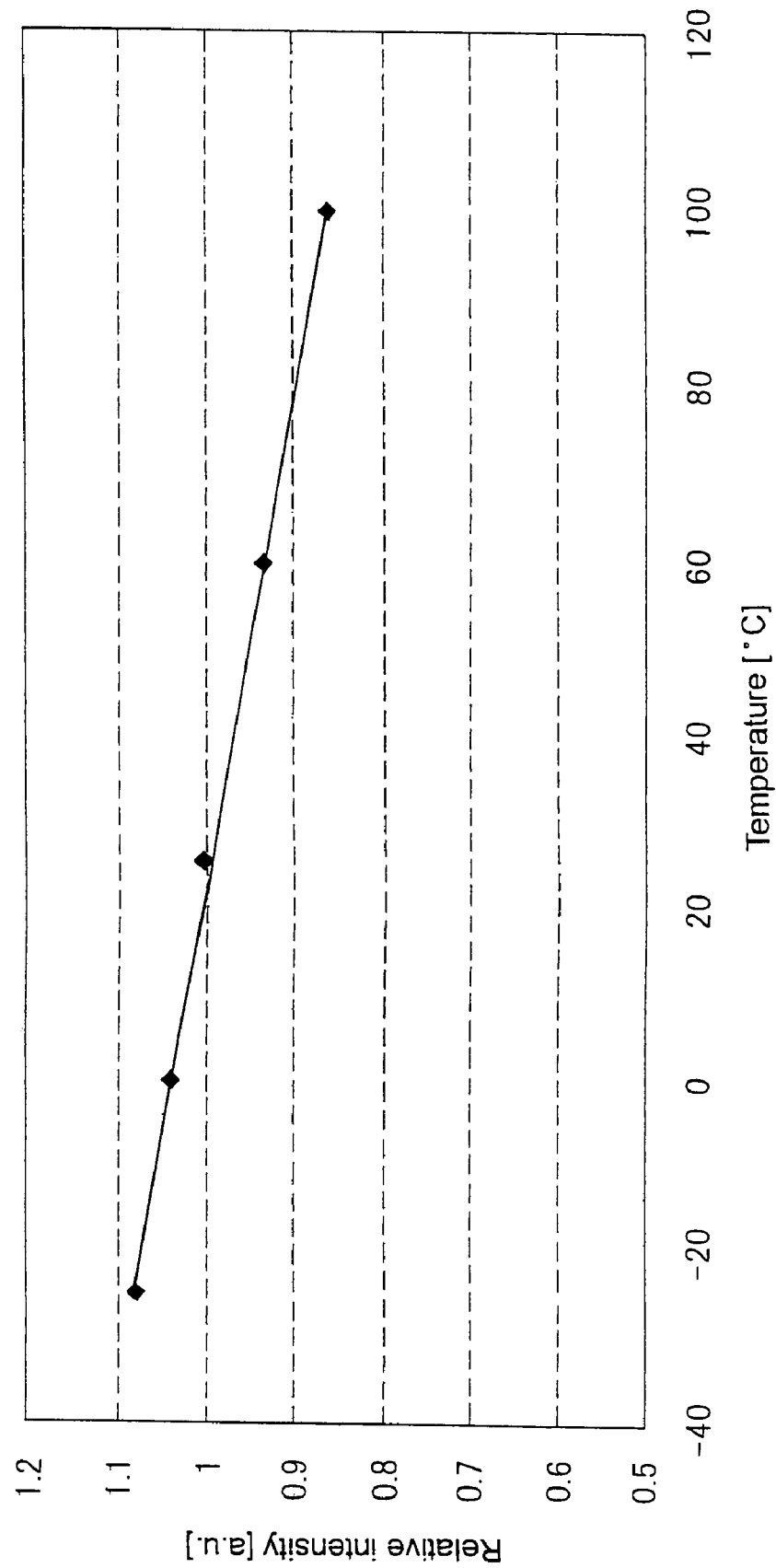
FIG. 66 is a chart showing the relation between the ambient temperature and the relative light output property of the phosphor 3 in one Example of the present invention.
Figure 67:
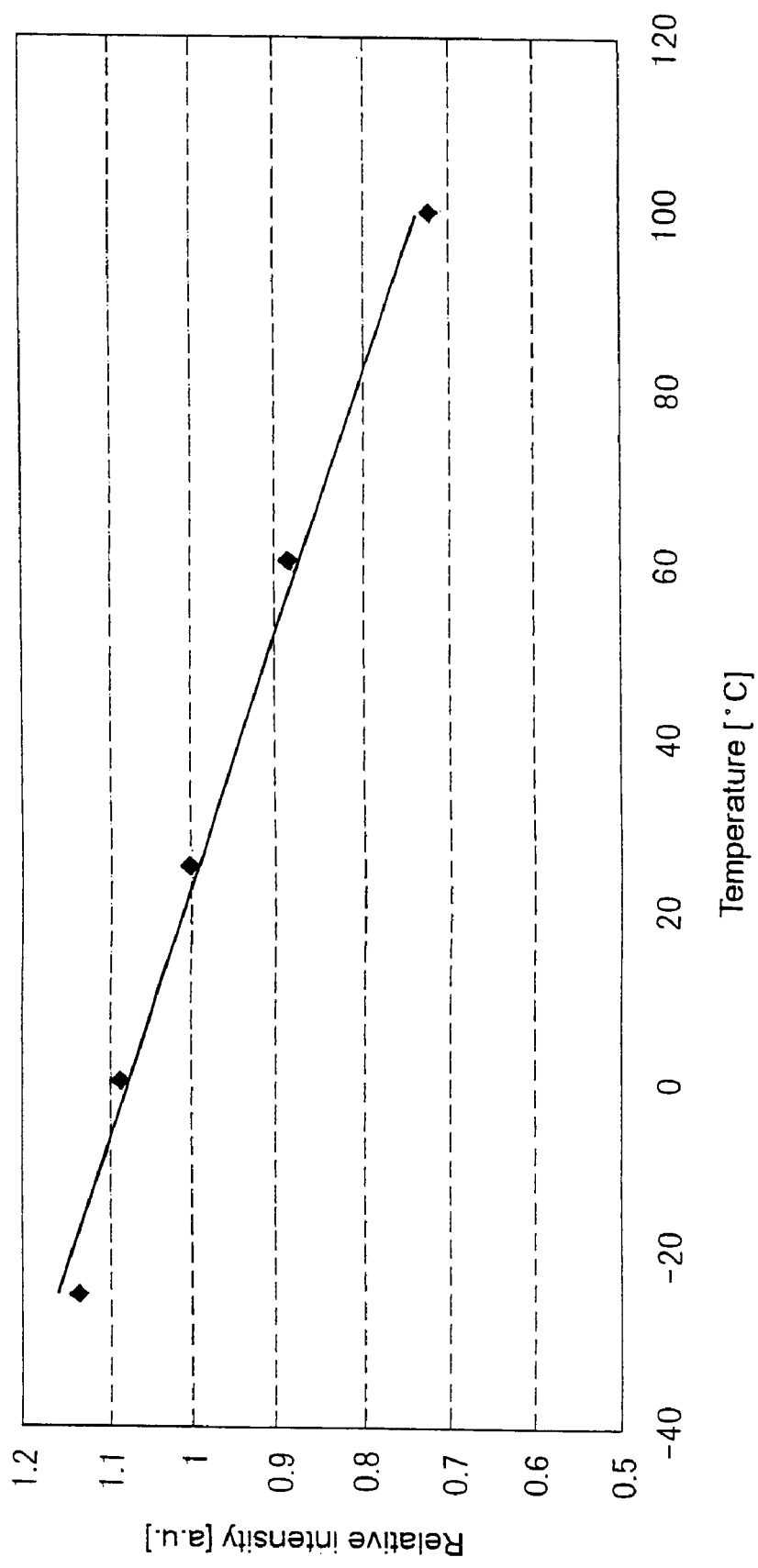
FIG. 67 is a chart showing the relation between the ambient temperature and the relative light output property of the phosphor 4 in one Example of the present invention.
Figure 68:
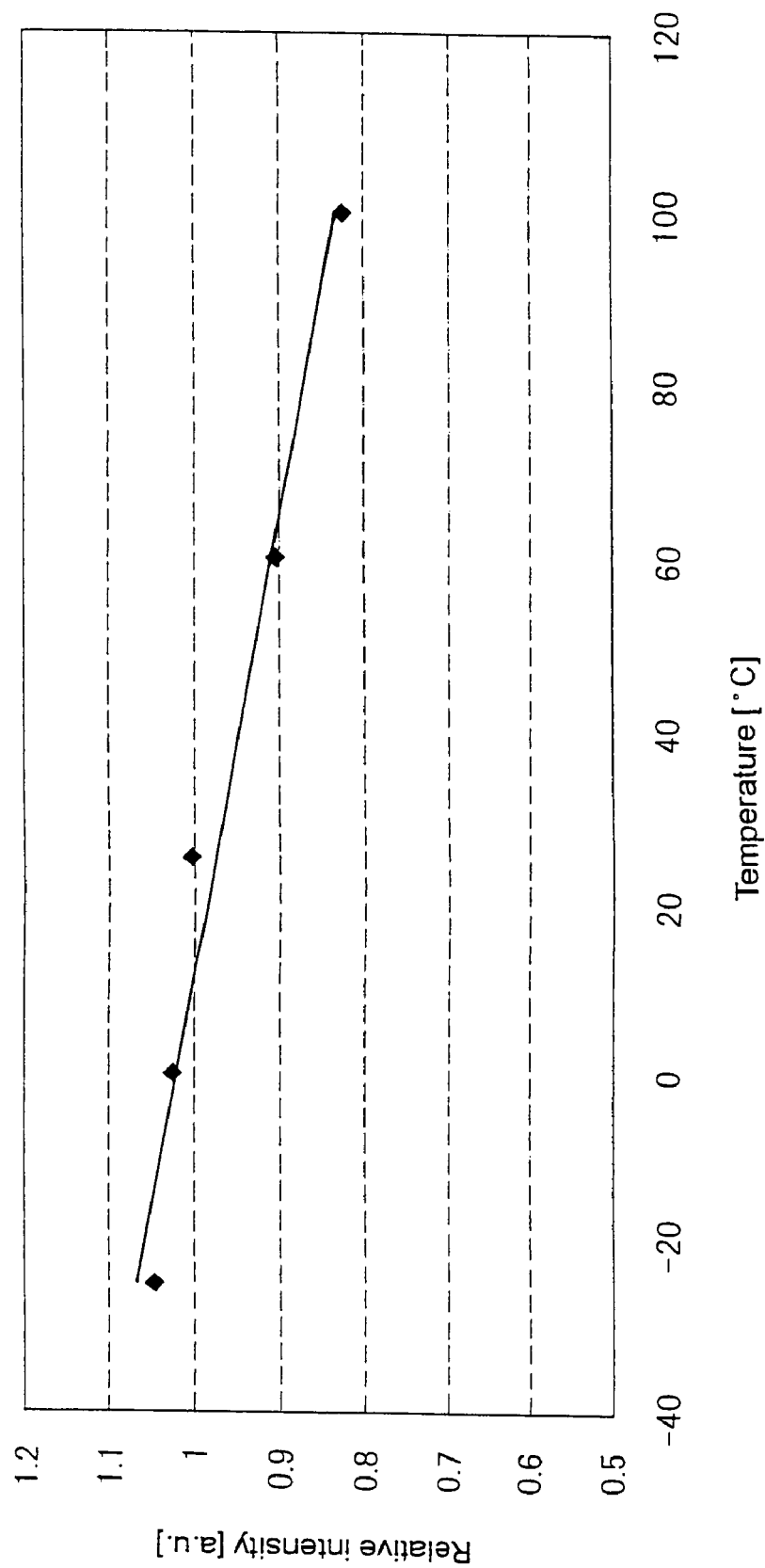
FIG. 68 is a chart showing the relation between the ambient temperature and the relative light output property of the phosphor 5 in one Example of the present invention.

FIG. 63 is a chart showing the chromaticity change when DC drive was carried out with respect to Example 257 and Comparative Example 11. In case of Comparative Example 11, the chromaticities in the respective electric currents are migrated to a high chromaticity side as if it leaves from the black body radiation locus to an arrow direction when the electric current is increased from 1 mA to 5 mA, 10 mA, 20 mA, 40 mA, 60 mA. On the other hand, in case of Example 257, the fluctuation of light chromaticity by color mixing is within a range of 0.326 to 0.333 in the x coordinate and 0.343 to 0.348 in the y coordinate on the chromaticity chart. Namely, the light chromaticity by color mixing is migrated at a position nearly along the black body radiation locus even if the electric current is increased, and the fluctuation of the chromaticity is hardly generated. Thus, it is a result of mutually compensating the chromaticity change to a high chromaticity side along the black body radiation locus which is shown in FIG. 61 as the ambient temperature-chromaticity property, with the chromaticity change to a low chromaticity side along the black body radiation locus which is shown in FIG. 62 as the ambient temperature-chromaticity property as the applied electric current-chromaticity property that the chromaticity is hardly changed in case of Example 257.

The constitution of Example 257 is a constitution that the decreasing rates of the luminescence outputs for the ambient temperature of the phosphors combined are $2.0 \times 10^{-3}$ [a.u./° C.] or less together and small in comparison with the phosphors of other Examples, and the difference of the

TABLE 39

| Example No. | Electric current of forward direction [mA] | Voltage of forward direction [V] | Radiation flux [mW] | Light flux [lm] | Color tone x | Color tone y | Correlative color temperature [K] | Average color rendering index Ra | Lamp efficiency [lm/W] |
|---|---|---|---|---|---|---|---|---|---|
| Example 257-1 | 20 | 3.7 | 7.0 | 2.04 | 0.332 | 0.348 | 5504.5 | 85.5 | 27.5 |
| Comparative Example 11 | 20 | 3.7 | 9.4 | 2.83 | 0.332 | 0.330 | 5523.6 | 82.0 | 38.0 |
| Comparative Example 12 | 20 | 3.8 | 8.4 | 2.54 | 0.332 | 0.329 | 5495.7 | 83.6 | 33.7 |
| Comparative Example 13 | 20 | 3.7 | 8.3 | 2.34 | 0.333 | 0.317 | 5462.7 | 87.9 | 31.2 |

As shown in Table 39, in the color rendering properties in case of Example 257 and Comparative Example 13, both Ra are 85 or more together, and the color rendering property can be improved in comparison with other Comparative Example. Further, FIG. 61 is a chart showing the chromaticity change to the ambient temperature with respect to Example 257 and Comparative Examples 11 to 13. As shown in FIG. 61, the chromaticities of any of Example 257 and Comparative Examples 11 to 13 are changed to a thick arrow direction in the drawing by the rise of temperature.

FIG. 62 is a chart showing the chromaticity change to the electric current which is applied to the LED chip with respect to Example 257 and Comparative Examples 11 to 13. In the present Example, the electric current property of the LED in which a red component was added to the white LED was confirmed by applying an electric current of 1 to 100 mA (1, 5, 10, 20, 40, 60, 80, 100 mA) under a condition in which the heat emission of the LED chip can be negligible. As shown in FIG. 62, in case of Comparative Examples 11 to 13, the chromaticities are migrated to a high color temperature region as if it leaves from the black body radiation locus to an decreasing rate of the luminescence outputs is $2.0 \times 10^{-4}$ [a.u./° C.] and set as a combination being small in comparison with other Examples. Namely, the decreasing rates of the luminescence outputs for the temperature rises of the phosphor 3 and the phosphor 5 are nearly equal. By making such a constitution thus, the difference of the luminescence outputs of the phosphor 3 and the phosphor 5 is kept at a nearly equal value without being influenced by the ambient temperature, even if the luminescence outputs of the phosphor 3 and the phosphor 5 are lowered by the rise of the ambient temperature caused by the heat emission of the light emitting element. Namely, by making such a constitution of the present invention, there can be made a light emitting device of improving color rendering property irrespective of the change of the ambient temperature of the light emitting device, in particular, the ambient temperature of the light emitting device caused by the change of electric current and hardly generating the color deviation. Further, when a light source for a back light which can be used as the constituting member of a liquid crystal display is formed by using the light emitting device related to the present invention in combination with a light conductive plate which introduces the light emitted from the light emitting device to the face side of observing luminescence, the light source for a back light improving color rendering property irrespective of the change of the ambient temperature and hardly generating the color deviation can be made.

Examples 258 and 259

In the present Example, a light emitting device which can emit warm light, light at a so called electric light bulb region (a color temperature of 2500 K to 3800 K) is formed by using the YAG-base phosphor and the nitride-base phosphor in combination. The compositions, the luminescence peal wave lengths λp [nm], and the color tones of the YAG-base phosphors (phosphors 258-1 and 258-2) and the nitride-base phosphors (phosphors 258-3 and 258-4) which are used in the present Example are shown in Table 40 below.

TABLE 40

| | Composition | Luminescence peak wave length λP [nm] | Color tone x | Color tone y |
|---|---|---|---|---|
| Phosphor 258-1 | $(Y_{0.2}Gd_{0.8})_{2.965}Ce_{0.035}Al_5O_{12}$ | 582 | 0.495 | 0.495 |
| Phosphor 258-2 | $Y_{2.965}Ce_{0.035}(Al_{0.8}Ga_{0.2})_5O_{12}$ | 537 | 0.386 | 0.573 |
| Phosphor 258-3 | $(Ca_{0.97}Eu_{0.03})_2Si_5N_8$ | 610 | 0.593 | 0.399 |
| Phosphor 258-4 | $(Sr_{0.475}Ca_{0.475}Eu_{0.03}Mn_{0.02})_2Si_5N_8$ | 650 | 0.643 | 0.348 |

Further, the decreasing rates [a.u./° C.] of the luminescence outputs of the respective phosphors which were measured in like manner as Example 257 are shown in Table 41 below.

TABLE 41

| | Composition | Decreasing rate of luminescence output [a.u./° C.] |
|---|---|---|
| Phosphor 258-1 | $(Y_{0.2}Gd_{0.8})_{2.965}Ce_{0.035}Al_5O_{12}$ | $5.07 \times 10^{-3}$ |
| Phosphor 258-2 | $Y_{2.965}Ce_{0.035}(Al_{0.8}Ga_{0.2})_5O_{12}$ | $2.00 \times 10^{-3}$ |
| Phosphor 258-3 | $(Ca_{0.97}Eu_{0.03})_2Si_5N_8$ | $2.93 \times 10^{-3}$ |
| Phosphor 258-4 | $(Sr_{0.475}Ca_{0.475}Eu_{0.03}Mn_{0.02})_2Si_5N_8$ | $2.70 \times 10^{-4}$ |

In the present Example, a light emitting device is formed by using the resin with the phosphor 258-2, the phosphor 258-3 and the phosphor 258-4 respectively in combination at the weight ratios which are shown in Table 42 below, in like manner as Example 257, and an electric light bulb color can be emitted.

TABLE 42

| Example No. | Phosphor | Resin | YAG-base phosphor | Nitride phosphor |
|---|---|---|---|---|
| Example 258 | Phosphor 7 + Phosphor 8 | 10 | 3.8 | 0.912 |
| Example 259 | Phosphor 7 + Phosphor 9 | 10 | 5.0 | 0.900 |
| Comparative Example 14 | Phosphor 6 | 10 | 10 | |

The measurement result of the optical properties of the light emitting devices which were formed in Examples 258 and 259 is shown in Table 43 below.

TABLE 43

| Example No. | Electric current of forward direction [mA] | Voltage of forward direction [V] | Radiation flux [mW] | Light flux [lm] | Color tone x | Color tone y | Correlative color temperature [K] | Average color rendering index Ra | Lamp efficiency [lm/W] |
|---|---|---|---|---|---|---|---|---|---|
| Example 258 | 20 | 3.22 | 4.6 | 1.488 | 0.451 | 0.408 | 2810.9 | 72.5 | 23.1 |
| Comparative Example 259 | 20 | 3.24 | 4.1 | 1.130 | 0.450 | 0.409 | 2836.7 | 85.7 | 17.4 |
| Comparative Example 14 | 20 | 3.23 | 3.8 | 1.209 | 0.448 | 0.408 | 2854.8 | 65.2 | 18.7 |

Figure 73:
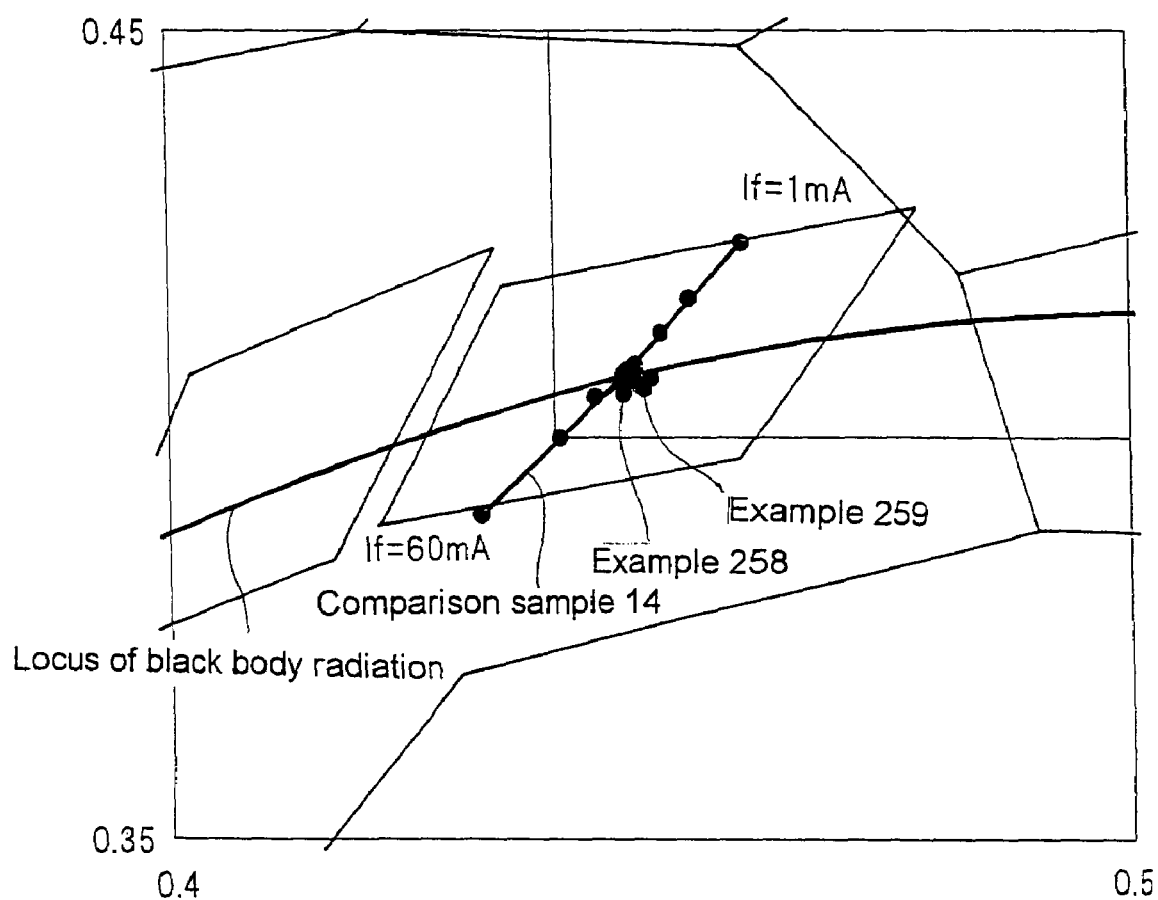
FIG. 73 is a chart showing the relation between the electric current and the chromaticity property (measurement by a DC drive) in one Example of the present invention.

FIG. 73 is a chart showing the chromaticity change when DC drive was carried out with respect to Example 258 and Example 259. In case of Comparative Example 14, the chromaticities in the respective electric currents are migrated to a high chromaticity side, being crossed against the black body radiation locus when the electric current is increased from 1 mA to 5 mA, 10 mA, 20 mA, 40 mA, 60 mA. On the other hand, in case of Example 258 and Example 259, the chromaticity is hardly changed.

The constitution of Example 258 and Example 259 is a constitution that the decreasing rates of the luminescence outputs for the ambient temperature of the phosphors combined are $3.0 \times 10^{-3}$ [a.u./° C.] or less together and small in comparison with the phosphor 258-1 of Comparative Example 14. By making such a constitution of the present invention, there can be made a light emitting device of improving color rendering property irrespective of the change of the ambient temperature of the light emitting device, in particular, the ambient temperature of the phosphor caused by the change of electric current and hardly generating the color deviation.

Figure 69:
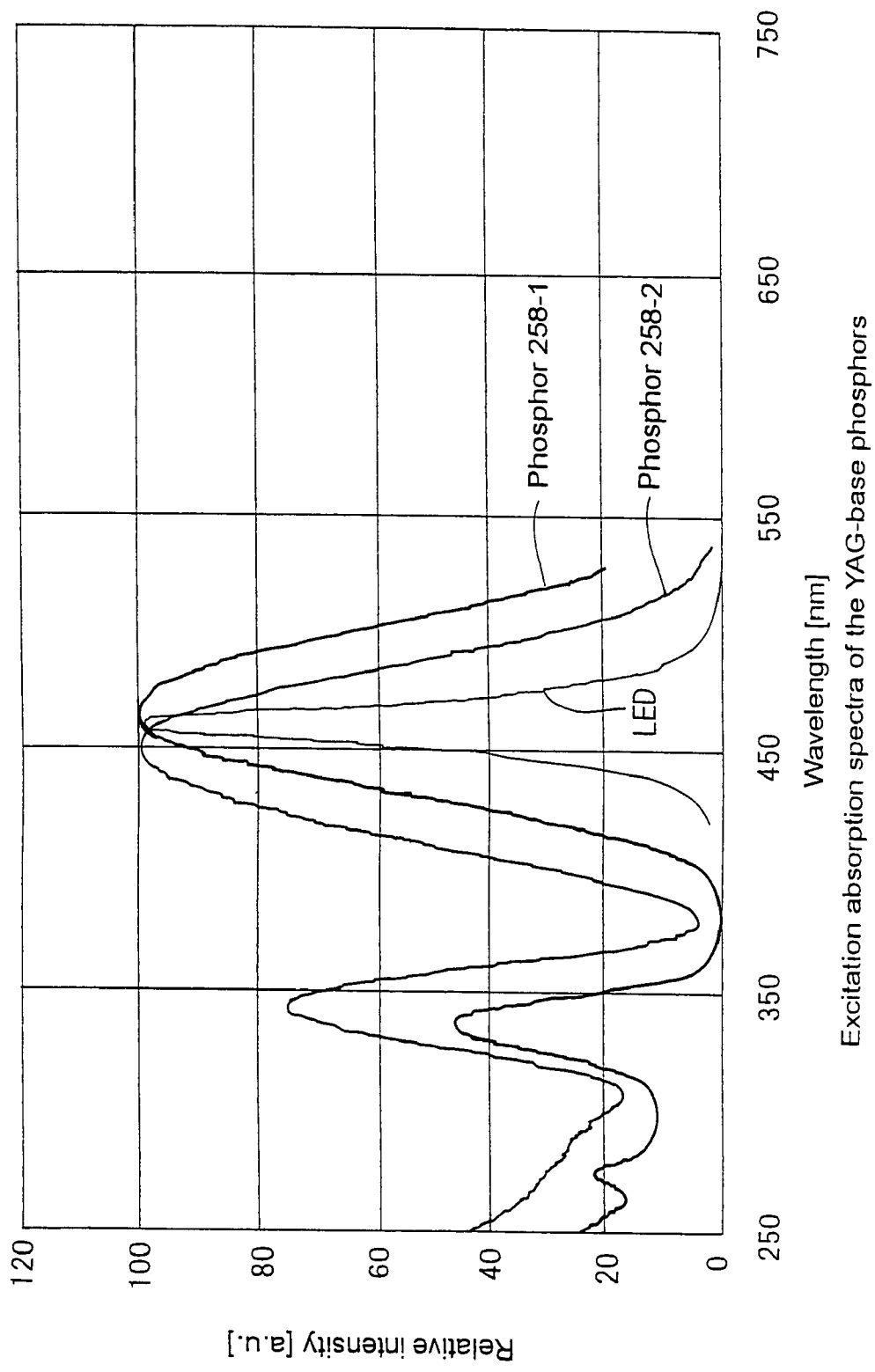
FIG. 69 is a chart showing the excitation absorption spectrum of the YAG-base phosphor in one Example of the present invention.
Figure 70:
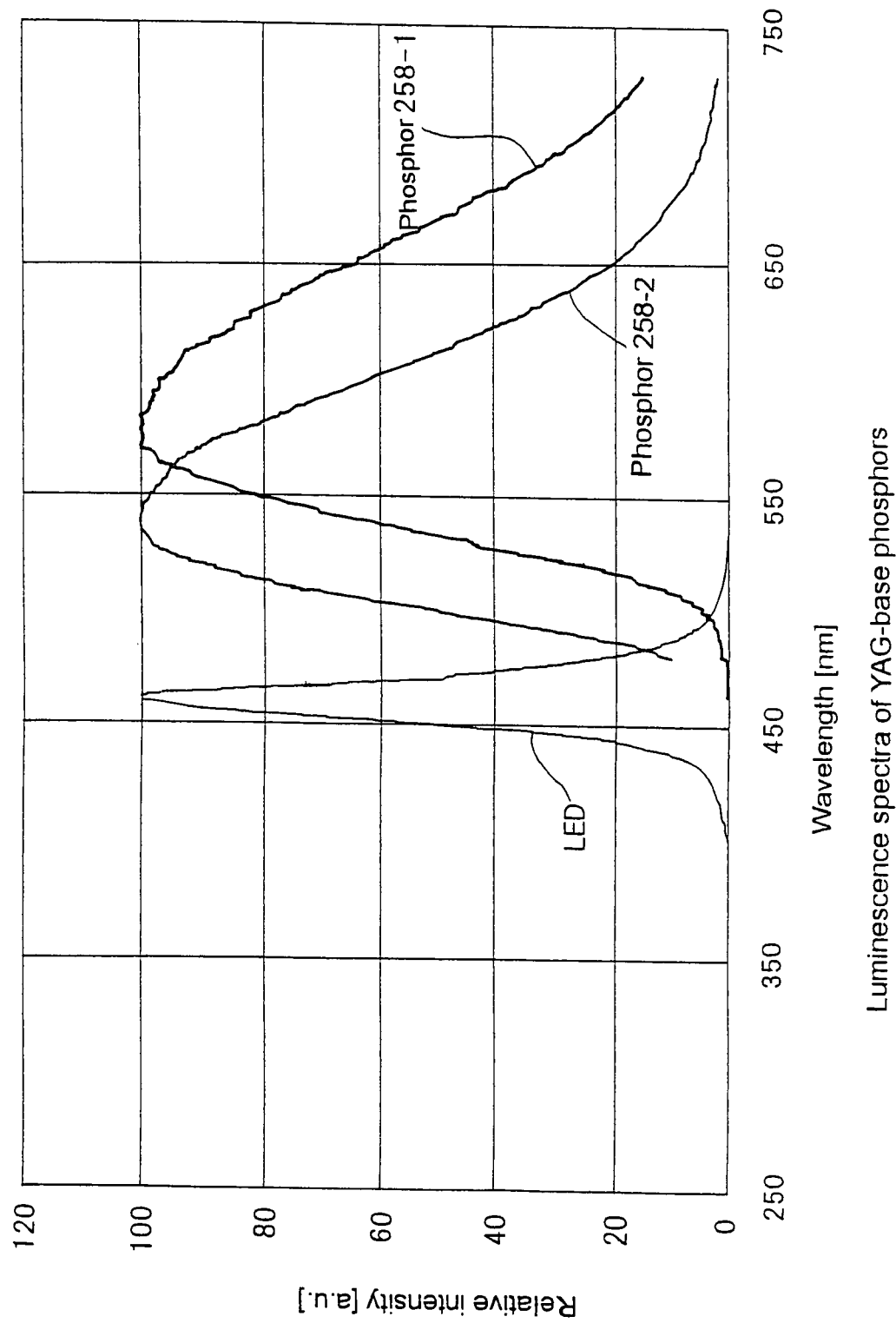
FIG. 70 is a chart showing the luminescence spectrum of the YAG-base phosphor in one Example of the present invention.
Figure 71:
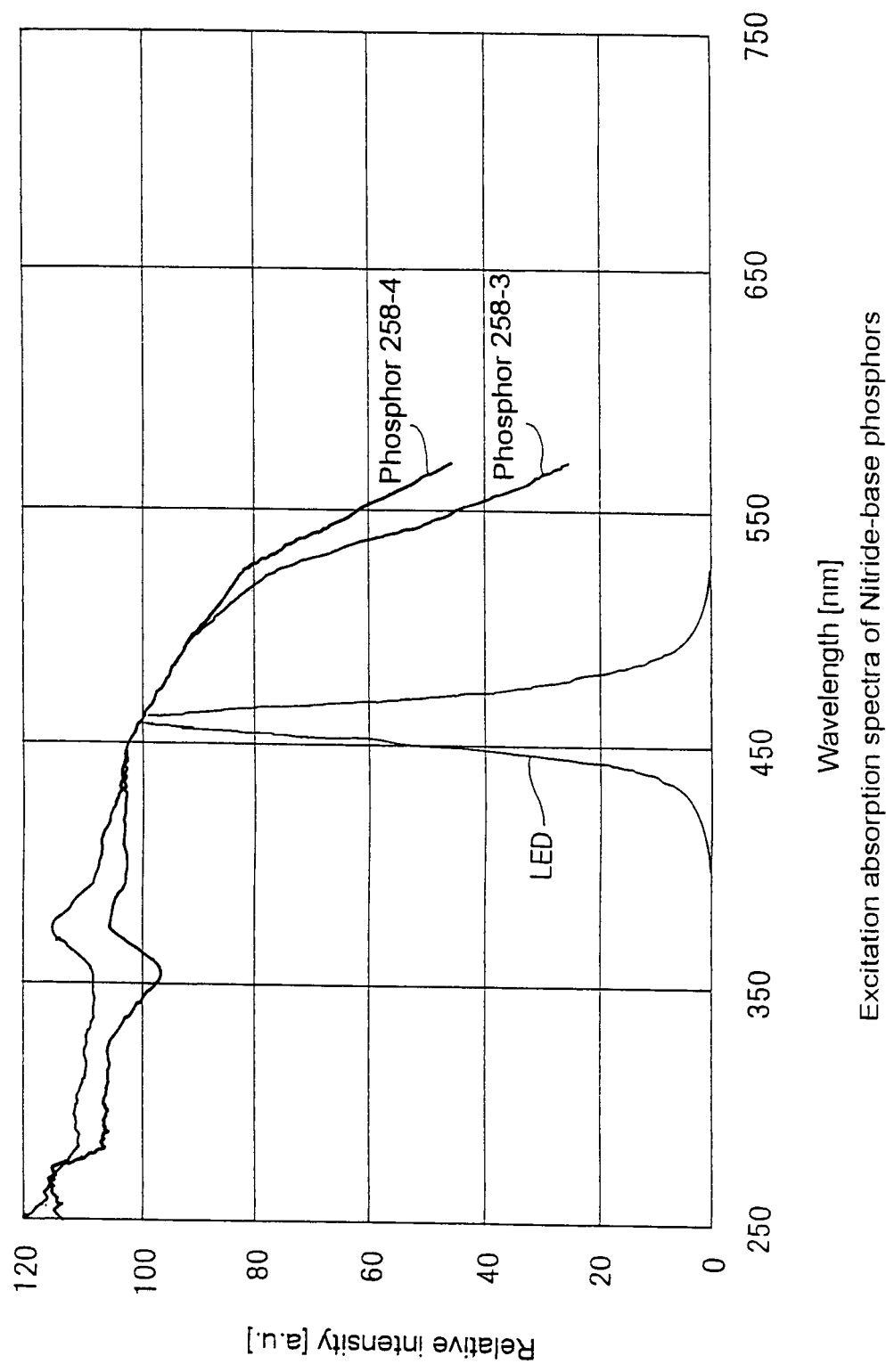
FIG. 71 is a chart showing the excitation absorption spectrum of the nitride-base phosphor in one Example of the present invention.
Figure 72:
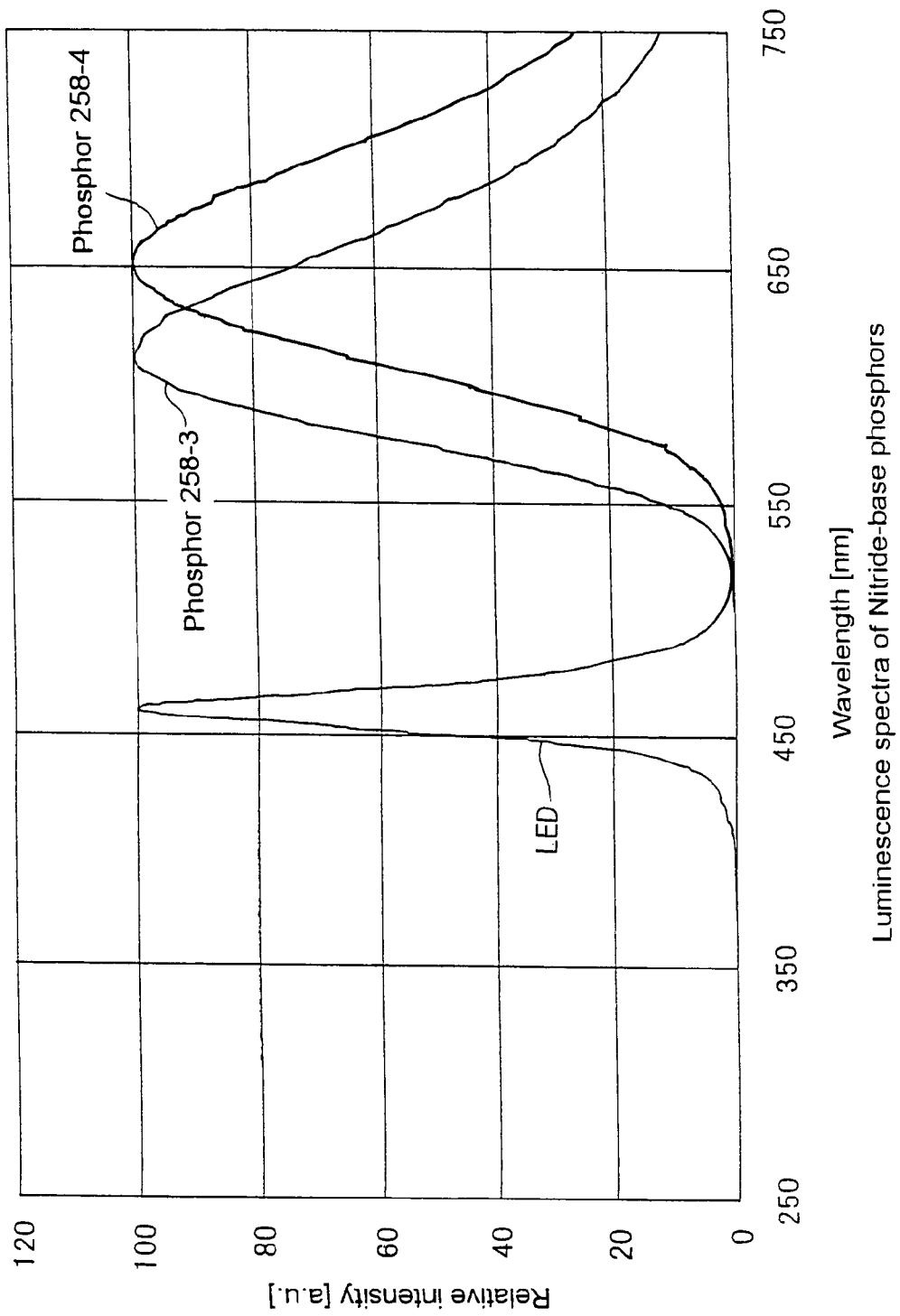
FIG. 72 is a chart showing the luminescence spectrum of the nitride-base phosphor in one Example of the present invention.

A light emitting device capable of emitting electric light bulb color light is formed as Comparative Example 14 in like manner as the above-mentioned Examples 258 and 259, using the YAG-base phosphor 258-1 alone which is shown in Table 40. Hereat, the weight ratio of the resin and the phosphor in the present Comparative Example are shown in Table 42. Further, the measurement result of the optical properties of the light emitting device which was formed as Comparative Example 14 is shown in Table 43 below with the Examples 258 and 259. Further, the chromaticity change is shown in FIG. 73, when DC drive was carried out with respect to Comparative Example 14. As shown in FIG. 73, with respect to the light emitting device in the present Comparative Example, the chromaticities in the respective electric currents are migrated to a high chromaticity side, being crossed against the black body radiation locus when the electric current is increased from 1 mA to 5 mA, 10 mA, 20 mA, 40 mA, 60 mA. This is considered to be because the luminescence peak wave length of the LED chip is shifted toward shorter wavelength in accordance with the increase of electric current as shown in FIG. 56, is deviated from the peak wave length of the excitation absorption spectrum of the phosphor 258-1 which was shown in FIG. 69, therefore the wave length conversion efficiency of the phosphor is lowered and the wave length component of light from the LED chip in which the wave length conversion is not carried out by the phosphor is increased. On the other hand, the peak wave length of the excitation absorption spectrum of the phosphor 258-2 which is used in Example 258 and Example 259 is situated at a short wavelength side in comparison with the phosphor 258-1, the luminescence peak wave length of the LED chip is within a range of being migrated in accordance with the change of the applied electric current, therefore the wave length conversion efficiency of the phosphor is not lowered. Further, in case of Example 258 and Example 259, there can be made the light emitting device of hardly generating the color deviation irrespective of the change of the ambient temperature of the light emitting device caused by the change of electric current, in particular, the ambient temperature of the phosphor and improving color rendering property, by using the YAG-base phosphor in combination with the nitride-base phosphor in which the peak wave length of the excitation absorption spectrum within a range that the luminescence peak wave length of the LED chip is migrated in accordance with the change of the applied electric current.

Example 260

In the present invention, the phosphors are obtained by substituting Al with Ga, or by substituting Y with Gd, based on the phosphors in which the composition formula is represented by $Y_{2.965}Ce_{0.035}Al_5O_{12}$ in addition to the YAG-base phosphors which were shown in Tables 36 and 40. Namely, with respect to the phosphor being substituted with Ga, the phosphor which was substituted within a range of $0<X\leq0.8$ in the general formula $Y_{2.965}Ce_{0.035}(Al_{1-x}Ga_x)_5O_{12}$ is arbitrarily formed, and with respect to the phosphor being substituted with Gd, the phosphor which was substituted within a range of $0<Y\leq0.9$ in the general formula $(Y_{1-Y}Gd_Y)_{2.965}Ce_{0.035}Al_5O_{12}$ is arbitrarily formed. Further, the phosphor which was substituted within a range of $0.015\leq Z\leq0.600$ in the general formula $Y_{3-Z}Ce_ZAl_5O_{12}$ is arbitrarily formed.

In similar manner as Examples 257 to 259, there can be made the light emitting device of hardly generating the color deviation, improving color rendering property and capable of emitting a desired color tone, by appropriately combining the phosphor in the present Example 260 with the nitride-base phosphor.

Examples which are related to the mode 8 of operation related to the present invention are specifically illustrated below. Further, it is needless to say that the present invention is not only limited to Examples shown below.

Example 261

Figure 84:
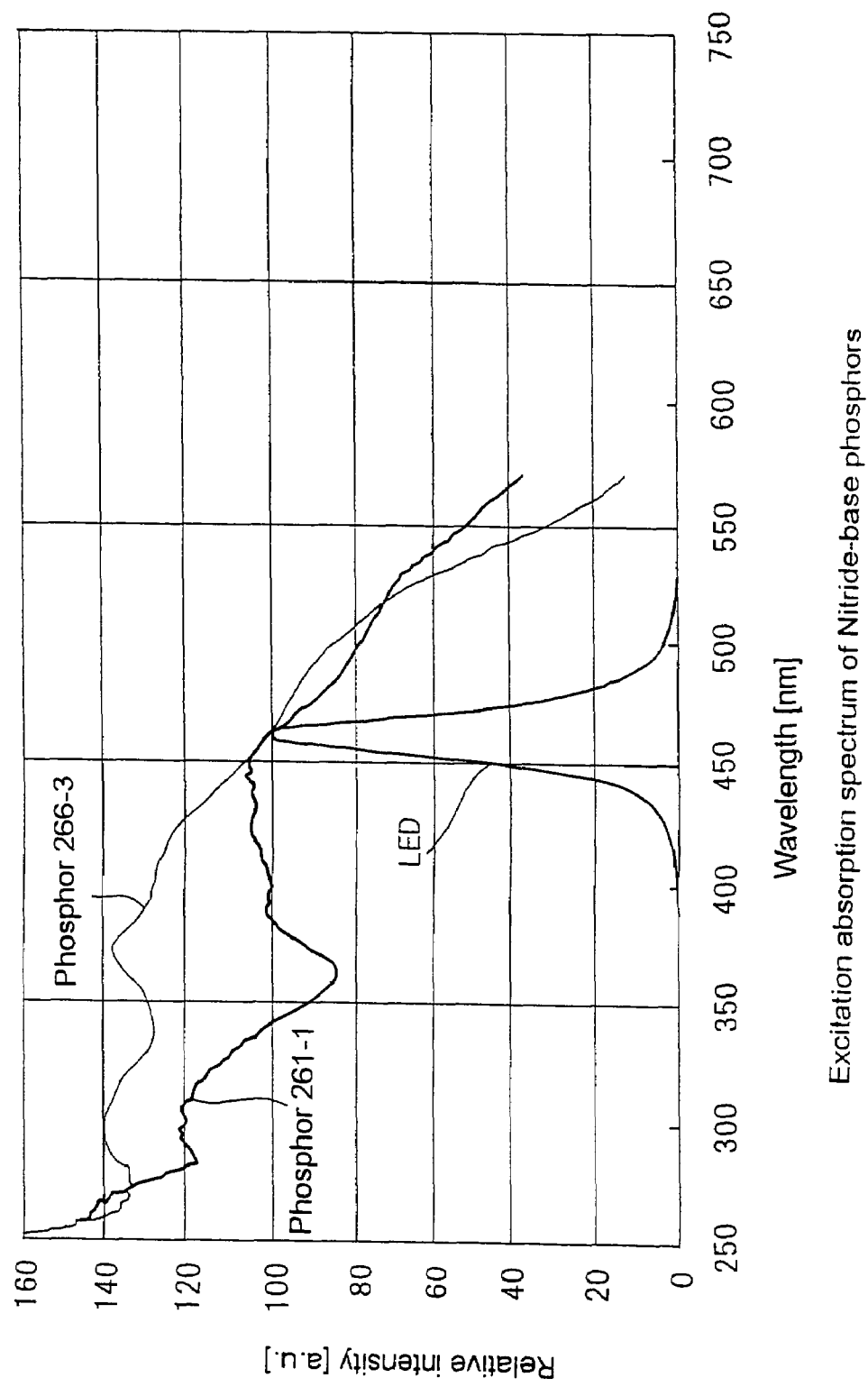
FIG. 84 is a chart showing the excitation absorption spectrum of the nitride-base phosphor in the present invention.
Figure 85:
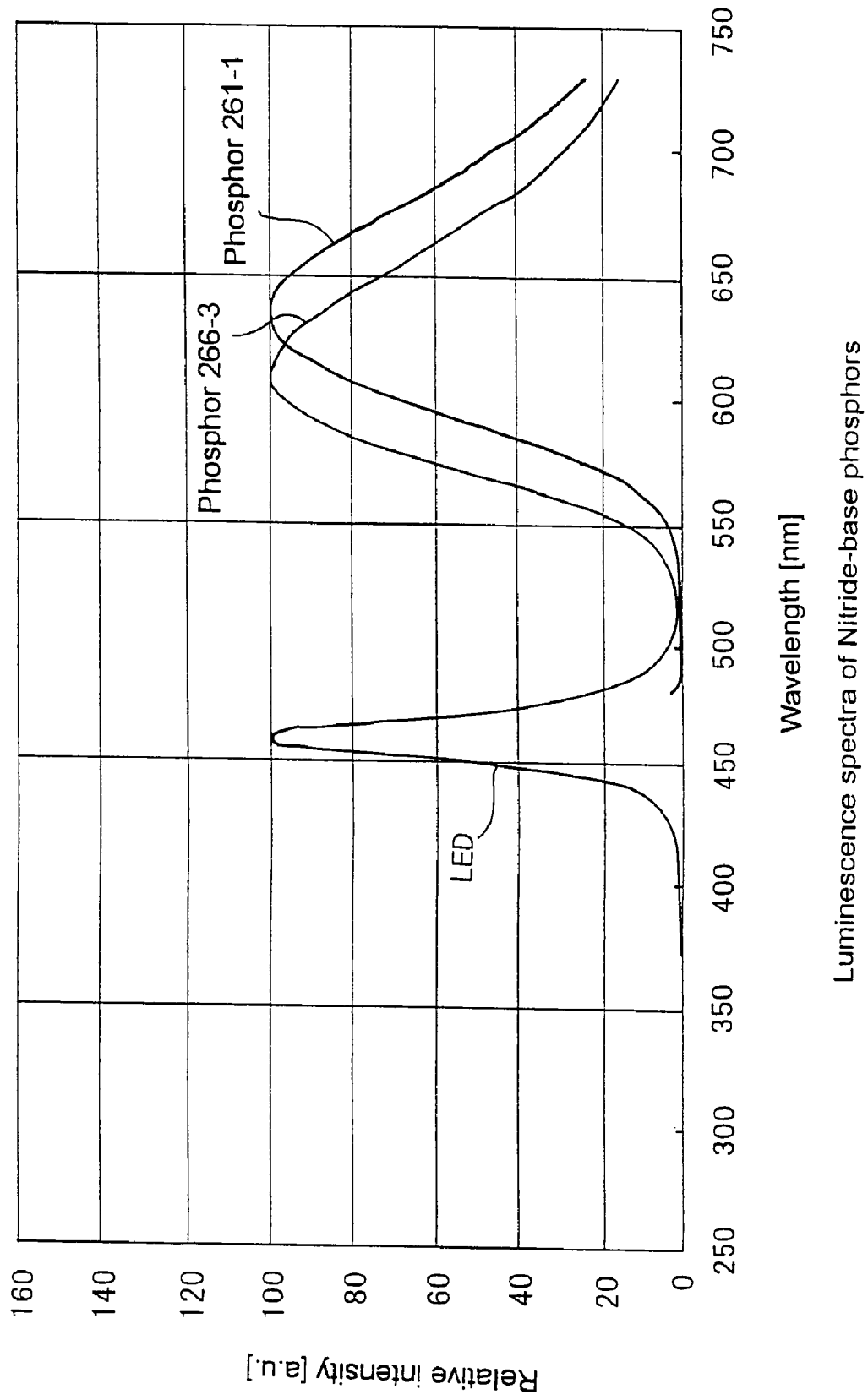
FIG. 85 is a chart showing the luminescence spectrum of the nitride-base phosphor in the present invention.

The typical chart of the light emitting diode 300 formed in the present Example is shown in FIG. 74. In the present Example 261, the nitride-base phosphor contained in the first phosphor layer 303 is $(Sr_{0.7}Ca_{0.3})_2Si_5N_8$:Eu (hereinafter, called as the "phosphor 261-1"). FIG. 84 shows the excitation absorption spectrum of the phosphor. FIG. 85 shows the luminescence spectrum. Further, the YAG-base phosphor contained in the second phosphor layer 306 is $Y_3(Al_{0.8}Ga_{0.2})_5O_{12}$:Ce (hereinafter, called as the "phosphor 261-2").

Figure 82:
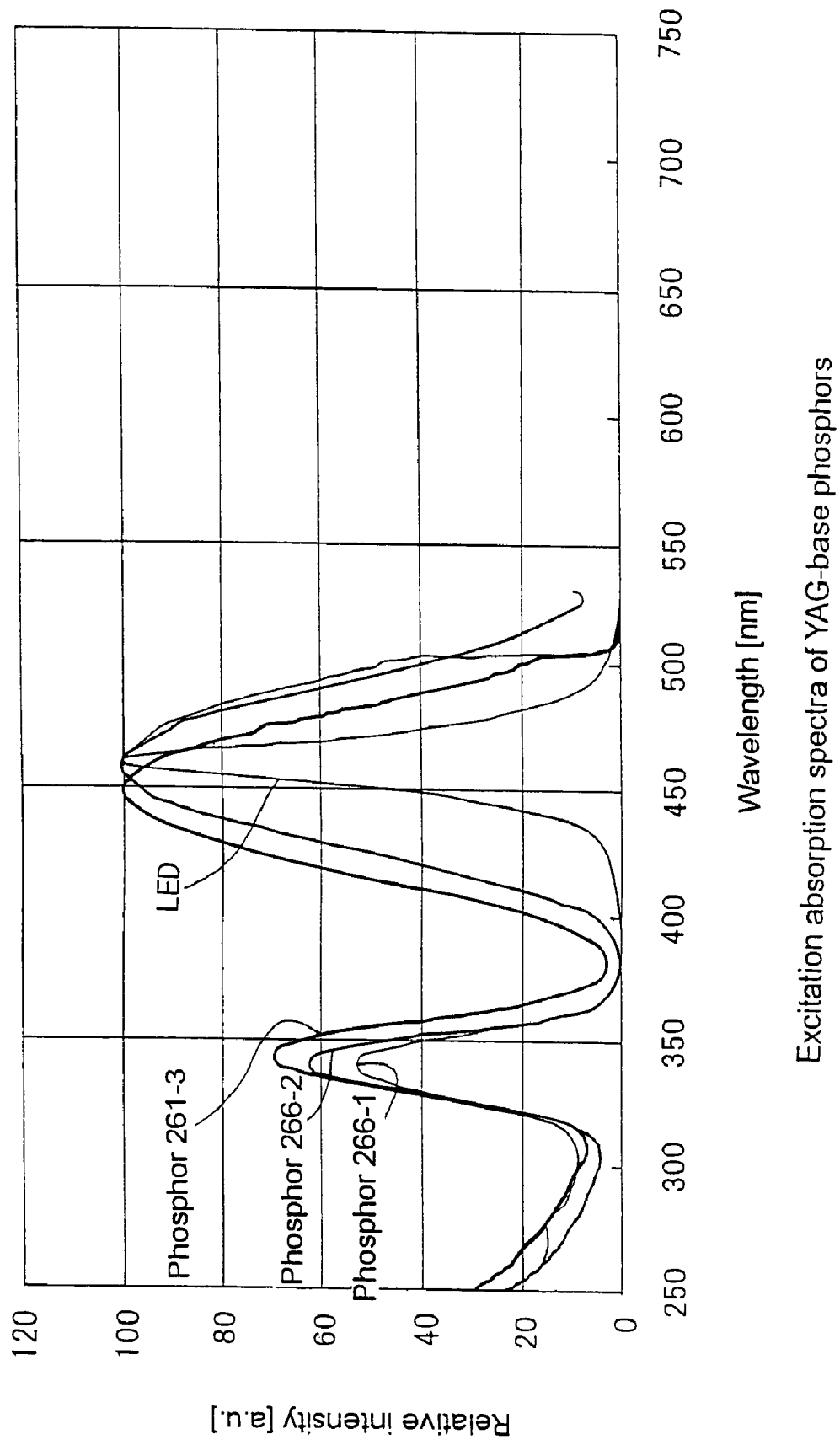
FIG. 82 is a chart showing the excitation absorption spectrum of the YAG-base phosphor in the present invention.
Figure 83:
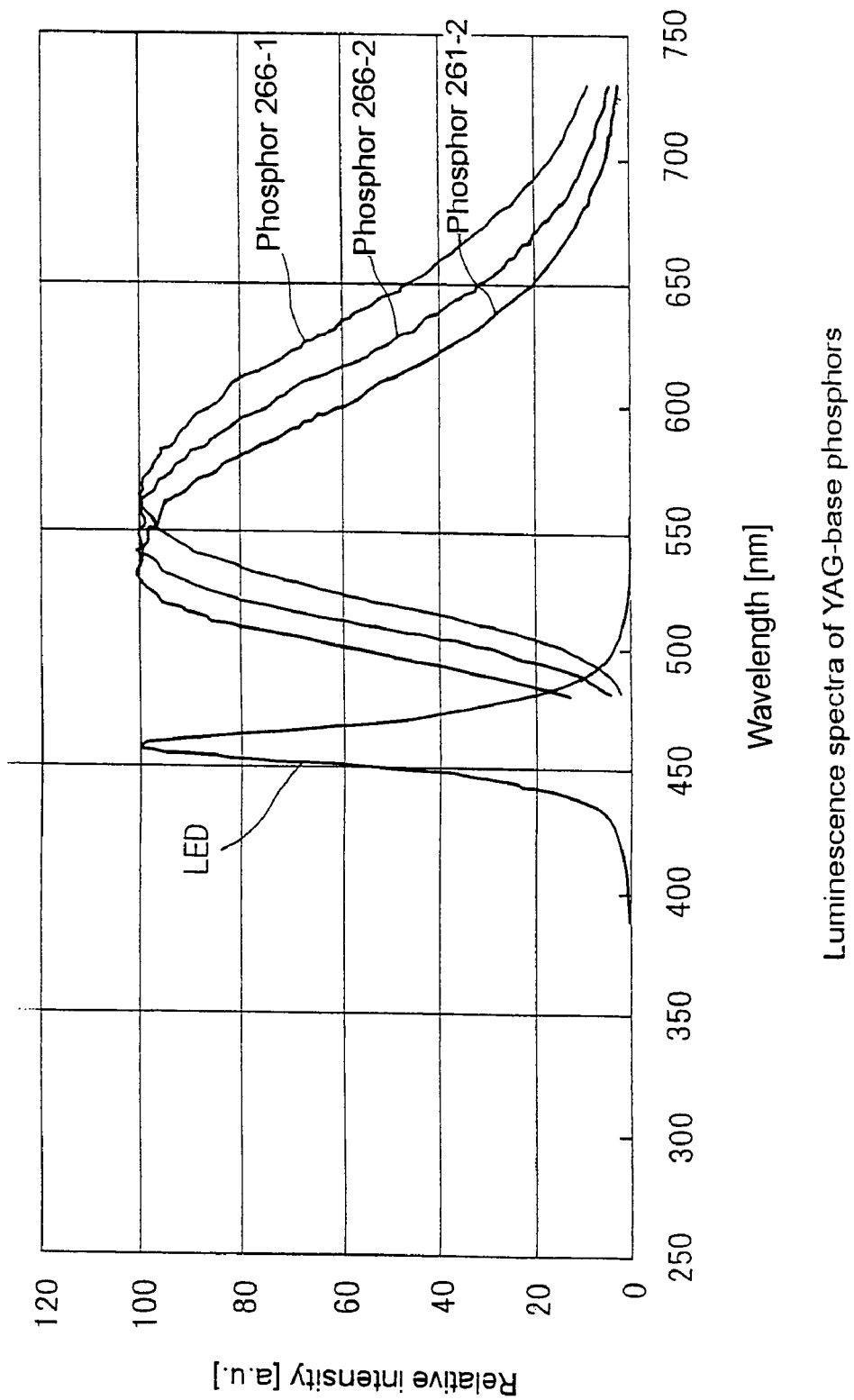
FIG. 83 is a chart showing the luminescence spectrum of the YAG-base phosphor in the present invention.

FIG. 82 shows the excitation absorption spectrum of the phosphor. FIG. 83 shows the luminescence spectrum.

As shown in FIG. 74, the first concave portion 301, the second concave portion 305 and the package 308 having the one pair of positive and negative lead electrodes 309 are formed by an injection molding using a thermoplastic resin as a material. The LED chips 302 and 304 capable of emitting light at a blue region are respectively adhered in the first concave portion and the second concave portion by an insulating adhesive to be fixed. In the present Example, the LED chips which are mounted in the respective concave portions were respectively one chip, but a plural number of chips may be mounted in the respective concave portions. Since the phosphors in the respective concave portions can be directly excited by mounting a plural number of the LED chips thus, a light emitting device which can emit light in high brightness can be formed. The positive electrode and negative electrode of the LED chips 302 and 304 are respectively wire-bonded with the positive electrode and negative electrode of the lead electrode using the electroconductive wire 110.

The formation material of the first phosphor layer 303 which contained the phosphor 261-1 in a silicone resin is prepared, and the prepared material is arranged and cured so as to cover the LED chip 302 which is mounted in the first concave portion. Hereat, the compounding ratio of the silicone resin and the phosphor 261-1 is (silicone resin):(phosphor 261-1)=10:3 (weight ratio).

Successively, the formation material of the second phosphor layer 306 which contained the phosphor 261-2 in a silicone resin is prepared, and the prepared material is arranged and cured so as to cover the LED chip 304 and the first phosphor layer 303 which is mounted in the second concave portion. Hereat, the compounding ratio of the silicone resin and the phosphor 261-2 is (silicone resin):(phosphor 261-2)=10:1 (weight ratio). The electroconductive wire 309, the phosphor layers and the LED chips are sealed by the molding member 307 in which a diffusing agent is contained in the silicone resin.

When electric current is run in a light emitting device which was formed as above, a color mix light having a luminescence spectrum which is shown in FIG. 79 is obtained, therefore the color rendering property is improved in comparison with a conventional technique and high output luminescence can be carried out. Hereat, it is preferable that the output of the LED chip 302 is larger than the output of the LED chip 304. The color rendering property is further improved thereby and high output luminescence can be carried out.

The measurement result of the optical properties of the light emitting diode which was formed in the present Example is shown in Table 44 below.

TABLE 44

| Example No. | Color tone x | Color tone y | Color temperature [K] | Color rendering property Ra | Specific color rendering property R9 |
|---|---|---|---|---|---|
| Example 261 | 0.361 | 0.344 | 4380 | 91.9 | 91.4 |

When a light source for a back light which can be used as the constituting member of a liquid crystal display is formed by using the light emitting device related to the present invention in combination with a light conductive plate which introduces the light emitted from the light emitting device to the face side of observing luminescence, the light source for a back light improving color rendering property irrespective of the change of the ambient temperature and hardly generating the color deviation can be made.

Example 262

Figure 75:
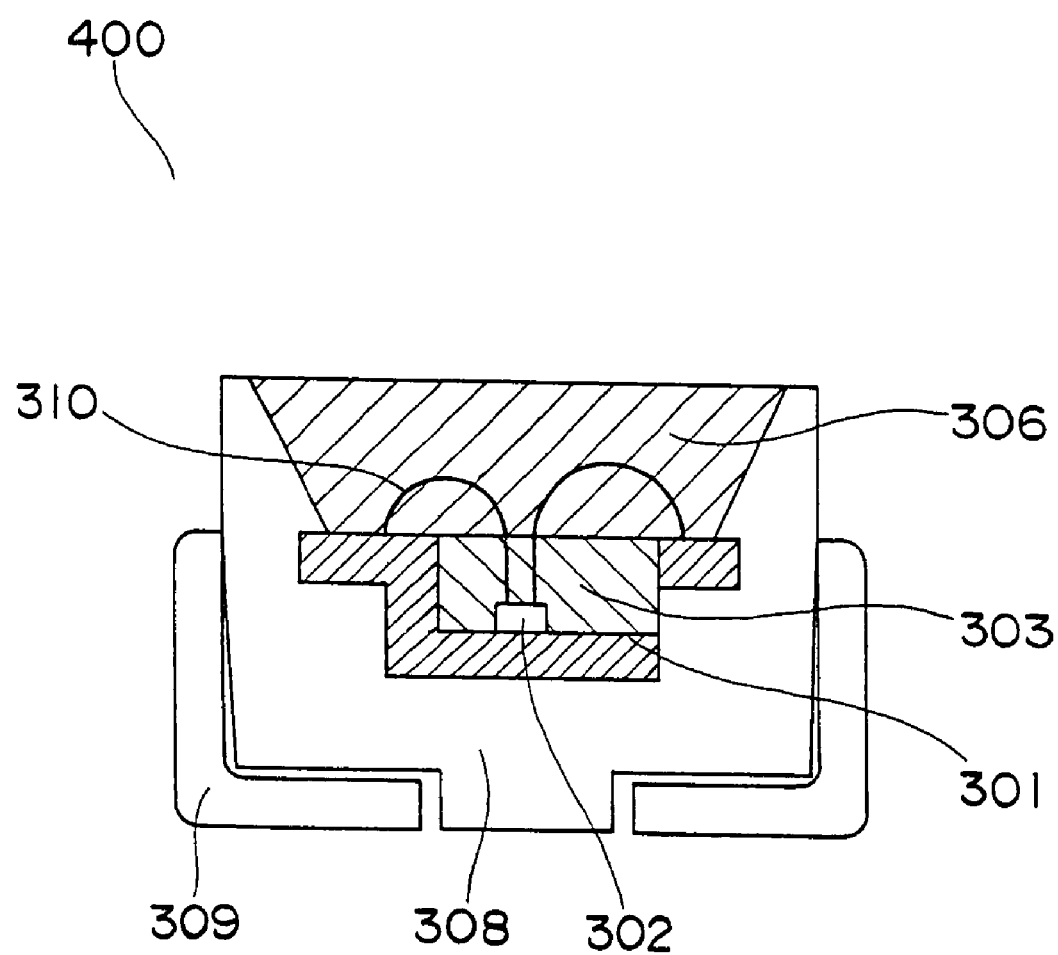
FIG. 75 is a typical section view of the light emitting diode related to the present invention.

The typical chart of the light emitting diode 400 formed in the present Example is shown in FIG. 75. In the present Example, at least one of the LED chip 302 is mounted in the concave portion 301 which was provided without making the first concave portion and the second concave portion as the above-mentioned Example, and the first phosphor layer and the second phosphor layer are laminated on the LED chip 302 in order by the similar method as Example 261. A light emitting device which improved the color rendering property in comparison with a conventional technique can be made by constituting thus.

Example 263

In the present Example, the phosphors which are contained in the first phosphor layer 303 and the second phosphor layer 306 are respectively the phosphor 261-1 and the phosphor 261-2 in like manner as the above-mentioned Examples. Provided that the contents of the phosphor 261-1 and the phosphor 261-2 are respectively more than the contents in the above-mentioned Examples. The first phosphor layer and the second phosphor layer are formed by the similar method as the above-mentioned Examples.

The typical chart of the light emitting diode 300 formed in the present Example is shown in FIG. 76. The light emitting diode 300 is a lead type light emitting diode equipped with the mount lead 402 and the inner lead 401, and the first concave portion 301 and the second concave portion 305 are provided in the cup portion of the mount lead 402. The LED chip 302 is provided on the bottom face of the first concave portion and the first phosphor layer 303 is formed so as to cover the LED chip 302. Further, the LED chip 304 is provided on the bottom face of the second concave portion and the second phosphor layer 306 is formed so as to cover the LED chip 304 and the first phosphor layer 303. Further, the phosphor layers, the lead electrodes and the electroconductive wire are resin-molded by the molding member 307 to be constituted. Hereat, the n-side electrode and p-side electrode of the LED chips 302 and 304 are respectively connected with the mount lead 402 and the inner lead 401 using the wire 110.

Reddish color mix light having the luminescence spectrum which is shown in FIG. 79 is obtained by running electric current in the light emitting device which was formed, therefore the color rendering property could be improved in comparison with a conventional technique. The measurement result of the optical properties of the light emitting diode which was formed in the present Example is shown in Table 45 below.

TABLE 45

| Example No. | Color tone x | Color tone y | Color temperature [K] | Color rendering property Ra | Specific color rendering property R9 |
|---|---|---|---|---|---|
| Example 263 | 0.428 | 0.411 | 3199 | 95.6 | 78.2 |

Example 264

Figure 77:
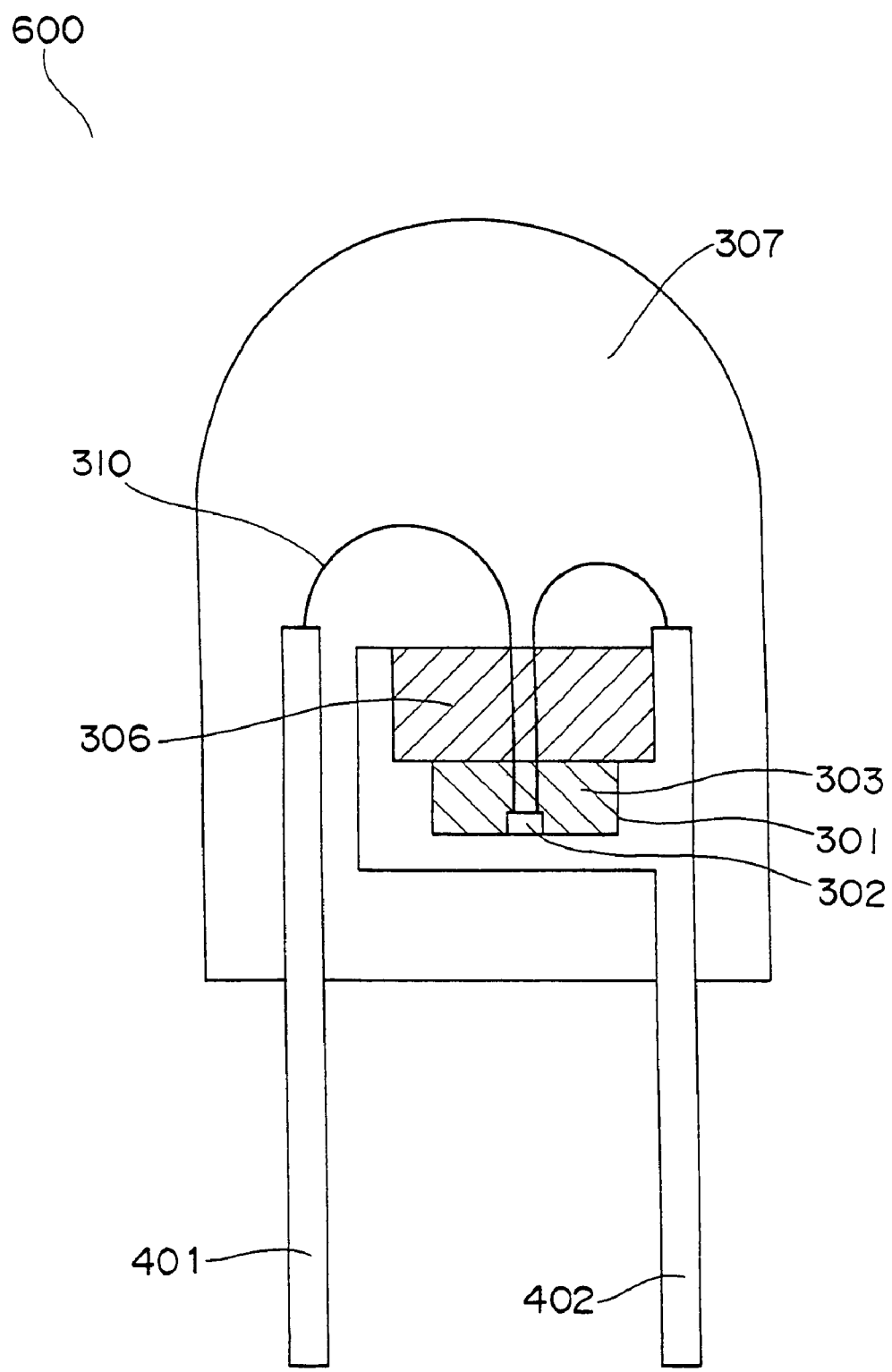
FIG. 77 is a typical section view of the light emitting diode related to the present invention.

The typical chart of the light emitting diode 400 formed in the present Example is shown in FIG. 77. In the present Example, at least one of the LED chip 302 is mounted in the concave portion 301 which was formed against the mount lead, in like manner as Example 263. The first phosphor layer and the second phosphor layer are laminated on the LED chip 302 in order by the similar method as other Examples. A light emitting device which improved the color rendering property in comparison with a conventional technique can be made by constituting thus.

Example 265

Figure 78A:
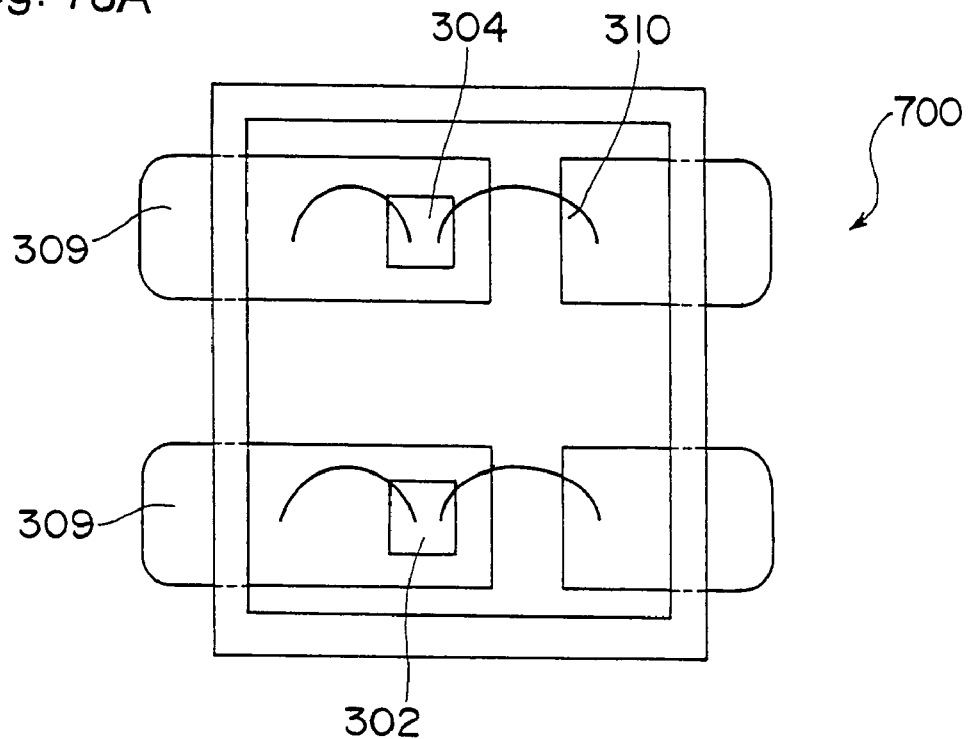
FIG. 78 is a frontal view (78A) and a typical section view (78B) of the light emitting diode related to the present invention.
Figure 78B:
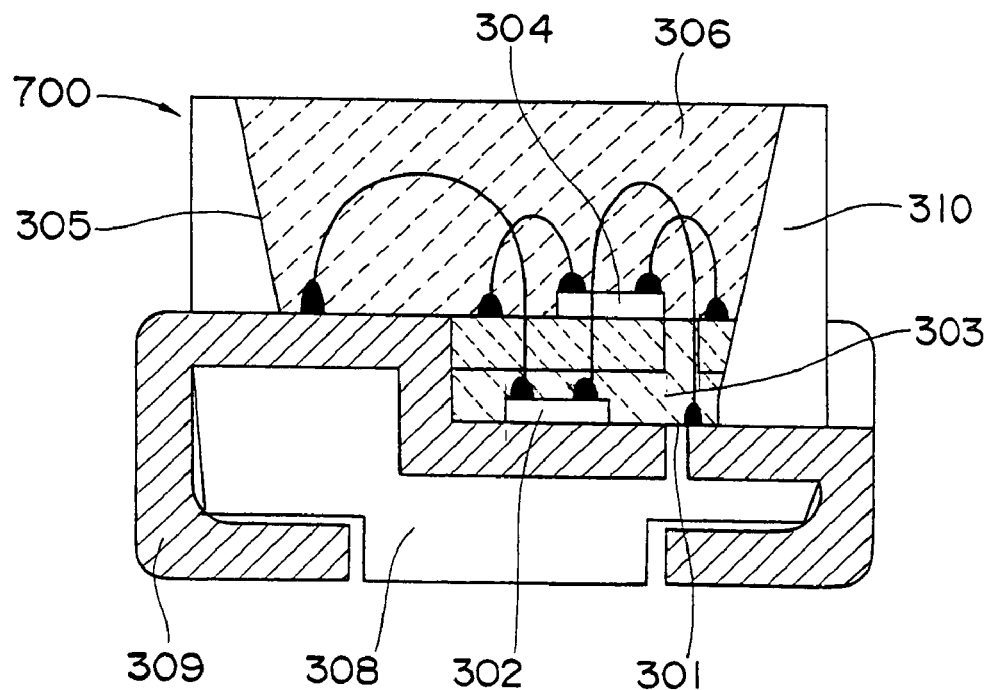
Figure 80:
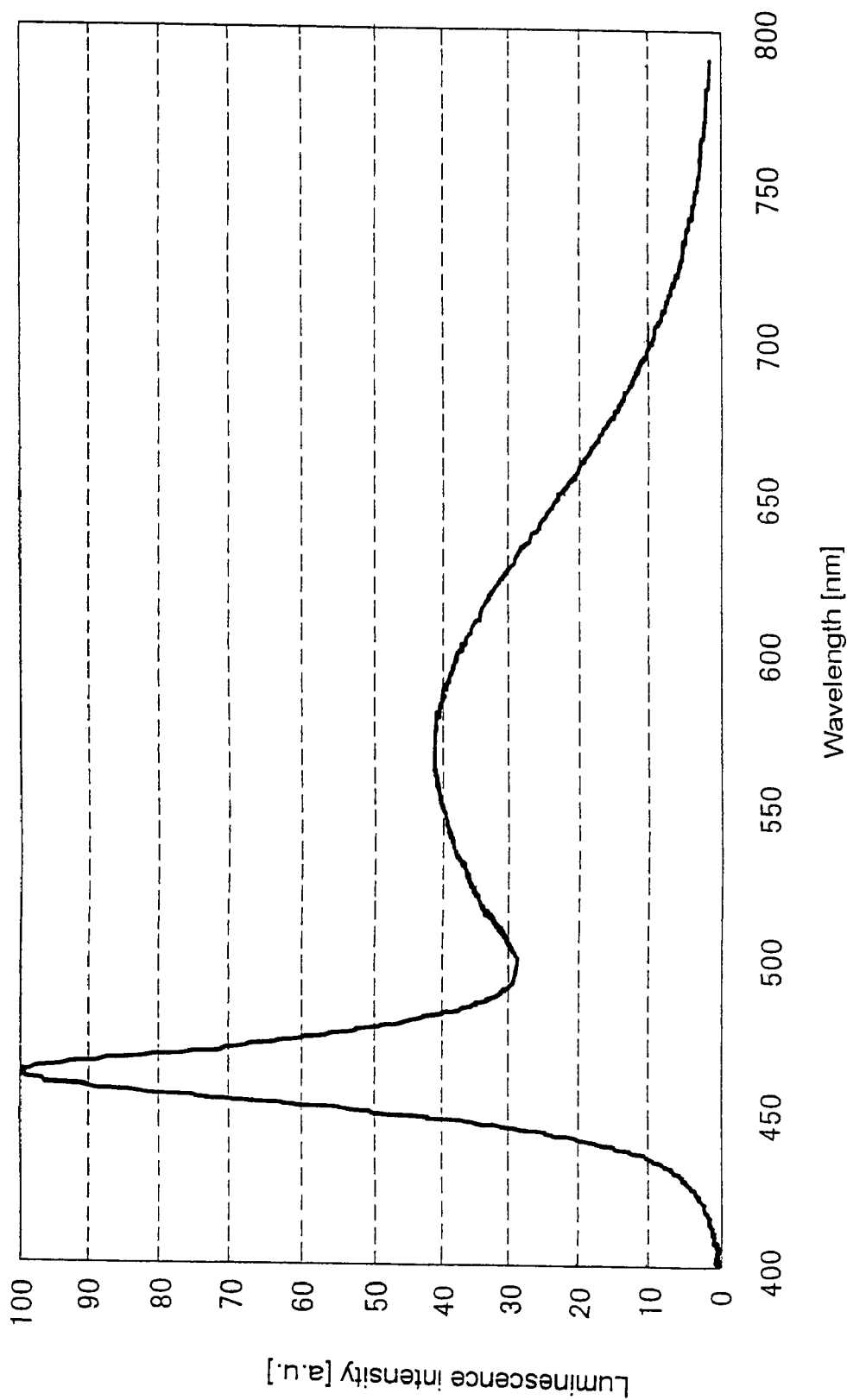
FIG. 80 is a chart showing the luminescence spectrum property of the light emitting device by a conventional technique which is shown for comparison with the present invention.

The typical chart of the light emitting diode 300 formed in the present Example is shown in FIG. 78. In like manner as other example, there are provided the first concave portion 301 in which the LED chip 302 which was covered with the first phosphor layer 303 is mounted, and the second concave portion 305 in which the LED chip 304 which was covered with the second phosphor layer 306 is mounted. Provided that the light emitting diode 300 formed in the present Example provides respectively one pair of the positive and negative one pair of electrodes 309 against the LED chips 302 and 304, electric current is respectively applied to the LED chips 302 and 304, and the luminescence output is designed to be able to be independently controlled.

The light emitting device which can freely control the color temperature of color mix light can be made by controlling the degree of the color mixing of light which is emitted by the wave length conversion by the first phosphor and the second phosphor.

Example 266

The typical chart of the light emitting diode 300 formed in the present Example is shown in FIG. 74. In the present Example, the nitride-base phosphor contained in the first phosphor layer 303 is $(Sr_{0.7}Ca_{0.3})_2Si_5N_8$:Eu (hereinafter, called as the "phosphor 261-1"). Further, the YAG-base phosphor contained in the second phosphor layer 306 is $Y_3(Al_{0.8}Ga_{0.2})_5O_{12}$:Ce (hereinafter, called as the "phosphor 261-2").

As shown in FIG. 74, the first concave portion 301, the second concave portion 305 and the package 308 having the one pair of positive and negative lead electrodes 309 are formed by an injection molding using a thermoplastic resin as a material. The LED chips 302 and 304 capable of emitting light at a blue region are respectively adhered in the first concave portion and the second concave portion by an insulating adhesive to be fixed. In the present Example, the LED chips which are mounted in the respective concave portions were respectively one chip, but a plural number of chips may be mounted in the respective concave portions. Since the phosphors in the respective concave portions can be directly excited by mounting a plural number of the LED chips thus, a light emitting device which can emit light in high brightness can be formed. The positive electrode and negative electrode of the LED chips 302 and 304 are respectively wire-bonded with the positive electrode and negative electrode of the lead electrode using the electroconductive wire 310.

FIG. 82 shows the excitation absorption spectrum of the YAG-base phosphor which is used in the present Example. FIG. 83 shows the luminescence spectrum of the YAG-base phosphor which is used in the present Example. In the present Example, as the YAG-base phosphors having different compositions respectively, $Y_3(Al_{0.8}Ga_{0.2})_5O_{12}$:Ce (hereinafter, called as the "phosphor 261-2"), $(Y_{0.8}Gd_{0.2})_3Al_5O_{12}$:Ce (hereinafter, called as the "phosphor 266-1"), and $Y_3Al_5O_{12}$:Ce (hereinafter, called as the "phosphor 266-2") were used. These phosphors are phosphors which absorb the blue light from the LED chip to be excited and emit yellow to green light, and they are contained in the second phosphor layer.

FIG. 84 shows the excitation absorption spectrum of the nitride-base phosphor which is used in the present Example. Further, FIG. 85 shows the luminescence spectrum of the nitride-base phosphor which is used in the present Example. In the present Example, as the nitride-base phosphors having different compositions respectively, $(Sr_{0.7}Ca_{0.3})_2Si_5N_8$:Eu (the phosphor 261-1) and $Ca_2Si_5N_8$:Eu (hereinafter, called as the "phosphor 266-3"). These phosphors are phosphors which absorb the blue light from the LED chip to be excited and emit red light, and contained in the first phosphor layer. The compositions of the phosphors used in the present Example, the peak wave lengths of the luminescence spectrum, and color tones are shown below.

TABLE 46

| Composition | | Luminescence peak wave length (nm) | Color tone x | Color tone y |
| --- | --- | --- | --- | --- |
| Phosphor 261-1 | $(Sr_{0.7}Ca_{0.3})_2Si_5N_8$:Eu | 637 | 0.638 | 0.360 |
| Phosphor 261-2 | $Y_3(Al_{0.8}Ga_{0.2})_5O_{12}$:Ce | 533 | 0.383 | 0.575 |
| Phosphor 266-1 | $(Y_{0.8}Gd_{0.2})_3Al_5O_{12}$:Ce | 562 | 0.457 | 0.527 |
| Phosphor 286-2 | $Y_3Al_5O_{12}$:Ce | 550 | 0.422 | 0.554 |
| Phosphor 266-3 | $Ca_2Si_5N_8$:Eu | 610 | 0.597 | 0.401 |

Firstly, after the light emitting diodes were formed using the phosphors 261-1 to 266-3 one by one, the ambient temperature was raised by applying a pulse current of 20 mA under a condition in which the heat emission of the LED chips themselves is negligible, and the luminescence outputs of the light emitting diodes for the ambient temperature were measured. Then, the relative outputs of the LED luminescence based on 25° C. were determined with respect to the respective phosphors 261-1 to 266-3, and shown as the ambient temperature-relative light output property in FIG. 87 to FIG. 91. Further, the decreasing rates of the relative LED luminescence outputs when the ambient temperature was changed by 1° C. are determined for the respective phosphors, and shown in Table 47 as the decreasing rates of the luminescence output.

TABLE 47

| Phosphor coated on light emitting diode | Composition | Decreasing rate of the luminescence output [a.u./° C.] |
| --- | --- | --- |
| Phosphor 261-1 | $(Sr_{0.7}Ca_{0.3})_2Si_5N_8$:Eu | $1.9 \times 10^{-3}$ |
| Phosphor 261-2 | $Y_3(Al_{0.8}Ga_{0.2})_5O_{12}$:Ce | $1.8 \times 10^{-3}$ |
| Phosphor 266-1 | $(Y_{0.8}Gd_{0.2})_3Al_5O_{12}$:Ce | $2.2 \times 10^{-3}$ |
| Phosphor 266-2 | $Y_3Al_5O_{12}$:Ce | $1.5 \times 10^{-3}$ |
| Phosphor 266-3 | $Ca_2Si_5N_8$:Eu | $3.4 \times 10^{-3}$ |

The phosphors used in the present Example are the phosphor 261-1 and the phosphor 261-2 which have the nearly equal decreasing rates of luminescence outputs against temperature rises. Namely, the decreasing rates of the luminescence outputs for the ambient temperature of the phosphors combined are $2.0 \times 10^{-3}$ [a.u./° C.] or less together and small in comparison with the combination of other phosphors, and the difference of the decreasing rate of the luminescence outputs is $2.0 \times 10^{-4}$ [a.u./° C.] and set as a combination being small in comparison with other phosphors.

The LED chip 302 or 304 which is used for exciting the phosphors in the present Example is the light emitting element in which the InGaAlN base compound semiconductor was formed as a luminescence layer, and the peak wave length of the luminescence spectrum is around 460 nm. Further, the chromaticity coordinate is shifted toward lower color temperature side along the black body radiation locus by heightening the electric current density between 3 to 300 A/cm$^2$.

Figure 81:
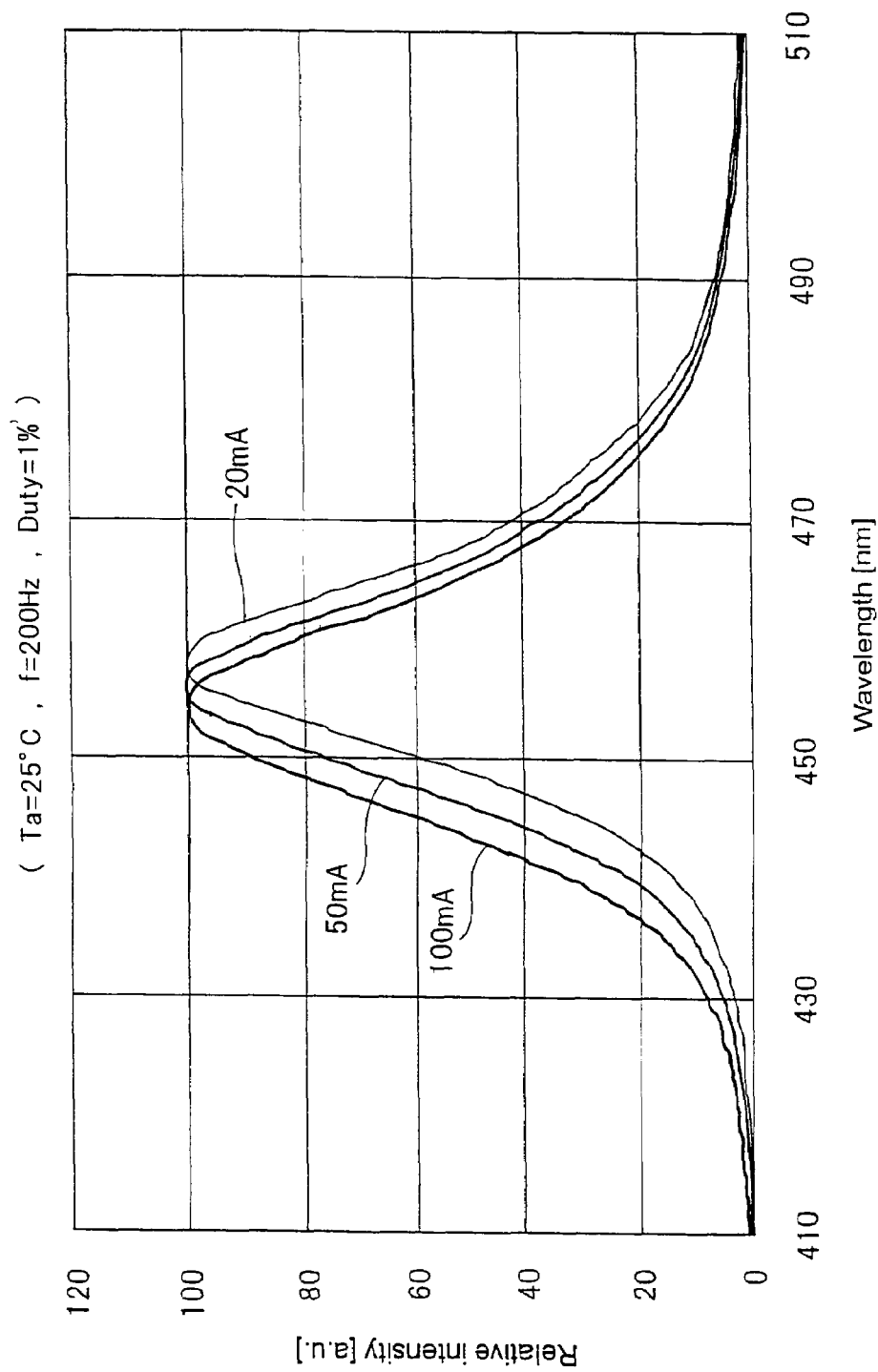
FIG. 81 is a chart showing the luminescence spectrum property of the LED chip in the present invention.

FIG. 81 is a chart showing the electric current properties of luminescence spectrum when electric current run in the LED chips 302 and 304 is changed. As shown in FIG. 81, with respect to the electric current properties of luminescence spectrum, the peak wave length is shifted toward shorter wavelength in accordance with the increase of applied electric current.

Then, as shown in FIG. 82, the positions of the peak wave lengths of the excitation absorption spectrum of the above-mentioned three phosphors 261-2, 266-1 and 266-2 are nearly coincided with the positions to which the peak wave lengths of luminescence spectrum of the LED chips are shifted in accordance with the increase of electric current which is applied to the LED chips. Hereat, it is preferable that the difference between the peak wave length of the excitation absorption spectrum of the phosphors 261-2, 266-1 and 266-2, and the peak wave length of the luminescence spectrum of the LED chips is 40 nm or less. Since the excitation efficiency of the phosphors is improved by using the phosphors and the quantity of light emitted from the LED is decreased without wave length conversion, the chromaticity deviation of a light emitting device can be prevented.

Hereat, when the phosphor 261-2 is used, the luminescence spectrum of the phosphor 261-2 is shifted toward shorter wave length than the luminescence spectrum of other phosphor as shown in FIG. 82. Accordingly, although the chromaticity deviation of the light emitting device can be prevented by shifting the peak wave lengths of the excitation absorption spectrum of the YAG-base phosphors, the emission of the light emitting device is deviated from the black body radiation locus, therefore a red component is added to the color mix light by adding the phosphor 261-1 or the phosphor 266-3, and the chromaticity coordinate is adjusted near at the black body radiation locus.

As shown in Table 44, the color rendering property in case of the present Example is Ra=91.9, and the color rendering property can be improved in comparison with a conventional technique.

Figure 86:
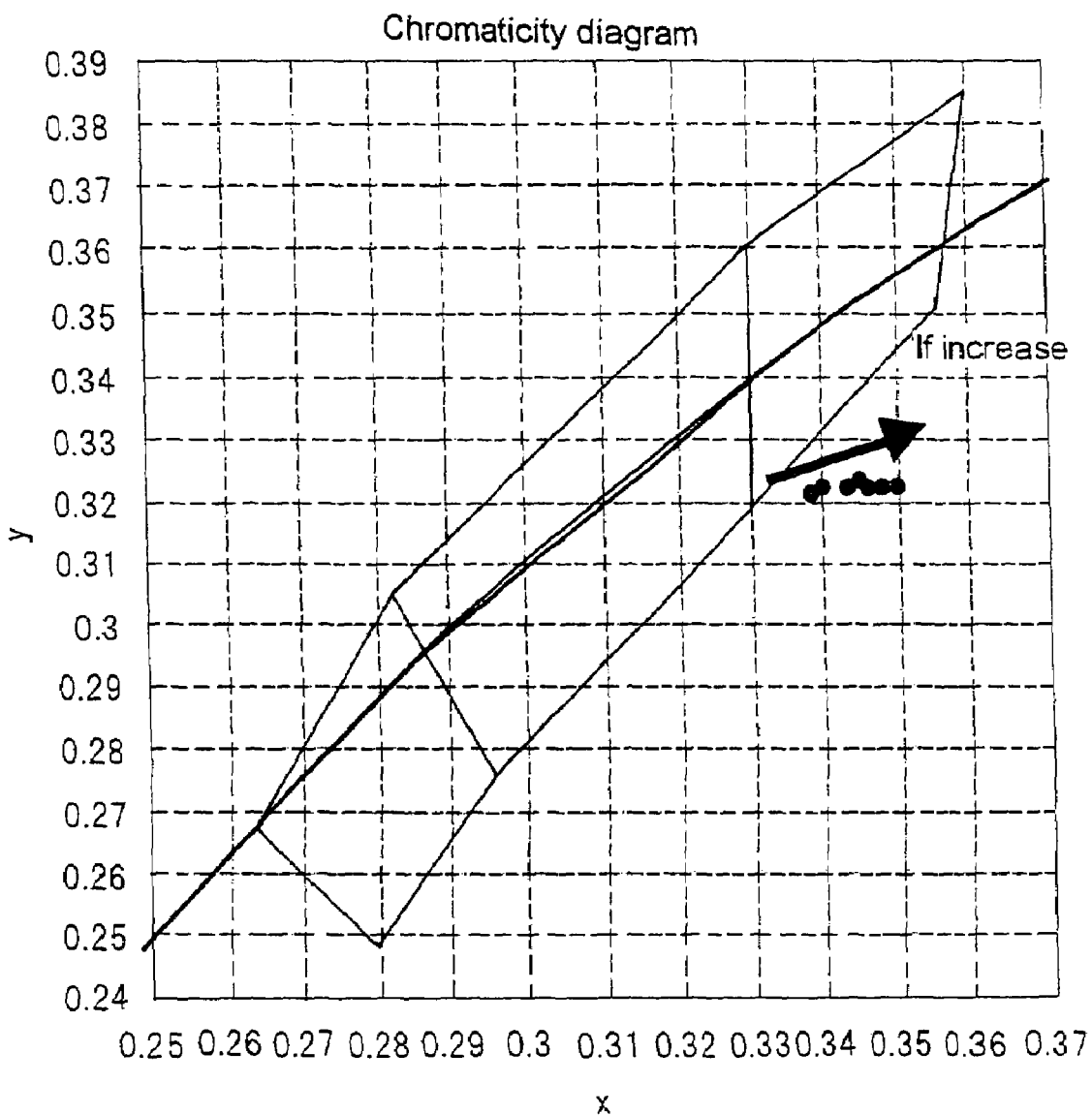
FIG. 86 is a chart showing the relation between the electric current and the chromaticity property (measurement by a DC drive) in the present invention.
Figure 87:
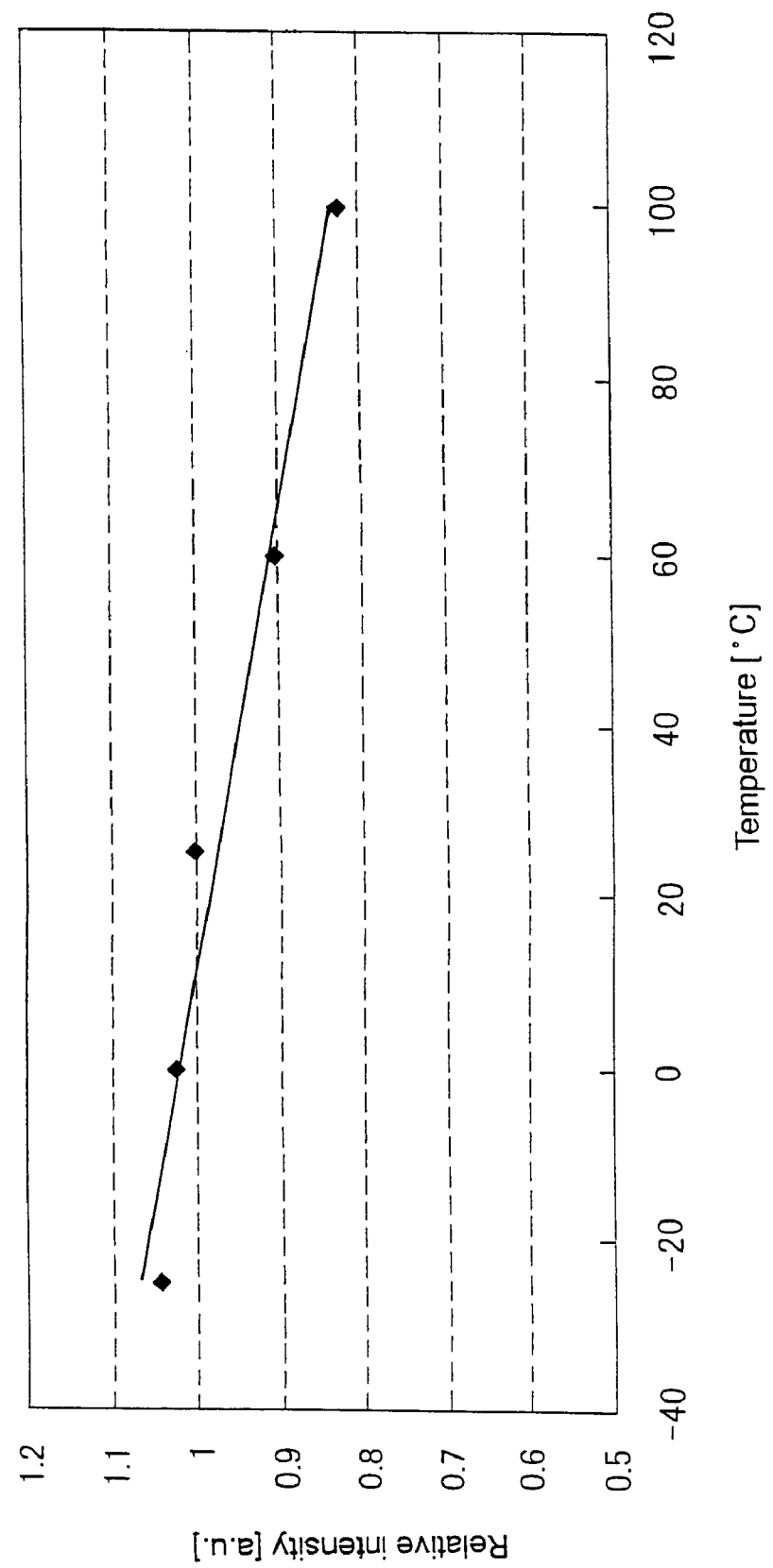
FIG. 87 is a chart showing the relation between the ambient temperature and the relative light output property of the light emitting diode which used the phosphor 261-1 in the present invention.
Figure 88:
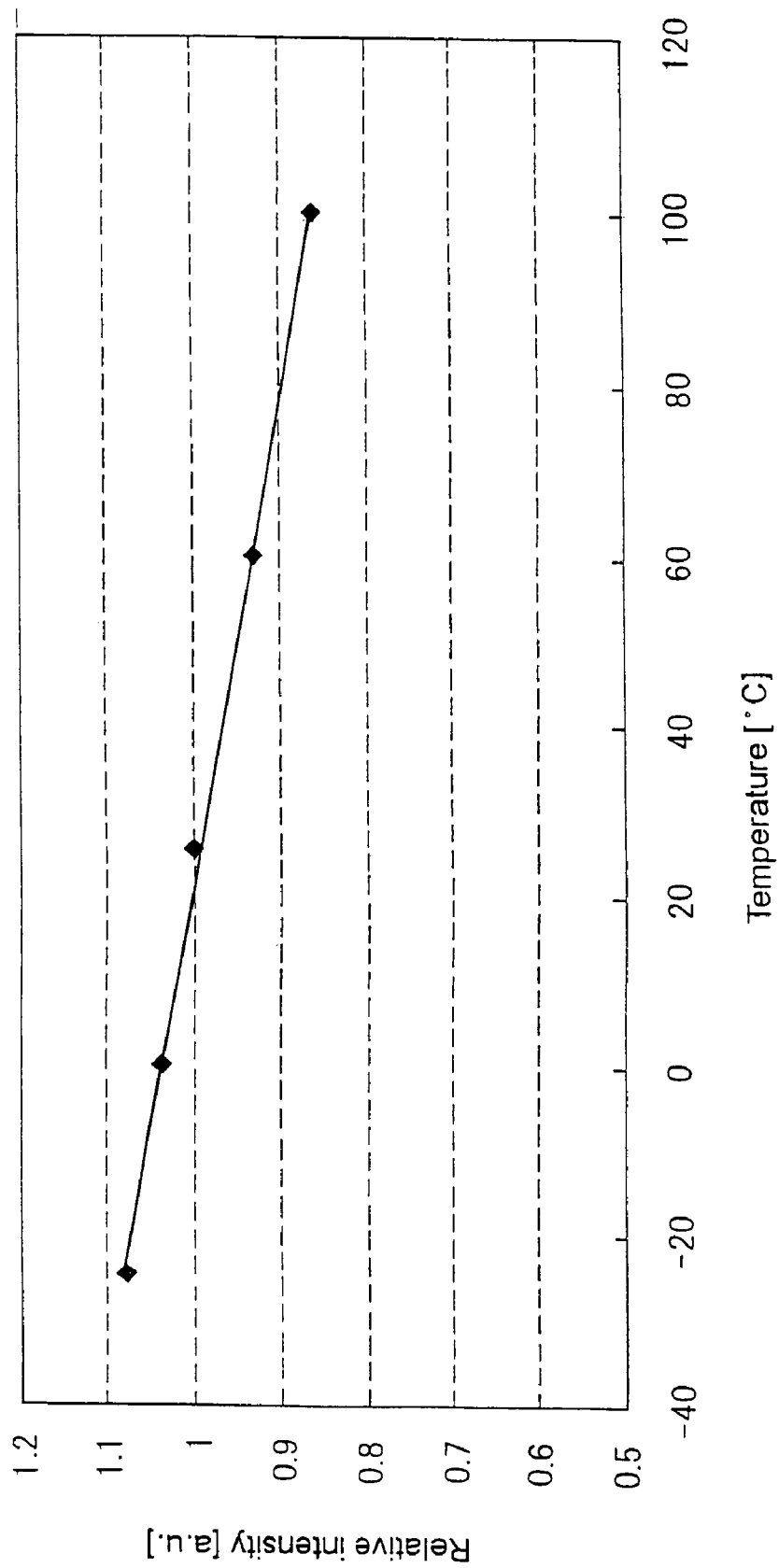
FIG. 88 is a chart showing the relation between the ambient temperature and the relative light output property of the light emitting diode which used the phosphor 261-2 in the present invention.
Figure 89:
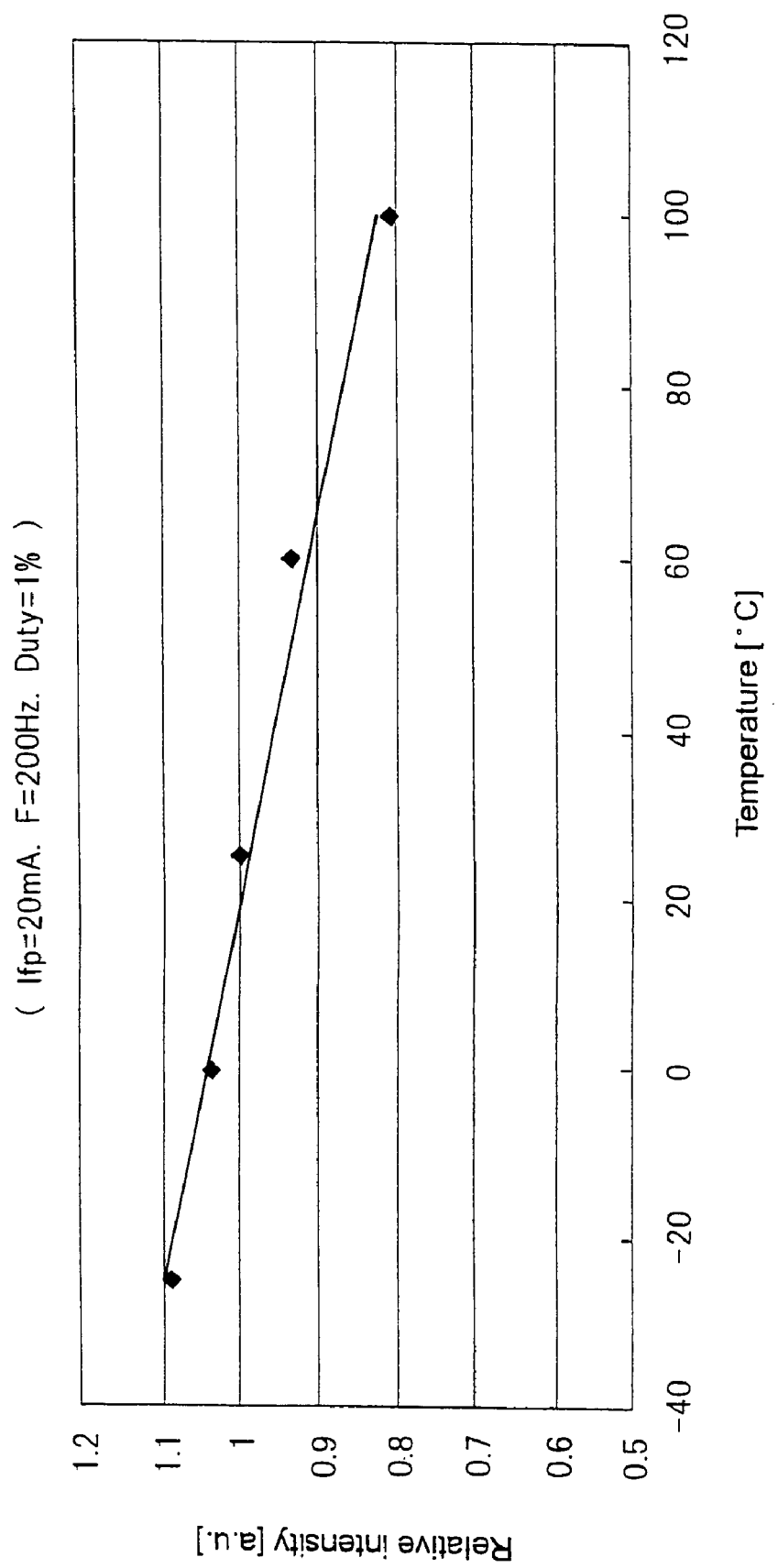
FIG. 89 is a chart showing the relation between the ambient temperature and the relative light output property of the light emitting diode which used the phosphor 266-1 in the present invention.
Figure 90:
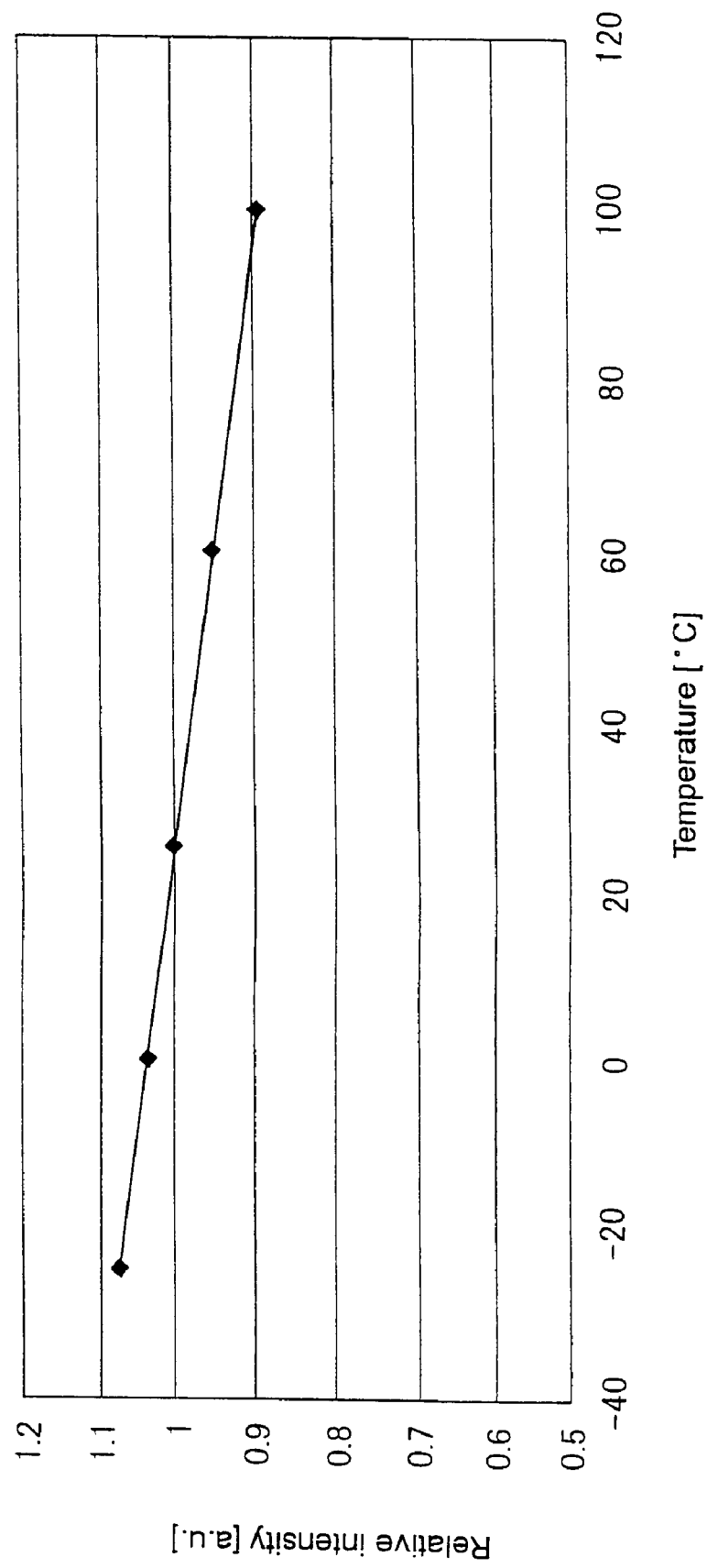
FIG. 90 is a chart showing the relation between the ambient temperature and the relative light output property of the light emitting diode which used the phosphor 266-2 in the present invention.
Figure 91:
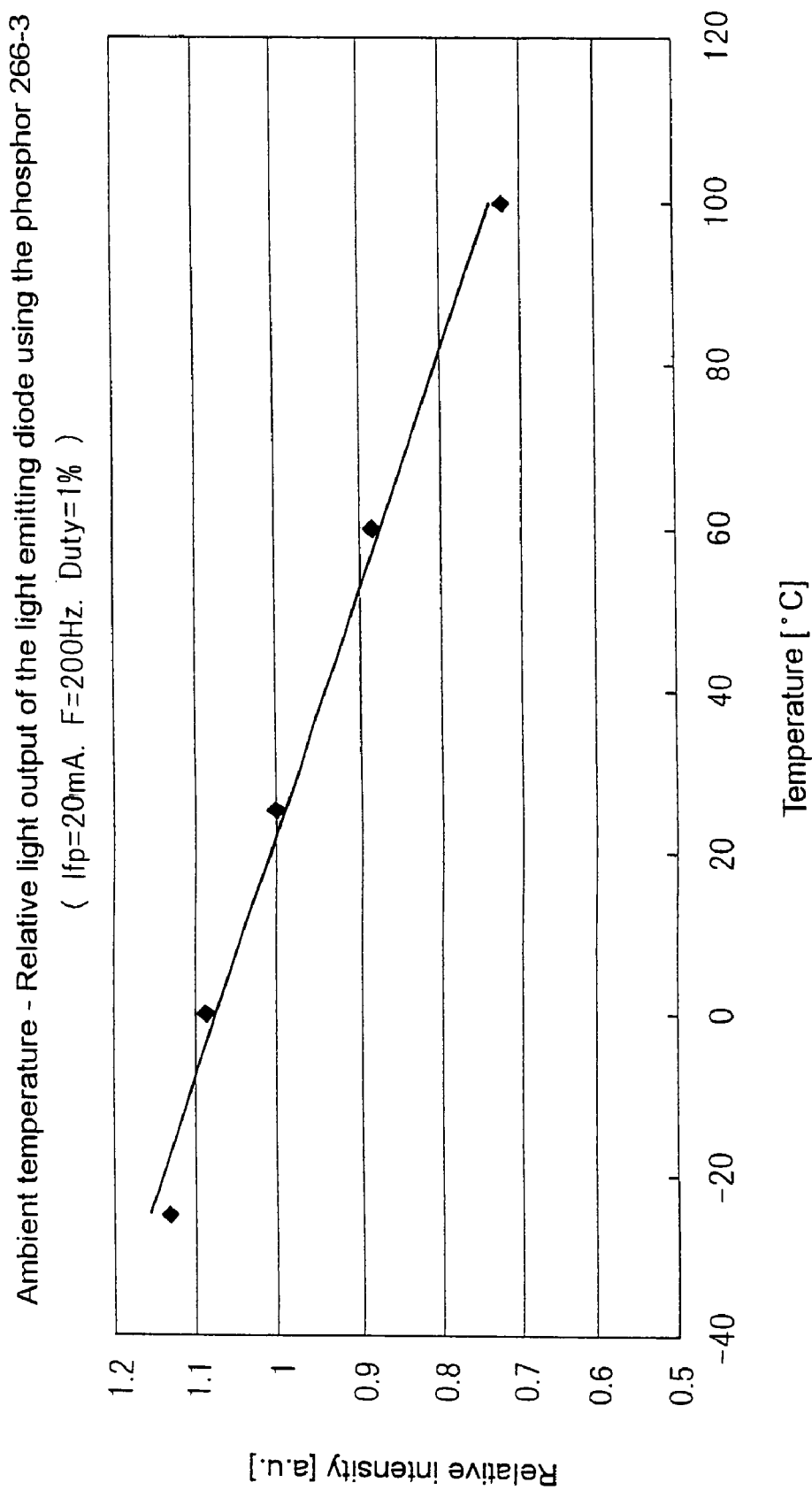
FIG. 91 is a chart showing the relation between the ambient temperature and the relative light output property of the light emitting diode which used the phosphor 266-3 in the present invention.

FIG. 86 is a chart showing the chromaticity change when DC drive was carried out with respect to the light emitting device which was formed in the present Example. When the electric current density is increased from 15 [A/cm$^2$] to 180 [A/cm$^2$], the fluctuation of light chromaticity by color mixing is within a range of 0.339 to 0.351 in the x coordinate and 0.321 to 0.322 in the y coordinate on the chromaticity chart. Namely, the light chromaticity by color mixing is migrated at a position nearly along the black body radiation locus even if the electric current is increased, and the fluctuation of the chromaticity is hardly generated.

The constitution of the present Example is a constitution that the decreasing rates of the luminescence outputs for the ambient temperature of the phosphors combined are $2.0 \times 10^{-3}$ [a.u./° C.] or less together and small in comparison with the phosphors of other Examples, and the difference of the decreasing rate of the luminescence outputs is $2.0 \times 10^{-4}$ [a.u./° C.] and set as a combination being small in comparison with other Examples. Namely, the decreasing rates of the luminescence outputs for the temperature rises of the phosphor 261-1 and the phosphor 261-2 are nearly equal. By making such a constitution thus, the difference of the luminescence outputs of the phosphor 261-1 and the phosphor 261-2 is kept at a nearly equal value without being influenced by the ambient temperature, even if the luminescence outputs of the phosphor 261-1 and the phosphor 261-2 are lowered by the rise of the ambient temperature caused by the heat emission of the light emitting element and the like. Namely, by making such a constitution of the present Example, there can be made a light emitting device of improving the color rendering property irrespective of the change of the ambient temperature of the light emitting device and hardly generating the chromaticity deviation.

Further, when a light source for a back light which can be used as the constituting member of a liquid crystal display is formed by using the light emitting device related to the present invention in combination with a light conductive plate which introduces the light emitted from the light emitting device to the face side of observing luminescence, the light source for a back light improving color rendering property irrespective of the change of the ambient temperature and hardly generating the color deviation can be made.

INDUSTRIAL APPLICABILITY

According to the present invention, the phosphor which can be used in combination with a blue light emitting element and the like and has a luminescence spectrum at a yellow to red region and high luminescence efficiency and durability can be provided.

Further, a reddish warm color-base white light emitting device having good luminescence efficiency can be provided by utilizing these phosphors.

Namely, it has an extremely important technical meaning that a near electric bulb color light emitting device can be produced.

What is claimed is:

1. A nitride phosphor which is activated by at least one or more rare earth elements selected from a group consisting of Y, La, Ce, Pr, Nd, Sm, Eu, Gd, Tb, Dy, Ho, Er and Lu, and which comprises at least one or more of the Group II Elements selected from a group consisting of Be, Mg, Ca, Sr, Ba and Zn, at least one or more of the Group IV Elements selected from a group consisting of C, Si, Ge, Sn, Ti, Zr and Hf, and N, the nitride phosphor containing B in the range of 1 ppm to 10000 ppm.

2. The nitride phosphor according to claim 1, further comprising O.

3. The nitride phosphor according to claim 1, of which crystal configuration is monoclinic or orthorhombic.

4. The nitride phosphor according to claim 1,
wherein said rare earth element is one or more of elements in which Eu is essential.

5. The nitride phosphor according to claim 1, further comprising one or more elements of the Group I Elements selected from a group consisting of Li, Na, K, Rb and Cs in the range of 0.1 ppm to 500 ppm.

6. The nitride phosphor according to claim 1, further comprising one or more elements selected from the Group I Elements consisting of Cu, Ag and Au, the Group III Elements consisting of Al, Ga and In, the Group IV Elements consisting of Ti, Zr, Hf, Sn and Pb, the Group V Elements consisting of P, Sb and Bi, and the Group VI Element consisting of S in the range of 0.1 ppm to 500 ppm.

7. The nitride phosphor according to claim 1, further comprising either the elements of Ni or Cr in the range of 1 ppm to 500 ppm.

8. The nitride phosphor according to claim 1, of which mean particle diameter is in a range of 2 μm to 15 μm.

9. The nitride phosphor according to claim 1, represented by a general formula $L_X M_Y N_{(2/3)X+(4/3)Y}$:R or a general formula $L_X M_Y O_Z N_{(2/3)X+(4/3)Y-(2/3)Z}$:R wherein L is at least one or more of the Group II Elements selected from a group consisting of Be, Mg, Ca, Sr, Ba and Zn, M is at least one or more of the Group IV Elements selected from a group consisting of C, Si, Ge, Sn, Ti, Zr, Hf. R is at least one or more of the rare earth elements selected from a group consisting of Y, La, Ce, Pr, Nd, Sm, Eu, Gd, Tb, Dy, Ho, Er and Lu, X, Y and Z are $0.5 \leq X \leq 3$, $1.5 \leq Y \leq 8$, and $0 < Z \leq 3$.

10. The nitride phosphor according to claim 9, of which crystal configuration is monoclinic or orthorhombic.

11. The nitride phosphor according to claim 9,
wherein said rare earth element is one or more of elements in which Eu is essential.

12. The nitride phosphor according to claim 9, further comprising one or more elements of the Group I Elements selected from a group consisting of Li, Na, K, Rb and Cs in the range of 0.1 ppm to 500 ppm.

13. The nitride phosphor according to claim 9, further comprising one or more elements selected from the Group I Elements consisting of Cu, Ag and Au, the Group III Elements consisting of Al, Ga and In, the Group IV Elements consisting of Ti, Zr, Hf, Sn and Pb, the Group V Elements consisting of P, Sb and Bi, and the Group VI Element consisting of S in the range of 0.1 ppm to 500 ppm.

14. The nitride phosphor according to claim 9, further comprising either the elements of Ni or Cr in the range of 1 ppm to 500 ppm.

15. The nitride phosphor according to claim 9, of which mean particle diameter is in a range of 2 μm to 15 μm.

16. The nitride phosphor according to claim 1 which absorbs a portion of light having a first luminescence spectrum and emits light having a second luminescence spectrum at a range different from said first luminescence spectrum, wherein the luminescence brightness and afterglow are controlled by the amount of B.

17. The nitride phosphor according to claim 16, of which crystal configuration is monoclinic or orthorhombic.

18. The nitride phosphor according to claim 16, further comprising one or more elements of the Group I Elements selected from a group consisting of Li, Na, K, Rb and Cs in the range of 0.1 ppm to 500 ppm.

19. The nitride phosphor according to claim 16, further comprising one or more elements selected from the Group I Elements consisting of Cu, Ag and Au, the Group III Elements consisting of Al, Ga and In, the Group IV Elements consisting of Ti, Zr, Hf, Sn and Pb, the Group V Elements consisting of P, Sb and Bi, and the Group VI Element consisting of S in the range of 0.1 ppm to 500 ppm.

20. The nitride phosphor according to claim 16, further comprising either the elements of Ni or Cr in the range of 1 ppm to 500 ppm.

21. The nitride phosphor according to claim 16, of which mean particle diameter is in a range of 2 μm to 15 μm.

22. A light emitting device comprising an excitation light source which emits light of a short wave length range of from near ultra violet to visible light and a phosphor which absorbs at least a portion of light from said excitation light source and emits light having a longer wave length range than light emitted from the excitation light source,
wherein said phosphor comprises a nitride phosphor which is activated by at least one or more rare earth elements selected from a group consisting of Y, La, Ce, Pr, Nd, Sm, Eu, Gd, Tb, Dy, Ho, Er and Lu, and which comprises at least one or more of the Group II Elements selected from a group consisting of Be, Mg, Ca, Sr, Ba and Zn, at least one or more of the Group IV Elements selected from a group consisting of C, Si, Ge, Sn, Ti, Zr and Hf, and N, the phosphor containing B in the range of 1 ppm to 10000 ppm.

23. The light emitting device according to claim 22, wherein said phosphor further comprises at least one or more of a phosphor emitting blue light, a phosphor emitting green light and a phosphor emitting yellow light.

24. The light emitting device according to claim 22, wherein said excitation light source is a semiconductor light emitting element.

25. The light emitting device according to claim 22, wherein a white light is emitted by mixing a portion of light emitted from said excitation light source which transmits between the particles of said phosphor with a portion of light emitted from said phosphor which is subjected to wavelength conversion by the light emitted from said excitation light source.

* * * * *